US008076782B2

(12) United States Patent
Asai et al.

(10) Patent No.: US 8,076,782 B2
(45) Date of Patent: Dec. 13, 2011

(54) SUBSTRATE FOR MOUNTING IC CHIP

(75) Inventors: Motoo Asai, Gifu (JP); Hiroaki Kodama, Gifu (JP); Toyoaki Tanaka, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 1458 days.

(21) Appl. No.: 10/509,899

(22) PCT Filed: Mar. 28, 2003

(86) PCT No.: PCT/JP03/03932
§ 371 (c)(1),
(2), (4) Date: Jun. 29, 2005

(87) PCT Pub. No.: WO03/083543
PCT Pub. Date: Oct. 9, 2003

(65) Prior Publication Data
US 2006/0012967 A1 Jan. 19, 2006

(30) Foreign Application Priority Data

Apr. 1, 2002 (JP) .................................. 2002-099305
Apr. 1, 2002 (JP) .................................. 2002-099306
Apr. 1, 2002 (JP) .................................. 2002-099307

(51) Int. Cl.
*H01L 29/40* (2006.01)
(52) U.S. Cl. ......... 257/774; 257/621; 257/772; 257/779
(58) Field of Classification Search .................. 257/686, 257/689, 777, 621, 774, E25.006, E25.013, 257/E25.018, E25.021, E25.027, E23.085, 257/E21.614, 772, 779; 438/629, 630, 637–640, 438/668, 672, 675
See application file for complete search history.

(56) References Cited

U.S. PATENT DOCUMENTS
5,105,237 A 4/1992 Hasegawa et al.
(Continued)

FOREIGN PATENT DOCUMENTS
EP 1 020 748 A1 7/2000
(Continued)

OTHER PUBLICATIONS
Machine translation of JP2002-329891 has been attached.*
(Continued)

*Primary Examiner* — Wai-Sing Louie
*Assistant Examiner* — Bilkis Jahan
(74) *Attorney, Agent, or Firm* — Oblon, Spivak, McClelland, Maier & Neustadt, L.L.P.

(57) ABSTRACT

An object of the present invention is to provide a substrate for mounting an IC chip which is a component for optical communication having an IC chip and an optical component integrally provided thereon, which can ensure a short distance between the IC chip and the optical component, which is excellent in electric signal transmission reliability and which can transmit optical signal through an optical path for transmitting optical signal.
The substrate for mounting an IC chip of the present invention is a substrate for mounting an IC chip comprising: a substrate and, as serially built up on both faces thereof, a conductor circuit and an interlaminar insulating layer in an alternate fashion and in repetition; a solder resist layer formed as an outermost layer; and an optical element mounted thereto, wherein an optical path for transmitting optical signal, which penetrates the substrate for mounting an IC chip, is disposed.

7 Claims, 79 Drawing Sheets

U.S. PATENT DOCUMENTS

| | | | |
|---|---|---|---|
| 5,312,765 A * | 5/1994 | Kanber | 438/59 |
| 5,452,283 A * | 9/1995 | Lee et al. | 369/112.26 |
| 5,530,288 A * | 6/1996 | Stone | 257/700 |
| 5,822,856 A | 10/1998 | Bhatt et al. | 29/832 |
| 5,942,375 A * | 8/1999 | Gosima | 430/313 |
| 6,323,439 B1 * | 11/2001 | Kambe et al. | 174/262 |
| 6,343,171 B1 | 1/2002 | Yoshimura et al. | |
| 6,426,011 B1 | 7/2002 | Katob | |
| 6,586,835 B1 * | 7/2003 | Ahn et al. | 257/717 |
| 6,623,178 B1 | 9/2003 | Sakurai et al. | |
| 6,661,939 B2 | 12/2003 | Kaneko et al. | |
| 6,788,874 B1 | 9/2004 | Ishikawa et al. | |
| 6,833,566 B2 * | 12/2004 | Suehiro et al. | 257/99 |
| 7,183,497 B2 * | 2/2007 | Kojima et al. | 174/262 |
| 7,526,152 B2 | 4/2009 | Asai et al. | |
| 7,715,666 B2 | 5/2010 | Kodama et al. | |
| 2001/0042637 A1 * | 11/2001 | Hirose et al. | 174/255 |
| 2002/0127418 A1 * | 9/2002 | Takeuchi et al. | 428/457 |
| 2004/0047539 A1 | 3/2004 | Okubora et al. | |
| 2004/0212030 A1 | 10/2004 | Asai | |
| 2005/0185880 A1 | 8/2005 | Asai | |

FOREIGN PATENT DOCUMENTS

| | | |
|---|---|---|
| EP | 1 194 025 A1 | 4/2002 |
| JP | 61-117882 | 6/1986 |
| JP | 62-274679 | 11/1987 |
| JP | 3-290606 | 12/1991 |
| JP | 4-74483 | 3/1992 |
| JP | 5-55633 | 3/1993 |
| JP | 05-055633 | 3/1993 |
| JP | 5-211202 | 8/1993 |
| JP | 6-69490 | 3/1994 |
| JP | 6-132516 | 5/1994 |
| JP | 6-281831 | 10/1994 |
| JP | 8-110436 | 4/1996 |
| JP | 8-330686 | 12/1996 |
| JP | 9-281352 | 10/1997 |
| JP | 11-12465 | 1/1999 |
| JP | 11-287926 | 10/1999 |
| JP | 2000-66051 | 3/2000 |
| JP | 2000-081524 | 3/2000 |
| JP | 2000-147275 | 5/2000 |
| JP | 2000-199827 | 7/2000 |
| JP | 2000-214351 | 8/2000 |
| JP | 2000-298352 | 10/2000 |
| JP | 2000-299562 | 10/2000 |
| JP | 2000-321442 | 11/2000 |
| JP | 2000-332301 | 11/2000 |
| JP | 2001-33665 | 2/2001 |
| JP | 2001-42145 | 2/2001 |
| JP | 2001-057466 | 2/2001 |
| JP | 2001-59923 | 3/2001 |
| JP | 2001-185752 | 7/2001 |
| JP | 2001-196643 | 7/2001 |
| JP | 2001-278941 | 10/2001 |
| JP | 2001-298052 | 10/2001 |
| JP | 2001-320172 | 11/2001 |
| JP | 2001-339077 | 12/2001 |
| JP | 2002-76376 | 3/2002 |
| JP | 2002-98863 | 4/2002 |
| JP | 2002-107560 | 4/2002 |
| JP | 2002-120230 | 4/2002 |
| JP | 2002-189137 | 7/2002 |
| JP | 2002-236228 | 8/2002 |
| JP | 2002-236229 | 8/2002 |
| JP | 2002-237684 | 8/2002 |
| JP | 2002-250830 | 9/2002 |
| JP | 2002-270860 | 9/2002 |
| JP | 2002-277664 | 9/2002 |
| JP | 2002-289911 | 10/2002 |
| JP | 2002-296435 | 10/2002 |
| JP | 2002-329891 | * 11/2002 |
| JP | 2002-331532 | 11/2002 |
| JP | 2003-46021 | 2/2003 |
| JP | 2003-046021 | 2/2003 |
| JP | 2003-046061 | 2/2003 |
| JP | 2003-46061 | 2/2003 |
| JP | 2003-046256 | 2/2003 |
| JP | 2003-46256 | 2/2003 |
| JP | 2003-101080 | 4/2003 |
| JP | 2003-110245 | 4/2003 |
| JP | 2003-215372 | 7/2003 |
| JP | 2004-004426 | 1/2004 |
| JP | 2004-4426 | 1/2004 |
| JP | 2004-4427 | 1/2004 |
| JP | 2004-004427 | 1/2004 |
| JP | 2004-004428 | 1/2004 |
| JP | 2004-4428 | 1/2004 |

OTHER PUBLICATIONS

Ray T. Chen, et al., "Fully Embedded Board-Level Guided-Wave Optoelectronic Interconnects", Proceedings of the IEEE, vol. 88, No. 6, Jun. 2000, pp. 780-793.

Yuzo Ishii, et al., "Large-Tolerant "OptoBumP" Interface for Interchip Optical Interconnections", IEICE Transactions C, vol. J84-C, No. 9, Sep. 2001, pp. 793-799, with partial English translation.

* cited by examiner (a) (b) (c) (d)

(a) (b)

SUBSTRATE FOR MOUNTING IC CHIP

TECHNICAL FIELD

The present invention relates to a substrate for mounting an IC chip, a manufacturing method of a substrate for mounting an IC chip, a device for optical communication, and a manufacturing method of a device for optical communication.

BACKGROUND ART

Recently, attention has been focused on optical fibers mainly in communication fields. Particularly in the IT (Information Technology) field, a communication technique which employs the optical fibers is necessary to provide a high speed Internet network.

The optical fiber has features of (1) low loss, (2) high band, (3) small diameter and light weight, (4) non-induction, (5) resource saving, and the like. A communication system which employs the optical fibers having these features can considerably decrease the number of relays as compared with a communication system which employs conventional metallic cables, can be easily constructed and maintained, and can improve its economical efficiency and reliability.

Further, since the optical fiber can transmit not only light having a single wavelength but also light having a number of different wavelengths simultaneously, i.e., only one optical fiber can provide multiple transmission of light having a number of different wavelengths, it is possible to realize a large capacity of a transmission line capable of dealing with diversified purposes and deal with picture service and the like.

Therefore, in the field of the network communication such as the Internet, it is proposed that the use of optical transmission using optical fibers not only for the communication of a basic network but also the communication between the basic network and terminal device (a personal computer, a mobile, a game machine or the like) and the communication between the terminal devices.

When the optical communication is used for the communication between the basic network and the terminal device, an IC which processes information (signals) in the terminal device operates at an electric signal; therefore, the terminal device is required to include a unit that converts optical signal into an electric signal or vice versa such as an optical-to-electric converter or an electric-to-optical converter (which device will also be referred to as "optical/electric converter", hereinafter).

For this reason, the conventional terminal device has mounted thereon separately, a package substrate on which an IC chip is mounted, and optical elements such as a light receiving element and a light emitting element which process optical signal, and electric wirings and the optical waveguide are connected to these elements, thereby performing signal transmission and signal processing.

SUMMARY OF THE INVENTION

When the package substrate having an IC chip mounted thereon, optical elements, such as a light receiving element and a light emitting element, which process optical signal, and the like are mounted separately on such a conventional terminal device, the size of a device itself becomes large, making it difficult to make the terminal device small in size.

Further, there has been also proposed a technique of internalizing optical elements such as a light receiving element and the like inside the package substrate on which an IC chip is mounted, and performing the optical communication of the terminal device using this package substrate with the optical elements included therein (hereinafter, also referred to as "optical element-internalizing package substrate"). Although such an optical element-internalizing package substrate can solve the problem in that the device itself becomes large in size, this package substrate has the following problems.

In the optical element-internalizng package substrate, since the optical elements are completely internalized inside the substrate, it is difficult to make a fine adjustment for alignment upon connection of the package substrate to an external optical element (e.g., an optical fiber or an optical waveguide). Besides, since the optical elements are included in the package substrate in advance at the time of producing the substrate, the positional deviation of the optical elements tends to occur. The reason is considered as follows. In a manufacturing process of the package substrate, it is necessary to apply a heat treatment and the like. When the optical elements are included in a resin layer, it is considered that the positional deviation of the optical elements occurs during the heat treatment.

As can be seen, when positional deviation occurs to the included optical elements, connection loss generated at the time of connecting the package substrate to the external optical component (e.g., an optical waveguide) is large, which deteriorates connection reliability in optical communication.

Further, in this optical element-internalizing package substrate, when a problem occurs to one of the included optical elements, it is impossible to replace only the defective optical element; therefore, the optical element-internalizing package substrate itself is regarded as a defective product, which is economically disadvantageous.

In addition, the positions at which the optical elements are mounted are limited due to the need to secure an optical path for transmitting optical signal and the positional relationship between the optical element and the optical component (such as an optical waveguide) attached to the external substrate. As a result, it is difficult to realize the high density of the substrate for mounting an IC chip in some cases.

Thus, the present inventors has made eager study to a substrate for mounting an IC chip capable of achieving optical communication excellent in connection reliability and, also, contributing to making a terminal device small in size. As a result, the present inventors reached the conclusion that the above-described problems can be solved by providing an optical path for transmitting optical signal that penetrates the substrate for mounting an IC chip, on the substrate for mounting an IC chip, and completed a substrate for mounting an IC chip, having the following configurations, according to a first aspect of a first group of the present invention and a manufacturing method of a substrate for mounting an IC chip according to a second aspect of the first group of the present invention.

Further, in a device for optical communication comprising a substrate for mounting an IC chip and a multilayered printed circuit board, the present inventors found that it is possible to secure excellent optical signal transmission characteristic and achieve high-density wiring by forming an optical path for transmitting optical signal in a predetermined manner in at least one of the substrate for mounting an IC chip and the multilayered printed circuit board, and completed devices for optical communication according to third to fifth aspects of the first group of the present invention.

That is, a substrate for mounting an IC chip according to the first aspect of the first group of the present invention is a substrate for mounting an IC chip comprising: a substrate and, as serially built up on both faces thereof, a conductor circuit and an interlaminar insulating layer in an alternate fashion and in repetition; a solder resist layer formed as an outermost layer; and an optical element mounted thereto, wherein an optical path for transmitting optical signal, which penetrates the substrate for mounting an IC chip, is disposed.

In the substrate for mounting an IC chip according to the first aspect of the first group of the present invention, it is desirable that the optical path for transmitting optical signal is constituted by a vacancy or constituted by a resin composition and a vacancy.

In the substrate for mounting an IC chip according to the first aspect of the first group of the present invention, it is also desirable that the optical path for transmitting optical signal is constituted by a vacancy and a conductor layer around the vacancy, or constituted by a resin composition, a vacancy and a conductor layer around these.

In the substrate for mounting an IC chip according to the first aspect of the first group of the present invention, it is desirable that a position at which the optical element is mounted is on a surface of the substrate for mounting an IC chip and that the optical element is a light receiving element and/or a light emitting element.

It is desirable that an electronic component is mounted on a surface of the substrate for mounting an IC chip according to the first aspect of the first group of the present invention.

In the substrate for mounting an IC chip according to the first aspect of the first group of the present invention, it is desirable that a micro lens is disposed on an end portion of the optical path for transmitting optical signal and that a cross-sectional diameter of the optical path for transmitting optical signal is 100 to 500 µm.

Further, in the substrate for mounting an IC chip according to the first aspect of the first group of the present invention, it is desirable that the conductor circuits with the substrate interposed therebetween are connected to each other through a plated-through hole, and the conductor circuits with the interlaminar insulating layers interposed therebetween are connected to each other through a via-hole.

The manufacturing method of a substrate for mounting an IC chip according to the second aspect of the first group of the present invention, comprises:

(a) a multilayered circuit board manufacturing step of serially building up a conductor circuit and an interlaminar insulating layer on both faces of a substrate in an alternate fashion and in repetition to provide a multilayered circuit board;

(b) a through hole formation step of forming a through hole in the multilayered circuit board; and (c) a solder resist layer formation step of forming a solder resist layer having an opening communicating with the through hole formed in the step (b).

It is desirable that the manufacturing method of a substrate for mounting an IC chip according to the second aspect of the first group of the present invention comprises a roughened face formation step of forming a roughened face on a wall face of the through hole formed in the step (b).

It is desirable that the manufacturing method of a substrate for mounting an IC chip according to the second aspect of the first group of the present invention comprises a conductor layer formation step of forming a conductor layer on a wall face of the through hole formed in the step (b).

It is desirable that the manufacturing method of a substrate for mounting an IC chip according to the second aspect of the first group of the present invention is constituted by a resin composition filling step of filling an uncured resin composition into the through hole formed in the step (b).

It is desirable that the manufacturing method of a substrate for mounting an IC chip according to the second aspect of the first group of the present invention comprises a micro lens disposition step of disposing a micro lens on an end portion of the opening formed in the step (c).

A device for optical communication according to the third aspect of the first group of the present invention is a device for optical communication comprising a substrate for mounting an IC chip and a multilayered printed circuit board, wherein an optical path for transmitting optical signal which penetrates the substrate for mounting an IC chip is formed in the substrate for mounting an IC chip.

A device for optical communication according to the fourth aspect of the first group of the present invention is a device for optical communication comprising a substrate for mounting an IC chip and a multilayered printed circuit board, wherein the multilayered printed circuit board includes a substrate and a conductor circuit, and an optical path for transmitting optical signal which penetrates at least the substrate is formed in the multilayered printed circuit board.

A device for optical communication according to the fifth aspect of the first group of the present invention is a device for optical communication comprising a substrate for mounting an IC chip and a multilayered printed circuit board, wherein an optical path for transmitting optical signal which penetrates the substrate for mounting an IC chip is formed in the substrate for mounting an IC chip, the multilayered printed circuit board includes a substrate and a conductor circuit, and an optical path for transmitting optical signal which penetrates at least the substrate is formed in the multilayered printed circuit board.

In the devices for optical communication according to the third to fifth aspects of the first group of the present invention, it is desirable that the optical path for transmitting optical signal is constituted by a cavity or constituted by a resin composition and a cavity.

In the devices for optical communication according to the third to fifth aspects of the first group of the present invention, it is also desirable that the optical path for transmitting optical signal is constituted by a cavity and a conductor layer around the cavity or is constituted by a resin composition, a cavity, and a conductor layer around the resin composition and the cavity.

In the devices for optical communication according to the third to fifth aspects of the first group of the present invention, it is desirable that a micro lens is disposed on an end portion of the optical path for transmitting optical signal.

In the devices for optical communication according to the third to fifth aspects of the first group of the present invention, it is desirable that a cross-sectional diameter of the optical path for transmitting optical signal is 100 to 500 µm.

In the devices for optical communication according to the third to fifth aspects of the first group of the present invention, it is desirable that an optical element is mounted on the substrate for mounting an IC chip and that a position at which the optical element is mounted is on a surface of the substrate for mounting an IC chip.

It is desirable that the optical element is a light receiving element and/or a light emitting element.

In the devices for optical communication according to the third to fifth aspects of the first group of the present invention, it is desirable that the substrate for mounting an IC chip includes conductor circuits, interlaminar insulating layers, and a via-hole connecting the conductor circuits across the interlaminar insulating layers.

Furthermore, in the conventional terminal device, since the distance between the IC mounting package substrate and the optical component is large, an electric wiring length is large and signal error or the like due to cross-talk noise or the like tend to occur during the transmission of a signal.

Further, in the conventional device for optical communication, the area between an optical waveguide and an optical element such as a light receiving element or a light emitting element is normally a cavity. When dust, foreign matters and the like floating in the air enters into this part, the optical signal transmission is often hampered by the foreign matters and the like, thereby often increasing the connection loss between the optical components.

Therefore, as a result of dedicated study, the present inventors found that by mounting various types of optical components on the substrate for mounting an IC chip, it is possible to realize optical communication excellent in connection reliability and contribute to making the terminal device small in size. In addition, the present inventors found that by disposing the substrate for mounting an IC chip and the multilayered printed circuit board to be opposed to each other and forming a sealing resin layer between them, it is possible to prevent the foreign matters and the like floating in the air from entering between the respective optical components and moderate the stress generated between the substrate for mounting an IC chip and the multilayered printed circuit board, thereby ensuring a device for optical communication excellent in reliability, and completed a device for optical communication according to the first aspect of the second group of the present invention and a manufacturing method of a device for optical communication according to the second aspect of the second group of the present invention.

That is, a device for optical communication according to the first aspect of the second group of the present invention is a device for optical communication comprising: a substrate for mounting an IC chip on which at least an optical element is mounted; and a multilayered printed circuit board on which at least an optical waveguide is formed, the device for optical communication being constituted to be able to transmit optical signal between the optical waveguide and the optical element, wherein a sealing resin layer is formed between the substrate for mounting an IC chip and the multilayered printed circuit board.

In the device for optical communication according to the first aspect of the second group of the present invention, it is desirable that the sealing resin layer has a transmissivity of 70%/mm or more for communication wavelength light.

It is also desirable that the sealing resin layer contains particles.

In the device for optical communication according to the first aspect of the second group of the present invention, it is desirable that the sealing resin layer contains particles.

In the device for optical communication according to the first aspect of the second group of the present invention, it is desirable that the optical element is a light receiving element and/or a light emitting element.

Further, a manufacturing method of a device for optical communication according to the second aspect of the second group of the present invention is a manufacturing method of a device for optical communication, wherein after separately manufacturing a substrate for mounting an IC chip on which at least an optical element is mounted, and a multilayered printed circuit board on which at least an optical waveguide is formed, the substrate for mounting an IC chip and the multilayered printed circuit board are disposed at and fixed to such respective positions as to be able to transmit optical signal between the optical element of the substrate for mounting an IC chip and the optical waveguide of the multilayered printed circuit board, and further, a resin composition for sealing is caused to flow between the substrate for mounting an IC chip and the multilayered printed circuit board and then a curing treatment is conducted, thereby forming a sealing resin layer.

Further, as a result of the dedicated study, the present inventors found that by disposing the substrate for mounting an IC chip on which various optical components are mounted and the multilayered printed circuit board to be confronting each other, it is possible to realize optical communication excellent in connection reliability and contribute to making the terminal device small in size, and completed a device for optical communication having the following configuration according to the first aspect of the third group of the present invention, a device for optical communication having the following configuration according to the first aspect of the fourth group of the present invention and also completed manufacturing methods of the devices for optical communication.

Moreover, the present inventors found that when a sealing resin layer is formed between the substrate for mounting an IC chip and the multilayered printed circuit board that are disposed to be confronting each other in the device for optical communication, it is possible to prevent the foreign matters and the like floating in the air from entering between the respective optical components and moderate the stress generated between the substrate for mounting an IC chip and the multilayered printed circuit board, thereby ensuring a device for optical communication excellent in reliability.

That is, a device for optical communication according to the first aspect of the third group of the present invention is a device for optical communication comprising: a substrate for mounting an IC chip having at least an area for mounting an optical element in which an optical element is mounted and a resin filled layer for an optical path is formed; and a multilayered printed circuit board at which at least an optical waveguide is formed, said device for optical communication is constituted such that optical signal can be transmitted between the optical waveguide and the optical element through the resin filled layer for an optical path.

In the device for optical communication according to the first aspect of the third group of the present invention, it is desirable that a sealing resin layer is formed between the substrate for mounting an IC chip and the multilayered printed circuit board. In this case, it is desirable that the sealing resin layer has a transmissivity of 70%/mm or more for communication wavelength light.

Further, it is desirable that the sealing resin layer contains particles.

In addition, in the device for optical communication according to the first aspect of the third group of the present invention, it is desirable that: at least one micro lens is disposed on a face of the resin filled layer for an optical path, said face confronting the multilayered printed circuit board; and that, when at least one micro lens is disposed on the face of the resin filled layer for an optical path, said face confronting the multilayered printed circuit board and the sealing resin is formed between the substrate for mounting an IC chip and the multilayered printed circuit board, the micro lens has a refractive index higher than that of the sealing resin layer.

Furthermore, in the device for optical communication according to the first aspect of the third group of the present invention, it is desirable that the optical element is a light receiving element and/or a light emitting element.

In a manufacturing method of a device for optical communication according to the second aspect of the third group of the present invention, after separately manufacturing: a substrate for mounting an IC chip having at least an area for mounting an optical element in which an optical element is mounted and a resin filled layer for an optical path is formed; and a multilayered printed circuit board at which at least an optical waveguide is formed, the substrate for mounting an IC chip and the multilayered printed circuit board are disposed at and fixed to such respective positions as to be able to transmit optical signal between the optical element of the substrate for mounting an IC chip and the optical waveguide of the multilayered printed circuit board, and further, a resin composition for sealing is made to flow between the substrate for mounting an IC chip and the multilayered printed circuit board and a curing treatment is conducted, thereby forming a sealing resin layer.

Moreover, a device for optical communication according to the first aspect of the fourth group of the present invention is a device for optical communication comprising: a substrate for mounting an IC chip at which an optical path for transmitting optical signal is formed, and on one face of said substrate an optical element is mounted; and a multilayered printed circuit board at which at least an optical waveguide is formed, said device for optical communication is constituted such that optical signal can be transmitted between the optical waveguide and the optical element through the optical path for transmitting optical signal.

In the device for optical communication according to the first aspect of the fourth group of the present invention, it is desirable that a sealing resin layer is formed between the substrate for mounting an IC chip and the multilayered printed circuit board, and that the sealing resin layer has a transmissivity of 70%/mm or more for communication wavelength light.

It is also desirable that the sealing resin layer contains particles.

Further, in the device for optical communication according to the first aspect of the fourth group of the present invention, it is desirable that: a micro lens is disposed on an end portion on at least a multilayered printed circuit board side of the optical path for transmitting optical signal; and that, in case the micro lens is disposed on the end portion on at least a multilayered printed circuit board side of the optical path for transmitting optical signal and the sealing resin layer is formed between the substrate for mounting an IC chip and the multilayered printed circuit board, the micro lens has a refractive index higher than that of the sealing resin layer.

In the device for optical communication according to the first aspect of the fourth group of the present invention, it is desirable that the optical element is a light receiving element and/or a light emitting element.

It is also desirable that a resin layer for an optical path is formed inside the optical path for transmitting optical signal.

In a manufacturing method of a device for optical communication according to the second aspect of the fourth group of the present invention, after separately manufacturing: a substrate for mounting an IC chip at which an optical path for transmitting optical signal is formed, and on one face of said substrate an optical element is mounted; and a multilayered printed circuit board at which at least an optical waveguide is formed, the substrate for mounting an IC chip and the multilayered printed circuit board are disposed at and fixed to such respective positions as to be able to transmit optical signal between the optical element of the substrate for mounting an IC chip and the optical waveguide of the multilayered printed circuit board, and further, a resin composition for sealing is made to flow between the substrate for mounting an IC chip and the multilayered printed circuit board and a curing treatment is conducted, thereby forming a sealing resin layer.

Additionally, the present inventors dedicated themselves to the study of a substrate for mounting an IC chip capable of realizing optical communication excellent in connection reliability and contributing to making the terminal device small in size. As a result, the present inventors also completed a substrate for mounting an IC chip having the following configuration according to the fifth group of the present invention.

That is, a substrate for mounting an IC chip according to the first aspect of the fifth group of the present invention is a substrate for mounting an IC chip comprising: a substrate, as serially built up on both faces thereof, a conductor circuit and an interlaminar insulating layer in an alternate fashion and in repetition; a solder resist layer formed as an outermost layer; and an optical element mounted thereto, wherein an optical waveguide is formed inside the substrate for mounting an IC chip, and an optical path for transmitting optical signal which connects the optical element to the optical waveguide is formed.

In the substrate for mounting an IC chip according to the first aspect of the fifth group of the present invention, it is desirable that the optical waveguide is an organic optical waveguide.

In the substrate for mounting an IC chip according to the first aspect of the fifth group of the present invention, it is desirable that the optical path for transmitting optical signal comprises a cavity, comprises a resin composition and a cavity or comprises a resin composition.

In the substrate for mounting an IC chip according to the first aspect of the fifth group of the present invention, it is also desirable that the optical path for transmitting optical signal comprises a cavity and a conductor layer around the cavity, comprises a resin composition, a cavity, and a conductor layer around the resin composition and the cavity or comprises a resin composition and a conductor layer around the resin composition.

In the substrate for mounting an IC chip according to the first aspect of the fifth group of the present invention, it is desirable that a position at which the optical element is mounted is on a surface of the substrate for mounting an IC chip and that the optical element is a light receiving element and/or a light emitting element.

It is also desirable that an electronic component is mounted on a surface of the substrate for mounting an IC chip.

In the substrate for mounting an IC chip according to the first aspect of the fifth group of the present invention, it is desirable that a micro lens is formed on an end portion of the optical path for transmitting optical signal or in the optical path for transmitting optical signal and that a cross-sectional diameter of the optical path for transmitting optical signal is 100 to 500 μm.

In the substrate for mounting an IC chip according to the first aspect of the fifth group of the present invention, it is desirable that the conductor circuits across the substrate are connected to each other through a plated-through hole, and the conductor circuits across the interlaminar insulating layers are connected to each other through a via-hole.

In a manufacturing method of a substrate for mounting an IC chip according to the second aspect of the fifth group of the present invention, a substrate, an optical waveguide, and a lamination manufactured through at least the following steps (a) to (c) are built up in this order: (a) a conductor circuit lamination formation step of serially building up conductor circuits and interlaminar insulating layers on a base material layer in an alternate fashion and in repetition to provide a conductor circuit lamination; (b) an opening formation step of forming an opening which becomes an optical path for transmitting optical signal in the conductor circuit lamination; and (c) a solder resist layer formation step of forming a solder resist layer having an opening communicating with the opening formed in the step (b), on one face of the conductor circuit lamination.

A manufacturing method of a substrate for mounting an IC chip according to the third aspect of the fifth group of the present invention comprises: (a) an optical waveguide formation step of forming an optical waveguide on a substrate on which conductor circuits are formed; (b) a multilayered circuit board manufacturing step of serially building up interlaminar insulating layers and conductor circuits on the substrate, on which the optical waveguide is formed, in an alternate fashion and in repetition to provide a multilayered circuit board; (c) an opening formation step of forming an opening which becomes an optical path for transmitting optical signal in the multilayered circuit board; and (d) a solder resist layer formation step of forming a solder resist layer having an opening communicating with the opening formed in the step (c) on one face of the multilayered circuit board.

It is desirable that the manufacturing method of a substrate for mounting an IC chip according to the second or third aspect of the fifth group of the present invention comprises: a roughened face formation step of forming a roughened face on a wall face of the opening which becomes the optical path for transmitting optical signal.

Further, it is desirable that the manufacturing method of a substrate for mounting an IC chip according to the second or third aspect of the fifth group of the present invention comprises: a conductor layer formation step of forming a conductor layer on a wall face of the opening which becomes the optical path for transmitting optical signal.

It is desirable that the manufacturing method of a substrate for mounting an IC chip according to the second or third aspect of the fifth group of the present invention comprises: a resin composition filling step of filling an uncured resin composition into the opening which becomes the optical path for transmitting optical signal.

It is desirable that the manufacturing method of a substrate for mounting an IC chip according to the second or third aspect of the fifth group of the present invention comprises: a micro lens formation step of forming a micro lens on an end portion of the opening which becomes the optical path for transmitting optical signal.

It is desirable that the manufacturing method of a substrate for mounting an IC chip according to the second or third aspect of the fifth group of the present invention comprises: a micro lens formation step of forming a micro lens in the opening which becomes the optical path for transmitting optical signal.

EXPLANATION OF SYMBOLS

Figure 1:
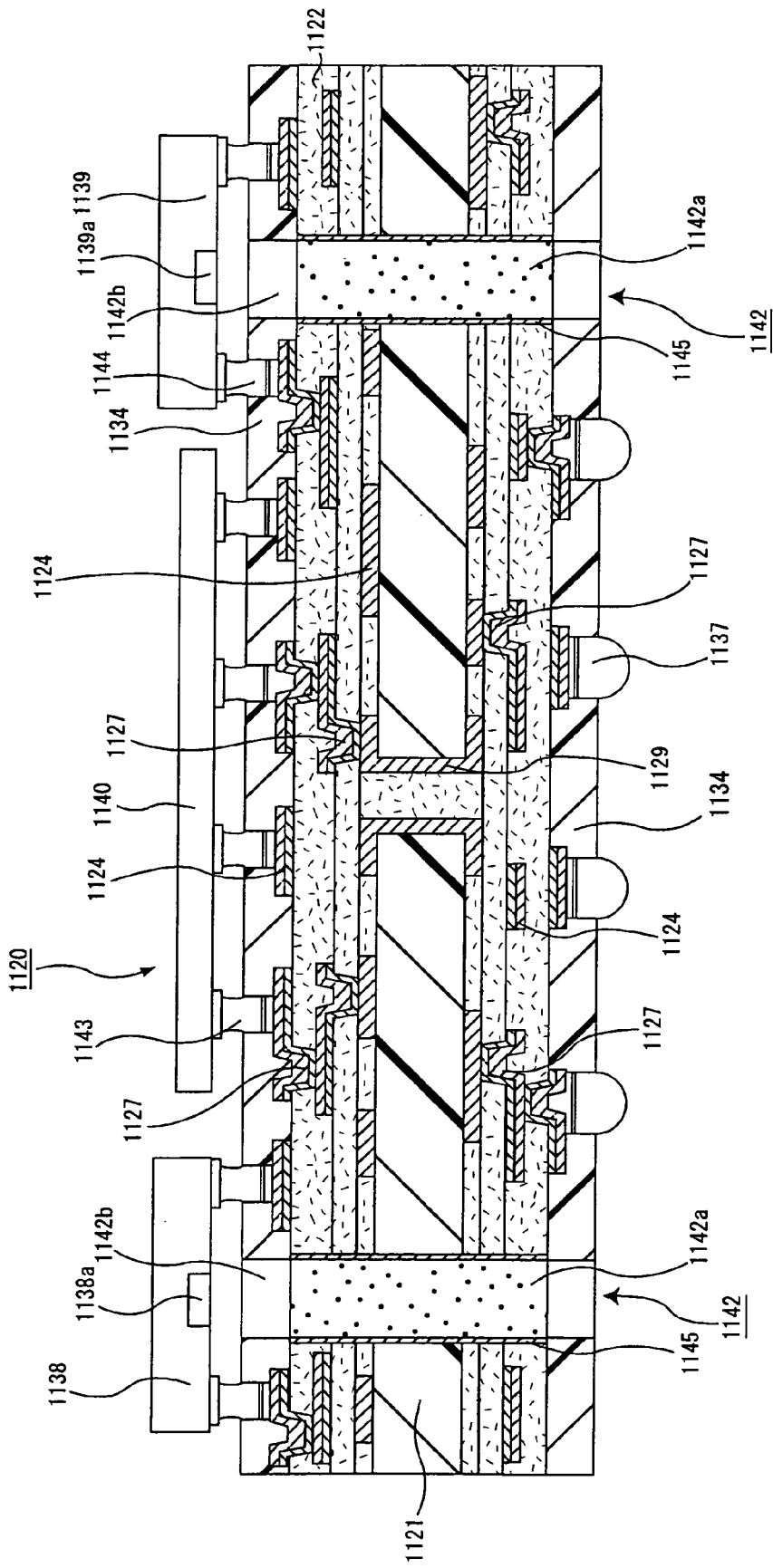
FIG. 1 is a cross-sectional view schematically showing one embodiment of a substrate for mounting an IC chip according to the first aspect of the first group of the present invention.

1020 substrate for mounting IC chip
1021 substrate
1022 interlaminar insulating layer
1024 conductor circuit
1027 via-hole
1029 plated-through hole
1034 solder resist layer
1038 light receiving element
1039 light emitting element
1120, 1120' substrate for mounting IC chip
1121 substrate
1122 interlaminar insulating layer
1124 conductor circuit
1127 via-hole
1129 plated-through hole
1134 solder resist layer
1138 light receiving element
1139 light emitting element
1140 IC chip
1142 optical path for transmitting optical signal
1145 conductor layer
30100, 30200, 30300 multilayered printed circuit board
30101, 30201, 30301 substrate
30102, 30202, 30302 interlaminar insulating layer
30104, 30204, 30304 conductor circuit
30107, 30207, 30307 via-hole
30109, 30209, 30309 plated-through hole
30111, 30211, 30311 opening for optical path
30114, 30214, 30314 solder resist layer
30118, 30218, 30318 optical waveguide
30119, 30219, 30319 optical path conversion mirror
30120, 30220, 30320 substrate for mounting IC chip
31120, 32120, 33120 package substrate
31100, 32100, 33100 substrate for inserting optical element
31121, 32121, 33121 substrate
31122, 32122, 33122 interlaminar insulating layer
31124, 32124, 33124 conductor circuit
31127, 32127, 33127 via-hole
31129, 32129, 33129 plated-through hole
31134, 32134, 33134 solder resist layer
31138, 32138, 33138 light receiving element
31139, 32139, 33139 light emitting element
30140, 30240 IC chip
31141, 32141 resin filled layer for optical path
30150, 30250, 30350 device for optical communication
30160, 30260, 30360 sealing resin layer
4100, 4200, 4300 multilayered printed circuit board
4101, 4201, 4301 substrate
4102, 4202, 4302 interlaminar insulating layer
4104, 4204, 4304 conductor circuit
4107, 4207, 4307 via-hole
4109, 4209, 4309 plated-through hole
4111, 4211 opening for optical path
4114, 4214, 4314 solder resist layer
4118, 4218, 4318 optical waveguide
4119, 4219, 4319 optical path conversion mirror
4120, 4220, 4320 substrate for mounting IC chip
4121, 4221, 4321 substrate
4122, 4222, 4322 interlaminar insulating layer
4124, 4224, 4324 conductor circuit
4127, 4227, 4327 via-hole
4129, 4229, 4329 plated-through hole
4134, 4234, 4334 solder resist layer
4137, 4237, 4337 solder connection part
4138, 4238, 4338 light receiving element
4139, 4239, 4339 light emitting element
4140 IC chip
4141, 4241, 4341, 4351 optical path for transmitting optical signal
4142, 4242, 4342, 4352 resin layer for optical path
4145, 4245, 4345, 4355 conductor layer
4150, 4250, 4350 device for optical communication
4160, 4260, 4360 sealing resin layer
5020, 5120, 5220, 5320 substrate for mounting IC chip
5021, 5121, 5221, 5321 substrate
5022, 5122, 5222, 5322 interlaminar insulating layer
5024, 5124, 5224, 5324 conductor circuit
5027, 5127, 5227, 5327 via-hole
5029, 5129, 5229, 5329 plated-through hole
5031 base material layer
5034, 5134, 5234, 5334 solder resist layer
5038, 5138, 5238, 5338 light receiving element
5039, 5139, 5239, 5339 light emitting element
5240, 5340 IC chip
5242, 5342 optical path for transmitting optical signal
5045, 5245, 5345 conductor layer
5050, 5150, 5250, 5350 optical waveguide

DETAILED DISCLOSURE OF THE INVENTION

First, a substrate for mounting an IC chip according to the first aspect of the first group of the present invention will be described.

The substrate for mounting an IC chip according to the first aspect of the first group of the present invention is a substrate for mounting an IC chip comprising: a substrate and, as serially built up on both faces thereof, a conductor circuit and an interlaminar insulating layer in an alternate fashion and in repetition; a solder resist layer formed as an outermost layer; and an optical element mounted thereto, wherein an optical path for transmitting optical signal, which penetrates the substrate for mounting an IC chip, is disposed.

Since the optical elements are mounted on the substrate for mounting an IC chip according to the first aspect of the first group of the present invention and the optical paths for transmitting optical signal penetrating the substrate for mounting an IC chip are disposed therein, it is possible to transmit input and output signals for the optical elements through the optical paths for transmitting optical signal.

In addition, when an IC chip is mounted on the substrate for mounting an IC chip, the distance between the IC chip and the optical elements is short and the reliability of the transmission of an electric signal is excellent. Specifically, when the optical element is a light receiving element, it is possible to accurately, swiftly process a large capacity of optical signal. When the optical element is a light emitting element, it is possible to swiftly transmit optical signal to the outside of the substrate for mounting an IC chip.

Further, in the substrate for mounting an IC chip on which the IC chip is mounted according to the first aspect of the first group of the present invention, since electronic components and optical elements necessary for optical communication can be provided integrally, it is possible to contribute to making a terminal device for optical communication small in size.

When the optical elements are to be mounted on the surface of the substrate, the optical elements are mounted thereon after forming conductor circuits and interlaminar insulating layers on the substrate for mounting an IC chip. Due to this, at the time of a heat treatment for forming the conductor circuits, the interlaminar insulating layers and the like, the optical elements are not mounted yet and thus positional deviation which may possibly occur during the heat treatment does not occur.

Moreover, when the optical elements are mounted on the surface of the substrate and a defect occurs to one of the optical elements, it suffices to replace only the defective optical element, thus advantageously ensuring good cost efficiency.

Moreover, in the substrate for mounting an IC chip according to the first aspect of the first group of the present invention, the alignment of the optical elements can be carried out relative to the optical paths for transmitting optical signal by an optical treatment or a mechanical treatment. It is, therefore, possible to accurately mount the optical elements at respective desired positions.

Furthermore, in the substrate for mounting an IC chip on which the optical paths for transmitting optical signal are formed according to the first aspect of the first group of the present invention, when the optical elements are to be mounted, the degree of freedom for the mounting positions of the optical elements is improved so as to make it possible to realize the high density of wirings for the substrate for mounting an IC chip. This is because the improvement of the degree of freedom for the mounting positions of the optical elements enables widening free space in the design of the substrate for mounting an IC chip.

The free space means a region in which conductor circuits are formed and electronic components such as a capacitor are mounted.

In the substrate for mounting an IC chip according to the first aspect of the first group of the present invention, the optical paths for transmitting optical signal which penetrates the substrate for mounting an IC chip are disposed.

In the substrate for mounting an IC chip on which such optical paths for transmitting optical signal are disposed, information can be exchanged between the optical elements mounted on the both faces of the substrate for mounting an IC chip by optical signal through these optical paths for transmitting optical signal.

In addition, in the substrate for mounting an IC chip, the optical elements are mounted on one surface of the substrate and the other surface thereof is connected to an external substrate having the other optical elements mounted thereon through solders and the like. Due to this, information can be exchanged between the optical elements mounted on the substrate for mounting an IC chip and those mounted on the external substrate through the optical paths for transmitting optical signal.

The optical path for transmitting optical signal desirably is constituted by a vacancy. When the optical path for transmitting optical signal is constituted by a vacancy, it is easy to form the optical path for transmitting optical signal and it is difficult to cause transmission loss to occur in the transmission of optical signal through the optical paths for transmitting optical signal. Whether the optical path for transmitting optical signal is constituted out of a vacancy or not may be appropriately determined based on the thickness of the substrate for mounting an IC chip and the like.

It is also desirable that the optical path for transmitting optical signal is constituted by a resin composition and a vacancy. When the optical path for transmitting optical signal is constituted by a resin composition and a vacancy, it is possible to prevent the deterioration of the strength of the substrate for mounting an IC chip.

When the optical path for transmitting optical signal is constituted by a resin composition and a vacancy, it is desirable that the optical path for transmitting optical signal formed in a portion penetrating the substrate and the interlaminar insulating layers is constituted by the resin composition, and the optical path for transmitting optical signal formed in the solder resist layer is constituted by the vacancy. This is because, normally, the substrate and the interlaminar insulating layers are high in adhesion to resin and the solder resist layer is low in adhesion thereto.

It is also desirable that the optical path for transmitting optical signal is constituted by a resin composition. When the optical path for transmitting optical signal is constituted by a resin composition, it is possible to prevent the deterioration of the strength of the substrate for mounting an IC chip.

When the optical path for transmitting optical signal is constituted by the resin composition, it is possible to prevent dust, foreign matters and the like from entering the optical path for transmitting optical signal. It is, therefore, possible to prevent the transmission of optical signal from being hampered by the presence of the dust, the foreign matters and the like.

In addition, the optical paths for transmitting optical signal constituted as mentioned above, i.e., the optical path for transmitting optical signal constituted by both/either of a vacancy and/or a resin composition is difficult to cause an adverse influence by heat and the like (e.g., the cross-sectional diameter of each optical path for transmitting optical signal is made small) in a heat treatment step or a reliability test.

When a part of or all of the optical path for transmitting optical signal is constituted by a resin composition, the resin component of the resin composition is not limited to specific one as long as the resin component is less absorbed in a communication wavelength band. Examples of the resin component include thermosetting resin, thermoplastic resin, photosensitive resin, resin obtained by photosensitizing a part of thermosetting resin and the like.

Specifically, examples of the resin component include epoxy resin, UV cured-type epoxy resin, polyolefin resin, acrylic resin such as PMMA (polymethyl methacrylate), PMMA deuteride and PMMA deuteride fluoride; polyimide resin such as polyimide fluoride; silicone resin such as silicone resin deuteride; polymer produced from benzocyclobutene and the like.

Further, the resin composition may contain particles such as resin particles, inorganic particles and metal particles in addition to the resin component. By incorporating these particles in the resin composition, it is possible to match the thermal expansion coefficients of the optical waveguide, the substrate, the interlaminar insulating layers, the solder resist layers and the like and impart flame resistance to the resin composition depending on the types of the particles.

When particles are mixed in the resin composition, it is desirable that the refractive index of the particles is almost equal to that of the resin component of the resin composition. Therefore, when two kinds of particles having different refractive index from each other are mixed with each other, it is desirable that the refractive index of the particles is almost equal to that of the resin component of the resin composition.

Specifically, when the resin component is, for example, epoxy resin having a refractive index of 1.53, it is desirable to use a mixture of silica particles having a refractive index of 1.54 and titania particles having a refractive index of 1.52.

Examples of a method of mixing up the particles include a kneading method and a method of dissolving and mixing up two or more kinds of particles and then forming them into particle shape.

Examples of the resin particles include thermosetting resin, thermoplastic resin, photosensitive resin, resin obtained by photosensitizing a part of thermosetting resin, a resin complex composed of thermosetting resin and thermoplastic resin, a complex composed of photosensitive resin and thermoplastic resin and the like.

Specifically, they include thermosetting resin such as epoxy resin, phenol resin, polyimide resin, bismaleimide resin, polyphenylene resin, polyolefin resin and fluororesin; resin obtained by reacting the thermosetting group of thermosetting resin (e.g., the epoxy group of epoxy resin) with an methacrylic acid, an acrylic acid or the like to impart an acrylic group to the resin; thermoplastic resin such as phenoxy resin, polyethersulfone (PES), polysulfone (PSF), polyphenylenesulfone (PPS), polyphenylene sulfide (PPES), polyphenyl ether (PPE) and polyetherimide (PI); photosensitive resin such as acrylic resin and the like.

Further, a resin complex of the thermosetting resin and the thermoplastic resin or a resin complex of the thermoplastic resin with the acrylated resin or the photosensitive resin can be used.

As the resin particles, resin particles of rubber can be also used.

In addition, examples of the inorganic particles include aluminum compounds such as alumina and aluminum hydroxide; calcium compounds such as calcium carbonate and calcium hydroxide; potassium compounds such as potassium carbonate; magnesium compounds such as magnesia, dolomite and basic magnesium carbonate; silicon compounds such as silica and zeolite; titanium compounds such as titania and the like. Further, the inorganic particles comprising a material obtained by mixing silica and titania with a certain rate, dissolving and making them even may be used.

As the inorganic particles, those of phosphorus or phosphorus compounds can be used.

Examples of the metal particles include Au, Ag, Cu, Pd, Ni, Pt, Fe, Zn, Pb, Al, Mg, Ca, Ti and the like.

These resin particles, inorganic particles and metal particles may be used alone or in combination of two or more of them.

The particles are desirably inorganic particles, which is desirably silica, titania or alumina. It is also desirable to use particles having a mixture composition obtained by mixing and dissolving at least two kinds among silica, titania and alumina.

The shape of the particles such as the resin particles is not limited to specific one and examples of the particles include a spherical shape, an elliptic shape, a friable shape, a polygonal shape and the like.

The particle diameter of the particles is desirably smaller than a communication wavelength. When the particle diameter is larger than the communication wavelength, the transmission of optical signal is sometimes hampered.

The lower limit and upper limit of the particle diameter are desirably 0.01 µm and 0.8 µm, respectively. When the particles include those exceeding the range, a particle size distribution becomes too wide. At the time of mixing the particles into the resin composition, the variation of the viscosity of the resin composition grows, thereby deteriorating reproducibility in preparing the resin composition and making it difficult to prepare a resin composition having a predetermined viscosity. The viscosity of the resin composition prepared at the time of forming the optical paths for transmitting optical signal is desirably 100000 to 300000 cps (mP·s).

The lower limit and upper limit of the particle diameter are more desirably 0.1 µm and 0.8 µm, respectively. When the particle diameter falls within the range, the resin composition is ensured to be filled into a through hole at the time of applying and filling the resin composition thereto using a spin coater or a roll coater. In addition, at the time of preparing the resin composition into which particles are mixed, it becomes easier to adjust the resin composition to have a predetermined viscosity.

The lower limit and upper limit of the particle diameter are particularly desirably 0.2 µm and 0.6 µm, respectively. When the particle diameter falls within the range, it becomes easier to fill the resin composition particularly into the through holes. Besides, the variation of the optical waveguides thus formed is minimized, ensuring particularly excellent characteristics of the substrate for mounting an IC chip.

When the particles having particle diameters within this range are used, two or more kinds of particles having different particle diameters may be included.

In this specification, the particle diameter means the length of the longest portion of a particle.

The lower limit of the mixing quantity of the particles is desirably 10% by weight, more desirably 20% by weight. On the other hand, the upper limit thereof is desirably 50% by weight, more desirably 40% by weight.

When the mixing quantity of the particles is less than 10% by weight, the effect of mixing particles cannot be sometimes expected. When it exceeds 50% by weight, the transmission of optical signal is sometimes hampered. When the mixing quantity falls within the range of 20 to 40% by weight, even the occurrence of the aggregation or dispersion of particles does not influence optical signal transmission characteristic.

Further, the shape of the optical paths for transmitting optical signal is not limited to a specific one and examples of the shape include columnar, elliptical columnar, quadrangular columnar, polygonal columnar or the like.

Among them, the columnar shape is desirable. This is because the influence of this shape on the transmission of optical signal is the smallest and it is easy to form the optical path into a columnar shape.

The lower limit and upper limit of the cross-sectional diameter of the optical path for transmitting optical signal are desirably 100 µm and 500 µm, respectively. When the cross-sectional diameter is less than 100 µm, the optical path may possibly be closed. When at least a part of the optical path for transmitting optical signal is constituted by a resin composition, it is difficult to fill the optical path with an uncured resin composition. On the other hand, even when the cross-sectional diameter exceeds 500 µm, the optical signal transmission characteristic does not improve so greatly and such a large cross-sectional diameter often hampers the degree of freedom for the design of conductor circuits and the like that constitute the substrate for mounting an IC chip.

The lower limit and upper limit of the cross-sectional diameter are more desirably 250 µm and 350 µm, respectively. When they fall within this range, both the optical signal transmission characteristic and the degree of freedom for design are excellent and no problem occurs even when the optical path is filled with the uncured resin composition.

The cross-sectional diameter of the optical path for transmitting optical signal means the diameter of a cross section when the optical path for transmitting optical signal is cylindrical, the longer diameter of the cross section when the optical path for transmitting optical signal is elliptic, and the length of the longest portion of the cross section when the optical path for transmitting optical signal is prismatic or polygonal.

It is also desirable that the optical path for transmitting optical signal is constituted by a vacancy and a conductor layer around the vacancy.

It is further desirable that the optical path for transmitting optical signal is constituted by a resin composition and a conductor layer around the resin composition.

In addition, it is desirable that the optical path for transmitting optical signal is constituted by a resin composition, a vacancy and a conductor layer around these.

When the conductor layer is to be formed, the conductor layer may be formed entirely around the resin composition and/or the vacancy or may be formed only partially around the resin composition and/or the vacancy.

In this way, by forming the conductor layer on the optical path for transmitting optical signal, it is possible to decrease the irregular reflection of light on the wall faces of the optical path for transmitting optical signal and improve the optical signal transmission characteristic. The conductor layer may be composed of one layer or two or more layers.

Examples of a material for the conductor layer include copper, nickel, chromium, titanium, noble metal and the like.

Further, the conductor layer can often serve as a plated-through hole, i.e., serve to electrically connect the conductor circuits which interpose the substrate therebetween or the conductor circuits which interpose the substrate and the interlaminar insulating layers therebetween.

The material for the conductor layer is desirably metal having glossiness such as noble metal. When the conductor layer is formed out of metal having glossiness, optical signal loss is less and the transmission of optical signal is less hampered. Due to this, it is possible to further ensure that the optical signal is transmitted through the optical paths for transmitting optical signal.

Furthermore, a covering layer made of tin, titanium, zinc or the like or a roughened layer may be provided on the conductor layer. Depending on the kind (wavelength or the like) of optical signal to be transmitted through the optical paths for transmitting optical signal, it is desirable to suppress the irregular reflection of light on the wall faces of the optical paths for transmitting optical signal. By providing the covering layer or roughened layer and, thereby, decreasing the irregular reflection of light on the wall faces, it is sometimes possible to improve the optical signal transmission characteristic.

Moreover, by forming the roughened layer or the like on the wall faces of each optical path for transmitting optical signal, it is possible to further improve the adhesion between the optical path for transmitting optical signal and the substrate or the interlaminar insulating layer.

In addition, the optical path for transmitting optical signal constituted by the resin composition (including a portion of the optical path for transmitting optical signal constituted by a vacancy and a resin composition, which portion is constituted by the resin composition) or the conductor layer may contact with the substrate or the interlaminar insulating layer through the roughened layer. When the optical path for transmitting optical signal or the like contacts with the substrate or the interlaminar insulating layer through the roughened layer, the adhesion thereof to the substrate or the interlaminar insulating layer is excellent to make it more difficult to cause the optical path for transmitting optical signal or the like to be peeled off.

In the substrate for mounting an IC chip, both an optical path for transmitting optical signal for light reception and an optical path for transmitting optical signal for light emission may be formed as the optical paths for transmitting optical signal or only one of them may be formed. Accordingly, in the substrate for mounting an IC chip, a plurality of optical paths for transmitting optical signal may be formed.

The optical path for transmitting optical signal for light reception is intended to transmit an external optical signal transmitted through an optical fiber, an optical waveguide or the like to the light receiving element, whereas the optical path for transmitting optical signal for light emission is intended to transmit optical signal emitted from the light emitting element to an external optical fiber, optical waveguide or the like.

In the substrate for mounting an IC chip, each optical path for transmitting optical signal may be formed for each communication wavelength.

Furthermore, the optical elements such as the light receiving element or the light emitting element are mounted on the substrate for mounting an IC chip according to the first aspect of the first group of the present invention.

Examples of the light receiving element include a PD (photodiode), an APD (avalanche photodiode) and the like.

They may be appropriately selected based on the configuration of the substrate for mounting an IC chip, required characteristics and the like.

Examples of a material for the light receiving element include Si, Ge, InGaAs and the like.

Among them, InGaAs is desirable because of its excellent light receiving sensitivity.

Examples of the light emitting element include an LD (semiconductor laser), a DFB-LD (distributed feedback type semiconductor laser), an LED (light emitting diode) and the like.

They may be appropriately selected based on the configuration of the substrate for mounting an IC chip, required characteristics and the like.

Examples of a material for the light emitting element include a compound of gallium, arsenic and phosphorus (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorus (InGaAsP) and the like.

They may be selected based on the communication wavelength. When the communication wavelength is in a 0.85 μm band, GaAlAs can be used. When the communication wavelength is in a 1.3 μm band or a 1.55 μm band, InGaAs or InGaAsP can be used.

Further, the positions at which the optical elements are mounted are desirably on the surface of the substrate for mounting an IC chip. As mentioned above, when the optical elements are mounted on the surface of the substrate for mounting an IC chip and a defect occurs to one of the optical elements, it suffices to replace only the defective optical element. The optical elements are desirably flip-chip type optical elements. This is because flip-chip type optical elements are easy to be replaced and easy to mount at more desirable positions by the self-alignment function at the time of mounting them.

When the optical elements mounting positions are on the surface of the substrate for mounting an IC chip, it is possible to align each optical element relative to each optical path for transmitting optical signal set as an origin as mentioned above.

Furthermore, when the optical elements mounting positions are on the surface of the substrate for mounting an IC chip, it is possible to avoid a problem that occurs to the conventional optical element-internalizing package substrate, i.e., the positional deviation of the optical elements.

In the conventional substrate for mounting an IC chip, an area for mounting an optical element such as a light receiving element and a light emitting element is formed on the substrate in advance and the optical elements are attached to this substrate. Thereafter, by subjecting embedding-resin to filling, curing and the like, the optical elements are mounted. When the optical elements are mounted in such a manner, the positional deviation of the optical elements tends to occur by the influence of heat applied during: the curing treatment of the interlaminar insulating layers and the solder resist layers; the reflow treatment of the solder paste and the like, a stress derived from the warping of the substrate and the rocking of the substrate during a plating treatment and the like.

Furthermore, when the optical elements are mounted using adhesive or solder, this adhesive or solder is often softened by the heat history in later steps and the positional deviation of the optical elements occur, accordingly.

However, when the optical elements are mounted on the surface of the substrate for mounting an IC chip, it is possible to avoid problems that cause such a stress and a positional deviation. This is because the strength of the substrate for mounting an IC chip is maintained as compared with that of the conventional substrate for mounting an IC chip.

When the optical elements are mounted on the surface of the substrate for mounting an IC chip, the face on which the optical elements are mounted may be the same as the face on which an IC chip is mounted or opposite thereto. In addition, when a plurality of optical elements are mounted on the substrate for mounting an IC chip, all of them may not be mounted on the same face.

Electronic components such as a capacitor and the like may be mounted on the surface of the substrate for mounting an IC chip. This is because it is possible to replace only a defective electronic component similarly to the optical elements.

In the substrate for mounting an IC chip, it is also desirable that the conductor circuits with the substrate interposed therebetween are connected to each other through a plated-through hole and the conductor circuits with the interlaminar insulating layers interposed therebetween are connected to each other through a via-hole.

This is because it is possible to realize the high density of the substrate for mounting an IC chip.

Further, by appropriately selecting the positions at which the conductor circuits and the via-holes are formed, it is possible to moderate a stress generated due to the difference in thermal expansion coefficient among the IC chip, the optical elements and the like.

Next, the embodiments of the substrate for mounting an IC chip according to the first aspect of the first group of the present invention will be described with reference to the drawings.

FIG. 1 is a cross-sectional-view schematically showing one embodiment of the substrate for mounting an IC chip according to the first aspect of the first group of the present invention. FIG. 1 shows the substrate for mounting an IC chip in a state where an IC chip is mounted.

As shown in FIG. 1, the substrate for mounting an IC chip 1120 is constituted such that conductor circuits 1124 and interlaminar insulating layers 1122 are serially built up on both faces of a substrate 1121 in an alternate fashion and in repetition and that the conductor circuits with the substrate 1120 interposed therebetween and the conductor circuits with the interlaminar insulating layers 1122 interposed therebetween are connected to one another by a plated-through hole 1129 and via-holes 1127, respectively. In addition, a solder resist layer 1134 is formed on each outermost layer of the substrate for mounting an IC chip 1120.

Further, optical paths for transmitting optical signal 1142 penetrating the substrate 1121, on which the conductor circuits 1124, the interlaminar insulating layers 1122 and the solder resist layers are formed, are formed in this substrate for mounting an IC chip 1120. The optical path for transmitting optical signal 1142 is constituted by a resin composition 1142a, a vacancy 1142b, and a conductor layer 1145 formed around the resin composition 1142a and the vacancy 1142b. Input/output signals for optical elements (a light receiving element 1138 and a light emitting element 1139) mounted on the substrate for mounting an IC chip 1120 are transmitted through the optical paths for transmitting optical signal.

It is noted that each optical path for transmitting optical signal may be composed of the vacancy or the resin composition, and the conductor layer may not be formed around the vacancy or the resin composition.

The light receiving element 1138 and the light emitting element 1139 are mounted through solder connection parts 1144 so that a light receiving part 1138a and a light emitting part 1139a are confronting the optical paths for transmitting optical signal 1142, respectively, and an IC chip 1140 is mounted through solder connection parts 1143 on one face of the substrate for mounting an IC chip 1120. Further, solder bumps 1137 are formed on the solder resist layer 1134 on the other face of the substrate for mounting an IC chip 1120.

In the substrate for mounting an IC chip 1120 thus constituted, optical signal transmitted from the outside through an optical fiber, an optical waveguide or the like (not shown) is received by the light receiving element 1138 (light receiving part 1138a) through the optical path for transmitting optical signal 1142, converted into an electric signal by the light receiving element 1138, and then fed to the IC chip 1140 through the solder connection parts 1143 and 1144, the conductor circuits 1124, the via-holes 1127, the plated-through hole 1129 and the like.

An electric signal emitted from the IC chip 1140 is transmitted to the light emitting element 1139 through the solder connection parts 1143 and 1144, the conductor circuits 1124, the via-holes 1127, the plated-through hole 1129 and the like, and converted into optical signal by the light emitting element 1139. The optical signal transmitted from the light emitting element 1139 (light emitting part 1139a) is transmitted to the external optical component (such as the optical fiber or the optical waveguide) through the optical path for transmitting optical signal 1142.

In the substrate for mounting an IC chip according to the first aspect of the first group of the present invention, the light receiving element and the light emitting element mounted on positions close to the IC chip perform optical/electric signal conversion. Therefore, an electric signal transmission distance is short, the reliability of signal transmission is excellent and it is thereby possible to deal with higher rate communication.

In addition, in the substrate for mounting an IC chip 1120, the solder bumps 1137 are formed on the solder resist layer 1134. Due to this, not only the electric signal emitted from the IC chip is converted into optical signal as mentioned above and transmitted to the outside through the optical path for transmitting optical signal 1142 and the like but also the electric signal is transmitted through the solder bumps.

When the solder bumps are formed as mentioned above, it is possible to connect the substrate for mounting an IC chip to an external substrate through the solder bumps. In this case, it is possible to dispose the substrate for mounting an IC chip at a predetermined position by the self-alignment function of solders.

The self-alignment function means a function that a solder is to be present near the center of an opening for forming a solder bump in a more stable form due to the mobility of the solder itself at the time of the reflow treatment. It is considered that this function is generated because surface tension strongly acts so that the solder wants to be spherical when the solder adheres to metal. In case of utilizing this self-alignment function, even when the positions of the substrate for mounting an IC chip and the external substrate are deviated before reflow at the time of connecting the substrate for mounting an IC chip to the external substrate through the solder bumps, the substrate for mounting an IC chip moves during the reflow and can be attached to an accurate position on the external substrate.

Accordingly, when optical signal is to be transmitted through the light receiving element and the light emitting element mounted on the substrate for mounting an IC chip and optical elements mounted on the external substrate, it is possible to accurately transmit the optical signal between the substrate for mounting an IC chip and the external substrate as long as the positions at which the light receiving element and the light emitting element are mounted on the substrate for mounting an IC chip are accurate.

In the substrate for mounting an IC chip according to the first aspect of the first group of the present invention, it is further desirable that micro lenses are disposed on the end portions of the optical paths for transmitting optical signal, respectively. When the micro lenses are disposed, it is possible to further suppress optical signal transmission loss.

The micro lens is not limited to a specific one and examples of the micro lens include a lens ordinarily used as an optical lens. Specific examples of a material for the micro lens include optical glass, resin for an optical lens and the like.

Examples of the resin for an optical lens include acrylic resin such as PMMA (polymethyl methacrylate), PMMA deuteride and PMMA deuteride fluoride; polyimide resin such as polyimide fluoride; epoxy resin; UV cured-type epoxy resin; silicone resin such as silicone resin deuteride; polymer produced from benzocyclobutene and the like.

The shape of the micro lens is not limited to a specific one but may be appropriately selected based on the design of the substrate for mounting an IC chip. Normally, the micro lens has a diameter of 100 to 500 μm and a thickness of 200 μm or less. Since the micro lens is normally small as mentioned above, no cracks occur to the micro lens even when heat is applied thereto.

Particles may be added to the micro lens and the quantity of the added particles is desirably 60% by weight or less.

When particles are added to the micro lens, it is desirable that the resin for an optical lens is equal in refractive index to the particles. For that reason, when the particles are added to the resin for an optical lens, it is desirable to mix two kinds of particles having different refractive indexes to make the refractive index of the particles almost equal to that of the resin for an optical lens.

Specifically, when the resin for an optical lens is, for example, epoxy resin having a refractive index of 1.53, it is desirable to mix silica particles having a refractive index of 1.54 and titania particles having a refractive index of 1.52.

Specific examples of the particles include the same as those contained in the optical paths for transmitting optical signal.

The substrate for mounting an IC chip having the micro lenses disposed on the end portions of the respective optical paths for transmitting optical signal will be described with reference to the drawings.

Figure 2:
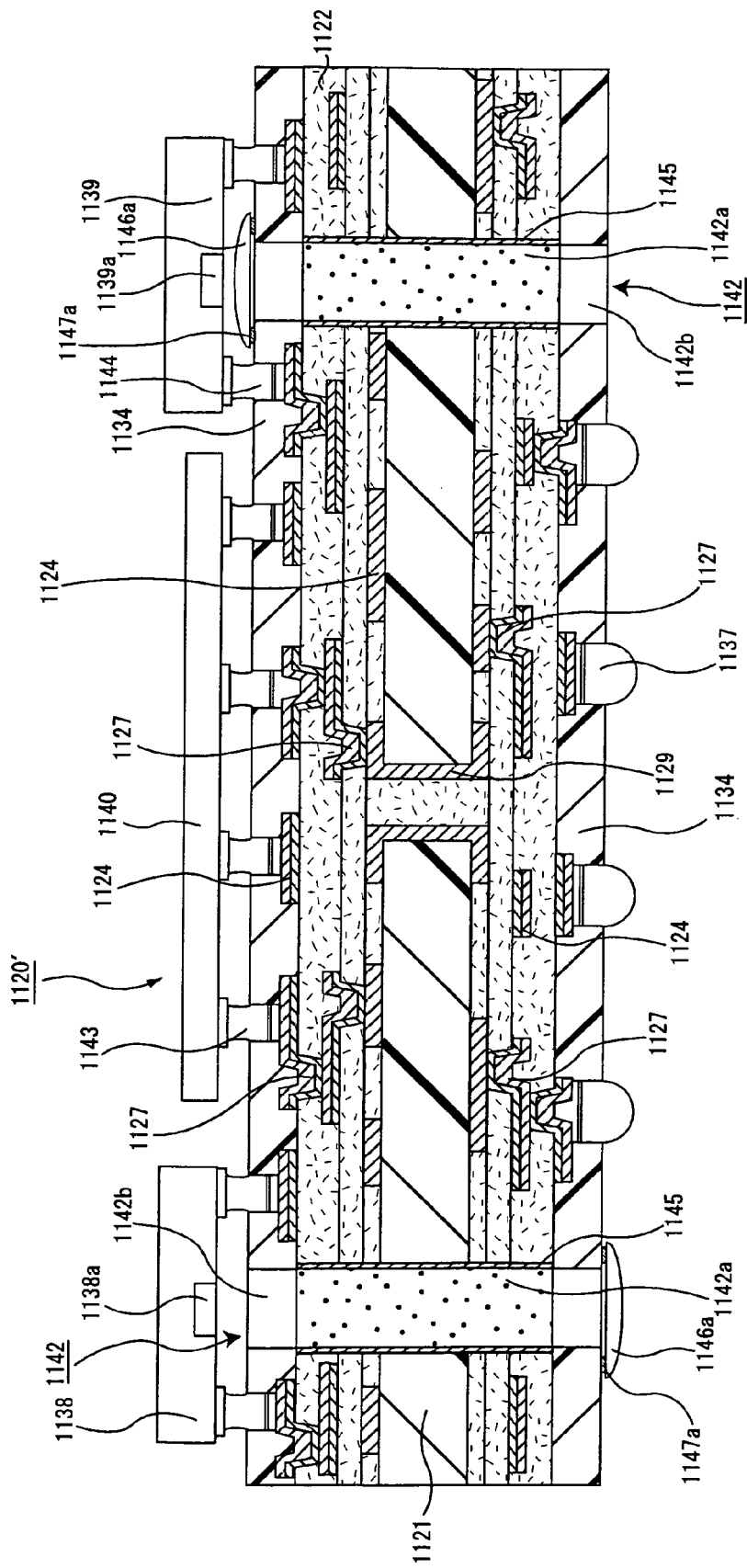
FIG. 2 is a cross-sectional view schematically showing another embodiment of the substrate for mounting an IC chip according to the first aspect of the first group of the present invention.

FIG. 2 is a cross-sectional view schematically showing another embodiment of the substrate for mounting an IC chip according to the first aspect of the first group of the present invention. It is noted that FIG. 2 shows the substrate for mounting an IC chip in a state where an IC chip is mounted.

The substrate for mounting an IC chip 1120' shown in FIG. 2 is constituted such that micro lenses 1146a and 1146b are disposed on the end portions of the respective optical paths for transmitting optical signal 1142, which are constituted by the resin composition 1142a, the vacancy 1142b and the conductor layer 1145, through adhesive layers 1147a and 1147b, respectively.

By thus disposing the micro lenses, it is possible to suppress the optical signal transmission loss.

The embodiment of the substrate for mounting an IC chip 1120' is equal to the substrate for mounting an IC chip 1120 shown in FIG. 1 except that the micro lenses 1146a and 1146b are disposed.

Further, in the substrate for mounting an IC chip 1120', the micro lens 1146b confronting the light emitting element 1139 is disposed on the light emitting element 1139 side of the optical path for transmitting optical signal 1142. Alternatively, the position at which the micro lens is disposed may be opposite to the light emitting element 1139 side of the optical path for transmitting optical signal 1142.

The micro lens 1146a confronting the light receiving element 1138 is desirably disposed on the opposite side to the light receiving element 1138 side of the optical path for transmitting optical signal 1142.

The positions at which the micro lenses are disposed are not limited to the end portions of the respective optical paths for transmitting optical signal. When the micro lenses are disposed on the respective optical paths for transmitting optical signal each of which is constituted by the resin composition and the vacancy or is constituted by the resin composition, the vacancy and the conductor layer around these, each micro lens may be disposed on the end portion of the resin composition. In this case, the positions at which the micro lenses are disposed are often within the respective optical paths for transmitting optical signal. Further, the micro-lenses may be formed on the both ends or one ends of the respective optical paths for transmitting optical signal.

The substrate for mounting an IC chip thus constituted according to the first aspect of the first group of the present invention can be manufactured using a manufacturing method of a substrate for mounting an IC chip according to the second aspect of the first group of the present invention or the other method.

Next, the manufacturing method of a substrate for mounting an IC chip according to the second aspect of the first group of the present invention will be described.

The manufacturing method of a substrate for mounting an IC chip according to the second aspect of the first group of the present invention comprises: (a) a multilayered circuit board manufacturing step of serially building up a conductor circuit and an interlaminar insulating layer on both faces of a substrate in an alternate fashion and in repetition to provide a multilayered circuit board; (b) a through hole formation step of forming a through hole in the multilayered circuit board; and (c) a solder resist layer formation step of forming a solder resist layer having an opening communicating with the through hole formed in the step (b).

In the substrate for mounting an IC chip manufactured by the manufacturing method according to the second aspect of the first group of the preset invention, the through holes formed in the step (b) and the openings formed in the step (c) and communicating with the through holes formed in the step (b) serve as the optical paths for transmitting optical signal. Therefore, in this manufacturing method, the substrate for mounting an IC chip according to the first aspect of the first group of the present invention, i.e., the substrate for mounting an IC chip for transmitting input/output signals for the optical elements through the optical paths for transmitting optical signal penetrating the substrate for mounting an IC chip can be suitably manufactured.

The step (a), i.e., the multilayered circuit board manufacturing step of manufacturing a multilayered circuit board will first be described in order of steps. Specifically, the multilayered circuit board can be manufactured through the following steps (1) to (9).

(1) Using an insulating substrate as a starting material, conductor circuits are formed first on the insulating substrate.

Examples of the insulating substrate include a glass epoxy substrate, a polyester substrate, a polyimide substrate, a bismaleimide-triazine (BT) resin substrate, a thermosetting polyphenylene ether resin, a copper-clad laminated board, an RCC substrate and the like.

Alternatively, a ceramic substrate such as an aluminum nitride substrate or a silicon substrate may be used.

The conductor circuits may be formed by forming a conductor layer in a spread state on each surface of the insulating substrate by an electroless plating treatment or the like and then etching the resultant conductor layer. Alternatively, the conductor circuits may be formed by etching the copper-clad laminated board or the RCC substrate.

Further, instead of the method of forming the conductor circuits by conducting the etching treatment, the conductor circuits may be formed by forming a plating resist on a conductor layer in a spread state, forming an electroplating layer on non plating resist formed areas, and then removing the plating resist and the conductor layers under the plating resist.

When the conductor circuits with the insulating substrate interposed therebetween are connected to each other by a plated-through hole, the plated-through hole is formed by forming a through hole for a plated-through hole in the insulating substrate using a drill, a laser or the like and, then, conducting an electroless plating treatment or the like. The diameter of the through hole for a plated-through hole is normally 100 to 300 µm.

It is desirable to fill the plated-through hole with a resin filler when the plated-through hole is formed.

(2) Next, the surfaces of the conductor circuits are subjected to a roughening treatment, based on necessity.

Examples of the roughening treatment include a blackening (oxidizing)-reducing treatment, an etching treatment using an etchant containing a cupric complex and an organic acid salt, a Cu—Ni—P needle-like alloy plating treatment and the like.

When roughened faces are formed, it is desirable that the mean roughness of the roughened faces is normally 0.1 to 5 µm. At the time of considering the adhesion between the conductor circuit and the interlaminar insulating layer, the influence of the conductor circuit on electric signal transmission capability and the like, it is more desirable that the mean roughness of the roughened faces is 2 to 4 µm.

This roughening treatment may be performed before filling the plated-through hole with the resin filler and roughened faces may be formed even on the wall faces of the plated-through hole. This is because the adhesion between the plated-through hole and the resin filler is improved.

(3) Either an uncured resin layer of thermosetting resin, photosensitive resin, resin obtained by acrylating a part of thermosetting resin, an uncured resin layer of a resin complex containing one of these resins and thermoplastic resin, or a resin layer of thermoplastic resin is formed on the substrate on which the conductor circuits are formed.

The uncured resin layer can be formed by applying uncured resin by a roll coater, a curtain coater or the like or by thermally bonding an uncured (half-cured) resin film.

Further, the resin layer of the thermoplastic resin can be formed by thermally bonding a resin formed body formed into film shape.

Among these formation methods, it is desirable to use the formation method of thermally bonding the uncured (half-cured) resin film. The resin film can be thermally bonded using a vacuum laminator or the like.

Furthermore, bonding conditions are not limited to specific ones but may be appropriately selected in view of the composition of the resin film and the like. Normally, it is desirable to carry out bonding under conditions of a pressure of 0.25 to 1.0 MPa, a temperature of 40 to 70° C., degree of vacuum of 13 to 1300 Pa, a period of time of about 10 to 120 seconds.

Examples of the thermosetting resin include epoxy resin, phenol resin, polyimide resin, polyester resin, bismaleimide resin, polyolefin resin, polyphenylene ether resin, polyphenylene resin, fluororesin and the like.

Specific examples of the epoxy resin include novolak type epoxy resins such as phenol novolak type epoxy resin and cresol novolak type epoxy resin; dicyclopentadiene-modified alicyclic epoxy resin and the like.

Examples of the photosensitive epoxy resin include acrylic resin and the like.

Further, examples of the resin obtained by acrylating a part of thermosetting resin include resin obtained by acrylating the thermosetting group of the thermosetting resin with a methacrylic acid or an acrylic acid and the like.

Examples of the thermoplastic resin include phenoxy resin, polyethersulfone (PES), polysulfone (PSF), polyphenylenesulfone (PPS), polyphenylene sulfide (PPES), polyphenyl ether (PPE), polyetherimide (PI) and the like.

Further, the resin complex is not limited to a specific one as long as the resin complex comprises thermosetting resin or photosensitive resin (including resin obtained by acrylating a part of thermosetting resin), and thermoplastic resin. Specific examples of the combination of the thermosetting resin and the thermoplastic resin include phenol resin/polyethersulfone, polyimide resin/polysulfone, epoxy resin/polyethersulfone, epoxy resin/phenoxy resin and the like. In addition, specific examples of the combination of the photosensitive resin and the thermoplastic resin include acrylic resin/phenoxy resin, epoxy resin obtained by acrylating a part of the epoxy group thereof/polyethersulfone and the like.

Furthermore, the mixing ratio of the thermosetting resin or photosensitive resin and the thermoplastic resin of the resin complex is desirably thermosetting resin or photosensitive resin/thermoplastic resin=95/5 to 50/50. With this ratio, it is possible to ensure high toughness without deteriorating heat resistance.

In addition, the resin layer may be composed of two or more different resin layers.

Specifically, the resin layer be composed of upper and lower layers. The lower layer of the resin layer is formed of, for example, a resin complex having a mixing ratio of thermosetting resin or photosensitive resin/thermoplastic resin=50/50 and the upper layer thereof is formed of, for example, a resin complex having a mixing ratio of thermosetting resin or photosensitive resin/thermoplastic resin=90/10.

With this configuration adopted, it is possible to ensure excellent adhesion between the resin layer and the substrate and to ensure facilitating the formation of openings for via-holes and the like in later steps.

Further, the resin layer may be formed using a resin composition for forming a roughened face.

Examples of the resin composition for forming a roughened face include a composition in which a substance soluble in a roughening solution containing at least one kind selected from an acid, an alkali and an oxidizing agent is dispersed in an uncured heat resistant resin matrix hardly soluble in a roughening solution containing at least one kind selected from an acid, an alkali and an oxidizing agent, and the like.

As for the terms "hardly soluble" and "soluble", substances which have a relatively high dissolution speed are called "soluble" substances and those which have a relatively slow dissolution speed are called "hardly soluble" substances for the sake of convenience when they are immersed in the same roughening solution for the same period of time.

The heat resistant resin matrix is desirably capable of keeping the shape of a roughened face at the time of forming the roughened face on the interlaminar resin insulating layer using the roughening solution. Examples of the heat resistant resin matrix include thermosetting resin, thermoplastic resin, complexes thereof and the like. In addition, photosensitive resin may be used. By using the photosensitive resin, openings for via-holes may be formed in the interlaminar resin insulating layer using exposure and development treatments.

Examples of the thermosetting resin include epoxy resin, phenol resin, polyimide resin, polyolefin resin, fluororesin and the like. Further, when the thermosetting resin is photosensitized, the thermosetting group of the resin is (meth)acrylated using a methacrylic acid, an acrylic acid or the like.

Examples of the epoxy resin include cresol novolak type epoxy resin, bisphenol A type epoxy resin, bisphenol F type epoxy resin, phenol novolak type epoxy resin, alkyl phenol novolak type epoxy resin, bi-phenol F type epoxy resin, naphthalene type epoxy resin, dicyclopentadiene type epoxy resin, epoxylated compounds of condensates of phenols and aromatic aldehydes containing a phenolic hydroxyl group, triglycidyl isocyanurate, alicyclic epoxy resin and the like. They may be used alone or in combination of two or more of them. Accordingly, excellent heat resistance can be ensured. The photosensitized thermosetting resin is desirably epoxy resin (meth)acrylate, more desirably epoxy resin containing two or more epoxy groups in one molecule.

Examples of the thermoplastic resin include phenoxy resin, polyethersulfone, polysulfone, polyphenylenesulfone, polyphenylene sulfide, polyphenyl ether, polyetherimide and the like. They may be used alone or in combination of two or more of them.

The substance soluble to the roughening solution containing at least one kind of compounds selected from the acid, alkali and oxidizing agent is desirably at least one kind selected from inorganic particles, resin particles and metal particles.

Examples of the inorganic particles include aluminum compounds, calcium compounds, potassium compounds, magnesium compounds, silicon compounds and the like. They may be used alone or in combination of two or more of them.

Examples of the aluminum compounds include alumina, aluminum hydroxide and the like, examples of the calcium compounds include calcium carbonate, calcium hydroxide and the like, examples of the potassium compounds include potassium carbonate and the like, examples of the magnesium compounds include magnesia, dolomite, basic magnesium carbonate, talc and the like, and examples of the silicon compounds include silica, zeolite and the like. They may be used alone or in combination of two or more kinds of them.

The alumina particles can be dissolved in and removed by an hydrofluoric acid, and calcium carbonate can be dissolved in and removed by a hydrochloric acid. Sodium-containing silica and dolomite can be dissolved in and removed by an aqueous alkaline solution.

Examples of the resin particles include thermosetting resin, thermoplastic resin and the like, and those which have a higher dissolution speed than that of the heat resistant resin matrix at the time of being immersed in a roughening solution containing at least one kind of compounds selected from an acid, an alkali, and an oxidizing agent can be used without any specific limitation. Specifically, examples thereof include amino resin (melamine resin, urea resin, guanamine resin and the like), epoxy resin, phenol resin, phenoxy resin, polyimide resin, polyphenylene resin, polyolefin resin, fluororesin, bismaleimide-triazine resin and the like. They may be used alone or in combination of two or more of them.

The resin particles are required to be previously subjected to a curing treatment. When the resin particles are not cured, they are dissolved in a solvent for dissolving the resin matrix.

As the resin particles, rubber particles, liquid-phase resin, liquid-phase rubber or the like may be used.

Examples of the rubber particles include acrylonitrile-butadiene rubber, polychloroprene rubber, polyisoprene rubber, acrylic rubber, polysulide type synthetic rubber, fluoro rubber, urethane rubber, silicone rubber, ABS resin and the like.

Further, rubber particles of polybutadiene rubber, a variety of modified polybutadiene rubbers such as epoxy-modified, urethane-modified and (meth)acrylonitrile-modified rubbers, (meth) acrylonitrile-butadiene rubber having carboxyl group and the like may also be used.

As the liquid-phase resin, an uncured solution of the thermosetting resin can be used. Specific examples of such liquid-phase resin include a solution mixture containing uncured epoxy oligomer and an aminic curing agent and the like.

For the liquid-phase rubber, an uncured solution of the polybutadiene, a variety of modified polybutadiene rubbers such as epoxy-modified, urethane-modified and (meth)acrylonitrile-modified rubbers, (meth)acrylonitrile-butadiene rubber having a carboxyl group, or the like can be used.

When the photosensitive resin composition is prepared using the liquid-phase resin or liquid-phase rubber, it is necessary to select the heat resistant resin matrix and the soluble substance so that these substances are not uniformly, mutually dissolved in (i.e., so that they are separated from each other).

By mixing together the heat resistant resin matrix and the soluble substance thus selected based on the standard, it is possible to prepare a photosensitive resin composition in a state where "lands" of the liquid-phase resin or liquid-phase rubber are dispersed in the "sea" of the heat resistant resin matrix or in a state where "lands" of the heat resistant resin matrix are dispersed in the "sea" of the liquid-phase resin or liquid-phase rubber.

The roughened faces can be formed by curing the photosensitive resin composition in such a state and, then, removing the liquid-phase resin or liquid-phase rubber in the "sea" or "lands".

Examples of the metal particles include gold, silver, copper, tin, zinc, stainless steel, aluminum, nickel, iron, lead and the like. They may be used alone or in combination of two or more kinds of them.

Further, the surface layer of the metal particles may be covered with resin in order to ensure the insulating property.

When two or more kinds of the soluble substances are mixed together, a mixture combination of the two soluble substances is desirably a combination of resin particles and inorganic particles. The reason is as follows. Since both the resin particles and the inorganic particles are low in conductivity, it is possible to ensure the insulating property of the interlaminar insulating layer, facilitate adjusting thermal expansion relative to the hardly soluble resin, prevent the occurrence of cracks to the interlaminar insulating layer of the resin composition for forming roughened surface, and prevent the occurrence of peeling between the interlaminar insulating layer and the conductor circuit.

Examples of the acid used as the roughening solution include a phosphoric acid, a hydrochloric acid, a sulfuric acid, a nitric acid, organic acids such as a formic acid and an acetic acid and the like. Among them, it is desirable to use an organic acid for the roughening solution. This is because the organic acid makes it difficult to corrode the metallic conductor layer exposed from the via-holes when a roughening treatment is conducted.

As the oxidizing agent, an aqueous solution containing a chromic acid, a chromic sulfide, an alkaline permanganic acid (e.g., potassium permanganate) or the like is desirable.

As the alkali, an aqueous solution containing sodium hydroxide, potassium hydroxide or the like is desirable.

The average particle diameter of the soluble substances is desirably 10 µm or less.

Alternatively, coarse particles having a relatively large average particle diameter of 2 µm or less and fine particles having a relatively small average particle diameter may be combined. For example, a soluble substance having an average particle diameter of 0.1 to 0.5 µm and a soluble substance having an average particle diameter of 1 to 2 µm may be combined.

By thus combining the coarse particles having a relatively large average particle diameter with the fine particles having a relatively small average particle diameter, it is possible to eliminate the solution residue of the thin film conductor layer, decrease the quantity of palladium catalyst under the plating resist and form shallow, complicated roughened faces.

Furthermore, by forming the complicated roughened faces, it is possible to maintain a practical peel strength even when the roughened faces have small irregularities.

Desirably, the average particle diameter of the coarse particles exceeds 0.8 µm and is less than 2.0 µm, and that of the fine particles is 0.1 to 0.8 µm.

(4) Next, in the case of forming an interlaminar insulating layer using the thermosetting resin or resin complex as a material therefor, a curing treatment is conducted to an uncured resin layer and openings for via-holes are formed to obtain the interlaminar insulating layer. In this step, a through hole for a plated-through hole may be formed, based on necessity.

It is desirable that the openings for via-holes are formed by a laser treatment. In addition, when photosensitive resin is used as a material for the interlaminar insulating layer, the openings for via-holes may be formed by exposure and development treatments.

When the interlaminar insulating layer is formed using thermoplastic resin as a material therefor, openings for via-holes are formed in a resin layer of thermoplastic resin to provide the interlaminar insulating layer. In this case, the openings for via-holes can be formed by conducting a laser treatment.

When a through hole for a plated-through hole is to be formed in this step, it may be formed by drilling, a laser treatment or the like.

Examples of a laser used for the laser treatment include a carbonic acid gas laser, a UV laser, an excimer laser and the like. Among them, the excimer laser or the carbonic acid gas laser having a short pulse is desirable.

Further, among various excimer lasers, a hologram type excimer laser is desirable. A hologram type excimer laser is a laser which applies a laser beam on to a target through a hologram, a condensing lens, a laser mask, a transfer lens or the like. By using this method, it is possible to efficiently form a large number of openings in the resin film layer by the application of the laser beam at one time.

When the carbonic acid gas laser is used, the pulse interval of the laser is desirably $10^{-4}$ to $10^{-8}$ seconds. In addition, a period of time for applying a laser beam to form openings is desirably 10 to 500 microseconds.

In addition, by applying a laser beam through an optical system lens and a mask, it is possible to form a large number of openings for via-holes at one time. This is because a laser beam with the same intensity and the same application angle can be applied to a plurality of parts by letting the laser beam pass through the optical system lens and the mask.

After thus forming the openings for via-holes, based on necessity, a desmear treatment may be conducted.

(5) Next, conductor circuits are formed on the surface of the interlaminar insulating layer including the inner walls of the openings for via-holes.

When the conductor circuit is to be formed, a thin film conductor layer is formed first on the surface of interlaminar insulating layer.

The thin film conductor layer can be formed by electroless plating, sputtering or the like.

Examples of a material for the thin film conductor layer include copper, nickel, tin, zinc, cobalt, thallium, lead and the like.

Among these materials, the thin film conductor layer of copper or copper and nickel is desirable because of its or their excellent electric characteristics, economical advantage and the like.

Further, when the thin film conductor layer is formed by electroless plating, the lower limit of the thickness of the thin film conductor layer is desirably 0.3 µm. When the thickness of the thin film conductor layer is less than 0.3 µm, non thin film layer formed areas are generated in some cases. The lower limit of the thickness of the thin film conductor layer is more desirably less than 0.6 µm. On the other hand, the upper limit thereof is desirably 2.0 µm, more desirably 1.2 µm. When the thickness of the thin film conductor layer exceeds 1.2 µm, incomplete etched areas are easily generated.

Further, when the thin film conductor layer is formed by sputtering, the thickness is desirably 0.1 to 1.0 µm.

Alternatively, a roughened face may be formed on the surface of the interlaminar insulating layer before the thin film conductor layer is formed. When the roughened face is formed, it is possible to improve the adhesion between the interlaminar insulating layer and the thin film conductor layer. When the interlaminar insulating layer is formed using the resin composition for forming a roughened face, in particular, it is desirable to form the roughened face using an acid, an oxidizing agent or the like.

Furthermore, when the through hole for a plated-through hole is formed in the step (4), the thin film conductor layer may be formed even on the wall face of the through hole at the time of forming the thin film conductor layer on the interlaminar insulating layer.

(6) Next, a plating resist is formed on the substrate on the surface of which the thin film conductor layer is formed.

The plating resist can be formed by: bonding a photosensitive dry film, closely disposing a photomask made of a glass substrate or the like drawing a plating resist pattern; and conducting exposure and development treatments.

(7) Thereafter, electroplating is conducted using the thin film conductor layer as a plating lead to form an electroplating layer in non plating resist formed areas. The electroplating is desirably copper plating.

Further, the thickness of the electroplating layer is desirably 5 to 20 μm.

Thereafter, the plating resist and the thin film conductor layer under the plating resist are removed, whereby conductor circuits (including via-holes) can be formed.

The removal of the plating resist may be carried out using an alkali aqueous solution or the like, and the removal of the thin film conductor layer may be carried out using an etchant containing a solution mixture of a sulfuric acid and peroxide, sodium persulfate, ammonium persulfate, ferric chloride, cupric chloride or the like.

Further, after forming the conductor circuits, a catalyst on the interlaminar insulating layer may be removed by an acid or an oxidizing agent, based on necessity. When the catalyst is removed, it is possible to prevent the deterioration of electric characteristic.

Alternatively, instead of the method of forming this plating resist and, then, forming the electroplating layer (steps (6) and (7)), the conductor circuits may be formed by using a method of forming an electroplating layer on the entire surface of the thin film conductor layer and, then, conducting an etching treatment. Specifically, the same method as a conductor circuit formation method based on a subtractive method described in the manufacturing method according to the second aspect of the second group of the present invention may be used.

Further, when the plated-through hole is formed in the steps (4) and (5), a resin filler may be filled into the plated-through hole.

When the resin filler is filled into the plated-through hole, based on necessity, a cover plating layer may be formed to cover the surface layer part of the resin filled layer by conducting electroless plating.

(8) Next, when the cover plating layer is formed, based on necessity, a roughening treatment is conducted to the surface of the cover plating layer and the steps (3) to (7) are repeatedly executed, thereby forming the interlaminar insulating layer. In this step, a plated-through hole may be formed or may not be formed.

(9) Furthermore, based on necessity, the conductor circuits and the interlaminar insulating layers may be laminated by repeatedly executing the steps (5) to (8).

By executing the steps (1) to (9), it is possible to manufacture a multilayered circuit board having conductor circuits and interlaminar insulating layers serially built up on both faces of the substrate in an alternate fashion and in repetition.

While the manufacturing method of a multilayered circuit board based on a semi-additive method has been described herein, the manufacturing method of the multilayered circuit board manufactured in the step (a) is not limited to the semi-additive method but a full-additive method, a subtractive method, a single step press method, a conformal method or the like may be used.

In the manufacturing method of a substrate for mounting an IC chip according to the second aspect of the first group of the present invention, after the multilayered circuit board is manufactured through the step (a), the step (b), i.e., the through hole formation step of forming through holes in the multilayered circuit board is executed. The through holes formed in this step serve as the optical paths for transmitting optical signal for the substrate for mounting an IC chip. Accordingly, the through holes formed in this step will be referred to as "through holes for optical paths" hereinafter.

The through holes for optical paths are formed by drilling, a laser treatment or the like.

Examples of a laser used for the laser treatment include the same as that used to form the openings for via-holes, and the like.

The positions at which the through holes for optical paths are formed are not limited to specific positions but may be appropriately selected based on the design of the conductor circuits, the position at which the IC chip is mounted and the like.

Furthermore, it is desirable that the through holes for optical paths are formed for respective optical elements such as the light receiving element and the light emitting element. Alternatively, they may be formed for respective signal wavelengths.

Further, after the through holes for optical paths are formed, a desmear treatment may be conducted, based on necessity.

The desmear treatment can be performed by a treatment using a permanganic acid solution, a plasma treatment, a corona treatment or the like. It is noted that when the desmear treatment is conducted, it is possible to remove the resin residue, burrs and the like in the through holes for optical paths, and lower the transmission loss caused by irregular reflection on the wall faces of the optical paths for transmitting optical signal.

Alternatively, the conductor layer may be formed after forming the through holes for optical paths in the following step or a roughened face formation step of roughening the wall faces of the through holes for optical paths, based on necessity, before an uncured resin composition is filled into the holes. This is because it is possible to improve the adhesion between the through holes for optical paths and the conductor layer or the resin composition.

The roughened face can be formed by dissolving exposed portions generated at the time of forming the through holes for optical paths in the substrate, the interlaminar insulating layer and the like by an acid such as a sulfuric acid, a hydrochloric acid or a nitric acid, an oxidizing agent such as a chromic acid, a chromic sulfide or a permanganate, or the like. Alternatively, the roughened face can be formed by a plasma treatment, a corona treatment or the like.

The mean roughness (Ra) of the roughened face is desirably 0.5 to 5 μm, more desirably 1 to 3 μm. When the mean roughness falls within this range, the adhesion of the roughened face to the conductor layer or the resin composition is excellent and the roughened face does not adversely influence the transmission of optical signal.

After forming the through holes for optical paths, based on necessity, a conductor layer formation step of forming a conductor layer on the wall faces of the through holes for optical paths may be performed.

The conductor layer can be formed by a method such as electroless plating or sputtering.

Specifically, a method of applying a catalyst core to the wall faces of the through holes for optical paths and, then, immersing the substrate, in which through holes for optical paths are formed, in an electroless plating bath after the through holes for optical paths are formed, or the like can be used to form the conductor layer.

Alternatively, a conductor layer composed of two or more layers may be formed by a combination of electroless plating and sputtering, or a conductor layer composed of two or more layer may be formed by conducting electroplating after electroless plating or sputtering.

In such a conductor layer formation step, it is desirable to not only form the conductor layer on the wall faces of the through holes for optical paths but also form conductor circuits on an outermost layer on the interlaminar insulating layer formed in the step (a).

Specifically, at the time of forming the conductor layer on the wall faces of the through holes for optical paths by electroless plating or the like, a conductor layer is also formed on the entire surface of the interlaminar insulating layer.

Next, a plating resist is formed on this conductor layer formed on the surface of the interlaminar insulating layer. The plating resist is formed by: bonding a photosensitive dry film, closely disposing a photomask made of a glass substrate or the like drawing a plating resist pattern; and conducting exposure and development treatments.

Further, electroplating is conducted using the conductor layer formed on the interlaminar insulating layer as a plating lead to form an electroplating layer on the non plating resist formed areas. Thereafter, the plating resist and the conductor layer under the plating resist are removed, thereby forming an independent conductor layer on the interlaminar insulating layer.

Further, a roughened layer may be formed on the wall faces of the conductor layer after forming the conductor layer. The roughened face can be formed by a blackening (oxidizing)-reducing treatment, an etching treatment using an etchant containing a cupric complex and an organic acid salt, a Cu—Ni—P needle-like alloy plating treatment or the like.

Alternatively, a covering layer may be formed in place of the roughened layer or a covering layer as well as the roughened layer may be formed.

Further, after forming the through holes for optical paths, based on necessity, a resin filling step of filling an uncured resin composition into the through holes may be executed.

By conducting a curing treatment after filling the uncured resin composition thereinto, it is possible to form optical paths for transmitting optical signal at least a part of which is composed of the resin composition.

A specific method of filling the uncured resin composition is not limited to a specific one but such a method as printing or potting can be used.

When the uncured resin composition is filled by printing, the uncured resin composition may be printed at one time or two or more times. Further, the uncured resin composition may be printed from both faces of the multilayered circuit board.

Further, when the uncured resin composition is to be filled, an uncured resin composition slightly larger in quantity than the inner volume of each of the through holes for optical paths may be filled and, after filling the uncured resin composition, an excessive resin composition overflowing the through holes for optical paths may be removed.

The removal of the excessive resin composition can be carried out by grinding or the like. When the excessive resin composition is to be removed, the resin composition may be in a half-cured state or a fully cured state, which state may be appropriately selected based on the material for the resin composition and the like.

Through such a through hole formation step as well as the roughened face formation step, the conductor layer formation step and the resin composition filling step which are executed based on necessity, it is possible to form the optical paths for transmitting optical signal on the multilayered circuit board which have been manufactured through the step (a).

Furthermore, at the time of executing the conductor layer formation step, independent conductor circuits can be formed by forming the conductor layer also on the surface of the interlaminar insulating layer and performing the treatment. Of course, even when the conductor layer is not formed, the conductor circuits can be formed on the surface of the interlaminar insulating layer by the method.

Next, the step (c), i.e., the solder resist layer formation step of forming a solder resist layer having openings communicating with the through holes for optical paths formed in the step (b) is executed.

Specifically, the solder resist layer can be formed by executing the following steps (1) and (2).

(1) First, a solder resist composition layer is formed on each outermost layer of the multilayer circuit board having the through holes for optical paths formed therein.

The solder resist composition layer can be formed using a solder resist composition of polyphenylene ether resin, polyolefin resin, fluororesin, thermoplastic elastomer, epoxy resin, polyimide resin or the like.

Furthermore, examples of the solder resist composition other than the above-mentioned solder resist composition include a paste-like fluid containing thermosetting resin comprising (meth) acrylate of novolak type epoxy resin, an imidazole curing agent, a bifunctional (meth)acrylic acid ester monomer, (meth) acrylic acid ester polymer with a molecular weight of about 500 to 5000, bisphenol type epoxy resin and the like, a photosensitive monomer such as a multivalent acrylic monomer and a glycol ether type solvent, and its viscosity is desirably prepared to be 1 to 10 Pa·s at 25° C.

A film composed of the solder resist composition may be pressure-bonded to form the solder resist composition layer. Particularly when the through holes for optical paths is constituted by cavities, the solder resist composition layer is desirably formed by pressure-bonding the film.

(2) Next, openings communicating with the through holes for optical paths (which openings will be also referred to as "openings for optical paths" hereinafter) are formed in the solder resist composition layer.

Specifically, the openings for optical paths can be formed by exposure and development treatments, a laser treatment or the like.

In addition, it is desirable to form openings for forming solder bumps simultaneously with the formation of the openings for optical paths. Alternatively, the formation of the openings for optical paths and the formation of the openings for forming solder bumps may be carried out separately.

Further, when the solder resist layer is to be formed, the solder resist layer having openings for optical paths and openings for forming solder bumps may be formed by manufacturing a resin film having openings at desired positions and bonding it thereon.

In this step, the optical paths for transmitting optical signal, each of which is constituted by a resin composition or a resin composition and a conductor layer around the resin composition, can be formed by, after forming the openings for optical paths, filling an uncured resin composition into the openings for optical paths and, then, curing the resin composition. It is noted that the uncured resin composition to be filled herein is desirably the same composition as the uncured resin composition filled in the step (b).

A method of filling the uncured resin composition is not limited to a specific one but the same method as that used to fill the uncured resin composition into the through holes for optical paths in the step (b) or the other method can be used.

When the uncured resin composition is filled in this step, it is desirable to previously fill the uncured resin composition into the through holes for optical paths in the step (b). However, instead of filling the uncured resin composition in the step (b), the uncured resin composition may be filled into the openings for optical paths and the through holes for optical paths simultaneously after forming the openings for optical paths.

Through these steps (1) and (2), it is possible to form the solder resist layer having openings communicating with the through holes for optical paths on the multilayered circuit board having the through holes for optical paths formed therein.

Further, after the through holes for optical paths and openings for optical paths are formed, based on necessity, a micro lens disposition step of disposing micro lenses on the end portions of the respective openings for optical paths may be executed.

The micro lenses are disposed desirably by attaching optical lenses through an adhesive layer.

Further, when the micro lenses are to be disposed using resin for an optical lens, the micro lenses can be disposed by dropping an appropriate quantity of uncured resin for an optical lens to the end portions of the openings for optical paths and curing this uncured resin for an optical lens. In this case, therefore, it is desirable that a resin composition is filled into the openings for optical paths.

It is also desirable that the uncured resin for an optical lens has a viscosity of 10 to 50 cps (mP·s). When the viscosity fall within this range, the resin becomes semispherical by surface tension at the time of being dropped.

When such a method is used, the uncured resin for an optical lens can be dropped by using such a device as a dispenser, an inkjet, a micro-pipette or a micro syringe. The uncured resin for an optical lens dropped by using one of these devices is to become spherical by the surface tension. Therefore, the uncured resin for an optical lens become semispherical on the end portions of the openings for optical paths (end portions of the resin composition) and, after being cured, this semispherical resin for an optical lens becomes micro lenses.

The diameter of each micro lens made of the resin for an optical lens, the shape of the curved face of the micro lens and the like can be controlled by appropriately adjusting the viscosity and the like of the uncured resin for an optical lens while considering the wettability between the resin composition and the uncured resin for an optical lens and the like.

When the micro lens is disposed on each optical path for transmitting optical signal constituted by a resin composition and a vacancy or a resin composition, a vacancy and a conductor layer around these, the micro lens may be disposed on the end portion of the resin composition. In this case, the position at which the micro lens is disposed is not limited to the end portion of the optical path for transmitting optical signal.

Further, in the manufacturing method according to the second aspect of the first group of the present invention wherein the steps (a) to (c) are executed, the multilayered circuit board is manufactured, the through holes for optical paths are formed in the multilayered circuit board and, then, the solder resist layers are formed. However, when the substrate for mounting an IC chip according to the first aspect of the first group of the present invention is to be manufactured, after manufacturing the multilayered circuit board, the solder resist layers may be formed before the through hole for forming the optical paths for transmitting optical signal, depending on situations.

In the manufacturing method of a substrate for mounting an IC chip according to the second aspect of the first group of the present invention, after executing these steps (a) to (c), solder pads or solder bumps are formed and optical elements are mounted using the following method, whereby a substrate for mounting an IC chip can be manufactured.

That is, conductor circuit portions exposed by forming the openings for forming solder bumps are covered with corrosion resistant metal such as nickel, palladium, gold, silver and platinum to provide solder pads, based on necessity. Among the corrosion resistant metallic materials, it is desirable to use nickel-gold, nickel-silver, nickel-palladium, nickel-palladium-gold or the like to form a covering layer.

The covering layer may be formed by plating, vapor deposition, electrodeposition or the like. Among them, plating is desirable from a viewpoint that the covering layer is excellent in evenness at the time of being formed by plating.

Furthermore, the solder pads are filled with solder paste through a mask having opening parts formed in portions corresponding to the solder pads and, then, reflow is performed, thereby forming solder bumps.

Moreover, optical elements (the light receiving element and the light emitting element) are mounted on the solder resist layer. The mounting of the optical elements can be performed through the solder bumps or the like. Alternatively, at the time of forming the solder bumps, the optical elements may be attached when the solder bumps are filled with the solder paste and the optical elements may be mounted on the solder resist layer simultaneously with the reflow.

Further, the optical elements may be mounted using conductive adhesive or the like in place of the solder.

Through these steps, it is possible to manufacture the substrate for mounting an IC chip according to the first aspect of the first group of the present invention.

Next, a device for optical communication according to the third aspect of the first group of the present invention will be described.

The device for optical communication according to the third aspect of the first group of the present invention is a device for optical communication comprising a substrate for mounting an IC chip and a multilayered printed circuit board, wherein an optical path for transmitting optical signal which penetrates the substrate for mounting an IC chip is formed in the substrate for mounting an IC chip.

The device for optical communication according to the third aspect of the first group of the present invention can transmit optical signal through the optical paths for transmitting optical signal formed in the substrate for mounting an IC chip.

The substrate for mounting an IC chip that constitutes the device for optical communication is not limited to a specific one as long as the optical paths for transmitting optical signal penetrating the substrate for mounting an IC chip are formed in the substrate. It is, however, desirable to use the above-mentioned substrate for mounting an IC chip according to the first aspect of the first group of the present invention. This is because the various effects can be attained by using the substrate for mounting an IC chip according to the first aspect of the first group of the present invention as the substrate for mounting an IC chip.

As the substrate for mounting an IC chip on which the optical paths for transmitting optical signal having the above-mentioned shape are formed, an RCC type substrate or the like may be used.

Further, in the substrate for mounting an IC chip according to the first aspect of the first group of the present invention, solder resist layers are formed on the respective outermost layers. In the substrate for mounting an IC chip that constitutes the device for optical communication according to the third aspect of the first group of the present invention, the solder resist layers may not be formed on the respective outer most layers. However, when the solder resist layers are formed on the respective outermost layers of the substrate for mounting an IC chip, it is possible to attain an alignment effect by a self-alignment function at the time of connecting the substrate for mounting an IC chip to the multilayered printed circuit board through solder bumps or the like or at the time of mounting the optical elements on the surface of the substrate for mounting an IC chip.

Examples of the multilayered printed circuit board that constitutes the device for optical communication include a multilayered printed circuit board constituted to comprise a substrate and conductor circuits and further have optical waveguides formed thereon, and the like.

Such a multilayered printed circuit board can transmit optical signal through the optical waveguides.

Furthermore, optical paths for transmitting optical signal may be formed in the multilayered printed circuit board, if necessary, so as to transmit optical signal between the multilayered printed circuit board and the substrate for mounting an IC chip (e.g., between the multilayered printed circuit board and the optical elements mounted on the substrate for mounting an IC chip).

Examples of a material for the optical waveguides include quartz glass, compound semiconductor, a polymer material and the like. Among them, the polymer material is excellent in workability and adhesion to the interlaminar insulating layer of the multilayered printed circuit board and is obtained at low cost. Therefore, it is desirable to use the polymer material for the optical waveguides.

As the polymer material, a conventionally well-known polymer material can be used. Specific examples of the polymer material include acrylic resin such as PMMA (polymethyl methacrylate), PMMA deuteride and PMMA deuteride fluoride; polyimide resin such as polyimide fluoride; epoxy resin; UV cured epoxy resin; silicone resin such as silicone resin deuteride; siloxane resin; polymer produced from benzocyclobutene and the like.

Further, when each of the optical waveguides is an optical waveguide for multi-mode, a material for the optical waveguide is desirably acrylic resin, epoxy resin or UV cured epoxy resin. When each of the optical waveguide is an optical waveguide for single-mode, a material for the optical waveguide is desirably polyimide resin, silicone resin or siloxane resin.

The core of each of the optical waveguides has desirably a thickness of 1 to 100 μm and a width of 1 to 100 μm. When the width is less than 1 μm, it is difficult to form the optical waveguide in some cases. When the width exceeds 100 μm, this hampers the degree of freedom for the design of the conductor circuits and the like that constitute the multilayered printed circuit board in some cases.

Furthermore, the ratio of the thickness to width of the core of each of the optical waveguides is desirably close to 1:1. This is because the planar shapes of the light receiving part of the light receiving element and the light emitting part of the light emitting part are normally circular shapes. It is noted that the ratio of thickness to width is not limited to a specific one but may be normally in the range of about 1:2 to 2:1.

Moreover, when each of the optical waveguides is an optical waveguide for single-mode having a communication wavelength of 1.31 μm or 1.55 μm, the core thereof has a thickness and a width of more desirably 5 to 15 μm, particularly desirably about 10 μm. In addition, when each of the optical waveguides is an optical waveguide for multi-mode having a communication wavelength of 0.85 μm, the core thereof has a thickness and a width of more desirably 20 to 80 μm, particularly desirably about 50 μm.

Further, particles may be contained in the optical waveguides. By incorporating the particles in the optical waveguides, it is made difficult to cause cracks to occur to the optical waveguides. Namely, when no particles are contained in the optical waveguides, cracks often occur to the optical waveguides due to the difference in thermal expansion coefficient between the optical waveguides and the other layers (the substrate and the interlaminar insulating layers). However, when particles are contained in the optical waveguides and the thermal expansion coefficient of the optical waveguides is prepared to narrow the difference in thermal expansion coefficient between the optical waveguides and the other layers as mentioned above, it is possible to make it more difficult to cause cracks to occur to the optical waveguides.

Specific examples of the particles include the same as those contained in the optical paths for transmitting optical signal.

Further, the shape of the particles is not limited to a specific one but the particles may be spherical, elliptic, friable, polygonal or the like. Among these shapes, the spherical shape or the elliptic shape is desirable. This is because the spherical or elliptic particle has no corners, which makes it more difficult to cause cracks and the like to occur to the optical waveguides.

When the particles are spherical or elliptic, light is less likely to be reflected by the particles, thus lowering optical signal loss.

In addition, it is desirable that the particle diameter of the particles is smaller than a communication wavelength. When the particle diameter is larger than the communication wavelength, this hampers optical signal transmission in some cases.

It is more desirable that the lower limit and upper limit of the particle diameter are 0.01 μm and 0.8 μm, respectively. When particles out of this range are included, a particle size distribution becomes too wide. At the time of mixing the particles into a resin composition, the variation of the viscosity of the resin composition grows, thereby deteriorating reproducibility in preparing the resin composition and making it difficult to prepare a resin composition having a predetermined viscosity.

The lower limit and upper limit of the particle diameter are more desirably 0.1 μm and 0.8 μm, respectively. When the particle diameter falls within the range, the resin composition can be suitably applied using a spin coater, a roll coater or the like and it is easier to prepare the resin composition into which particles are mixed to have a predetermined viscosity.

The lower limit and upper limit of the particle diameter are particularly desirably 0.2 μm and 0.6 μm, respectively. This range is particularly suitable for the application of the resin composition and the formation of the cores of the optical waveguides. Besides, within this range, the variation among the formed optical waveguides, particularly that of the cores is minimized, ensuring particularly excellent characteristics of the device for optical communication.

When the particles having particle diameters within this range are used, two or more kinds of particles having different particle diameters may be included. The particles are desirably inorganic particles, which comprise titania or alumina. It is also desirable to use particles having a mixture composition formed by mixing and dissolving at least two kinds of silica, titania and alumina.

The lower limit of the mixing quantity of the particles is desirably 10% by weight, more desirably 20% by weight. The upper limit thereof is desirably 80% by weight, more desirably 70% by weight. When the mixing quantity of the particles is less than 10% by weight, the effect of mixing particles cannot be sometimes expected. When it exceeds 80% by weight, the transmission of optical signal is hampered in some cases.

In addition, the shape of the optical waveguides is not limited to a specific one. However, sheet-like optical waveguides are desirable because they are easy to be formed.

When each of the optical waveguides comprises a core and a cladding, the particles may be mixed in both the core and the cladding. Desirably, no particles are mixed in the core and particles are mixed only in the cladding that covers the surrounding of the core. The reason is as follows.

When the particles are mixed in an optical waveguide, an air layer is generated on the interface between the particles and the resin composition depending on the adhesion between the particles and the resin composition of the optical waveguide. In this case, the air layer changes the refraction direction of light, often increasing the transmission loss of the optical waveguide. On the other hand, when the particles are mixed only in the cladding, the problem that the transmission loss of the optical waveguide increases does not occur and it is possible to prevent the occurrence of the cracks to occur to the optical waveguide.

When the light receiving element and the light emitting element are mounted on the substrate for mounting an IC chip and optical waveguides are formed at respective positions opposed to the light receiving element and light emitting element, it is desirable that the optical waveguide formed at the position opposed to the light receiving element and that formed at the position opposed to the light emitting element are made of the same material.

Further, it is desirable that an optical path conversion mirror is formed on each of the optical waveguides. By forming the optical path conversion mirror, it is possible to change the angle of the optical path to a desired angle. Alternatively, a member that includes an optical path conversion part may be disposed on the tip end portion of each of the optical waveguides in place of forming the optical path conversion mirror on each optical waveguide.

The optical path conversion mirror can be formed by cutting one end of each optical waveguide as will be described later.

Furthermore, solder bumps for transmitting an electric signal are desirably formed on the multilayered printed circuit board. By forming the solder bumps, it is possible to transmit an electric signal between the multilayered printed circuit board and an external electronic component or an external substrate.

In addition, when the solder bumps are formed, the light receiving element and the light emitting element mounted on the substrate for mounting an IC chip and the optical waveguides formed on the multilayered printed circuit board can be disposed at respective predetermined positions opposed to one another by connecting the substrate for mounting an IC chip to the multilayered printed circuit board through the solder bumps. This is because the self-alignment function of solders can be utilized. When the substrate for mounting an IC chip is connected to the multilayered printed circuit board through a PGA (Pin Grid Array) or a BGA (Ball Grid Array), it is possible to attain the same effect.

As described so far, the device for optical communication according to the third aspect of the first group of the present invention is not limited to a specific one as long as the device for optical communication comprises the substrate for mounting an IC chip having the optical paths for transmitting optical signal formed therein and the multilayered printed circuit board as mentioned above. It is, however, desirable that the device for optical communication is constituted to comprise the substrate for mounting an IC chip on which the light receiving element and the light emitting element are mounted and the multilayered printed circuit board on which the optical waveguides are formed, and to be able to transmit optical signal through the optical paths for transmitting optical signal between the light receiving element and light emitting element and the optical waveguides. Further, the number of substrates for mounting IC chips connected to the multilayered printed circuit board is not limited to one but may be two or more. The substrates for mounting IC chips connected to the multilayered printed circuit board may be a plurality of substrates for mounting IC chips that are built up.

The embodiment of the device for optical communication according to the third aspect of the first group of the present invention will be described with reference to the drawings.

Figure 3:
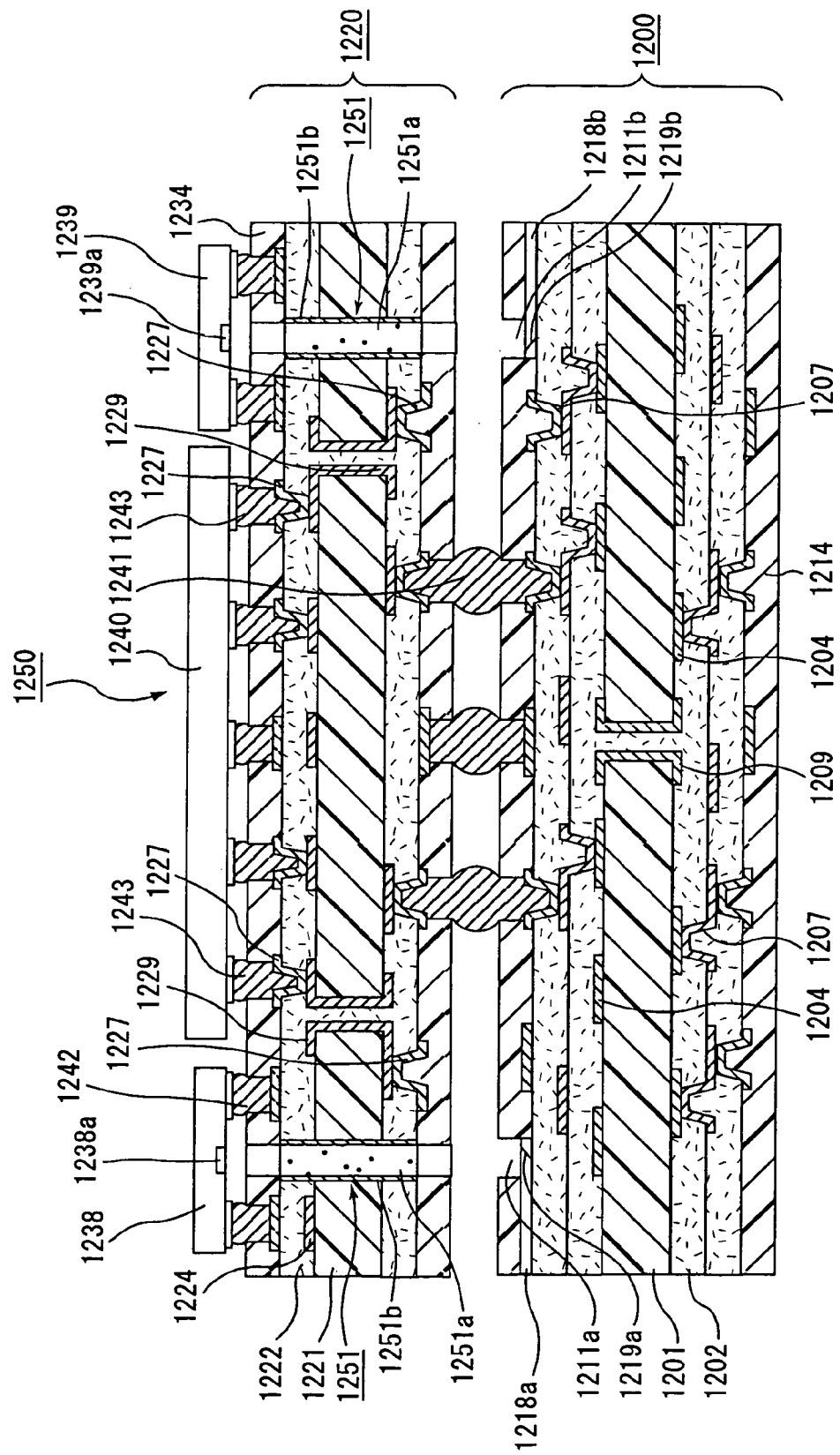
FIG. 3 is a cross-sectional view schematically showing one embodiment of a device for optical communication according to the third aspect of the first group of the present invention.

FIG. 3 is a cross-sectional view schematically showing one embodiment of the device for optical communication according to the third aspect of the first group of the present invention. It is noted that FIG. 3 shows the device for optical communication in a state where an IC chip is mounted.

As shown in FIG. 3, the device for optical communication 1250 comprises a substrate for mounting an IC chip 1220 on which an IC chip 1240 is mounted and a multilayered printed circuit board 1200, with the substrate for mounting an IC chip 1220 electrically connected to the multilayered printed circuit board 1200 through solder connection parts 1241.

The substrate for mounting an IC chip 1220 is constituted such that conductor circuits 1224 and interlaminar insulating layers 1222 are serially built up on both faces of a substrate 1221 in an alternate fashion and in repetition and that the conductor circuits across the substrate 1221 and those across the interlaminar insulating layers 1222 are electrically connected to one another by a plated-through hole 1229 and via-holes 1227, respectively.

In addition, optical paths for transmitting optical signal 1251 penetrating the substrate for mounting an IC chip 1220 are formed in the substrate for mounting an IC chip 1220. A conductor layer 1251*b* is formed on a part of the wall faces of each of these optical paths for transmitting optical signal 1251 and a resin composition 1251*a* is filled into a part of the interior thereof. Therefore, each of the optical paths for transmitting optical signal 1251 comprises the resin composition, a cavity and the conductor layer around the resin composition and the cavity.

Furthermore, the substrate for mounting an IC chip 1220 is constituted such that a light receiving element 1238 and a light emitting element 1239 are mounted on one face of the substrate for mounting an IC chip 1220 on the side on which face the IC chip 1240 is mounted and that optical signal can be transmitted between the light receiving element 1238 and light emitting element 1239 and optical waveguides 1219 (1219*a*, 1219*b*) respectively.

A solder resist layer 1234 comprising solder bumps is formed on each outermost layer of the substrate for mounting an IC chip 1220.

The multilayered printed circuit board 1200 is constituted such that conductor circuits 1204 and interlaminar insulating layers 1202 are built up on both faces of a substrate 1201 and that the conductor circuits across the substrate 1201 and the conductor circuits across the interlaminar insulating layers 1202 are electrically connected to one another through a plated-through hole 1209 and via-holes 1207, respectively.

In addition, a solder resist layer 1214 comprising openings for optical paths 1211 and solder bumps is formed on the outermost layer of the multilayered printed circuit board 1200 on the side opposed to the substrate for mounting an IC chip 1220, and optical waveguides 1218 (1218*a*, 1218*b*) comprising optical conversion mirrors 1219 (1219*a*, 1219*b*) immediately under openings for optical paths 1211 (1211*a*, 1211*b*), respectively are formed.

In the device for optical communication 1250 thus constituted, optical signal transmitted from the outside through an optical fiber (not shown) is introduced into the optical waveguide 1218*a*, transmitted to the light receiving element 1238 (light receiving part 1238*a*) through the optical path conversion mirror 1219*a*, the opening for an optical path 1211*a* and the optical path for transmitting optical signal 1251, and converted into an electric signal by the light receiving element 1238, and the resultant electric signal is transmitted to the IC chip 1240 through the solder connection parts 1242, the conductor circuits 1224, the via-holes 1227 and solder connection parts 1243.

Further, the electric signal transmitted from the IC chip 1240 is fed to the light emitting element 1239 through the solder connection parts 1243, the via-holes 1227, the conductor circuits 1224 and solder connection parts 1242 and converted into optical signal by the light emitting element 1239, and the resultant optical signal is introduced into the optical waveguide 1218*b* from the light emitting element 1239 (light emitting part 1239*a*) through the optical path for transmitting optical signal 1251, the opening for an optical path 1211*b* and the optical conversion mirror 1219*b* and fed to the outside through the optical fiber (not shown) as optical signal.

In the device for optical communication according to the third aspect of the first group of the present invention, optical/electric signal conversion is performed on the surface of the substrate for mounting an IC chip, i.e., at a position near the IC chip. Therefore, an electric signal transmission distance is short and it is possible to satisfy higher rate communication.

Furthermore, the electric signal transmitted from the IC chip is not only converted into optical signal, and then transmitted to the outside through the optical fiber as mentioned above but also the electric signal is transmitted to the multilayered printed circuit board through the solder connection parts and then transmitted to an electronic component such as the other IC chip mounted on the multilayered printed circuit board through the conductor circuits (including the via-holes and plated-through hole) of the multilayered printed circuit board.

Moreover, in the device for optical communication 1250 having the above-mentioned configuration, it is difficult to cause the positional deviation of the light receiving element and the light emitting element mounted on the substrate for mounting an IC chip and the optical waveguides formed on the multilayered printed circuit board, thus ensuring excellent optical signal connection reliability.

The positions at which the optical waveguides are formed on the multilayered printed circuit board shown in FIG. 3 are on the outermost interlaminar insulating layer of the multilayered printed circuit board on the side closer to the substrate for mounting an IC chip. However, in the multilayered printed circuit board that constitutes the substrate for mounting an IC chip according to the third aspect of the first group of the present invention, the formation positions of the optical waveguides are not limited to these positions but may be between the interlaminar insulating layers or on the substrate.

Next, a method of manufacturing the device for optical communication according to the third aspect of the first group of the present invention will be described.

The device for optical communication can be manufactured by first manufacturing the substrate for mounting an IC chip and the multilayered printed circuit board separately and, then, connecting them through solders or the like.

Therefore, a method of manufacturing the substrate for mounting an IC chip and a method of manufacturing the multilayered printed circuit board will be described first, and then a method of connecting the substrate for mounting an IC chip and the multilayered printed circuit board will be described herein.

As the method of manufacturing a substrate for mounting an IC chip, the same method as that for manufacturing the substrate for mounting an IC chip according to the first aspect of the first group of the present invention or the like can be used.

It is noted that the solder resist layers are not necessarily formed on the substrate for mounting an IC chip that constitutes the device for optical communication according to the third aspect of the first group of the present invention as mentioned above. Therefore, when the substrate for mounting an IC chip on which no solder resist layers are formed is to be manufactured, it suffices to omit the step (c) of the manufacturing method of the substrate for mounting an IC chip according to the second aspect of the first group of the present invention.

As the method of manufacturing the multilayered printed circuit board, a method wherein the following steps (1) to (6) are executed or the like can be used.

(1) A multilayered circuit board is manufactured using the same method as the step (a) of the manufacturing method of the substrate for mounting an IC chip according to the second aspect of the first group of the present invention.

(2) Next, optical waveguides are formed on non conductor formed areas on the interlaminar insulating layer of the multilayered circuit board.

The optical waveguides can be formed using the method of forming the optical waveguides on the multilayered printed circuit board in a manufacturing method of a device for optical communication according to the second aspect of the second group of the present invention to be described later, i.e., using the same method as that used in the step (3) of the multilayered printed circuit board manufacturing method or the like.

When the optical waveguides each having a core containing particles are formed out of a polymer material, it is desirable to use a mold formation method rather than an exposure-development method of the following reason.

When a groove for forming core is formed in a lower cladding by mold formation and a core is formed in this groove by the mold formation method of forming the core, all the particles contained in the core enter into the core, so that the surface of the core becomes flat and excellent optical signal transmission characteristic is ensured. On the other hand, when the core is formed by the exposure-development method, a part of particles protrude from the surface of the core after development or recesses from which the particles are eliminated are formed in the core surface, with the result that irregularities are often formed on the surface of the core. The irregularities prevent light from being reflected in a desired direction, with the result that the optical signal transmission characteristic deteriorates.

Furthermore, an optical path conversion mirror is formed on each of the optical waveguides.

The optical path conversion mirror may be formed either before or after the optical waveguide is attached onto the interlaminar insulating layer. However, it is desirable to form the optical path conversion mirror in advance except for a case where the optical waveguide is directly formed onto the interlaminar insulating layer. Therefore, operation is facilitated and there is no possibility of damaging or breaking the other members including the conductor circuits and the interlaminar insulating layers that constitute the multilayered printed circuit board.

As the method of forming the optical path conversion mirror, the same method as that used in the step (3) of the manufacturing method of the multilayered printed circuit board in the manufacturing method of the device for optical communication according to the second aspect of the second group of the present invention or the like can be used. Alternatively, an optical path conversion member may be embedded in place of forming the optical path conversion mirror.

(3) Next, a solder resist composition layer is formed on the outermost layer of the multilayered printed circuit board on which the optical waveguides are formed. The solder resist composition layer can be formed using the same resin composition as that used to form the solder resist layer in the manufacturing method of the substrate for mounting an IC chip according to the second aspect of the first group of the present invention or the like. It is noted that the solder resist composition layer may be formed if necessary.

(4) Next, openings for forming solder bumps and openings for optical paths are formed in the solder resist composition layer on the side opposed to the substrate for mounting an IC chip, thereby providing a solder resist layer.

The openings for forming solder bumps and openings for optical paths can be formed using the same method as that of forming the openings for forming solder bumps in the substrate for mounting an IC chip, i.e., exposure and development treatments, a laser treatment or the like can be used.

It is noted that the formation of the openings for forming solder bumps and that of the openings for optical paths may be performed either simultaneously or separately.

Among these methods, it is desirable to select the method of forming the openings for forming solder bumps and the openings for optical paths by applying a resin composition containing, as a material therefor, photosensitive resin and conducting exposure and development treatments at the time of forming the solder resist layer.

When the openings for optical paths are formed by the exposure and development treatments, there is no possibility of damaging the optical waveguides present under the openings for optical paths at the time of forming the openings.

Alternatively, the solder resist layer having the openings for forming solder bumps and the openings for optical paths may be formed by manufacturing a resin film having openings at desired positions in advance and bonding it thereon.

Further, if necessary, the solder resist layer on the face of the multilayered printed circuit board opposite to the face thereof opposed to the substrate for mounting an IC chip may be formed to have openings for forming solder bumps.

This is because external connection terminals can be formed on the solder resist layer on the face of the multilayered printed circuit board opposite to the face opposed to the substrate for mounting an IC chip through later steps.

In this step, after forming the openings for optical paths, a resin composition may be filled into the openings for optical paths. Examples of the resin composition filled into the openings for optical paths include the same as the resin composition filled in the through holes for optical paths in the manufacturing method of the substrate for mounting an IC chip according to the second aspect of the first group of the present invention and the like.

(5) Next, conductor circuit portions exposed by forming the openings for forming solder bumps are covered with corrosion resistant metal such as nickel, palladium, gold, silver and platinum to thereby provide solder pads if necessary. Specifically, the same method as that for forming the solder pads in the manufacturing method of the substrate for mounting an IC chip according to the second aspect of the first group of the present invention may be used so as to form the solder pads.

(6) After filling solder paste into the solder pads through a mask having opening parts formed in portions corresponding to the solder pads, reflow is conducted to thereby form the solder bumps. A PGA or a BGA in place of the solder pads may be formed in some cases.

In addition, on the solder resist layer on the face of the multilayered printed circuit board opposite to the face thereof opposed to the substrate for mounting an IC chip, the PGA or BGA may be provided by disposing pins or forming solder balls on the external substrate connection face of the solder resist layer.

Through these steps, it is possible to manufacture the multilayered printed circuit board that constitutes the device for optical communication according to the third aspect of the first group of the present invention.

Next, the method of manufacturing the device for optical communication using the substrate for mounting an IC chip and the multilayered printed circuit board manufactured by the above-mentioned methods will be described.

First, solder connection parts are formed by the solder bumps of the substrate for mounting an IC chip and the solder bumps of the multilayered printed circuit board, respectively and the substrate for mounting an IC chip and the multilayered printed circuit board are electrically connected to each other.

Namely, the substrate for mounting an IC chip and the multilayered printed circuit board are disposed to be opposed to each other at predetermined positions in predetermined directions, respectively, and reflow is then conducted to connect the substrate for mounting an IC chip to the multilayered printed circuit board, whereby the device for optical communication can be obtained.

In this step, the substrate for mounting an IC chip and the multilayered printed circuit board are connected to each other using their solder bumps. Due to this, even when there is slight positional deviation between the substrate for mounting an IC chip and the multilayered printed circuit board at the time of disposing them to be opposed to each other; it is possible to dispose them at their respective predetermined positions by the self-alignment effect of the solders during reflow.

It is noted that the solder bumps may be formed on only one of the faces of the substrate for mounting an IC chip and multilayered printed circuit board. In this case, the substrate for mounting an IC chip and the multilayered printed circuit board can be electrically connected to each other, as well.

Next, an IC chip is mounted on the substrate for mounting an IC chip and then sealed with resin if necessary.

The IC chip can be mounted by a conventional well-known method. It is noted that the IC chip capable of being mounted by flip-chip connection is desirably used as mentioned above.

Alternatively, the IC chip may be mounted before connecting the substrate for mounting an IC chip to the multilayered printed circuit board and then the substrate for mounting an IC chip on which the IC chip is mounted may be connected to the multilayered printed circuit board.

Through these steps, it is possible to manufacture the device for optical communication according to the third aspect of the first group of the present invention.

Next, a device for optical communication according to the fourth aspect of the first group of the present invention will be described.

The device for optical communication according to the fourth aspect of the first group of the present invention is a device for optical communication comprising a substrate for mounting an IC chip and a multilayered printed circuit board, wherein the multilayered printed circuit board includes a substrate and a conductor circuit, and an optical path for transmitting optical signal which penetrates at least the substrate is formed in the multilayered printed circuit board.

The device for optical communication according to the fourth aspect of the first group of the present invention can transmit optical signal through the optical paths for transmitting optical signal formed in the multilayered printed circuit board.

The substrate for mounting an IC chip that constitutes the device for optical communication is not limited to a specific substrate and examples of the substrate for mounting an IC chip include the substrate for mounting an IC chip according to the first aspect of the first group of the present invention and the like.

In addition, optical paths for transmitting optical signal are not necessarily formed in the substrate for mounting an IC chip that constitutes the device for optical communication according to the fourth aspect of the first group of the present invention. Accordingly, when optical elements such as a light receiving element and a light emitting element are mounted on the substrate for mounting an IC chip, it suffices to attach these optical elements on the side of the substrate for mounting an IC chip opposed to the multilayered printed circuit board through solders, conductive adhesive or the like. In this case, even when no optical paths for transmitting optical signal are formed in the substrate for mounting an IC chip, it is possible to transmit optical signal between the light receiving element and light emitting element and the optical waveguides formed on the multilayered printed circuit board. Further, even when the optical elements are mounted on the side of the substrate for mounting an IC chip opposed to the multilayered printed circuit board, the optical elements are desirably mounted on the surface of the substrate for mounting an IC chip.

It is also desirable that the substrate for mounting an IC chip that constitutes the device for optical communication according to the fourth aspect of the first group of the present invention is constituted to include conductor circuits, interlaminar insulating layers and via-holes for connecting the conductor circuits across the interlaminar insulating layers. This is because it is possible to increase the density of the substrate for mounting an IC chip.

It is noted that an RCC type substrate or the like may be used as the substrate for mounting an IC chip.

Furthers solder resist layers may not be formed on the outermost layers of the substrate for mounting an IC chip, respectively. However, when the solder resist layers are formed on the respective outermost layers of the substrate for mounting an IC chip, it is possible to attain an alignment effect by the self-alignment function at the time of connecting the substrate for mounting an IC chip to the multilayered printed circuit board through solder bumps or the like or at the time of mounting optical elements on the surface of the substrate for mounting an IC chip.

Furthermore, the multilayered printed circuit board that constitutes the device for optical communication according to the fourth aspect of the first group of the present invention is constituted to include a substrate and conductor circuits and further constituted such that optical paths for transmitting optical signal penetrating at least the substrate are formed in the multilayered printed circuit board.

Such a multilayered printed circuit board can transmit optical signal between the multilayered printed circuit board and an external substrate (substrate for mounting an IC chip) through the optical paths for transmitting optical signal.

In the multilayered printed circuit board having the optical paths for transmitting optical signal formed therein, at the time of forming optical waveguides, the degree of freedom for the positions at which the optical waveguides are formed improves, making it possible to increase the density of the multilayered printed circuit board. This is because the improved degree of freedom for the optical waveguide formation positions enables free space to be widened in the design of the multilayered printed circuit board.

In addition, in the multilayered printed circuit board, when the optical waveguides are to be formed, the optical waveguides can be aligned relative to the respective optical paths for transmitting optical signal by an optical treatment or a mechanical treatment. It is therefore possible to accurately form the optical waveguides at desired positions, respectively.

It is desirable that each of the optical paths for transmitting optical signal comprises a cavity. When the optical path for transmitting optical signal comprises a cavity, it is easy to form the optical path for transmitting optical signal and it is difficult to cause transmission loss to occur in the transmission of optical signal through the optical paths for transmitting optical signal. Whether the optical path for transmitting optical signal is constituted of a cavity or not may be appropriately determined based on the thickness of the substrate for mounting an IC chip and the like.

It is also desirable that each of the optical paths for transmitting optical signal comprises a resin composition and a cavity. When each of the optical paths for transmitting optical signal comprises a resin composition and a cavity, it is possible to prevent the deterioration of the strength of the multilayered printed circuit board.

It is further desirable that each of the optical paths for transmitting optical signal comprises a resin composition. When each of the optical paths for transmitting optical signal comprises a resin composition, it is possible to prevent the deterioration of the strength of the substrate for mounting an IC chip.

When each of the optical paths for transmitting optical signal comprises the resin composition, it is possible to prevent dust, foreign matters and the like from entering into the optical path for transmitting optical signal. It is therefore possible to prevent the transmission of optical signal from being hampered by the presence of the dust, foreign matters and the like.

In addition, it is difficult to have an adverse influence on the optical paths for transmitting optical signal constituted as mentioned above, i.e., the optical paths for transmitting optical signal each comprising both of or either of a cavity and a resin composition by heat and the like (e.g., the cross-sectional diameter of each optical path for transmitting optical signal is made small) in a heat treatment step or a reliability test.

When a part of or all of each of the optical paths for transmitting optical signal comprises a resin composition, examples of the resin composition include the same as the resin composition that constitutes each of the optical paths for transmitting optical signal on the substrate for mounting an IC chip according to the first aspect of the first group of the present invention and the like.

The shape of the optical paths for transmitting optical signal is not limited to a specific one and examples of the shape include columnar, elliptical columnar, quadrangular columnar, polygonal columnar or the like. Among them, the columnar shape is desirable. This is because the influence of this shape on the transmission of optical signal is the smallest and it is easy to form the optical path into a cylindrical shape.

The lower limit and upper limit of the cross-sectional diameter of each of the optical paths for transmitting optical signal are desirably 100 μm and 500 μm, respectively. When the cross-sectional diameter is less than 100 μm, the optical path may possibly be closed. When at least a part of the optical path for transmitting optical signal comprises a resin composition, it is difficult to fill the optical path with an uncured resin composition. On the other hand, even when the cross-sectional diameter is made larger than 500 μm, the optical signal transmission characteristic does not improve so greatly and such a large cross-sectional diameter often hampers the degree of freedom for the design of conductor circuits and the like that constitute the multilayered printed circuit board.

The lower limit and upper limit of the cross-sectional diameter are more desirably 250 μm and 350 μm, respectively. When they fall within this range, both the optical signal transmission characteristic and the degree of freedom for design are excellent and no problem occurs even when the optical path is filled with the uncured resin composition.

It is desirable that the optical path for transmitting optical signal comprises a cavity and a conductor layer around the cavity.

It is also desirable that each of the optical paths for transmitting optical signal comprises a resin composition and a conductor layer around the resin composition.

It is further desirable that each of the optical paths for transmitting optical signal comprises a resin composition, a cavity and a conductor layer around the resin composition and the cavity.

When the conductor layer is to be formed, the conductor layer may be formed entirely around the resin composition and/or the cavity or may be formed only partially around the resin composition and/or the cavity.

In this way, by forming the conductor layer on the optical path for transmitting optical signal, it is possible to decrease the irregular reflection of light on the wall faces of the optical path for transmitting optical signal and improve the optical signal transmission characteristic. The conductor layer may comprise one layer or two or more layers.

Examples of a material for the conductor layer include copper, nickel, chromium, titanium, noble metal and the like.

Further, the conductor layer can often serve as a plated-through hole, i.e., serve to electrically connect the conductor circuits across the substrate or the conductor circuits across the substrate and the interlaminar insulating layers.

The material for the conductor layer is desirably metal having glossiness such as noble metal. When the conductor layer is formed out of metal having glossiness, optical signal loss is less and the transmission of optical signal is less hampered. Therefore, it is possible to further ensure that the optical signal is transmitted through the optical paths for transmitting optical signal.

Furthermore, a covering layer comprising tin, titanium, zinc or the like or a roughened layer may be provided on the conductor layer. Depending on the kind (wavelength or the like) of optical signal to be transmitted through the optical paths for transmitting optical signal, it is desirable to suppress the irregular reflection of light on the wall faces of the optical path for transmitting optical signal. By providing the covering layer or roughened layer and thereby decreasing the irregular reflection of light on the wall faces, it is possible to improve the optical signal transmission characteristic in some cases.

Moreover, by forming the roughened layer or the like on the wall faces of each optical path for transmitting optical signal, it is possible to further improve the adhesion between the optical path for transmitting optical signal and the substrate or the interlaminar insulating layer.

In addition, the optical path for transmitting optical signal comprising the resin composition (including a portion comprising the resin composition of the optical path for transmitting optical signal comprising a cavity and a resin composition) or the conductor layer may contact with the substrate or the interlaminar insulating layer through the roughened layer. When each of the optical paths for transmitting optical signal or the like contacts with the substrate or the interlaminar insulating layer through the roughened layer, the adhesion thereof to the substrate or the interlaminar insulating layer is excellent to make it more difficult to cause the optical path for transmitting optical signal or the like to be peeled off.

In the multilayered printed circuit board, both an optical path for transmitting optical signal for light reception and an optical path for transmitting optical signal for light emission may be formed as the optical paths for transmitting optical signal or only one of them may be formed. Accordingly, in the multilayered printed circuit board, a plurality of optical paths for transmitting optical signal may be formed.

Further, in the multilayered printed circuit board, each optical path for transmitting optical signal may be formed per communication wavelength.

It is desirable to dispose a micro lens on the end portion of each of the optical paths for transmitting optical signal formed in the multilayered printed circuit board, particularly on the end portion thereof on the side opposed to the substrate for mounting an IC chip. By providing the micro lens, it is possible to further decrease the optical signal transmission loss.

Examples of the micro lens include the same as that formed on the end portion of each of the optical paths for transmitting optical signal in the substrate for mounting an IC chip according to the first aspect of the first group of the present invention and the like.

It is further desirable to form optical waveguides on the multilayered printed circuit board.

In such a multilayered printed circuit board, optical signal can be transmitted through the optical paths for transmitting optical signal and the optical waveguides.

Examples of the optical waveguides include the same as those formed on the multilayered printed circuit board that constitutes the device for optical communication according to the third aspect of the first group of the present invention and the like.

Further, it is desirable that an optical conversion mirror is formed on each of the optical waveguides similarly to the multilayered printed circuit board that constitutes the device for optical communication according to the third aspect of the first group of the present invention.

Alternatively, the multilayered printed circuit board may be constituted to include conductor circuits, interlaminar insulating layers and via-holes for connecting the conductor circuits across the interlaminar insulating layers. With this configuration, it is possible to increase the density of the multilayered printed circuit board.

In addition, it is desirable that solder bumps for transmitting an electric signal are formed on the multilayered printed circuit board. By forming the solder bumps, it is possible to transmit an electric signal between the multilayered printed circuit board and an external electronic component or an external substrate.

When the solder bumps are formed, the substrate for mounting an IC chip is connected to the multilayered printed circuit board through the solder bumps, whereby it is possible to dispose the light receiving element and the light emitting element mounted on the substrate for mounting an IC chip and the optical waveguides formed on the multilayered printed circuit board at respective predetermined positions opposed to one another. This is because the self-alignment function of solders can be utilized. When the substrate for mounting an IC chip is connected to the multilayered printed circuit board through a PGA or a BGA, it is possible to attain the same effect.

As described above, the device for optical communication according to the fourth aspect of the first group of the present invention is not limited to a specific one as long as the device for optical communication comprises the substrate for mounting an IC chip and the multilayered printed circuit board having the optical paths for transmitting optical signal formed therein as mentioned above. It is, however, desirable that the device for optical communication is constituted to comprise the substrate for mounting an IC chip on which the light receiving element and the light emitting element are mounted and the multilayered printed circuit board on which the optical waveguides are formed, and to be able to transmit optical signal through the optical paths for transmitting optical signal between the light receiving element and light emitting element and the optical waveguides.

The embodiment of the device for optical communication according to the fourth aspect of the first group of the present invention will be described with reference to the drawings.

Figure 4:
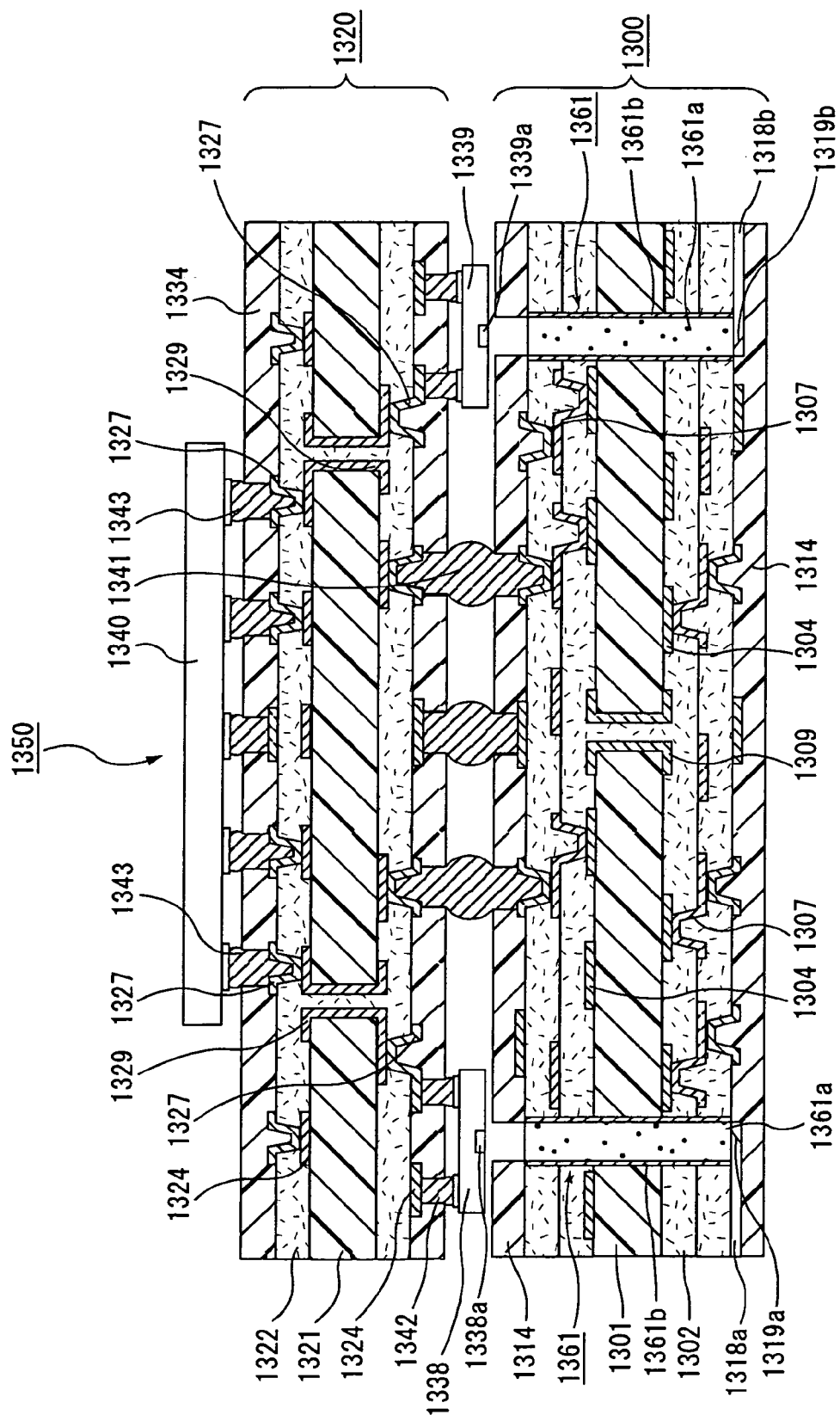
FIG. 4 is a cross-sectional view schematically showing one embodiment of a device for optical communication according to the fourth aspect of the first group of the present invention.

FIG. 4 is a cross-sectional view schematically showing one embodiment of the device for optical communication according to the fourth aspect of the first group of the present invention. It is noted that FIG. 4 shows the device for optical communication in a state where an IC chip is mounted.

As shown in FIG. 4, the device for optical communication 1350 according to the fourth aspect of the first group of the present invention comprises a substrate for mounting an IC chip 1320 on which an IC chip 1340 is mounted and a multilayered printed circuit board 1300, with the substrate for mounting an IC chip 1320 electrically connected to the multilayered printed circuit board 1300 through solder connection parts 1341.

The substrate for mounting an IC chip 1320 is constituted such that conductor circuits 1324 and interlaminar insulating layers 1322 are serially built up on both faces of a substrate 1321 in an alternate fashion and in repetition and that the conductor circuits across the substrate 1321 and those across the interlaminar insulating layers 1322 are electrically connected to one another by a plated-through hole 1329 and via-holes 1327, respectively.

Further, a solder resist layer 1334 comprising solder bumps is formed on each outermost layer of the substrate for mounting an IC chip 1320, and the outermost layer thereof on the side opposed to the multilayered printed circuit board 1300 comprises a light receiving element 1338 and a light emitting element 1339 so that a light receiving part 1338a and a light emitting part 1339a are exposed.

The multilayered printed circuit board 1300 is constituted such that conductor circuits 1304 and interlaminar insulating layers 1302 are serially built up on both faces of a substrate 1301 in an alternate fashion and in repetition and that the conductor circuits across the substrate 1301 and the conductor circuits across the interlaminar insulating layers 1302 are electrically connected to one another through a plated-through hole 1309 and via-holes 1307, respectively.

In addition, optical paths for transmitting optical signal 1361 penetrating the substrate 1301, the interlaminar insulating layers 1302 and solder resist layers 1314 are formed in the multilayered printed circuit board 1300. The multilayered printed circuit board 1300 is constituted to be able to transmit optical signal between optical waveguides 1319 (1319a, 1319b) and the light receiving element 1338 and light emitting element 1339 through the optical paths for transmitting optical signal 1361, respectively. Further, a conductor layer 1316b is formed on a part of the wall faces of each of the optical paths for transmitting optical signal 1361 and a resin composition 1361a is filled into a part of the interior thereof.

In the multilayered printed circuit board 1300, the optical waveguides 1319 are formed on the outermost interlaminar insulating layer 1302 of the multilayered printed circuit board 1300 on the opposite side to the substrate for mounting an IC chip 1320 across the substrate 1301, and the optical waveguides 1319 comprise optical path conversion mirrors 1319 (1319a, 1319b) respectively.

In the device for optical communication 1150 shown in FIG. 4, the light receiving element and the light emitting element are mounted on the face on the side opposed to the multilayered printed circuit board.

The formation positions of the optical waveguides on the multilayered printed circuit board shown in FIG. 4 are on the outermost interlaminar insulating layer of the multilayered printed circuit board. However, the formation positions of the optical waveguides in the multilayered printed circuit board that constitutes the substrate for mounting an IC chip according to the fourth aspect of the first group of the present invention are not limited to these positions but may be between the interlaminar insulating layers or on the substrate.

In the device for optical communication according to the fourth aspect of the first group of the present invention, optical/electric signal conversion is performed in the substrate for mounting an IC chip, i.e., at a position near the IC chip. Therefore, an electric signal transmission distance is short and it is possible to satisfy higher rate communication.

Furthermore, the electric signal transmitted from the IC chip is not only converted into the optical signal and then transmitted to the outside through the optical fiber as mentioned above, but also the electric signal is transmitted to the multilayered printed circuit board through the solder connection parts and then transmitted to an electric component such as the other IC chip mounted on the multilayered printed circuit board through the conductor circuits (including the via-holes and plated-through hole) of the multilayered printed circuit board.

Moreover, in the device for optical communication having the above-mentioned configuration, the positional deviation of the light receiving element and the light emitting element mounted on the substrate for mounting an IC chip and the optical waveguides formed on the multilayered printed circuit board, is less likely to be caused, thus ensuring excellent optical signal connection reliability.

Next, a method of manufacturing the device for optical communication according to the fourth aspect of the first group of the present invention will be described.

Similarly to the case of manufacturing the device for optical communication according to the third aspect of the first group of the present invention, the device for optical communication can be manufactured by first manufacturing the substrate for mounting an IC chip and the multilayered printed circuit board separately and, then, connecting them through solders or the like.

Therefore, a manufacturing method of the substrate for mounting an IC chip and a manufacturing method of the multilayered printed circuit board will be described first, and then a connecting method of the substrate for mounting an IC chip and the multilayered printed circuit board will be described herein.

As the manufacturing method of the substrate for mounting an IC chip, the same method as that of manufacturing the substrate for mounting an IC chip according to the first aspect of the first group of the present invention or the like can be used.

It is noted that the optical paths for transmitting optical signal are not necessarily formed in the substrate for mounting an IC chip that constitutes the device for optical communication according to the fourth aspect of the first group of the present invention as mentioned above.

Therefore, when the substrate for mounting an IC chip on which no optical paths for transmitting optical signal are formed is to be manufactured, it suffices to omit the step (b), further omit the formation of the openings for optical paths and if necessary, form openings for optical paths in the step (c) of the manufacturing method of the substrate for mounting an IC chip according to the second aspect of the first group of the present invention.

In addition, when the substrate for mounting an IC chip is formed, solder resist layers may be formed if necessary.

As the method of manufacturing the multilayered printed circuit board, a method comprising the following steps (1) to (5), or the like, can be used.

(1) Using the same methods as those used in the steps (a) and (b) of the manufacturing method of the substrate for mounting an IC chip according to the second aspect of the first group of the present invention, a multilayered circuit board having through holes for optical paths formed therein is manufactured.

(2) Next, optical waveguides are formed on non conductor formed areas on the interlaminar insulating layer of the multilayered circuit board. The optical waveguides are formed on the position at which transmission of optical signal through the through holes for optical paths is possible.

As a specific optical waveguide formation method, the same method as that used in the step (2) of the method of manufacturing the multilayered printed circuit board that constitutes the device for optical communication according to the fourth aspect of the first group of the present invention or the like can be used.

In addition, optical conversion mirrors are formed on the optical waveguides formed herein.

(3) Next, a solder resist layer is formed on the outermost layer of the multilayered circuit board on which the optical waveguides are formed. The solder resist layer may be formed using the same method as that used in the step (3) of the method of manufacturing the multilayered printed circuit board that constitutes the device for optical communication according to the fourth aspect of the first group of the present invention or the like.

It is noted that the solder resist layer may be formed if necessary.

(4) Next, openings for forming solder bumps and openings for optical paths are formed on the solder resist layer on the side of the multilayered circuit board opposed to the substrate for mounting an IC chip.

The openings for forming solder bumps and openings for optical paths may be formed using the same method as that used in the step (4) of the method of manufacturing the multilayered printed circuit board that constituted the device for optical communication according to the fourth aspect of the first group of the present invention or the like.

Further, the openings for optical paths are formed to communicate with the through holes for optical paths formed in the step (1).

In this step, after forming the openings for optical paths, a resin composition may be filled into the openings for optical paths. Examples of the resin composition include the same as the resin composition filled into the through holes for optical paths in the step (1) and the like. Alternatively, in this step, the resin composition may be filled into the through holes for optical paths and the openings for optical paths simultaneously.

(5) Next, using the same methods as those used in the steps (5) and (6) of the method of manufacturing the multilayered printed circuit board that constitutes the device for optical communication according to the fourth aspect of the first group of the present invention or the like, solder pads, solder bumps or the like are formed, whereby it is possible to manufacture the multilayered printed circuit board that constitutes the device for optical communication according to the fourth aspect of the first group of the present invention.

Next, the substrate for mounting an IC chip and the multilayered printed circuit board manufactured by the methods are connected to each other, thereby manufacturing the device for optical communication.

Specifically, for manufacturing the device for optical communication, the same method as that used to manufacture the device for optical communication according to the third aspect of the first group of the present invention may be used.

In addition, similarly to the case of manufacturing the device for optical communication according to the third aspect of the first group of the present invention, solder bumps may be formed on only one of the faces of the substrate for mounting an IC chip and the multilayered printed circuit board opposed to each other. In this case, the substrate for mounting an IC chip and the multilayered printed circuit board can be connected to each other, as well.

Next, a device for optical communication according to the fifth aspect of the first group of the present invention will be described.

The device for optical communication according to the fifth aspect of the first group of the present invention is a device for optical communication comprising a substrate for mounting an IC chip and a multilayered printed circuit board, wherein an optical path for transmitting optical signal which penetrates the substrate for mounting an IC chip is formed in the substrate for mounting an IC chip, the multilayered printed circuit board includes a substrate and a conductor circuit, and an optical path for transmitting optical signal which penetrates at least the substrate is formed in the multilayered printed circuit board.

The device for optical communication according to the fifth aspect of the first group of the present invention can transmit optical signal through the optical paths for transmitting optical signal formed in the substrate for mounting an IC chip and the optical paths for transmitting optical signal formed in the multilayered printed circuit board.

The substrate for mounting an IC chip that constitutes the device for optical communication according to the fifth aspect of the first group of the present invention is not limited to a specific one as long as the optical paths for transmitting optical signal penetrating the substrate for mounting an IC chip are formed in the substrate for mounting an IC chip and examples of the substrate for mounting an IC chip include the same as the substrate for mounting an IC chip that constitutes the device for optical communication according to the third aspect of the first group of the present invention and the like.

By using such a substrate for mounting an IC chip, it is possible to attain various effects mentioned above.

The multilayered printed circuit board that constitutes the device for optical communication according to the fifth aspect of the first group of the present invention is not limited to a specific one as long as the multilayered printed circuit board is constituted to include a substrate and conductor circuits and to have optical paths for transmitting optical signal, which penetrate at least the substrate, formed therein. Examples of the multilayered printed circuit board include the same as the multilayered printed circuit board that constitutes the device for optical communication according to the third aspect of the first group of the present invention and the like. By using such a multilayered printed circuit board, it is possible to attain various effects as mentioned above.

Specifically, the optical paths for transmitting optical signal are formed in each of the substrate for mounting an IC chip and the multilayered printed circuit board. Therefore, at the time of mounting optical elements on the substrate for mounting an IC chip or forming optical waveguides on the multilayered printed circuit board, the degree of freedom for the positions at which the optical elements are mounted and the positions at which the optical waveguides are formed is improved, thus making it possible to increase the density of the substrate for mounting an IC chip and that of the multilayered printed circuit board. This is because free space is widened in the design of the substrate for mounting an IC chip and the multilayered printed circuit board.

Furthermore, the optical element mounting positions and the optical waveguide formation positions can be aligned relative to the optical paths for transmitting optical signal formed in the substrate for mounting an IC chip and the multilayered printed circuit board, respectively, by an optical treatment or a mechanical treatment. It is therefore possible to accurately mount the optical elements and the optical waveguides at respective desired positions.

Furthermore, it is difficult to have an adverse influence on the optical paths for transmitting optical signal having the above-mentioned configuration by heat and the like in a heat treatment step or a reliability test.

The embodiment of the device for optical communication according to the fifth aspect of the first group of the present invention will be described with reference to the drawings.

Figure 5:
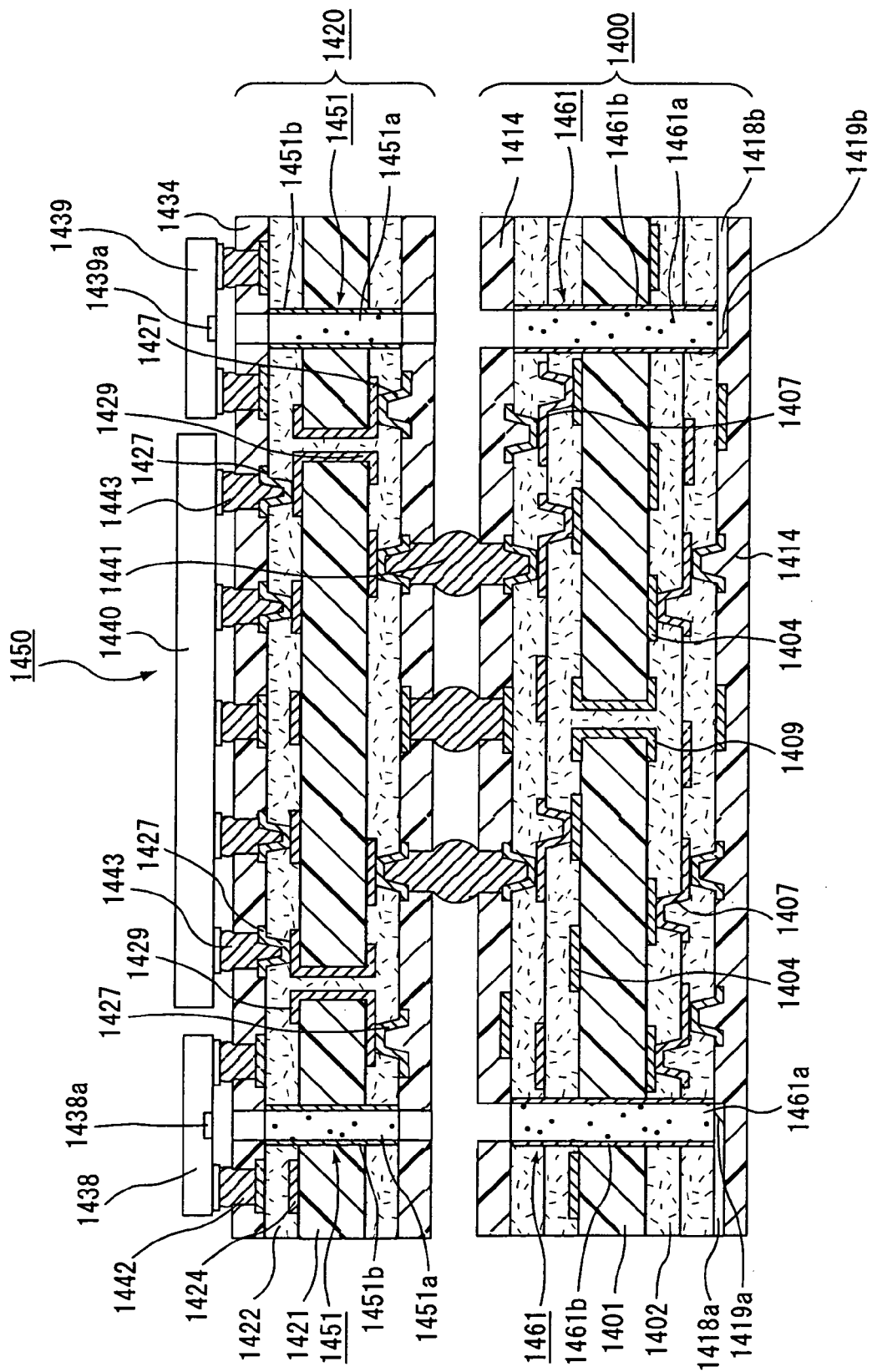
FIG. 5 is a cross-sectional view schematically showing one embodiment of a device for optical communication according to the fifth aspect of the first group of the present invention.

FIG. 5 is a cross-sectional view schematically showing one embodiment of the device for optical communication according to the fifth aspect of the first group of the present invention. It is noted that FIG. 5 shows the device for optical communication in a state where an IC chip is mounted.

As shown in FIG. 5, the device for optical communication 1450 according to the fifth aspect of the first group of the present invention comprises a substrate for mounting an IC chip 1420 on which an IC chip 1440 is mounted and a multilayered printed circuit board 1400, with the substrate for mounting an IC chip 1420 electrically connected to the multilayered printed circuit board 1400 through solder connection parts 1441.

Further, the device for optical communication 1450 is constituted such that optical paths for transmitting optical signal 1451 penetrating the substrate for mounting an IC chip 1420 are formed in the substrate for mounting an IC chip 1420. A conductor layer 1451b is formed on a part of the wall faces of each of these optical paths for transmitting optical signal 1451 and a resin composition 1451a is filled into a part of the interior thereof. This substrate for mounting an IC chip 1420 is equal in configuration to the substrate for mounting an IC chip 1220 shown in FIG. 3.

In addition, the device for optical communication 1450 is constituted such that optical paths for transmitting optical signal 1461 penetrating a substrate 1401, interlaminar insulating layers 1402 and solder resist layers 1414 are formed in the multilayered printed circuit board 1400 so as to be able to transmit optical signal between optical waveguides 1419 and a light receiving element 1438 and a light emitting element 1439, respectively. A conductor layer 1461b is formed on a part of the wall faces of each of these optical paths for transmitting optical signal 1461 and a resin composition 1461a is filled into a part of the interior thereof. This multilayered printed circuit board 1400 is equal in configuration to the multilayered printed circuit board 1300 shown in FIG. 4.

In this device for optical communication 1450, it is possible to transmit optical signal between the light receiving element 1438 and light emitting element 1439 and the optical waveguides 1419 through the optical paths for transmitting optical signal 1451 formed in and penetrating the substrate for mounting an IC chip 1420 and the optical paths for transmitting optical signal 1461 formed in the multilayered printed circuit board 1400 and penetrating the substrate 1401, the interlaminar insulating layers 1402 and the solder resist layers 1414.

Figure 6:
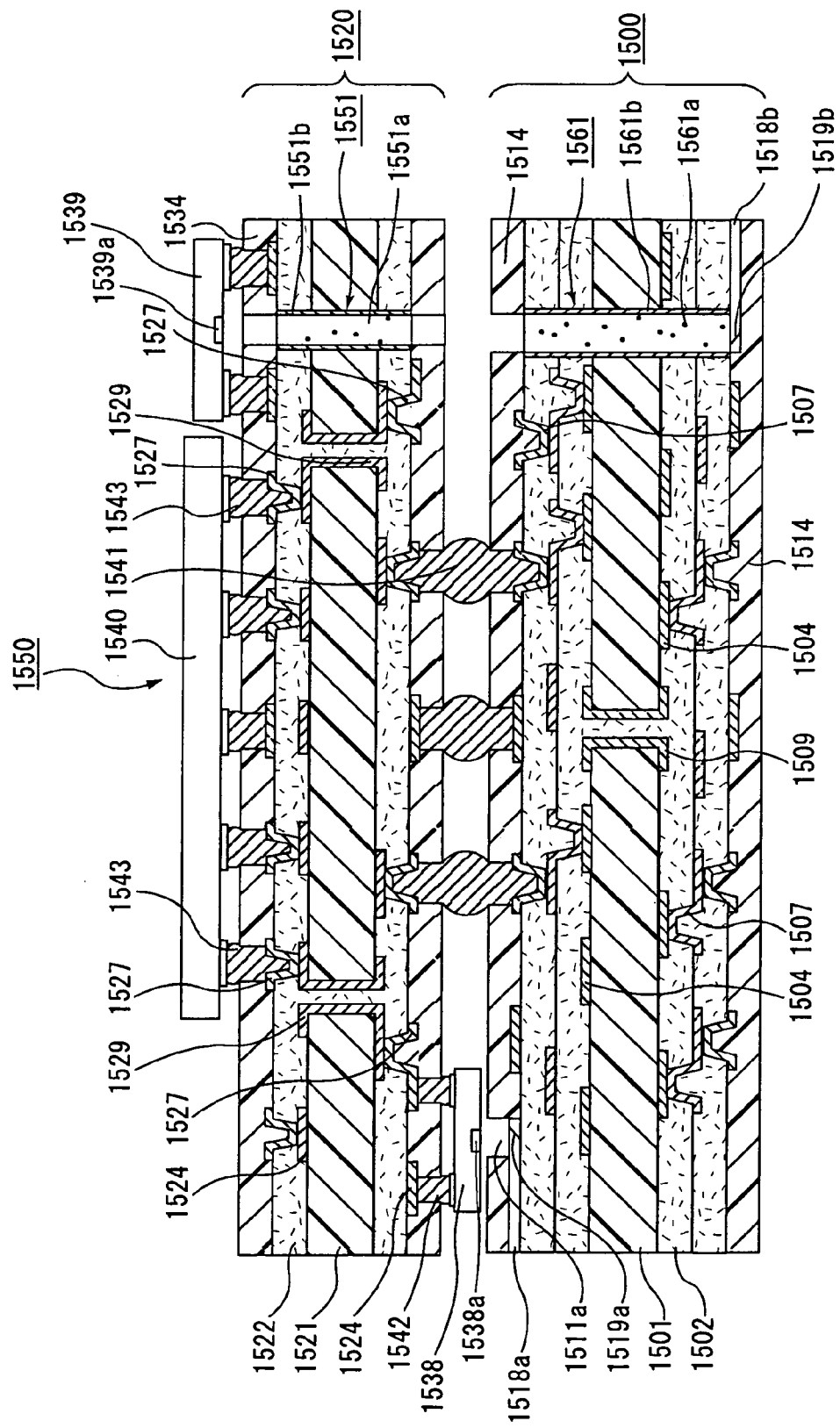
FIG. 6 is a cross-sectional view schematically showing another embodiment of the device for optical communication according to the fifth aspect of the first group of the present invention.
Figure 7:
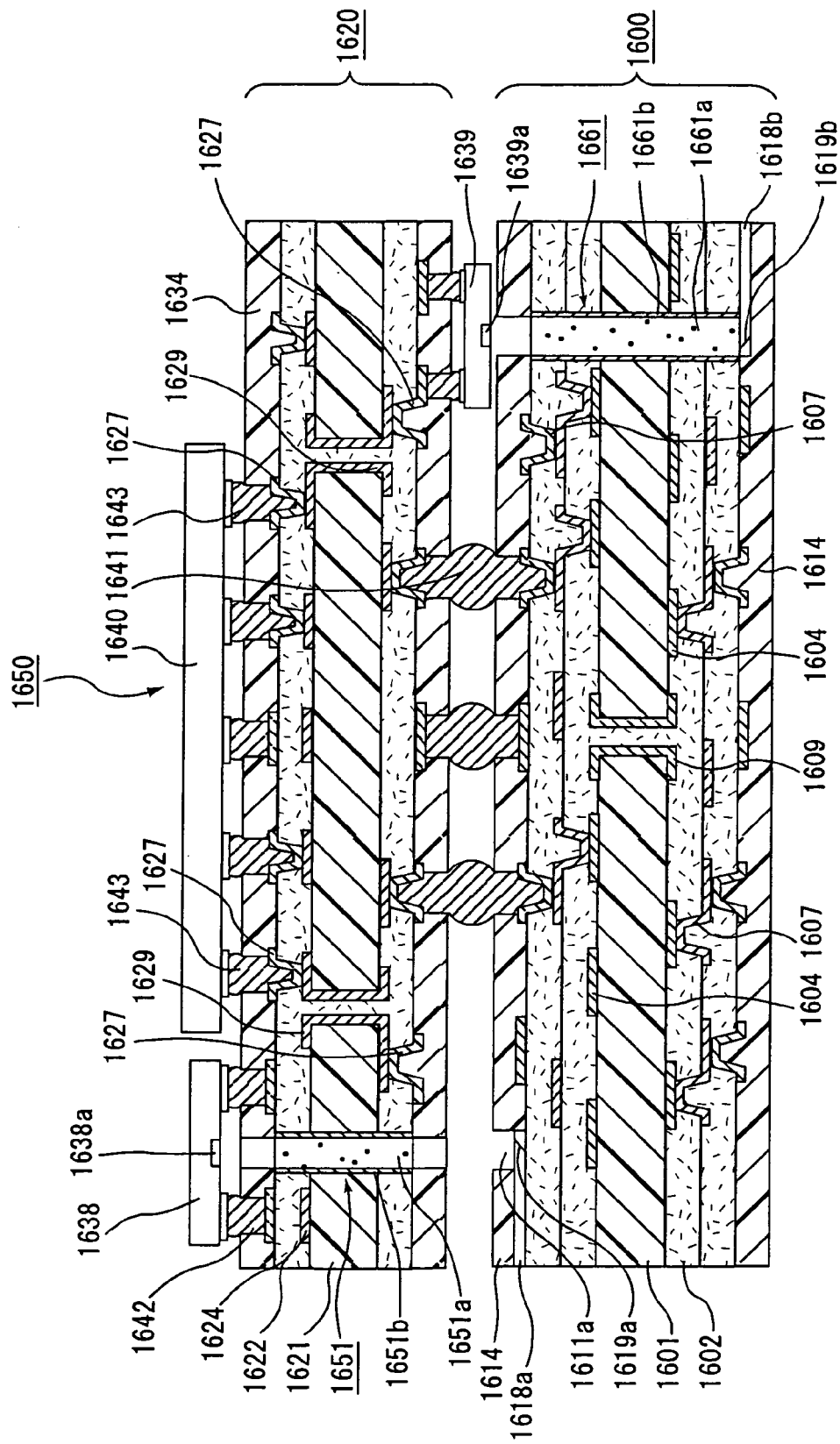
FIG. 7 is a cross-sectional view schematically showing another embodiment of the device for optical communication according to the fifth aspect of the first group of the present invention.

Furthermore, the embodiment of the device for optical communication according to the fifth aspect of the first group of the present invention is not limited to that shown in FIG. 5 but may be those shown in FIGS. 6 and 7.

Moreover, a substrate for mounting an IC chip 1550 shown in FIG. 6 is constituted such that a light receiving element 1538 is mounted on the face of the substrate for mounting an IC chip 1550 on the side opposed to a multilayered printed circuit board 1500 and that a light emitting element 1539 is mounted on the opposite face to the face thereof opposed to the multilayered printed circuit board 1500.

Further, an optical path for transmitting optical signal 1551 penetrating the substrate for mounting an IC chip 1520 is formed in the substrate for mounting an IC chip 1520 so as to be able to transmit optical signal between the light emitting element 1539 and an optical waveguide formed in the multilayered printed circuit board 1500. A conductor layer 1551b is formed on a part of the wall faces of the optical path for transmitting optical signal 1551 and a resin composition 1551a is filled into a part of the interior thereof.

Optical waveguides are formed in the multilayered printed circuit board 1500. The optical waveguide 1518a for transmitting optical signal between the optical waveguide 1518a and the light receiving element 1538 is formed on an outermost interlaminar insulating layer 1502 on the side near the substrate for mounting an IC chip 1520 across the substrate 1501. The optical waveguide 1518b for transmitting optical signal between the optical waveguide 1518b and the light emitting element 1539 is formed on an outermost interlaminar insulating layer 1502 on the opposite side to the substrate for mounting an IC chip 1520 across the substrate 1501. Further, an optical path for transmitting optical signal 1561 for transmitting optical signal between the light emitting element 1539 and the optical waveguide 1518b is formed in the multilayered printed circuit board 1500. The optical path for transmitting optical signal 1561 is formed to penetrate the substrate 1501, the interlaminar insulating layers 1502 and solder resist layers 1514. A conductor layer 1561b is formed on a part of the wall faces of the optical path for transmitting optical signal 1561 and a resin composition 1561a is filled into a part of the interior thereof.

In this device for optical communication 1550, the light emitting element 1539 and the optical waveguide 1519b can transmit optical signal therebetween through the optical path for transmitting optical signal 1551 formed in and penetrating the substrate for mounting an IC chip 1520 and the optical path for transmitting optical signal 1561 formed in the multilayered printed circuit board 1500 and penetrating the substrate 1501, the interlaminar insulating layers 1502 and the solder resist layers 1514.

The light receiving element 1538 and the optical waveguide 1519a can transmit optical signal therebetween through an opening for an optical path 1511a formed in the solder resist layer of the multilayered printed circuit board 1500.

Moreover, in a device for optical communication 1650 shown in FIG. 7, a light receiving element 1638 is mounted on the face of a substrate for mounting an IC chip 1620 opposite to the face thereof opposed to a multilayered printed circuit board 1600, and a light emitting element 1639 is mounted on the face of the substrate for mounting an IC chip 1620 on the side opposed to the multilayered printed circuit board 1600.

Further, an optical path for transmitting optical signal 1651 penetrating the substrate for mounting an IC chip 1650 is formed in the substrate for mounting an IC chip 1650 so as to be able to transmit optical signal between the light receiving element 1638 and an optical waveguide 1618a formed in the multilayered printed circuit board 1600. A conductor layer 1651b is formed on a part of the wall faces of the optical path for transmitting optical signal 1651 and a resin composition 1651a is filled into a part of the interior thereof.

Optical waveguides 1619 are formed in the multilayered printed circuit board 1600. The optical waveguide 1618a for transmitting optical signal between the optical waveguide 1618a and the light receiving element 1638 is formed on an outermost interlaminar insulating layer on the side near the substrate for mounting an IC chip 1620 across the substrate 1601. The optical waveguide 1618b for transmitting optical signal between the optical waveguide 1618b and the light emitting element 1639 is formed on an outermost interlaminar insulating layer on the opposite side to the substrate for mounting an IC chip 1620 across the substrate 1601. Further, the optical path for transmitting optical signal 1651 for transmitting optical signal between the light emitting element 1639 and the optical waveguide 1618b is formed in the multilayered printed circuit board 1600. The optical path for transmitting optical signal 1661 is formed to penetrate the substrate 1601, the interlaminar insulating layers 1602 and solder resist layers 1614. A conductor layer 1661b is formed on a part of the wall faces of the optical path for transmitting optical signal 1661 and a resin composition 1661a is filled into a part of the interior thereof.

In this device for optical communication 1650, the light emitting element 1639 and the optical waveguide 1619b can transmit optical signal therebetween through the optical path for transmitting optical signal 1661 formed in the multilayered printed circuit board 1600 and penetrating the substrate 1601, the interlaminar insulating layers 1602 and the solder resist layers 1614.

The light receiving element 1638 and the optical waveguide 1619a can transmit optical signal therebetween through the optical path for transmitting optical signal 1651 formed in and penetrating the substrate for mounting an IC chip 1620.

As mentioned above, the embodiment of the substrate for mounting an IC chip according to the fifth aspect of the first group of the present invention is not limited to those shown in FIGS. 5 to 7 but any embodiment in which the mounting positions of the light receiving element and the light emitting element, the formation positions of the optical waveguides and whether to form the optical paths for transmitting optical signal are appropriately selected and combined, is possible.

It is noted that the optical waveguide formation positions on the multilayered printed circuit board shown in each of FIGS. 5 to 7 are on the outermost interlaminar insulating layer. However, in the multilayered printed circuit board that constitutes the substrate for mounting an IC chip according to the fifth aspect of the first group of the present invention, the optical waveguide formation positions are not limited to these positions but may be between the interlaminar insulating layers or on the substrate.

In the device for optical communication according to the fifth aspect of the first group of the present invention, optical/electric signal conversion is performed in the substrate for mounting an IC chip, i.e., at a position near the IC chip. Therefore, an electric signal transmission distance is short and it is possible to satisfy higher rate communication.

Furthermore, the electric signal transmitted from the IC chip is not only converted into optical signal, and then transmitted to the outside through the optical fiber as mentioned above but also the electric signal is transmitted to the multilayered printed circuit board through the solder connection parts and transmitted to an electric component such as the other IC chip mounted on the multilayered printed circuit board through the conductor circuits (including the via-holes and plated-through hole) of the multilayered printed circuit board.

Moreover, in the device for optical communication having the above-mentioned configuration, it is difficult to cause the positional deviation of the light receiving element and the light emitting element mounted on the substrate for mounting an IC chip and the optical waveguides formed on the multilayered printed circuit board, thus ensuring excellent optical signal connection reliability.

Each of the optical paths for transmitting optical signal formed in the devices for optical communication shown in FIGS. 3 to 7 has the conductor layer formed on the wall faces thereof and the resin composition filled into the interior thereof. However, the formation of the conductor layer and the filling of the resin composition may be carried out if necessary.

Next, a method of manufacturing the device for optical communication according to the fifth aspect of the first group of the present invention will be described.

Similarly to the case of manufacturing the device for optical communication according to the third aspect of the first group of the present invention, the device for optical communication can be manufactured by first manufacturing the substrate for mounting an IC chip and the multilayered printed circuit board separately and, then, connecting them through solders or the like.

Therefore, a method of manufacturing the substrate for mounting an IC chip and a method of manufacturing the multilayered printed circuit board will be described first, and then a method of connecting the substrate for mounting an IC chip and the multilayered printed circuit board will be described herein.

As the method of manufacturing the substrate for mounting an IC chip, the same method as that of manufacturing the substrate for mounting an IC chip that constitutes the device for optical communication according to the third aspect of the first group of the present invention or the like can be used.

When the substrate for mounting an IC chip is formed, the solder resist layers may be formed if necessary.

As the method of manufacturing the multilayered printed circuit board, the same method as that of manufacturing the multilayered printed circuit board that constitutes the device for optical communication according to the fourth aspect of the first group of the present invention or the like can be used.

When the multilayered printed circuit board is formed, the solder resist layers may be formed if necessary.

Next, the substrate for mounting an IC chip and the multilayered printed circuit board manufactured by the methods are connected to each other, thereby manufacturing the device for optical communication.

Specifically, for manufacturing the device for optical communication, the same method as that used to manufacture the device for optical communication according to the third aspect of the first group of the present invention or the like may be used.

In addition, similarly to the case of manufacturing the device for optical communication according to the third aspect of the first group of the present invention, solder bumps may be formed only one of the faces of the substrate for mounting an IC chip and the multilayered printed circuit board opposed to each other. In this case, the substrate for mounting an IC chip and the multilayered printed circuit board can be connected to each other, as well.

The IC chips mounted on the devices for optical communication according to the third to fifth aspects of the first group of the present invention may be mounted by wire-bonding or flip-chip connection. It is desirable that the IC chips are mounted by the flip-chip connection.

The second group of the present invention will next be described.

A device for optical communication according to the first aspect of the second group of the present invention is a device for optical communication comprising: a substrate for mounting an IC chip on which at least an optical element is mounted; and a multilayered printed circuit board on which at least an optical waveguide is formed, the device for optical communication being constituted to be able to transmit optical signal between the optical waveguide and the optical element, wherein a sealing resin layer is formed between the substrate for mounting an IC chip and the multilayered printed circuit board.

Since the device for optical communication according to the first aspect of the second group of the present invention comprises the substrate for mounting an IC chip on which the optical elements are mounted at predetermined positions, respectively, and the multilayered printed circuit board on which the optical waveguides are formed at predetermined positions, respectively, the connection loss between the mounted optical components is low and excellent connection reliability is ensured for the device for optical communication.

Further, in the device for optical communication, since optical components and electronic components necessary for optical communication can be provided integrally, it is possible to contribute to making a terminal device for optical communication small in size.

In addition, since the sealing resin layer is formed between the substrate for mounting an IC chip and the multilayered printed circuit board, dust, foreign matters and the like floating in the air do not enter between the optical element and the optical waveguide. It is therefore possible to prevent the transmission of optical signal from being hampered by the dust, the foreign matters and the like.

Furthermore, the sealing resin layer can serve to moderate the stress derived from the difference in thermal expansion coefficient between the substrate for mounting an IC chip and the multilayered printed circuit board. Therefore, it is possible to prevent fracture and the like in the vicinity of solder bumps connecting the substrate for mounting an IC chip to the multilayered printed circuit board. Besides, by forming the sealing resin layer, the positional deviation between the optical elements and the optical waveguides is less likely to occur and thus, the transmission of optical signal between the optical elements and the optical waveguides is not hampered.

Therefore, the device for optical communication according to the first aspect of the second group of the present invention is excellent in reliability in these respects.

Moreover, in the device for optical communication according to the first aspect of the second group of the present invention, it is desirable that the substrate for mounting an IC chip and the multilayered printed circuit board are electrically connected to each other through solder bumps. This is because the self-alignment function of solders enables to further surely dispose both at predetermined positions.

In the case of utilizing this self-alignment function and even when the positional deviation occurs between the multilayered printed circuit board and the substrate for mounting an IC chip before reflow at the time of connecting the substrate for mounting an IC chip onto the multilayered printed circuit board through the solder bumps, the substrate for mounting an IC chip moves during the reflow and can be attached to an accurate position on the multilayered printed circuit board.

Therefore, it is possible to manufacture a device for optical communication excellent in connection reliability by connecting the substrate for mounting an IC chip onto the multilayered printed circuit board through the solder bumps as long as such optical elements as a light receiving element, a light emitting element and optical waveguides are attached to respective positions accurately.

The device for optical communication according to the first aspect of the second group of the present invention will now be described with reference to the drawings.

Figure 14:
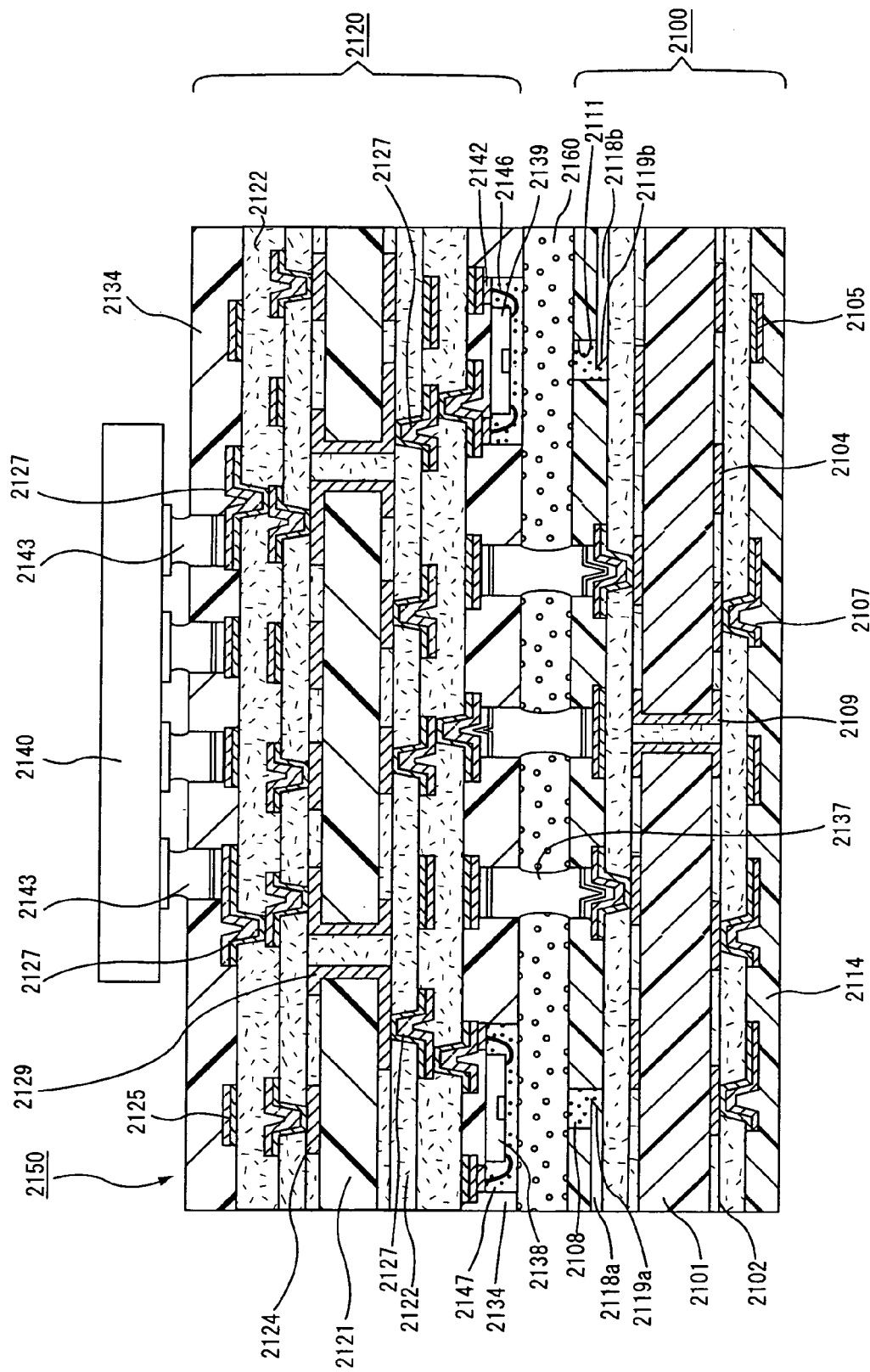
FIG. 14 is a cross-sectional view schematically showing one embodiment of a device for optical communication according to the first aspect of the second group of the present invention.

FIG. 14 is a cross-sectional view schematically showing one embodiment of the device for optical communication according to the first aspect of the second group of the present invention. It is noted that FIG. 14 shows the device for optical communication in a state where an IC chip is mounted.

As shown in FIG. 14, the device for optical communication 2150 comprises a substrate for mounting an IC chip 2120 on which an IC chip 2140 is mounted and a multilayered printed circuit board 2100, with the substrate for mounting an IC chip 2120 electrically connected to the multilayered printed circuit board 2100 through solder connection parts 2137.

A sealing resin layer 2160 is formed between the substrate for mounting an IC chip 2120 and the multilayered printed circuit board 2100.

The substrate for mounting an IC chip 2120 is constituted such that conductor circuits 2124 and interlaminar insulating layers 2122 are serially built up on both faces of a substrate 2121 in an alternate fashion and in repetition and that the conductor circuits across the substrate 2121 and those across the interlaminar insulating layers 2122 are electrically connected to one another by a plated-through hole 2129 and via-holes 2127, respectively.

A solder resist layer 2134 comprising solder bumps for mounting the IC chip is formed on one of the outermost layers of the substrate for mounting an IC chip 2120, whereas wire-bonding type light receiving element 2138 and light emitting element 2139 are contained in and fixed to a part of the other outermost layer (a solder resist layer opposed to the multilayered printed circuit board 2100) of the substrate for mounting an IC chip 2120 and electrically connected to a conductor layer 2142 formed on the substrate for mounting an IC chip by wires 2146, respectively. It is noted that the light receiving element 2138 and the light emitting element 2139 are fixed by die-bonding resin (not shown).

Further, the surrounding of each of the light receiving element 2138 and the light emitting element 2139 contained in the solder resist layer 2134 is sealed with resin 2147.

The multilayered printed circuit board 2100 is constituted such that conductor circuits 2104 and interlaminar insulating layers 2102 are serially built up on both faces of a substrate 2101 in an alternate fashion and in repetition and that the conductor circuits across the substrate 2101 and those across the interlaminar insulating layers 2102 are electrically connected to one another by a plated-through hole 2109 and via-holes 2107, respectively.

Further, openings for optical paths 2111 each having a resin layer for an optical path 2108 formed therein and a solder resist layer 2114 comprising solder bumps are formed on the outermost layer of the multilayered printed circuit board 2100 on the side opposed to the substrate for mounting an IC chip 2120, and optical waveguides 2118 (2118a, 2118b) comprising optical conversion mirrors 2119 (2119a, 2119b) are formed immediately under the openings for optical paths 2111 (2111a, 2111b), respectively.

In the device for optical communication 2150 having the above-mentioned configuration, optical signal transmitted from the outside through an optical fiber or the like (not shown) is introduced into the optical waveguide 2118a, transmitted to the light receiving element 2138 (light receiving part 2138a) through the optical path conversion mirror 2119a, the opening for an optical path 2111a and the sealing resin layer 2160, and converted into an electric signal by the light receiving element 2138, and the resultant electric signal is transmitted to the IC chip 2140 through the conductor layer 2142, the conductor circuits 2124, the via-holes 2127, the plated-through hole 2129 and solder connection parts 2143.

Further, the electric signal transmitted from the IC chip 2140 is transmitted to the light emitting element 2139 through solder connection parts 2143, the conductor circuits 2124, the via-holes 2127, the plated-through hole 2129 and the conductor layer 2142 and converted into optical signal by the light emitting element 2139, and the resultant optical signal is introduced into the optical waveguide 2118b from the light emitting element 2139 (light emitting part 2139a) through the sealing resin layer 2160, the opening for an optical path 2111b and the optical conversion mirror 2119b and transmitted to the outside through the optical fiber or the like (not shown) as optical signal.

In such a device for optical communication according to the first aspect of the second group of the present invention, since the sealing resin layer is formed between the substrate for mounting an IC chip and the multilayered printed circuit board, dust, foreign matters and the like floating in the air do not enter between the optical element and the optical waveguide and the transmission of optical signal is not hampered by these dust, foreign matters and the like.

Further, in the device for optical communication, optical/electric signal conversion is performed in the substrate for mounting an IC chip, i.e., at a position near the IC chip. Therefore, an electric signal transmission distance is short and it is possible to satisfy higher rate communication.

Furthermore, the electric signal transmitted from the IC chip is not only converted into optical signal, and then transmitted to the outside through the optical fiber as mentioned above but also the electric signal is transmitted to the multilayered printed circuit board through the solder bumps and transmitted to an electronic component such as the other IC chip mounted on the multilayered printed circuit board through the conductor circuits (including the via-holes and plated-through hole) of the multilayered printed circuit board.

Figure 15:
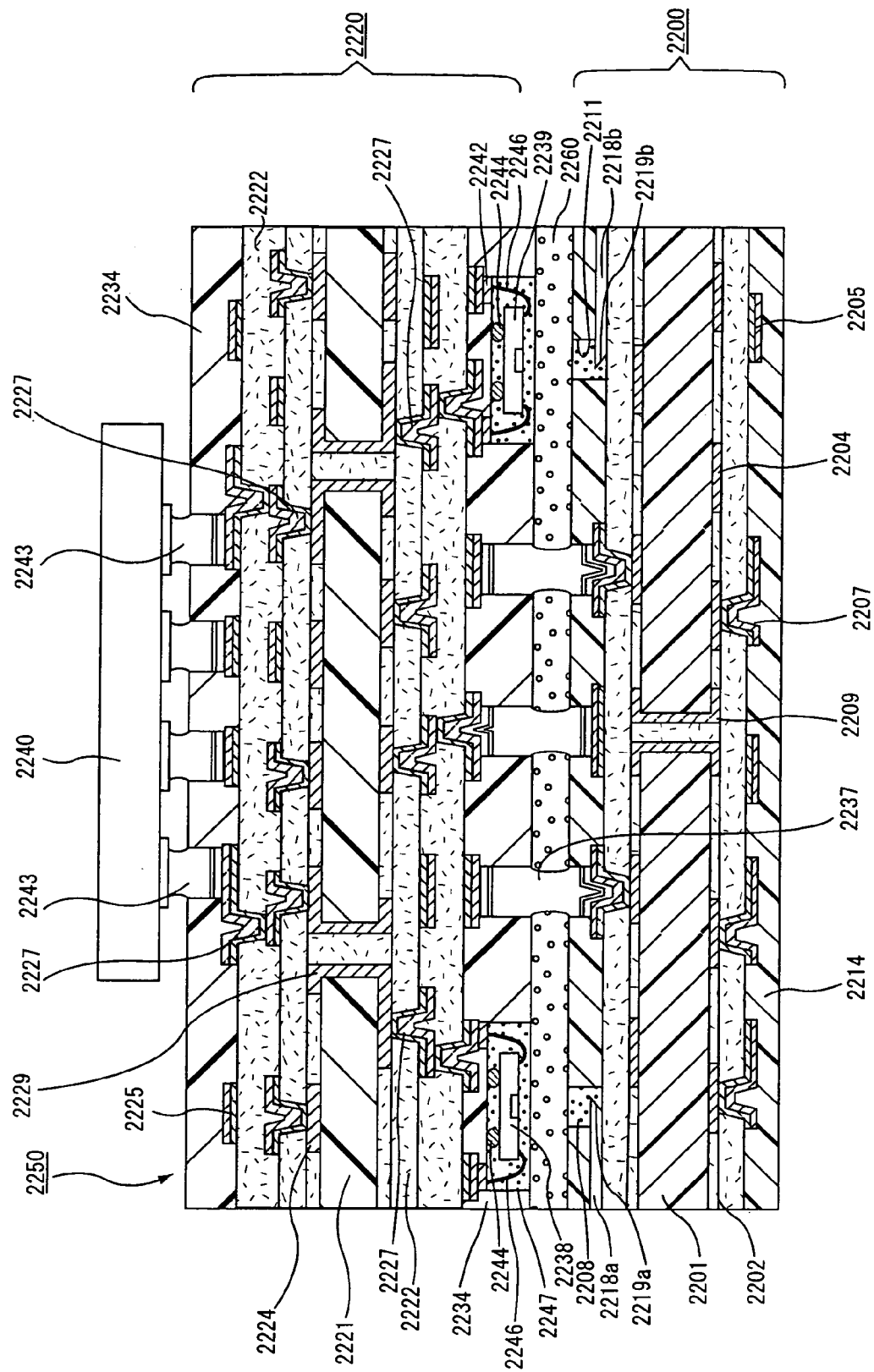
FIG. 15 is a cross-sectional view schematically showing another embodiment of the device for optical communication according to the first aspect of the second group of the present invention.
Figure 16:
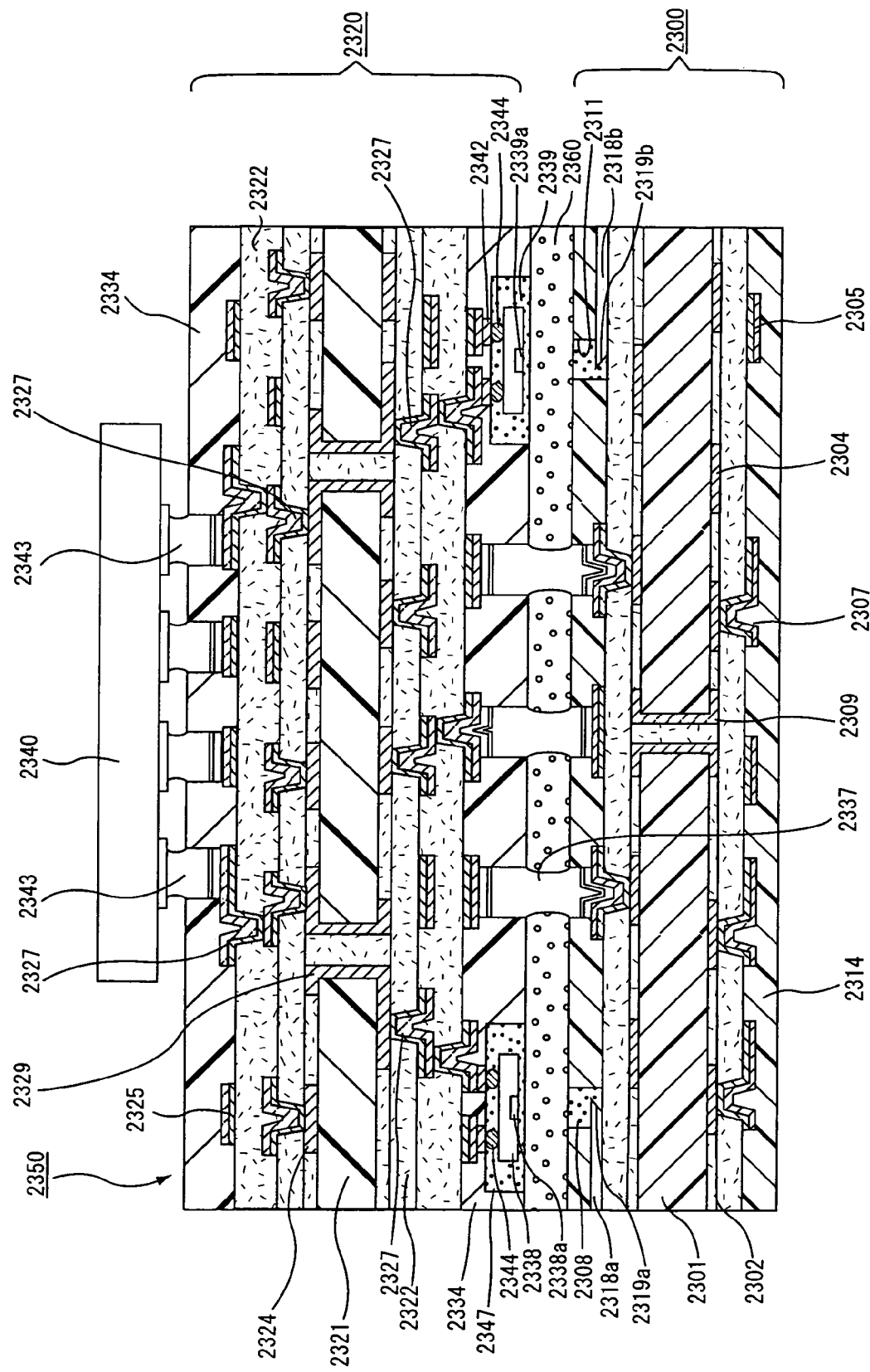
FIG. 16 is a cross-sectional view schematically showing another embodiment of the device for optical communication according to the first aspect of the second group of the present invention.

In addition, the embodiment of the device for optical communication according to the first aspect of the second group of the present invention is not limited to that shown in FIG. 14 but may be that shown in FIG. 15 or 16.

FIG. 15 is a cross-sectional view schematically showing another example of the device for optical communication according to the first aspect of the second group of the present invention. FIG. 16 is a cross-sectional view schematically showing another example of the device for optical communication according to the first aspect of the second group of the present invention.

The device for optical communication shown in FIG. 15 is almost equal in structure to that shown in FIG. 14 except that optical elements (a light receiving element and a light emitting element) are fixed to a substrate for mounting an IC chip.

Namely, in the device for optical communication 2150 shown in FIG. 14, the optical elements are fixed by the die-bonding resin. In the device for optical communication 2250 shown in FIG. 15, by contrast, the light receiving element 2238 and the light emitting element 2239 are fixed by solders 2244, respectively. It is noted that the solders 2244 serve only to fix the respective optical elements and that the electrical connection of the optical elements is established by wires 2246, respectively.

As can be seen, the device for optical communication 2250 shown in FIG. 15 differs from the device for optical communication 2150 shown in FIG. 14 only in the manner of fixing the optical elements to the substrate for mounting an IC chip and the other structure of the device for optical communication 2250 is equal to that of the device for optical communication 2150.

The device for optical communication shown in FIG. 16 is almost equal in structure to that shown in FIG. 14 except for the manner of mounting the optical elements (light receiving element and light emitting element).

Namely, in the device for optical communication 2150 shown in FIG. 14, wire-bonding type optical elements are employed as the optical elements and the optical elements are fixed by the die-bonding resin. In the device for optical communication 2350 shown in FIG. 16, by contrast, flip-chip type optical elements are employed as the light receiving element 2338 and the light emitting element 2339, respectively, and the light receiving element 2338 and the light emitting element 2339 are fixed and electrically connected by the solders 2344, respectively.

Further, in the device for optical communication 2350, the clearances between the bottom faces of the light receiving element 2338 and the light emitting element 2339 (the faces thereof opposite to the faces on which the light receiving part and the light emitting part are provided) and the solder resist layer 2334 are also sealed with resin.

In this way, the device for optical communication 2350 shown in FIG. 16 differs from the device for optical communication 2150 shown in FIG. 14 only in the manner of mounting the optical elements and the other structure thereof is equal to that of the device for optical communication 2150.

Figure 27:
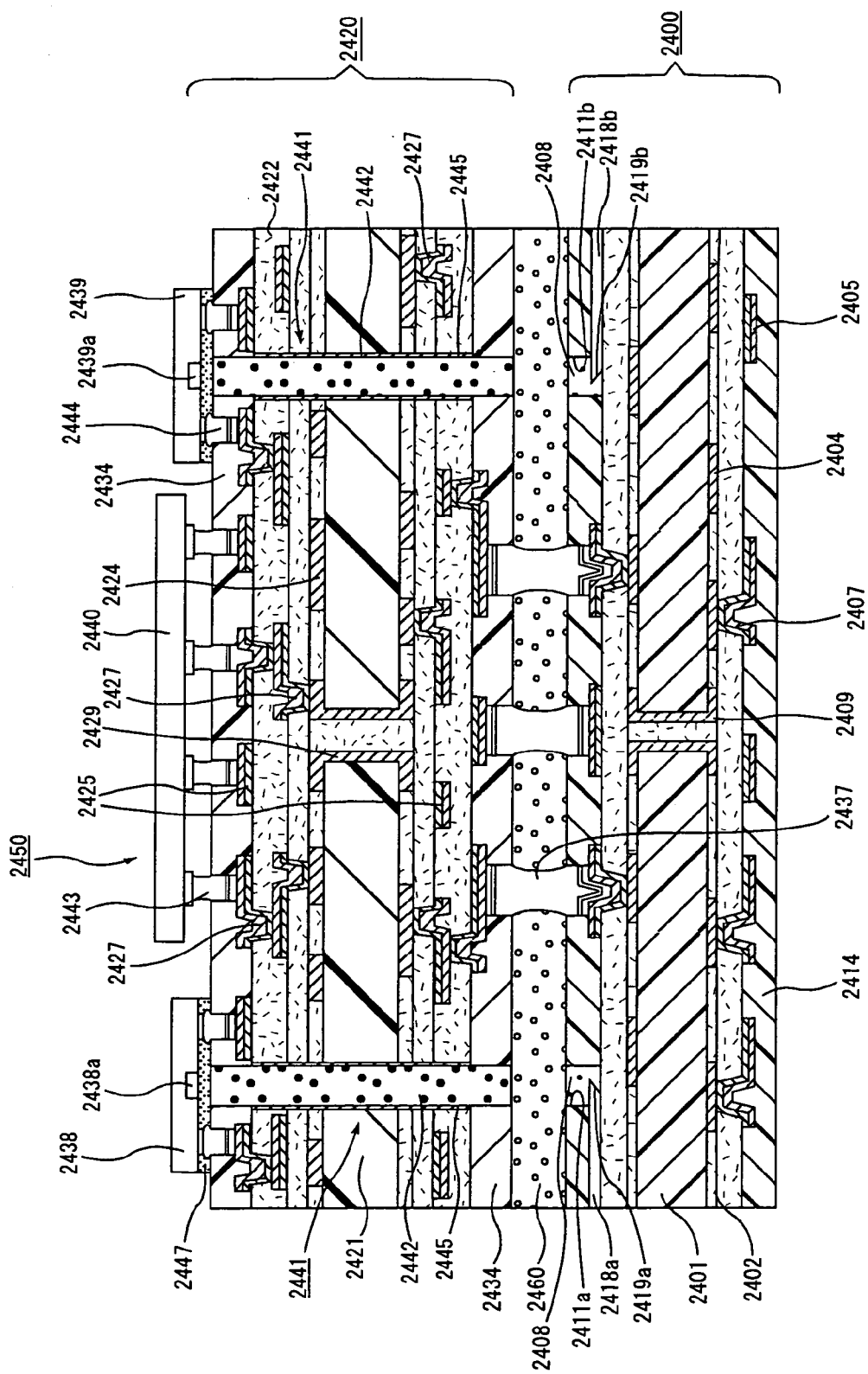
FIG. 27 is a cross-sectional view schematically showing another embodiment of the device for optical communication according to the first aspect of the second group of the present invention.
Figure 28:
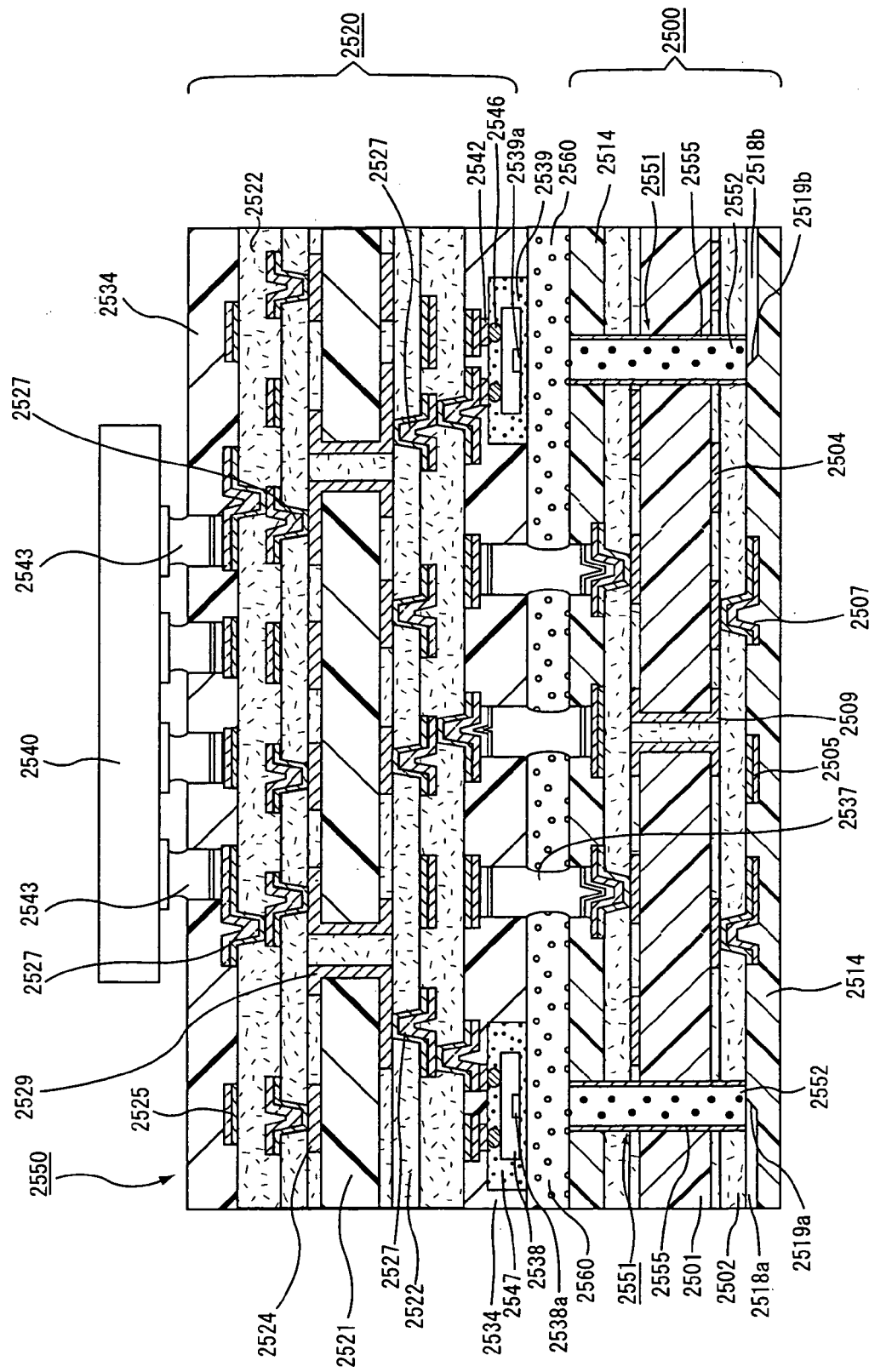
FIG. 28 is a cross-sectional view schematically showing another embodiment of the device for optical communication according to the first aspect of the second group of the present invention.

Moreover, the device for optical communication according to the first aspect of the second group of the present invention may be constituted as shown in FIGS. 27 and 28. FIG. 27 is a cross-sectional view schematically showing another example of the device for optical communication according to the first aspect of the second group of the present invention, and FIG. 28 is a cross-sectional view schematically showing another example of the device for optical communication according to the first aspect of the second group of the present invention.

The device for optical communication shown in FIG. 27 differs from that shown in FIG. 14 in the positions at which optical elements (a light receiving element and a light emitting element) are mounted and in that optical paths for transmitting optical signal for transmitting optical signal between the optical elements and optical waveguides are formed.

That is, in the device for optical communication 2150 shown in FIG. 14, the optical elements are mounted on the face of the substrate for mounting an IC chip 2120 on the side opposed to the multilayered printed circuit board 2100. In the device for optical communication 2450 shown in FIG. 27, the light receiving element 2438 and the light emitting element 2439 are mounted on the face of a substrate for mounting an IC chip 2420 on the opposite side to that opposed to a multilayered printed circuit board 2400 across a substrate. It is noted that the light receiving element 2438 and the light emitting element 2439 are mounted on the substrate for mounting an IC chip through solders.

Further, the optical paths for transmitting optical signal 2441 for transmitting optical signal between the light receiving element 2438 and light emitting element 2439 and the optical waveguides 2418, respectively, are formed in the substrate for mounting an IC chip 2420. A resin layer for an optical path 2442 is formed in each of the optical paths for transmitting optical signal 2441 and a conductor layer 2445 is formed on the wall faces thereof.

Moreover, the lower faces of the light receiving element 2438 and the light emitting element 2439 are sealed from a solder resist layer 2434 by the resin 2447.

The device for optical communication 2450 having the above-mentioned configuration can transmit optical signal between the optical elements (light receiving element 2438 and light emitting element 2439) and the optical waveguides 2118 through the optical paths for transmitting optical signal 2441.

As can be seen, the device for optical communication 2450 shown in FIG. 27 differs from the device for optical communication 2150 shown in FIG. 14 only in the optical element mounting positions and in that the optical paths for transmitting optical signal are formed, and the other structure thereof is equal to that of the device for optical communication 2150.

The device for optical communication shown in FIG. 28 differs from the device for optical communication shown in FIG. 16 in the optical waveguide formation positions and in that optical paths for transmitting optical signal penetrating a substrate, interlaminar insulating layers and a solder resist layer on one side are formed in a multilayered printed circuit board.

That is, in the multilayered printed circuit board 2300 that constitutes the device for optical communication 2350 shown in FIG. 16, the optical waveguides 2318 are formed on the outermost interlaminar insulating layer on the side opposed to the substrate for mounting an IC chip 2320. In the multilayered printed circuit board 2500 shown in FIG. 28, by contrast, optical waveguides 2518 are formed on the outermost interlaminar insulating layer on the opposite side to the side opposed to the substrate for mounting an IC chip 2520 across a substrate.

Further, the optical paths for transmitting optical signal 2551 penetrating the substrate 2501, the interlaminar insulating layers 2502 and the solder resist layer 2514 on the side opposed to the substrate for mounting an IC chip 2520 are formed in the multilayered printed circuit board 2500. It is noted that a resin layer for an optical path 2552 is formed in each of the optical paths for transmitting optical signal 2551 and that a conductor layer 2555 is formed on the wall faces thereof.

The device for optical communication 2550 having the above-mentioned configuration can transmit optical signal through the optical paths for transmitting optical signal 2551 formed in the multilayered printed circuit board 2500.

As can be seen, the device for optical communication 2550 shown in FIG. 28 differs from the device for optical communication 2350 shown in FIG. 16 only in the optical waveguide formation positions and in that the optical paths for transmitting optical signal are formed, and the other structure thereof is equal to that of the device for optical communication 350.

In this way, the optical waveguide formation positions of the device for optical communication according to the first aspect of the second group of the present invention may be on the outermost interlaminar insulating layer on the side of the multilayered printed circuit board opposed to the substrate for mounting an IC chip as seen in the multilayered printed circuit board shown in FIG. 14 or the like, or may be on the outermost interlaminar insulating layer on the opposite side to the side opposed to the substrate for mounting an IC chip across the substrate as seen in the multilayered printed circuit board shown in FIG. 28. Besides, the optical waveguide formation positions are not limited to these positions but may be between the interlaminar insulating layers or between the substrate and the interlaminar insulating layer.

Moreover, in the device for optical communication according to the first aspect of the second group of the present invention, the number of substrates for mounting IC chips connected to the multilayered printed circuit board is not limited to one but may be two or more. The substrates for mounting IC chips connected to the multilayered printed circuit board may be a plurality of substrates for mounting IC chips that are built up.

Next, the constituent members and the like of the device for optical communication according to the first aspect of the second group of the present invention will be described.

As mentioned above, the device for optical communication according to the first aspect of the second group of the present invention has the sealing resin layer formed between the substrate for mounting an IC chip and the multilayered printed circuit board.

The sealing resin layer is not limited to a specific one as long as the resin layer is less absorbed in a communication wavelength band. Examples of a material for the sealing resin layer include thermosetting resin, thermoplastic resin, photosensitive resin, resin obtained by photosensitizing apart of thermosetting resin, UV ray cured type resin and the like. Among them, it is desirable to use the thermosetting resin. This is because it is possible to ensure curing the resin when it is the thermosetting resin.

Specifically, examples of the material therefor include acrylic resin such as PMMA (polymethyl methacrylate), PMMA deuteride and PMMA deuteride fluoride; polyimide resin such as polyimide fluoride; epoxy resin; UV cured epoxy resin; silicone resin such as silicone resin deuteride; polymer produced from benzocyclobutene and the like.

It is also desirable that the sealing resin layer has a transmissivity of not less than 70%/mm for communication wavelength light.

When the transmissivity for the communication wavelength light is less than 70%/mm, optical signal loss is large, which often causes the deterioration of the reliability of the device for optical communication. It is more desirable that the transmissivity is 90%/mm or more.

When the sealing resin layer comprises only the resin composition mentioned above, in particular, the transmissivity thereof is desirably 90%/mm or more. As will be described later, when particles are contained in the sealing resin layer, it is desirable that the transmissivity of the sealing resin layer is 70%/mm or more.

In the present specification, the transmissivity for communication wavelength light means transmissivity for communication wavelength light per 1 mm-length. Specifically, when light having an intensity $I_1$ is incident on the sealing resin layer and emitted from the sealing resin layer after passing through the sealing resin layer by 1 mm, the emitting light has an intensity $I_2$. The transmissivity for the light is calculated by the following expression (1).

$$\text{Transmissivity (\%/mm)} = (I_2/I_1) \times 100 \tag{1}$$

It is noted that the above-mentioned transmissivity is transmissivity measured at 25 to 30° C.

Furthermore, it is desirable that the sealing resin layer contains particles such as resin particles, inorganic particles or metal particles.

By incorporating the particles therein, it is possible to match the thermal expansion coefficient of the substrate for mounting an IC chip to that of the multilayered printed circuit board and make it more difficult to cause cracks or the like due to the difference in thermal expansion coefficient to occur.

In the device for optical communication according to the first aspect of the second group of the present invention which comprises the substrate for mounting an IC chip and the multilayered printed circuit board, the thermal expansion coefficients of the constituent members thereof (in a z-axis direction) are as follows: the thermal expansion coefficient of the substrate is about $5.0 \times 10^{-5}$ to $6.0 \times 10^{-5}$ (/° C.), that of the interlaminar insulating layers is about $6.0 \times 10^{-5}$ to $8.0 \times 10^{-5}$ (/° C.), that of the particles is about $0.1 \times 10^{-5}$ to $1.0 \times 10^{-5}$ (/° C.), that of the sealing resin layer is about $0.1 \times 10^{-5}$ to $100 \times 10^{-5}$ (/° C.), that of the sealing resin layer into which particles are mixed is about $3.0 \times 10^{-5}$ to $4.0 \times 10^{-5}$ (/° C.), those of the IC chip and the optical elements made of silicon, germanium or the like are about $0.5 \times 10^{-5}$ to $1.5 \times 10^{-5}$ (/° C.) and that of the conductor circuits is about $1.0 \times 10^{-5}$ to $2.0 \times 10^{-5}$ (/° C.). It is noted that the thermal expansion coefficients are measured at 20° C.

As can be seen, when particles are mixed in the sealing resin layer, the difference in thermal expansion coefficient between the sealing resin layer and the other constituent members that constitute the device for optical communication is decreased. Therefore, a stress is moderated.

Further, when particles are mixed in the sealing resin layer, the positional deviation of the optical elements and the optical waveguides is less likely to be caused.

Moreover, when the particles are mixed in the sealing resin layer, it is desirable that the resin component of the sealing resin layer is almost equal in refractive index to the particles. Therefore, when the particles are mixed in the sealing resin layer, it is desirable to mix two or more kinds of particles having different refractive indexes together to set the refractive index of the particles almost equal to that of the resin composition.

Specifically, when the resin component is, for example, epoxy resin having a refractive index of 1.53, it is desirable to use a mixture of silica particles having a refractive index of 1.54 and titania particles having a refractive index of 1.52.

Examples of a method of mixing up the particles include a kneading method and a method of dissolving and mixing up two or more kinds of particles and, then, forming them into particle shape.

Examples of the resin particles include those comprising thermosetting resin, thermoplastic resin, photosensitive resin, resin obtained by photo sensitizing a part of thermosetting resin, a resin complex comprising thermosetting resin and thermoplastic resin, a complex comprising photosensitive resin and thermoplastic resin and the like.

Specifically, they include thermosetting resin such as epoxy resin, phenol resin, polyimide resin, bismaleimide resin, polyphenylene resin, polyolefin resin and fluororesin; resin obtained by reacting the thermosetting group of one of these thermosetting resins (e.g., the epoxy group of epoxy resin) with an methacrylic acid, an acrylic acid or the like to impart an acrylic group to the resin; thermoplastic resin such as phenoxy resin, polyethersulfone (PES), polysulfone (PSF), polyphenylenesulfone (PPS), polyphenylene sulfide (PPES), polyphenyl ether (PPE) and polyetherimide (PI); photosensitive resin such as acrylic resin and the like.

Further, resin particles comprising a resin complex comprising the thermosetting resin and the thermoplastic resin or a resin complex comprising the acrylated resin, the photosensitive resin and the thermoplastic resin can be used.

As the resin particles, rubber-containing resin particles can be also used.

In addition, examples of the inorganic particles include those comprising aluminum compounds such as alumina and aluminum hydroxide; calcium compounds such as calcium carbonate and calcium hydroxide; potassium compounds such as potassium carbonate; magnesium compounds such as magnesia, dolomite and basic magnesium carbonate; silicon compounds such as silica and zeolite; titanium compounds such as titania and the like. Further, the inorganic particles comprising a material obtained by mixing silica and titania with a certain rate, dissolving and making them even may be used.

As the inorganic particles, those comprising phosphorus or phosphorus compounds can be also used.

Examples of the metal particles include those comprising gold, silver, copper, palladium, nickel, platinum, iron, zinc, lead, aluminum, magnesium, calcium and the like.

These resin particles, inorganic particles and metal particles may be used alone or in combination of two or more of them. The particles are desirably inorganic particles, which desirably comprise silica, titania or alumina. It is also desirable to use particles having a mixture composition obtained by mixing and dissolving at least two kinds of silica, titania and alumina.

Further, the shape of the particles is not limited to specific one and examples of the particles include a spherical shape, an elliptic shape, a friable shape, a polygonal shape and the like. Among these shapes, the spherical shape or the elliptic shape is desirable. This is because the spherical or elliptic particle has no corners, which makes it more difficult to cause cracks and the like to occur to the sealing resin layer.

Moreover, when the particles are spherical or elliptic, it is difficult to reflect light on the particles, thus lowering optical transmission loss.

The particle diameter of the particles is desirably smaller than a wavelength. When the particle diameter is larger than the communication wavelength, the transmission of optical signal is hampered in some cases.

The lower limit and upper limit of the particle diameter are desirably 0.01 μm and 0.8 μm, respectively. When the particles include those out of this range, a particle size distribution becomes too wide. At the time of mixing the particles into the resin composition, the variation of the viscosity of the resin composition grows, thereby deteriorating reproducibility in preparing the resin composition and making it difficult to prepare a resin composition having a predetermined viscosity. The viscosity of the resin composition prepared when forming the sealing resin layer is desirably 20 to 100 cps (mP·s).

The lower limit and upper limit of the particle diameter are more desirably 0.1 µm and 0.8 µm, respectively. When the particle diameter falls within the range, it is ensured to fill resin between the substrate for mounting an IC chip and the multilayered printed circuit board. In addition, at the time of preparing the resin composition into which particles are mixed, it becomes easier to adjust the resin composition to have a predetermined viscosity.

The lower limit and upper limit of the particle diameter are particularly desirably 0.2 µm and 0.6 µm, respectively. When the particle diameter falls within the range, it becomes particularly easier to fill the resin composition particularly. Besides, the variation of the sealing resin layers thus formed is minimized, ensuring particularly excellent characteristics for the substrate for mounting an IC chip.

When the particles having particle diameters within this range are used, two or more kinds of particles having different particle diameters may be included.

The lower limit of the mixing quantity of the particles is desirably 20% by weight, more desirably 30% by weight. On the other hand, the upper limit thereof is desirably 70% by weight, more desirably 60% by weight. When the mixing quantity of the particles is less than 20% by weight, the effect of mixing the particles is not attained in some cases. When the mixing quantity of the particles exceeds 70% by weight, optical signal transmission is often hampered.

The composition of the sealing resin layer has an influence on reliabilities such as the optical signal transmission loss, heat resistance and bending strength. Therefore, the specific composition may be appropriately selected so that the sealing resin layer satisfies low optical signal transmission loss, excellent heat resistance and excellent cracking resistance.

In the device for optical communication according to the first aspect of the second group of the present invention, the sealing resin layer may be formed only in regions that do not correspond to optical paths for optical signal among the area put between the substrate for mounting an IC chip and the multilayered printed circuit board. Specifically, the sealing resin layer may be formed, for example, only in the vicinity of the outer periphery of the area put between the substrate for mounting an IC chip and the multilayered printed circuit board.

By thus forming the sealing resin layer, it is possible to attain the effect of the second group of the present invention that it is possible to prevent dust, foreign matters and the like floating in the air from entering between the optical elements and the optical waveguides. In addition, since the optical signal optical paths comprise the air, there is no possibility that the sealing resin layer hampers the optical signal transmission, thus further widening the option of a material for the sealing resin layer.

In addition, the substrate for mounting an IC chip that constitutes the device for optical communication according to the first aspect of the second group of the present invention has the optical elements (light receiving element and light emitting element) mounted thereon.

Specific examples of the light receiving element and light emitting element include the same light receiving element and light emitting element as those mounted on the substrate for mounting an IC chip according to the first aspect of the first group of the present invention and the like.

It is noted that the optical elements (light receiving element and light emitting element) may be electrically connected to the substrate for mounting an IC chip by wire-bonding or flip-chip bonding at the time of mounting them on the substrate for mounting an IC chip.

Further, when the optical elements are electrically connected by wire-bonding, the optical elements may be fixed to the substrate for mounting an IC chip using die-bonding resin or solders.

Moreover, as shown in the figures, in the device for optical communication according to the first aspect of the second group of the present invention, the surroundings of the optical elements mounted on the substrate for mounting an IC chip are desirably sealed with resin and the sealing resin is made of the similar material as that for the sealing resin layer. Accordingly, particles may be mixed in the resin for sealing the surroundings of the optical elements, and the transmissivity of the resin is desirably 70%/mm or more when particles are mixed therein and 90%/mm or more when the resin comprising only the resin component.

In addition, when the optical elements are electrically connected to the substrate for mounting an IC chip by flip-chip bonding, In addition, in the substrate for mo it is desirable that the gaps between the optical elements and the solder resist layer or the resin layer for an optical path are sealed by resin mounting an IC chip of the device for optical communication shown, the optical elements (light receiving element and light emitting element) are mounted on the substrate for mounting an IC chip so as to be embedded into the solder resist layer and the surroundings of the optical elements are sealed with resin. However, in the substrate for mounting an IC chip that constitutes the device for optical communication according to the first aspect of the second group of the present invention, the optical elements are not always mounted on the substrate for mounting an IC chip so that the entire optical elements are embedded into the solder resist layer. Instead, the optical elements may be mounted thereon so that a part of the optical elements are embedded into the solder resist layer or mounted on the surface of the solder resist layer so that the optical elements are not at all embedded into the solder resist layer.

Even when the optical elements are mounted so that a part of the optical elements are embedded or the optical elements are not at all embedded into the solder resist layer, the surroundings of the optical elements may be sealed with resin.

Moreover, it is desirable that solder bumps for transmitting an electric signal are formed on the substrate for mounting an IC chip. By forming the solder bumps, it is possible to transmit an electric signal between the substrate for mounting an IC chip and an external electronic component.

Optical waveguides are formed on the multilayered printed circuit board that constitutes the device for optical communication according to the first aspect of the second group of the present invention.

Examples of the optical waveguide include an organic optical waveguide made of a polymer material or the like, an inorganic optical waveguide made of a quartz glass, a compound semiconductor or the like, and the like. Among them, the organic optical waveguide made of a polymer material or the like is desirable. This is because the organic optical waveguide is excellent in adhesion to the interlaminar insulating layer, easy to work with and can be obtained at low cost.

The polymer material is not limited to a specific one as long as the polymer material is less absorbed in a communication wavelength band. Examples of the polymer material include thermosetting resin, thermoplastic resin, photosensitive resin, resin obtained by photosensitizing a part of thermosetting resin and the like, a complex of thermosetting resin and thermoplastic resin, a complex of photosensitive resin and thermoplastic resin and the like.

Specific examples of the polymer material include acrylic resin such as PMMA (polymethyl methacrylate), PMMA deuteride and PMMA deuteride fluoride; polyimide resin such as polyimide fluoride; epoxy resin; UV cured epoxy resin; polyolefin resin; silicone resin such as silicone resin deuteride; siloxane resin; polymer produced from benzocyclobutene and the like.

Further, when the optical waveguide is an optical waveguide for multi-mode, a material for the optical waveguide is desirably acrylic resin, epoxy resin or UV cured epoxy resin. When the optical waveguide is an optical waveguide for single-mode, a material for the optical waveguide is desirably polyimide resin, silicone resin or siloxane resin.

The core of the optical waveguide has desirably a thickness of 1 to 100 μm and a width of 1 to 100 μm. When the width is less than 1 μm, it is often difficult to form the optical waveguide. When the width exceeds 100 μm, this sometimes hampers the degree of freedom for the design of the conductor circuits and the like that constitute the multilayered printed circuit board.

Furthermore, the ratio of the thickness to width of the core of the optical waveguide is desirably close to 1:1. This is because the planar shapes of the light receiving part of the light receiving element and the light emitting part of the light emitting element are normally circular shapes. It is noted that the ratio of thickness to width is not limited to a specific one but may be normally in the range of about 1:2 to 2:1.

Moreover, when the optical waveguide is an optical waveguide for single-mode having a communication wavelength of 1.31 μm or 1.55 μm, the core thereof has a thickness and a width of more desirably 5 to 15 μm, particularly desirably about 10 μm. In addition, when the optical waveguide is an optical waveguide for multi-mode having a communication wavelength of 0.85 μm, the core thereof has a thickness and a width of more desirably 20 to 80 μm, particularly desirably about 50 μm.

Further, particles such as resin particles, inorganic particles and metal particles may be contained in the optical waveguides besides the resin component.

By incorporating the particles in the optical waveguides, it is made difficult to cause cracks to occur to the optical waveguides. Namely, when no particles are contained in the optical waveguides, cracks often occur to the optical waveguides due to the difference in thermal expansion coefficient between the optical waveguides and the other layers (the substrate and the interlaminar insulating layers). However, when particles are contained in the optical waveguides and the thermal expansion coefficient of the optical waveguides is adjusted to narrow the difference in thermal expansion coefficient between the optical waveguides and the other layers, it is possible to make it more difficult to cause cracks to occur to the optical waveguides.

Specific examples of the particles include the same as those contained in the optical waveguides that constitute the device for optical communication according to the third aspect of the first group of the present invention.

Further, the shape of the particles is not limited to a specific one but the particles may be spherical, elliptic, friable, polygonal or the like. Among these shapes, the spherical shape or the elliptic shape is desirable. This is because the spherical or elliptic particle has no corners, which makes it more difficult to cause cracks and the like to occur to the optical waveguides.

When the particles are spherical or elliptic, light is less likely to be reflected by the particles, thus lowering optical signal loss.

In addition, it is desirable that the particle diameter is smaller than a communication wavelength. When the particle diameter is larger than the communication wavelength, this often hampers optical signal transmission.

It is more desirable that the lower limit and upper limit of the particle diameter are 0.01 μm and 0.8 μm, respectively. When particles out of this range are included, a particle size distribution becomes too wide. At the time of mixing the particles into a resin composition, the variation of the viscosity of the resin composition grows, thereby deteriorating reproducibility in the case of preparing the resin composition and making it difficult to prepare a resin composition having a predetermined viscosity.

The lower limit and upper limit of the particle diameter are more desirably 0.1 μm and 0.8 μm, respectively. When the particle diameter falls within the range, the resin composition can be suitably applied using a spin coater, a roll coater or the like and it is easier to prepare the resin composition into which particles are mixed to have a predetermined viscosity.

The lower limit and upper limit of the particle diameter are particularly desirably 0.2 μm and 0.6 μm, respectively. This range is particularly suitable for the application of the resin composition and the formation of the cores of the optical waveguides. Besides, within this range, the variation among the formed optical waveguides, particularly that of the cores is minimized, thus ensuring particularly excellent device for optical communication in characteristics.

When the particles having particle diameters within this range are used, two or more kinds of particles having different particle diameters may be included. The above-mentioned particles are desirably in organic particles, which may be silica, titania or alumina. It is also desirable to use particle shaving a mixture composition formed by mixing and dissolving at least two kinds among silica, titania and alumina.

The lower limit of the mixing quantity of the particles contained in the optical waveguides is desirably 10% by weight, more desirably 20% by weight. The upper limit thereof is desirably 80% by weight, more desirably 70% by weight. When the mixing quantity of the particles is less than 10% by weight, the effect of mixing particles cannot be expected in some cases. When it exceeds 80% by weight, the transmission of optical signal is hampered in some cases.

In addition, the shape of the optical waveguides is not limited to a specific one. However, sheet-like optical waveguides are desirable because they are easy to be formed.

Moreover, when the optical waveguides is composed of a core and a cladding, the particles may be mixed in both the core and the cladding. Desirably, no particles are mixed in the core and particles are mixed only in the cladding that covers the surrounding of the core. The reason is as follows.

When the particles are mixed in an optical waveguide, an air layer is often generated on the interface between the particles and the resin composition depending on the adhesion between the particles and the resin composition of the optical waveguide. In this case, the air layer changes the refraction direction of light, often increasing the transmission loss of the optical waveguide. On the other hand, when the particles are mixed only in the cladding, the problem that the transmission loss of the optical waveguide increases does not occur and it is possible to make it difficult to cause cracks to occur to the optical waveguide by mixing the particles into the cladding.

In addition, it is desirable that an optical waveguide for light reception and an optical waveguide for light emission are formed as the optical waveguides, respectively. The optical waveguide for light reception means an optical waveguide for transmitting optical signal sent from the outside through an optical fiber or the like to the light receiving element, and the optical waveguide for light emission means an optical waveguide for transmitting optical signal sent from the light emitting element to the optical fiber or the like.

It is also desirable that the optical waveguide for light reception and the optical waveguide for light emission are made of the same material. When they are made of the same material, it is easy to match the thermal expansion coefficients and the like between them and easy to form the optical waveguides.

It is desirable that an optical path conversion mirror is formed on each of the optical waveguides as mentioned above. By forming the optical path conversion mirror, it is possible to change the angle of the optical path to a desired angle. Alternatively, a member having an optical path conversion part formed thereon may be disposed on the tip end portion of each of the optical waveguides in place of forming the optical path conversion mirror on each optical waveguide.

The optical path conversion mirror can be formed by cutting one end of each optical waveguide.

Furthermore, in the multilayered printed circuit board that constitutes the device for optical communication shown in the figure, the optical waveguides are formed on the outermost interlaminar insulating layer and the solder resist layer is formed to cover this interlaminar insulating layer and the optical waveguides. However, this solder resist layer is not necessarily formed but the optical waveguides may be formed entirely on the outermost interlaminar insulating layer to serve as the solder resist layer.

Furthermore, in the substrate for mounting an IC chip, when the optical elements are mounted on the face of the substrate for mounting an IC chip opposite to the face opposed to the multilayered printed circuit board across the substrate as shown in FIG. 27, optical paths for transmitting optical signal are formed in the substrate for mounting an IC chip. Accordingly, optical signal can be transmitted through the optical paths for transmitting optical signal.

It is desirable that a resin layer for an optical path is formed in each of the optical paths for transmitting optical signal. The formation of such a resin layer for an optical path is suitable for the formation of the sealing resin layer and makes it more difficult for dust, foreign matters and the like to enter the optical paths for transmitting optical signal.

In addition, when the resin layer for an optical path is formed in each of the optical paths for transmitting optical signal, the strength of the substrate for mounting an IC chip becomes more excellent.

The resin component of the resin layer for an optical path is not limited to a specific one as long as the resin component is less absorbed in a communication wavelength band. Specific examples of the resin component include the same resin as that used for the sealing resin layer.

Furthermore, particles such as resin particles, inorganic particles and metal particles may be contained in the resin layer for an optical path besides the resin component. By incorporating these particles in the resin layer for an optical path, it is possible to match the thermal expansion coefficients of the optical paths for transmitting optical signal, the substrate, the interlaminar insulating layers, the solder resist layers and the like.

Specific examples of the particles include the same as those contained in the sealing resin layer.

Further, the shape of the optical paths for transmitting optical signal is not limited to a specific one but they may be columnar, elliptical columnar, quadrangular columnar, polygonal columnar or the like. Among these shapes, the columnar shape is desirable. This is because the columnar shape has the smallest influence on the optical signal transmission and it is easy to form the optical waveguides into spherical shape.

The lower limit of the cross-sectional diameter of each of the optical paths for transmitting optical signal is desirably 100 μm. When the cross-sectional diameter is less than 100 μm, the optical path may possibly be closed and it is often difficult to form the resin layer for an optical path in the optical path for transmitting optical signal. On the other hand, the upper limit of the cross-sectional diameter thereof is desirably 500 μm. Even when the cross-sectional diameter exceeds 500 μm, the optical signal transmission characteristic does not improve so greatly and such a large cross-sectional diameter often hampers the degree of freedom for the design of conductor circuits and the like that constitute the substrate for mounting an IC chip.

The lower limit and upper limit of the cross-sectional diameter are more desirably 250 μm and 350 μm, respectively from a viewpoint that both the optical signal transmission characteristic and the degree of freedom for design are excellent and no problem occurs even when an uncured resin composition is filled into the optical paths having the cross-sectional diameter.

The cross-sectional diameter of each of the optical paths for transmitting optical signal means the diameter of a cross section when the optical path for transmitting optical signal is cylindrical, the longer diameter of the cross section when the optical path for transmitting optical signal is elliptic, and the length of the longest portion of the cross section when the optical path for transmitting optical signal is prismatic or polygonal.

It is also desirable that a conductor layer is formed on the wall faces of each of the optical paths for transmitting optical signal. The conductor layer may comprise one layer or two or more layers.

Examples of a material for the conductor layer include copper, nickel, chromium, titanium, noble metal and the like.

Further, the conductor layer can often serve as a plated-through hole, i.e., serve to electrically connect the conductor circuits across the substrate or the conductor circuits across the substrate and the interlaminar insulating layers.

In addition, the material for the conductor layer may be metal having glossiness such as gold, silver, nickel, platinum, aluminum and rhodium. The conductor layer which is formed out of such metal having glossiness suitably reflects optical signal.

In addition, a covering layer or roughened layer made of tin, titanium, lead and the like may be further provided on the conductor layer. By providing the covering layer or roughened layer, it is possible to improve the adhesion of the resin layer for an optical path.

Furthermore, when the conductor layer and the resin layer for an optical path are formed in each of the optical paths for transmitting optical signal, they may contact with the substrate or the interlaminar insulating layer through a roughened face. When the conductor layer contacts therewith through the roughened face, the adhesion thereof to the substrate or the interlaminar insulating layer is excellent, making it more difficult to cause the peeling of the conductor layer and the like.

The device for optical communication having the above-mentioned configuration according to the first aspect of the second group of the present invention can be manufactured by a manufacturing method of a device for optical communication according to the second aspect of the second group of the present invention to be described later, or the like.

Next, the manufacturing method of the device for optical communication according to the second aspect of the second group of the present invention will be described.

In the manufacturing method of the device for optical communication according to the second aspect of the second group of the present invention, after separately manufacturing a substrate for mounting an IC chip on which at least an optical element is mounted, and a multilayered printed circuit board on which at least an optical waveguide is formed, the substrate for mounting an IC chip and the multilayered printed circuit board are disposed at and fixed to such respective positions as to be able to transmit optical signal between the optical element of the substrate for mounting an IC chip and the optical waveguide of the multilayered printed circuit board, and further, a resin composition for sealing is caused to flow between the substrate for mounting an IC chip and the multilayered printed circuit board and then a curing treatment is conducted, thereby forming a sealing resin layer.

In the manufacturing method of the device for optical communication according to the second aspect of the second group of the present invention, after disposing and fixing the substrate for mounting an IC chip and the multilayered printed circuit board at and to the respective predetermined positions, the sealing resin layer is formed between them. Therefore, dust, foreign matters and the like floating in the air do not enter between the optical element and the optical waveguide, and it is possible to suitably manufacture the device for optical communication capable of preventing the transmission of optical signal from being hampered by the dust, the foreign matters and the like.

Furthermore, by forming the sealing resin layer between the substrate for mounting an IC chip and the multilayered printed circuit board, the sealing resin layer can serve to moderate the stress derived from the difference in thermal expansion coefficient between the substrate for mounting an IC chip and the multilayered printed circuit board in the device for optical communication thus obtained. In addition, by forming the sealing resin layer, the positional deviation between the optical elements and the optical waveguides becomes less likely to be caused.

Therefore, in the manufacturing method of the device for optical communication according to the second aspect of the second group of the present invention, it is possible to suitably manufacture a device for optical communication excellent in reliability.

In the manufacturing method of the device for optical communication according to the second aspect of the second group of the present invention, first, the substrate for mounting an IC chip and the multilayered printed circuit board are separately manufactured.

Accordingly, the manufacturing method of the substrate for mounting an IC chip and the manufacturing method of the multilayered printed circuit board will be described separately first, and then a method of forming the sealing resin layer will be described herein.

First, the manufacturing method of the substrate for mounting an IC chip will be described.

(1) Using an insulating substrate as a starting material, conductor circuits are formed on the insulating substrate.

Specifically, in order to form the conductor circuits, the same method as that used in the step (1) of the step (a) of the manufacturing method of the substrate for mounting an IC chip according to the second aspect of the first group of the present invention or the like can be used. In this step, similarly to the step (1) of the step (a) of the manufacturing method of the substrate for mounting an IC chip according to the second aspect of the first group of the present invention, a plated-through hole may be formed.

(2) Next, a roughening treatment is conducted to the surfaces of the conductor circuits based on necessity. As the roughening treatment, the same method as that used in the step (2) of the step (a) of the manufacturing method of the substrate for mounting an IC chip according to the second aspect of the first group of the present invention or the like can be used. This roughening treatment may be also conducted to the wall face of the plated-through hole.

(3) Next, either an uncured resin layer of thermosetting resin, photosensitive resin, resin obtained by photosensitizing a part of thermosetting resin, an uncured resin layer of a resin complex containing one of these resins and thermoplastic resin, or a resin layer of thermoplastic resin is formed on the substrate on which the conductor circuits are formed.

The formation of these resin layers can be carried out by the same method as that used in the step (3) of the step (a) of the manufacturing method of the substrate for mounting an IC chip according to the second aspect of the first group of the present invention or the like.

(4) Next, when an interlaminar insulating layer is formed using, as a material therefor, thermosetting resin or a resin complex, a curing treatment is conducted to the uncured resin layer and openings for via-holes are formed to obtain the interlaminar insulating layer. In this step, a through hole for a plated-through hole may be formed based on necessity.

It is desirable that the openings for via-holes are formed by a laser treatment. In addition, when photosensitive resin is used as a material for the interlaminar insulating layer, the openings for via-holes may be formed by exposure and development treatments.

When the interlaminar insulating layer is formed using thermoplastic resin as a material therefor, openings for via-holes are formed in a resin layer of thermoplastic resin to provide the interlaminar insulating layer. In this case, the openings for via-holes can be formed by conducting a laser treatment.

When a through hole for a plated-through hole is to be formed in this step, it may be formed by drilling, a laser treatment or the like.

As a laser used for the laser treatment, the same laser as that used in the step (4) of the step (a) of the manufacturing method of the substrate for mounting an IC chip according to the second aspect of the first group of the present invention or the like can be used.

(5) Next, conductor circuits are formed on the surface of the interlaminar insulating layer including the inner walls of the openings for via-holes.

When the conductor circuits are to be formed, a thin film conductor layer is formed first on the surface of interlaminar insulating layer.

The thin film conductor layer can be formed using the same method as that used in the step (5) of the step (a) of the manufacturing method of the substrate for mounting an IC chip according to the second aspect of the first group of the present invention or the like.

In this step, similarly to the step (5) of the step (a) of the manufacturing method of the substrate for mounting an IC chip according to the second aspect of the first group of the present invention, a roughened face may be formed on the surface of the interlaminar insulating layer before forming the thin film conductor layer.

In addition, when a through hole for a plated-through hole is formed in the step (4), the thin film conductor layer may be formed even on the wall face of the through hole at the time of forming the thin film conductor layer on the interlaminar insulating layer.

(6) Next, a plating resist is formed on the substrate on the surface of which the thin film conductor layer is formed. The plating resist can be formed using the same method as that used in the step (6) of the step (a) of the manufacturing method of the substrate for mounting an IC chip according to the second aspect of the first group of the present invention or the like.

(7) Electroplating is conducted using the thin film conductor layer as a plating lead to form an electroplated layer in non plating resist formed areas. Thereafter, the plating resist and the thin film conductor layer under the plating resist are removed, whereby conductor circuits (including via-holes) are formed.

The formation of the electroplated layer and the removal of the thin film conductor layer can be carried out using the same method as that used in the step (7) of the step (a) of the manufacturing method of the substrate for mounting an IC chip according to the second aspect of the first group of the present invention or the like.

While the formation method of the conductor circuit described herein is based on an additive method, the formation method of the conductor circuit in the manufacturing method according to the second aspect of the second group of the present invention is not limited to that based on the additive method but may be based on a subtractive method.

A method of forming the conductor circuits based on the subtractive method will be briefly described hereinafter.

Namely, after forming an interlaminar insulating layer having openings for via-holes, a thin film conductor layer is formed on the surface of the interlaminar insulating layer including the wall faces of the openings for via-holes similarly to the step (5).

Next, an electroplated layer or the like is formed on the entire face of the thin film conductor layer, thereby increasing the thickness of the conductor layer. It is noted that the formation of the electroplated layer or the like may be carried out based on necessity.

Next, an etching resist is formed on the conductor layer.

The etching resist is formed by bonding a photosensitive dry film, closely disposing a photomask on the photosensitive dry film and conducting exposure and development treatment and the like.

Furthermore, the conductor layer under non etching resist formed areas is removed by an etching treatment and the etching resist is then peeled off, whereby independent conductor circuits (including via-holes) are formed on the interlaminar insulating layer.

The etching treatment can be carried out using an etchant containing a solution mixture of a sulfuric acid and peroxide, sodium persulfate, ammonium persulfate, ferric chloride, cupric chloride or the like and the peeling of the etching resist can be carried out using an aqueous alkaline solution.

Even by using such a method, it is possible to form the conductor circuits on the interlaminar insulating layer.

Whether to select the additive method or the subtractive method of the formation method of the conductor circuit may be appropriately determined based on the width and distance of the conductor circuits, the number of connection terminals, the pitch and the like for the IC chip and the optical elements to be mounted on the substrate and other various electronic components.

Moreover, when the plated-through hole is formed in the steps (4) and (5), a resin filler may be filled into the plated-through hole.

Further, when the resin filler is filled into the plated-through hole, a cover plated layer may be formed to cover the surface layer part of the resin filled layer by performing electroless plating based on necessity.

(8) When the cover plated layer is formed, a roughening treatment is conducted to the surface of the cover plated layer if necessary and the steps (3) to (7) are repeatedly executed if necessary, whereby the interlaminar insulating layers and the conductor circuits are serially built upon both faces thereof in an alternate fashion and in repetition. In this step, a plated-through hole may be formed or may not be formed.

Furthermore, when the substrate for mounting an IC chip on which the optical elements are mounted on the opposite side to the side opposed to the multilayered printed circuit board across the substrate and in which the optical paths for transmitting optical signal are formed, through holes penetrating the substrate and the interlaminar insulating layers (hereinafter, referred to as "through holes for optical paths") are formed in the step (8) and further, resin layers for optical paths are formed in the respective through holes for optical paths if necessary.

When the optical paths for transmitting optical signal on the wall faces of which conductor layers are to be formed, through holes for optical paths penetrating the substrate and the interlaminar insulating layers may be formed before forming conductor circuits on the outermost layer and the conductor layers may be formed on the wall faces of the respective through holes for optical paths simultaneously with the formation of the conductor circuits. It is noted that the formation of the conductor layers and that of the conductor circuits on the outermost layer may be carried out separately.

The through holes for optical paths may be formed by drilling, a laser treatment or the like.

In addition, the positions at which the through holes for optical paths are formed are not limited to specific ones but may be appropriately selected based on the design of the conductor circuits, the positions at which the optical elements and the IC chip are mounted and the like.

Furthermore, when the through holes for optical paths are to be formed, they are desirably formed for respective optical elements such as a light receiving element and a light emitting element. Alternatively, they may be formed for respective signal wavelengths.

After forming the through holes for optical paths, a desmear treatment may be performed if necessary.

The desmear treatment can be performed by the same method as that used in the step (b) of the manufacturing method of the substrate for mounting an IC chip according to the second aspect of the first group of the present invention or the like.

A roughened face may be formed on the wall faces of each of the through holes for optical paths. By forming the roughened face, it is possible to improve the adhesion between the through hole for an optical path and the conductor layer or the resin layer for an optical path.

The roughened face can be formed by the same method as that used in the step (b) of the manufacturing method of the substrate for mounting an IC chip according to the second aspect of the first group of the present invention or the like.

Furthermore, after forming the conductor layer, a roughened face may be formed on the surface of the conductor layer.

The resin layer for an optical path is formed by filling an uncured resin composition into each of the through holes for optical paths and then curing the resin composition.

Specifically, in order to form the resin layer for an optical path, the same method as that used in the resin filling step described in the step (b) of the manufacturing method of the substrate for mounting an IC chip according to the second aspect of the first group of the present invention or the like can be used. Thereby, the resin layer for an optical path can be formed.

By performing such treatments, it is possible to form the optical paths for transmitting optical signal penetrating the multilayered circuit board.

(9) Next, a solder resist composition layer is formed on each outermost layer of the substrate on which the conductor circuits and the interlaminar insulating layer are formed.

The solder resist composition layer can be formed using the same method as that used in the step (1) of the step (c) of the manufacturing method of the substrate for mounting an IC chip according to the second aspect of the first group of the present invention or the like.

(10) Next, openings for forming solder bumps (openings for mounting the IC chip and openings for connecting the substrate for mounting an IC chip to the multilayered printed circuit board) and openings for mounting optical elements are formed on the solder resist composition layer, thus providing a solder resist layer.

The openings for forming solder bumps and the openings for mounting optical elements can be formed by the same method as that for forming the openings for via-holes, i.e., by exposure and development treatments, a laser treatment or the like.

Moreover, the solder resist layer having openings for forming solder bumps and openings for mounting optical elements may be formed by manufacturing a resin film having openings at desired positions and bonding it at the time of forming the solder resist layer.

When the substrate for mounting an IC chip having the optical paths for transmitting optical signal is manufactured, it is desirable to form openings for optical paths communicating with the through holes for optical paths in the solder resist layer. When the openings for optical paths are formed, a resin composition may be filled into each of the openings for optical paths and examples of the resin composition include the same as that filled into each of the through holes for optical paths and the like.

(11) Next, conductor circuit portions exposed by forming the openings for forming solder bumps and the openings for mounting optical elements are covered with corrosion resistant metal such as nickel, palladium, gold, silver and platinum to provide solder pads if necessary. Among the corrosion resistant metallic materials, it is desirable to use nickel-gold, nickel-silver, nickel-palladium, nickel-palladium-gold or the like to form a covering layer.

The covering layer may be formed by plating, vapor deposition, electrodeposition or the like. Among them, plating is desirable from a viewpoint that the covering layer is excellent in evenness at the time of being formed by plating.

In addition, in this step, a covering layer (a conductor layer for establishing electrical connection with the optical elements) is desirably also formed on conductor circuit portions exposed by forming the openings for mounting optical elements.

(12) Next, the solder pads are filled with solder paste through a mask having opening parts formed in portions corresponding to the solder pads and then reflow is performed, thereby forming solder bumps.

By forming such solder bumps, it is possible to mount the IC chip through the solder bumps and connect the multilayered printed circuit board to the substrate for mounting an IC chip. It is noted that the solder bumps may be formed if necessary. Even when no solder bumps are formed, it is possible to electrically connect the IC chip to be mounted and the multilayered printed circuit board to be connected through the bumps of the IC chip and the multilayered printed circuit board.

(13) Moreover, optical elements (a light receiving element and a light emitting element) are mounted on the solder resist layer. The mounting of the optical elements may be carried out according to the manner of connecting the optical elements (wire-bonding, flip-chip bonding or the like). As a specific method of connecting the optical elements by the wire-bonding or the flip-chip bonding, a conventionally well-known method can be used.

Further, the optical elements may be mounted so that the optical elements are partially or entirely embedded into the solder resist layer or may be mounted on the surface without embedding them at all.

Accordingly, the magnitude of each of the openings for mounting optical elements formed in the above-mentioned step (10) may be appropriately determined based on the manner of mounting the optical elements.

Further, in this step, after mounting the optical elements, the surroundings thereof may be sealed with resin.

Next, the manufacturing method of the multilayered printed circuit board will be described.

(1) First, similarly to the steps (1) to (2) of the manufacturing method of the substrate for mounting an IC chip according to the second aspect of the second group of the present invention, conductor circuits are formed on both faces of a substrate and a plated-through hole for connecting the conductor circuits across the substrate are formed. In this step, similarly to the above, a roughened face is formed on the surface of each of the conductor circuits and wall surface of the plated-through hole if necessary.

(2) Next, interlaminar insulating layers and conductor circuits are serially built up on both faces of the substrate, on which the conductor circuits are formed, in an alternate fashion and in repetition, if necessary.

Specifically, the interlaminar insulating layers and the conductor circuits may be serially built up in an alternate fashion and in repetition using the same methods as those used in the steps (3) to (8) of the manufacturing method of the substrate for mounting an IC chip according to the second aspect of the second group of the present invention.

In the steps, similarly to the case of manufacturing the substrate for mounting an IC chip, a plated-through hole penetrating the substrate and the interlaminar insulating layers and a cover plated layer may be formed.

It is noted that this step (2), i.e., the step of serially building up the interlaminar insulating layers and the conductor circuits in an alternate fashion and in repetition may be executed only once or a plurality of number of times.

In addition, to form the conductor circuits on the interlaminar insulating layer in this step, the subtractive method may be used similarly to the case of manufacturing the substrate for mounting an IC chip.

Further, when the optical waveguides are formed on the interlaminar insulating layer on the opposite side of the multilayered printed circuit board to the side thereof opposed to the substrate for mounting an IC chip across the substrate or the like in a step described later, then through holes for optical paths having resin layers for optical paths formed on the respective interiors thereof and having conductor layers formed on the respective wall faces thereof are formed in this step, if necessary, by the same method as that described in the manufacturing method of the substrate for mounting an IC chip.

It is noted that these through holes for optical paths penetrating the substrate and the like (optical paths for transmitting optical signal) may be formed after forming the optical waveguides in the following step (3).

(3) Next, optical waveguides are formed on the substrate on the side opposed to the substrate for mounting an IC chip or on non conductor formed areas on the interlaminar insulating layer.

The optical waveguides can be formed by attaching optical waveguides formed into predetermined shape in advance by adhesive when an inorganic material such as quartz glass is used as a material for the optical waveguides.

Furthermore, the optical waveguides made of the inorganic material can be formed by forming a film out of an inorganic material such as $LiNbO_3$ or $LiTaO_3$ by a liquid-phase epitaxial method, a chemical vapor deposition method (CVD), a molecular beam epitaxial method or the like.

Examples of a method of forming the optical waveguides made of a polymer material include (1) a method of bonding a film for forming an optical waveguide formed into a film shape on a removable film or the like onto the interlaminar insulating layer, (2) a method of directly forming the optical waveguide on the interlaminar insulating layer by serially building up a lower cladding, a core and an upper cladding on the interlaminar insulating layer in an alternate fashion and in repetition, and the like.

It is noted that the same method can be used to form the optical waveguides whether the optical waveguides are formed on the removable film or on the interlaminar insulating layer.

Specifically, in order to form the optical waveguides, a method using reactive ion etching, an exposure-development method, a mold formation method, a resist formation method, a combination thereof or the like can be used.

When the method by the reactive ion etching is used, the following steps are executed. (i) A lower cladding is formed on the removable film, the interlaminar insulating layer or the like (hereinafter, simply referred to as "removable film or the like"). (ii) A resin composition for a core is applied onto the lower cladding and a curing treatment is conducted, based on necessity, thereby obtaining a resin layer for forming a core. (iii) A resin layer for forming a mask is then formed on the resin layer for forming a core, and exposure and development treatments are conducted to this resin layer for forming a mask, thereby forming a mask (an etching resist) on the resin layer for forming a core.

(iv) Reactive ion etching is conducted to the resin layer for forming a core, thereby removing the resin layer for forming a core in non mask formed areas and forming the core on the lower cladding. (v) Finally, an upper cladding is formed on the lower cladding to cover the core, thus obtaining an optical waveguide.

When the method by this reactive ion etching is used, it is possible to form an optical waveguide excellent in dimension reliability. This method is also excellent in reproducibility.

When the exposure-development method is used, the following steps are executed. (i) A lower cladding is formed on the removable film or the like. (ii) A resin composition for a core is applied on this lower cladding and a semi-curing treatment is conducted, based on necessity, thereby forming a layer of the resin composition for forming a core.

(iii) Next, a mask having a pattern corresponding to a core formation portion drawn thereon is put on the layer of the resin composition for forming a core and exposure and development treatments are conducted, thereby forming a core on the lower cladding. (iv) Finally, an upper cladding is formed on the lower cladding to cover the core, thus obtaining an optical waveguide.

Since this exposure-development method requires a small number of steps, it can be suitably used when mass-producing optical waveguides. In addition, since this method requires a small number of heat steps, it is possible to make it difficult to cause a stress to occur to the optical waveguide.

When the mold formation method is used, the following steps are executed. (i) A lower cladding is formed on the removable film or the like. (ii) A groove for forming a core is formed in the lower cladding by forming a mold. (iii) A resin composition for a core is filled in the groove by printing and a curing treatment is conducted, thereby forming a core. (iv) Finally, an upper cladding is formed on the lower cladding to cover the core, thus obtaining an optical waveguide.

This mold formation method can be suitably used at the time of mass-producing optical waveguides and optical waveguides excellent in dimension reliability can be formed. This method is also excellent in reproducibility.

When the resist formation method is used, the following steps are executed. (i) A lower cladding is formed on the removable film or the like. (ii) A resin composition for a resist is applied onto this lower cladding and exposure and development treatments are conducted, thereby forming a resist for forming a core in non core formed areas on the lower cladding.

(iii) Next, a resin composition for a core is applied onto non resist formed areas on the lower cladding. (iv) Further, the resin composition for a core is cured and then the resist for forming a core is peeled off, thereby forming a core on the lower cladding. (v) Finally, an upper cladding is formed on the lower cladding to cover the core, thus obtaining an optical waveguide.

This resist formation method can be suitably used at the time of mass-producing optical waveguides and optical waveguides excellent in dimension reliability can be formed. This method is also excellent in reproducibility.

When the optical waveguides made of the polymer material are formed by one of these methods and the optical waveguides having particles mixed in the cores thereof are to be formed, the mold formation method rather than the exposure-development method is desirable for the following reason.

When the groove for forming a core is formed in the lower cladding by the mold formation and the core is then formed by the mold formation method of forming the core in this groove, the particles mixed in the core are all contained in the core, so that the surface of the core is flat and excellent in transmission of optical signal. On the other hand, when the core is formed by the exposure-development method, a part of particles protrude from the surface of the core after development or recesses from which particles are eliminated are formed in the surface of the core, whereby irregularities are formed on the surface of the core in some cases. These irregularities prevent light from reflecting in a desired direction. As a result, the optical signal transmission characteristic may possibly be deteriorated.

Further, an optical path conversion mirror is formed on the optical waveguides.

The optical path conversion mirror may be formed either before or after attaching the optical waveguide onto the interlaminar insulating layer. However, it is desirable to form the optical path conversion mirror before attaching the optical waveguide onto the interlaminar insulating layer except for a case where the optical waveguide is directly formed onto the interlaminar insulating layer. When the optical path conversion mirror is formed in advance, operation is facilitated and there is no possibility of damaging or breaking the other members including the substrate, the conductor circuits and the interlaminar insulating layers that constitute the multilayered printed circuit board.

A method of forming the optical path conversion mirror is not limited to a specific one but a conventionally well-known method can be used. Specifically, machining using a diamond saw having a 90°-V-shaped tip end, a blade or a cutter, processing by reactive ion etching, laser abrasion or the like can be conducted to form the optical path conversion mirror. Alternatively, an optical path conversion member may be embedded into the optical waveguide in place of forming the optical path conversion mirror.

The method of forming the optical waveguides on the substrate or the outermost interlaminar insulating layer has been described herein. However, when the multilayered printed circuit is manufactured, the optical waveguides are often formed between the substrate and the interlaminar insulating layer or between the interlaminar insulating layers.

When the optical waveguides are to be formed between the substrate and the interlaminar insulating layer, the substrate having conductor circuits formed on both faces thereof is formed and then optical waveguides are formed on non conductor formed areas on the substrate similarly to the step (3) in the step (1), and an interlaminar insulating layer is then formed similarly to the step (2), whereby optical waveguides can be formed at the positions.

When the optical waveguides are to be formed between the interlaminar insulating layers, at least one interlaminar insulating layer is formed on the substrate having the conductor circuits formed thereon similarly to the steps (1) and (2), then optical waveguides are formed on the interlaminar insulating layer similarly to the step (3), and the same step as the step (2) is repeatedly executed, whereby optical waveguides can be formed between the interlaminar insulating layers.

(4) Next, a solder resist composition layer is formed on the outermost layer of the multilayered printed circuit board on which the optical waveguides are formed.

The solder resist composition layer can be formed using the same resin composition as that used to form the solder resist layer in the manufacturing method of the substrate for mounting an IC chip according to the second aspect of the third group of the present invention.

In some cases, the optical waveguides may be formed entirely on the outermost layer of the substrate in the step (3) so as to serve as the solder resist layer.

(5) Next, openings for forming solder bumps (openings for mounting the substrate for mounting an IC chip and various surface mount electronic components) and openings for optical paths are formed on a solder resist layer opposed to the substrate for mounting an IC chip.

The formation of the openings for forming solder bumps and openings for optical paths can be performed using the same method as that for forming the openings for forming solder bumps in the manufacturing method of the substrate for mounting an IC chip according to the second aspect of the third group of the present invention, i.e., exposure and development treatment, a laser treatment or the like.

The formation of the openings for forming solder bumps and that of the openings for optical paths may be performed simultaneously or separately.

Among these methods, it is desirable to select the method of forming the openings for forming solder bumps and the openings for optical paths by applying a resin composition containing, as a material therefor, photosensitive resin and conducting exposure and development treatments at the time of forming the solder resist layer.

When the openings for optical paths are formed by the exposure and development treatments, there is no possibility of damaging the optical waveguides present under the openings for optical paths at the time of forming the openings.

Alternatively, the solder resist layer having the openings for forming solder bumps and the openings for optical paths may be formed by manufacturing a resin film having openings at desired positions in advance and bonding it in forming the solder resist layer.

When the through holes for optical paths are formed and the optical waveguides are formed on the opposite side to the side opposed to the substrate for mounting an IC chip across the substrate, the openings for optical paths are formed to communicate with the through holes for optical paths at the time of forming the openings for optical paths in this step.

Further, if necessary, the solder resist layer on the face of the multilayered printed circuit board opposite to the face thereof opposed to the substrate for mounting an IC chip may be also formed to include openings for forming solder bumps.

This is because external connection terminals can be formed on the solder resist layer on the face of the multilayered printed circuit board opposite to the face thereof opposed to the substrate for mounting an IC chip through a later step.

(6) Next, conductor circuit portions exposed by forming the openings for forming solder bumps are covered with corrosion resistant metal such as nickel, palladium, gold, silver and platinum, if necessary, to provide solder pads. Specifically, the same method as that used in the step (11) of the manufacturing method of the substrate for mounting an IC chip according to the second aspect of the second group of the present invention may be used so as to form the solder pads.

(7) Next, if necessary, an uncured resin composition is filled into each of the openings for optical paths formed in the step (5) and a curing treatment is then conducted to the resin composition, thereby forming a resin layer for an optical path.

The uncured resin composition filled in this step is desirably equal to that filled into each of the through holes for optical paths and the openings for optical paths in the steps of the manufacturing method of the substrate for mounting an IC chip according to the second aspect of the second group of the present invention.

In addition, as mentioned above, even when the through holes for optical paths and the openings for optical paths are formed in order to form optical waveguides on the opposite side to the side opposed to the substrate for mounting an IC chip across the substrate, an uncured resin composition may be filled into the through holes for optical paths and the openings for optical paths. In order to fill the uncured resin composition, one of the following methods may be executed. The first method is: the uncured resin composition is filled into the through holes for optical paths and the openings for optical paths simultaneously. The second method is: after forming the through holes for optical paths in the multilayered circuit board, the uncured resin composition is filled into the through holes for optical paths and cured, a solder resist layer having openings for optical paths is formed and then the uncured resin composition is filled into the openings for optical paths and cured.

(8) Next, after filling solder paste into the solder pads through a mask having opening parts formed in portions corresponding to the solder pads, reflow is conducted to form the solder bumps.

By forming such solder bumps, it is possible to mount the substrate for mounting an IC chip and various surface mount electronic components through the solder bumps. It is noted that the solder bumps may be formed if necessary. Even when no solder bumps are formed, it is possible to mount the to-be-mounted IC chip and various surface mount electronic components through the bumps of the IC chip and various surface mount electronic components.

On the solder resist layer on the opposite side to the face of the multilayered printed circuit board opposed to the substrate for mounting an IC chip, external connection terminals are not always formed. A PGA or a BGA may be provided by disposing pins or forming solder balls if necessary.

Through such steps, it is possible to manufacture the multilayered printed circuit board that constitutes the device for optical communication.

In the manufacturing method of the device for optical communication according to the second aspect of the second group of the present invention, the substrate for mounting an IC chip and the multilayered printed circuit board are disposed at and fixed to positions such that optical signal can be transmitted between the optical elements of the substrate for mounting an IC chip and the optical waveguides of the multilayered printed circuit board.

In this case, after disposing the substrate for mounting an IC chip and the multilayered printed circuit board to be opposed to each other, solder connection parts are formed by the solder bumps of the substrate for mounting an IC chip and the solder bumps of the multilayered printed circuit board and the substrate for mounting an IC chip and the multilayered printed circuit board are electrically connected to each other and fixed relative to each other. Namely, the substrate for mounting an IC chip and the multilayered printed circuit board are disposed at predetermined positions in predetermined directions, respectively so as to be opposed to each other and reflow is conducted, thereby connecting them to each other.

As mentioned above, the solder bumps for fixing the substrate for mounting an IC chip and the multilayered printed circuit board relative to each other may be formed on only one of the substrate for mounting an IC chip and the multilayered printed circuit board.

Further, in this step, the substrate for mounting an IC chip and the multilayered printed circuit board are connected to each other using their solder bumps. Therefore, even when there is slight positional deviation between the substrate for mounting an IC chip and the multilayered printed circuit board at the time of disposing them to be opposed to each other, it is possible to dispose them at their respective predetermined positions by the self-alignment effect of solders during reflow.

Next, a resin composition for sealing is caused to flow between the substrate for mounting an IC chip and the multilayered printed circuit board and a curing treatment is conducted to the resin composition for sealing, thereby forming a sealing resin layer. The resin composition for sealing may be caused to infiltrate between the substrate for mounting an IC chip and the multilayered printed circuit board by applying the resin composition for sealing around the substrate for mounting an IC chip using a dispenser or the like and leaving the resin composition for sealing as it was. Alternatively, the resin composition for sealing may be applied using a syringe.

Examples of the resin composition for sealing include those obtained by appropriately mixing resin components such as the acrylic resin such as PMMA (polymethyl methacrylate), PMMA deuteride and PMMA deuteride fluoride; polyimide resin such as polyimide fluoride; epoxy resin; UV cured epoxy resin; silicone resin such as silicone resin deuteride; polymer produced from benzocyclobutene and the like, with particles to be contained if necessary and various additives such as a curing agent, a defoaming agent, acid anhydrate and a solvent, and the like.

Further, the resin composition for sealing has a transmissivity of desirably 70%/mm or more, more desirably 90%/mm for communication wavelength light after being cured.

Herein, the viscosity of the resin composition for sealing caused to flow between the substrate for mounting an IC chip and the multilayered printed circuit board and conditions for the curing treatment after the resin composition for sealing is caused to flow therebetween may be appropriately selected based on the composition of the resin composition for sealing, the design of the substrate for mounting an IC chip and the multilayered printed circuit board and the like. Specifically, the viscosity of the resin composition, for example, is desirably 20 to 100 cps (mP·s).

Next, an IC chip is mounted on the substrate for mounting an IC chip and, thereafter, the IC chip is sealed with resin if necessary, thereby providing a device for optical communication.

The mounting of the IC chip can be performed by a conventionally well-known method.

Alternatively, the device for optical communication may be obtained by mounting the IC chip before connecting the substrate for mounting an IC chip to the multilayered printed circuit board and, then, connecting the substrate for mounting an IC chip on which the IC chip is mounted to the multilayered printed circuit board.

As the resin composition used to seal the IC chip with resin, a conventionally well-known resin composition for sealing an IC chip can be used and particles may be mixed into this resin composition.

The third group of the present invention will next be described.

A device for optical communication according to the first aspect of the third group of the present invention will first be described.

The device for optical communication according to the first aspect of the third group of the present invention is a device for optical communication comprising: a substrate for mounting an IC chip having at least an area for mounting an optical element in which an optical element is mounted and a resin filled layer for an optical path is formed; and a multilayered printed circuit board at which at least an optical waveguide is formed, said device for optical communication is constituted such that optical signal can be transmitted between the optical waveguide and the optical element through the resin filled layer for an optical path.

Since the device for optical communication according to the first aspect of the third group of the present invention comprises the substrate for mounting an IC chip on which the optical elements are mounted at predetermined positions, respectively, and the multilayered printed circuit board on which the optical waveguides are formed at predetermined positions, respectively, the connection loss between the mounted optical elements is low and excellent connection reliability is ensured for the device for optical communication.

Further, in the device for optical communication, since electronic components and optical elements necessary for optical communication can be provided integrally, it is possible to contribute to making a terminal device for optical communication small in size.

In addition, it is desirable that a sealing resin layer is formed between the substrate for mounting an IC chip and the multilayered printed circuit board in the device for optical communication according to the first aspect of the third group of the present invention. When the sealing resin layer is formed, dust, foreign matters and the like floating in the air do not enter between the optical element and the optical waveguide and it is possible to prevent the transmission of optical signal from being hampered by the dust, the foreign matters and the like. Therefore, the device for optical communication has more excellent reliability.

Furthermore, when the sealing resin layer is formed, the sealing resin layer can serve to moderate the stress derived from the difference in thermal expansion coefficient between the substrate for mounting an IC chip and the multilayered printed circuit board. Therefore, it is possible to prevent disconnection and the like in the vicinity of solder bumps connecting the substrate for mounting an IC chip to the multilayered printed circuit board. Besides, when the sealing resin layer is formed, the positional deviation between the optical elements and the optical waveguides is less likely to occur and thus, the transmission of optical signal between the optical elements and the optical waveguides is not hampered.

Accordingly, in view of these respects, the device for optical communication is more excellent in reliability when the sealing resin layer is formed between the substrate for mounting an IC chip and the multilayered printed circuit board.

Moreover, in the device for optical communication according to the first aspect of the third group of the present invention, it is desirable that the substrate for mounting an IC chip and the multilayered printed circuit board are electrically connected to each other through solder bumps. This is because the self-alignment function of solders enables to further surely dispose both at predetermined positions.

In the case of utilizing this self-alignment function and even when the positional deviation occurs between the multilayered printed circuit board and the substrate for mounting an IC chip before reflow at the time of connecting the substrate for mounting an IC chip onto the multilayered printed circuit board through the solder bumps, the substrate for mounting an IC chip moves during the reflow and can be attached to an accurate position on the multilayered printed circuit board.

Accordingly, it is possible to manufacture a device for optical communication excellent in connection reliability by connecting the substrate for mounting an IC chip onto the multilayered printed circuit board through the solder bumps as long as such optical elements as a light receiving element, a light emitting element and optical waveguides are attached to respective positions of the substrate for mounting an IC chip and the multilayered printed circuit board accurately, respectively.

The device for optical communication according to the first aspect of the third group of the present invention will now be described with reference to the drawings.

Figure 29:
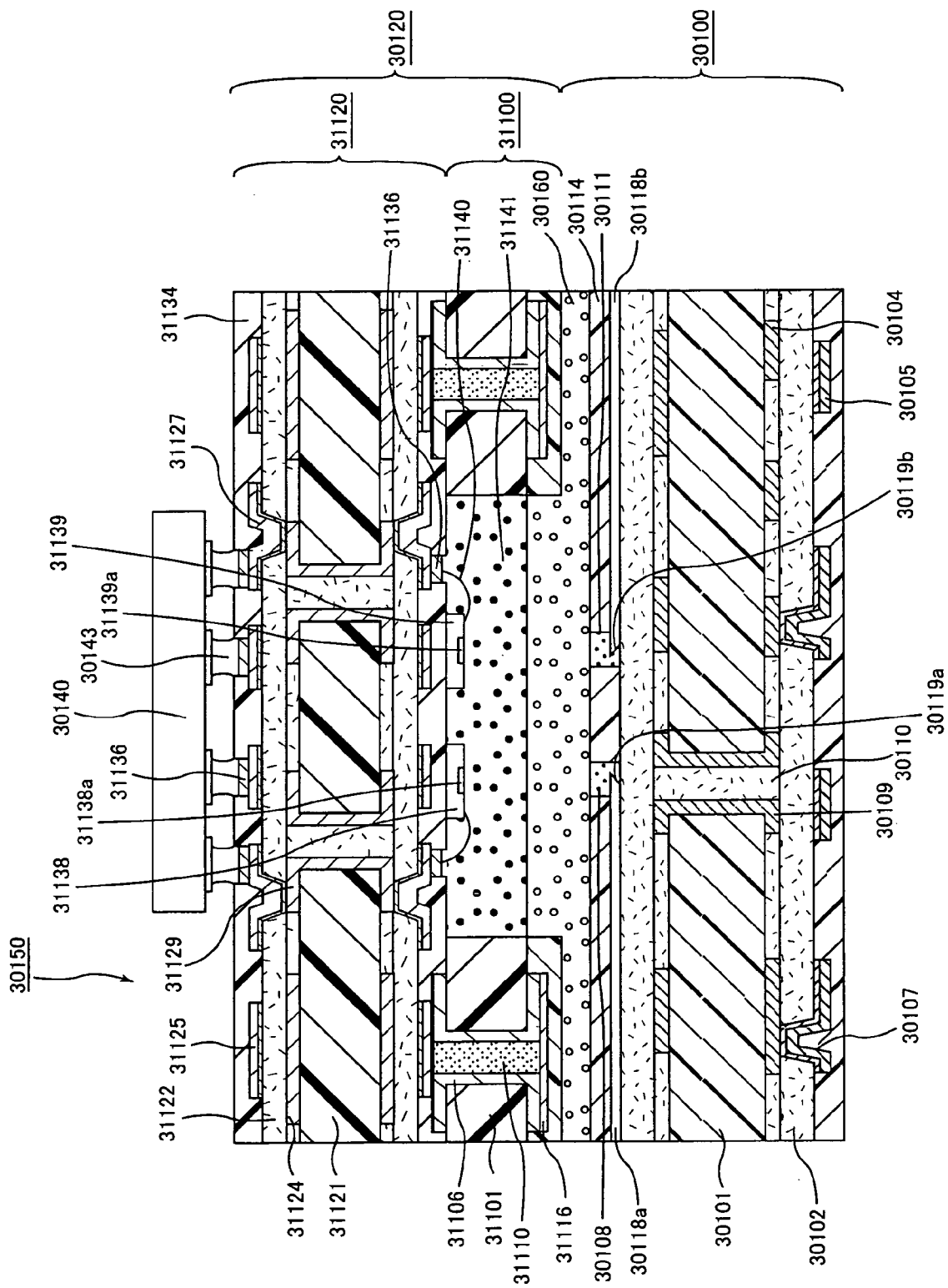
FIG. 29 is a cross-sectional view schematically showing one embodiment of a device for optical communication according to the first aspect of the third group of the present invention.

FIG. 29 is a cross-sectional view schematically showing one embodiment of the device for optical communication according to the first aspect of the third group of the present invention. It is noted that FIG. 29 shows the device for optical communication in a state where an IC chip is mounted.

As shown in FIG. 29, the device for optical communication 30150 comprises a substrate for mounting an IC chip 30120 and a multilayered printed circuit board 30100, with the substrate for mounting an IC chip 30120 electrically connected to the multilayered printed circuit board 30100 through solder connection parts (not shown).

In addition, a sealing resin layer 30160 is formed between the substrate for mounting an IC chip 30120 and the multilayered printed circuit board 30100.

It is noted that an IC chip 30140 is mounted on the substrate for mounting an IC chip 30120 through solder connection parts 30143.

In the substrate for mounting an IC chip 30120, a package substrate 31120 constituted such that conductor circuits 31124, 31125 and interlaminar insulating layers 31122 are serially built up on both faces of a substrate 31121 in an alternate fashion and in repetition, the conductor circuits with the substrate 31121 interposed therebetween are connected to each other by a plated-through hole 31129 and that the conductor circuits with the interlaminar insulating layers 31122 interposed therebetween are connected to each other through via-holes 31127, is built up on a substrate for inserting an optical element 31100 having an area for mounting an optical element.

The substrate for inserting an optical element 31100 is constituted such that conductor circuits are formed on both faces of a substrate 31101, a plated-through hole 31106 connecting the conductor circuits to each other are formed in the substrate for inserting an optical element 31100, a resin filler layer 31110 is formed on the interior of the plated-through hole 31106 and a cover plating layer 31116 is formed to cover the resin filler layer 31110.

Further, the substrate for inserting an optical element 31100 includes the area for mounting an optical element almost at the center thereof. In this area for mounting an optical element, optical elements such as a light receiving element 31138 and a light emitting element 31139 are disposed using resin for die-bonding (not shown), a resin filled layer for an optical path 31141 is formed, and the optical elements are electrically connected to a metal layer 31136 on the package substrate 31120 by wire-bonding through wires 31140, respectively. In order to dispose the optical elements, conductor containing paste may be used in place of the resin for die-bonding. Solders) may be used in place of the resin for die-bonding in some cases.

In the substrate for mounting an IC chip 30120, an area occupied by the resin filled layer for an optical path 31141, the optical elements (light receiving element 31138 and light emitting element 31139) and the wires 31140 corresponds to the area for mounting an optical element.

Moreover, the resin filled layer for an optical path may be constituted by one layer as shown in FIG. 29, be constituted by two layers of an inner resin filled layer for an optical path and an outer resin filled layer for an optical path, or may be constituted by three or more layers. This will be described later in detail.

Furthermore, the device for optical communication 30150 shown in FIG. 29 employs wire-bonding type optical elements as the optical elements. However, the optical elements employed in the device for optical communication according to the first aspect of the third group of the present invention may be flip-chip type optical elements.

When the flip-chip type optical elements are employed, pads for connecting optical elements may be provided on the package substrate in advance and the optical elements may be attached to the respective pads through solders.

When the flip-chip type optical elements are attached, it is desirable to seal the clearances between the optical elements and the package substrate with resin. Specifically, the clearances may be sealed with a resin composition for forming the inner resin filled layer for an optical path or the like.

In the substrate for mounting an IC chip 30120, a solder resist layer 31134 having openings is formed on the outermost layer on the package substrate 31120 side, and solder bumps for mounting the IC chip through the solder pads (metal layer) 31136 are formed in the respective openings of the solder resist layer 31134. As mentioned above, FIG. 29 shows the device for optical communication on which the IC chip 30140 is mounted through the solder connection parts 30143.

Further, the multilayered printed circuit board 30100 is constituted such that conductor circuits 30104 and interlaminar insulating layers 30102 are serially build up on both faces of a substrate 30101 in an alternate fashion and in repetition and that the conductor circuits with the substrate 30101 interposed therebetween and those with the interlaminar insulating layers 30102 interposed therebetween are connected to one another by a plated-through hole 30109 and via-holes 30107, respectively. In addition, a resin filler layer 30110 is formed on the interior of the plated-through hole 30109.

Furthermore, a solder resist layer 30114 having openings for optical paths 30111 and optical waveguides 30118 (30118a, 30118b) having optical path conversion mirrors 30119 (30119a, 30119b) immediately under the openings for optical paths 30111 are formed, respectively on the outermost layer of the multilayered printed circuit board 30100 on the side confronting the substrate for mounting an IC chip 30120. A resin layer for an optical path 30108 is formed in each of the openings for optical paths 30111.

In the device for optical communication 30150 having the above-mentioned configuration, optical signal transmitted from the outside through an optical fiber or the like (not shown) is introduced into the optical waveguide 30118a, transmitted to the light receiving element 31138 (light receiving part 31138a) through the optical path conversion mirror 30119a, the opening for an optical path 30111, the sealing resin layer 30160 and the resin filled layer for an optical path 31141, and converted into an electric signal by the light receiving element 31138, and the resultant electric signal is transmitted to the IC chip 30140 through the conductor circuits and the solder connection parts.

Further, the electric signal sent from the IC chip 30140 is transmitted to the light emitting element 31139 through the solder connection parts and the conductor circuits, and converted into optical signal by the light emitting element 31139, and the resultant optical signal is introduced into the optical waveguide 30118b from the light emitting element 31139 (light emitting part 31139a) through the resin filled layer for an optical path 31141, the sealing resin layer 30160, the opening for an optical path 30111b and the optical conversion mirror 30119b and outputted to the outside through the optical fiber or the like (not shown) as optical signal.

In the device for optical communication according to the first aspect of the third group of the present invention, optical/electric signal conversion is performed in the substrate for mounting an IC chip, i.e., at a position near the IC chip. Therefore, an electric signal transmission distance is short, and it is possible to satisfy higher rate communication and integrally provide electronic components and optical elements necessary for optical communication. It is thus possible to contribute to making a terminal device for optical communication small in size.

Furthermore, in the device for optical communication, the electric signal outputted from the IC chip is not only converted into optical signal, and then transmitted to the outside through the optical fiber as mentioned above, but also the electric signal is transmitted to the multilayered printed circuit board through the solder bumps and transmitted to an electronic component such as the other IC chip mounted on the multilayered printed circuit board through the conductor circuits (including the via-holes and plated-through hole) of the multilayered printed circuit board (not shown).

In the cross-sectional view of the device for optical communication 30150 shown in FIG. 29, the solder bumps for connecting the substrate for mounting an IC chip to the multilayered printed circuit board are not shown. Actually, however, the substrate for mounting an IC chip and the multilayered printed circuit board are connected to each other through the solder bumps formed on both of or one of the substrate for mounting an IC chip and the multilayered printed circuit board.

Furthermore, in the device for optical communication 30150 shown in FIG. 29, the sealing resin layer 30160 is formed between the substrate for mounting an IC chip 30120 and the multilayered printed circuit board 30100. In the device for optical communication having thus the sealing resin layer formed between the substrate for mounting an IC chip and the multilayered printed circuit board, dust, foreign matters and the like floating in the air do not enter between the optical element and the optical waveguide and the transmission of optical signal is not hampered by the presence of the dust, the foreign matters and the like. Therefore, the device for optical communication is more excellent in reliability.

The sealing resin layer is not limited to a specific one as long as the resin layer is less absorbed in a communication wavelength band. Examples of a material for the sealing resin layer include the same material as that for the sealing resin layer formed in the device for optical communication according to the first aspect of the second group of the present invention and the like.

It is also desirable that the sealing resin layer has a transmissivity of 70 (%/mm) or more for communication wavelength light.

When the transmissivity for the communication wavelength light is less than 70%/mm, optical signal loss is large, which often causes the deterioration of the reliability of the device for optical communication. It is more desirable that the transmissivity is 90%/mm or more.

When the sealing resin layer is composed of only the resin composition already mentioned above, in particular, the transmissivity thereof is desirably 90%/mm or more. As will be described later, when particles are contained in the sealing resin layer, it is desirable that the transmissivity of the sealing resin layer is 70%/mm or more.

Furthermore, it is desirable that the sealing resin layer contains particles such as resin particles, inorganic particles or metal particles.

By incorporating the particles therein, it is possible to match the thermal expansion coefficient of the above-mentioned substrate for mounting an IC chip to that of the multilayered printed circuit board and make it more difficult to cause cracks or the like due to the difference in thermal expansion coefficient to occur.

In the device for optical communication according to the first aspect of the third group of the present invention which comprises the substrate for mounting an IC chip and the multilayered printed circuit board, the thermal expansion coefficients of the constituent members thereof (in a z-axis direction) are the same as those of the constituent members of the device for optical communication according to the first aspect of the second group of the present invention.

Accordingly, when particles are mixed in the sealing resin layer, the difference in thermal expansion coefficient between the sealing resin layer and the other constituent members that constitute the device for optical communication is decreased. Therefore, a stress is moderated.

Further, when particles are mixed in the sealing resin layer, the positional deviation between the optical elements and the optical waveguides becomes less likely to be caused.

Moreover, when the particles are mixed in the sealing resin layer, it is desirable that the resin component of the sealing resin layer is almost equal in refractive index to the particles. Therefore, when the particles are mixed in the sealing resin layer, it is desirable to set the refractive index of the particles almost equal to that of the resin composition similarly to the sealing resin layer formed on the device for optical communication according to the first aspect of the second group of the present invention.

Specific examples of the resin particles, inorganic particles and metal particles include the same particles as those contained in the sealing resin layer formed on the device for optical communication according to the first aspect of the second group of the present invention. The particles are desirably inorganic particles, which desirably of silica, titania or alumina. It is also desirable to use particles having a mixture composition obtained by mixing and dissolving at least two kinds among silica, titania and alumina.

Further, the shape, particle diameter and mixing quantity of the particles are the same as those of the particles contained in the sealing resin layer formed on the device for optical communication according to the first aspect of the second group of the present invention.

The composition of the sealing resin layer has an influence on reliabilities such as the optical signal transmission loss, heat resistance and bending strength. Therefore, the specific composition may be appropriately selected so that the sealing resin layer satisfies low optical signal transmission loss, excellent heat resistance and excellent cracking resistance.

In the device for optical communication according to the first aspect of the third group of the present invention, it is desirable that the resin filled layer for an optical path is equal in refractive index to the sealing resin layer. When the refractive index of the resin filled layer for an optical path is lower than that of the sealing resin layer, optical signal transmitted through the resin filled layer for an optical path is converged toward the light receiving part of the light receiving element. The optical signal outputted from the light emitting element is refracted in a direction in which the optical signal is not spread on the interface between the resin filled layer for an optical path and the sealing resin layer. However, because of the difference in refractive index therebetween, the reflection of the optical signal on the interface between the resin filled layer for an optical path and the sealing resin layer occurs, with the result that the optical signal transmission loss increases. Therefore, in order to lower the optical signal transmission loss, it is desirable that the resin filled layer for an optical path is equal in refractive index to the sealing resin layer. Normally, the refractive indexes of the resin filled layer for an optical path and the sealing resin layer are appropriately selected based on the degree of the reflection and the degree of refraction of the optical signal on the interface between the resin filled layer for an optical path and the sealing resin layer.

Furthermore, in the device for optical communication, a resin layer for an optical path is formed in each of the openings for optical paths provided in the multilayered printed circuit board. In this case, it is desirable that the resin layer for an optical path is equal in refractive index to the sealing resin layer. When they are equal in refractive index, it is possible to lower the optical signal transmission loss similarly to the case where the resin filled layer for an optical path is equal in refractive index to the sealing resin layer.

Moreover, when the interior of each of the openings for optical paths is a vacancy, the uncured resin composition for forming the sealing resin layer often enters the vacancy of each of the openings for optical paths and a void often occurs at the time of the entry of the uncured resin composition in the step of forming the sealing resin layer of the manufacturing of the device for optical communication. The occurrence of such a void may possibly adversely influence the optical signal transmission capability of the device for optical communication. However, when the resin layer for an optical path is formed in each of the openings for optical paths, such a problem does not occur.

Moreover, when the resin layer for an optical path is formed in each of the openings for optical paths, it is desirable that the resin filled layer for an optical path, the resin layer for an optical path and the sealing resin layer are equal in refractive index. This is because when the three are equal in refractive index, the reflection of the optical signal on the interface between the resin filled layer for an optical path and the sealing resin layer and that on the interface between the sealing resin layer and the resin layer for an optical path do not occur.

The refractive indexes of the resin components used for the sealing resin layer and resin filled layer for an optical path are as follows: the refractive index of epoxy resin is about 1.50 to 1.60, that of acrylic resin is about 1.40 to 1.55, and that of polyolefin is about 1.55 to 1.65. Examples of a method of adjusting the refractive index of the sealing resin layer or the like include a method of changing polarizability by fluorinating or phenylating a part of the resin component to thereby change the refractive index of a resin component, a method of changing a molecular weight by deuteriding a part of the resin component to thereby change the refractive index of a resin component and the like. It is noted that such a refractive index adjustment method can be also used as a method of adjusting the refractive index of the optical waveguide.

Further, in the device for optical communication, it is desirable that at least one micro lens is provided on the face of the resin filled layer for an optical path, said face confronting the multilayered printed circuit board.

Figure 30:
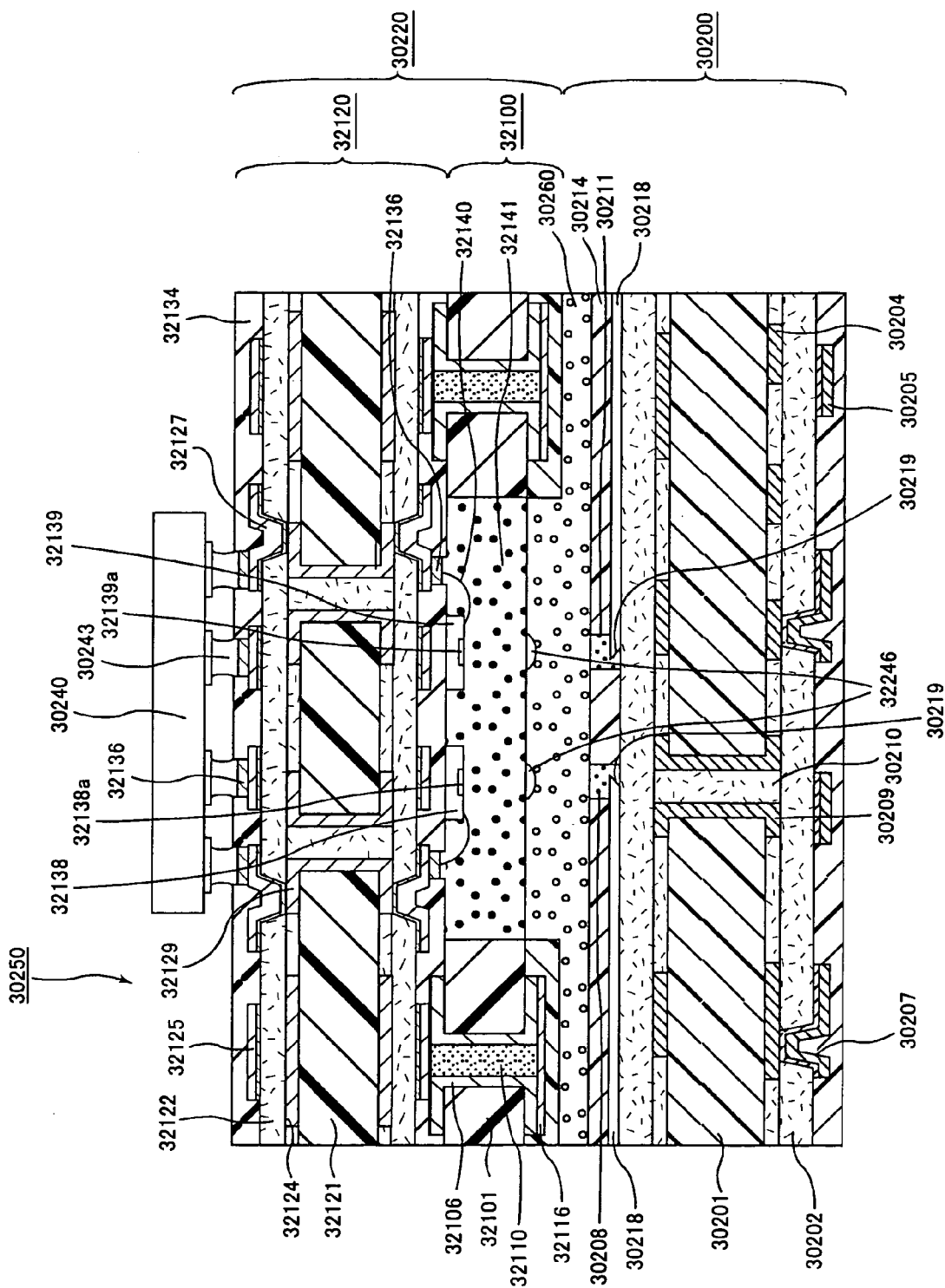
FIG. 30 is a cross-sectional view schematically showing another embodiment of the device for optical communication according to the first aspect of the third group of the present invention.

FIG. 30 is a cross-sectional view schematically showing another embodiment of the device for optical communication according to the first aspect of the third group of the present invention.

Similarly to the device for optical communication 30150 shown in FIG. 29, the device for optical communication 30250 shown in FIG. 30 comprises a substrate for mounting an IC chip 30220 and a multilayered printed circuit board 30200 and a sealing resin layer 30260 is formed between the substrate for mounting an IC chip 30220 and the multilayered printed circuit board 30200.

Further, in the substrate for mounting an IC chip 30220, micro lenses 32246 are disposed between optical elements (alight receiving element 32138 and a light emitting element 32139) and optical path conversion mirrors 30219, respectively, on the face of a resin filled layer for an optical path 32141 confronting the sealing resin layer 30260. By thus disposing the micro lenses, it is possible to further ensure transmitting optical signal between the optical elements (light receiving element and light emitting element) and the optical waveguides.

As shown in FIG. 30, it is desirable that two micro lenses are disposed between the light emitting element and the optical path conversion mirror and between the light receiving element and the optical path conversion mirror, respectively. Depending on situations, it suffices to dispose only one micro lens either between the light emitting element and the optical path conversion mirror or between the light receiving element and the optical path conversion mirror.

It is noted that the embodiment of the device for optical communication 30250 shown in FIG. 30 is equal to the device for optical communication 30150 except that the micro lenses 30246 are disposed on the face of the resin filled layer for an optical path 33141 of the substrate for mounting an IC chip 30220 confronting the sealing resin layer 30160.

In addition, it is desirable that the refractive index of each of the micro lenses disposed on the face of the resin filled layer for an optical path, said face confronting the sealing resin layer (the face confronting the multilayered printed circuit board) is higher than that of the sealing resin layer. By disposing the micro lenses having such a refractive index, it is possible to converge optical signal in a desired direction and it is, therefore, possible to further ensure transmitting the optical signal.

In addition, when the micro lense is a convex lens having a convex face only on one side (sealing resin layer side) as shown in FIG. 30, the radius of curvature of the micro lens is appropriately selected based on the focal distance of the micro lens. Specifically, when the focal distance of the micro lens is to be set long, the radius of curvature is set small. When the focal distance is to be set short, the radius of curvature is set large.

Furthermore, though not shown in the drawing, when a resin layer for an optical path is formed in the opening for an optical path of the multilayered printed circuit board, it is desirable that a micro lens is also disposed on the sealing resin layer-side tip end portion of the opening for an optical path. In this case, it is desirable that the refractive index of the micro lens is higher than that of the sealing resin layer.

Moreover, when a micro lens is also disposed on the end portion of an opening for an optical path and the distance from the light receiving part of the light receiving element or the light emitting part of the light emitting element to the surface of the resin filled layer for an optical path is almost equal to the thickness of the opening for an optical path having the resin layer for an optical path formed therein, it is desirable that the micro lens disposed on the end portion of the opening for an optical path is almost equal in refractive index to the micro lenses disposed on the face of the resin filled layer for an optical path, said face confronting the sealing resin layer.

By disposing the micro lenses having such refractive indexes, it is possible to converge optical signal in a desired direction and it is, therefore, possible to further ensure transmitting the optical signal.

The micro lense is not limited to a specific one and examples of the micro lens include a lens used as an optical lens. Specific examples of a material for the micro lens include optical glass, resin for an optical lens and the like.

Examples of the resin for an optical lens include the same resin for an optical lens as that used in the substrate for mounting an IC chip according to the first aspect of the first group of the present invention and the like.

The shape of the micro lens is not limited to a specific one but may be appropriately selected based on the design of the substrate for mounting an IC chip. Normally, the micro lens has a diameter of 100 to 500 μm and a thickness of 200 μm or less. Since the micro lens is normally small as mentioned above, no cracks occur to the micro lens even when heat is applied thereto.

Further, similarly to the micro lens formed on the substrate for mounting an IC chip according to the first aspect of the first group of the present invention, particles may be added to the micro lens and specific examples of the particles include the same particles as those added to the micro lens formed on the substrate for mounting an IC chip according to the first aspect of the first group of the present invention.

In addition, the quantity of the added particles is desirably 60% by weight or less.

When particles are added to the micro lens, it is desirable that the resin for an optical lens is equal in refractive index to the particles. For that reason, when the particles are added to the resin for an optical lens, it is desirable to mix two kinds of particles having different refractive indexes to make the refractive index of the particles almost equal to that of the resin for an optical lens.

Specifically, when the resin for an optical lens is, for example, epoxy resin having a refractive index of 1.53, it is desirable to mix silica particles having a refractive index of 1.54 and titania particles having a refractive index of 1.52.

When the micro lenses are disposed on the face of the resin filled layer for an optical path, said face confronting the sealing resin layer, the micro lenses may be disposed on the resin filled layer for an optical path through a transparent adhesive layer or directly disposed thereon.

In case of disposing the micro lens on the end portion of the opening for an optical path, the micro lens may be similarly disposed thereon through a transparent adhesive layer. When the resin layer for an optical path is formed on the interior of the opening for an optical path, the micro lens may be directly disposed on the resin layer for an optical path.

It is desirable that the micro lenses are attached so that the centers of the micro lenses are located on a line connecting the light receiving part of the light receiving element and the light emitting part of the light emitting element to the optical conversion mirrors of the optical waveguides, respectively.

Further, the shape of the micro lenses is not limited to the convex shape shown in FIG. 30 but may be any shape capable of converging optical signal in a desired direction.

The embodiment of the substrate for mounting an IC chip that constitutes the device for optical communication according to the first aspect of the third group of the present invention is not limited to that shown in FIG. 29 or 30.

Figure 31:
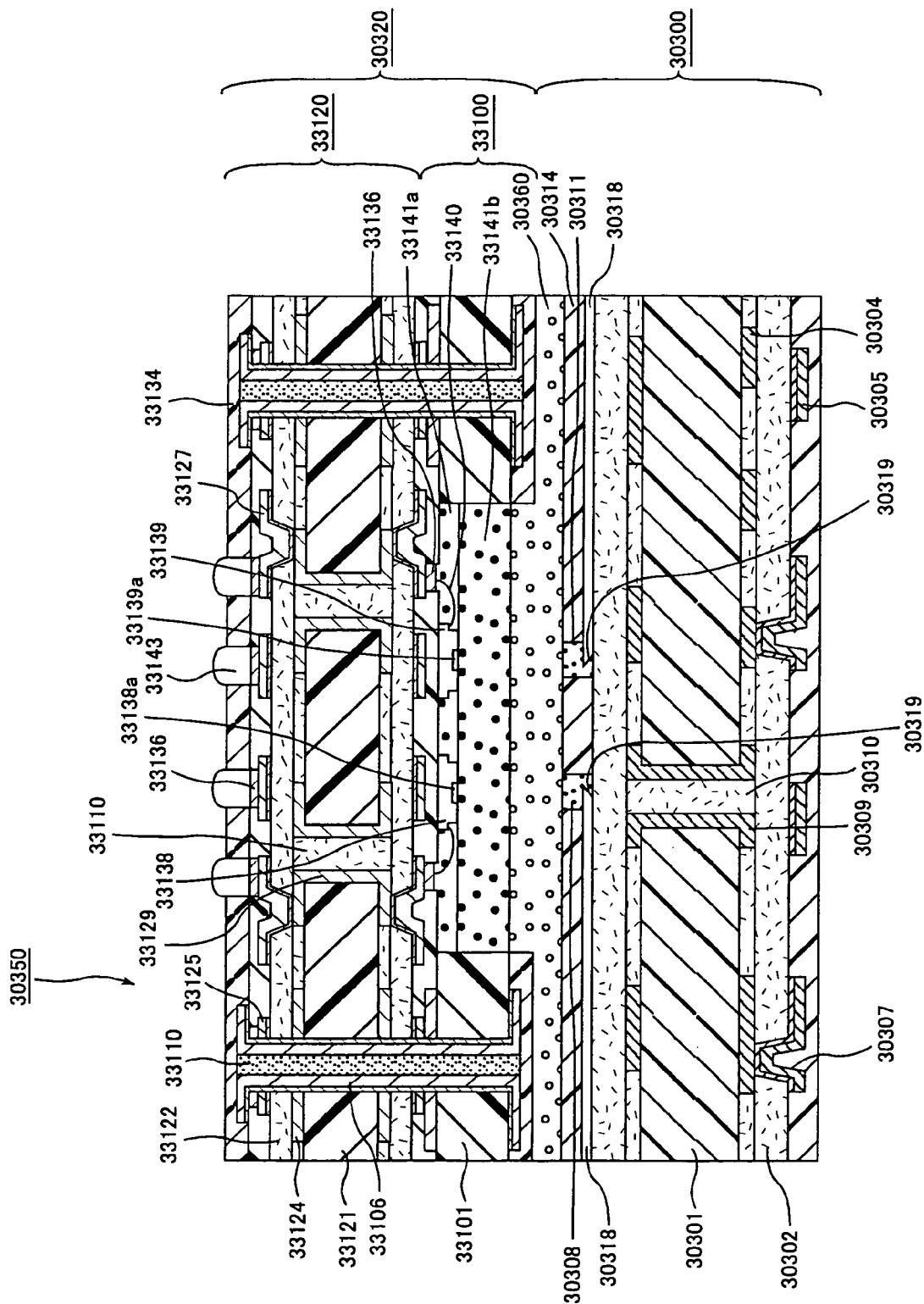
FIG. 31 is a cross-sectional view schematically showing another embodiment of the device for optical communication according to the first aspect of the third group of the present invention.

FIG. 31 is a cross-sectional view schematically showing another embodiment of the device for optical communication according to the first aspect of the third group of the present invention.

The device for optical communication 30350 shown in FIG. 31 is constituted by a substrate for mounting an IC chip 30320 and a multilayered printed circuit board 30300. Although the structure of the substrate for mounting an IC chip 30320 differs from that of the substrate for mounting an IC chip 30120 that constitutes the device for optical communication 30150 shown in FIG. 29, the other structure and the like of the device for optical communication 30350 are equal to those of the device for optical communication 30150 shown in FIG. 29. Therefore, only the substrate for mounting an IC chip 30320 that constitutes the device for optical communication 30350 will be described herein in detail.

In the substrate for mounting an IC chip 30320, a package substrate 33120 is constituted such that: conductor layers 33124, 33125 and interlaminar insulating layers 33122 are serially built up on both faces of a substrate 33121 in an alternate fashion and in repetition; the conductor circuits with the substrate 33121 interposed therebetween are connected to each other by a plated-through hole 33129 and the conductor circuits with the interlaminar insulating layers 33122 interposed therebetween are connected to each other through via-holes, is built up on a substrate for inserting an optical element 33100 having an area for mounting an optical element.

Further, the substrate for inserting an optical element 33100 is constituted such that the area for mounting an optical element is provided almost at the center thereof, optical elements such as a light receiving element 33138 and a light emitting element 33139 are disposed and resin filled layer for optical paths (an inner resin filled layer for an optical path 33141*a*, an outer resin filled layer for an optical path 33141*b*) are formed in this area for mounting an optical element, and that the optical elements are electrically connected to the metal layer 33136 of the package substrate 33120 by wire-bonding through wires 33140, respectively.

Furthermore, the pads for electric connection of the light receiving element 33138 and the light emitting element 33139 (parts connected to the wires of the optical elements) shown in FIG. 31 are provided on the package substrate side relative to the light receiving part 33138*a* of the light receiving element 33138 and the light emitting part 33139*a* of the light emitting element 33139, respectively.

By constituting the resin filled layer for an optical path to have a structure composed of the inner resin filled layer for an optical path and the outer resin filled layer for an optical path using the optical elements having such shapes, it is possible for the inner resin filled layer for an optical path to protect the wires and the connection parts between the optical elements and the wires, thus ensuring more excellent connection reliability for the connection between the optical elements and the conductor circuits (metal layers).

Moreover, in the substrate for mounting an IC chip 30320, a plated-through hole 33106 which penetrates the substrate for inserting an optical element 33100 and the package substrate 33120 is formed and a resin filler layer 33110 is formed on the interior of the plated-through hole 33106. In addition, a solder resist layer 33134 having openings is formed on the outermost layer of the substrate for mounting an IC chip 30320 on the side on which an IC chip is mounted, and solder bumps 33143 for mounting the IC chip are formed in the respective openings of the solder resist layer 33134 through solder bumps (metal layers) 33136.

Next, the other constituent members of the device for optical communication according to the first aspect of the third group of the present invention and the like will be described.

The optical elements (light receiving element, light emitting element) are mounted on the substrate for mounting an IC chip that constitutes the device for optical communication according to the first aspect of the third group of the present invention.

Specific examples of the light receiving element and light emitting element include the same light receiving element and light emitting element as those mounted on the substrate for mounting an IC chip according to the first aspect of the first group of the present invention and the like.

Further, the resin filled layer for an optical path is formed on the substrate for mounting an IC chip that constitutes the device for optical communication according to the first aspect of the third group of the present invention. It is possible to transmit optical signal between the optical elements mounted on the substrate for mounting an IC chip and optical waveguides formed on the multilayered printed circuit board through this resin filled layer for an optical path.

The resin filled layer for an optical path may be constituted by one layer as seen in the resin filled layer for optical paths 31141 and 32141 shown in FIGS. 29 and 30 or may be constituted by two layers of the inner resin filled layer for an optical path 33141*a* and the outer resin filled layer for an optical path 33141*b* as seen in the resin filled layer for an optical path shown in FIG. 31.

When the resin filled layer for an optical path is constituted by two layers, it is possible to ensure more excellent reliability for the device for optical communication by forming the inner resin filled layer for an optical path using a resin composition suitable for fixing the optical elements and forming the outer resin filled layer for an optical path using a resin composition excellent in transmissivity for communication wavelength light.

Further, when the inner resin filled layer for an optical path and the outer resin filled layer for an optical path thus different in characteristics are formed, the thickness of the inner resin filled layer for an optical path is equal to or smaller than those of the optical elements. When the thickness of the inner resin filled layer for an optical path having the above-mentioned characteristic is larger than those of the optical elements, optical signal transmission is hampered in some cases.

In some cases, the resin filled layer for an optical path may be constituted by three or more layers.

When the resin filled layer for an optical path may be constituted by one layer, the resin filled layer for an optical path is not limited to a specific one as long as the resin filled layer for an optical path is excellent in transmissivity for communication wavelength light. Examples of a material for the resin filled layer for an optical path include thermosetting resin, thermoplastic resin, photosensitive resin, resin obtained by photosensitizing a part of thermosetting resin, a resin composition having these complexes as a resin component and the like. Specific examples of the resin component include epoxy resin, phenol resin, polyimide resin, olefin resin, BT resin and the like.

In addition, the resin composition may contain such particles as resin particles, inorganic particles and metal particles in addition to the resin component. By incorporating these particles in the resin composition, it is possible to match the thermal expansion coefficients of the resin filled layer for an optical path, the substrate, the solder resist layer, the interlaminar insulating layers and the like and impart flame resistance to the resin composition depending on the types of the particles.

Specific examples of the particles include the same particles as those contained in the sealing resin layer and the like.

Furthermore, the shape of the particles is not limited to a specific one and examples of the shape include a spherical shape, an elliptic shape, a friable shape, a polygonal shape and the like.

In addition, it is desirable that the particle diameter of the particles is smaller than a communication wavelength. When the particle diameter is larger than the communication wavelength, this often hampers optical signal transmission.

It is more desirable that the lower limit and upper limit of the particle diameter are 0.01 μm and 0.8 μm, respectively. When particles out of this range are included, a particle size distribution becomes too wide. At the time of mixing the particles into a resin composition, the variation of the viscosity of the resin composition grows, thereby deteriorating reproducibility in preparing the resin composition and making it difficult to prepare a resin composition having a predetermined viscosity. It is noted that the viscosity of the resin composition prepared at the time of forming the resin filled layer for an optical path is desirably 200 to 1000 cps (mP·s).

The lower limit and upper limit of the particle diameter are more desirably 0.1 μm and 0.8 μm, respectively. When the particle diameter falls within the range, the resin composition can be suitably applied and filled and it is easier to prepare the resin composition into which particles are mixed to have a predetermined viscosity.

The lower limit and upper limit of the particle diameter are particularly desirably 0.2 μm and 0.6 μm, respectively. This range is particularly suitable for the application of the resin composition. Besides, within this range, the variation among the formed resin filled layer for optical paths is minimized, ensuring particularly excellent device for optical communication in characteristics.

When the particles having particle diameters within this range are used, two or more kinds of particles having different particle diameters may be included.

The lower limit of the mixing quantity of the particles contained in the resin filled layer for optical paths is desirably 10% by weight, more desirably 20% by weight. The upper limit thereof is desirably 50% by weight, more desirably 40% by weight. When the mixing quantity of the particles is less than 10% by weight, the effect of mixing particles cannot be expected in some cases. When it exceeds 50% by weight, the transmission of optical signal is hampered in some cases. In addition, when the mixing quantity is within the range of 20 to 40% by weight, even the occurrence of the aggregation or dispersion of particles does not influence optical signal transmission characteristic.

When the resin filled layer for an optical path composed of two layers of the inner resin filled layer for an optical path and the outer resin filled layer for an optical path, the resin composition excellent in optical signal transmission can be used as a material for the outer resin filled layer for an optical path and the same material as a conventionally well-known resin composition for sealing an IC chip, or the like can be used as a material for the inner resin filled layer for an optical path.

Specifically, examples of the materials include thermosetting resin, thermoplastic resin, photosensitive resin, resin obtained by photosensitizing apart of thermosetting resin, a resin complex of thermosetting resin and thermoplastic resin, a complex of photosensitive resin and thermoplastic resin and the like.

Specific examples of the resin composition include resin compositions obtained by mixing phenol novolak type resin as a curing agent, silica as a filler and the like into cresol novolak type epoxy resin and, based on necessity, also mixing the other additives such as a reaction acceleration agent, a coupling agent, a flame retarder (flame resistance assistant) and a coloring agent and the like.

In the substrate for mounting an IC chip, when the resin filled layer for an optical path is constituted by one layer, the resin filled layer for an optical path has a transmissivity of desirably 70%/mm or more, more desirably 90%/mm or more.

In the present specification, the transmissivity of the resin filled layer for an optical path means transmissivity for communication wavelength light per 1 mm-length. Specifically, when light having an intensity $I_3$ is incident on the resin filled layer for an optical path and emitted from the resin filled layer for an optical path after passing through the resin filled layer for an optical path, the emitting light has an intensity $I_4$. The transmissivity for the light is calculated by the following expression (2).

$$\text{Transmissivity (\%/mm)} = (I_4/I_3) \times 100 \quad (2)$$

It is noted that the transmissivity is transmissivity measured at 25 to 30° C.

Furthermore, when the resin filled layer for an optical path is constituted by two layers, the upper resin filled layer for an optical path has a transmissivity (transmissivity for communication wavelength light per 1 mm-length) of the resin filled layer for an optical path is desirably 70%/mm or more, more desirably 90%/mm or more.

Moreover, optical waveguides are formed on the multilayered printed circuit board that constitutes the device for optical communication according to the first aspect of the third group of the present invention.

Examples of the optical waveguide include the same optical waveguides as those formed on the multilayered printed circuit board that constitutes the device for optical communication according to the first aspect of the second group of the present invention, and the like.

In the multilayered printed circuit boards shown in FIGS. 29 to 31, the optical waveguides are formed on the outermost interlaminar insulating layer on the side confronting the substrate for mounting an IC chip. However, the optical waveguide formation positions in the device for optical communication according to the first aspect of the third group of the present invention are not limited to these positions but may be between the interlaminar insulating layers or between the substrate and the interlaminar insulating layer. Further, the positions may be on the outermost interlaminar insulating layer on the opposite side to the side confronting the substrate for mounting an IC chip across the substrate, between the interlaminar insulating layers, between the substrate and the interlaminar insulating layer, or the like.

Furthermore, in the multilayered printed circuit boards shown in FIGS. 29 to 31, the optical waveguides are formed on the outermost interlaminar insulating layer and the solder resist layer is formed to cover this interlaminar insulating layer and the optical waveguides. However, this solder resist layer is not always formed but the optical waveguide may be formed entirely on the outermost interlaminar insulating layer so as to serve as the solder resist layer.

In the device for optical communication according to the first aspect of the third group of the present invention, the sealing resin layer may be formed only in regions that do not correspond to optical paths for optical signal among the area put between the substrate for mounting an IC chip and the multilayered printed circuit board. Specifically, the sealing resin layer may be formed, for example, only in the vicinity of the outer periphery of the area put between the substrate for mounting an IC chip and the multilayered printed circuit board.

By thus forming the sealing resin layer, it is possible to attain the effect of the second group of the present invention that it is possible to prevent dust, foreign matters and the like floating in the air from entering between the optical elements and the optical waveguides. In addition, since the optical paths of optical signal are constituted by the air, there is no possibility that the sealing resin layer hampers the optical signal transmission, thus further widening the option of a material for the sealing resin layer.

Moreover, in the substrate for mounting an IC chip that constitutes the device for optical communication according to the third group of the present invention, the IC chip, the other electronic components and the like may be mounted within the area for mounting an optical element.

In addition, in the device for optical communication according to the first aspect of the third group of the present invention, the number of substrates for mounting IC chips connected to the multilayered printed circuit board is not limited to one but may be two or more.

The device for optical communication according to the first aspect of the third group of the present invention can be manufactured by, for example, a manufacturing method of a device for optical communication according to the second aspect of the third group of the present invention to be described later.

Next, the manufacturing method of the device for optical communication according to the second aspect of the third group of the present invention will be described.

In the manufacturing method of the device for optical communication according to the second aspect of the third group of the present invention, after separately manufacturing: a substrate for mounting an IC chip having at least an area for mounting an optical element in which an optical element is mounted and a resin filled layer for an optical path is formed; and a multilayered printed circuit board at which at least an optical waveguide is formed, the substrate for mounting an IC chip and the multilayered printed circuit board are disposed at and fixed to such respective positions as to be able to transmit optical signal between the optical element of the substrate for mounting an IC chip and the optical waveguide of the multilayered printed circuit board, and further, a resin composition for sealing is made to flow between the substrate for mounting an IC chip and the multilayered printed circuit board and a curing treatment is conducted, thereby forming a sealing resin layer.

In the manufacturing method of the device for optical communication according to the second aspect of the third group of the present invention, after disposing and fixing the substrate for mounting an IC chip and the multilayered printed circuit board at and to the respective predetermined positions, the sealing resin layer is formed between them. Therefore, dust, foreign matters and the like floating in the air do not enter between the optical element and the optical waveguide, and it is possible to suitably manufacture the device for optical communication capable of preventing the transmission of optical signal from being hampered.

Furthermore, by forming the sealing resin layer between the substrate for mounting an IC chip and the multilayered printed circuit board, the sealing resin layer can serve to moderate the stress derived from the difference in thermal expansion coefficient between the substrate for mounting an IC chip and the multilayered printed circuit board in the device for optical communication thus obtained. In addition, by forming the sealing resin layer, the positional deviation of the optical elements and the optical waveguides becomes less likely to be formed.

Therefore, in the manufacturing method of the device for optical communication according to the second aspect of the third group of the present invention, it is possible to suitably manufacture a device for optical communication excellent in reliability.

In the manufacturing method of the device for optical communication, first, the substrate for mounting an IC chip and the multilayered printed circuit board are separately manufactured.

Therefore, a manufacturing method of the substrate for mounting an IC chip and a manufacturing method of the multilayered printed circuit board will be described separately first, and then a method of forming the sealing resin layer will be described herein.

First, the manufacturing method of the substrate for mounting an IC chip will be described.

The substrate for mounting an IC chip is manufactured by manufacturing a package substrate and a substrate for inserting an optical element separately, bonding them together and executing predetermined steps and the like. Therefore, a method of manufacturing the substrate for inserting an optical element and a method of manufacturing the package substrate will first be described separately in order of steps, and then the step of bonding them together to provide the substrate for mounting an IC chip will be described.

The package substrate can be manufactured by executing steps (A) to (C), or the like.

(A) First, conductor circuits are formed on a substrate.

Specifically, a conductor layer in a spread state is formed on the substrate by an electroless plating treatment or the like, a resist is formed on the conductor layer and then an etching treatment is conducted, whereby the conductor circuits can be formed on the substrate.

Alternatively, the conductor circuits may be formed on the substrate by forming a plating resist on the substrate and then conducting a plating treatment and peeling the plating resist.

Examples of the substrate include substrates of epoxy resin, polyester resin, polyimide resin, bismaleimide-triazine resin (BT resin), phenol resin, resins (e.g., glass epoxy resin) obtained by impregnating these resins with a reinforcing agent such as glass fibers, an FR-4 substrate, an FR-5 substrate and the like.

Further, a double-sided copper-clad laminated board, a single-sided copper-clad laminated board, an RCC substrate or the like may be used as the substrate on which the conductor layer in a spread state is formed.

Further, a conformal substrate or a substrate formed by the additive method may be used as the substrate on which the conductor layer is formed.

In addition, a plated-through hole for connecting the conductor circuits with the substrate interposed therebetween to each other may be formed, based on necessity.

When the plated-through hole is formed, a through hole is formed in the substrate in advance by drilling, a laser treatment or the like before forming the conductor layer in a spread state, the conductor layer is also formed on the wall face of the through hole at the time of forming the conductor layer in a spread state, and then an etching treatment is conducted, whereby the conductor circuits and the plated-through hole may be formed.

Alternatively, after forming through holes in the substrate on which the conductor layer in a spread state is formed, an electroless plating treatment or the like is conducted to the wall faces of the through holes and an etching treatment is further conducted to the conductor layer, whereby the conductor circuits and the plated-through hole may be formed.

When the plated-through hole is formed, it is desirable to fill a resin filler in the plated-through hole. It is noted that the resin filler can be filled thereinto using a squeegee by putting a mask having an opening formed in a portion corresponding to the plated-through hole, on the substrate.

Further, a roughening treatment may be conducted to the surfaces of the conductor circuits (including the land surfaces of the plated-through hole). By roughening the surfaces of the conductor circuits, it is possible to improve the adhesion of the conductor circuits to a interlaminar insulating layer to be built up thereon in a later step.

Examples of the roughening treatment include a blackening (oxidizing)-reducing treatment, an etching treatment using an etchant containing a cupric complex and an organic acid salt or the like, a Cu—Ni—P needle-like alloy plating treatment and the like. This roughening treatment may be performed before filling the plated-through hole with the resin filler and roughened faces may be formed even on the wall faces of the plated-through hole. This is because the adhesion between the plated-through hole and the resin filler is improved.

Examples of the resin filler filled into the a plated-through hole include a resin composition containing epoxy resin, a curing agent and inorganic particles, and the like.

Although the epoxy resin is not limited to a specific one, it is desirable to use at least one kind selected from a group consisting of bisphenol type epoxy resin and novolak type epoxy resin.

As for the bisphenol type epoxy resin, when bisphenol A or F type resin is selected, the viscosity of the resin can be prepared without using a diluent solvent. The novolak type epoxy resin is high in strength and excellent in heat resistance and chemical resistance, not decomposed eve in a strong basic solution such as an electroless plating solution and difficult to thermally decompose.

As the bisphenol type epoxy resin, bisphenol A type epoxy resin or bisphenol F type epoxy resin is desirable. The bisphenol F type epoxy resin is more desirable because it is low in viscosity and can be used without a solvent.

Further, as the novolak type epoxy resin, at least one kind selected from phenol novolak type epoxy resin and cresol novolak type epoxy resin is desirable.

In addition, a mixture of bisphenol type epoxy resin and cresol novolak type epoxy resin may be used. In this case, the mixing ratio of the bisphenol type epoxy resin to the cresol novolak epoxy resin is desirably 1/1 to 1/100 in weight ratio.

The curing agent contained in the resin filler is not limited to a specific one but a conventionally well-known curing agent can be used. Examples of the curing agent include an imidazole type curing agent, an acid anhydrate curing agent, an amine type curing agent and the like. Among them, it is desirable to use the imidazole type curing agent, particularly 1-benzil-2-methyl imidazole, 1-cyanoethyl-2-ethyl-4-methyl imidazole or 4-methyl-2-ethyl imidazole which is liquid at 25° C.

Further, examples of the inorganic particles contained in the resin filler include aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc and, silicon compounds such as silica and zeolite, titanium compounds such as titania and the like. They may be used alone or in combination of two or more of them.

Further, the inorganic particles may be coated with a silane coupling agent or the like. This is because the adhesion between the inorganic particles and epoxy resin improves.

In addition, the lower limit of the content of the inorganic particles in the resin composition is desirably 10% by weight, more desirably 20% by weight. The upper limit of the content thereof is desirably 80% by weight, more desirably 70% by weight. Within this range, it is possible to match the thermal expansion coefficient of the resin composition to those of the substrate and the like.

The shape of the inorganic particles is not limited to a specific one and examples of the shape include a spherical shape, an elliptic shape, a friable shape, a polygonal shape and the like. Among these shapes, the spherical shape or the elliptic shape is desirable. This is because the spherical or elliptic particles can suppress the occurrence of cracks and the like derived from the shape of the particles.

The average particle diameter of the inorganic particles is desirably 0.01 to 5.0 μm.

The resin composition may contain the other thermosetting resin, thermoplastic resin and the like other than the epoxy resin and the like.

Examples of the thermosetting resin include polyimide resin, phenol resin and the like. Examples of the thermoplastic resin include fluororesin such as polytetra fluoroethylene (PTFE), 4-fluoroethylene-6-fluoropropylene copolymer (FEP) and 4-fluoroethylene-perfluoroalkoxy copolymer (PFA), polyethylene terephthalate (PET), polysulfone (PSF), polyphenyl sulfide (PPS), thermoplastic polyphenylene ether (PPE), polyether sulfone (PES), polyether imide (PEI), polyphenylene sulfone (PPS), polyethylene naphthalate (PEN), polyether ether ketone (PEEK), polyolefin based resin and the like. They may be used alone or in combination of two or more of them.

It is noted that one of these resins may be used in place of the epoxy resin.

(B) Next, an interlaminar insulating layer having via-holes is formed on the substrate on which the conductor circuits are formed and conductor circuits are formed on the interlaminar insulating layer.

Specifically, it is possible to form the interlaminar insulating layer and the conductor circuits through the following steps (i) to (vi).

(i) First, an uncured resin layer of thermosetting resin or a resin complex or a resin layer of thermoplastic resin is formed on the substrate on which the conductor circuits are formed.

The uncured resin layer may be formed by applying uncured resin by a roll coater, a curtain coater or the like or by thermally bonding an uncured (half-cured) resin film. Alternatively, the uncured resin layer may be formed by bonding a resin film having a metal layer such as copper foil formed on one side of an uncured resin film.

In addition, the resin layer of thermoplastic resin is desirably formed by thermally bonding a resin formed body formed into film shape.

When the uncured resin is applied, resin is applied and then subjected to a heat treatment. By conducting the heat treatment, uncured resin can be thermally cured.

It is noted that the curing may be conducted after forming openings for via-holes to be described later.

Specific examples of the thermosetting resin used to form such a resin layer include epoxy resin, phenol resin, polyimide resin, polyester resin, bismaleimide resin, polyolefin resin, polyphenylene ether resin and the like.

Examples of the epoxy resin include cresol novolak type epoxy resin, bisphenol A type epoxy resin, bisphenol F type epoxy resin, phenol novolak type epoxy resin, alkyl phenol novolak type epoxy resin, bi-phenol F type epoxy resin, naphthalene type epoxy resin, dicyclopentadiene type epoxy resin, epoxylated compounds of condensates of phenols and aromatic aldehydes containing a phenolic hydroxyl group, triglycidyl isocyanurate, alicyclic epoxy resin and the like. They may be used alone or in combination of two or more of them. Accordingly, excellent heat resistance can be ensured.

Examples of the polyolefin resin include polyethylene, polystyrene, polypropylene, polyisobutylene, polybutadiene, polyisoprene, cycloolefin type resin, copolymers of these resin materials and the like.

Further, examples of the thermoplastic resin include phenoxy resin, polyethersulfone, polysulfone and the like.

Further, the complexes (resin complexes) of thermosetting resin and thermoplastic resin are not particularly limited when they contain thermosetting resin and thermoplastic resin and their specific examples include resin compositions for forming roughened faces.

As the resin composition for forming a roughened face, the same as the resin composition for forming a roughened face used in the step (3) of the step (a) of the manufacturing method of the substrate for mounting an IC chip according to the second aspect of the first group of the present invention or the like can be used.

(ii) Next, at the time of forming an interlaminar insulating layer using, as a material therefor, thermosetting resin or a resin complex, an uncured resin layer is subjected to a curing treatment and openings for via-holes are formed therein, thereby providing the interlaminar insulating layer.

It is desirable that the openings for via-holes are formed by a laser treatment. The laser treatment may be conducted before or after the curing treatment.

Further, at the time of forming an interlaminar insulating layer made of photosensitive resin, openings for via-holes may be formed by conducting exposure and development treatments. In this case, the exposure and development treatments are conducted before the curing treatment.

Furthermore, at the time of forming an interlaminar insulating layer using, as a material therefor, thermoplastic resin, openings for via-holes are formed in a resin layer of thermoplastic resin by a laser treatment, thereby providing the interlaminar insulating layer.

Examples of a laser used for the laser treatment include a carbonic acid gas laser, an excimer laser, a UV laser, a YAG laser and the like. One of them may be selected based on the shape of the openings for via-holes to be shaped and the like.

When the openings for via-holes are formed, it is possible to form a number of openings for via-holes at one time by applying a laser beam to the resin layer through a mask using a hologram type excimer laser.

When the carbonic acid gas laser having a short pulse interval is used to form the openings for via-holes, resin residue in the openings is small and the resin of the peripheral edges of the opening is less damaged.

In addition, at the time of applying a laser beam through an optical system lens and a mask, it is possible to form a number of openings for via-holes at one time.

This is because a laser beam with the same intensity and the same application angle can be applied to a plurality of parts by letting the laser beam pass through the optical system lens and the mask.

(iii) Next, a roughened face is formed on the surface of the interlaminar insulating layer including the inner walls of the openings for via-holes, based on necessity, using an acid or an oxidizing agent.

It is noted that this roughened face is formed in order to improve the adhesion between the inter laminar insulating layer and a thin film conductor layer to be formed thereon. When there is sufficient adhesion between the inter laminar insulating layer and the thin film conductor layer, it is unnecessary to form the roughened surface.

Examples of the acid include a sulfuric acid, a nitric acid, a hydrochloric acid, a phosphoric acid, a formic acid and the like. Examples of the oxidizing agent include a chromic acid, a chromic sulfide, a permanganic acid such as a potassium permanganate and the like.

Further, after forming the roughened face, it is desirable to neutralize the surface of the interlaminar insulating layer using an aqueous solution such as alkaline aqueous solution, neutralizer or the like.

This is because the influence of the acid or oxidizing agent cannot be exerted on the next step.

Further, the formation of the roughened face may be performed using a plasma treatment or the like.

In addition, it is desirable that the maximum roughness Rmax of the roughened face is 0.1 to 20 µm. When Rmax exceeds 20 µm, the roughened face itself is easily damaged or peeled off. When Rmax is less than 0.1 µm, the adhesion between the interlaminar insulating layer and the conductor circuits cannot be often sufficiently attained. When conductor circuits are formed by the semi-additive method, in particular, it is desirable that the maximum roughness Rmax is 0.1 to 5 µm. With such maximum roughness, it is possible to sufficiently secure the adhesion to the thin film conductor layer and facilitate removing the thin film conductor layer.

(iv) Next, a thin film conductor layer is formed on the surface of the interlaminar insulating film having the openings for via-holes formed therein.

The thin film conductor layer is formed by electroless plating, sputtering, vapor deposition or the like. When the roughened face is not formed on the surface of the interlaminar insulating layer, the thin film conductor layer is desirably formed by sputtering.

When the thin film conductor layer is formed by electroless plating, a catalyst is attached to the plating target surface in advance. Examples of the catalyst include palladium chloride and the like.

The thickness of the thin film conductor layer is not limited to a specific one. However, when the thin film conductor layer is formed by electroless plating, the thickness thereof is desirably 0.6 to 1.2 µm. When the thin film conductor layer is formed by sputtering, the thickness thereof is desirably 0.1 to 1.0 µm.

Further, examples of a material for the thin film conductor layer include Cu, Ni, P, Pd, Co., W and the like. Among them, it is desirable to use Cu or Ni.

(v) Next, a plating resist is formed on a part of the thin film conductor layer using a dry film and electroplating is then performed using the thin film conductor layer as a plating lead, thereby forming an electroplating layer in non plating resist formed areas.

In this step, the openings for via-holes may be formed to have a filled-via structure by filling the opening for a via-hole with an electroplated member. Namely, a via-hole having a hollow in the upper face thereof is temporarily formed and conductor containing paste is filled into this hollow to thereby provide the filled-via structure. Alternatively, the via-hole may be made a via-hole having a flat upper face by forming a via-hole having a hollow in the upper face thereof, filling a resin filler or the like into the hollow and further forming a cover plating layer on the via-hole. By making the via-hole having a filled-via structure, it is possible to form a via-hole immediately on the via-hole.

(vi) Moreover, the plating resist is peeled off and the thin film conductor layer present under the plating resist is removed by etching, thus providing independent conductor circuits. Examples of etchant include an aqueous solution containing a sulfuric acid and peroxide, an aqueous solution containing persulfuric acid such as ammonium persulfate, ferric chloride, cupric chloride, hydrochloric acid and the like. Alternatively, a solution mixture containing the cupric complex and an organic acid may be used as the etchant.

While the conductor circuit formation method described herein is based on the additive method, the conductor circuit formation method in the manufacturing method according to the present invention is not limited to that based on the additive method but may be based on the subtractive method.

A method of forming the conductor circuits based on the subtractive method will be briefly described hereinafter.

First, after an interlaminar insulating layer including openings for via-holes are formed similarly to the steps (i) to (iii), a thin film conductor layer is formed on the surface of the interlaminar insulating layer including the wall faces of the openings for via-holes.

Next, an electroplating layer or the like is formed on the entire surface of the thin film conductor layer, thereby increasing the thickness of the conductor layer. It is noted that the formation of the electroplating layer or the like may be carried out, based on necessity.

Next, an etching resist is formed on the conductor layer.

The etching resist is formed by bonding a photosensitive dry film, closely disposing a photomask on the photosensitive dry film and conducting exposure and development treatments and the like.

Furthermore, the conductor layer under non etching resist formed areas is removed by an etching treatment and the etching resist is then peeled off, whereby independent conductor circuits (including via-holes) are formed on the interlaminar insulating layer.

The etching treatment can be carried out using an etchant containing a solution mixture of a sulfuric acid and peroxide, sodium persulfate, ammonium persulfate, ferric chloride, cupric chloride or the like and the peeling of the etching resist can be carried out using an aqueous alkaline solution.

By using such a method, it is possible to form the interlaminar insulating layer including via-holes and form the conductor circuits on the interlaminar insulating layer. In the substrate for mounting an IC chip according to the present invention, only one interlaminar insulating layer is formed. However, depending on the substrate for mounting an IC chip to be manufactured, two or more interlaminar insulating layers may be built up by repeatedly executing this step (B) a plurality of number of times.

Whether to select the additive method or the subtractive method of the conductor circuit formation method may be appropriately determined based on the width and distance of the conductor circuits, the number of connection terminals, the pitch and the like for the IC chip and the optical elements to be mounted on the substrate and other various electronic components.

(C) Next, a solder resist layer is formed on the outermost layer.

Specifically, the solder resist layer is formed by applying an uncured solder resist composition using a roll coater, a curtain coater or the like or pressure-bonding a solder resist composition formed into film shape and conducting a curing treatment to the resultant solder resist composition.

Examples of the solder resist composition include the same solder resist composition as that used in the step (1) of the step (c) of the manufacturing method of the substrate for mounting an IC chip according to the second aspect of the first group of the present invention.

Furthermore, elastomer or inorganic filler may be mixed into the solder resist composition.

Further, openings are formed in the solder resist layer, based on necessity, by a laser treatment or exposure and development treatments. Examples of a laser used here in include the same laser as that used to form the openings for via-holes and the like.

Next, a metal layer is formed on the surface of each conductor circuit exposed to the bottom of the openings, based on necessity. It is noted that the metal layer formed in the opening in this step often serves as a solder pad when the solder resist layer including the openings constitutes the outermost layer of the substrate for mounting an IC chip.

The metal layer can be formed by covering the surface of the conductor circuit with corrosion resistant metal such as nickel, palladium, gold, silver and platinum.

Specifically, it is desirable to form the metal layer using such metal as nickel-gold, nickel-silver, nickel-palladium, nickel-palladium-gold and the like.

Further, the solder pad can be formed by using such a method as plating, vapor deposition or electrode position. Among these methods, it is desirable to use the plating method from a viewpoint that the covering layer is excellent in evenness.

In addition, an alignment mark or the like used at the time of bonding the optical elements to the insertion substrate in a step to be described later may be formed on the solder resist layer formed in this step.

Through these steps (A) to (C), it is possible to manufacture the package substrate.

Next, the manufacturing method of the substrate for inserting an optical element will be described.

The substrate for inserting an optical element can be manufactured by executing the following steps (a) to (c).

(a) First, conductor circuits are formed on the both faces or one face of a substrate by an electroless plating treatment or the like.

Specifically, a conductor layer in a spread state is formed on the substrate by an electroless plating treatment or the like, a resist is formed on the conductor layer and then an etching treatment is conducted, whereby the conductor circuits can be formed on the substrate.

Alternatively, the conductor circuits may be formed on the substrate by forming a plating resist on the substrate and then conducting a plating treatment and peeling the plating resist.

Further, in this step, a plated-through hole for connecting the conductor circuits with the substrate interposed therebetween to each other may be formed.

The plated-through hole may be formed as follows. Through holes are formed in advance by drilling, a laser treatment or the like before forming the conductor layer in a spread state by the electroless plating treatment or the like, the conductor layer is also formed on the wall faces of the through holes at the time of forming the conductor layer in a spread state, and an etching treatment is then conducted, whereby the conductor circuits and the plated-through hole is formed.

Alternatively, after forming through holes in the substrate on which the conductor layer in a spread state is formed, an electroless plating treatment or the like is conducted to the wall faces of the through holes and an etching treatment is further conducted to the conductor layer, whereby the conductor circuits and the plated-through hole are formed.

Alternatively, after forming the through holes in the substrate, a plating resist is formed on a part of the surface of the substrate, a conductor layer is formed on the wall faces of the through holes and formed in non plating resist formed areas, and the plating resist is peeled off, whereby the conductor circuits and the plated-through hole are formed.

When the through hole is formed by one of these methods, it is desirable to conduct a desmear treatment to the through holes after forming the through hole and before forming the conductor layer. Examples of the desmear treatment include a chemical treatment using an oxidizing agent such as a permanganic acid or a chromic acid, a dry treatment using plasma and the like.

Examples of the substrate used herein include the same substrate as that used at the time of manufacturing the package substrate and the like.

Furthermore, when the plated-through hole is also formed in the step of manufacturing this substrate for inserting an optical element, it is desirable to fill a resin filler in the plated-through hole and form a resin filler layer. It is noted that the resin filler can be filled thereinto using a squeegee by putting a mask having openings formed in portions corresponding to the through holes on the substrate.

It is also desirable to form a roughened face on the wall face of the plated-through hole before filling the resin filler into the plated-through hole in this step. This is because it is possible to further improve the adhesion with the resin filler layer.

Examples of the resin filler include the same resin filler as that used at the time of manufacturing the package substrate and the like.

In this conductor circuit formation step, after forming the resin filler layer in the plated-through hole, a cover plating layer may be formed to cover the exposed face of the resin filler layer from the plated-through hole. By forming the cover plating layer, it is possible to form solder pads not only on the lands of the plated-through hole but also on the cover plating layer and thereby further improving the degree of freedom for the design.

The cover plating layer can be formed by forming a conductor layer on the surface of the substrate including the exposed face of the resin filler layer, forming an etching resist in a cover plating layer formation area, conducting an etching treatment or the like to form a plating resist in non cover plating layer formed areas in advance, and conducting a plating treatment and removing the plating resist.

In this step, therefore, when the cover plating layer is formed on the plated-through hole, it is possible to form the conductor circuits, the plated-through hole and the cover plating layer simultaneously by executing the treatments according to the following procedures.

Through holes are first formed in the substrate, a conductor layer is formed on the surface of the substrate including the wall faces of the through holes and a resin filler is filled in each through hole on the wall faces of which the conductor layer is formed. Further, after a conductor layer is built up on the exposed face of the resin filler and the conductor layer formed on the surface of the substrate by a plating treatment or the like, the conductor layer in non conductor circuit formed areas and non plated-through hole formed areas is etched away, whereby it is possible to form the conductor circuits, the plated-through hole and the cover plating layer simultaneously.

(b) Next, an adhesive layer is formed on at least a part of the non conductor circuit formed areas on the substrate on which the conductor circuits are formed. In this specification, it is assumed that the land parts of the plated-through hole are included in the conductor circuits. Accordingly, the land parts of the plated-through hole do not correspond to the non conductor circuit formed areas.

In this step, the adhesive layer is formed on all of or a part of the non conductor circuit formed areas on the side on which the substrate for inserting an optical element is bonded to the package substrate in a later step. The adhesive layer may be applied thereto so as to be able to attain sufficient bonding property for bonding the substrate for inserting an optical element to the package substrate. Therefore, the adhesive layer may be formed or may not be formed in portions in which through holes are formed in a step (c) to be described later.

Examples of the adhesive include those composed of thermosetting resin, thermoplastic resin, photosensitive resin, resin obtained by partially photosensitizing a thermosetting group, complexes thereof and the like.

Specific examples of the adhesive include epoxy resin, phenol resin, polyimide resin, BT resin and the like. Alternatively, adhesive formed into sheet shape may be used or prepreg may be used.

(c) Next, a through hole is formed in a part of the substrate on which the adhesive layer is formed. In the through hole formed in this step, an optical element is disposed in a later step.

The through hole can be formed by router processing or the like.

Further, the position at which the through hole is formed is not limited to specific one. Normally, the through hole is formed at the center of the substrate.

In addition, in this step, after forming the through hole, a chemical treatment, a grinding treatment or the like may be conducted so as to remove burrs and the like present on the wall face of the through hole.

The chemical treatment can be performed using an oxidizing agent composed of an aqueous solution of a chromic acid, a permanganic acid or the like.

Through these steps (a) to (c), it is possible to manufacture the substrate for inserting an optical element.

Next, a method of bonding the package substrate manufactured in the steps (A) to (C) and the substrate for inserting an optical element manufactured in the steps (a) to (c) together through the adhesive layer included in the substrate for inserting an optical element, thereby obtaining the substrate for mounting an IC chip, will be described.

The bonding of the package substrate and the substrate for inserting an optical element can be performed using a pin-laminate method, a mass-laminate method or the like.

Specifically, after aligning the both substrates, the temperature is raised to a temperature at which the adhesive layer is softened (normally about 60 to 200° C.) and the both substrates are pressed at a pressure of about 1 to 10 MPa, thereby bonding the package substrate to the substrate for inserting an optical element. Thereafter, through the following steps (1) to (3), the substrate for mounting an IC chip is obtained.

(1) First, after attaching optical elements on the surface of the package substrate exposed from the through hole formed in the substrate for inserting an optical element, the optical elements are electrically connected to the conductor circuits on the package substrate.

Methods for the attachment and electric connection of the optical elements may be appropriately selected according to the optical elements.

Now, a case of using wire-bonding type optical elements and a case of using flip-chip type optical elements will be specifically described.

When the wire-bonding type optical elements are used, the attachment of the optical elements can be performed by an eutectic coupling method, a solder coupling method, a resin coupling method or the like. Alternatively, the optical elements may be attached using silver paste or gold paste.

In the resin coupling method, thermosetting resin such as epoxy resin or polyimide resin is used as a main agent, paste containing a curing agent, a filler, a solvent and the like besides the resin component is applied onto the package substrate, the optical elements are then put on the paste and the paste is thermally cured, thereby attaching the optical elements to the surface of the package substrate.

It is noted that the application of the paste can be performed by a dispense method, a stamping method, a screen printing method or the like.

When the silver paste is used, then the silver paste is applied onto the package substrate, the optical elements are put on the paste and this silver paste is fired, thereby attaching the optical elements.

To electrically connect the optical elements to the metal layer of the package substrate, wire-bonding is utilized. The connection of the optical elements by the wire-bonding ensures a large degree of freedom for design of attachment and advantageous inexpensiveness.

As the wire-bonding, a conventionally well-known method, i.e., a nail head bonding method or a wedge bonding method can be utilized.

When the flip-chip type optical elements are used, the attachment and electrical connection of the optical elements can be performed simultaneously. As for the flip-chip bonding method, a conventionally well-known method can be utilized.

In addition, when the flip-chip type optical elements are used as the optical elements, it is desirable to seal the clearances between the optical elements and the package substrate with resin.

The resin sealing may be performed by filling a resin composition into the clearances between the optical elements and the package substrate at the time of forming the resin filled layer for an optical path in a later step and they conducting a curing treatment to the resin composition. Needless to say, the resin sealing may be performed separately from the step of forming the resin filled layer for an optical path.

The method of the electric connection of the optical elements is not limited to the wire-bonding or flip-chip bonding but may be tape-bonding method or the like.

(2) Next, a resin composition is filled into the through hole formed in the substrate for inserting an optical element, thereby forming the resin filled layer for an optical path.

A method of filling the resin composition is not limited to a specific one but may be printing method, potting method or the like. Alternatively, a resin composition formed into tablet shape may be filled into the through hole using a plunger or the like. After filling the resin composition, a curing treatment or the like is conducted, based on necessity.

In addition, when the resin filled layer for an optical path is constituted by two or more layer, i.e., an inner resin filled layer for an optical path and an outer resin filled layer for an optical path, the resin composition is filled into the through hole twice in this step.

Furthermore, when a curing treatment is conducted to the filled resin composition in the step of forming the resin filled layer for an optical path, which is constituted by two or more layers, the curing treatment may be conducted once after filling the resin composition which becomes the inner resin filled layer for an optical path and may be conducted again after filling the resin composition which becomes the outer resin filled layer for an optical path. Alternatively, after filling the resin composition which becomes the inner resin filled layer for an optical path and the resin composition which becomes the outer resin filled layer for an optical path, the curing treatment may be conducted to the both layers simultaneously. Which method is to be selected may be appropriately determined according to the resin composition.

When the resin composition which becomes the inner resin filled layer for an optical path differs in curing condition from the resin composition which becomes the outer resin filled layer for an optical path, it is desirable that the resin composition which becomes the inner resin filled layer for an optical path is filled and a curing treatment is conducted thereto once and the resin composition which becomes the outer resin filled layer for an optical path is filled and a curing treatment is conducted thereto. When this method is used, the resin composition which becomes the inner resin filled layer for an optical path is not mixed with the resin composition which becomes the outer resin filled layer for an optical path on the interface therebetween.

Moreover, in this step, it is desirable that a grinding treatment is conducted to the exposed face of the resin composition exposed from the through hole so as to flatten the exposed face. By flattening the exposed face, it is possible to decrease the probability of hampering optical signal transmission.

The grinding treatment can be performed by buff grinding, grinding using grinding paper or the like, mirror grinding, clean grinding, lapping or the like. Alternatively, chemical grinding using an acid, an oxidizing agent, chemicals or the like may be performed. Further, a grinding treatment by a combination of two or more of these methods may be performed.

After forming the resin filled layer for an optical path, micro lenses are disposed on a part of the exposed face of the resin filled layer for an optical path (face confronting the multilayered printed circuit board), based on necessity.

In order to dispose the micro lenses on a part of the exposed face of the resin filled layer for an optical path, the micro lenses may be disposed at predetermined positions through a transparent adhesive layer or directly disposed at the predetermined position on the exposed face of the a part of the exposed face of the resin filled layer for an optical path.

Examples of a method of directly disposing each micro lens on the exposed face of the resin filled layer for an optical path include a method by dropping an appropriate quantity of uncured resin for an optical lens onto the resin filled layer for an optical path and conducting a curing treatment to the dropped uncured resin for an optical lens, and the like.

Further, the uncured resin for an optical lens has a viscosity of 10 to 50 cps (mP·s). When the viscosity falls within this range, the resin becomes semispherical by surface tension at the time of dropping the resin.

At the time of dropping an appropriate quantity of the uncured resin for an optical lens onto the resin filled layer for an optical path, such a device as a dispenser, an inkjet, a micro pipette or a micro syringe can be employed.

Since the uncured resin for an optical lens dropped onto the resin filled layer for an optical path using such a device is to become semispherical by the surface tension thereof, the resin becomes semispherical on the exposed face of the resin filled layer for an optical path. Thereafter, by curing the semispherical uncured resin for an optical lens, it is possible to dispose a semispherical micro lens (convex lens) on the resin filled layer for an optical path.

The diameter of the micro lens formed by the method, the shape of the curved face of the micro lens and the like can be controlled by appropriately adjusting the viscosity and the like of the uncured resin for an optical lens while considering the wettability between the resin filled layer for an optical path and the uncured resin for an optical lens and the like.

Further, after forming the resin filled layer for an optical path, based on necessity, a plated-through hole penetrating the package substrate and the substrate for inserting an optical element may be formed.

Specifically, a through hole for a plated-through hole penetrating the package substrate and the substrate for inserting an optical element is formed by drilling, a laser treatment or the like and then a thin film conductor layer is formed on the exposed face of the package substrate and that of the substrate for inserting an optical element including the wall face of the through hole for a plated-through hole by electroless plating, sputtering or the like. Further, a plating resist is formed on the substrate on the surface of which the thin film conductor layer is formed, an electroplating layer is formed in non plating resist formed areas and then the plating resist and the thin film conductor layer under the plating resist are removed, thereby forming the plated-through hole penetrating the package substrate and the substrate for inserting an optical element.

Examples of a material for the thin film conductor layer include copper, nickel, tin, zinc, cobalt, thallium, lead and the like.

Among them, it is desirable to use the thin film conductor layer made of copper or copper and nickel because of its or their excellent electric characteristic, inexpensiveness and the like.

Further, when the thin film conductor layer is formed by electroless plating, the thickness thereof is desirably 0.6 to 1.2 μm. When the thin film conductor layer is formed by sputtering, the thickness thereof is desirably 0.1 to 1.0 μm.

A copper plated layer is desirable as the electroplating layer and the thickness of the layer is desirably 5 to 20 µm.

In addition, the plating resist may be removed by an aqueous alkaline solution or the like. The thin film conductor layer may be removed using a solution mixture of a sulfuric acid and peroxide, etchant containing sodium persulfate, ammonium persulfate, ferric chloride, cupric chloride or the like.

Furthermore, after forming the conductor circuits, the catalyst on the interlaminar insulating layer may be removed by an acid or an oxidizing agent, based on necessity. By removing the catalyst, it is possible to prevent the deterioration of electric characteristic.

In addition, after forming the plated-through hole, it is desirable to form a resin filler layer by filling a resin composition into the plated-through hole and then conducting a curing treatment to the resin composition, based on necessity. As the resin composition, the same resin composition as that used to be filled into the plated-through hole in the manufacturing of the package substrate or the like can be used.

Moreover, when the resin filler layer is formed in the plated-through hole, a cover plating layer which covers the surface layer part of the resin filler layer may be formed, based on necessity by electroless plating or the like. When the cover plating layer is formed, solder pads can be formed not only on the lands of the through holes but also on the cover plating layer, thus further improving the degree of freedom for design.

In addition, after forming the plating resist as mentioned above, the plated-through hole penetrating the substrate for inserting an optical element and the package substrate may be formed using a method of forming a electroplating layer on the entire face of the thin film conductor layer, forming an etching resist and a solder plated layer on the electroplating layer and then conducting an etching treatment in place of the method of forming the electroplating layer.

It is noted that the formation of the plated-through hole described herein is not always performed after mounting the optical elements, forming the resin filled layer for an optical path and disposing the micro lenses. The plated-through hole may be formed before mounting the optical elements, before forming the resin filled layer for an optical path or before disposing the micro lenses.

(3) Next, a solder resist layer is formed on the exposed face of the package substrate and that of the substrate for inserting an optical element.

Specifically, the solder resist layer is formed by applying an uncured solder resist composition using a roll coater, a curtain coater or the like or pressure-bonding a solder resist composition formed into film shape and then conducting a curing treatment to the composition.

As the solder resist composition, the same solder resist composition as that used at the time of manufacturing the package substrate or the like can be used.

In this step, it is unnecessary to form the solder resist layer on the resin filled layer for an optical path formed in the step (2).

Furthermore, when the plated-through hole penetrating the package substrate and the substrate for inserting an optical element are not formed in the step (2), it is unnecessary to form the solder resist layer on the exposed face of the package substrate in this step. This is because the solder resist layer is already formed entirely on the exposed face of the package substrate before executing this step.

In addition, openings for forming solder bumps (openings for mounting IC chips and openings for connecting the substrate for mounting an IC chip to the multilayered printed circuit board) are formed in the solder resist layer by a laser treatment or exposure and development treatments, based on necessity. Examples of a laser used for the treatment at this time include the same laser as that used at the time of forming the openings for via-holes and the like.

The formation of the solder resist layer described herein is not necessarily performed after mounting the optical elements (the step (1)), forming the resin filled layer for an optical path and disposing the micro lenses (the step (2)) but may be performed before mounting the optical elements, before forming the resin filled layer for an optical path or before disposing the micro lenses.

As mentioned above, when the plated-through hole penetrating the package substrate and the substrate for inserting an optical element is formed, the solder resist layer is formed after forming the plated-through hole.

Next, a metal layer is formed on the surface of each conductor circuit exposed to the bottom of the openings, based on necessity.

The metal layer can be formed by covering the surface of the conductor circuit with corrosion resistant metal such as nickel, palladium, gold, silver and platinum.

Specifically, it is desirable to form the metal layer using such metal as nickel-gold, nickel-silver, nickel-palladium, nickel-palladium-gold and the like.

Further, the metal layer can be formed by using such a method as plating, vapor deposition or electrodeposition. Among these methods, it is desirable to use the plating method from a viewpoint that the covering layer is excellent in evenness. It is noted that this metal layer serves as a solder pad at the time of forming solder bumps or the like in a later step.

Furthermore, after filling solder paste into the solder pad through a mask having opening parts formed in portions corresponding to openings for mounting the IC chip (openings for mounting an IC chip) and openings for connecting the substrate for mounting an IC chip to the multilayered printed circuit board (openings for connecting multilayered printed circuit boards), reflow is conducted to form the solder bumps, based on necessity.

By forming such solder bumps, it is possible to mount the IC chip through the solder bumps and connect the multilayered printed circuit board to the substrate for mounting an IC chip.

The solder bumps may be formed, based on necessity. Even when no solder bumps are formed, it is possible to electrically connect the IC chip and the multilayered printed circuit board to be mounted to the substrate for mounting an IC chip through the bumps of the IC chip and the multilayered printed circuit board.

Through these steps, it is possible to manufacture the substrate for mounting an IC chip that constitutes the device for optical communication according to the first aspect of the third group of the present invention.

Next, the manufacturing method of the multilayered printed circuit board will be described.

(1) First, similarly to the step (A) of manufacturing the package substrate, conductor circuits are formed on both faces of a substrate and a plated-through hole connecting the conductor circuits with the substrate interposed therebetween are formed. In addition, roughened faces are formed on the surfaces of the conductor circuits and wall face of the plated-through hole, based on necessity in this step.

(2) Next, similarly to the step (B) of the manufacturing the package substrate, an interlaminar insulating layer and conductor circuits are built up on the surface on which the conductor circuits are formed in an alternate fashion and in repetition, based on necessity.

This step (2), i.e., the step of building up the interlaminar insulating layer and the conductor circuits may be executed only once or a plurality of number of times.

(3) Next, optical waveguides are formed in non conductor formed areas on the substrate on the side confronting the substrate for mounting an IC chip or on the interlaminar insulating layer.

The optical waveguides can be formed by the same method as that used in the step (3) of the manufacturing method of the multilayered printed circuit board according to the second aspect of the second group of the present invention, or the like.

Furthermore, similarly to the manufacturing method according to the second aspect of the second group of the present invention, an optical conversion mirror is formed on the optical waveguides. Alternatively, an optical path conversion member may be embedded into the optical waveguides instead of forming the optical path conversion mirror.

In this manufacturing method of the multilayered printed circuit board, similarly to the manufacturing method according to the second aspect of the second group of the present invention, the optical waveguides are often formed between the substrate and the interlaminar insulating layer or between the interlaminar insulating layers.

Furthermore, even when the optical waveguides are formed between the substrate and the interlaminar insulating layer or between the interlaminar insulating layers, it is possible to use the same method as that used in the step (3) of the manufacturing method of the multilayered printed circuit board according to the second aspect of the second group of the present invention, or the like.

Further, in the multilayered printed circuit board that constitutes the device for optical communication according to the first aspect of the third group of the present invention, the optical waveguides may be formed on the opposite side of the multilayered printed circuit board to the side confronting the substrate for mounting an IC chip across the substrate. When the multilayered printed circuit board having the optical waveguides formed at such positions is to be manufactured, it is necessary to form optical paths for transmitting optical signal penetrating at least the substrate so as to be able to transmit optical signal between the optical waveguides and the optical elements mounted on the substrate for mounting an IC chip. Such optical paths for transmitting optical signal may be appropriately formed either before forming the optical waveguides or after forming the optical waveguides.

Specifically, after forming the multilayered circuit board through the steps (1) and (2), the through holes for optical paths penetrating the multilayered circuit board are formed before forming the optical waveguides. Thereafter, the optical waveguides are formed by the method at such positions as to be able to transmit optical signal between the multilayered printed circuit board and the optical waveguides through the through holes for optical paths, and the multilayered printed circuit board is obtained through steps to be described later. After forming the through holes for optical paths, a resin layer for an optical path or a conductor layer may be formed on the interior or the wall face thereof, based on necessity.

(4) Next, a solder resist composition layer is formed on the outermost layer of the substrate on which the optical waveguides are formed.

The solder resist composition layer can be formed using the same resin composition as that used at the time of forming the solder resist layer of a substrate for mounting an IC chip according to the second aspect of the third group of the present invention.

In some cases, the optical waveguides may be formed entirely on the outermost layer of the substrate so as to serve as the solder resist layer in the step (3).

(5) Next, openings for forming solder bumps (openings for mounting the substrate for mounting an IC chip and various surface mount electronic components) and openings for optical paths are formed in the solder resist layer on the side confronting the substrate for mounting an IC chip.

The openings for forming solder bumps and openings for optical paths can be formed by the same method as the method of forming the openings for forming solder bumps in the substrate for mounting an IC chip, i.e., using exposure and development treatments, a laser treatment or the like.

It is noted that the formation of the openings for forming solder bumps and that of the openings for optical paths may be performed simultaneously or may be performed separately.

Among these methods, it is desirable to select the method of forming the openings for forming solder bumps and the openings for optical paths by applying a resin composition containing photosensitive resin as a material therefor and conducting exposure and development treatments.

When the openings for optical paths are formed by the exposure and development treatments, there is no possibility of damaging the optical waveguides present under the respective openings for optical paths at the time of forming the openings.

Alternatively, the solder resist layer having openings for forming solder bumps and openings for optical paths may be formed by manufacturing a resin film having openings a desired positions in advance and bonding it thereon at the time of forming the solder resist layer.

When the through holes for optical paths are formed and the optical waveguides are formed on the opposite side to the side confronting the substrate for mounting an IC chip across the substrate, the openings for optical paths are formed to communicate with the through holes for optical paths at the time of forming the through holes for optical paths in this step.

Further, openings for forming solder bumps may be formed in the solder resist layer on the opposite side to the face of the multilayered printed circuit board confronting the substrate for mounting an IC chip, based on necessity.

This is because external connection terminal scan be formed even on the solder resist layer on the opposite side to the face confronting the substrate for mounting an IC chip through a later step.

(6) Next, conductor circuit portions exposed by forming the openings for forming solder bumps are covered with corrosion resistant metal such as nickel, palladium, gold, silver or platinum to provide solder pads, based on necessity. Specifically, the same method as that used in the step (c) of the package substrate manufacturing method may be used.

(7) Next, an uncured resin composition is filled into the openings for optical paths formed in the step (5) and a curing treatment is then conducted to the resin composition to thereby form a resin layer for an optical path, based on necessity.

The uncured resin composition filled in this step is desirably the same as that used to form the resin filled layer for an optical path in the manufacturing process for the substrate for mounting an IC chip, particularly the resin composition used to form the upper resin filled layer for an optical path.

Further, as mentioned above, when the through holes for optical paths and the openings for optical paths are formed so as to form the optical waveguides on the opposite side to the side confronting the substrate for mounting an IC chip across the substrate, an uncured resin composition may be filled into the through holes for optical paths and the openings for optical paths. In the case of filling the uncured resin composition, the following method can be used. The uncured resin composition is filled into the through holes for optical paths and the openings for optical paths simultaneously and a curing treatment is then conducted to the resin composition. Alternatively, after forming the through holes for optical paths in the multilayered circuit board, the uncured resin composition is filled and cured, the solder resist layer including the opening for an optical path is formed and then the uncured resin composition is filled and cured.

(8) Next, after filling solder paste into the solder pads through a mask having opening parts formed in portions corresponding to the solder pads, reflow is conducted to form solder bumps.

By forming such solder bumps, it is possible to mount the substrate for mounting an IC chip and various surface mount electronic components through the solder bumps. The solder bumps may be formed, based on necessity. Even when no solder bumps are formed, it is possible to mount the substrate for mounting an IC chip and various surface mount electronic components through the solder bumps of the substrate for mounting an IC chip and various surface mount electronic components through the solder bumps.

Moreover, on the solder resist layer on the opposite side to the side confronting the substrate for mounting an IC chip, external connection terminals are not always formed. By disposing pins or forming solder balls, a PGA or a BGA may be provided, based on necessity.

Through these steps, it is possible to manufacture the multilayered printed circuit board that constitutes the device for optical communication according to the first aspect of the third group of the present invention.

In the manufacturing method of the device for optical communication according to the second aspect of the third group of the present invention, next, the substrate for mounting an IC chip and the multilayered printed circuit board are disposed at and fixed to positions so as to be able to transmit optical signal between the optical elements of the substrate for mounting an IC chip and the optical waveguides of the multilayered printed circuit board through the resin filled layer for an optical path, respectively.

Herein, the substrate for mounting an IC chip and the multilayered printed circuit board are disposed to be confronting each other, solder connection parts are formed by the solder bumps of the substrate for mounting an IC chip and the solder bumps of the multilayered printed circuit board, the substrate for mounting an IC chip and the multilayered printed circuit board are electrically connected to each other and fixed relative to each other. Namely, by disposing the substrate for mounting an IC chip and the multilayered printed circuit board at predetermined positions in predetermined directions, respectively, so as to be confronting each other and conducting reflow, the substrate for mounting an IC chip and the multilayered printed circuit board are connected to each other.

As described above, the solder bumps for fixing both the substrate for mounting an IC chip and the multilayered printed circuit board may be formed only on one of them.

In this step, the substrate for mounting an IC chip and the multilayered printed circuit board are connected to each other using their own solder bumps. Therefore, even when there is slight positional deviation between the substrate for mounting an IC chip and the multilayered printed circuit board at the time of disposing them to be confronting each other, it is possible to dispose them at their respective predetermined positions by the self-alignment effect of the solders during reflow.

Next, a resin composition for sealing is made to flow between the substrate for mounting an IC chip and the multilayered printed circuit board and a curing treatment is conducted to the resin composition for sealing, thereby forming a sealing resin layer. The resin composition for sealing may be caused to infiltrate between the substrate for mounting an IC chip and the multilayered printed circuit board by applying the resin composition for sealing around the substrate for mounting an IC chip using a dispenser or the like and leaving the resin composition for sealing as it is. Alternatively, the resin composition for sealing may be applied using a syringe.

Examples of the resin composition for sealing include the same resin composition for sealing as that use in the manufacturing method of the device for optical communication according to the second aspect of the second group of the present invention and the like.

The viscosity of the resin composition for sealing made to flow between the substrate for mounting an IC chip and the multilayered printed circuit board and conditions for the curing treatment after causing the resin composition for sealing to flow therebetween may be appropriately selected based on the composition of the resin composition for sealing, the design of the substrate for mounting an IC chip and the multilayered printed circuit board and the like. Specifically, the viscosity of the resin composition, for example, is desirably 20 to 100 cps (mP·s).

Next, an IC chip is mounted on the substrate for mounting an IC chip and, thereafter, the IC chip is sealed with resin, based on necessity, thereby providing a device for optical communication.

The mounting of the IC chip can be performed by a conventionally well-known method.

Alternatively, the device for optical communication may be obtained by mounting the IC chip before connecting the substrate for mounting an IC chip to the multilayered printed circuit board and then connecting the substrate for mounting an IC chip on which the IC chip is mounted to the multilayered printed circuit board.

Next, the fourth group of the present invention will be described.

A device for optical communication according to the first aspect of the fourth group of the present invention will first be described. The device for optical communication according to the first aspect of the fourth group of the present invention is a device for optical communication comprising: a substrate for mounting an IC chip at which an optical path for transmitting optical signal is formed, and on one face of said substrate an optical element is mounted; and a multilayered printed circuit board at which at least an optical waveguide is formed, said device for optical communication is constituted such that optical signal can be transmitted between the optical waveguide and the optical element through the optical path for transmitting optical signal.

Since the device for optical communication according to the first aspect of the fourth group of the present invention comprises the substrate for mounting an IC chip on which the optical elements are mounted at predetermined positions, respectively, and the multilayered printed circuit board on which the optical waveguides are formed at predetermined positions, respectively, the connection loss between the mounted optical elements is low and excellent connection reliability is ensured for the device for optical communication.

Further, in the device for optical communication, since electronic components and optical elements necessary for optical communication can be provided integrally, it is possible to contribute to making a terminal device for optical communication small in size.

In addition, it is desirable that a sealing resin layer is formed between the substrate for mounting an IC chip and the multilayered printed circuit board in the device for optical communication according to the first aspect of the fourth group of the present invention. When the sealing resin layer is formed, dust, foreign matters and the like floating in the air do not enter between the optical element and the optical waveguide and it is possible to prevent the transmission of optical signal from being hampered by the dust, the foreign matters and the like. Therefore, the device for optical communication has more excellent reliability.

Furthermore, when the sealing resin layer is formed, the sealing resin layer can serve to moderate the stress derived from the difference in thermal expansion coefficient between the substrate for mounting an IC chip and the multilayered printed circuit board. Therefore, it is possible to prevent disconnection and the like in the vicinity of solder bumps connecting the substrate for mounting an IC chip to the multilayered printed circuit board. Besides, when the sealing resin layer is formed, the positional deviation between the optical elements and the optical waveguides is less likely to occur and thus, the transmission of optical signal between the optical elements and the optical waveguides is not hampered.

Therefore, the device for optical communication is more excellent in reliability in these respects in the case where the sealing resin layer is formed between the substrate for mounting an IC chip and the multilayered printed circuit board.

Moreover, in the device for optical communication according to the first aspect of the fourth group of the present invention, it is desirable that the substrate for mounting an IC chip and the multilayered printed circuit board are electrically connected to each other through solder bumps. This is because the self-alignment function of solders enables to further surely dispose both at predetermined positions.

In case of utilizing this self-alignment function, even when the positional deviation occurs between the multilayered printed circuit board and the substrate for mounting an IC chip before reflow at the time of connecting the substrate for mounting an IC chip onto the multilayered printed circuit board through the solder bumps, the substrate for mounting an IC chip moves during the reflow and can be attached to an accurate position on the multilayered printed circuit board.

Therefore, it is possible to manufacture a device for optical communication excellent in connection reliability by connecting the substrate for mounting an IC chip onto the multilayered printed circuit board through the solder bumps as long as such optical elements as a light receiving element, a light emitting element and optical waveguides are attached to respective positions of the substrate for mounting an IC chip and the multilayered printed circuit board accurately.

The device for optical communication according to the first aspect of the third group of the present invention will now be described with reference to the drawings.

Figure 49:
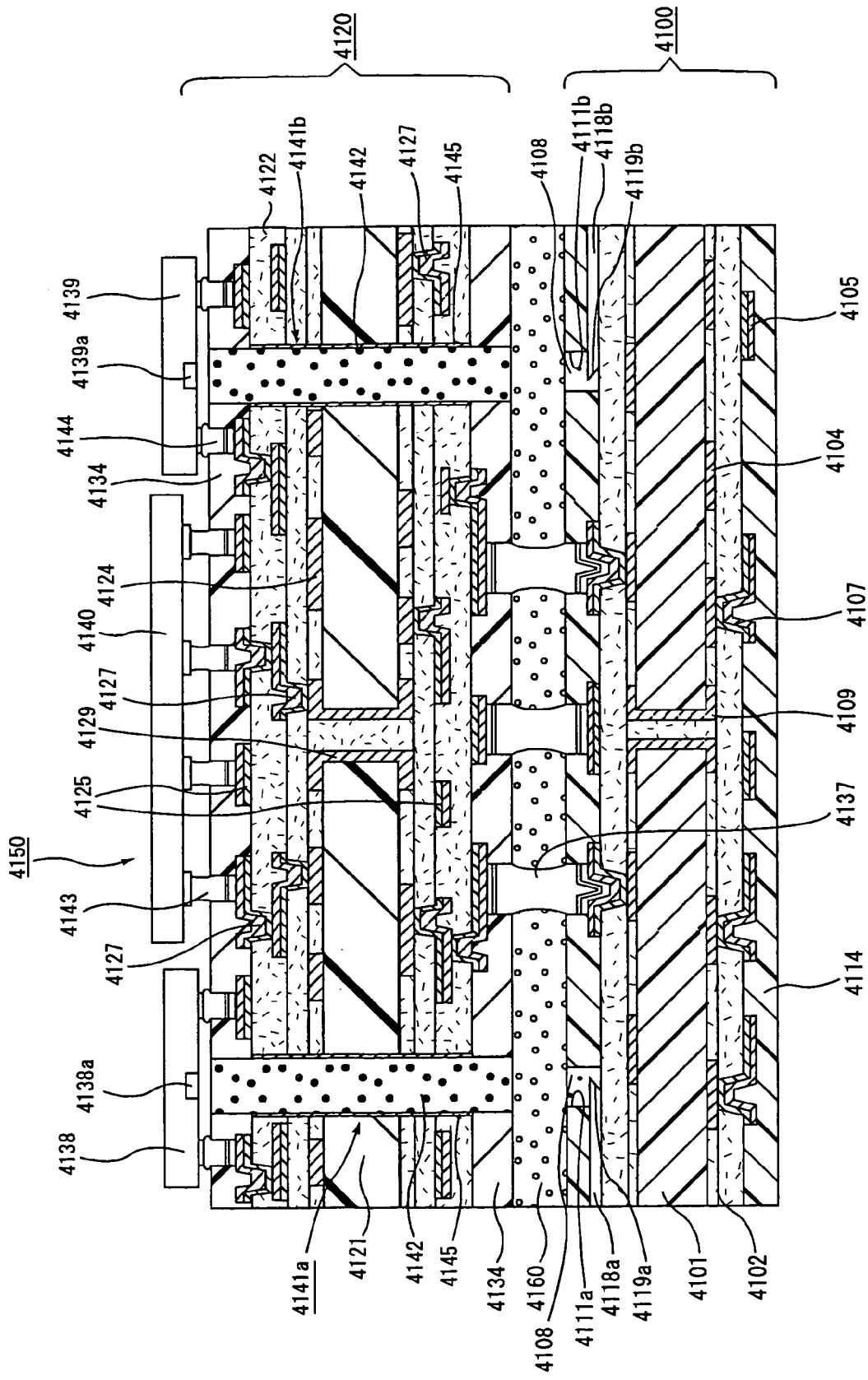
FIG. 49 is a cross-sectional view schematically showing one embodiment of a device for optical communication according to the first aspect of the fourth group of the present invention.

FIG. 49 is a cross-sectional view schematically showing one embodiment of the device for optical communication according to the first aspect of the fourth group of the present invention. It is noted that FIG. 49 shows the device for optical communication in a state where an IC chip is mounted.

As shown in FIG. 49, the device for optical communication 4150 comprises a substrate for mounting an IC chip 4120 and a multilayered printed circuit board 4100, with the substrate for mounting an IC chip 4120 electrically connected to the multilayered printed circuit board 4100 through solder connection parts 4137.

In addition, a sealing resin layer 4160 is formed between the substrate for mounting an IC chip 4120 and the multilayered printed circuit board 4100.

In the substrate for mounting an IC chip 4120, conductor circuits 4124, 4125 and interlaminar insulating layers 4122 are built up on both faces of a substrate 4121 in an alternate fashion and in repetition, the conductor circuits with the substrate 4121 interposed therebetween and the conductor circuits with the insulating layer 4122 interposed therebetween are electrically connected to one another a through plated-through hole 4129 and via-holes 4127, respectively. In addition, a solder resist layer 4134 is formed in an outermost layer.

In this substrate for mounting an IC chip 4120, optical paths for transmitting optical signal 4141 (4141*a*, 4141*b*) penetrating the substrate 4124, on both faces of which the conductor circuits 4124, 4125, the interlaminar insulating layers 4122 and a solder resist layer 4134 are formed, are formed. A conductor layer 4145 is formed on the wall face of the optical paths for transmitting optical signal 4141 and a resin layer for an optical path 4142 is formed on the interior thereof.

It is noted that the conductor layer is not always formed.

Further, on one face of the substrate for mounting an IC chip 4120, a light receiving element 4138 and a light emitting element 4139 are surface-mounted through solder connection parts 4144 so that a light receiving part 4138*a* and a light emitting part 4139*a* are confronting the optical paths for transmitting optical signal 4141, respectively, and an IC chip 4140 is surface-mounted through solder connection parts 4143.

In the multilayered printed circuit board 4100, conductor circuits 4104 and an interlaminar insulating layer 4102 are built up both faces of a substrate 4101 in an alternate fashion and in repetition, the conductor circuits with the substrate 4101 interposed therebetween and the conductor circuits with the interlaminar insulating layers 4102 interposed therebetween are electrically connected to one another a through plated-through hole 4109 and via-holes 4107, respectively.

Furthermore, a solder resist layer 4114 having openings for optical paths 4111 and solder bumps is formed and optical waveguides 4118 (4118*a*, 4118*b*) having optical path conversion mirrors 4119 (4119*a*, 4119*b*) provided immediately under the openings for optical paths (4111*a*, 4111*b*) are formed, respectively on the outermost layer of the multilayered printed circuit board 4100 on the side confronting the substrate for mounting an IC chip 4120. A resin layer for an optical path 4108 is formed on the openings for optical paths 4111.

In the device for optical communication 4150 having the above-mentioned configuration, optical signal transmitted from the outside through an optical fiber or the like (not shown) is introduced into the optical waveguide 4118*a*, transmitted to the light receiving element 4138 (light receiving part 4138*a*) through the optical path conversion mirror 4119*a*, the opening for an optical path 4111*a*, the sealing resin layer 4160 and the optical path for transmitting optical signal 4141*a*, and converted into an electric signal by the light receiving element 4138, and the resultant electric signal is transmitted to the IC chip 4140 through the conductor circuits and the solder connection parts.

Further, the electric signal sent from the IC chip 4140 is transmitted to the light emitting element 4139 through solder connection parts and the conductor circuits, and converted into optical signal by the light emitting element 4139, and the resultant optical signal is introduced into the optical waveguide 4118b from the light emitting element 4139 (light emitting part 4139a) through the optical path for transmitting optical signal 4141b, the sealing resin layer 4160, the opening for an optical path 4111b and the optical conversion mirror 4119b and transmitted to the outside through the optical fiber or the like (not shown) as optical signal.

In such a device for optical communication according to the first aspect of the fourth group of the present invention, optical/electric signal conversion is performed in the substrate for mounting an IC chip, i.e., at a position in the vicinity of the IC chip. Therefore, an electric signal transmission distance is short, and it is possible to satisfy higher rate communication and integrally provide electronic components and optical elements necessary for optical communication. It is thus possible to contribute to making a terminal device for optical communication small in size.

Furthermore, the electric signal sent from the IC chip is not only converted into optical signal, and then transmitted to the outside through the optical fiber as mentioned above, but also the electric signal is transmitted to the multilayered printed circuit board through the solder bumps and transmitted to an electronic component such as the other IC chip mounted on the multilayered printed circuit board through the conductor circuits (including the via-holes and plated-through hole) of the multilayered printed circuit board.

In addition, in the device for optical communication 4150 shown in FIG. 49, the sealing resin layer 4160 is formed between the substrate for mounting an IC chip 4120 and the multilayered printed circuit board 4100. In the device for optical communication having the sealing resin layer formed between the substrate for mounting an IC chip and the multilayered printed circuit board, dust, foreign matters and the like floating in the air do not enter between the optical element and the optical waveguide and the transmission of optical signal is not hampered by these dust, foreign matters and the like. Therefore, the device for optical communication is more excellent in reliability.

The sealing resin layer is not limited to a specific one as long as the resin layer is less absorbed in a communication wavelength band. Examples of a material for the sealing resin layer include the same material as that for the sealing resin layer formed in the device for optical communication according to the first aspect of the second group of the present invention.

It is also desirable that the sealing resin layer has a transmissivity of 70 (%/mm) or more for communication wavelength light.

When the transmissivity for the communication wavelength light is less than 70%/mm, optical signal loss is large, which often causes the deterioration of the reliability of the device for optical communication. It is more desirable that the transmissivity is 90%/mm or more.

When the sealing resin layer composed of only the above-mentioned resin composition, in particular, the transmissivity thereof is desirably 90%/mm or more. As will be described later, when particles are contained in the sealing resin layer, it is desirable that the transmissivity of the sealing resin layer is 70%/mm or more.

Furthermore, it is desirable that the sealing resin layer contains particles such as resin particles, inorganic particles or metal particles.

By incorporating the particles therein, it is possible to match the thermal expansion coefficient of the above-mentioned substrate for mounting an IC chip to that of the multilayered printed circuit board and make it more difficult to cause cracks or the like due to the difference in thermal expansion coefficient to occur.

In the device for optical communication according to the first aspect of the fourth group of the present invention which comprises the substrate for mounting an IC chip and the multilayered printed circuit board, the thermal expansion coefficients of the constituent members thereof (in a z-axis direction) are the same as those of the constituent members of the device for optical communication according to the first aspect of the second group of the present invention.

As can be seen, when particles are mixed in the sealing resin layer, the difference in thermal expansion coefficient between the sealing resin layer and the other constituent members that constitute the device for optical communication is decreased. Therefore, a stress is moderated.

Further, when particles are mixed in the sealing resin layer, the positional deviation between the optical elements and the optical waveguides becomes less likely to be caused.

Moreover, when the particles are mixed in the sealing resin layer, it is desirable that the resin component of the sealing resin layer is almost equal in refractive index to the particles. Therefore, when the particles are mixed in the sealing resin layer, it is desirable to set the refractive index of the particles almost equal to that of the resin composition similarly to the sealing resin layer formed on the device for optical communication similarly to the sealing resin layer formed in the device for optical communication according to the first aspect of the second group of the present invention.

(移行用では、3の1)

Specific examples of the resin particles, inorganic particles and metal particles include the same particles as those contained in the sealing resin layer formed on the device for optical communication according to the first aspect of the second group of the present invention. The particles are desirably inorganic particles, which are desirably of silica, titania or alumina. It is also desirable to use particles having a mixture composition obtained by mixing and dissolving at least two kinds among silica, titania and alumina.

Further, the shape and mixing quantity of the particles are the same as those of the particles contained in the sealing resin layer formed on the device for optical communication according to the first aspect of the second group of the present invention.

The composition of the sealing resin layer has an influence on reliabilities such as the optical signal transmission loss, heat resistance and bending strength. Therefore, the specific composition may be appropriately selected so that the sealing resin layer satisfies low optical signal transmission loss, excellent heat resistance and excellent cracking resistance.

In the device for optical communication according to the first aspect of the third group of the present invention, it is desirable that the optical paths for transmitting optical signal are equal in refractive index to the sealing resin layer. When the refractive indexes of the optical paths for transmitting optical signal are lower than that of the sealing resin layer, optical signal transmitted through the optical paths for transmitting optical signal is converged toward the light receiving part of the light receiving element. The optical signal sent from the light emitting element is refracted in a direction in which the optical signal is not spread on the interface between the optical paths for transmitting optical signal and the sealing resin layer. However, because of the difference in refractive index therebetween, the reflection of the optical signal on the interface between the optical paths for transmitting optical signal and the sealing resin layer occurs, with the result that the optical signal transmission loss increases. Therefore, in order to lower the optical signal transmission loss, it is desirable that optical paths for transmitting optical signal are equal in refractive index to the sealing resin layer. Normally, the refractive indexes of optical paths for transmitting optical signal and the sealing resin layer are appropriately selected based on the degree of the reflection and the degree of refraction of the optical signal on the interface between the optical path for transmitting optical signal and the sealing resin layer.

The refractive indexes of the resin components used for the sealing resin layer and the like are as follows: the refractive index of epoxy resin is about 1.50 to 1.60; that of acrylic resin is about 1.40 to 1.55; and that of polyolefin is about 1.55 to 1.65. Examples of a method of adjusting the refractive index of the sealing resin layer or the like include a method by changing polarizability by fluorinating or phenylating a part of the resin component to thereby change the refractive index of a resin component, a method by changing a molecular weight by deuteriding a part of the resin component to thereby change the refractive index of a resin component and the like. It is noted that such a refractive index adjustment method can be also used as a method of adjusting the refractive index of the optical waveguide.

In the device for optical communication according to the first aspect of the fourth group of the present invention, the sealing resin layer may be formed only in regions that do not correspond to optical paths for optical signal among the area put between the substrate for mounting an IC chip and the multilayered printed circuit board. Specifically, the sealing resin layer may be formed, for example, only in the vicinity of the outer periphery of the area put between the substrate for mounting an IC chip and the multilayered printed circuit board.

By thus forming the sealing resin layer, it is possible to attain the effect of the second group of the present invention that it is possible to prevent dust, foreign matters and the like floating in the air from entering between the optical elements and the optical waveguides. In addition, since the optical signal optical paths is constituted by the air, there is no possibility that the sealing resin layer hampers the optical signal transmission, thus further widening the option of a material for the sealing resin layer.

In the device for optical communication, it is desirable that the optical path for transmitting optical signal has the resin layer for an optical path formed therein as shown in FIG. 49. As mentioned above, in the device for optical communication according to the first aspect of the fourth group of the present invention, it is desirable that the sealing resin layer is formed between the substrate for mounting an IC chip and the multilayered printed circuit board. However, when the interior of each optical paths for transmitting optical signal is constituted by a vacancy, the sealing resin layer sometimes enter into a part of the optical paths for transmitting optical signal at the time of forming the sealing resin layer, which sometimes hampers the optical signal transmission.

Furthermore, the device for optical communication, it is desirable that the conductor layer is formed on the wall face of the optical path for transmitting optical signal as shown in FIG. 49. By forming the conductor layer on the wall face of each optical path for transmitting optical signal, it is possible to decrease the irregular reflection of light on the wall face of the optical path for transmitting optical signal and improve optical signal transmission characteristic.

Additionally, in the device for optical communication, it is desirable that the resin layer for an optical path is also formed in the openings for optical paths formed in the multilayered printed circuit board. In this case, the resin layer for an optical path is equal in refractive index to the sealing resin layer. When they are equal in refractive index, it is possible to decrease the optical signal transmission loss similarly to the case where the optical paths for transmitting optical signal are equal in refractive index to the sealing resin layer.

Moreover, when the interior of the openings for optical paths is a vacancy, the uncured resin composition for forming the sealing resin layer often enters into the vacancy of the openings for optical paths and a void often occurs at the time of the entry of the uncured resin composition in the step of forming the sealing resin layer of the manufacturing of the device for optical communication. The occurrence of such a void may possibly adversely influence the optical signal transmission capability of the device for optical communication. However, when the resin layer for an optical path is formed in the openings for optical paths, such a problem does not occur.

Further, when the sealing resin layer is formed between the substrate for mounting an IC chip and the multilayered printed circuit board, the resin layer for an optical path is formed in the optical paths for transmitting optical signal and the resin layer for an optical path is formed in the openings for optical paths, it is desirable that the sealing resin layer, the resin layers for optical paths in optical paths for transmitting optical signal and those in the openings for optical paths are equal in refractive index. When the three are equal in refractive index, no optical signal reflection occurs to the interface between the sealing resin layer and the resin layer for an optical path.

In addition, in the device for optical communication, it is desirable that a micro lens is disposed on the end portion of the optical paths for transmitting optical signal at least on one side. The micro lenses may be formed on the both ends of the optical path for transmitting optical signal.

Figure 50:
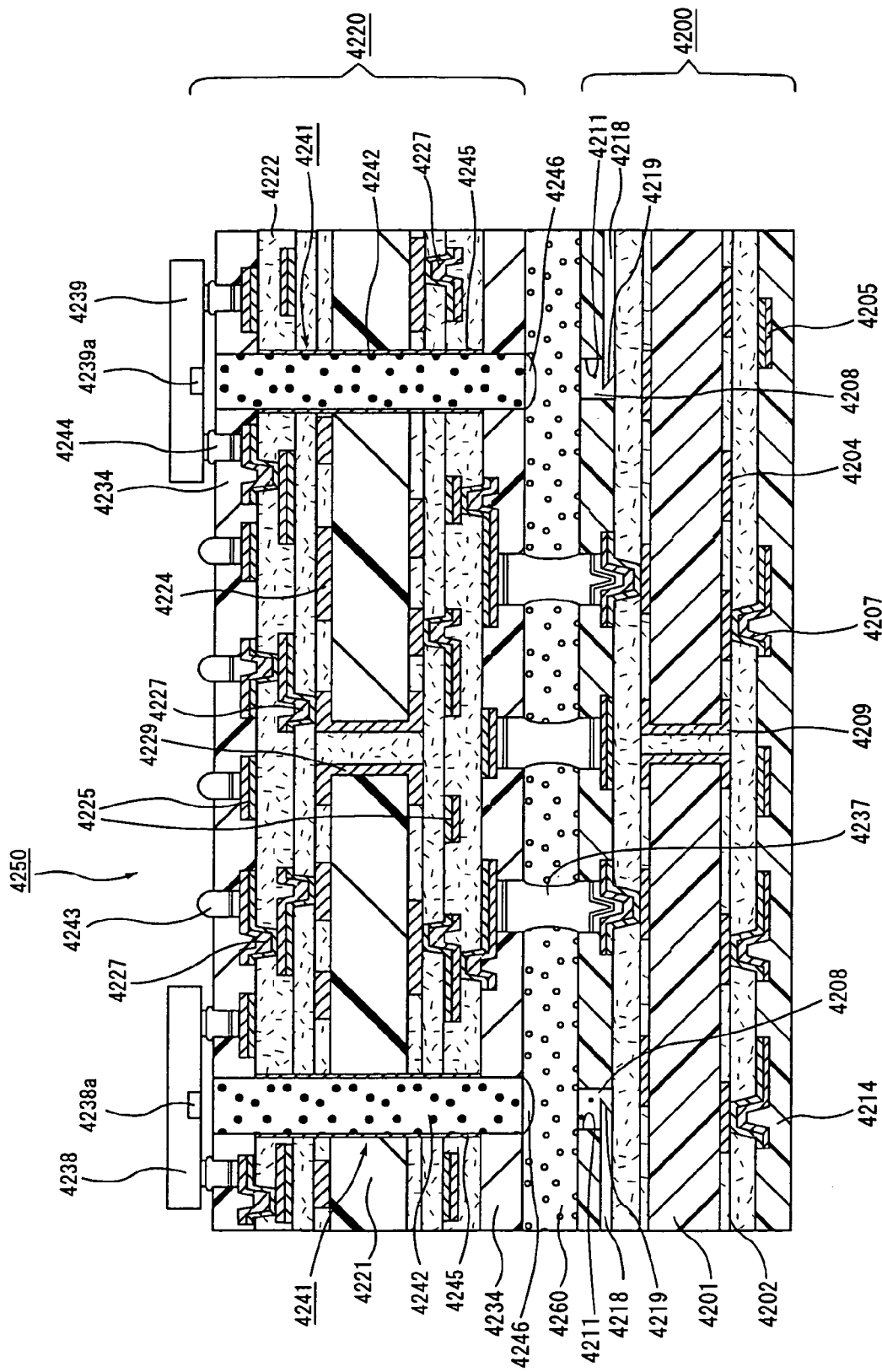
FIG. 50 is a cross-sectional view schematically showing another embodiment of the device for optical communication according to the first aspect of the fourth group of the present invention.

FIG. 50 is a cross-sectional view schematically showing another embodiment of the device for optical communication according to the first aspect of the fourth group of the present invention.

Similarly to the device for optical communication 4150 shown in FIG. 49, the device for optical communication 4250 comprises a substrate for mounting an IC chip 4220 and a multilayered printed circuit board 4200 and a sealing resin layer 4260 is formed between the substrate for mounting an IC chip 4250 and the multilayered printed circuit board 4200.

In addition, in the substrate for mounting an IC chip 4220, a micro lens 4246 is disposed on the end portion of each optical path for transmitting optical signal 4241 having a resin layer for an optical path 4242 formed therein on the multilayered printed circuit board 4200 side.

By thus disposing the micro lenses, it is possible to further ensure transmission of optical signal between optical elements (a light receiving element and a light emitting element) and optical waveguides.

It is noted that the embodiment of the device for optical communication 4250 is equal to that of the device for optical communication 4150 except that the micro lenses 4246 are disposed on one ends of the respective optical paths for transmitting optical signal 4242 of the substrate for mounting an IC chip 4220.

It is also desirable that the refractive index of the micro lens disposed on (multilayered printed circuit board-side) one end of each of the optical paths for transmitting optical signal is higher than that of the sealing resin layer.

By disposing the micro lenses having such refractive indexes, it is possible to converge optical signal in a desired direction and, therefore, possible to further ensure the transmission of optical signal.

In addition, when the micro lense is a convex lens having a convex face only on one side (sealing resin layer side) as shown in FIG. 50, the radius of curvature of the micro lens is appropriately selected based on the focal distance of the micro lens. Specifically, when the focal distance of the micro lens is to be set long, the radius of curvature is set small. When the focal distance is to be set short, the radius of curvature is set large.

In addition, when the micro lenses are disposed and the resin layer for an optical path is formed in each of the optical paths for transmitting optical signal, the refractive index of the micro lenses may be higher than that of the resin layer for an optical path or equal thereto.

Furthermore, though not shown in the figure, when a resin layer for an optical path also is formed in the openings for optical paths of the multilayered printed circuit board, it is desirable that a micro lens is also disposed on the sealing resin layer-side tip end portion of the opening for an optical path. In this case, it is desirable that the refractive index of the micro lens is higher than that of the sealing resin layer.

Moreover, when a micro lens is also disposed on the end portion of the openings for optical paths and each optical path for transmitting optical signal formed therein is almost equal in thickness to each optical path for transmitting optical signal having the resin layer for an optical path formed therein, it is desirable that the micro lens disposed on the end portion of the opening for an optical path is almost equal in refractive index to the micro lens disposed on the end portion of the optical path for transmitting optical signal.

By disposing the micro lenses having such refractive indexes, it is possible to converge optical signal in a desired direction and it is therefore possible to further ensure transmitting the optical signal.

The micro lense is not limited to a specific one and examples of the micro lens include the same optical lens as that disposed in device for optical communication according to the first aspect of the third group of the present invention and the like.

In case of disposing the micro lens on the end portion of the optical path for transmitting optical signal, the micro lens may be disposed on the end portion of the optical path for transmitting optical signal through a transparent adhesive layer. When the resin layer for an optical path is formed on the interior of the optical path for transmitting optical signal, the micro lens may be directly disposed on the resin layer for an optical path.

Similarly to the case of disposing the micro lens on the end portion of the opening for an optical path, the micro lens may be disposed on the end portion of the opening for an optical path. When the resin layer for an optical path is formed on the interior of the opening for an optical path, the micro lens may be directly disposed on the resin layer for an optical path.

Although the positions at which the micro lenses are attached are desirably on the sealing resin layer-side (side confronting the multilayered printed circuit board) end portions of the respective optical paths for transmitting optical signal formed in the substrate for mounting an IC chip, the positions are not limited to these positions but may be the optical element-side end portions of the respective optical paths for transmitting optical signal or the both end portions thereof.

The shape of the micro lens is not limited to the convex shape as shown in FIG. 50 but may be any arbitrary shape capable of converging optical signal in a desired direction.

Further, in the device for optical communication according to the first aspect of the fourth group of the present invention, the number of substrates for mounting IC chips connected to the multilayered printed circuit board is not limited to one but may be two or more. The substrates for mounting IC chips connected to the multilayered printed circuit board may be a plurality of substrates for mounting IC chips which are built up.

Next, the other constituent members of the device for optical communication according to the first aspect of the fourth group of the present invention will be described.

Optical elements (a light receiving element, a light emitting element) are mounted on the substrate for mounting an IC chip that constitutes the device for optical communication according to the first aspect of the fourth group of the present invention.

Specific examples of the light receiving element and light emitting element include the same light receiving element and light emitting element as those mounted on the substrate for mounting an IC chip according to the first aspect of the first group of the present invention.

It is noted that the surroundings of the optical elements mounted on the substrate for mounting an IC chip may be sealed with resin. In addition, the gap between: the mounted optical elements; and the solder resist layers or the resin layers for optical paths may be sealed with resin. In this case, the resin sealing may be performed using the same material as that of the sealing resin layer or the like. Alternatively, the entire area put between the optical elements and the solder resist layer or resin layer for an optical path may be sealed with resin or only in the vicinity of the outer periphery of the area may be sealed with resin.

Furthermore, the optical paths for transmitting optical signal are formed in the substrate for mounting an IC chip that constitutes the device for optical communication according to the first aspect of the fourth group of the present invention, so that it is possible to transmit optical signal between the optical elements mounted on the substrate for mounting an IC chip and the optical waveguides formed on the multilayered printed circuit board through the optical paths for transmitting optical signal.

It is desirable that a resin layer for an optical path is formed in the optical paths for transmitting optical signal. When the resin layer for an optical path is thus formed, it is suitable to form the sealing resin layer as mentioned above and it is possible to decrease the probability of the entry of dust, foreign matters and the like between the optical element and the optical waveguide.

Further, when the resin layer for an optical path is formed in the optical paths for transmitting optical signal, it is possible to ensure that the substrate for mounting an IC chip has excellent strength.

In some cases, part of or entirety of the interior of the optical paths for transmitting optical signal may be constituted by a vacancy.

Further, when the resin layer for an optical path is formed in the optical paths for transmitting optical signal, the resin component of the resin layer is not limited to a specific one as long as the resin component is less absorbed in a communication wavelength band. Specific examples of the resin component include the same resin as that used for the sealing resin layer and the like.

Furthermore, particles such as resin particles, inorganic particles and metal particles may be contained in the resin layer for an optical path besides the above-mentioned resin component. By incorporating these particles in the resin layer for an optical path, it is possible to match the thermal expansion coefficients of the optical paths for transmitting optical signal, the substrate, the interlaminar insulating layers, the solder resist layers and the like.

Specific examples of the particles include the same as those contained in the sealing resin layer.

Further, the shape of the optical paths for transmitting optical signal is not limited to a specific one but they may be columnar, elliptical columnar, quadrangular columnar, polygonal columnar or the like. Among these shapes, the columnar shape is desirable. This is because the spherical shape has the smallest influence on the optical signal transmission and it is easy to form the optical waveguides into columnar shape.

The lower limit of the cross-sectional diameter of the optical paths for transmitting optical signal is desirably 100 µm. When the cross-sectional diameter is less than 100 µm, the optical path may possibly be closed and it is often difficult to form the resin layer for an optical path in the optical path for transmitting optical signal. On the other hand, the upper limit of the cross-sectional diameter thereof is desirably 500 µm. Even when the cross-sectional diameter exceeds 500 µm, the optical signal transmission characteristic does not improve so greatly and such a large cross-sectional diameter often hampers the degree of freedom for the design of conductor circuits and the like that constitute the substrate for mounting an IC chip.

The lower limit and upper limit of the cross-sectional diameter are more desirably 250 µm and 350 µm, respectively, from a viewpoint that both the optical signal transmission characteristic and the degree of freedom for design are excellent and no problem occurs even when an uncured resin composition is filled into the optical paths having the above-mentioned cross-sectional diameter.

The cross-sectional diameter of the optical paths for transmitting optical signal means: the diameter of a cross section when the optical path for transmitting optical signal is cylindrical; the longer diameter of the cross section when the optical path for transmitting optical signal is elliptic, and the length of the longest portion of the cross section when the optical path for transmitting optical signal is prismatic or polygonal.

It is also desirable that a conductor layer is formed on the wall faces of the optical paths for transmitting optical signal. The conductor layer may be composed of one layer or two or more layers.

Examples of a material for the conductor layer include copper, nickel, chromium, titanium, noble metal and the like.

Further, the conductor layer can often serve as a plated-through hole, i.e., serve to electrically connect the conductor circuits which interpose the substrate therebetween or the conductor circuits which interpose the substrate and the interlaminar insulating layers therebetween.

In addition, the material for the conductor layer may be metal having glossiness such as gold, silver, nickel, platinum, aluminum and rhodium. The conductor layer which is formed out of such metal having glossiness suitably reflects optical signal.

Further, a covering layer or a roughened layer made of tin, titanium, zinc or the like may be further provided on the conductor layer. By providing the covering layer or roughened layer, it is possible to improve the adhesion between the optical path for transmitting optical signal and the resin layer for an optical path.

Furthermore, when the conductor layer and the resin layer for an optical path are formed in the optical paths for transmitting optical signal, they may contact with the substrate or the interlaminar insulating layer through a roughened face. When the conductor layer contacts therewith through the roughened face, the adhesion thereof to the substrate or the interlaminar insulating layer is excellent, making it more difficult to cause the peeling of the conductor layer and the like.

Moreover, the optical waveguides are formed on the multilayered printed circuit board that constitutes the device for optical communication according to the first aspect of the fourth group of the present invention.

Examples of the optical waveguides include the same optical waveguides as those formed on the multilayered printed circuit board that constitutes the device for optical communication according to the first aspect of the second group of the present invention, and the like.

In the multilayered printed circuit boards shown in FIGS. 49 to 50, the optical waveguides are formed on the outermost interlaminar insulating layer on the side confronting the substrate for mounting an IC chip. However, the optical waveguide formation positions in the device for optical communication according to the first aspect of the fourth group of the present invention are not limited to these positions but may be between the interlaminar insulating layers or between the substrate and the interlaminar insulating layer. Further, the positions may be on the outermost interlaminar insulating layer on the opposite side to the side confronting the substrate for mounting an IC chip across the substrate, between the interlaminar insulating layers, between the substrate and the interlaminar insulating layer or the like.

Figure 62:
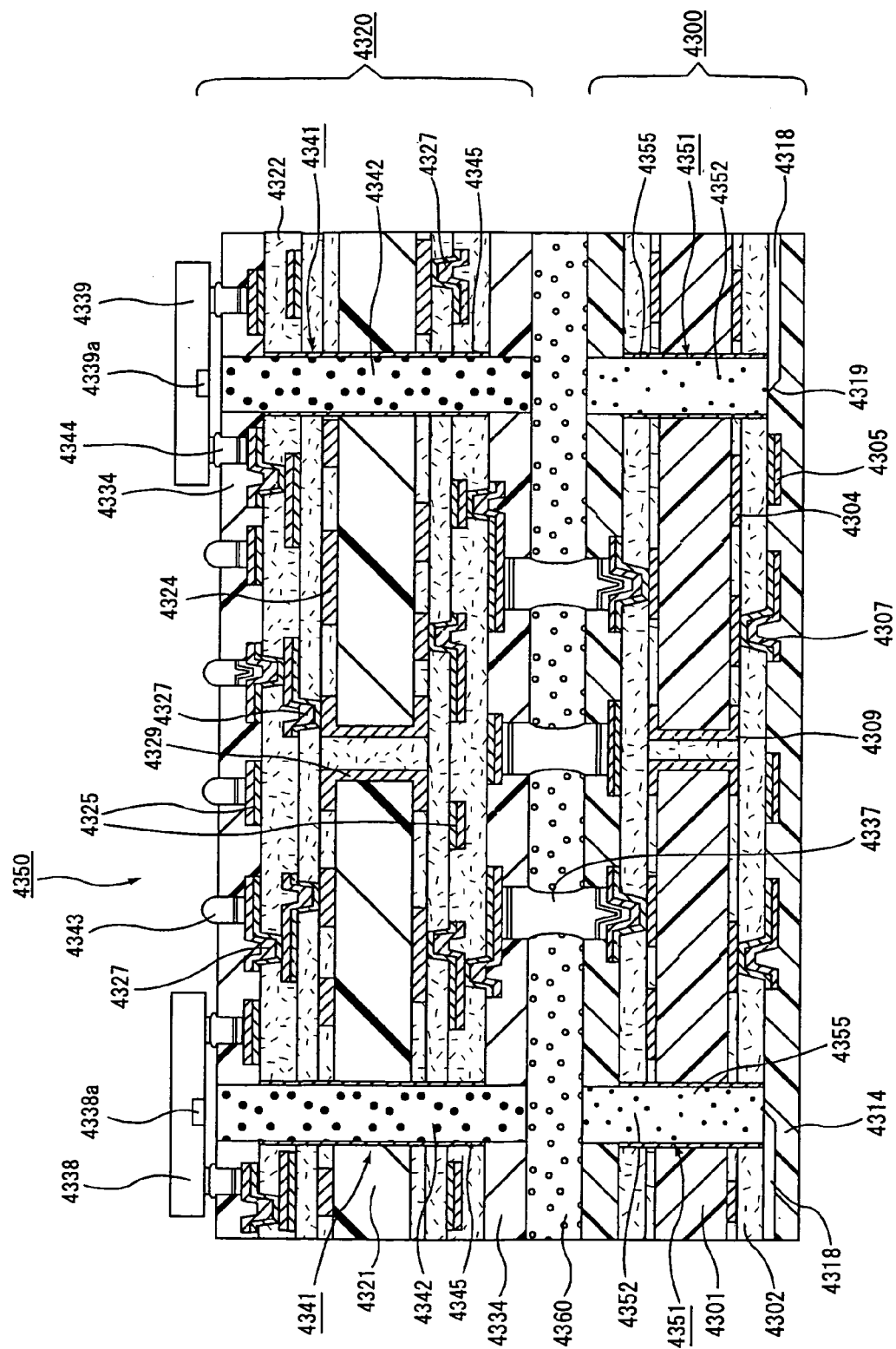
FIG. 62 is a cross-sectional view schematically showing part of the steps of manufacturing the multilayered circuit board that constitutes the device for optical communication according to the first aspect of the fourth group of the present invention.

Namely, similarly to a device for optical communication shown in FIG. 62, the optical waveguides may be formed on the outermost interlaminar insulating layer of the multilayered printed circuit board on the opposite side to the side confronting the substrate for mounting an IC chip across the substrate.

FIG. 62 is a cross-sectional view schematically showing one embodiment of the device for optical communication according to the first aspect of the fourth group of the present invention.

Similarly to device for optical communication 4150 shown in FIG. 49, the device for optical communication 4350 shown in FIG. 62 comprises a substrate for mounting an IC chip 4320 and a multilayered printed circuit board 4300, with the substrate for mounting an IC chip 4320 electrically connected to the multilayered printed circuit board 4300 through solder connection parts 4337.

In addition, a sealing resin layer 4360 is formed between the substrate for mounting an IC chip 4320 and the multilayered printed circuit board 4300.

The configuration of the substrate for mounting an IC chip 4320 is almost equal to that of the substrate for mounting an IC chip 4120 shown in FIG. 49.

In the multilayered printed circuit board 4300, conductor circuits 4304 and an interlaminar insulating layer 4302 are built up both faces of a substrate 4301 in an alternate fashion and in repetition, the conductor circuits with the substrate 4301 interposed therebetween and the conductor circuits with the interlaminar insulating layers 4302 interposed therebetween are electrically connected to one another through a plated-through hole 4309 and via-holes 4307, respectively. In addition, a solder resist layer 4314 having solder bumps is formed on the outermost layer of the multilayered printed circuit board 4300.

Further, optical waveguides 4318 respectively having optical path conversion mirrors 4319 are formed on the outermost insulating layer of the multilayered printed circuit board 4300 on the opposite side to the side confronting the substrate for mounting an IC chip 4320 across the substrate 4301. Optical paths for transmitting optical signal 4352 penetrating the substrate 4310, the interlaminar insulating layers 4302 and the solder resist layer 4314 on the side of the multilayered printed circuit board 4300 confronting the substrate for mounting an IC chip 4320 are formed so as to be able to transmit optical signal between the optical waveguides 4318 and optical paths for transmitting optical signal 4341 formed in the substrate for mounting an IC chip 4320.

While a conductor layer 4355 is formed on the wall face of the optical paths for transmitting optical signal 4351 and a resin layer for an optical path 4352 is formed on the interior thereof, the conductor layer and resin layer for an optical path may be formed, based on necessity.

The device for optical communication having the above-mentioned configuration can transmit optical signal through the optical paths for transmitting optical signal 4351 formed in the multilayered printed circuit board 4300.

Further, in the multilayered printed circuit boards that constitute the devices for optical communication shown in FIGS. 49, 50 and 62, respectively, the optical waveguides are formed on the outermost interlaminar insulating layer and the solder resist layer is formed to cover this interlaminar insulating layer and the optical waveguides. However, this solder resist layer is not always formed but the optical waveguides may be formed entirely on the outermost interlaminar insulating layer so as to serve as the solder resist layer.

The device for optical communication having the above-mentioned configuration according to the first aspect of the fourth group of the present invention can be manufactured by the manufacturing method of the device for optical communication according to the second aspect of the fourth group of the present invention described later, or the like.

Next, the manufacturing method of the device for optical communication according to the second aspect of the fourth group of the present invention will be described.

The manufacturing method of the device for optical communication according to the second aspect of the fourth group of the present invention, after separately manufacturing: a substrate for mounting an IC chip at which an optical path for transmitting optical signal is formed, and on one face of said substrate an optical element is mounted; and a multilayered printed circuit board at which at least an optical waveguide is formed, the substrate for mounting an IC chip and the multilayered printed circuit board are disposed at and fixed to such respective positions as to be able to transmit optical signal between the optical element of the substrate for mounting an IC chip and the optical waveguide of the multilayered printed circuit board, and further, a resin composition for sealing is made to flow between the substrate for mounting an IC chip and the multilayered printed circuit board and a curing treatment is conducted, thereby forming a sealing resin layer.

In the manufacturing method of the device for optical communication according to the second aspect of the fourth group of the present invention, after disposing and fixing the substrate for mounting an IC chip and the multilayered printed circuit board at and to the respective predetermined positions, the sealing resin layer is formed between them. Therefore, dust, foreign matters and the like floating in the air do not enter between the optical element and the optical waveguide, and it is possible to appropriately manufacture the device for optical communication capable of preventing the transmission of optical signal from being hampered.

Furthermore, by forming the sealing resin layer between the substrate for mounting an IC chip and the multilayered printed circuit board, the sealing resin layer can serve to moderate the stress derived from the difference in thermal expansion coefficient between the substrate for mounting an IC chip and the multilayered printed circuit board in the device for optical communication thus obtained. In addition, by forming the sealing resin layer, the positional deviation between the optical elements and the optical waveguides becomes less likely to be caused.

Therefore, in the manufacturing method of the device for optical communication according to the present invention, it is possible to suitably manufacture a device for optical communication excellent in reliability.

In the manufacturing method of the device for optical communication, first, the substrate for mounting an IC chip and the multilayered printed circuit board are separately manufactured.

Therefore, a manufacturing method of the substrate for mounting an IC chip and a manufacturing method of the multi layered printed circuit board will be described separately first, and then a method of forming the sealing resin layer will be described herein.

First, the manufacturing method of the substrate for mounting an IC chip will be described.

(1) Using an insulating substrate as a starting material, conductor circuits are formed on the insulating substrate.

Specifically, this step may be the same as the step (1) of the manufacturing method of the substrate for mounting an IC chip according to the second aspect of the second group of the present invention.

(2) Next, a roughening treatment is conducted to the surfaces of the conductor circuits, based on necessity.

Specifically, this step may be the same as the step (2) of the manufacturing method of the substrate for mounting an IC chip according to the second aspect of the second group of the present invention.

(3) Next, either an uncured resin layer of thermosetting resin, photosensitive resin, resin obtained by photosensitizing a part of thermosetting resin, an uncured resin layer of a resin complex containing one of these resins and thermoplastic resin, or a resin layer of thermoplastic resin is formed on the substrate on which the conductor circuits are formed.

Specifically, this step may be the same as the step (3) of the manufacturing method of the substrate for mounting an IC chip according to the second aspect of the second group of the present invention.

(4) Next, when an interlaminar insulating layer is formed using, as a material therefor, thermosetting resin or a resin complex, a curing treatment is conducted to the uncured resin layer and openings for via-holes are formed, thereby obtaining the interlaminar insulating layer. In this step, a through hole for a plated-through hole may be formed, based on necessity.

Specifically, this step may be the same as the step (4) of the manufacturing method of the substrate for mounting an IC chip according to the second aspect of the second group of the present invention.

(5) Next, conductor circuits are formed on the surface of the interlaminar insulating layer including the inner walls of the openings for via-holes.

When the conductor circuits are to be formed, a thin film conductor layer is formed first on the surface of interlaminar insulating layer.

Specifically, this step may be the same as the step (5) of the manufacturing method of the substrate for mounting an IC chip according to the second aspect of the second group of the present invention.

(6) Next, a plating resist is formed on the substrate on the surface of which the thin film conductor layer is formed.

Specifically, this step may be the same as the step (6) of the manufacturing method of the substrate for mounting an IC chip according to the second aspect of the second group of the present invention.

(7) Thereafter, electroplating is conducted using the thin film conductor layer as a plating lead, thereby forming an electroplated layer in non plating resist formed areas.

Specifically, this step may be the same as the step (7) of the manufacturing method of the substrate for mounting an IC chip according to the second aspect of the second group of the present invention.

Further, similarly to the manufacturing method according to the second aspect of the second group of the present invention, the conductor circuit formation method in the manufacturing of the substrate for mounting an IC chip is not limited to the method based on the additive method but may be based on the subtractive method. As the method based on the subtractive method, the method described in the manufacturing method according to the second aspect of the second group of the present invention can be used.

Similarly to the manufacturing method according to the second aspect of the second group of the present invention, whether to select the additive method or the subtractive method of the conductor circuit formation method may be appropriately determined based on the width and distance of the conductor circuits, the number of connection terminals, the pitch and the like for the IC chip and the optical elements to be mounted on the substrate and other various electronic components.

Moreover, similarly to the manufacturing method according to the second aspect of the second group of the present invention, when the plated-through hole is formed in the steps (4) and (5), a resin filler may be filled into the plated-through hole.

Further, when the resin filler is filled into the plated-through hole, a cover plating layer may be formed to cover the surface layer part of the resin filled layer by performing electroless plating, based on necessity.

(8) Next, when the cover plating layer is formed, a roughening treatment is conducted to the surface of the cover plating layer, based on necessity and the steps (3) and (4) are repeatedly executed, based on necessity, whereby an outermost insulating layer can be formed.

(9) Thereafter, by repeatedly executing the steps (3) to (8), based on necessity, conductor circuits and interlaminar insulating layers are built up on both faces of the substrate in an alternate fashion and in repetition. In this step, the plated-through hole may be formed or may not be formed.

By executing such steps (1) to (9), it is possible to manufacture a multilayered circuit board having conductor circuits and interlaminar insulating layers built up on both faces of the substrate in an alternate fashion and in repetition.

(10) Next, through holes penetrating the multilayered printed circuit board are formed. The through holes formed in this step become the optical paths for transmitting optical signal in the substrate for mounting an IC chip through a later step. Therefore, the through holes formed in this step will be referred to as "through holes for optical paths" hereinafter.

The through holes for optical paths are formed by drilling, a laser treatment or the like.

Examples of a laser used for the laser treatment include the same as that used to form the openings for via-holes and the openings for forming solder bumps and the like.

The positions at which the through holes for optical paths are formed are not limited to specific positions but may be appropriately selected based on the design of the conductor circuits, the position at which the IC chip is mounted and the like.

Furthermore, it is desirable that the through holes for optical paths are formed for respective optical elements such as the light receiving element and the light emitting element. Alternatively, they may be formed for respective signal wavelengths.

Further, after the through holes for optical paths are formed, based on necessity, a desmear treatment may be conducted.

The desmear treatment can be performed by a treatment using a permanganic acid solution, a plasma treatment, a corona treatment or the like. It is noted that when the desmear treatment is conducted, it is possible to remove the resin residue, burrs and the like in the through holes for optical paths, and lower the transmission loss caused by irregular reflection on the wall faces of the optical paths for transmitting optical signal.

Alternatively, the conductor layer may be formed after forming the through holes for optical paths in the following step or a roughening treatment for roughening the wall faces of the through holes for optical paths, based on necessity, before an uncured resin composition is filled into the holes. By forming the roughened face, it is possible to improve the adhesion between the through holes for optical paths and the conductor layer or the resin composition.

The roughened face can be formed by dissolving exposed portions generated at the time of forming the through holes for optical paths in the substrate, the interlaminar insulating layer and the like by an acid such as a sulfuric acid, a hydrochloric acid or a nitric acid, an oxidizing agent such as a chromic acid, a chromic sulfide or a permanganate, or the like. Alternatively, the roughened face can be formed by a plasma treatment, a corona treatment or the like.

After forming the through holes for optical paths, a conductor layer is desirably formed on the wall faces of the through holes for optical paths.

The conductor layer can be formed by a method such as electroless plating or sputtering.

Specifically, a method of forming through holes for optical paths, applying a catalyst core to the wall faces of the through holes for optical paths and, then, immersing the substrate, in which through holes for optical paths are formed, in an electroless plating bath, or the like can be used to form the conductor layer.

Alternatively, a conductor layer composed of two or more layers may be formed by a combination of electroless plating and sputtering or a conductor layer composed of two or more layer may be formed by conducting electroplating after electroless plating or sputtering.

In this step, it is desirable to not only form the conductor layer on the wall faces of the through holes for optical paths but also form outermost layer conductor circuits on an outermost layer on the multilayered printed circuit board.

Specifically, at the time of forming the conductor layer on the wall faces of the through holes for optical paths by electroless plating or the like, a conductor layer is also formed on the entire surface of the interlaminar insulating layer.

Next, a plating resist is formed on this conductor layer formed on the surface of the interlaminar insulating layer. The plating resist is formed by the same method as that conducted in the step (6) or the like.

Further, electroplating is conducted using the conductor layer formed on the interlaminar insulating layer as a plating lead, thereby forming an electroplating layer on the non plating resist formed areas. Thereafter, the plating resist and the conductor layer under the plating resist are removed, thereby forming an independent conductor layer on the interlaminar insulating layer.

Further, a roughened face may be formed on the wall faces of the conductor layer after forming the conductor layer.

The roughened face may be formed by the same method as that conducted in the step (2) or the like.

Further, after forming the through holes for optical paths (or after forming the conductor layer on the wall faces thereof, based on necessity), it is desirable to fill an uncured resin composition into these through holes for optical paths. By filling the uncured resin composition and then conducting a curing treatment to the resin composition, it is possible to form the through holes for optical paths as optical paths for transmitting optical signal each having the resin layer for an optical path formed therein.

A method of filling the uncured resin composition is not limited to a specific one but such a method as printing or potting can be used.

When the uncured resin composition is filled by printing, the uncured resin composition may be printed at one time or two or more times. Further, the uncured resin composition may be printed from both faces of the multilayered circuit board.

Further, when the uncured resin composition is filled, an uncured resin composition slightly larger in quantity than the inner product of the through holes for optical paths may be filled and, after filling the uncured resin composition, an excessive resin composition overflowing the through holes for optical paths may be removed.

The removal of the excessive resin composition can be carried out by grinding or the like. When the excessive resin composition is to be removed, the resin composition may be in a half-cured state or a fully cured state, which state may be appropriately selected based on the material for the resin composition and the like.

By performing such a treatment, it is possible to form the optical paths for transmitting optical signal penetrating the multilayered circuit board.

Furthermore, at the time of forming the conductor layer on the wall faces of the through holes for optical paths, independent conductor circuits can be formed by forming the conductor layer also on the surface of the interlaminar insulating layer and performing the treatment. Needless to say, even when the conductor layer is not formed, the conductor circuits can be formed on the surface of the interlaminar insulating layer by the method.

(11) Next, a solder resist composition layer is formed on the outermost layer of the substrate on which the conductor circuits and the interlaminar insulating layers are formed.

Specifically, this step may be the same as the step (9) of the manufacturing method of the substrate for mounting an IC chip according to the second aspect of the second group of the present invention.

(12) Next, openings penetrating the through holes for optical paths (hereinafter, also referred to as "openings for optical paths") are formed in the solder resist composition layer, thus obtaining a solder resist layer.

Specifically, the solder resist layer is formed by the same method as the method of forming the openings for via-holes, i.e., by exposure and development treatments, a laser treatment or the like.

In addition, when the openings for optical paths are formed, it is desirable to form openings for forming solder bumps (openings for mounting an IC chip and optical elements and those for connecting the substrate for mounting an IC chip to the multilayered printed circuit board) simultaneously. It is noted that the formation of the openings for optical paths and that of the openings for forming solder bumps may be performed separately.

Further, when the solder resist layer is formed, the solder resist layer having openings for optical paths and openings for forming solder bumps may be formed by manufacturing a resin film having openings at desired positions and bonding it thereon.

Through these steps (11) and (12), it is possible to form the solder resist layer having openings communicating with the through holes for optical paths on the multilayered circuit board having the through holes for optical paths formed therein.

It is noted that the diameter of the openings for optical paths may be equal to that of the through holes for optical paths or may be smaller than that.

Further, when the resin layer for an optical path is formed in the through holes for optical paths in the step (10), it is desirable to fill an uncured resin composition into the opening for an optical path and then to conduct a curing treatment to the resin composition, thereby forming the resin layer for an optical path in this step.

By forming the resin layer for an optical path also in this step, the resin layer for an optical path is formed entirely in the optical paths for transmitting optical signal.

Further, the uncured resin composition filled into the openings for optical paths is desirably equal to the uncured resin composition filled in the through holes for optical paths in the step (10).

In addition, when the optical paths for transmitting optical signal each having the resin layer for an optical path formed on the overall interior thereof are formed, the optical paths for transmitting optical signal each having the resin layer for an optical path formed on the overall interior thereof may be formed by not filling the uncured resin composition in the step (10) but filling the uncured resin composition into the through holes for optical paths and openings for optical paths communicating with the through holes for optical paths in this step and conducting a curing treatment to the resin composition afterwards.

Alternatively, the resin layer for an optical path may be formed by, after filling the uncured resin composition into the through holes for optical paths, half-curing this resin composition, forming the solder resist layers having the openings for optical paths by the method, filling an uncured resin composition into the openings for optical paths, and simultaneously conducting a curing treatment to the resin compositions in the through holes for optical paths and those in the openings for optical paths in the step (10).

(13) Next, a micro lens is disposed on the end portion of each of the optical paths for transmitting optical signal, based on necessity.

In order to dispose the micro lens on the end portion of each of the optical paths for transmitting optical signal, the micro lens may be disposed on the end portion of each of the optical paths for transmitting optical signal through an adhesive layer formed on the solder resist layer. When the resin layer for an optical path is formed on the interior of each optical path for transmitting optical signal, in particular, the micro lens may be directly disposed on the resin layer for an optical path or disposed thereon through a transparent adhesive layer.

Examples of a method of directly disposing each micro lens on the resin layer for an optical path include a method by dropping an appropriate quantity of uncured resin for an optical lens onto the resin layer for an optical path and conducting a curing treatment to the dropped uncured resin for an optical lens, and the like.

Further, it is desirable that the uncured resin for an optical lens has a viscosity of 10 to 50 cps (mP·s). When the viscosity falls within this range, the resin becomes semispherical by surface tension at the time of dropping the resin.

To drop an appropriate quantity of the uncured resin for an optical lens onto the resin layer for an optical path, such a device as a dispenser, an inkjet, a micro pipette or a micro syringe can be employed.

Since the uncured resin for an optical lens dropped onto the resin layer for an optical path using such a device is to become semispherical by the surface tension thereof, the resin becomes semispherical on the exposed face of the resin layer for an optical path. Thereafter, by curing the semispherical uncured resin for an optical lens, it is possible to dispose a semispherical micro lens (convex lens) on the resin layer for an optical path.

The diameter of the micro lens formed by the method, the shape of the curved face of the micro lens and the like can be controlled by appropriately adjusting the viscosity and the like of the uncured resin for an optical lens while considering the wettability between the resin composition and the uncured resin for an optical lens and the like.

(14) Next, conductor circuit portions exposed by forming the openings for forming solder bumps are covered with corrosion resistant metal such as nickel, palladium, gold, silver or platinum to provide solder pads, based on necessity. Among the corrosion resistant metallic materials, it is desirable to use nickel-gold, nickel-silver, nickel-palladium, nickel-palladium-gold or the like to form a covering layer.

The covering layer may be formed by plating, vapor deposition, electrode position or the like. Among them, plating is desirable from a viewpoint that the covering layer is excellent in evenness at the time of being formed by plating.

(15) Next, the solder pads are filled with solder paste through a mask having opening parts formed in portions corresponding to openings for mounting the substrate for mounting an IC chip (openings for mounting IC chips) and openings for connecting the substrate for mounting an IC chip to the multilayered printed circuit board (openings for connecting multilayered printed circuit boards) and then reflow is performed, thereby forming solder bumps.

By forming such solder bumps, it is possible to mount the IC chip through the solder bumps and connect the multilayered printed circuit board to the substrate for mounting an IC chip. It is noted that the solder bumps may be formed, based on necessity. Even when no solder bumps are formed, it is possible to electrically connect the IC chip to be mounted and the multilayered printed circuit board to be connected through the bumps of the IC chip and the multilayered printed circuit board.

(16) Moreover, optical elements (a light receiving element and a light emitting element) are mounted on the solder resist layer. The optical elements may be mounted through solders by filling solder paste even into the openings for mounting the optical elements (openings for mounting optical elements) and attaching the optical elements before conducting reflow in the step (15).

Further, the optical elements may be mounted using conductive adhesive or the like in place of the solder paste.

Through these steps, it is possible to manufacture the substrate for mounting an IC chip that constitutes the device for optical communication according to the first aspect of the fourth group of the present invention.

Next, the multilayered printed circuit board manufacturing method will be described.

(1) First, similarly to the steps (1) to (2) of the manufacturing method of the substrate for mounting an IC chip according to the second aspect of the fourth group of the present invention, conductor circuits are formed on both faces of a substrate and a plated-through hole for connecting the conductor circuits with the substrate interposed therebetween are formed. In this step, similarly to the above, a roughened face is formed on the surface of each of the conductor circuits and the wall surface of the plated-through hole, based on necessity.

(2) Next, interlaminar insulating layers and conductor circuits are built up on the substrate, on which the conductor circuits are formed, in an alternate fashion and in repetition, based on necessity.

Specifically, the interlaminar insulating layers and the conductor circuits may be built up using the same methods as those used in the steps (3) to (8) of the manufacturing method of the substrate for mounting an IC chip according to the second aspect of the fourth group of the present invention.

In the steps, similarly to the manufacturing of the substrate for mounting an IC chip, a plated-through hole penetrating the substrate and the interlaminar insulating layers and a cover plating layer may be formed.

It is noted that this step (2), i.e., the step of building up the interlaminar insulating layers and the conductor circuits may be executed only once or a plurality of number of times.

In addition, to form the conductor circuits on the interlaminar insulating layer in this step, the subtractive method may be used similarly to the manufacturing of the substrate for mounting an IC chip.

(3) Next, optical waveguides are formed on the substrate on the side confronting the substrate for mounting an IC chip or on non conductor formed areas on the interlaminar insulating layer.

The optical waveguides can be formed by the same method as that conducted in the step (3) of the manufacturing method of the multilayered printed circuit board in the manufacturing method according to the second aspect of the second group of the present invention or the like.

Further, an optical path conversion mirror is formed on the optical waveguides similarly to the manufacturing method according to the second aspect of the second group of the present invention. Alternatively, an optical path conversion member may be embedded into the optical waveguide in place of forming the optical path conversion mirror.

In this manufacturing method of the multilayered printed circuit board, similarly to the manufacturing method according to the second aspect of the second group of the present invention, the optical waveguides are often formed between the substrate and the interlaminar insulating layer or between the interlaminar insulating layers.

Even when the optical waveguides are formed between the substrate and the interlaminar insulating layer or between the interlaminar insulating layers, the same method as that conducted in the step (3) of the manufacturing method of the multilayered printed circuit board according to the second aspect of the second group of the present invention or the like may be used.

Furthermore, in the multilayered printed circuit board that constitutes the device for optical communication according to the first aspect of the fourth group of the present invention, the optical waveguides may be formed on the opposite side of the multilayered printed circuit board to the side confronting the substrate for mounting an IC chip across the substrate. When the multilayered printed circuit board having the optical waveguides formed at such positions is manufactured, it is necessary to form optical paths for transmitting optical signal penetrating at least the substrate so as to be able to transmit optical signal between the optical waveguides and the optical elements mounted on the substrate for mounting an IC chip. Such optical paths for transmitting optical signal may be appropriately formed either before or after the optical waveguides are formed.

Specifically, the multilayered printed circuit board may be manufactured as follows. After manufacturing the multilayered circuit board through the steps (1) and (2), the through holes for optical paths are formed using the same method as that used in the step (10) of the manufacturing method of the substrate for mounting an IC chip according to the second aspect of present group before forming the optical waveguides. Thereafter, the optical waveguides are formed at such positions as to be able to transmit optical signal between the optical waveguides and the substrate for mounting an IC chip through the through holes for optical paths by the above-mentioned method, and then steps to be described later are executed to obtain a multilayered printed circuit board. After forming the through holes for optical paths, an resin layer for an optical path and a conductor layer may be formed on the interior and wall face of each of the through holes for optical paths, based on necessity.

(4) Next, a solder resist composition layer is formed on the outermost layer of the multilayered printed circuit board on which the optical waveguides are formed.

The solder resist composition layer can be formed using the same resin composition as that used to form the solder resist layer in the manufacturing method of the substrate for mounting an IC chip according to the second aspect of this group of the present invention.

In some cases, the optical waveguides may be formed entirely on the outermost layer of the substrate in the step (3) so as to serve as the solder resist layer.

(5) Next, openings for forming solder bumps (openings for mounting the substrate for mounting an IC chip and various surface mount electronic components) and openings for optical paths are formed on a solder resist layer confronting the substrate for mounting an IC chip.

The formation of the openings for forming solder bumps and openings for optical paths can be performed using the same method as that for forming the openings for forming solder bumps in the manufacturing method of the substrate for mounting an IC chip according to the second aspect of the fourth group of the present invention. The formation of the openings for forming solder bumps and that of the openings for optical paths may be performed simultaneously or separately.

Among these methods, it is desirable to select the method of forming the openings for forming solder bumps and the openings for optical paths by applying a resin composition containing, as a material therefor, photosensitive resin and conducting exposure and development treatments at the time of forming the solder resist layer.

When the openings for optical paths are formed by the exposure and development treatments, there is no possibility of damaging the optical waveguides present under the openings for optical paths at the time of forming the openings.

Alternatively, the solder resist layer having the openings for forming solder bumps and the openings for optical paths may be formed by manufacturing a resin film having openings at desired positions in advance and bonding it in forming the solder resist layer.

When the through holes for optical paths are formed and the optical waveguides are formed on the opposite side to the side confronting the substrate for mounting an IC chip across the substrate, the openings for optical paths are formed to communicate with the through holes for optical paths at the time of forming the openings for optical paths in this step.

Further, the solder resist layer on the face of the multilayered printed circuit board opposite to the face thereof confronting the substrate for mounting an IC chip may be also formed to have openings for forming solder bumps.

This is because external connection terminals can be formed on the solder resist layer on the face of the multilayered printed circuit board opposite to the face thereof confronting the substrate for mounting an IC chip through a later step.

(6) Next, conductor circuit portions exposed by forming the openings for forming solder bumps are covered with corrosion resistant metal such as nickel, palladium, gold, silver and platinum, thereby providing solder pads, based on necessity. Specifically, the same method as that used in the step (14) of the manufacturing method of the substrate for mounting an IC chip according to the second aspect of the fourth group of the present invention may be used so as to form the solder pads.

(7) Next, an uncured resin composition is filled into the openings for optical paths formed in the step (5), based on necessity and a curing treatment is then conducted to the resin composition, thereby forming a resin layer for an optical path.

The uncured resin composition filled in this step is desirably equal to that filled into the through holes for optical paths and the openings for optical paths in the steps of the manufacturing process of the substrate for mounting an IC chip according to the second aspect of the present group of the present invention.

In addition, even when the through holes for optical paths and the openings for optical paths are formed in order to form optical paths on the opposite side to the side confronting the substrate for mounting an IC chip across the substrate, an uncured resin composition may be filled into the through holes for optical paths and the openings for optical paths. In this case, to fill the uncured resin composition, the same method as that used in the manufacturing of the substrate for mounting an IC chip according to this group of the present invention may be used.

(8) Next, after filling solder paste into the solder pads through a mask having opening parts formed in portions corresponding to the solder pads, reflow is conducted to form the solder bumps.

By forming such solder bumps, it is possible to mount the substrate for mounting an IC chip and various surface mount electronic components through the solder bumps. It is noted that the solder bumps may be formed, based on necessity. Even when no solder bumps are formed, it is possible to mount the to-be-mounted IC chip and various surface mount electronic components through the bumps of the IC chip and various surface mount electronic components.

On the solder resist layer on the opposite side to the face of the multilayered printed circuit board confronting the substrate for mounting an IC chip, external connection terminals are not always formed. A PGA or a BGA may be provided by disposing pins or forming solder balls, based on necessity.

Through such steps, it is possible to manufacture the multilayered printed circuit board that constitutes the device for optical communication according to the present invention.

In the manufacturing method of the device for optical communication according to the second aspect of the fourth group of the present invention, the substrate for mounting an IC chip and the multilayered printed circuit board are disposed at and fixed to positions such that optical signal can be transmitted between the optical elements of the substrate for mounting an IC chip and the optical waveguides of the multilayered printed circuit board.

Herein, after disposing the substrate for mounting an IC chip and the multilayered printed circuit board to be confronting each other, solder connection parts are formed by the solder bumps of the substrate for mounting an IC chip and the solder bumps of the multilayered printed circuit board, and the substrate for mounting an IC chip and the multilayered printed circuit board are electrically connected to each other and fixed relative to each other. Namely, the substrate for mounting an IC chip and the multilayered printed circuit board are disposed at predetermined positions in predetermined directions, respectively so as to be confronting each other and, reflow is conducted, thereby connecting them to each other.

As mentioned above, the solder bumps for fixing the substrate for mounting an IC chip and the multilayered printed circuit board relative to each other may be formed on only one of the substrate for mounting an IC chip and the multilayered printed circuit board.

Further, in this step, the substrate for mounting an IC chip and the multilayered printed circuit board are connected to each other using their solder bumps. Therefore, even when there is slight positional deviation between the substrate for mounting an IC chip and the multilayered printed circuit board at the time of disposing them to be confronting each other, it is possible to dispose them at their respective predetermined positions by the self-alignment effect of solders during reflow.

Next, a resin composition for sealing is made to flow between the substrate for mounting an IC chip and the multilayered printed circuit board and a curing treatment is conducted to the resin composition for sealing, thereby forming a sealing resin layer. The resin composition for sealing may be caused to infiltrate between the substrate for mounting an IC chip and the multilayered printed circuit board by applying the resin composition for sealing around the substrate for mounting an IC chip using a dispenser or the like and leaving the resin composition for sealing as it is. Alternatively, the resin composition for sealing may be applied using a syringe.

Examples of the resin composition for sealing include the same composition as that used in the manufacturing method of the device for optical communication according to the second aspect of the second group of the present invention and the like.

Herein, the viscosity of the resin composition for sealing made to flow between the substrate for mounting an IC chip and the multilayered printed circuit board and conditions for the curing treatment after the resin composition for sealing is made to flow therebetween may be appropriately selected based on the composition of the resin composition for sealing, the design of the substrate for mounting an IC chip and the multilayered printed circuit board and the like. Specifically, the viscosity of the resin composition, for example, is desirably 20 to 100 cps (mP·s).

Next, an IC chip is mounted on the substrate for mounting an IC chip and, thereafter, the IC chip is sealed with resin, based on necessity, thereby providing a device for optical communication.

The mounting of the IC chip can be performed by a conventionally well-known method.

Alternatively, the device for optical communication may be obtained by mounting the IC chip before connecting the substrate for mounting an IC chip to the multilayered printed circuit board and then connecting the substrate for mounting an IC chip on which the IC chip is mounted to the multilayered printed circuit board.

Next, the fifth group of the present invention will be described.

A substrate for mounting an IC chip according to the first aspect of the fifth group of the present invention will first be described.

The substrate for mounting an IC chip according to the first aspect of the fifth group of the present invention is a substrate for mounting an IC chip comprising: a substrate, as serially built up on both faces thereof, a conductor circuit and an interlaminar insulating layer in an alternate fashion and in repetition; a solder resist layer formed as an outermost layer; and an optical element mounted thereto, wherein an optical waveguide is formed inside the substrate for mounting an IC chip, and an optical path for transmitting optical signal which connects the optical element to the optical waveguide is formed.

Since the optical waveguides are formed inside and the optical path for transmitting optical signal penetrating the substrate for mounting an IC chip connecting the optical elements to the optical waveguides, respectively are provided in the substrate for mounting an IC chip according to the first aspect of the fifth group of the present invention, it is possible to transmit input and output signals for the optical elements through the optical waveguides and optical paths for transmitting optical signal. In addition, when an IC chip is mounted on the substrate, the distance between the IC chip and each of the optical elements is short and the reliability of the transmission of an electric signal is excellent.

Further, in the substrate for mounting an IC chip on which the IC chip is mounted according to the first aspect of the fifth group of the present invention, since electronic components and optical elements necessary for optical communication can be provided integrally, it is possible to contribute to making a terminal device for optical communication small in size.

When the optical elements are to be mounted on the surface of the substrate, the optical elements are mounted thereon after forming conductor circuits and interlaminar insulating layers for the substrate for mounting an IC chip. Therefore, at the time of a heat treatment for forming the conductor circuits, the interlaminar insulating layers and the like, the optical elements are not mounted yet and positional deviation which may possibly occur during the heat treatment does not occur.

Moreover, when the optical elements are mounted on the surface of the substrate and a defect occurs to one of the optical elements, it suffices to replace only the defective optical element, thus advantageously ensuring good cost efficiency.

Furthermore, in the substrate for mounting an IC chip according to the first aspect of the fifth group of the present invention, the optical waveguides are formed inside the substrate for mounting an IC chip, the adherence of foreign matters to the wall faces of the optical waveguides is prevented and the irregular reflection of light is decreased. It is therefore possible to improve optical signal transmission characteristic.

According to the present invention, the optical waveguides are formed inside the substrate for mounting an IC chip.

Examples of each of the optical waveguide include an organic optical waveguide made of a polymer material or the like, an inorganic optical waveguide comprising a compound semiconductor or the like, and the like. Among them, the organic optical waveguide is desirable. This is because the organic optical waveguide is excellent in adhesion to the interlaminar insulating layer, easy to work with and can be obtained at low cost.

As the polymer material, a conventionally well-known polymer material can be used. Specific examples of the polymer material include acrylic resin such as PMMA (polymethyl methacrylate), PMMA deuteride and PMMA deuteride fluoride; polyimide resin such as polyimide fluoride; epoxy resin; UV cured epoxy resin; polyolefin resin; silicone resin such as silicone resin deuteride; siloxane resin; polymer produced from benzocyclobutene and the like.

Further, when each of the optical waveguides is an optical waveguide for multi-mode, a material for the optical waveguide is desirably acrylic resin, epoxy resin or UV cured epoxy resin. When each of the optical waveguide is an optical waveguide for single-mode, a material for the optical waveguide is desirably polyimide resin, silicone resin or siloxane resin.

The core of each of the optical waveguides has desirably a thickness of 1 to 100 μm and a width of 1 to 100 μm. When the width is less than 1 μm, it is often difficult to form the optical waveguide. When the width exceeds 100 μm, this sometimes hampers the degree of freedom for the design of the conductor circuits and the like that constitute the multilayered printed circuit board.

Furthermore, the ratio of the thickness to width of the core of each of the optical waveguides is desirably close to 1:1. This is because the planar shapes of the light receiving part of the light receiving element and the light emitting part of the light emitting part are normally circular shapes. It is noted that the ratio of thickness to width is not limited to a specific one but may be normally in the range of about 1:2 to 2:1.

Moreover, when each of the optical waveguides is an optical waveguide for single-mode having a communication wavelength of 1.31 μm or 1.55 μm, the core thereof has a thickness and a width of more desirably 5 to 15 μm, particularly desirably about 10 μm. In addition, when each of the optical waveguides is an optical waveguide for multi-mode having a communication wavelength of 0.85 μm, the core thereof has a thickness and a width of more desirably 20 to 80 μm, particularly desirably about 50 μm.

Further, particles may be contained in the optical waveguides. By incorporating the particles in the optical waveguides, it is made difficult to cause cracks to occur to the optical waveguides. Namely, when no particles are contained in the optical waveguides, cracks often occur to the optical waveguides due to the difference in thermal expansion coefficient between the optical waveguides and the other layers (the substrate, the interlaminar insulating layers and the like). However, when particles are contained in the optical waveguides and the thermal expansion coefficient of the optical waveguides is prepared to narrow the difference in thermal expansion coefficient between the optical waveguides and the other layers, it is possible to make it more difficult to cause cracks to occur to the optical waveguides.

Specific examples of the particles include the same as those used for the optical waveguides formed on the multilayered printed circuit board that constitute the device for optical communication according to the first aspect of the second group of the present invention and the like.

Further, the shape of the particles is not limited to a specific one but the particles may be spherical, elliptic, friable, polygonal or the like. Among these shapes, the spherical shape or the elliptic shape is desirable. This is because the spherical or elliptic particle has no corners, which makes it more difficult to cause cracks and the like to occur to the optical waveguides.

When the particles are spherical or elliptic, light is less likely to be reflected by the particles, thus lowering optical signal loss.

In addition, it is desirable that the particle diameter of the particles is smaller than a communication wavelength. When the particle diameter is larger than the communication wavelength, this often hampers optical signal transmission.

It is more desirable that the lower limit and upper limit of the particle diameter are 0.01 μm and 0.8 μm, respectively.

When particles out of this range are included, a particle size distribution becomes too wide. At the time of mixing the particles into a resin composition, the variation of the viscosity of the resin composition grows, thereby deteriorating reproducibility in preparing the resin composition and making it difficult to prepare a resin composition having a predetermined viscosity.

The lower limit and upper limit of the particle diameter are more desirably 0.1 μm and 0.8 μm, respectively. When the particle diameter falls within the range, the resin composition can be suitably applied using a spin coater, a roll coater or the like and it is easier to prepare the resin composition into which particles are mixed to have a predetermined viscosity.

The lower limit and upper limit of the particle diameter are particularly desirably 0.2 μm and 0.6 μm, respectively. This range is particularly suitable for the application of the resin composition and the formation of the cores of the optical waveguides. Besides, within this range, the variation among the formed optical waveguides, particularly that of the cores is minimized, thus ensuring particularly excellent device for optical communication in its characteristics.

When the particles having particle diameters within this range are used, two or more kinds of particles having different particle diameters may be included. The particles are desirably inorganic particles, which comprise titania or alumina. It is also desirable to use particles having a mixture composition formed by mixing and dissolving at least two kinds of silica, titania and alumina.

The lower limit of the mixing quantity of the particles is desirably 10% by weight, more desirably 20% by weight. The upper limit thereof is desirably 80% by weight, more desirably 70% by weight. When the mixing quantity of the particles is less than 10% by weight, the advantage of mixing particles cannot be expected in some cases. When it exceeds 80% by weight, the transmission of optical signal is hampered in some cases.

In addition, the shape of the optical waveguides is not limited to a specific one. However, sheet-like optical waveguides are desirable because they are easy to be formed.

Moreover, when each of the optical waveguides comprises a core and a cladding, the particles may be mixed in both the core and the cladding. Desirably, no particles are mixed in the core and particles are mixed only in the cladding that covers the surrounding of the core. The reason is as follows.

When the particles are mixed in an optical waveguide, an air layer is often generated on the interface between the particles and the resin composition depending on the adhesion between the particles and the resin composition of the optical waveguide. Therefore, the air layer changes the refraction direction of light, often increasing the transmission loss of the optical waveguide. On the other hand, when the particles are mixed only in the cladding, the problem that the transmission loss of the optical waveguide increases does not occur and it is possible to make it difficult to cause cracks to occur to the optical waveguide by mixing the particles into the cladding.

In addition, when a light receiving element and a light emitting element are mounted as the optical elements on the substrate for mounting an IC chip, it is desirable that the optical waveguide formed at a position opposed to the light receiving element and the optical waveguide formed at a position opposed to the light emitting element are made of the same material. When they are made of the same material, it is easy to match the thermal expansion coefficients and the like between them and easy to form the optical waveguides.

It is further desirable that an optical path conversion mirror is formed on each of the optical waveguides. By forming the optical path conversion mirror, it is possible to change the angle of the optical path to a desired angle. Alternatively, a member having an optical path conversion part formed thereon may be disposed on the tip end portion of each of the optical waveguides in place of forming the optical path conversion mirror on each optical waveguide.

The optical path conversion mirror can be formed by cutting one end of each optical waveguide by machining.

The positions at which the optical waveguides are formed are not limited to specific ones. The optical waveguides may be formed between a plurality of interlaminar insulating layers, between the interlaminar insulating layer and the solder resist layer or between the substrate and the interlaminar insulating layer.

In the substrate for mounting an IC chip according to the first aspect of the fifth group of the present invention, the optical paths for transmitting optical signal connecting the optical elements to the optical waveguides, respectively are disposed.

In the substrate for mounting an IC chip having such optical paths for transmitting optical signal disposed therein, it is possible to exchange information between the optical elements mounted on the both faces of the substrate for mounting an IC chip by optical signal through the optical paths for transmitting optical signal.

Accordingly, it is necessary that each of these optical paths for transmitting optical signal is constituted to be able to transmit optical signal between each optical waveguide formed inside the substrate for mounting an IC chip and each optical element.

Specifically, when the optical elements are disposed on the surface of the substrate for mounting an IC chip and the optical waveguides are formed between the substrate and the interlaminar insulating layer or between a plurality of interlaminar insulating layers, it is necessary to form the optical paths for transmitting optical signal in a part of the interlaminar insulating layers and the solder resist layer so as to be able to exchange optical signal with the light receiving element or light emitting element as the optical element.

The optical path for transmitting optical signal may comprise a cavity, a resin composition capable of causing optical signal to pass and a cavity, or a resin composition capable of causing optical signal to pass. When the optical path for transmitting optical signal comprises a cavity, formation thereof is easy. When the optical path for transmitting optical signal comprises a resin composition and a cavity, or comprises a resin composition it is possible to prevent the deterioration of the strength of the substrate for mounting an IC chip.

When the optical path for transmitting optical signal comprises a resin composition and a cavity, it is desirable that the optical path for transmitting optical signal formed in the interlaminar insulating layers comprises the resin composition and that formed in the solder resist layer comprises the cavity. This is because normally, the interlaminar insulating layers are high in adhesion to resin and the solder resist layer is low in adhesion thereto.

When a part of or all of each of the optical path for transmitting optical signal comprises a resin composition, the resin component of the resin composition is not limited to specific one as long as the resin component is less absorbed in a communication wavelength band. Examples of the resin component include thermosetting resin, thermoplastic resin, photosensitive resin, resin obtained by photosensitizing a part of thermosetting resin and the like.

Specifically, examples of the resin component include epoxy resin, UV cured epoxy resin, polyolefin resin, acrylic resin such as PMMA (polymethyl methacrylate), PMMA deuteride and PMMA deuteride fluoride; polyimide resin such as polyimide fluoride; silicone resin such as silicone resin deuteride; polymer produced from benzocyclobutene and the like.

Further, the resin composition may contain such particles as resin particles, inorganic particles and metal particles in addition to the resin component. By incorporating these particles in the resin composition, it is possible to match the thermal expansion coefficients of the optical paths for transmitting optical signal, the substrate, the interlaminar insulating layers, the solder resist layers and the like and impart flame resistance to the resin composition depending on the types of the particles.

When particles are contained in the resin composition, it is desirable that the refractive index of the particles is almost equal to that of the resin component of the resin composition. Therefore, when particles are contained in the in the resin composition, it is desirable to mix two kinds of particles having different refractive indexes together to set the refractive index of the particles almost equal to that of the resin component.

Specifically, when the resin component is, for example, epoxy resin having a refractive index of 1.53, it is desirable to use a mixture of silica particles having a refractive index of 1.54 and titania particles having a refractive index of 1.52.

Examples of a method of mixing up the particles include a kneading method and a method of dissolving and mixing up two or more kinds of particles and then forming them into particle shape.

Examples of the resin particles, inorganic particles and metal particles include the same resin particles as those contained in the optical paths for transmitting optical signal that constitute the substrate for mounting an IC chip according to the first aspect of the first group of the present invention and the like.

These resin particles, inorganic particles and metal particles may be used alone or in combination of two or more kinds of them.

The particles are desirably inorganic particles, which desirably comprise silica, titania or alumina. It is also desirable to use particles having a mixture composition obtained by mixing and dissolving at least two kinds of silica, titania and alumina.

The shape of the particles such as the resin particles is not limited to specific one and examples of the particles include a spherical shape, an elliptic shape, a friable shape, a polygonal shape and the like.

The particle diameter of the particles is desirably smaller than a communication wavelength. When the particle diameter is larger than the communication wavelength, the transmission of optical signal is hampered in some cases.

The lower limit and upper limit of the particle diameter are desirably 0.01 µm and 0.8 µm, respectively. When the particles include those exceeding the range, a particle size distribution becomes too wide. At the time of mixing the particles into the resin composition, the variation of the viscosity of the resin composition grows, thereby deteriorating reproducibility in preparing the resin composition and making it difficult to prepare a resin composition having a predetermined viscosity. The viscosity of the resin composition prepared at the time of forming the optical paths for transmitting optical signal is desirably 100000 to 300000 cps (mP·s).

The lower limit and upper limit of the particle diameter are more desirably 0.1 µm and 0.8 µm, respectively. When the particle diameter falls within the range, the resin composition is ensured to be filled into a through hole at the time of applying and filling the resin composition thereto using a spin coater or a roll coater. In addition, at the time of preparing the resin composition into which particles are mixed, it becomes easier to adjust the resin composition to have a predetermined viscosity.

The lower limit and upper limit of the particle diameter are particularly desirably 0.2 μm and 0.6 μm, respectively. When the particle diameter falls within the range, it becomes easier to fill the resin composition particularly into the through holes. Besides, the variation of the optical waveguides thus formed is minimized, ensuring particularly excellent characteristics for the substrate for mounting an IC chip.

When the particles having particle diameters within this range are used, two or more kinds of particles having different particle diameters may be included.

The lower limit of the mixing quantity of the particles is desirably 10% by weight, more desirably 20% by weight. The upper limit thereof is desirably 50% by weight, more desirably 40% by weight.

When the mixing quantity of the particles is less than 10% by weight, the effect of mixing particles cannot be expected in some cases. When it exceeds 50% by weight, the transmission of optical signal is hampered in some cases. When the mixing quantity falls within the range of 20 to 40% by weight, even the occurrence of the aggregation or dispersion of particles does not influence optical signal transmission characteristic.

Further, the shape of the optical paths for transmitting optical signal is not limited to a specific one and examples of the shape include columnar, elliptical columnar, quadrangular columnar, polygonal columnar or the like. Among them, the columnar shape is desirable. This is because the influence of this shape on the transmission of optical signal is the smallest and it is easy to form the optical path into a cylindrical shape.

The lower limit and upper limit of the cross-sectional diameter of each of the optical paths for transmitting optical signal are desirably 100 μm and 500 μm, respectively. When the cross-sectional diameter is less than 100 μm, the optical path may possibly be closed. When at least a part of the optical path for transmitting optical signal comprises a resin composition, it is difficult to fill the optical path with an uncured resin composition. On the other hand, even when the cross-sectional diameter exceeds 500 μm, the optical signal transmission characteristic does not improve so greatly and such a large cross-sectional diameter often hampers the degree of freedom for the design of conductor circuits and the like that constitute the substrate for mounting an IC chip.

The lower limit and upper limit of the cross-sectional diameter are more desirably 250 μm and 350 μm, respectively. When they fall within this range, both the optical signal transmission characteristic and the degree of freedom for design are excellent and no problem occurs even when the optical path is filled with the uncured resin composition.

The cross-sectional diameter of each of the optical paths for transmitting optical signal means the diameter of a cross section when the optical path for transmitting optical signal is cylindrical, the longer diameter of the cross section when the optical path for transmitting optical signal is elliptic, and the length of the longest portion of the cross section when the optical path for transmitting optical signal is prismatic or polygonal.

It is also desirable that each of the optical paths for transmitting optical signal may comprise a cavity and/or a resin composition and a conductor layer around the cavity. Examples of the conductor layer include the same conductor layer formed in the optical path for transmitting optical signal of the substrate for mounting an IC chip according to the first aspect of the first group of the present invention and the like.

By forming the conductor layer, it is possible to decrease the irregular reflection of light on the wall faces of the optical path for transmitting optical signal and improve the optical signal transmission characteristic. The conductor layer can serve as a via-hole, in some cases.

Furthermore, similarly to the substrate for mounting an IC chip according to the first aspect of the first group of the present invention, a covering layer or a roughened layer may be provided on the conductor layer. By providing the covering layer or roughened layer, it is possible to further decrease the irregular reflection of light and improve the adhesion between the optical path for transmitting optical signal and the substrate or the interlaminar insulating layer.

In addition, the optical path for transmitting optical signal comprising the resin composition or the conductor layer may contact with the substrate or the interlaminar insulating layer through the roughened layer. When each of the optical path for transmitting optical signal or the like contacts with the substrate or the interlaminar insulating layer through the roughened layer, the adhesion thereof to the substrate or the interlaminar insulating layer is excellent to make it more difficult to cause the optical path for transmitting optical signal or the like to be peeled off.

Furthermore, the optical elements such as a light receiving element and a light emitting element are mounted on the substrate for mounting an IC chip according to the first aspect of the fifth group of the present invention.

Specific examples of the light receiving element and light emitting element include the same light receiving element and light emitting element as those mounted on the substrate for mounting an IC chip according to the first aspect of the first group of the present invention and the like.

The positions at which the optical elements are mounted are desirably on the surface of the substrate for mounting an IC chip. As mentioned above, when the optical elements are mounted on the surface of the substrate for mounting an IC chip and a defect occurs to one of the optical elements, it suffices to replace only the defective optical element.

It is also desirable that electronic components such as a capacitor and the like are mounted on the surface of the substrate for mounting an IC chip. This is because it is possible to replace only a defective electronic component similarly to the optical elements.

It is desirable that a micro lens is formed on the end portion of each of the optical paths for transmitting optical signal or in each of the optical paths for transmitting optical signal. By forming the micro lens, it is possible to further suppress the optical signal transmission loss.

Herein, the structure in which a micro lens is formed on the end portion of each of the optical paths for transmitting optical signal means a structure in which the micro lens is disposed to cover the end portion of the optical path for transmitting optical signal through an adhesive layer formed on the solder resist layer, a structure in which the optical path for transmitting optical signal comprises the resin composition or a structure in which the micro lens is formed on the resin composition.

On the other hand, the structure in which a micro lens is formed in each of the optical paths for transmitting optical signal means a structure in which when each of the optical paths for transmitting optical signal comprises a resin composition and a cavity, the micro lens is formed on the resin composition inside the optical path for transmitting optical signal. In some cases, the resin composition may comprise two layers and the micro lens may be formed between the upper resin composition layer and the lower resin composition layer.

Examples of the micro lens include the same micro lens formed on the substrate for mounting an IC chip according to the first aspect of the first group of the present invention and the like.

Furthermore, in the substrate for mounting an IC chip according to the first aspect of the fifth group of the present invention, it is desirable that the conductor circuits across the substrate are connected to each other through a plated-through hole and that the conductor circuits across the interlaminar insulating layers are connected to each other through a via-hole. This is because it is possible to make the substrate for mounting an IC chip small in size while realizing the high-density wiring of the substrate for mounting an IC chip by doing so.

Next, the embodiments of the substrate for mounting an IC chip according to the first aspect of the fifth group of the present invention will be described with reference to the drawings.

Figure 63:
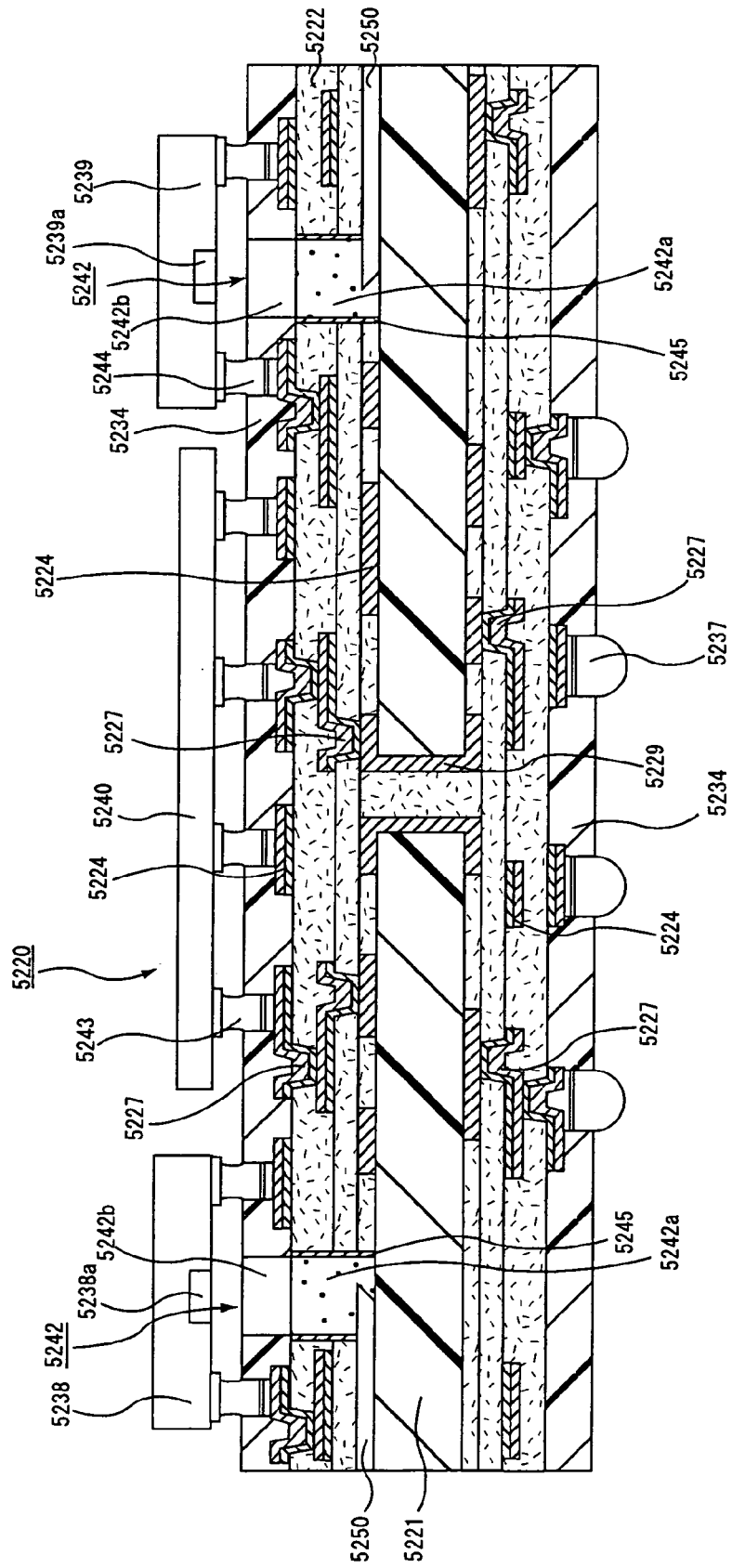
FIG. 63 is a cross-sectional view schematically showing one embodiment of a substrate for mounting an IC chip according to the first aspect of the fifth group of the present invention.

FIG. 63 is a cross-sectional view schematically showing one embodiment of the substrate for mounting an IC chip according to the first aspect of the fifth group of the present invention. FIG. 63 shows the substrate for mounting an IC chip in a state where an IC chip is mounted.

As shown in FIG. 63, the substrate for mounting an IC chip 5220 is constituted so that conductor circuits 5224 and interlaminar insulating layers 5222 are built up on both faces of a substrate 5221 in an alternate fashion and in repetition and that the conductor circuits across the substrate 5221 and the conductor circuits across the interlaminar insulating layers 5222 are connected to one another by a plated-through hole 5229 and via-holes 5227, respectively. In addition, a solder resist layer 5234 is formed on each outermost layer of the substrate for mounting an IC chip 5220.

Further, optical waveguides 5250 as well as the outermost layer conductor circuits 5224 are formed on the surface of the substrate 5221. In portions of the tip ends of the optical waveguides 5250 in which optical path conversion mirrors are formed, optical paths for transmitting optical signal 5242 connecting optical element (a light receiving element 5238 and a light emitting element 5239) disposed on the surface of the substrate for mounting an IC chip 5220 to the optical waveguides 5250 are formed in a perpendicular direction to the substrate 5221, respectively. Each of the optical paths for transmitting optical signal 5242 comprises a resin composition 5242a, a cavity 5242b and a conductor layer 5245 formed around the resin composition 5242a and the cavity 5242b.

It is noted that each of the optical paths for transmitting optical signal may be formed out of a cavity or the conductor layer may not be formed around the cavity and/or the resin composition.

As mentioned above, the light receiving element 5238 and the light emitting element 5239 are mounted through solder connection parts 5244 so that a light receiving part 5238a and a light emitting part 5239a are opposed to the optical paths for transmitting optical signal 5542, respectively and an IC chip 5240 is surface-mounted through solder connection parts 5243 on one face of the substrate for mounting an IC chip 5520. Further, solder bumps 5237 are formed on the solder resist layer 5234 on the other face of the substrate for mounting an IC chip 5220.

In the substrate for mounting an IC chip 5220 having the above-mentioned, optical signal sent from the outside through an optical fiber or the like (not shown) is received by the light receiving element 5238 (light receiving part 5238a) through the optical path for transmitting optical signal 5242, converted into an electric signal by the light receiving element 5238, and then transmitted to the IC chip 5240 through the solder connection parts 5243 and 5244, the conductor circuits 5224, the via-holes 5227, the plated-through hole 5229 and the like.

An electric signal sent from the IC chip 5240 is transmitted to the light emitting element 5239 through the solder connection parts 5243 and 5244, the conductor circuits 5224, the via-holes 5227, the plated-through hole 5229 and the like, and converted into optical signal by the light emitting element 5239. The optical signal transmitted from the light emitting element 5239 (light emitting part 5239a) is transmitted to the external optical element (such as the optical fiber) through the optical path for transmitting optical signal 5242 and the optical waveguide 5250.

In the substrate for mounting an IC chip according to the first aspect of the fifth group of the present invention, the light receiving element and the light emitting element mounted on positions close to the IC chip perform optical/electric signal conversion. Therefore, an electric signal transmission distance is short, the reliability of signal transmission is excellent and it is thereby possible to deal with higher rate communication.

In addition, in the substrate for mounting an IC chip 5220, the solder bumps 5237 are formed on the solder resist layer 5234 through a metal plated layer. Therefore, the electric signal sent from the IC chip is not only converted into optical signal as mentioned above, but also transmitted to the outside through the optical path for transmitting optical signal 5242 and the like through the solder bumps.

When the solder bumps are formed as mentioned above, it is possible to connect the substrate for mounting an IC chip to an external substrate through the solder bumps. In this case, it is possible to dispose the substrate for mounting an IC chip at a predetermined position by the self-alignment function of solders.

In case of utilizing this self-alignment function, even when the positions of the substrate for mounting an IC chip and the external substrate are deviated before reflow at the time of connecting the substrate for mounting an IC chip to the external substrate through the solder bumps, the substrate for mounting an IC chip moves during the reflow and can be attached to an accurate position on the external substrate.

Therefore, when optical signal is to be transmitted through the light receiving element and the light emitting element mounted on the substrate for mounting an IC chip and optical elements mounted on the external substrate, it is possible to accurately transmit the optical signal between the substrate for mounting an IC chip and the external substrate as long as the positions at which the light receiving element and the light emitting element are mounted on the substrate for mounting an IC chip are accurate.

Figure 64:
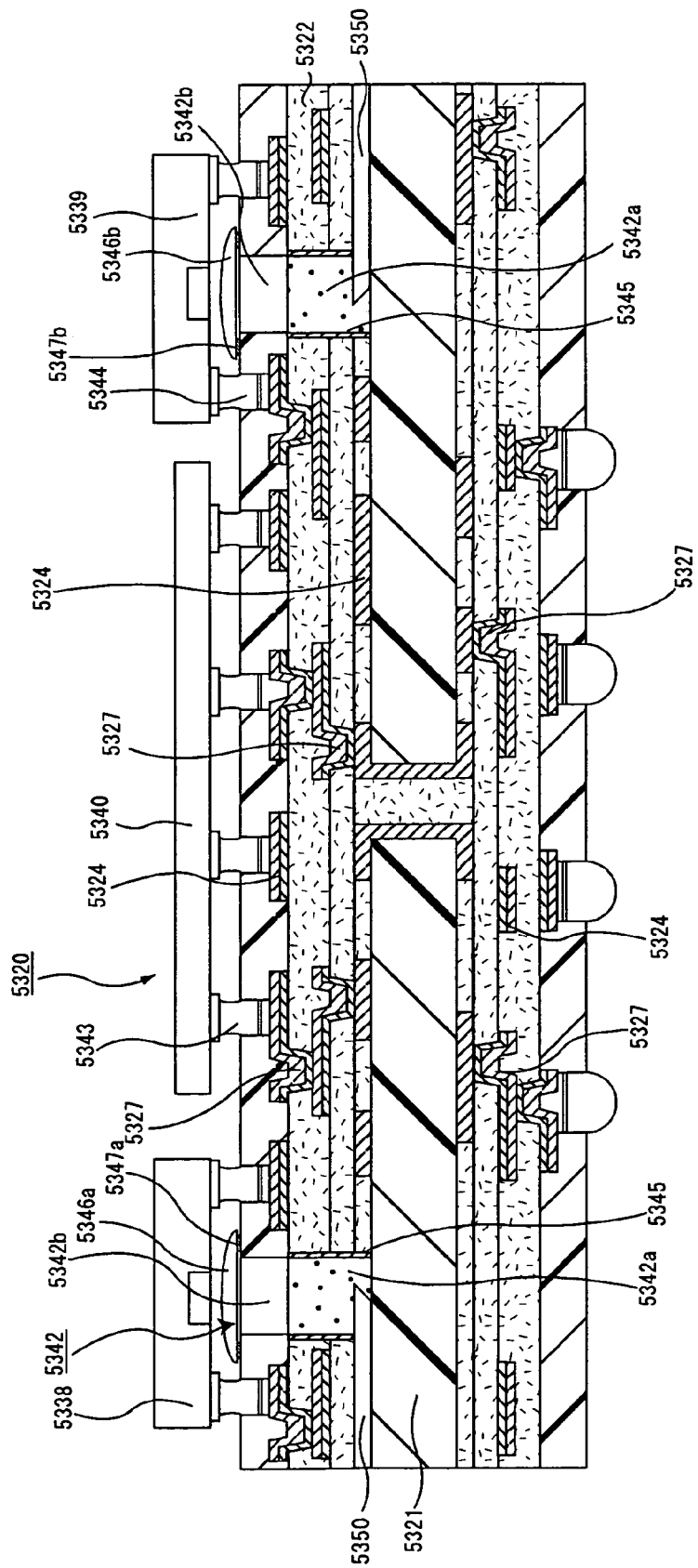
FIG. 64 is a cross-sectional view schematically showing another embodiment of the substrate for mounting an IC chip according to the first aspect of the fifth group of the present invention.

FIG. 64 is a cross-sectional view schematically showing another embodiment of the substrate for mounting an IC chip according to the first aspect of the fifth group of the present invention. It is noted that FIG. 64 shows the substrate for mounting an IC chip in a state where an IC chip is mounted.

The substrate for mounting an IC chip 5320 shown in FIG. 64 is constituted so that micro lenses 5346a and 5346b are disposed on the end portions of optical paths for transmitting optical signal 5342, each of which comprises a resin composition 5342a, a cavity 5342b and a conductor layer 5345, through adhesive layers 5347a and 5347b, respectively.

By thus disposing the micro lenses, it is possible to suppress the optical signal transmission loss.

The embodiment of the substrate for mounting an IC chip 5320 is equal to the substrate for mounting an IC chip 5220 except that the micro lenses 5346a and 5346b are disposed.

Further, in FIG. 64, reference symbol 5321 denotes a substrate, 5322 denotes an interlaminar insulating layer, 5324 denotes a conductor circuit, 5327 denotes a via-hole, 5338 denotes a light receiving element, 5339 denotes a light emitting element, 5340 denotes an IC chip, 5343 and 5344 denote solder connection parts and 5350 denotes an optical waveguide.

Figure 78:
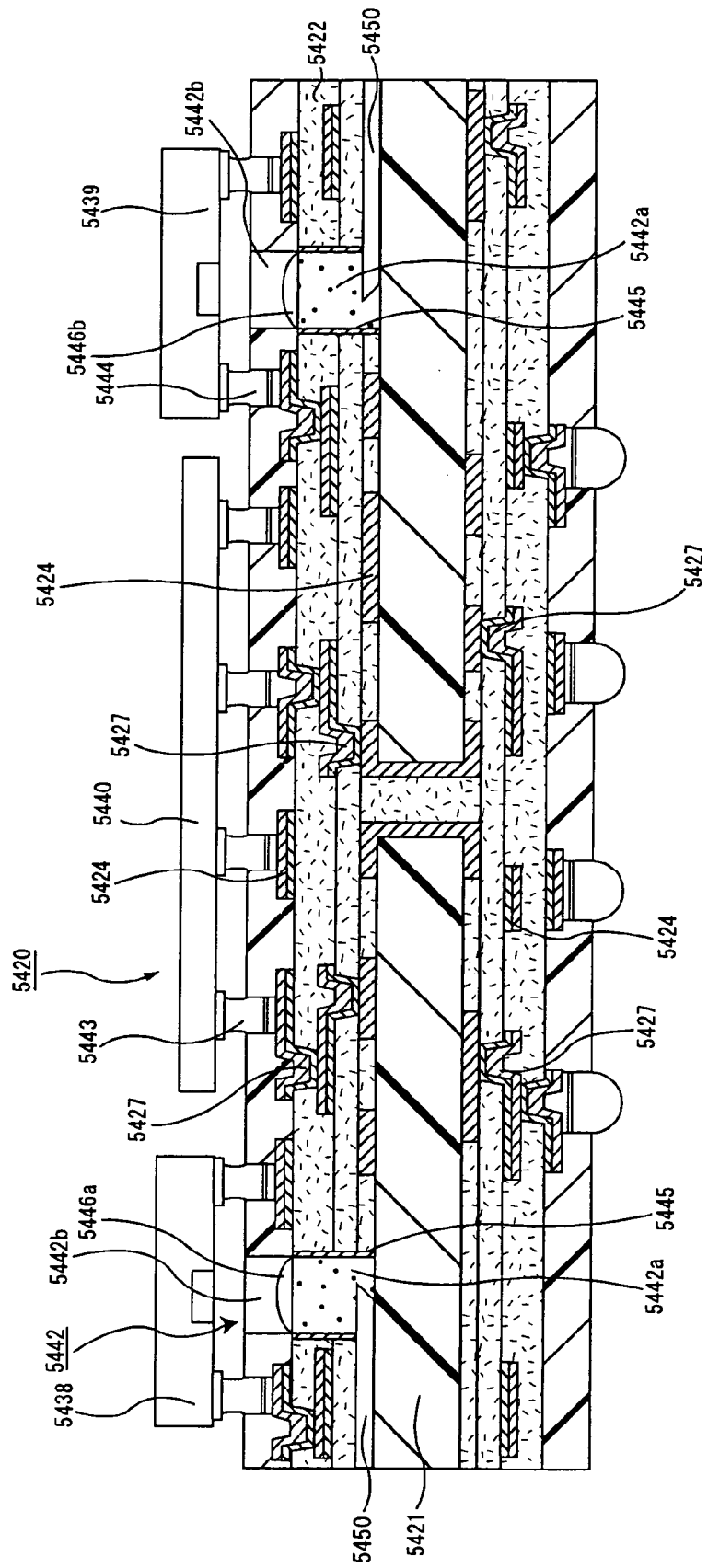
FIG. 78 is a cross-sectional view schematically showing another embodiment of the substrate for mounting an IC chip according to the third aspect of the fifth group of the present invention.

Furthermore, FIG. 78 is a cross-sectional view schematically showing still another embodiment of the substrate for mounting an IC chip according to the first aspect of the fifth group of the present invention. It is noted that FIG. 78 shows the substrate for mounting an IC chip in a state where an IC chip is mounted.

The substrate for mounting an IC chip 5420 shown in FIG. 78 is constituted so that micro lenses 5446a and 5446b are formed on a resin compositions 5442a of optical paths for transmitting optical signal 5442 each comprising the resin composition 5442a, a cavity 5442b and a conductor layer 5445, respectively.

By thus forming the micro lenses, it is possible to suppress the optical signal transmission loss.

It is noted that the embodiment of the substrate for mounting an IC chip 5420 is equal to the substrate for mounting an IC chip 5220 except that the micro lenses 5446a and 5446b are formed in the respective optical paths for transmitting optical signal 5442.

Further, in FIG. 78, reference symbol 5421 denotes a substrate, 5422 denotes an interlaminar insulating layer, 5424 denotes a conductor circuit, 5427 denotes a via-hole, 5438 denotes a light receiving element, 5439 denotes a light emitting element, 5440 denotes an IC chip, 5443 and 5444 denote solder connection parts and 5450 denotes an optical waveguide.

In addition, such a substrate for mounting an IC chip 5420 is constituted so that each optical path for transmitting optical signal 5442 comprise a resin composition and that the micro lenses 5446a and 5446b are formed on the end portions of the respective optical paths for transmitting optical signal 5442.

The substrate for mounting an IC chip constituted as mentioned above according to the first aspect of the fifth group of the present invention can be manufactured by a manufacturing method of a substrate for mounting an IC chip according to the second or third aspect of the fifth group of the present invention.

The manufacturing method of the substrate for mounting an IC chip according to the second aspect of the fifth group of the present invention will next be described.

In the manufacturing method of the substrate for mounting an IC chip according to the second aspect of the first group of the present invention, a substrate, an optical waveguide, and a lamination manufactured through at least the following steps (a) to (c) are built up in this order: (a) a conductor circuit lamination formation step of serially building up conductor circuits and interlaminar insulating layers on a base material layer in an alternate fashion and in repetition to provide a conductor circuit lamination; (b) an opening formation step of forming an opening which becomes an optical path for transmitting optical signal in the conductor circuit lamination; and (c) a solder resist layer formation step of forming a solder resist layer having an opening communicating with the opening formed in the step (b), on one face of the conductor circuit lamination.

In the substrate for mounting an IC chip according to the second aspect of the fifth group of the present invention, the optical waveguides are formed inside the substrate for mounting an IC chip and the openings communicating with the conductor circuit lamination and the solder resist layer are formed. The openings communicating therewith can serve as optical paths for transmitting optical signal, so that the substrate for mounting an IC chip manufactured by the manufacturing method according to the second aspect of the fifth group of the present invention can suitably transmit optical signal between the optical elements and the optical waveguides through the optical paths for transmitting optical signal when optical elements are mounted on the substrate for mounting an IC chip.

Further, in the manufacturing method of the substrate for mounting an IC chip according to the second aspect of the fifth group of the present invention, the number of steps which require heat treatments is small after the step of forming the optical waveguides. This makes it difficult to cause the positional deviation of the optical waveguides derived from the deformation of the substrate and the interlaminar insulating layers during the heat treatment to occur, thus making it possible to suitably manufacture the substrate for mounting an IC chip excellent in connection reliability.

In the manufacturing method of the substrate for mounting an IC chip according to the second aspect of the fifth group of the present invention, after (A) a substrate manufacturing step; (B) an optical waveguide manufacturing step; (C) a lamination manufacturing step are executed, (D) a building-up step of building up the substrate, the optical waveguides and the lamination manufactured in these step in this order is executed, whereby it is possible to manufacture a substrate for mounting an IC chip.

These steps will now be described in this order.

(A) Substrate Manufacturing Step

Using an insulating substrate as a starting material, if necessary, conductor circuits are formed on the insulating substrate.

Examples of the insulating substrate include the same insulating material as that used in the step (1) of the step (a) of the manufacturing method of the substrate for mounting an IC chip according to the second aspect of the first group of the present invention and the like.

In addition, in the case of forming the conductor circuits on the substrate, the same method as that used in the step (1) of the step (a) of the manufacturing method of the substrate for mounting an IC chip according to the second aspect of the first group of the present invention and the like may be used. Further, a plated-through hole may be formed similarly to the step (1) of the step (a) of the manufacturing method of the substrate for mounting an IC chip according to the second aspect of the first group of the present invention.

(B) Optical Waveguide Manufacturing Step

Optical waveguides formed into film shape are formed in this step.

When each of the optical waveguides is an organic optical waveguide made of a polymer material or the like, the organic optical waveguide can be formed by forming a polymer material on a removable film or the like into film shape by a method using reactive ion etching, an exposure-development method, a mold formation method, a resist formation method, a combination thereof or the like. The specific methods are the same as those described as the optical waveguide formation methods in the manufacturing method of the device for optical communication according to the second aspect of the third group of the present invention.

In case of forming the optical waveguides using one of these methods, when the optical waveguides each having a core containing particles are to be formed out of a polymer material, it is desirable to use the mold formation method rather than the exposure-development method of the following reason.

When a groove for forming a core is formed in a lower cladding by mold formation and a core is formed in this groove by the mold formation method of forming the core, all the particles contained in the core enter into the core, so that the surface of the core becomes flat and excellent optical signal transmission characteristic is ensured. On the other hand, when the core is formed by the exposure-development method, a part of particles protrude from the surface of the core after development or recesses from which the particles are eliminated are formed in the core surface, with the result that irregularities are often formed on the surface of the core. The irregularities prevent light from being reflected in a desired direction, with the result that the optical signal transmission characteristic deteriorates.

Furthermore, the optical waveguides are inorganic optical waveguides comprising quartz glass, a compound semiconductor or the like, the inorganic optical waveguides can be formed by forming a film on a removable film or the like out of an inorganic material such as $LiNbO_3$ or $LiTaO_3$ by a liquid-phase epitaxial method, chemical vapor deposition method (CVD), a molecular beam epitaxial method or the like.

Further, an optical path conversion mirror is formed on each of the optical waveguides.

A method of forming the optical path conversion mirror is not limited to a specific one but a conventionally well-known method can be used. Specifically, machining using a diamond saw having a 90°-V-shaped tip end, a blade or a cutter, processing by reactive ion etching, laser abrasion or the like can be conducted to form the optical path conversion mirror. Alternatively, an optical path conversion member may be embedded into the optical waveguide in place of forming the optical path conversion mirror.

(C) Lamination Manufacturing Step

The lamination is manufactured through at least the following steps (a) to (c):

(a) a conductor circuit lamination formation step of serially building up conductor circuits and interlaminar insulating layers on a base material layer in an alternate fashion and in repetition to provide a conductor circuit lamination;

(b) an opening formation step of forming openings which become optical paths for transmitting optical signal in the conductor circuit lamination; and (c) a solder resist layer formation step of forming a solder resist layer having openings communicating with the openings formed in the step (b), on one face of the conductor circuit lamination.

First, the step (a), i.e., the conductor circuit lamination formation step will be described in order of steps. Specifically, the following steps (1) to (9) can be executed.

(1) Using a base material layer formed into film shape as a starting material, conductor circuits are formed on the base material layer.

Examples of the base material layer include a later obtained by forming uncured resin such as thermosetting resin, photosensitive resin, resin obtained by acrylating a part of thermosetting resin, a resin complex containing these resins and thermoplastic resin into film shape and curing the uncured resin, a layer obtained by forming thermoplastic resin or the like into film shape, and the like.

Examples of the thermosetting resin include epoxy resin, phenol resin, polyimide resin, polyester resin, bismaleimide resin, polyolefin resin, polyphenylene ether resin, polyphenylene resin, fluororesin and the like.

Specific examples of the epoxy resin include novolak type epoxy resins such as phenol novolak type epoxy resin and cresol novolak type epoxy resin; dicyclopentadiene-modified alicyclic epoxy resin and the like.

Examples of the photosensitive epoxy resin include acrylic resin and the like.

Further, examples of the resin obtained by acrylating a part of thermosetting resin include resin obtained by acrylating the thermosetting group of the thermosetting resin with a methacrylic acid or an acrylic acid and the like.

Examples of the thermoplastic resin include phenoxy resin, polyethersulfone (PES), polysulfone (PSF), polyphenylenesulfone (PPS), polyphenylene sulfide (PPES), polyphenyl ether (PPE), polyetherimide (PI) and the like.

Further, the resin complex is not limited to a specific one as long as the resin complex comprises thermosetting resin, photosensitive resin (including resin obtained by acrylating a part of thermosetting resin) and thermoplastic resin. Specific examples of the combination of the thermosetting resin and the thermoplastic resin include phenol resin/polyethersulfone, polyimide resin/polysulfone, epoxy resin/polyethersulfone, epoxy resin/phenoxy resin and the like. In addition, specific examples of the combination of the photosensitive resin and the thermoplastic resin include acrylic resin/phenoxy resin, epoxy resin obtained by acrylating a part of the epoxy group thereof/polyethersulfone and the like.

Furthermore, the mixing ratio of the thermosetting resin or photosensitive resin and the thermoplastic resin of the resin complex is desirably thermosetting resin or photosensitive resin/thermoplastic resin=95/5 to 50/50. With this ratio, it is possible to ensure high toughness without deteriorating heat resistance.

In addition, the base material layer may comprise two or more different resin layers.

Further, the base material layer may be obtained by forming a resin composition for roughened face formation into film shape and curing the resin composition. The resin composition for forming a roughened face will be described in detail at the time of describing the formation method of the interlaminar insulating layer later.

Furthermore, the conductor circuits formed on the base material layer can be formed by forming a conductor layer in a spread state on the surface of the base material layer by an electroless plating treatment or the like and conducting an etching treatment and the like.

Further, instead of forming the conductor circuits by conducting the etching treatment, the conductor circuits may be formed by forming a plating resist on a conductor layer in a spread state, forming an electroplated layer on non plating resist formed areas and then removing the plating resist and the conductor layers under the plating resist.

When the conductor circuits across the base material substrate are connected to each other by a plated-through hole, the plated-through hole is formed by forming a through hole for a plated-through hole in the base material substrate using a laser or the like and then conducting an electroless plating treatment or the like. The diameter of the through hole for a plated-through hole is normally 100 to 300 µm.

It is also desirable to fill the plated-through hole with a resin filler when the plated-through hole is formed.

(2) Next, the surfaces of the conductor circuits are subjected to a roughening treatment if necessary.

For the roughening treatment, the same method as that used in the step (2) of the step (a) of the manufacturing method of the substrate for mounting an IC chip according to the second aspect of the first group of the present invention or the like can be used. Further, this roughening treatment may be conducted to the wall face of the plated-through hole.

(3) Either an uncured resin layer comprising thermosetting resin, photosensitive resin, resin obtained by acrylating a part of thermosetting resin, an uncured resin layer comprising a resin complex containing one of these resins and thermoplastic resin, or a resin layer comprising thermoplastic resin is formed on the base material layer on which the conductor circuits are formed. To form these resin layers, the same resin as that used at the time of forming the base material layer and the like can be used.

Further, the uncured resin layer or resin layer comprising thermoplastic resin to be formed herein may comprise two or more different resin layers.

Specifically, the resin layer comprises upper and lower layers. The lower layer of the resin layer comprises, for example, a resin complex having a mixing ratio of thermosetting resin or photosensitive resin/thermoplastic resin=50/50 and the upper layer thereof comprises, for example, a resin complex having a mixing ratio of thermosetting resin or photosensitive resin/thermoplastic resin=90/10.

With this configuration, it is possible to ensure excellent adhesion between the resin layer and the substrate and to ensure facilitating the formation of openings for via-holes and the like in later steps.

The uncured resin layer may be formed by applying uncured resin by a roll coater, a curtain coater or the like or by thermally bonding an uncured (semi-cured) resin film.

In addition, the resin layer comprising thermoplastic resin can be formed by thermally bonding a resin formed body formed on a film.

The thermal bonding of the resin complex or resin formed body can be carried out by using a vacuum laminator or the like.

Furthermore, bonding conditions are not limited to specific ones but may be appropriately selected in view of the composition of the resin film and the like. Normally, it is desirable to carry out bonding under conditions of a pressure of 0.25 to 1.0 MPa, a temperature of 40 to 70° C., degree of vacuum of 13 to 1300 Pa, a period of time of about 10 to 120 seconds.

Further, the uncured resin layer may be formed using a resin composition for forming a roughened face.

Examples of the resin composition for forming a roughened face include the same resin composition for forming a roughened face as that used in the manufacturing method of the substrate for mounting an IC chip according to the second aspect of the first group of the present invention and the like.

(4) Next, at the time of forming an interlaminar insulating layer using the thermosetting resin or resin complex as a material therefor, a curing treatment is conducted to an uncured resin layer and openings for via-holes are formed to obtain the interlaminar insulating layer. In this step, a through hole for a plated-through hole may be formed if necessary.

When the interlaminar insulating layer is formed using thermoplastic resin as a material therefor, openings for via-holes are formed in a resin layer comprising thermoplastic resin to provide the interlaminar insulating layer.

The openings for via-holes and the through hole for a plated-through hole can be formed by the same method as that used in the step (4) of the manufacturing method of the substrate for mounting an IC chip according to the second aspect of the first group of the present invention and the like.

It is desirable that the interlaminar insulating layer formed in this step is equal in material to the base material layer.

This is because they are equal in physical properties such as a thermal expansion coefficient by using the same material.

(5) Next, a thin film conductor layer is formed on the surface of interlaminar insulating layer including the inner walls of the openings for via-holes.

The thin film conductor layer can be formed by the same method as that used in the step (5) of the step (a) of the manufacturing method of the substrate for mounting an IC chip according to the second aspect of the first group of the present invention or the like.

In this step, similarly to the step (5) of the step (a) of the manufacturing method of the substrate for mounting an IC chip according to the second aspect of the first group of the present invention, a roughened face may be formed on the surface of the interlaminar insulating layer.

In addition, when a through hole for a plated-through hole is formed in the step (4), the thin film conductor layer may be formed even on the wall face of the through hole at the time of forming the thin film conductor layer on the interlaminar insulating layer.

(6) Next, a plating resist is formed on a part of the interlaminar insulating layer on the surface of which the thin film conductor layer is formed. The plating resist can be formed using the same method as that used in the step (6) of the step (a) of the manufacturing method of the substrate for mounting an IC chip according to the second aspect of the first group of the present invention or the like.

(7) Electroplating is conducted using the thin film conductor layer as a plating lead, thereby forming an electroplated layer in non plating resist formed areas. Thereafter, the plating resist and the thin film conductor layer under the plating resist are removed, whereby conductor circuits (including via-holes) are formed.

The formation of the electroplated layer and the removal of the thin film conductor layer can be carried out using the same method as that used in the step (7) of the step (a) of the manufacturing method of the substrate for mounting an IC chip according to the second aspect of the first group of the present invention or the like.

Further, similarly to the manufacturing method of the substrate for mounting an IC chip according to the second aspect of the first group of the present invention, the conductor circuits may be formed by using a method of forming an electroplated layer on the entire surface of the thin film conductor layer and conducting an etching treatment.

Further, similarly to the manufacturing method of the substrate for mounting an IC chip according to the second aspect of the first group of the present invention, a resin filler may be filled into the plated-through hole or a cover plated layer may be formed.

(8) Next, the same steps as the steps (8) and (9) of the step (a) of the manufacturing method of the substrate for mounting an IC chip according to the second aspect of the first group of the present invention are executed, thereby building up the conductor circuits and the interlaminar insulating layers and the like in an alternate fashion and in repetition.

By executing these steps (1) to (8), it is possible to manufacture a conductor circuit lamination having conductor circuits and interlaminar insulating layers built up on both faces of the base material layer in an alternate fashion and in repetition.

While the manufacturing method of the conductor circuit lamination based on a semi-additive method has been described, the method of manufacturing the conductor circuit lamination manufactured in the step (a) is not limited to the semi-additive method-based method but a full-additive method, a subtractive method, a batch laminating method, a conformal method or the like may be used.

Among them, it is desirable to use the additive method such as the semi-additive method or the full-additive method. This is because when the additive method is used, etching accuracy is high, so that it is suitable to form finer conductor circuits and it is possible to improve the degree of freedom for the design of the conductor circuits.

After the conductor circuit lamination is manufactured through the step (a), the step (b), i.e., the opening formation step of forming openings which become optical paths for transmitting optical signal in the conductor circuit lamination is executed. The openings formed in this step serve as the optical paths for transmitting optical signal for the substrate for mounting an IC chip. Accordingly, the openings formed in this step will be referred to as "openings for transmitting optical signal" hereinafter.

The openings for transmitting optical signal are formed by a laser treatment or the like.

Examples of a laser used for the laser treatment include the same as that used to form the openings for via-holes and the like.

The positions at which the openings for transmitting optical signal are formed are not limited to specific positions but may be appropriately selected based on the design of the conductor circuits, the position at which the IC chip is mounted and the like.

Furthermore, it is desirable that the openings for transmitting optical signal are formed for respective optical elements such as the light receiving element and the light emitting element. Alternatively, they may be formed for respective signal wavelengths.

Further, after the openings for transmitting optical signal are formed, a desmear treatment may be conducted to the wall faces of the openings for transmitting optical signal if necessary.

Further, it is desirable that a roughening treatment of roughening the wall faces of the openings for transmitting optical signal is executed, if necessary, after the formation of the openings for transmitting optical signal and before the formation of a conductor layer, the filling of an uncured resin composition or the like in the following steps. It is possible to improve the adhesion between the openings for transmitting optical signal and the conductor layer or resin composition.

The desmear treatment and the formation of the roughened face can be conducted by the same method as that used in the step (b) of the manufacturing method of the substrate for mounting an IC chip according to the second aspect of the first group of the present invention or the like.

The mean roughness (Ra) of the roughened face is desirably 0.5 to 5 μm, more desirably 1 to 3 μm. When the mean roughness falls within this range, the adhesion of the roughened face to the conductor layer or the resin composition is excellent and the roughened face does not adversely influence the transmission of optical signal.

After forming the openings for transmitting optical signal, a conductor layer formation step of forming a conductor layer on the wall faces of the openings for transmitting optical signal is desirably performed if necessary. In addition, it is desirable to not only form the conductor layer but also form conductor circuits on the outermost interlaminar insulating layer in this formation step.

Specifically, the same method as the conductor layer formation step used in the step (b) of the manufacturing method of the substrate for mounting an IC chip according to the second aspect of the first group of the present invention or the like can be used.

Further, after forming the conductor layer, a roughened face may be formed on the wall face of the conductor layer similarly to the conductor layer formation step used in the step (b) of the manufacturing method of the substrate for mounting an IC chip according to the second aspect of the first group of the present invention.

It is further desirable that after forming the openings for transmitting optical signal, a resin composition filling step of filling an uncured resin composition into each of the openings is executed if necessary.

By filling the uncured resin composition thereinto and conducting a curing treatment to the resin composition, it is possible to form optical paths for transmitting optical signal each comprising a resin composition and a cavity or a resin composition.

As a specific method of filling the uncured resin composition, the same method as that used in the resin composition filling step executed so as to fill the resin composition into the optical paths for transmitting optical signal in the step (b) of the manufacturing method according to the second aspect of the first group of the present invention or the like can be used.

When the resin composition filling step is not executed, it is possible to form optical paths for transmitting optical signal each comprising a cavity.

By executing such an opening formation step as well as the roughened face formation step, the conductor layer formation step and the resin composition filling step executed if necessary, it is possible to form a part of the optical paths for transmitting optical signal in the conductor circuit lamination manufactured through the step (a).

Furthermore, independent conductor circuits can be formed by forming the conductor layer even on the surface of the interlaminar insulating layer and conducting the treatments at the time of executing the conductor circuit formation step. Needless to say, even when the step of forming the conductor layer is not executed, it is possible to form the conductor circuits on the surface of the interlaminar insulating layer based on the method.

Next, the step (c), i.e., the solder resist layer formation step of forming a solder resist layer having openings communicating with the openings formed in the step (b) is executed.

Specifically, the solder resist layer can be formed by executing the following steps (1) and (2).

It is noted that it suffices to form the solder resist layer on one face of the conductor circuit lamination.

(1) First, a solder resist composition layer is formed on one face of the conductor circuit lamination having the openings for transmitting optical signal formed therein.

Examples of the solder resist composition include the same solder resist composition as that used in the step (1) of the step (c) of the manufacturing method of the substrate for mounting an IC chip according to the second aspect of the first group of the present invention and the like.

Further, a film comprising the solder resist composition may be pressure-bonded to form the solder resist composition layer. Particularly when the openings for transmitting optical signal comprise cavities, the solder resist composition layer is desirably formed by pressure-bonding the film.

(2) Next, openings (hereinafter, also referred to as "openings for optical paths") communicating with the openings for transmitting optical signal are formed in the solder resist composition layer, thereby obtaining a solder resist layer.

Specifically, the openings for optical paths can be formed by the same method as that used in the step (2) of the step (c) of the manufacturing method of the substrate for mounting an IC chip according to the second aspect of the first group of the preset invention or the like.

Further, the cross-sectional diameter of the opening for an optical path may be smaller than that of the openings for transmitting optical signal. In this case, the cross-sectional diameter of the opening for an optical path may be set smaller than that of the openings for transmitting optical signal by 20 to 100 μm.

Through such steps (1) and (2), it is possible to form the solder resist layer having openings communicating with the openings for transmitting optical signal on one face of the conductor circuit lamination on which the openings for transmitting optical signal are formed.

In the manufacturing method of the substrate for mounting an IC chip according to the second aspect of the fifth group of the present invention, the solder resist layer may be formed after the building-up step (D) to be described later.

Furthermore, when the uncured resin composition is filled into each of the openings for transmitting optical signal in the opening formation step (b), an uncured resin composition may be filled in each of the openings for optical paths formed in the solder resist layer by the same method as that used for the openings for transmitting optical signal. By thus filling the uncured resin composition into each of the openings for optical paths of the solder resist layer and then conducting a curing treatment to the uncured resin composition, it is possible to form optical paths for transmitting optical signal each comprising a resin composition.

After executing these steps (a) to (c), solder pads are formed by the following method, whereby a lamination can be manufactured.

Namely, conductor circuit portions exposed by forming the openings for forming solder bumps are covered with corrosion resistant metal such as nickel, palladium, gold, silver and platinum, thereby providing solder pads if necessary. Among the corrosion resistant metallic materials, it is desirable to use nickel-gold, nickel-silver, nickel-palladium, nickel-palladium-gold or the like to form a covering layer.

The covering layer may be formed by plating, vapor deposition, electrodeposition or the like. Among them, plating is desirable from a viewpoint that the covering layer is excellent in evenness at the time of being formed by plating.

(D) Building-up Step

The optical waveguides manufactured in the step (B) and the lamination manufactured in the step (C) are built up on the substrate manufactured in the step (A).

This building-up is desirably performed by thermal bonding and can be performed using a vacuum laminator or the like.

In addition, bonding conditions are not limited to specific ones but may be appropriately selected based on the compositions of the resin used for the optical waveguides and the lamination. Normally, it is desirable to conduct thermal bonding under conditions of vacuum or reduced pressure, a pressure of 0.2 to 1.0 MPa, a temperature of 50 to 200° C., a period of time of about 30 to 600 seconds.

Furthermore, the optical waveguides may be formed on the substrate in advance and the lamination may be then built up on the optical waveguides or the optical waveguides may be formed on the outermost insulating layer of the lamination in advance and the resultant lamination may be built up on the substrate.

Moreover, after finishing the building-up step, a micro lens formation step of forming micro lenses on the end portions of the respective optical paths for transmitting optical signal may be executed if necessary. By executing this step, it is possible to further suppress the optical signal transmission loss.

In the case of forming the micro lenses on the end portions of the optical paths for transmitting optical signal, respectively, the micro lenses may be disposed on the end portions thereof through an adhesive layer formed on the solder resist layer (see FIG. 64). When each of the optical paths for transmitting optical signal comprises a resin composition, the micro lenses may be directly formed on the resin compositions, respectively.

Examples of a method of directly forming a micro lens on each of the resin compositions include a method of dropping an appropriate quantity of uncured resin for an optical lens onto the resin composition and conducting a curing treatment to the dropped uncured resin for an optical lens, and the like. It is desirable that the uncured resin for an optical lens has a viscosity of 10 to 50 cps (mP·s). When the viscosity falls within this range, the resin becomes semispherical by surface tension at the time of dropping the resin.

At the time of dropping an appropriate quantity of the uncured resin for an optical lens onto the resin composition by the method, such a device as a dispenser, an inkjet, a micro pipette or a micro syringe can be employed. Since the uncured resin for an optical lens dropped onto the resin composition using such a device is to become semispherical by the surface tension thereof, the resin becomes semispherical on the resin composition. Thereafter, by curing the semispherical uncured resin for an optical lens, it is possible to form a semispherical micro lens on the resin composition.

Examples of the resin for an optical lens include the same polymer material as that described for the optical waveguides of the substrate for mounting an IC chip according to the first aspect of this group such as acrylic resin and epoxy resin, and the like.

The diameter of the micro lens formed by the method, the shape of the curved face of the micro lens and the like can be controlled by appropriately adjusting the viscosity and the like of the uncured resin for an optical lens while considering the wettability between the resin composition and the uncured resin for an optical lens and the like.

Further, in the manufacturing method of the substrate for mounting an IC chip according to the second aspect of the fifth group of the present invention, a micro lens formation step of forming a micro lens in each optical path for transmitting optical signal may be executed. In this case, it is also possible to further suppress optical signal transmission loss.

When a micro lens is formed in each of the optical paths for transmitting optical signal and the optical path for transmitting optical signal comprises a resin and a cavity, then the micro lens may be directly formed on the resin composition inside each of the optical paths for transmitting optical signal (see FIG. 78). In some cases, the resin composition may be formed to have a two-layer structure and the micro lens may be formed between the upper resin composition layer and the lower resin composition layer.

Examples of a method of forming a micro lens in each of the optical paths for transmitting optical signal include the same method as that for forming the micro lens comprising the resin for an optical lens composition on the end portion of each optical path for transmitting optical signal as mentioned above and the like.

When the resin composition comprises two layers, the micro lens can be formed between the upper resin composition layer and the lower resin composition layer by filling an uncured resin composition into each openings for transmitting optical signal and curing the resin composition in the conductor circuit lamination before forming the solder resist layer, forming a micro lens comprising resin for an optical lens on this cured resin composition by the method, forming the solder resist layer on the conductor circuit lamination, filling an uncured resin composition into each opening for an optical path of the solder resist layer and curing the resin composition.

Furthermore, solder bumps are formed and optical elements (a light receiving element and a light emitting element) are mounted on the solder resist layer, whereby it is possible to manufacture the substrate for mounting an IC chip according to the first aspect of the fifth group of the present invention.

The solder bumps are formed by filling the solder pads with solder paste through a mask having opening parts formed in portions corresponding to the solder pads and conducting reflow.

In addition, the optical elements can be mounted through the solder pads. Alternatively, the optical elements may be attached when the solder paste is filled into the solder pads and the optical elements may be mounted simultaneously with reflow in forming the solder pads.

Further, the optical elements may be mounted using conductive adhesive or the like in place of solders.

Through such steps, it is possible to suitably manufacture the substrate for mounting an IC chip according to the first aspect of the fifth group of the present invention.

Next, a manufacturing method of a substrate for mounting an IC chip according to the third aspect of the fifth group of the present invention will be described.

The manufacturing method of the substrate for mounting an IC chip according to the third aspect of the fifth group of the present invention comprises: (a) an optical waveguide formation step of forming an optical waveguide on a substrate on which conductor circuits are formed; (b) a multilayered circuit board manufacturing step of serially building up interlaminar insulating layers and conductor circuits on the substrate, on which the optical waveguide is formed, in an alternate fashion and in repetition to provide a multilayered circuit board; (c) an opening formation step of forming an opening which becomes an optical path for transmitting optical signal in the multilayered circuit board; and (d) a solder resist layer formation step of forming a solder resist layer having an opening communicating with the opening formed in the step (c) on one face of the multilayered circuit board.

In the manufacturing method of the substrate for mounting an IC chip according to the third aspect of the fifth group of the present invention, the optical waveguides are formed inside the substrate for mounting an IC chip and the openings communicating with the conductor circuit lamination and the solder resist layer are formed. The openings communicating therewith can serve as optical paths for transmitting optical signal, so that the substrate for mounting an IC chip manufactured by the manufacturing method according to the third aspect of the fifth group of the present invention can suitably transmit optical signal between the optical elements and the optical waveguides through the optical paths for transmitting optical signal when optical elements are mounted on the substrate for mounting an IC chip.

The step (a), i.e., the optical waveguide formation step of forming optical waveguides on a substrate on which conductor circuits are formed will first be described in order of steps. Specifically, the optical waveguides can be formed through the following steps (1) to (3).

(1) Using an insulating substrate as a starting material, conductor circuits are formed on the insulating substrate.

Specifically, the same step as the step (1) of the manufacturing method of the substrate for mounting an IC chip according to the second aspect of the first group of the present invention or the like may be executed. In this step, similarly to the step (1) of the manufacturing method of the substrate for mounting an IC chip according to the second aspect of the first group of the present invention, a plated-through hole may be formed.

The conductor circuits may be formed after a step (3) to be described later.

(2) Next, the surfaces of the conductor circuits are subjected to a roughening treatment if necessary.

For the roughening treatment, the same method as that used in the step (2) of the step (a) of the manufacturing method of the substrate for mounting an IC chip according to the second aspect of the first group of the present invention or the like can be used. Further, this roughening treatment may be conducted to the wall face of the plated-through hole.

(3) Next, optical waveguides are formed in non conductor formed areas on the substrate.

The optical waveguides can be formed using the same method as that used in the step (3) of the manufacturing method of the multilayered printed circuit board in the manufacturing method of the device for optical communication according to the second aspect of the second group of the present invention or the like.

In addition, an optical path conversion mirror is formed on each of the optical waveguides.

The optical path conversion mirror may be formed either before or after the optical waveguide is attached onto the interlaminar insulating layer. However, it is desirable to form the optical path conversion mirror in advance except for a case where the optical waveguide is directly formed onto the interlaminar insulating layer. By doing so, operation is facilitated and there is no possibility of damaging or breaking the other members, such as conductor circuits and the substrate, constituting the substrate for mounting an IC chip.

To form the optical path conversion mirror, the same method as that used in the optical waveguide manufacturing step (B) in the manufacturing method of the substrate for mounting an IC chip according to the second aspect of the fifth group of the present invention or the like can be used.

Further, as mentioned above, the conductor circuits may be formed on the insulating substrate after forming the optical waveguides in this step (3). In this case, it is desirable to form the conductor circuits by the method of forming a plating resist on a conductor layer in a spread state, forming an electroplated layer in non plating resist formed areas, and removing the plating resist and the conductor layer under the plating resist. By using this method, there is a little probability of damaging the formed optical waveguides.

Next, the step (b), i.e., the multilayered circuit board manufacturing step of serially building up interlaminar insulating layers and conductor circuits on the substrate on which the optical waveguides are formed in the step (a), thereby obtaining a multilayered circuit board will be described in order of steps. Specifically, the multilayered circuit board can be manufactured through the following steps (1) to (7).

(1) Either an uncured resin layer comprising thermosetting resin, photosensitive resin, resin obtained by acrylating apart of thermosetting resin, an uncured resin layer comprising a resin complex containing one of these resins and thermoplastic resin, or a resin layer comprising thermoplastic resin is formed on the substrate on which the optical waveguides are formed in the step (a).

Specifically, the same resin as that used at the time of forming the interlaminar insulating layer in the (a) conductor circuit lamination formation step in the manufacturing method of the substrate for mounting an IC chip according to the second aspect of the fifth group of the present invention or the like can be used.

The uncured resin layer may be formed by applying uncured resin by a roll coater, a curtain coater or the like or by thermally bonding an uncured (semi-cured) resin film.

In addition, the resin layer comprising thermoplastic resin can be formed by thermally bonding a resin formed body formed on a film.

The thermal bonding of the resin complex or resin formed body can be carried out by using a vacuum laminator or the like.

Furthermore, bonding conditions are not limited to specific ones but may be appropriately selected in view of the composition of the resin film and the like. Normally, it is desirable to carry out bonding under conditions of a pressure of 0.25 to 1.0 MPa, a temperature of 40 to 70° C., degree of vacuum of 13 to 1300 Pa, a period of time of about 10 to 120 seconds.

(2) Next, at the time of forming an interlaminar insulating layer using the thermosetting resin or resin complex as a material therefor, a curing treatment is conducted to an uncured resin layer and openings for via-holes are formed to thereby obtain the interlaminar insulating layer. In this step, a through hole for a plated-through hole may be formed if necessary.

It is desirable that the openings for via-holes are formed by a laser treatment. In addition, when photosensitive resin is used as a material for the interlaminar insulating layer, the openings for via-holes may be formed by exposure and development treatments.

Further, at the time of forming an insulating layer using thermoplastic resin as a material therefor, openings for via-holes are formed in the resin layer comprising thermoplastic resin, thereby obtaining the interlaminar insulating layer. In this case, the openings for via-holes can be formed by conducting a laser treatment.

Further, when a through hole for a plated-through hole is formed in this step, the through hole for a plated-through hole may be formed by drilling, a laser treatment or the like.

Examples of a laser used for the laser treatment include the same laser as that used at the time of forming the openings for via-holes in the (a) conductor circuit lamination formation step in the manufacturing method of the substrate for mounting an IC chip according to the second aspect of the fifth group of the present invention and the like.

(3) Next, conductor circuits are formed on the surface of the interlaminar insulating layer including the inner walls of the openings for via-holes.

Specifically, to form the conductor circuits, the same methods as those use in (5) to (7) of the (a) conductor circuit lamination formation step in the manufacturing method of the substrate for mounting an IC chip according to the second aspect of the fifth group of the present invention or the like can be used.

In this step, similarly to the (a) conductor circuit lamination formation step, a plated-through hole may be formed. When the plated-through hole is formed, a resin filler may be filled into the plated-through hole.

Further, when the resin filler is filled into the plated-through hole, a cover plated layer which covers a resin filler layer may be formed by electroless plating or the like.

(4) Next, when the cover plated layer is formed, a roughening treatment is conducted to the surface of the cover plated layer, if necessary, and the steps (1) and (2) are repeatedly executed, thereby forming the interlaminar insulating layer. It is noted that the plated-through hole may be formed or may not be formed in this step.

(5) Further, by repeatedly executing the steps (3) and (4) if necessary, the conductor circuits and the interlaminar insulating layers are serially built up.

By executing these steps (1) to (5), it is possible to manufacture the multilayered circuit board having conductor circuits and interlaminar insulating layers built up on both faces of the substrate in an alternate fashion and in repetition.

While the manufacturing method of the multilayered circuit board described herein in detail is based on a semi-additive method, the manufacturing method of the multilayered circuit board manufactured in the step (a) is not limited to the semi-additive method-based method but a full-additive method, a subtractive method, a batch laminating method, a conformal method or the like may be used. Among them, it is desirable to use the additive method such as the semi-additive method or the full-additive method. This is because when the additive method is used, etching accuracy is high, so that it is suited to form finer conductor circuits and it is possible to improve the degree of freedom for the design of the conductor circuits.

In the manufacturing method of the substrate for mounting an IC chip according to the third aspect of the fifth group of the present invention, after the multilayered circuit board is manufactured through the step (a) and the step (b), the step (c), i.e., the opening formation step of forming openings which become optical paths for transmitting optical signal in the multilayered circuit board is executed. The openings formed in this step serve as the optical paths for transmitting optical signal for the substrate for mounting an IC chip. Accordingly, the openings formed in this step will be referred to as "openings for transmitting optical signal" hereinafter.

The openings for transmitting optical signal are formed by a laser treatment or the like.

Examples of a laser used for the laser treatment include the same as that used to form the openings for via-holes and the like.

In this case, as the laser, a laser having a wavelength with which the optical waveguides do not absorb light is desirably used. By using such a laser, there is a little probability of damaging the surfaces of the optical waveguides at the time of forming the openings for transmitting optical signal.

The positions at which the openings for transmitting optical signal are formed are not limited to specific positions but may be appropriately selected based on the design of the conductor circuits, the position at which the IC chip is mounted and the like.

Furthermore, it is desirable that the openings for transmitting optical signal are formed for respective optical elements such as the light receiving element and the light emitting element. Alternatively, they may be formed for respective signal wavelengths.

Further, after the openings for transmitting optical signal are formed, a desmear treatment may be conducted to the wall faces of the openings for transmitting optical signal if necessary. The desmear treatment can be performed by a treatment using a permanganic acid solution, a plasma treatment, a corona treatment or the like. It is noted that when the desmear treatment is conducted, it is possible to remove the resin residue, burrs and the like in the openings for transmitting optical signal, and lower the transmission loss caused by irregular reflection on the wall faces of the optical paths for transmitting optical signal.

Further, it is desirable that a roughening treatment of roughening the wall faces of the openings for transmitting optical signal is executed if necessary after the formation of the openings for transmitting optical signal and before the formation of a conductor layer, the filling of an uncured resin composition or the like in the following steps. By doing so, it is possible to improve the adhesion between the openings for transmitting optical signal and the conductor layer or resin composition.

The roughened face can be formed by dissolving exposed portions generated at the time of forming the openings for transmitting optical signal in the interlaminar insulating layer and the like by an acid such as a sulfuric acid, a hydrochloric acid or a nitric acid, an oxidizing agent such as a chromic acid, a chromic sulfide or a permanganate, or the like. Alternatively, the roughened face can be formed by a plasma treatment, a corona treatment or the like.

The mean roughness (Ra) of the roughened face is desirably 0.5 to 5 µm, more desirably 1 to 3 µm. When the mean roughness falls within this range, the adhesion of the roughened face to the conductor layer or the resin composition is excellent and the roughened face does not adversely influence the transmission of optical signal.

After forming the openings for transmitting optical signal, a conductor layer formation step of forming a conductor layer on the wall faces of the openings for transmitting optical signal is desirably performed if necessary.

The conductor layer can be formed by such a method as an electroless plating method or a sputtering method.

Specifically, a method of applying a catalyst core to the wall faces of the openings for transmitting optical signal and then immersing the substrate, in which the openings for transmitting optical signal are formed, in an electroless plating bath after the openings for transmitting optical signal are formed, or the like can be used to form the conductor layer.

Alternatively, a conductor layer comprising two or more layers may be formed by a combination of electroless plating and sputtering or a conductor layer comprising two or more layer may be formed by conducting electroplating after electroless plating or sputtering.

In such a conductor layer formation step, it is desirable to not only form the conductor layer on the wall faces of the openings for transmitting optical signal but also form outermost layer conductor circuits on the interlaminar insulating layer formed through the step (b).

Specifically, at the time of forming the conductor layer on the wall faces of the openings for transmitting optical signal by electroless plating or the like, a conductor layer is also formed on the entire surface of the interlaminar insulating layer.

Next, a plating resist is formed on this conductor layer formed on the surface of the interlaminar insulating layer. The plating resist is formed by bonding a photosensitive dry film, closely disposing a photomask comprising a glass substrate or the like on which a plating resist pattern is drawn and exposure and conducting development treatments.

Further, electroplating is conducted using the conductor layer formed on the interlaminar insulating layer as a plating lead, thereby forming an electroplated layer on the non plating resist formed areas. Thereafter, the plating resist and the conductor layer under the plating resist are removed, thereby forming independent conductor circuits on the interlaminar insulating layer.

Further, a roughened face may be formed on the wall face of the conductor layer after forming the conductor layer.

The roughened face can be formed by a blackening (oxidizing)-reducing treatment, an etching treatment using an etchant containing a cupric complex and an organic acid salt, a Cu—Ni—P needle-like alloy plating treatment or the like.

Further, after forming the openings for transmitting optical signal, it is desirable to execute a resin filling step of filling an uncured resin composition into the openings if necessary.

By filling the uncured resin composition and then conducting a curing treatment to the resin composition, it is possible to form the openings for transmitting optical signal each comprising a resin composition and a cavity or the openings for transmitting optical signal each comprising a resin composition.

A specific method of filling the uncured resin composition is not limited to a specific one but such a method as printing or potting can be used.

When the uncured resin composition is filled by printing, the uncured resin composition may be printed at one time or two or more times.

Further, when the uncured resin composition is to be filled, an uncured resin composition slightly larger in quantity than the inner volume of each of the openings for transmitting optical signal may be filled and, after filling the uncured resin composition, an excessive resin composition overflowing the openings for transmitting optical signal may be removed.

The removal of the excessive resin composition can be carried out by grinding or the like. When the excessive resin composition is to be removed, the resin composition may be in a semi-cured state or a fully cured state, which state may be appropriately selected based on the material for the resin composition and the like.

When the resin composition filling step is not executed, it is possible to form optical paths for transmitting optical signal each comprising a cavity.

By executing such an opening formation step as well as the roughened face formation step, the conductor layer formation step and the resin composition filling step executed if necessary, it is possible to form a part of the optical paths for transmitting optical signal in the multilayered circuit board manufactured through the steps (a) and (b). Furthermore, independent conductor circuits can be formed by forming the conductor layer even on the surface of the interlaminar insulating layer and performing the treatments at the time of executing the conductor circuit formation step. Needless to say, even when the step of forming the conductor layer is not executed, it is possible to form the conductor circuits on the surface of the interlaminar insulating layer based on the method.

Next, the step (d), i.e., the solder resist layer formation step of forming a solder resist layer having openings communicating with the openings formed in the step (c) on one face of the multilayered circuit board is executed.

Specifically, the solder resist layer can be formed by executing the following steps (1) and (2).

(1) First, a solder resist composition layer is formed on the outermost layer of the multilayered circuit board in which the openings for transmitting optical signal are formed.

The solder resist composition layer can be formed by the same method as that used in the (c) solder resist layer formation step in the manufacturing method according to the second aspect of the fifth group of the present invention.

(2) Next, openings (hereinafter, also referred to as "openings for optical paths") communicating with the openings for transmitting optical signal are formed in the solder resist composition layer.

Specifically, the openings for optical paths can be formed by exposure and development treatment, a laser treatment or the like.

It is also desirable to form openings for forming solder bumps simultaneously with the formation of the openings for optical paths. It is noted that the formation of the openings for optical paths and that of the openings for forming solder bumps may be performed separately.

Furthermore, when the solder resist layer is formed, the solder resist layer having openings for optical paths and openings for forming solder bumps may be formed by manufacturing a resin film having openings at desired positions and bonding it thereon.

Further, the cross-sectional diameter of the opening for an optical path may be smaller than that of the openings for transmitting optical signal. In this case, the cross-sectional diameter of the opening for an optical path may be set smaller than that of the openings for transmitting optical signal by 20 to 100 µm.

Through such steps (1) and (2), it is possible to form the solder resist layer having openings communicating with the openings for transmitting optical signal on the multilayered circuit board on which the openings for transmitting optical signal are formed.

Furthermore, when the uncured resin composition is filled into each of the openings for transmitting optical signal in the opening formation step (c), an uncured resin composition may be filled in each of the openings for optical paths formed in the solder resist layer by the same method as that used for the openings for transmitting optical signal. By thus filling the uncured resin composition into each of the openings for optical paths of the solder resist layer and then conducting a curing treatment to the uncured resin composition, it is possible to form optical paths for transmitting optical signal each comprising a resin composition.

While the solder resist layer having openings communicating with the openings for optical paths is formed on one face of the multilayered circuit board, i.e., on the openings for transmitting optical signal formation side of the multilayered circuit board. Alternatively, a solder resist layer without openings may be formed on the other face of the multilayered circuit board.

Moreover, it is desirable to execute a micro lens formation step of forming a micro lens on the end portion of each optical path for transmitting optical signal or in the optical path for transmitting optical signal if necessary after forming the openings for transmitting optical signal and the openings for optical paths. By forming the micro lens, it is possible to further suppress the optical signal transmission loss.

To form a micro lens on the end portion of each optical path for transmitting optical signal or in the optical path for transmitting optical signal, the same method as that described in the manufacturing method of the substrate for mounting an IC chip according to the second aspect of the fifth group of the present invention can be used.

In the manufacturing method of the substrate for mounting an IC chip according to the third aspect of the fifth group of the present invention, after executing these steps (a) to (d), solder pads and solder bumps are formed and optical elements are mounted by the following method, whereby it is possible to manufacture the substrate for mounting an IC chip.

The formation of the solder pads and solder bumps and the mounting of the optical elements can be performed by the same method as the manufacturing method of the substrate for mounting an IC chip according to the second aspect of the fifth group of the present invention.

In each of the manufacturing methods of the substrates for mounting IC chips according to the second and third aspects of the fifth group of the present invention, the optical waveguides are formed between the substrate and the interlaminar insulating layer. However, the optical waveguide formation positions on the substrate for mounting an IC chip according to the first aspect of the fifth group of the present invention is not limited to the position between the substrate and the interlaminar insulating layer but may be between the interlaminar insulating layers.

The substrate for mounting an IC chip having such a configuration can be manufactured as follows. In the manufacturing method of the substrate for mounting an IC chip according to the second aspect of the fifth group of the present invention, optical waveguides are not formed in the step (a) i.e., the optical waveguide formation step, interlaminar insulating layers and conductor circuits are serially built up in the step (b), i.e., the multilayered circuit board manufacturing step, and optical waveguides are then formed.

BEST MODE FOR CARRYING OUT THE INVENTION

The present invention will be described hereinafter in more detail.

It is also noted that the thermal expansion coefficient of resin was measured at 50 to 70° C. and the characteristics (particle content, refractive index, transmissivity) of the resin were those after the resin was cured unless specified otherwise.

EXAMPLE 1

A. Manufacturing of Resin Film for Interlaminar Insulating Layer 30 parts by weight of Bisphenol A type epoxy resin (epoxy equivalent 469, Epikote 1001 made by Yuka Shell Epoxy Co.), 40 parts by weight of cresol novolak type epoxy resin (epoxy equivalent 215, Epichlon N-673 made by Dainippon Ink and Chemicals, Inc.), and 30 parts by weight of phenol novolak resin containing triazine structure (phenolic hydroxy equivalent 120, Phenolite KA-7052 made by Dainippon Ink and Chemicals, Inc.) were dissolved while being heated in 20 parts by weight of ethyl diglycol acetate and 20 parts by weight of solvent naphtha under stirring condition, followed by the addition of 15 parts by weight of epoxy-terminated polybutadiene rubber (made by Nagase Chemicals Ltd.; Denalex R-45EPT) and 1.5 parts by weight of a pulverized product of 2-phenyl-4,5-bis(hydroxymethyl)imidazole, 2 parts by weight of a finely pulverized silica, and 0.5 parts by weight of a silicone based defoaming agent to prepare an epoxy resin composition.

After the obtained epoxy resin composition was applied to a 38 µm-thick PET film so as to adjust the thickness after drying to be 50 µm by a roll coater, the resulting film was dried at 80 to 120° C. for 10 minutes to produce a resin film for an interlaminar resin insulating layer.

B. Preparation of Resin Composition for Filling Through Hole

A container was loaded with 100 parts by weight of bisphenol F type epoxy monomer (YL 983 U made by Yuka Shell Epoxy Co.; molecular weight: 310), 170 parts by weight of a $SiO_2$ spherical particles coated with a silane coupling agent and having an average particle diameter of 1.6 µm and a diameter of the maximum particle of 15 or less (made by Admatechs Co., Ltd.; CRS 1101-CE), and 1.5 parts by weight of a leveling agent (Perenol S4 made by San Nopco Ltd.) and they were stirred and mixed to prepare a resin filler with a viscosity of 45 to 49 Pa·s at 23±1° C. As a curing agent, 6.5 parts by weight of an imidazole curing agent (made by Shikoku Chemicals Corp.; 2E4MZ-CN) was employed.

C. Manufacturing of Substrate for Mounting IC Chip (1) A copper-clad laminated board composed of an insulating substrate 1021 made of a 0.8 mm-thick glass epoxy resin or BT (bismaleimide-triazine) resin, with a 18 µm-thick copper foil 1028 laminated on both faces of the substrate 1021 was used as a starting material (see FIG. 8(*a*)). First, the copper-clad laminated board was drilled to bore holes and then, an electroless plating treatment was carried out and pattern etching was carried out to form conductor circuits 1024 and a plated-through hole 1029 on both faces of the substrate 1021.

Figure 8:
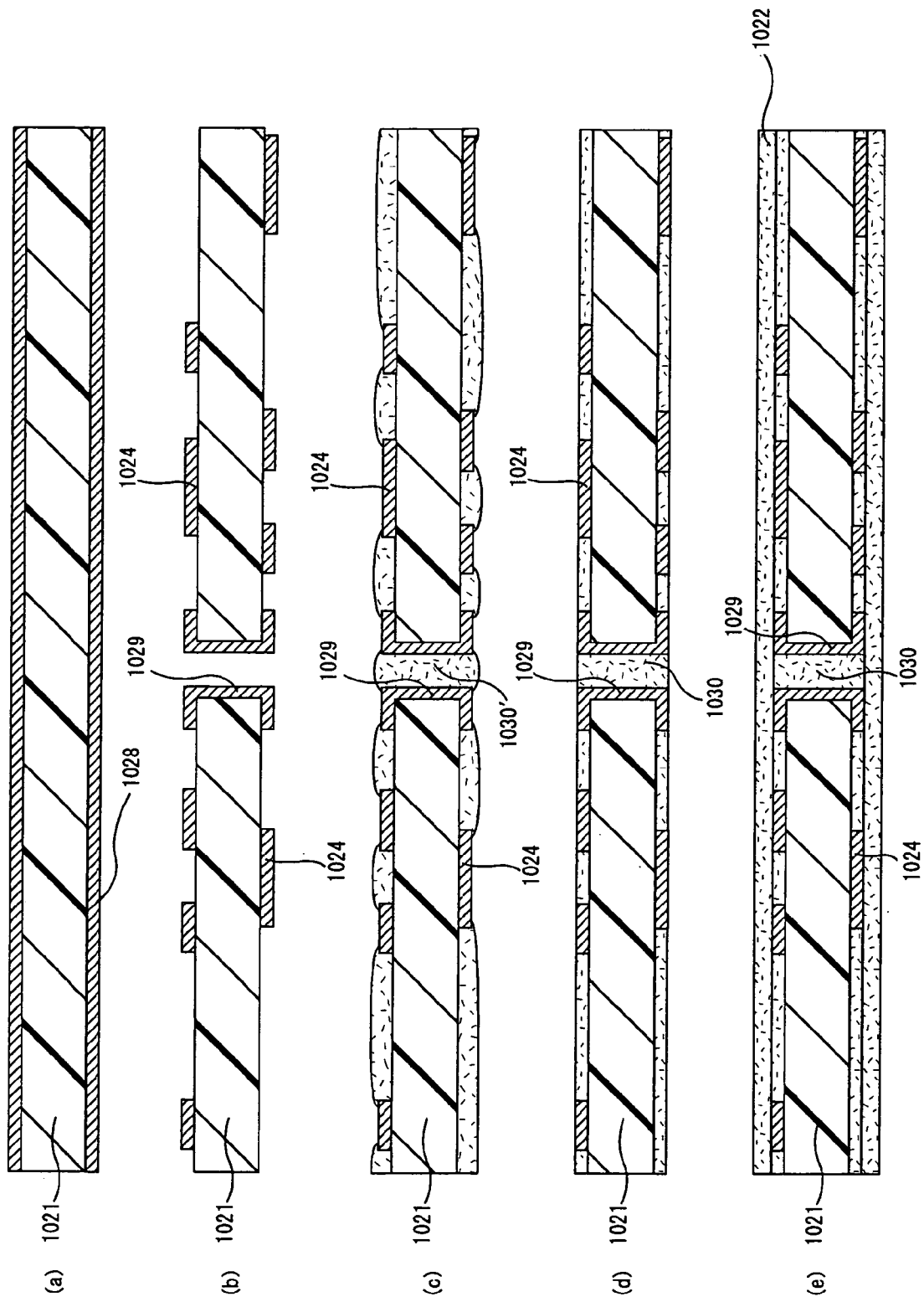
FIG. 8 is a cross-sectional view schematically showing part of a manufacturing method of a substrate for mounting an IC chip according to the second aspect of the first group of the present invention.

(2) The substrate having the plated-through hole 1029 formed therein and the conductor circuits 1024 formed thereon was washed with water and dried, then subjected to a blackening treatment using an aqueous solution containing NaOH (10 g/l), $NaClO_2$ (40 g/l), $Na_3PO_4$ (6 g/l) as a blackening bath (oxidizing bath) and a reducing treatment using an aqueous solution containing NaOH (10 g/l) and $NaBH_4$ (6 g/l) as a reducing bath to form roughened faces (not shown) on the entire surfaces of the conductor circuits 1024 including the plated-through hole 1029 (see FIG. 8(*b*)).

(3) After the resin filler described in B was prepared, a layer of resin filler 1030' was formed inside the plated-through hole 1029, non conductor formed areas and the peripheral parts of the conductor circuits 1024 on one face of the substrate 1021 by the following method within 24 hours after the preparation.

That is, first, the resin filler was pushed in the plated-through hole using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minutes, thereby forming the layer of resin filler 1030' (see FIG. 8(*c*)).

(4) One face of the substrate for which the treatment (3) was just finished was ground by belt sander grinding using #600 belt grinding paper (made by Sankyo Chemical Engineering Co.) so as not to leave the resin filler 1030' on the surfaces of the conductor circuits 1024 and the land surface of the plated-through holes 1029 and then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 1030.

In such a manner, the surface layer part of the resin filler layer 1030 formed in the plated-through hole 1029 and the non conductor formed are as and the surfaces of the conductor circuits 1024 were flattened, thus obtaining an insulating substrate wherein: the resin filler 1030 and the side faces of the conductor circuits 1024 were firmly stuck to each other through the roughened faces (not shown); and the inner wall face of the plated-through hole 1029 and the resin filler 1030 were also firmly stuck to each other through the roughened faces (see FIG. 8(*d*)). By this step, the surface of the resin filler layer 1030 was flush with the surfaces of the conductor circuits 1024.

(5) After the substrate was washed with water and degreased with an acid, soft etching was carried out and etchant was sprayed on both faces of the substrate to etch the surfaces of the conductor circuits 1024 and the land surface and inner wall of the plated-through hole 1029, thereby forming roughened faces (not shown) on the entire surfaces of the conductor circuits 1024. As the etchant, etchant (made by Meck Co.; Meck etch bond) containing 10 parts by weight of an imidazole copper(II) complex and 7 parts by weight of glycolic acid, and 5 parts by weight of potassium chloride was used.

(6) Next, a resin film for an interlaminar resin insulating layer with a slightly larger size than that of the substrate produced in the A was put on the substrate, temporarily pressure-bonded under conditions of 0.4 MPa pressure, 80° C. temperature, and 10-second pressure bonding period and cut. Thereafter, the film was bonded by the following method using a vacuum laminator device to thereby form an interlaminar resin insulating layer 1022 (see FIG. 8(*e*)).

That is, the resin film for an interlaminar resin insulating layer was actually pressure-bonded on the substrate under conditions of 65 Pa degree of vacuum, 0.4 MPa pressure, 80° C. temperature and 60-second pressure bonding period, and the resin film was further thermally cured at 170° C. for 30 minutes.

Figure 9:
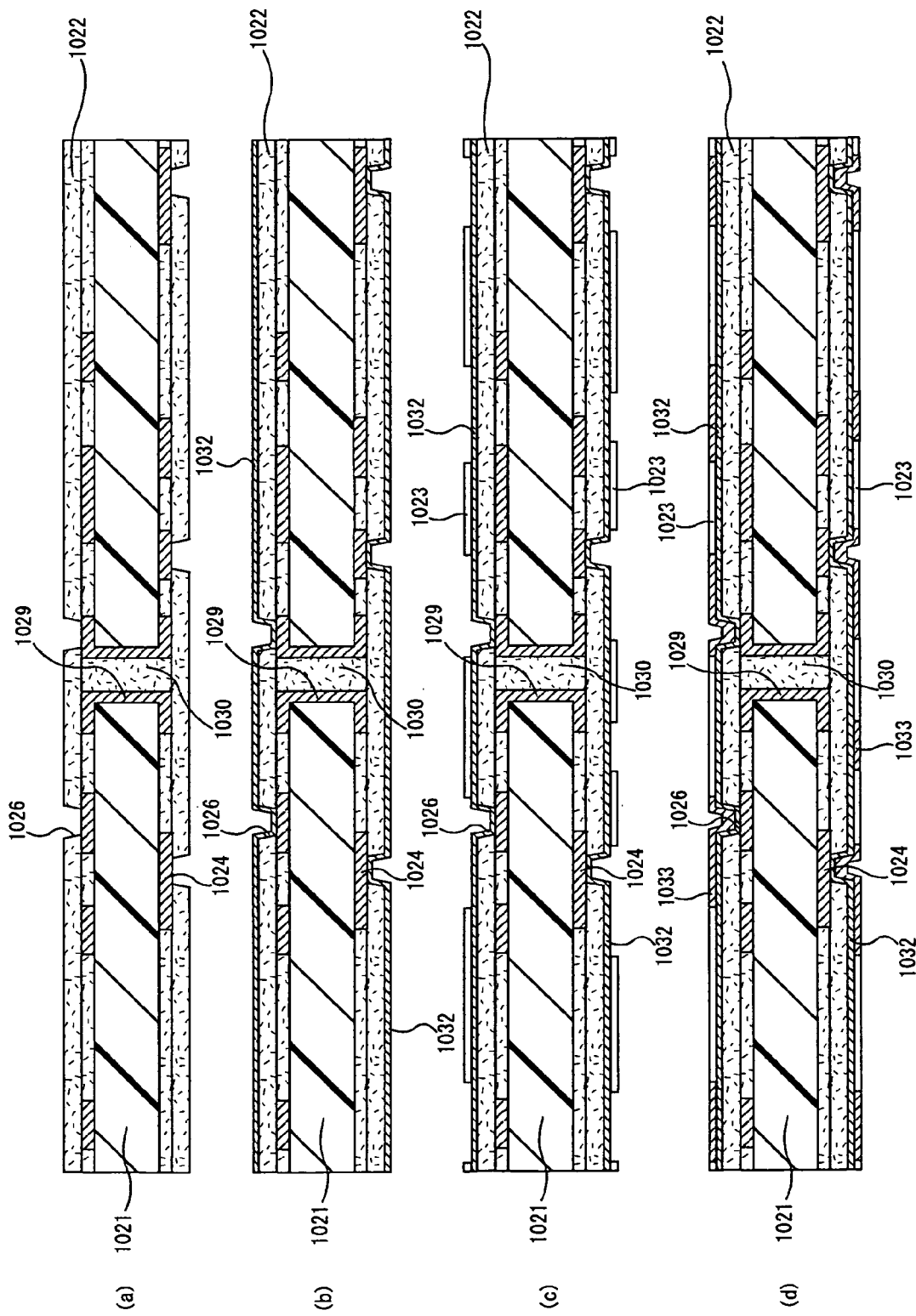
FIG. 9 is a cross-sectional view schematically showing part of the manufacturing method of a substrate for mounting an IC chip according to the second aspect of the first group of the present invention.

(7) Next, openings for via-holes 1026 with 80 μm diameter were formed in the interlaminar insulating layers 1022 by a $CO_2$ gas laser of 10.4 μm wavelength through a 1.2 mm-thick mask having through holes therein in conditions of a beam diameter of 4.0 mm, a top hat mode, a pulse interval of 8.0 μs, 1.0 mm-diameter of the through holes of the mask and one shot (see FIG. 9(*a*)).

(8) The substrate in which the openings for via-holes 1026 were formed was immersed in a solution containing 60 g/l of permanganic acid at 80° C. for 10 minutes to dissolve and remove epoxy resin particles existing on the surfaces of the interlaminar resin insulating layers 1022, thus forming the roughened faces (not shown) on the interlaminar insulating layers 1022 including the inner wall faces of the openings for via-holes 1026.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth of 3 μm), whereby a catalyst core was attached to the surfaces of the interlaminar insulating layers 1022 (including the inner wall faces of the openings for via-holes 1026) (not shown). That is, the catalyst was attached by immersing the substrate in a catalytic solution containing palladium chloride ($PdCl_2$) and stannous chloride ($SnCl_2$) to precipitate metal.

(10) Next, the substrate was immersed in an electroless copper plating solution having the following composition to form a thin film conductor layer (electroless copper plating film) 1032 having a thickness of 0.6 to 3.0 μm on the surface of each interlaminar insulating layer 1022 (including the inner wall faces of the openings for via-holes 1026) (see FIG. 9(*b*)).

[Electroless Plating Solution]

| | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. liquid temperature and 40 Minutes

(11) Next, a commercially available photosensitive dry film was bonded to the substrate on which the thin film conductor layers (electroless copper plating films) 1032 were formed, a mask was put thereon and exposure with 100 mJ/cm² and development with an aqueous 0.8% sodium carbonate solution were carried out, thereby forming a plating resist 1023 having a thickness of 20 μm (see FIG. 9(*c*)).

(12) Next, the substrate was washed with water at 50° C. to be degreased, washed with water at 25° C., and further washed with sulfuric acid. Thereafter, the substrate was subjected to electroplating under the following conditions, thereby forming an electroplating copper film 1033 having a 20 μm-thickness in non plating resist 1023 formed areas (see FIG. 9(d)).

[Electroplating solution]

| Sulfuric acid | 2.24 mol/l |
|---|---|
| Copper sulfate | 0.26 mol/l |
| Additive | 19.5 ml/l |
| (Cupracid HL made by Atotech Co.) | |
| [Electroplating conditions] | |
| Current density | 1 A/dm$^2$ |
| Time | 65 minutes |
| Temperature | 22 ± 2° C. |

Figure 10:
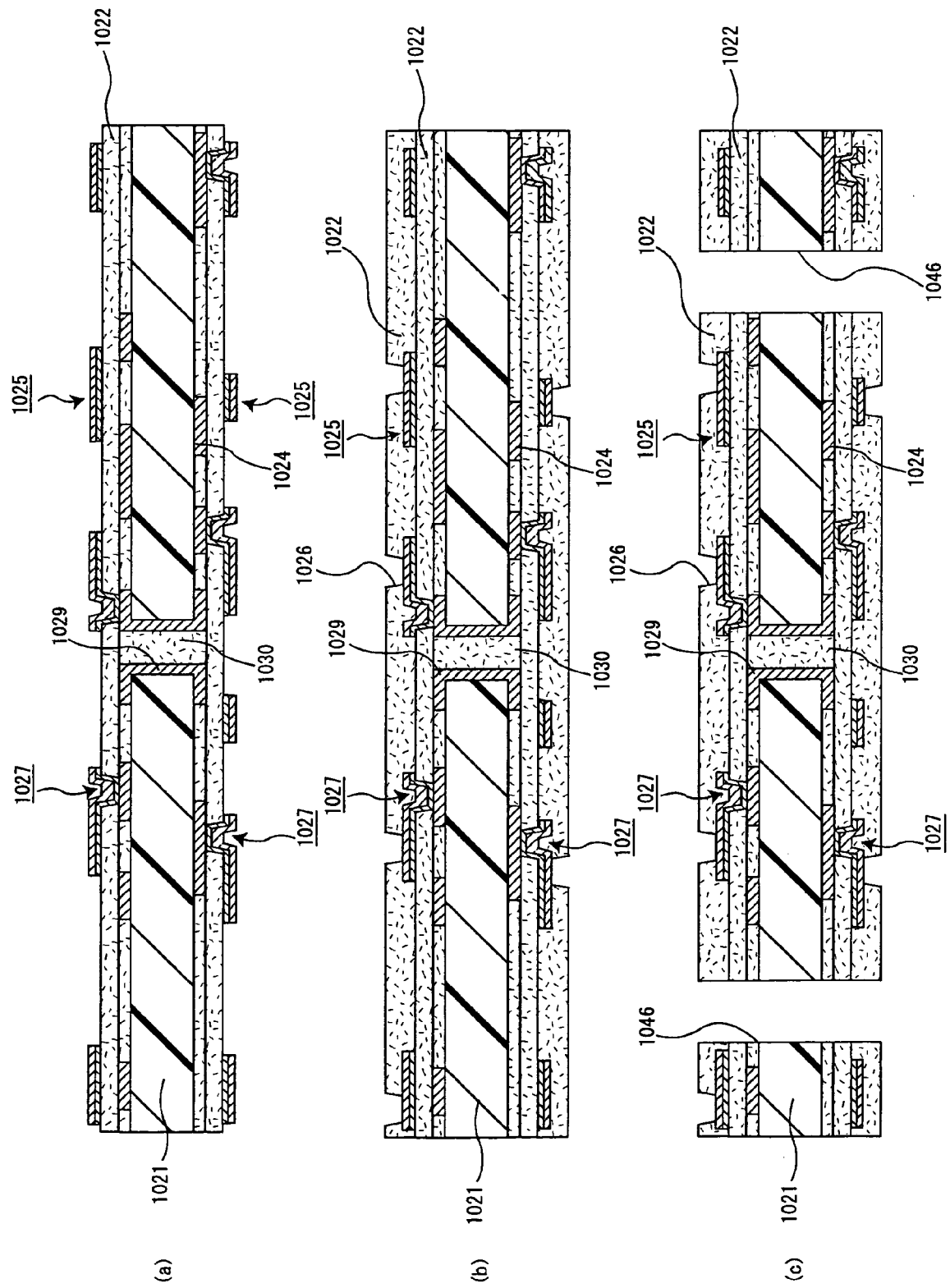
FIG. 10 is a cross-sectional view schematically showing part of the manufacturing method of a substrate for mounting an IC chip according to the second aspect of the first group of the present invention.

(13) After peeling off the plating resists 1023 with 5% NaOH, the thin film conductor layer under the plating resist 1023 was etched, dissolved and removed with a solution mixture of sulfuric acid and hydrogen peroxide, thus forming conductor circuits 1025 (including via-holes 1027) each composed of the thin film conductor layer (electroless copper plating film) 1032 and the electroplating copper film 1033 and having a thickness of 18 μm (see FIG. 10(a)).

(14) Further, using the same etchant as that used in the step (5), roughened faces (not shown) were formed on the surfaces of the conductor circuits 1025, and the interlaminar insulating layer 1022 having the openings for via-holes 1026 and having a roughened face (not shown) formed on the surface thereof was then serially build up similarly to the steps (6) to (8) (see FIG. 10(b)).

Thereafter, using a drill having a diameter of 395 μm, through holes 1046 penetrating the substrate 1021 and the interlaminar insulating layers 1022 were formed. Further, a desmear treatment was conducted to the wall faces of the through holes 1046 (see FIG. 10(c).

Figure 11:
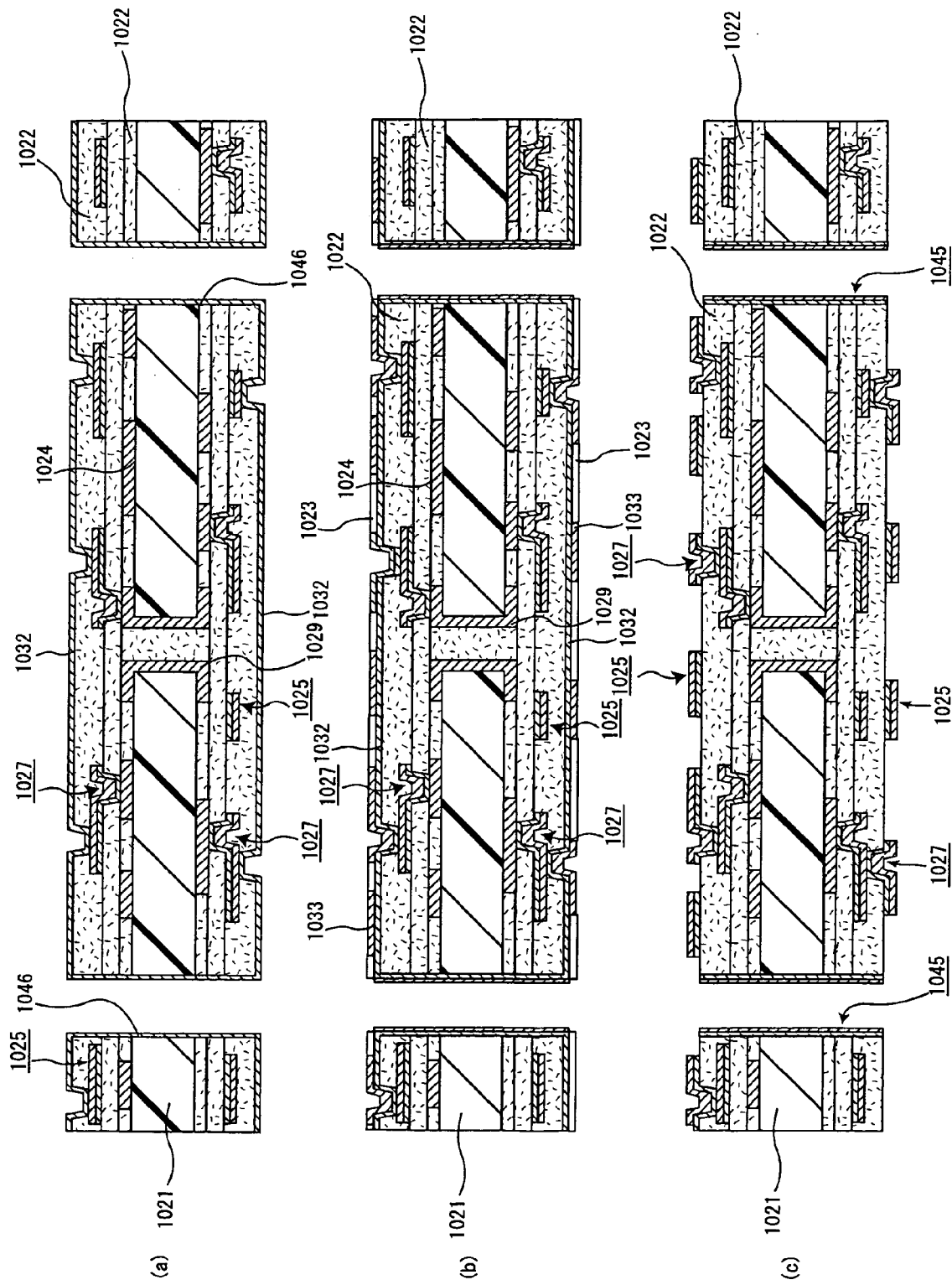
FIG. 11 is a cross-sectional view schematically showing part of the manufacturing method of a substrate for mounting an IC chip according to the second aspect of the first group of the present invention.

(15) Next, a catalyst was attached to the wall faces of the through holes 1046 and the surfaces of the interlaminar insulating layers 1022 using the same method as that used in the step (9), and the substrate was immersed in the same electroless copper plating solution as that used in the step (10), thereby forming a thin film conductor layer (electroless copper plating film) 1032 on the surface of the interlaminar insulating layer 1022 (including the inner wall faces of the openings for via-holes 1026) and the wall faces of the through holes 1046 (see FIG. 11(a)).

(16) Next, a plating resist 1023 was provided by the same method as that used in the step (11) and a copper electroplating film 1033 having a thickness of 20 μm was formed in non plating resist 1023 formed areas by the same method as that used in the step (12) (see FIG. 11(b)).

(17) Next, using the same method as that used in the step (13), the plating resist 1023 was peeled off and the thin film conductor layer under the plating resist 1023 was removed, thereby forming conductor circuits 1025 (including via-holes 1027) and a conductor layer 1045.

Furthermore, using the same method as that used in the step (2), an oxidizing-reducing treatment was carried out, thereby forming roughened faces (not shown) on the surfaces of the conductor circuits 1025 and the surface of the conductor layer 1045 (see FIG. 11(c)).

(18) Next, the resin composition containing epoxy resin was filled into each through hole 1046 in which the conductor layer 1045 was formed using the squeegee, the resin composition was dried and the surface layer of the resin composition was flattened by buff grinding. Further, a curing treatment was conducted to the resin composition, thereby forming a resin composition layer 1042a (see FIG. 12(a)).

(19) Next, the container was loaded with: 46.67 parts by weight of an oligomer provided with a photosensitivity (molecular weight: 4000) obtained by acrylating 50% of the epoxy group of cresol novolak type epoxy resin (made by Nippon Kayaku Co., Ltd.), dissolved in diethylene glycol dimethyl ether (DMDG) to be 60% by weight concentration; 15.0 parts by weight of bisphenol A type epoxy resin (trade name: Epikote 1001 made by Yuka Shell Epoxy Co.) dissolved in methyl ethyl ketone to be 80% by weight concentration; 1.6 parts by weight of imidazole curing agent (trade name: 2E4MZ-CN made by Shikoku Chemicals Corp.); 4.5 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE 6 A made by Kyoei Chemical Co., Ltd.); and 0.71 parts by weight of the dispersion type defoaming agent (made by San Nopco Ltd.; S-65). They were stirred and mixed to prepare a mixture composition. 2.0 parts by weight of benzophenone (made by Kanto Chemical Co., Inc.) as photoinitiator and 0.2 parts by weight of Michler's ketone (made by Kanto Chemical Co., Inc.) as photosensitizer were added to the mixture composition, thereby obtaining a solder resist composition prepared to have a viscosity of 2.0 Pa·s at 25° C.

The viscosity measurement was carried out using a rotor No. 4 in the case of 60 min$^{-1}$ (rpm) and a rotor No. 3 in the case of 4.6 min$^{-1}$ (rpm) using a B-type viscometer (made by Tokyo Instruments Co. Ltd., DVL-B type).

Figure 12:
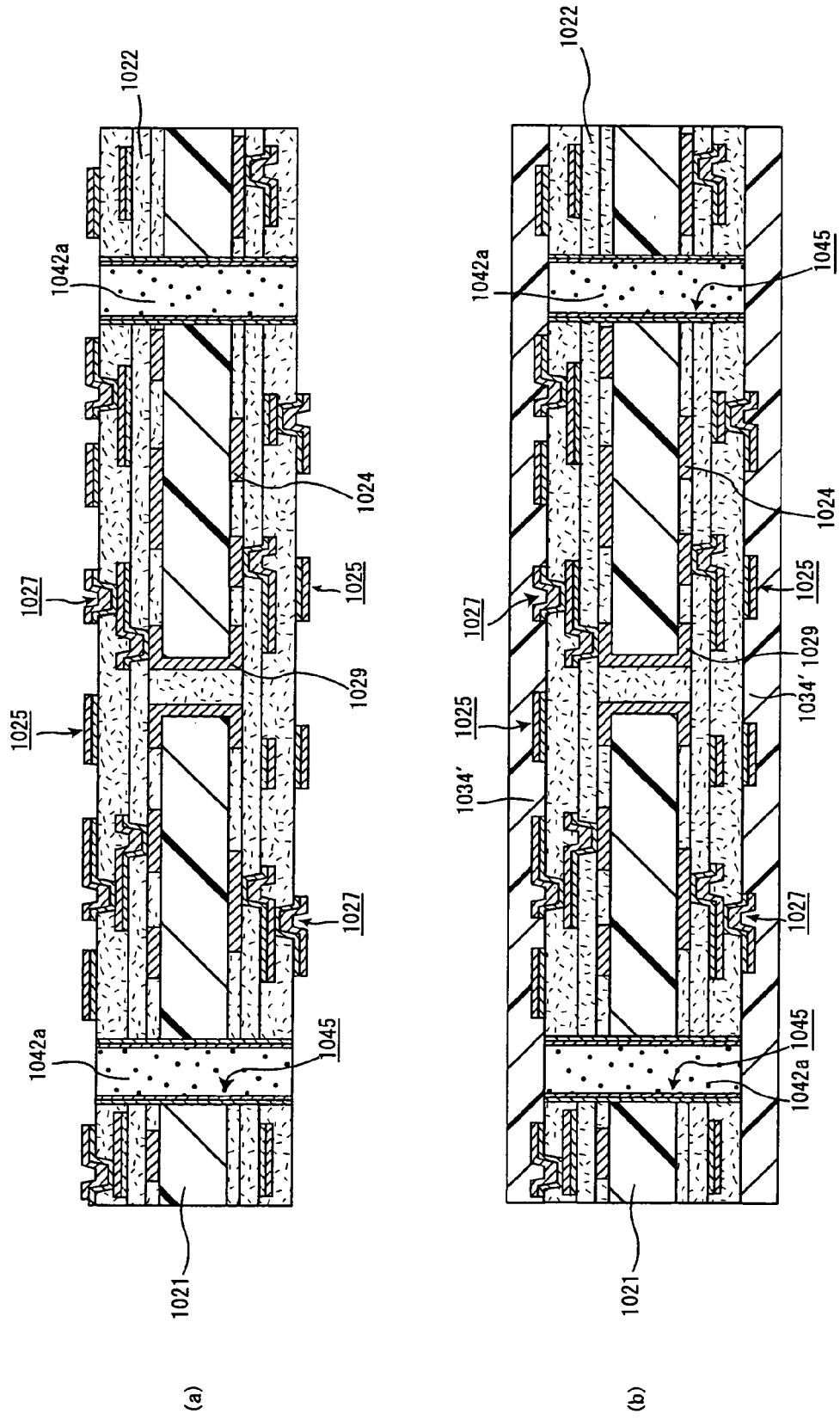
FIG. 12 is a cross-sectional view schematically showing part of the manufacturing method of a substrate for mounting an IC chip according to the second aspect of the first group of the present invention.

(20) Next, the solder resist composition was applied by 30 μm thickness to both faces of the substrate in which the resin composition 1042a was formed and dried under conditions of 70° C. for 20 minutes and 70° C. for 30 minutes, thereby forming a solder resist composition layer 1034' (see FIG. 12(b)).

(21) A 5 mm-thick photomask on which a pattern of openings for forming solder bumps and openings for optical paths was drawn was closely stuck to the solder resist composition layer 1034' on the IC chip mounting side, exposed with UV rays of 1000 mJ/cm$^2$ and developed with a DMTG solution, thereby forming openings having a diameter of 200 μm.

Figure 13:
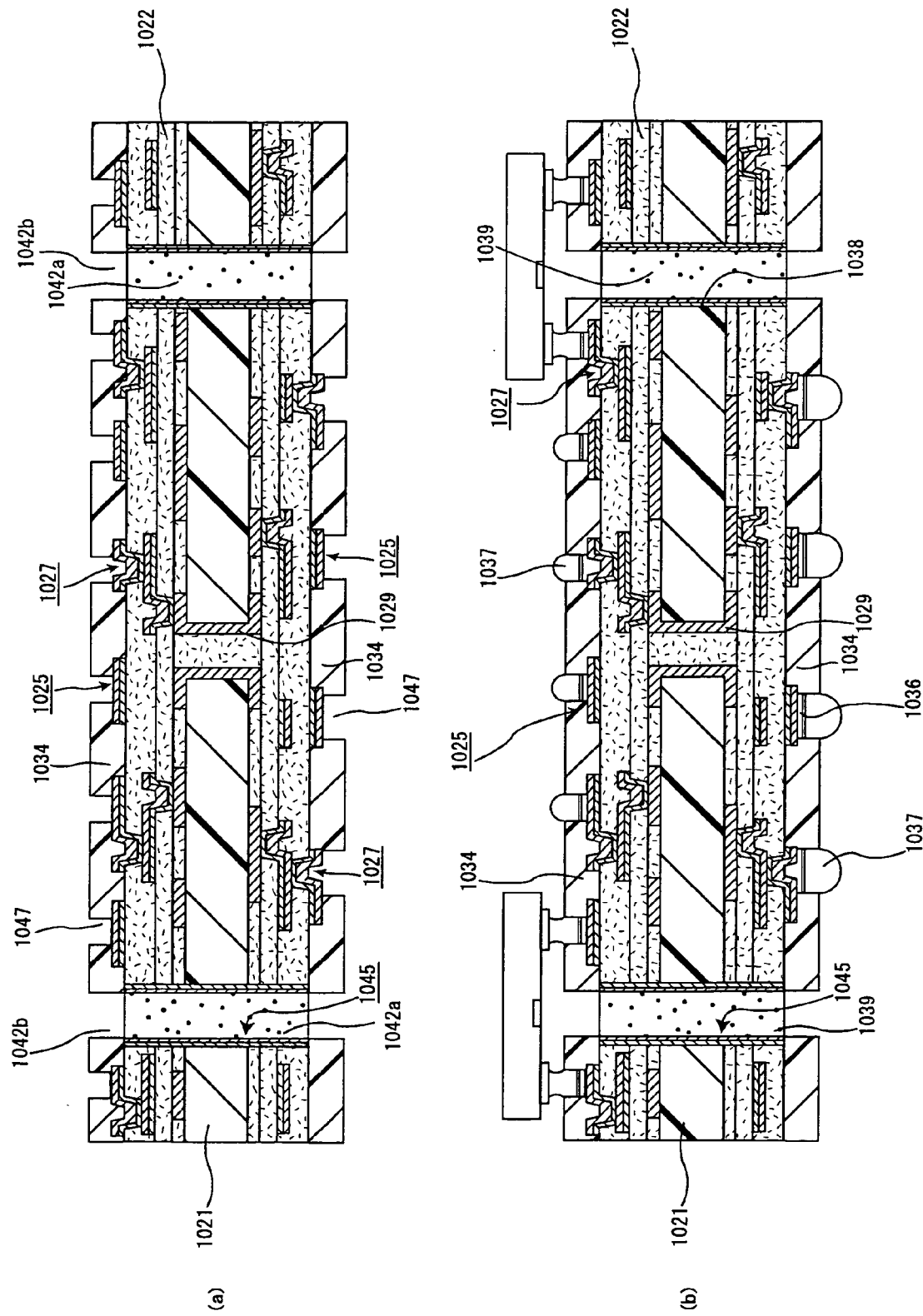
FIG. 13 is a cross-sectional view schematically showing part of the manufacturing method of a substrate for mounting an IC chip according to the second aspect of the first group of the present invention.

Further, heat treatments were conducted under conditions of 80° C. for 1 hour, 100° C. for 1 hour, 120° C. for 1 hour and 150° C. for 3 hours, respectively, to cure the solder resist composition layer, thereby forming a solder resist layer 1034 having openings for forming solder bumps 1047, openings for optical paths 1042b and a thickness of 20 μm (see FIG. 13(a)). It is noted that a commercially available solder resist composition can be also used as the above-mentioned solder resist composition.

(22) Next, the substrate on which the solder resist layers 1034 were formed was immersed in an electroless nickel plating solution having pH 4.5 and containing nickel chloride (2.3×10$^{-1}$ mol/l), sodium hypophosphite (2.8×10$^{-1}$ mol/l) and sodium citrate (1.6×10$^{-1}$ mol/l) for 20 minutes, thereby forming a 5 μm-thick nickel plated layer in the openings for forming solder bumps 1047. Further, the resultant substrate was immersed in an electroless gold plating solution containing potassium gold cyanide (7.6×10$^{-3}$ mol/l), ammonium chloride (1.9×10$^{-1}$ mol/l), sodium citrate (1.2×10$^{-1}$ mol/l) and sodium hypophosphite (1.7×10$^{-1}$ mol/l) under conditions of 80° C. for 7.5 minutes, to form a 0.03 μm-thick gold plating layer on the nickel plated layer, thus obtaining solder pads 1036.

(23) Next, solder paste was printed in the openings for forming solder bumps 1047 formed in each solder resist layer 1034, a light receiving element 1038 and a light emitting element 1039 were attached thereinto while aligning the light receiving part 1038a of the light receiving element 1038 and the light emitting part 1039a of the light emitting element 1039, and reflow was conducted at 200° C., thereby mounting the light receiving element 1038 and the light emitting element 1039, forming solder bumps 1037 in the respective openings for forming solder bumps 1047, thus obtaining a substrate for mounting an IC chip (see FIG. 13(b)).

As the light receiving element 1038, an optical element of InGaAs was used. As the light emitting element 1039, an optical element of InGaAsP was used.

It is noted that in the substrate for mounting an IC chip manufactured in this example, each of the optical paths for transmitting optical signal is constituted by the resin composition, a vacancy and the conductor layer around them.

EXAMPLE 2

A substrate for mounting an IC chip was obtained similarly to Example 1 except that a resin composition containing polyolefin was employed in place of the resin composition containing epoxy resin in the step (18) of Example 1.

It is noted that in the substrate for mounting an IC chip manufactured in this example, each of the optical paths for transmitting optical signal is constituted by the resin composition, a vacancy and the conductor layer around them.

EXAMPLE 3

A substrate for mounting an IC chip was obtained similarly to Example 1 except that the step (18) of Example 1, i.e., the step of forming the resin composition layer 1042a was not executed.

It is noted that in the substrate for mounting an IC chip manufactured in this example, each of the optical paths for transmitting optical signal is constituted by a vacancy and the conductor layer around the vacancy.

EXAMPLE 4

A substrate for mounting an IC chip was obtained similarly to Example 1 except that no conductor layer was formed on the wall face of each through hole in the steps (15) and (16) of Example 1.

It is noted that in the substrate for mounting an IC chip manufactured in this example, each of the optical paths for transmitting optical signal is constituted by a resin composition and a vacancy.

EXAMPLE 5

A substrate for mounting an IC chip was obtained similarly to Example 1 except that no conductor layer was formed on the wall face of each through hole in the steps (15) and (16) of Example 1 and that a resin composition containing polyolefin was employed in place of the resin composition containing epoxy resin in the step (18).

It is noted that in the substrate for mounting an IC chip manufactured in this example, each of the optical paths for transmitting optical signal is constituted by the resin composition and a vacancy.

EXAMPLE 6

A substrate for mounting an IC chip was obtained similarly to Example 1 except that no conductor layer was formed on the wall face of each through hole in the steps (15) and (16) of Example 1 and that the step (18), i.e., the step of forming the resin composition layer 1042a was not executed.

It is noted that in the substrate for mounting an IC chip manufactured in this example, each of the optical paths for transmitting optical signal is constituted by a vacancy.

For the substrates for mounting IC chips in Examples 1 to 6 thus obtained, each substrate for mounting an IC chip was cut with a cutter so as to cross the optical paths for transmitting optical signal and the cross section thereof was observed. As a result, it was found that the optical paths penetrating the substrate for mounting an IC chip were secured.

Further, an optical waveguide made of PMMA was disposed on the end portion of the optical path for transmitting optical signal in the substrate for mounting an IC chip on the opposite side to the light receiving element side, and a detector was attached to the end portion of the optical path for transmitting optical signal on the opposite side to the light emitting element mounting side. Thereafter, optical signal was transmitted through the optical waveguide and the IC chip was allowed to perform arithmetic operation and then the detector detected the optical signal. As a result, a desired optical signal was able to be detected.

In addition, the connection loss between the light receiving element and light emitting element and the optical paths for transmitting optical signal was measured. As a result, it was found that the connection loss was small and that no problem occurred to optical signal transmission due to the connection loss.

EXAMPLES 7 TO 13

A substrate for mounting an IC chip was obtained similarly to Example 1 except that a resin composition layer was formed using the following method in the step (18) of Example 1.

Namely, a resin composition obtained by adding pulverized silica having a particle size distribution of 0.1 to 0.8 μm to epoxy resin (refractive index: 1.53, transmissivity: 91%/mm, thermal expansion coefficient: 82 ppm) so that the silica content became the value shown in Table 1, was prepared and the filled into each through hole by screen printing. Here, the resin composition was prepared to have a viscosity of 200000 cps (mP·s) measured by BH type No7 at 10 rpm. Table 1 shows the transmissivity and thermal expansion coefficient of the resin composition as well as the content thereof.

Next, the resin composition was cured under conditions of 120° C. for 1 hour and 150° C. for 2 hours.

Moreover, the resin composition overflowing the through holes was removed by grinding using #3000 grinding paper and ground using alumina particles of 0.05 μm to flatten the surface layer of the resin composition, thereby forming a resin composition layer.

TABLE 1

|  | Content of pulverized silica (% by weight) | transmissivity (%/mm) | Thermal expansion coefficient (ppm) |
| --- | --- | --- | --- |
| Example 7 | 0 | 91 | 72 |
| Example 8 | 5 | 84 | 67 |
| Example 9 | 10 | 81 | 58 |
| Example 10 | 20 | 84 | 50 |
| Example 11 | 40 | 82 | 40 |
| Example 12 | 50 | 81 | 38 |
| Example 13 | 60 | 78 | 32 |

COMPARATIVE EXAMPLE

A. Manufacturing of Substrate for Mounting IC Chip

A substrate for mounting an IC chip was manufactured similarly to the steps of A in Example 33 to be described later.

B. Manufacturing of Multilayered Printed Circuit Board

A multilayered printed circuit board was manufactured similarly to the steps of B in Example 33.

C. Manufacturing of IC Mounting Device for Optical Communication

An IC chip 70140 was mounted on the substrate for mounting an IC chip 70120 manufactured through the steps of A by wire-bonding and then sealed with resin, thereby obtaining a substrate for mounting an IC chip.

Figure 79:
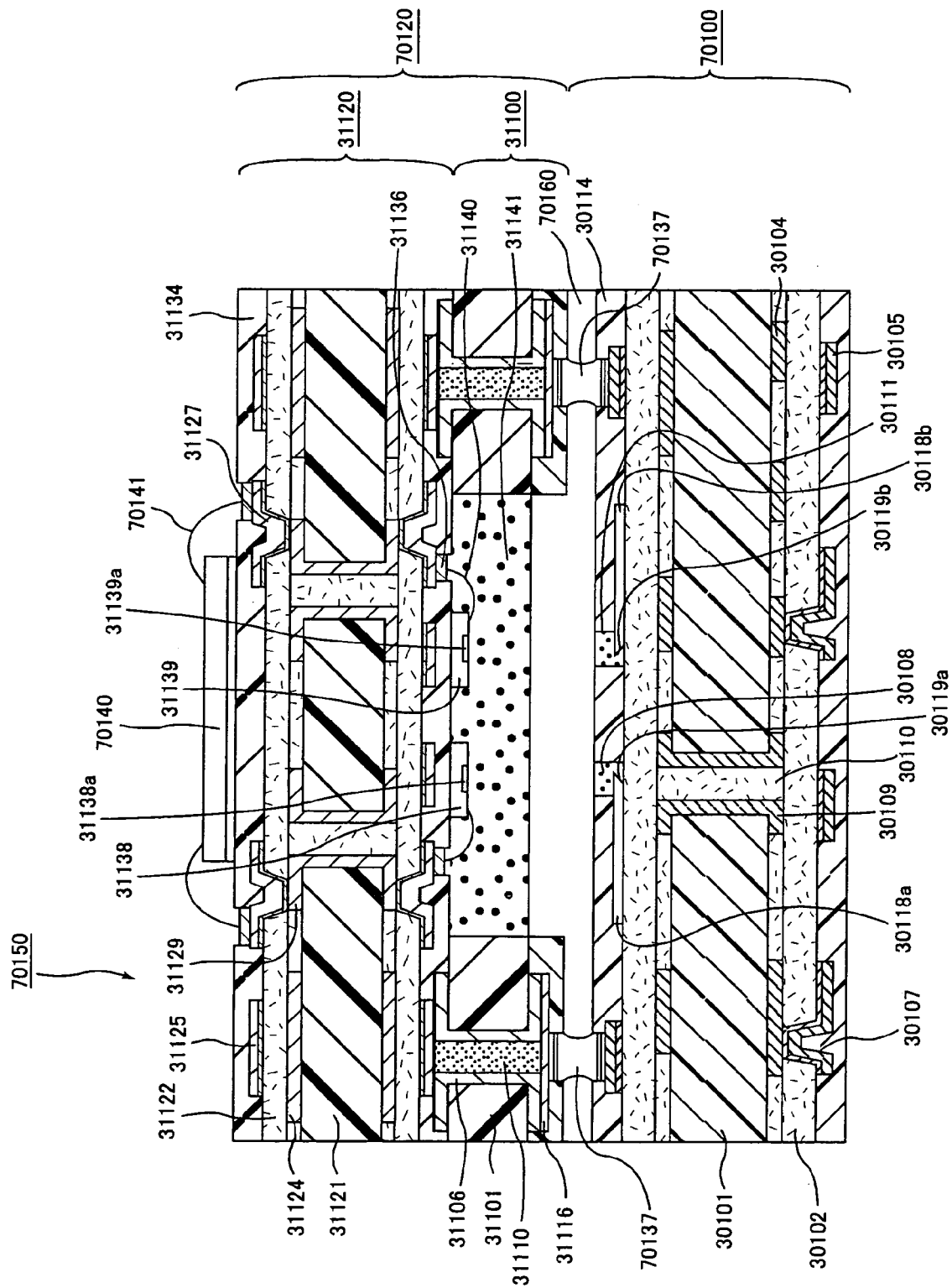
FIG. 79 is a cross-sectional view schematically showing a device for optical communication manufactured in a comparative example.

Next, this substrate for mounting an IC chip and the multilayered printed circuit board 70100 manufactured through the steps of B were disposed at respective predetermined positions to be confronting each other and reflow was conducted at 200° C., thereby connecting the solder bumps of the both substrates to one another and forming solder connection parts 70137, thus obtaining a device for optical communication 70150 (see FIG. 79). In the device for optical communication 70150 thus manufactured, a clearance 70160 between the substrate for mounting an IC chip 70120 and the multilayered printed circuit board 70100 is constituted by a vacancy.

Furthermore, in the cross-sectional view of the device for optical communication 70150 shown in FIG. 79, it appears that optical waveguides 30118a and 30118b formed in the multilayered printed circuit board 70100 are cut off halfway. Actually, however, the optical waveguides are formed so that the end faces thereof on the opposite side to the side on which optical path conversion mirrors 30119a and 30119b are formed, are aligned with the side faces of the multilayered printed circuit board, respectively.

In addition, in the substrate for mounting an IC chip 70120 that constitutes the device for optical communication 70150, optical elements (a light receiving element and a light emitting element) are completely internalized in the substrate for mounting an IC chip and the optical elements are mounted by wire-bonding. In addition, a resin composition is filled into each concave portion for mounting each optical element.

An IC chip 70140 is connected to the substrate for mounting an IC chip 70120 through wires 70141.

For the substrates for mounting IC chips in Examples 7 to 13 obtained as mentioned, the filling property of the resin composition and the presence/absence of the occurrence of cracks to the resin composition layer after a liquid-phase temperature cycle test were evaluated. The evaluation results are shown in Table 2.

The filling property of the resin composition was evaluated by, after forming the resin composition layer, cutting each substrate for mounting an IC chip to cross the optical paths for transmitting optical signal and observing the cross section.

In addition, liquid-phase temperature cycle tests were conducted for 250 cycles, 500 cycles and 1000 cycles, respectively with one cycle set as −55° C./3 minutes and 125° C./3 minutes, and the presence/absence of occurrence of cracks was evaluated for cross cut using a microscope.

Further, for the device for optical communication manufactured in Comparative Example, liquid-phase cycle tests were conducted under the same conditions as those mentioned above, and the transmission characteristics of optical signal through the optical elements and the optical waveguides after the respective cycle tests were evaluated.

TABLE 2

|  | Formability of cladding | Liquid-phase temperature cycle | | |
|---|---|---|---|---|
|  |  | 250 cycles | 500 cycles | 1000 cycles |
| Example 7 | ◯ | ◯ | ◯ | Δ |
| Example 8 | ◯ | ◯ | ◯ | Δ |
| Example 9 | ◯ | ◯ | ◯ | ◯ |
| Example 10 | ◯ | ◯ | ◯ | ◯ |
| Example 11 | ◯ | ◯ | ◯ | ◯ |
| Example 12 | ◯ | ◯ | ◯ | ◯ |
| Example 13 | ◯ | ◯ | ◯ | ◯ |
| Comparative Example | — | ◯ | Δ | X |

Table 2 shows the results of Examples 7 to 13 and the evaluation result of optical signal transmission characteristic of the device for optical communication manufactured in the above-mentioned Comparative Example.

Evaluation Standard of Filling Property of Resin Composition

◯: Resin composition was completely filled into each through hole and no void occurred.

Δ: Void occurrence portion was observed in part of resin composition filled into each through hole, and deterioration of optical signal transmission capability was observed.

X: Large void occurred to resin composition filled into each through hole and optical signal was not able to be transmitted.

Evaluation standard of liquid-phase temperature cycle test

◯: No crack was observed.

Δ: Some cracks occurred but optical signal was able to be transmitted through optical paths for transmitting optical signal.

X: Cracks occurred and optical signal was not able to be transmitted optical paths for transmitting optical signal.

Evaluation standard of optical signal transmission characteristic of Comparative Example ◯: Optical signal was able to be transmitted through optical elements and optical waveguides.

Δ: Optical signal was able to be transmitted through optical elements and optical waveguides though increase of transmission loss was seen.

X: Optical signal could not often transmitted through optical elements and optical waveguides.

Further, for Examples 8 to 13, the pulverized silica particles mixed into the resin composition that constitutes each optical path for transmitting optical signal were replaced by titania particles or alumina particles, and the same tests were conducted. As a result, despite slight difference in thermal expansion coefficient value, the same results were obtained for the resin composition filling property and the liquid-phase temperature cycle.

EXAMPLE 14

A. Manufacturing of Substrate for Mounting IC Chip

A-1. Manufacturing of Resin Film for Interlaminar Insulating Layer

A resin film for an interlaminar insulating layer was prepared using the same method as that used in the steps of A in Example 1.

A-2. Preparation of Resin Composition for Filling Through Hole

A resin composition for filling a through hole was prepared using the same method in the steps of B in Example 1.

A-3. Manufacturing of Substrate for Mounting IC Chip (1) A copper-clad laminated board composed of an insulating substrate 2021 made of a 0.8 mm-thick glass epoxy resin or BT (bismaleimide-triazine) resin, with a 18 μm-thick copper foil 2028 laminated on both faces of the substrate 2021 was used as a starting material (see FIG. 17(*a*)). First, the copper-clad laminated board was drilled to bore holes and then, an electroless plating treatment was carried out and pattern etching was carried out to form conductor circuits 2024 and plated-through holes 2029 on both faces of the substrate 2021 (see FIG. 17(*b*)).

(2) The substrate having the plated-through holes 2029 formed therein and the conductor circuits 2024 formed thereon was washed with water and dried, then subjected to a blackening treatment using an aqueous solution containing NaOH (10 g/l), $NaClO_2$ (40 g/l), $Na_3PO_4$ (6 g/l) as a blackening bath (oxidizing bath) and a reducing treatment using an aqueous solution containing NaOH (10 g/l) and $NaBH_4$ (6 g/l) as a reducing bath to form roughened faces (not shown) on the entire surfaces of the conductor circuits 2024 including the plated-through holes 2029.

(3) After the resin filler described in A-2 was prepared, a layer of resin filler 2030' was formed inside each plated-through hole 2029, non conductor formed areas and the peripheral parts of the conductor circuits 2024 on the substrate 2021 by the following method within 24 hours after the preparation.

That is, first, the resin filler was pushed in the plated-through holes using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minutes, thereby forming the layer of resin filler 2030' (see FIG. 17(*c*)).

(4) One face of the substrate for which the treatment (3) was just finished was ground by belt sander grinding using #600 belt grinding paper (made by Sankyo Chemical Engineering Co.) so as not to leave the resin filler 2030' on the surfaces of the conductor circuits 2024 and the land surfaces of the plated-through holes 2029 and then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 2030.

Figure 17:
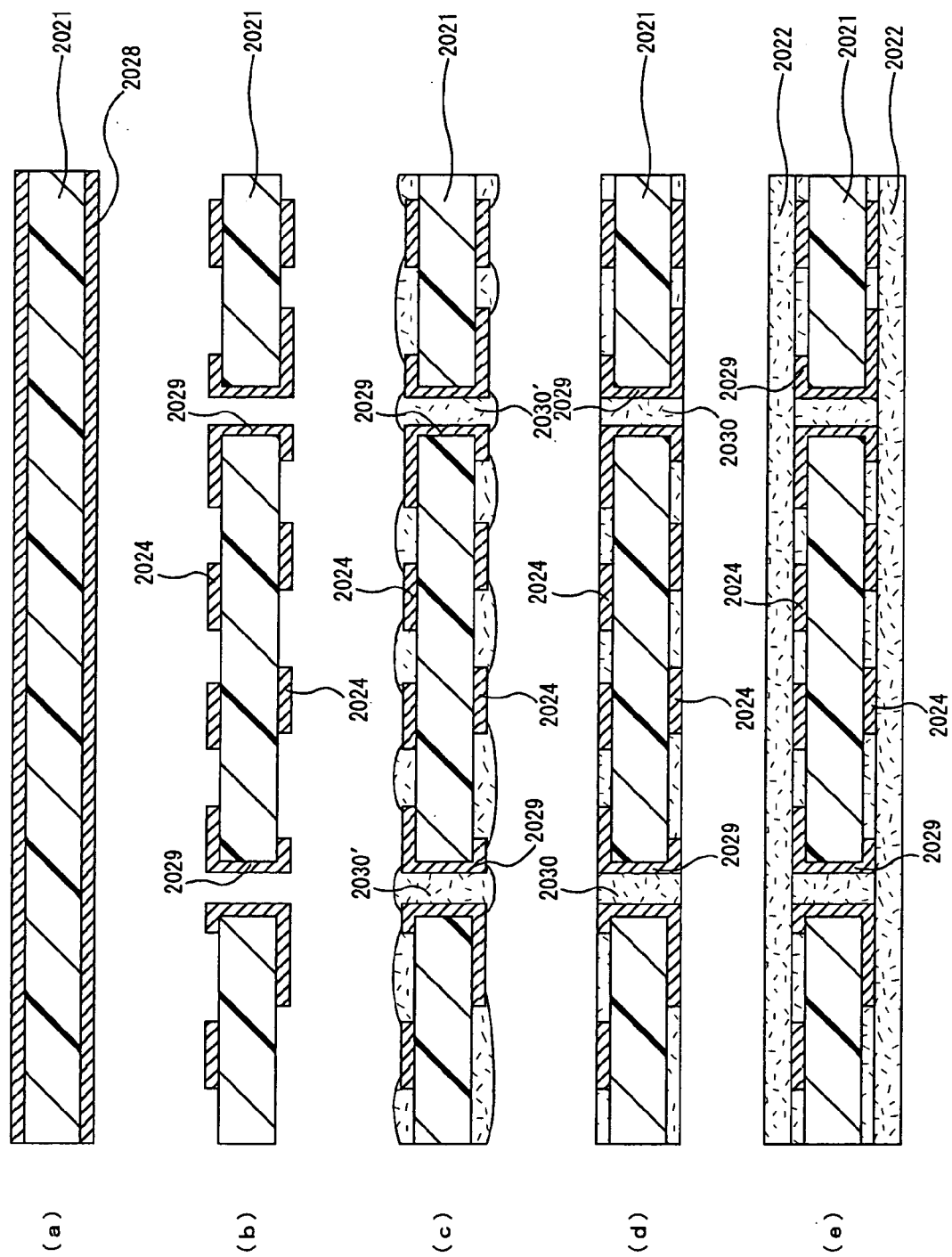
FIG. 17 is a cross-sectional view schematically showing part of steps of manufacturing a substrate for mounting an IC chip that constitutes the device for optical communication according to the first aspect of the second group of the present invention.

In such a manner, the surface layer part of the resin filler 2030 formed in the plated-through hole 2029 and the non conductor formed areas, the surfaces of the conductor circuits 2024 were flattened and the resin filler 2030 and the side faces of the conductor circuits 2024 were firmly stuck to each other through the roughened faces, and the inner wall faces of the plated-through holes 2029 and the resin filler 2030 were also firmly stuck to each other through the roughened faces, thus obtaining an insulating substrate (see FIG. 17(*d*)). By this step, the surface of the resin filler layer 2030 was flush with the surfaces of the conductor circuits 2024.

(5) After the substrate was washed with water and degreased with an acid, soft etching was carried out and etchant was sprayed on both faces of the substrate to etch the surfaces of the conductor circuits 2024 and the land surfaces and inner walls of the plated-through holes 2029, thereby forming roughened faces (not shown) on the entire surfaces of the conductor circuits 2024. As the etchant, etchant (made by Meck Co.; Meck etch bond) containing 10 parts by weight of an imidazole copper(II) complex and 7 parts by weight of glycolic acid, and 5 parts by weight of potassium chloride was used.

(6) Next, a resin film for an interlaminar resin insulating layer with a slightly larger size than that of the substrate produced in the A-1 was put on both faces of the substrate, temporarily pressure-bonded under conditions of 0.4 MPa pressure, 80° C. temperature, and 10-second pressure bonding period and cut. Thereafter, the film was bonded by the following method using a vacuum laminator device to thereby form an interlaminar resin insulating layer 2022 (see FIG. 17(*e*)).

That is, the resin film for an interlaminar resin insulating layer was actually pressure-bonded on the substrate under conditions of 65 Pa degree of vacuum, 0.4 MPa pressure, 80° C. temperature and 60-second pressure bonding period, and the resin film was further thermally cured at 170° C. for 30 minutes.

(7) Next, openings for via-holes 2026 with 80 μm diameter were formed in the interlaminar insulating layers 2022 by a $CO_2$ gas laser of 10.4 μm wavelength through a 1.2 mm-thick mask having through holes therein in conditions of a beam diameter of 4.0 mm, a top hat mode, a pulse interval of 8.0 μs, 1.0 mm-diameter of the through holes of the mask and one shot.

Figure 18:
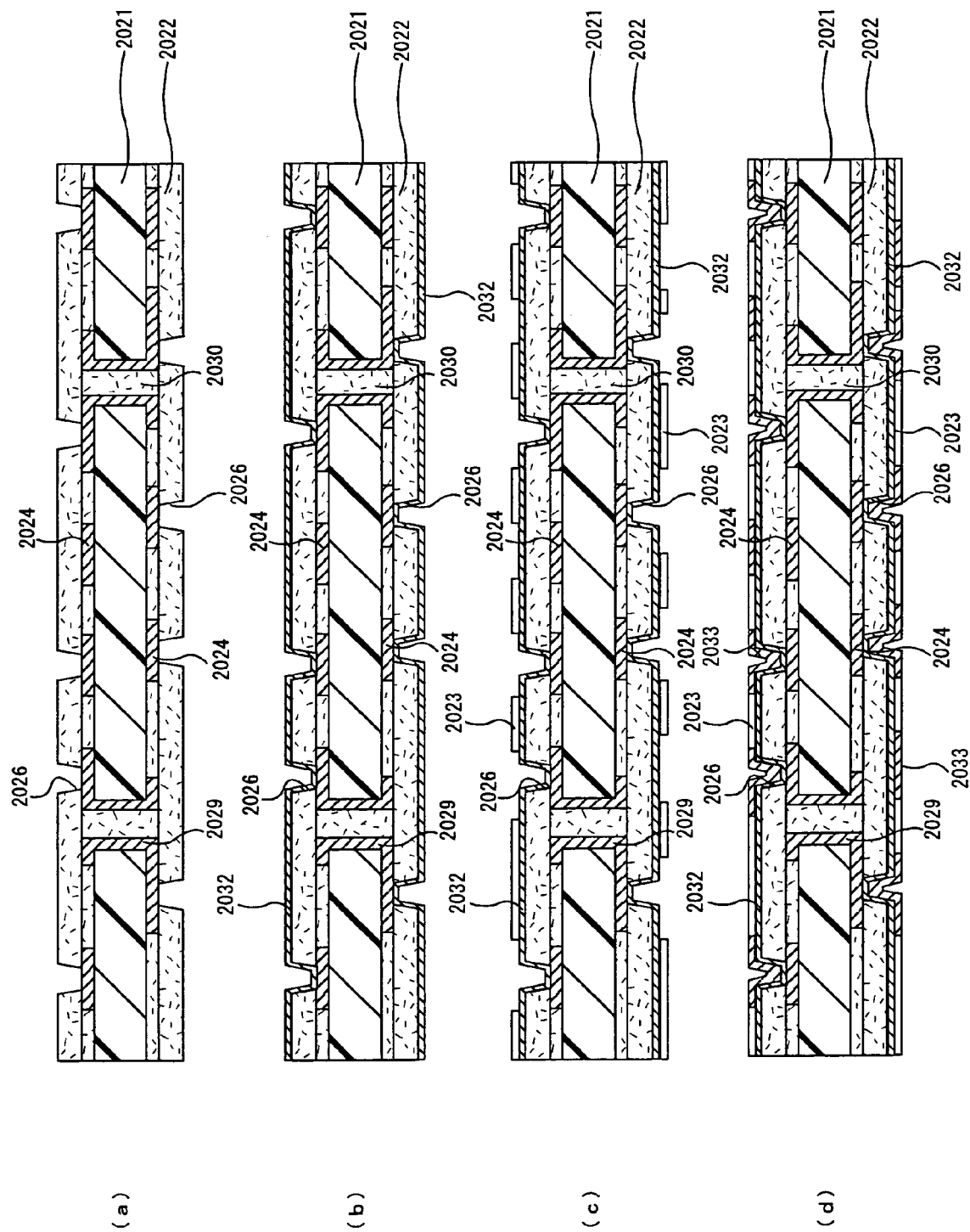
FIG. 18 is a cross-sectional view schematically showing part of the steps of manufacturing the substrate for mounting an IC chip that constitutes the device for optical communication according to the first aspect of the second group of the present invention.

(see FIG. 18(*a*)).

(8) The substrate in which the openings for via-holes 2026 were formed was immersed in a solution containing 60 g/l of permanganic acid at 80° C. for 10 minutes to dissolve and remove epoxy resin particles existing on the surfaces of the interlaminar resin insulating layers 2022, thus forming the roughened faces (not shown) on the interlaminar insulating layers 2022 including the inner wall faces of the openings for via-holes 2026.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth of 3 μm), whereby a catalyst core was attached to the surfaces of the interlaminar insulating layers 2022 (including the inner wall faces of the openings for via-holes 2026) (not shown). That is, the catalyst was attached by immersing the substrate in a catalytic solution containing palladium chloride ($PdCl_2$) and stannous chloride ($SnCl_2$) to precipitate metal.

(10) Next, the substrate was immersed in an electroless copper plating solution having the following composition to form an electroless copper plating film 2032 having a thickness of 0.6 to 3.0 μm on the surface of each interlaminar insulating layer 2022 (including the inner wall faces of the openings for via-holes 2026) (see FIG. 18(*b*)).

[Electroless Plating Solution]

| | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]

30° C. liquid temperature and 40 minutes

(11) Next, a commercially available photosensitive dry film was bonded to both faces of the substrate on which the electroless copper plating film 2032 was formed, a mask was put thereon and exposure with 100 mJ/cm² and development with an aqueous 0.8% sodium carbonate solution were carried out, thereby forming a plating resist 2023 having a thickness of 20 μm (see FIG. 18(*c*)).

(12) Next, the substrate was washed with water at 50° C. to be degreased, washed with water at 25° C., and further washed with sulfuric acid. Thereafter, the substrate was subjected to electroplating under the following conditions, thereby forming a electroplating copper film 2033 (see FIG. 18(*d*)).

[Electroplating Solution]

| | |
|---|---|
| Sulfuric acid | 2.24 mol/l |
| Copper sulfate | 0.26 mol/l |
| Additive | 19.5 ml/l |
| (Cupracid GL made by Atotech Co.) | |

[Electroplating Conditions]

| | |
|---|---|
| Current density | 1 A/dm² |
| Time | 65 minutes |
| Temperature | 22 ± 2° C. |

Figure 19:
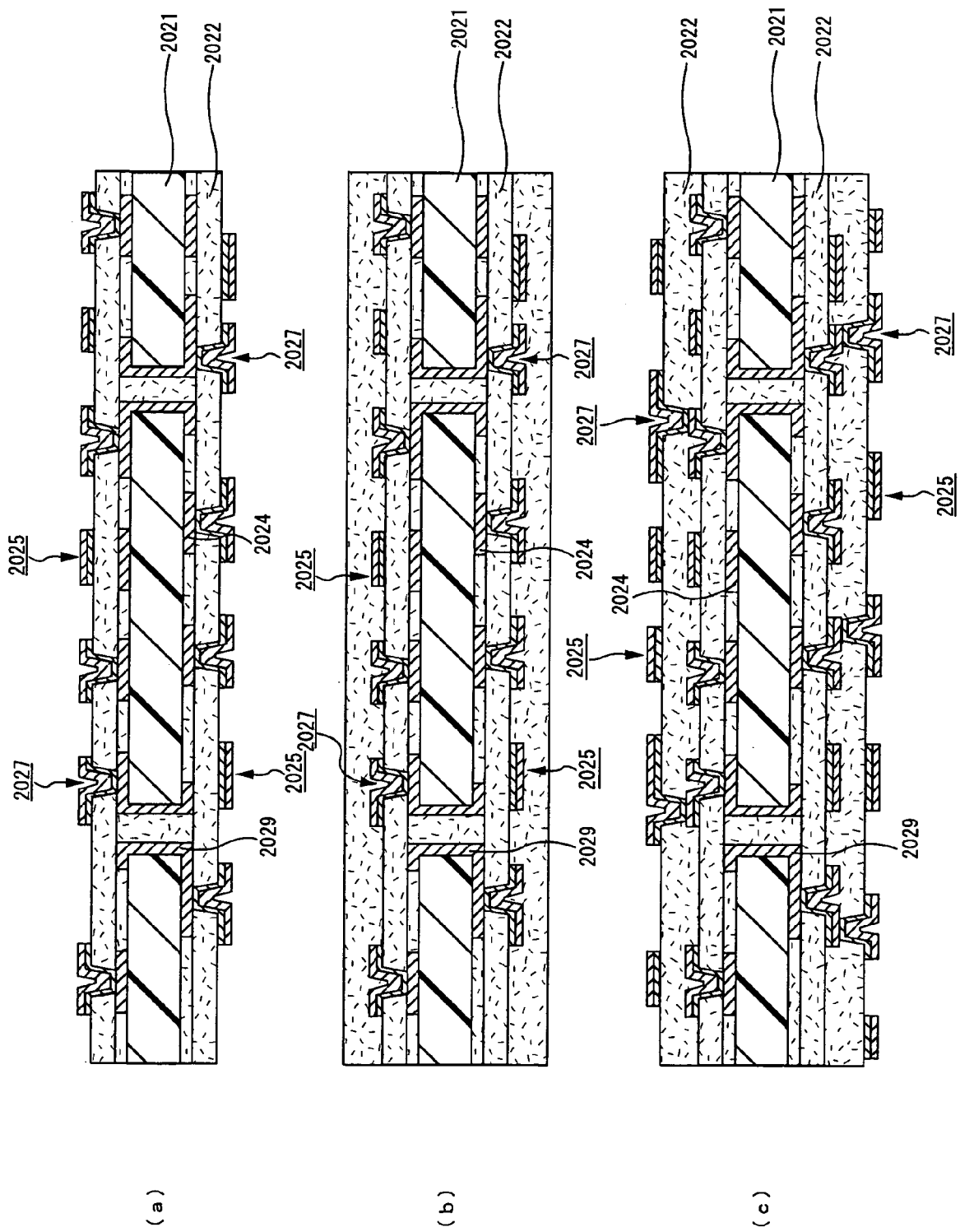
FIG. 19 is a cross-sectional view schematically showing part of the steps of manufacturing the substrate for mounting an IC chip that constitutes the device for optical communication according to the first aspect of the second group of the present invention.

(13) After peeling off the plating resists 2023 with 5% NaOH, the thin film conductor layer under the plating resist 2023 was etched, dissolved and removed with a solution mixture of sulfuric acid and hydrogen peroxide, thus forming conductor circuits 2025 (including via-holes 2027) each comprising the electroless copper plating film 2032 and the electroplating copper film 2033 and having a thickness of 18 μm (see FIG. 19(*a*)).

(14) Next, the steps (5) to (12) were repeated, thereby building up upper level interlaminar insulating layers and conductor circuits in an alternate fashion and in repetition (see FIGS. 19(*b*) and 19(*c*)).

Further, using the same etchant (Meck etch bond) as that used in the step (5), roughened faces (not shown) on the surfaces of the conductor circuits 2025 (including the via-holes 2027).

(15) Next, a resin composition was prepared similarly to the step (19) of Example 1.

Figure 20:
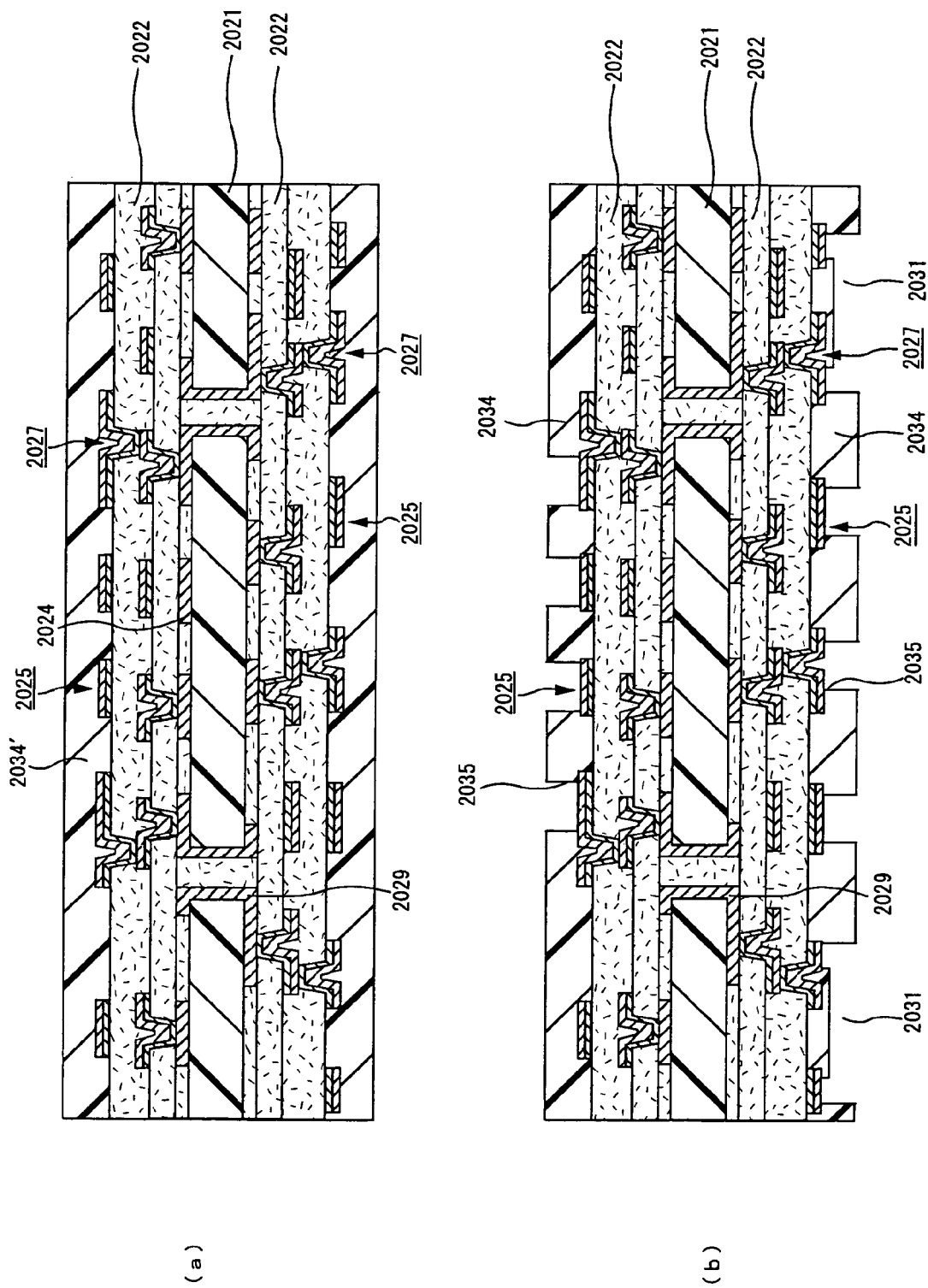
FIG. 20 is a cross-sectional view schematically showing part of the steps of manufacturing the substrate for mounting an IC chip that constitutes the device for optical communication according to the first aspect of the second group of the present invention.
Figure 21:
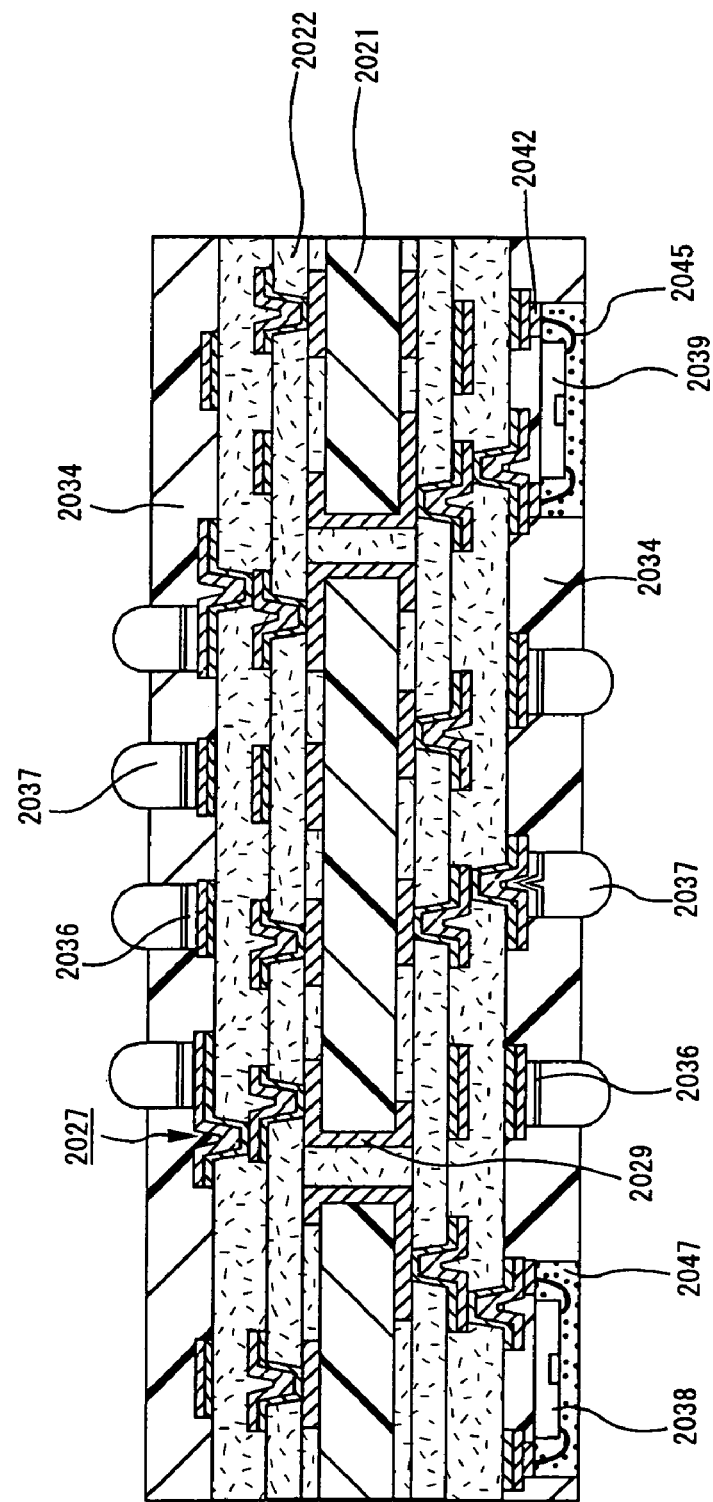
FIG. 21 is a cross-sectional view schematically showing part of the steps of manufacturing the substrate for mounting an IC chip that constitutes the device for optical communication according to the first aspect of the second group of the present invention.

(16) Next, the solder resist composition was applied by 30 μm thickness to both faces of the substrate having the interlaminar insulating layers 2022 and the conductor circuits 2025 (including the via-holes 2027) formed thereon and dried under conditions of 70° C. for 20 minutes and 70° C. for 30 minutes, thereby forming a solder resist composition layer 2034' (see FIG. 20(*a*)).

(17) Next, a 5 mm-thick photomask on which a pattern of openings for forming solder bumps and openings for mounting optical elements (a light receiving element and a light emitting element) was drawn was closely stuck to one of the solder resist composition layers, exposed with UV rays of 1000 mJ/cm² and developed with a DMTG solution.

Further, heat treatments were conducted under conditions of 80° C. for 1 hour, 100° C. for 0.1 hour, 120° C. for 1 hour and 150° C. for 3 hours, respectively, to cure the solder resist composition layer, thereby forming a solder resist layer 2034 having openings for forming solder bumps 2035, openings for mounting optical elements 2031 and a thickness of 20 μm. It is noted that the diameter of the openings for forming solder bumps 2035 was 150 μm and the distance between the openings was 250 μm.

Further, a photo mask on which a pattern of IC chip mounting openings was drawn was closely stuck to the other solder resist composition layer and subjected to exposure and development under the same exposure and development conditions as those mentioned above, thereby openings for mounting IC chips 2035 (see FIG. 20(*b*)).

It is noted that the diameter of the openings for forming solder bumps was normally about 50 to 200 μm and the distance between the openings was normally 100 to 250 μm.

(18) Next, the substrate on which the solder resist layers 2034 were formed was immersed in an electroless nickel plating solution having pH 4.5 and containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, thereby forming a 5 μm-thick nickel plated layer in the openings for forming solder bumps 2035 and the openings for mounting optical elements 2031. Further, the resultant substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, to form a 0.03 μm-thick gold plated layer on the nickel plated layer, thus obtaining solder pads 2036 and pads for connecting optical elements 2042.

(19) Next, a light receiving element 2038 and a light emitting element 2039 were attached into the openings for mounting optical elements 2031 on which the solder resist layer 2034 was formed using resin for die-bonding while aligning a light receiving part and a light emitting part.

As the light receiving element 2038, an optical element comprising InGaAs was used. As the light emitting element 2039, an optical element comprising InGaAsP was used.

Next, the light receiving element 2038 and the light emitting element 2039 were connected to the pads for connecting optical elements 2042 exposed to the bottoms of the respective openings for mounting optical elements 2031 by wire-bonding. As wires 2045 herein, Au containing wires were used.

Next, the surroundings of the optical element 2038 and the light emitting element 2039 were sealed with resin by the following method.

That is, an uncured resin composition containing thermosetting epoxy resin, particles having a particle size distribution of 0.1 to 0.8 μm, acid anhydride, a defoaming agent and a curing agent was filled into each of the openings for mounting optical elements 2031 in which the optical elements 2038 and 2038 were mounted, respectively, and a curing treatment was then conducted to the resin composition, thereby sealing the surroundings of the optical elements with resin 2047.

(20) Next, solder paste was printed in the openings for forming solder bumps 2035 formed in each solder resist layer 2034 and reflow was conducted at 200° C., thereby forming solder bumps 2037. Further, solder bumps were similarly formed on the openings for mounting IC chips, thus obtaining a substrate for mounting an IC chip.

B. Manufacturing of Multilayered Printed Circuit Board

B-1. Manufacturing of Resin Film for Interlaminar Resin Insulating Layer

A resin film for an interlaminar insulating layer was prepared using the same method as that used in A-1.

B-2. Preparation of Resin Composition for Filling Through Hole

A resin composition for filling a through hole was prepared using the same method as that used in A-2.

B-3. Manufacturing of Multilayered Printed Circuit Board (1) A copper-clad laminated board composed of an insulating substrate 2001 made of a 0.6 mm-thick glass epoxy resin or BT resin, with a 18 μm-thick copper foil 2008 laminated on both faces of the substrate 2001 was used as a starting material (see FIG. 22(*a*)). First, the copper-clad laminated board was drilled to bore holes and, then, an electroless plating treatment was carried out and pattern etching was carried out to form conductor circuits 2004 and a plated-through hole 2009 on both faces of the substrate 2001 (see FIG. 22(*b*)).

(2) The substrate having the plated-through hole 2009 formed therein and the conductor circuits 2004 formed thereon was washed with water and dried, then etchant (made by Meck Co.; Meck etch bond) was sprayed to the substrate, thereby forming roughened faces (not shown) on the surfaces of the conductor circuits 2004 including the plated-through hole 2009.

(3) After the resin filler described in B-2 was prepared, a layer of resin filler 2010' was formed inside the plated-through hole 2009, non conductor formed areas and the peripheral parts of the conductor circuits 2004 on the substrate 2001 by the following method within 24 hours after the preparation.

That is, first, the resin filler was pushed in the plated-through hole using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minuets, thereby forming the layer of resin filler 2010' (see FIG. 22(*c*)).

(4) One face of the substrate for which the treatment (3) was just finished was ground by belt sander grinding using #600 belt grinding paper (made by Sankyo Chemical Engineering Co.) so as not to leave the resin filler 2010' on the surfaces of the conductor circuits 2004 and the land surface of the plated-through hole 2009 and then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 2010.

Figure 22:
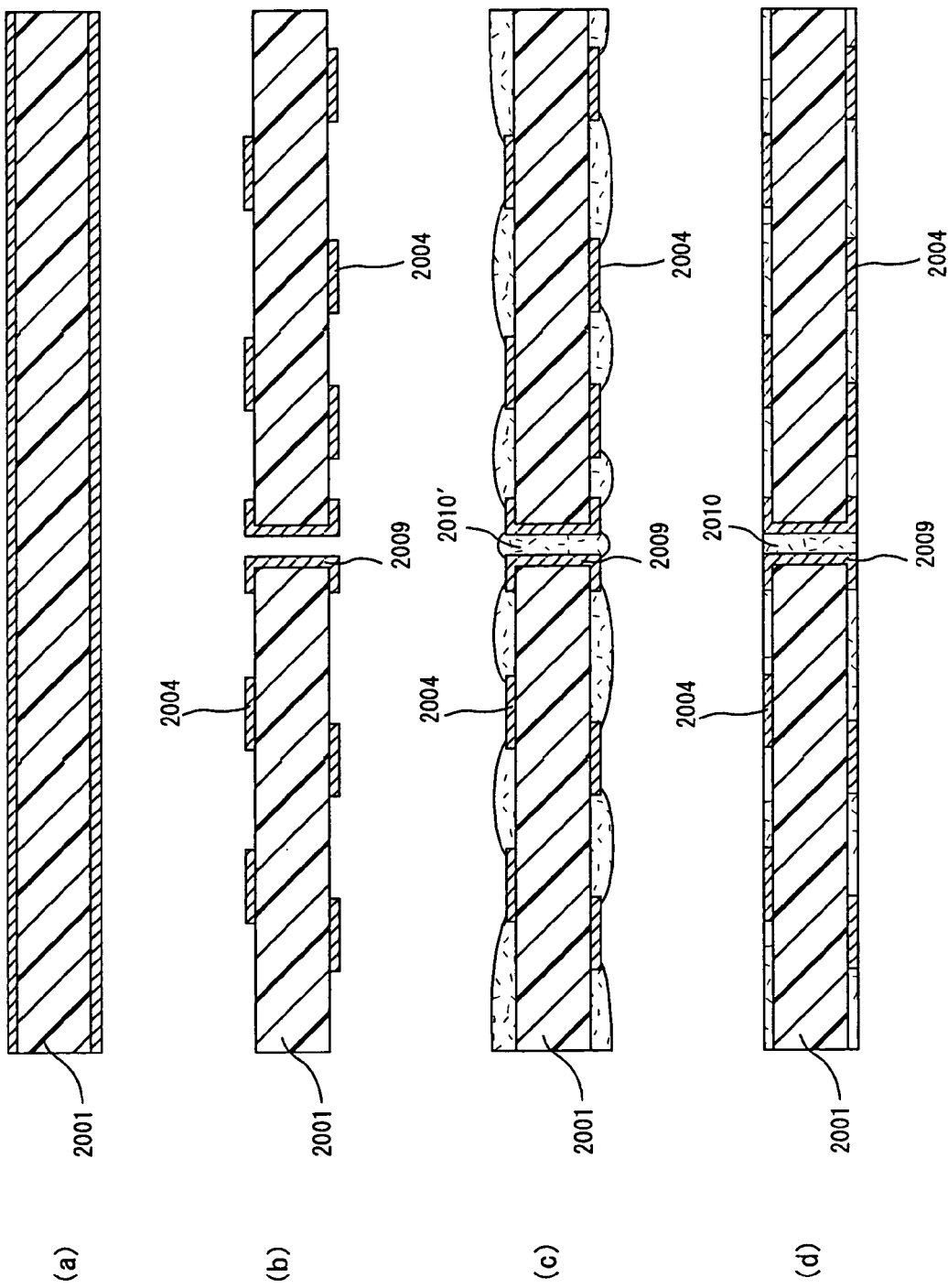
FIG. 22 is a cross-sectional view schematically showing part of steps of manufacturing a multilayered circuit board that constitutes the device for optical communication according to the first aspect of the second group of the present invention.

In such a manner, the surface layer part of the resin filler 2010 formed in the plated-through hole 2009 and the non conductor formed areas, the surfaces of the conductor circuits 2004 were flattened and the resin filler 2010 and the side faces of the conductor circuits 2004 were firmly stuck to each other through the roughened faces, and the inner wall face of the plated-through hole 2009 and the resin filler 2010 were also firmly stuck to each other through the roughened face, thus obtaining an insulating substrate (see FIG. 22(*d*)). By this step, the surface of the resin filler layer 2010 was flush with the surfaces of the conductor circuits 2004.

(5) After the substrate was washed with water and degreased with an acid, soft etching was carried out and etchant was sprayed on both faces of the substrate to etch the surfaces of the conductor circuits 2004 and the land surface and inner wall of the plated-through hole 2009, thereby forming roughened faces (not shown) on the entire surfaces of the conductor circuits 2004. As the etchant, Meck etch bond made by Meck Co. was used.

(6) Next, a resin film for the interlaminar resin insulating layer with a slightly larger size than that of the substrate produced in the B-1 was put on the substrate, temporarily pressure-bonded under conditions of 0.4 MPa pressure, 80° C. temperature, and 10-second pressure bonding period and cut. Thereafter, the film was bonded by the following method using a vacuum laminator device to thereby form an interlaminar resin insulating layer 2002 (see FIG. 23(*a*)). That is, the resin film for the interlaminar resin insulating layer was actually pressure-bonded on the substrate under conditions of 65 Pa degree of vacuum, 0.4 MPa pressure, 80° C. temperature and 60-second pressure bonding period, and the resin film was further thermally cured at 170° C. for 30 minutes.

(7) Next, openings for via-holes 2006 with 80 μm diameter were formed in the interlaminar insulating layers 2002 by a $CO_2$ gas laser of 10.4 μm wavelength through a 1.2 mm-thick mask having through holes therein in conditions of a beam diameter of 4.0 mm, a top hat mode, a pulse interval of 8.0 μs, 1.0 mm-diameter of the through holes of the mask and one shot.

Figure 23:
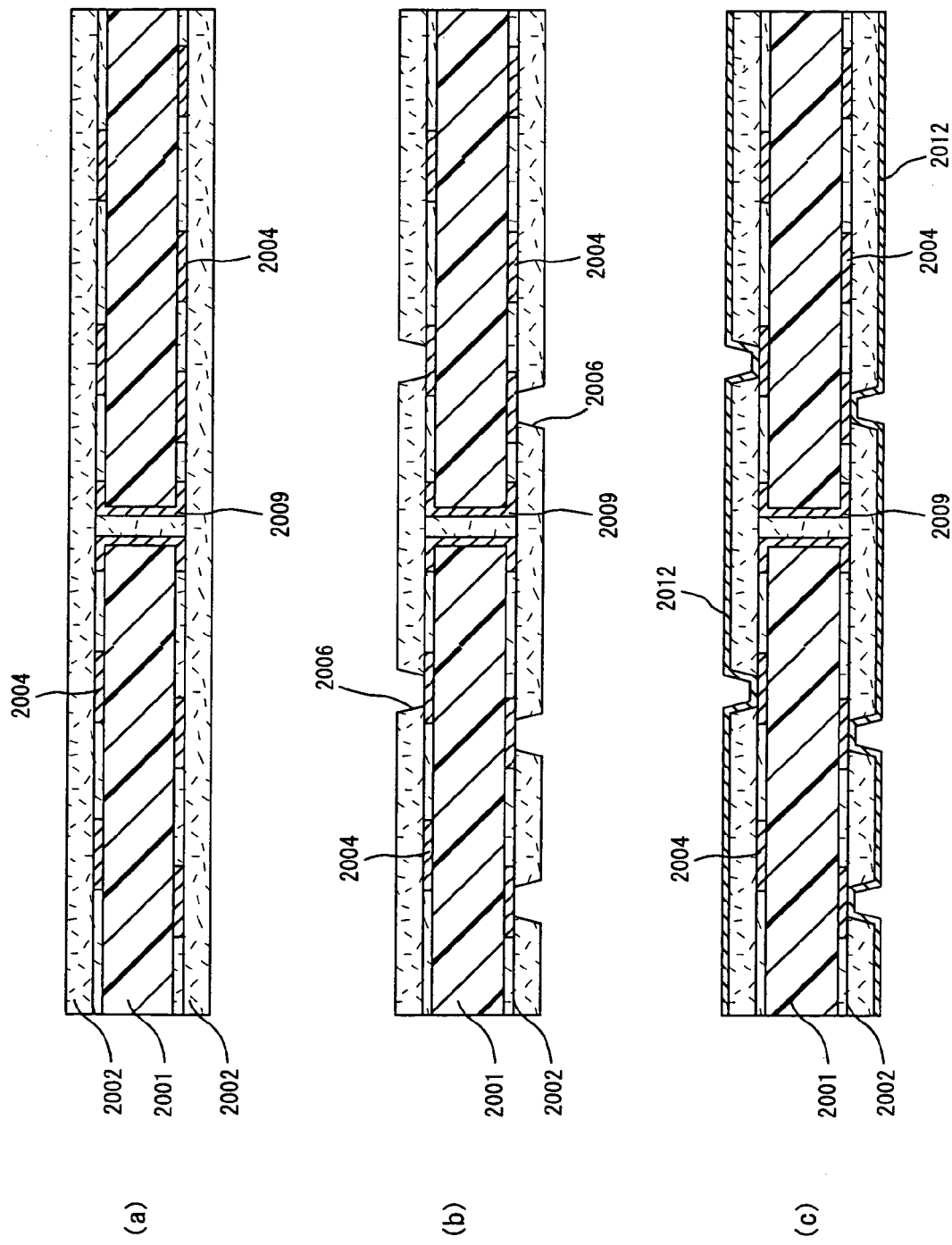
FIG. 23 is a cross-sectional view schematically showing part of the steps of manufacturing the multilayered circuit board that constitutes the device for optical communication according to the first aspect of the second group of the present invention.

(see FIG. 23(*b*)).

(8) The substrate in which the openings for via-holes 2006 were formed was immersed in a solution containing 60 g/l of permanganic acid at 80° C. for 10 minutes to dissolve and remove epoxy resin particles existing on the surfaces of the interlaminar resin insulating layers 2022, thus forming the roughened faces (not shown) on the surfaces of the interlaminar insulating layers 2002 including the inner wall faces of the openings for via-holes 2006.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth of 3 μm), whereby a catalyst core was attached to the surfaces of the interlaminar insulating layers 2002 (including the inner wall faces of the openings for via-holes 2006) (not shown). That is, the catalyst was attached by immersing the substrate in a catalytic solution containing palladium chloride ($PdCl_2$) and stannous chloride ($SnCl_2$) to precipitate metal.

(10) Next, the substrate was immersed in an electroless copper plating solution having the following composition to form a electroless copper plating film 2012 having a thickness of 0.6 to 3.0 μm on the surface of each interlaminar insulating layer 2002 (including the inner wall faces of the openings for via-holes 2006) (see FIG. 23(*b*)).

It is noted that the used electroless plating solution and the electroless plating conditions were the same as those in the step (10) in the manufacturing of the substrate for mounting an IC chip.

Figure 24:
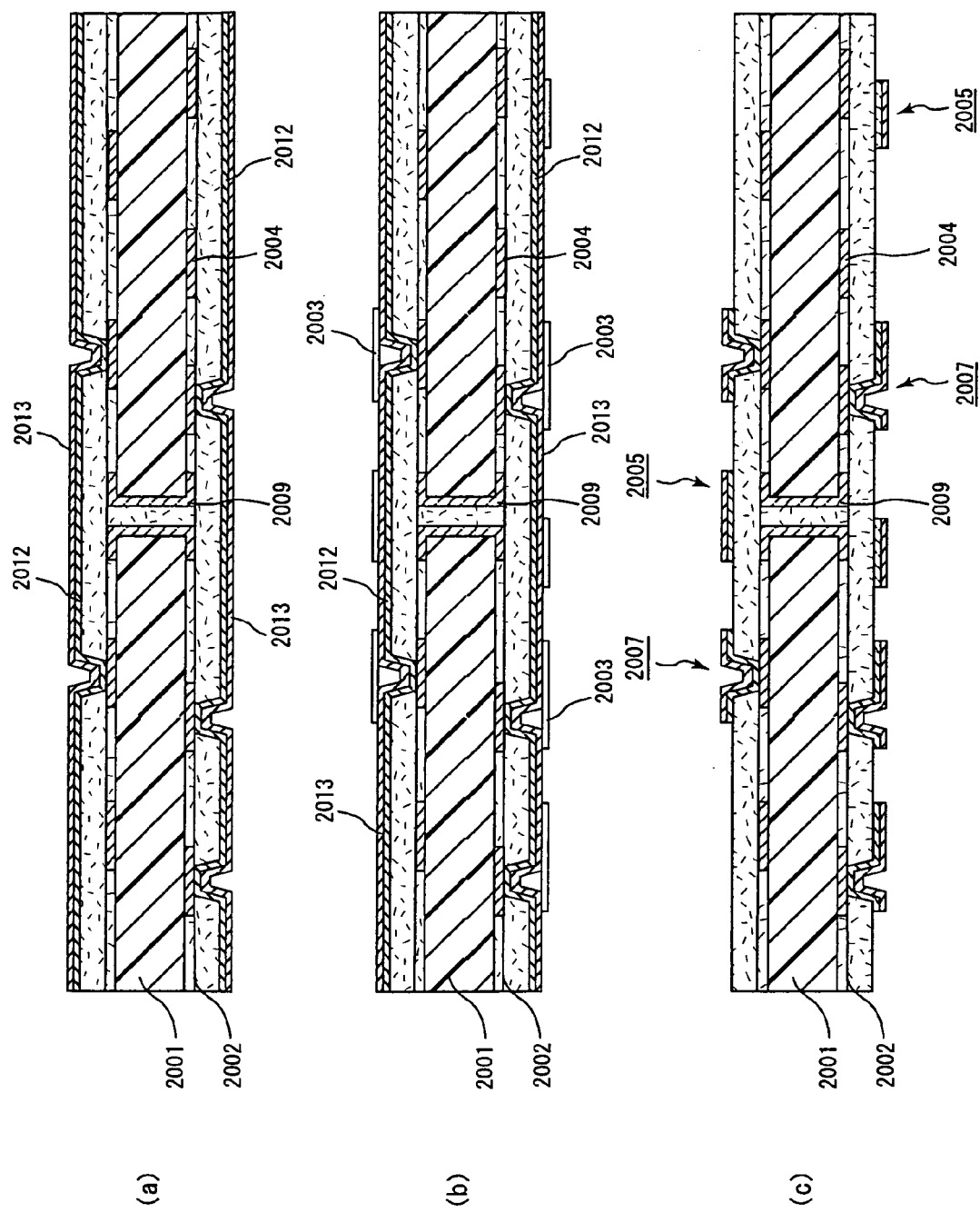
FIG. 24 is a cross-sectional view schematically showing part of the steps of manufacturing the multilayered circuit board that constitutes the device for optical communication according to the first aspect of the second group of the present invention.

(11) The substrate on which the electroless plating films 2012 were formed was washed with water and electroplating was then carried out, thereby forming an electroless copper plating film 2013 having a thickness of 20 μm entirely on each electroless plating film 2012 (see FIG. 24(*a*)).

It is noted that the used electroless plating solution and the electroless plating conditions were the same as those in the step (12) in the manufacturing of the substrate for mounting an IC chip.

(12) Next, a commercially available photosensitive dry film was bonded to the substrate on which the electroless copper plating films 2013 were formed, a mask was put there on and exposure with 100 mJ/$cm^2$ and development with an aqueous 0.8% sodium carbonate solution were carried out, thereby forming an etching resist 2003 (see FIG. 24(*b*)).

(13) Next, the electroplating copper film and the electroless plating film under the non etching resist formed areas were etched with a solution mixture of sulfuric acid and hydrogen peroxide, thereby dissolving and removing these films, and the etching resist was peeled off with 5% NaOH solution, thereby forming conductor circuits 2007 (including the via-holes 2005) each comprising the electroless copper plating film 2012 and the electroplating copper film 2013 (see FIG. 24(*c*)).

Further, using etchant (Meck etch bond), roughened faces (not shown) were formed on the respective conductor circuits 2005 (including the via-holes 2007).

Figure 25:
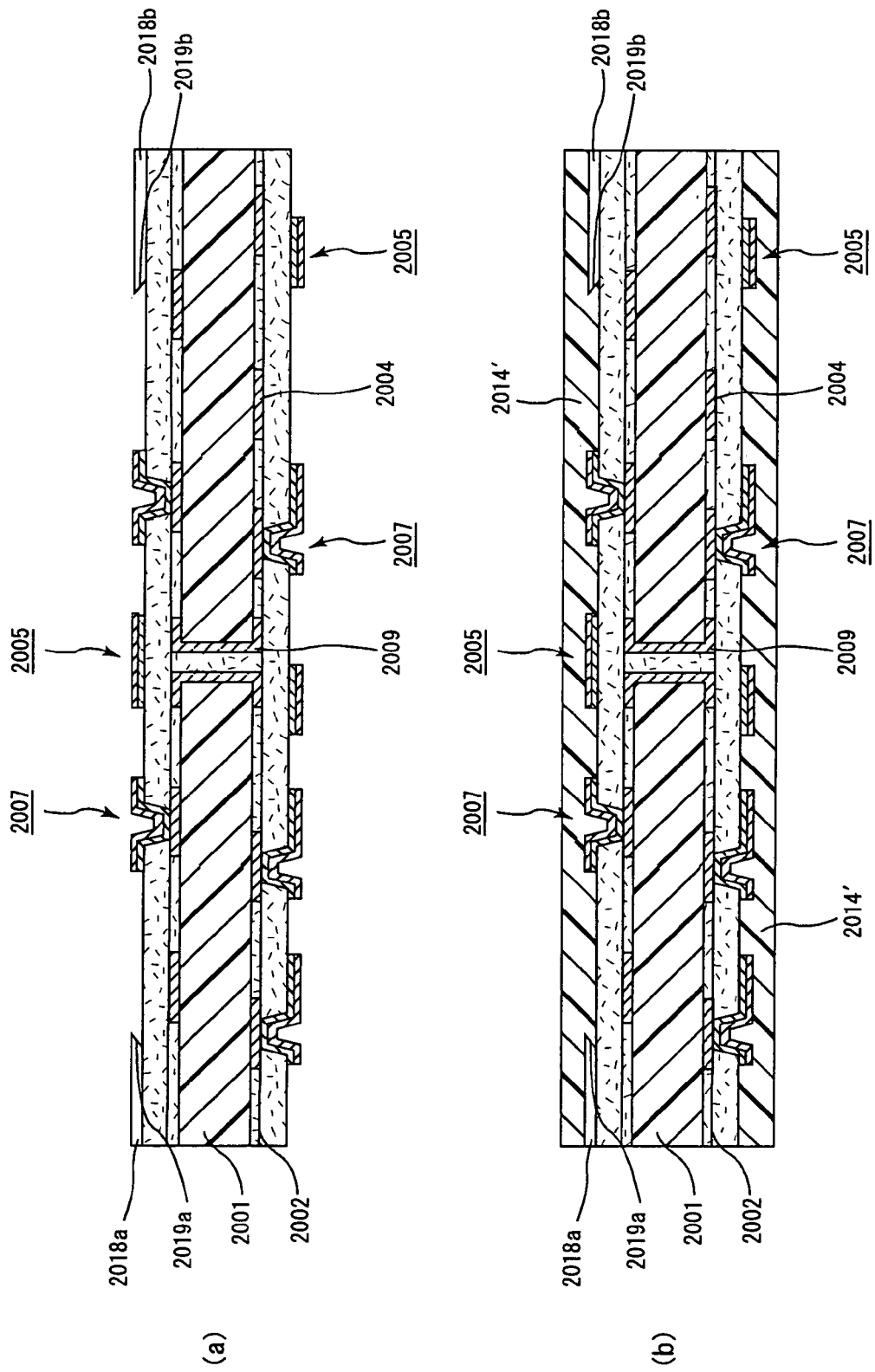
FIG. 25 is a cross-sectional view schematically showing part of the steps of manufacturing the multilayered circuit board that constitutes the device for optical communication according to the first aspect of the second group of the present invention.

(14) Next, optical waveguides 2018 (2018*a*, 2018*b*) having optical path conversion mirrors 2019 (2019*a*, 2019*b*) were formed at predetermined positions by the following method, respectively (see FIG. 25(*a*)).

That is, a film-shaped optical waveguide (width: 25 μm, thickness: 25 μm) which was made of PMMA and on which 45°—the optical conversion mirror 2019 was formed in advance using a diamond saw having a 90°-V-shaped tip end was bonded so that the side face of the optical waveguide on the other end on the non optical path conversion mirror formed side was aligned to the side face of the interlaminar insulating layer.

The bonding of each optical waveguide was performed by applying adhesive comprising thermosetting resin onto the bonded face of the optical waveguide to the interlaminar insulating layer by a thickness of 10 μm, pressure-bonding the adhesive and curing the adhesive at 60° C. for 1 hour.

In this example, curing was conducted under condition of 60° C./1 hour. In some cases, step curing may be conducted. When the step curing is conducted, no stress occurred due to the optical waveguide at the time of bonding the optical waveguide.

(15) Next, a solder resist composition was prepared similarly to the step (15) in the manufacturing of the substrate for mounting an IC chip, the solder resist composition was applied onto both faces of the substrate by a thickness of 35 μm and dried under conditions of 70° C. for 20 minutes and 70° C. for 30 minutes, thereby forming a solder resist layer 2014' (see FIG. 25(*b*)).

(16) Next, a 5 mm-thick photomask on which a pattern of openings for forming solder bumps and openings for optical paths was drawn was closely stuck to one face of the substrate, exposed with UV rays of 1000 mJ/cm$^2$ and developed with a DMTG solution, thereby forming openings having a diameter of 150 μm at intervals of 250 μm.

Figure 26:
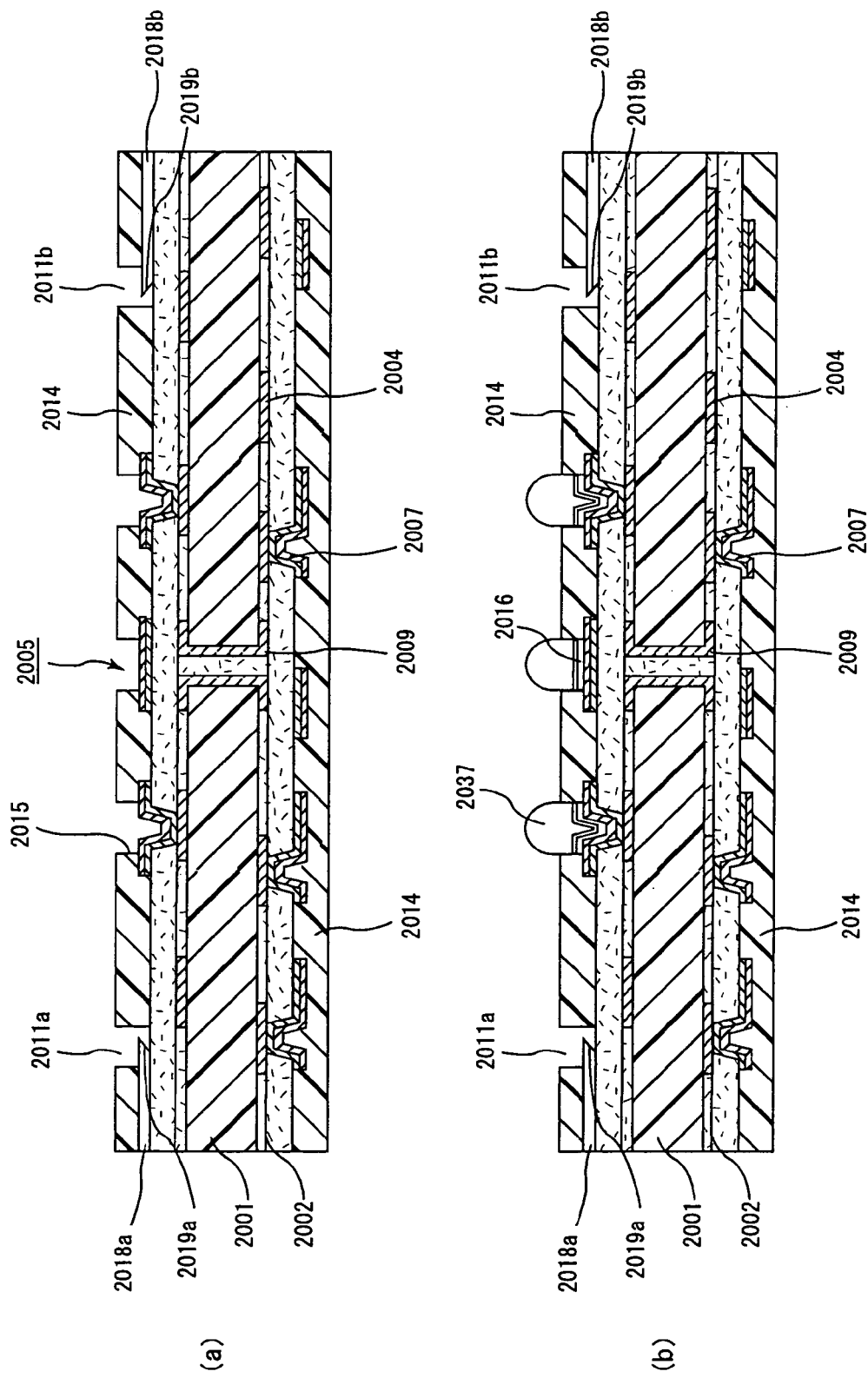
FIG. 26 is a cross-sectional view schematically showing part of the steps of manufacturing the multilayered circuit board that constitutes the device for optical communication according to the first aspect of the second group of the present invention.

Further, heat treatments were conducted under conditions of 80° C. for 1 hour, 100° C. for 1 hour, 120° C. for 1 hour and 150° C. for 3 hours, respectively, to cure the solder resist layer, thereby forming a solder resist layer 2014 having openings for forming solder bumps 2015, openings for optical paths 2011 (2011*a*, 2011*b*) and a thickness of 20 μm (see FIG. 26(*a*)).

(17) Next, similarly to the step (18) in the manufacturing of the substrate for mounting an IC chip, a nickel plated layer and a gold plated layer were formed, thereby obtaining solder pads 2016.

(18) Solder paste was printed in each of the openings for forming solder bumps 2015 formed in the solder resist layer 2014, and reflow was conducted at 200° C., thereby forming solder bumps 2017 in the respective openings for forming solder bumps 2015, thus obtaining a multilayered printed circuit board (see FIG. 26(*b*)).

C. Manufacturing of Device for IC Mounting Optical Communication

First, an IC chip was mounted on the substrate for mounting an IC chip manufactured through the steps in A, the IC chip then sealed with resin, thereby obtaining a substrate for mounting an IC chip.

Thereafter, this substrate for mounting an IC chip and the multilayered printed circuit board manufactured through the steps in B were disposed at predetermined positions to be opposed to each other, respectively, and reflow was conducted at 200° C., thereby connecting the solder bumps of the substrate and the board to form solder connection parts.

Next, an uncured resin composition for sealing was filled between the multilayered printed circuit board and the substrate for mounting an IC chip which were connected through the solder connection parts and a curing treatment was conducted to the resin composition for sealing, thereby forming a sealing resin layer and thus obtaining a device for optical communication (see FIG. 14).

As the resin composition for sealing, a resin composition containing thermosetting epoxy resin, particles having a particle size distribution of 0.1 to 0.8 μm, acid anhydride, defoaming agent and curing agent was used. In addition, the viscosity of the resin composition for sealing was 5 Pa·s at 5 min$^{-1}$ (rpm)/25° C.

Further, the transmissivity of the formed sealing resin layer was 85%/mm.

It is noted that the viscosity of the resin composition for sealing is normally about 1 to 10 Pa·s at 5 min$^{-1}$ (rpm)/25° C.

EXAMPLE 15

A device for optical communication was manufactured similarly to Example 14 except that at the time of forming the optical waveguides, optical waveguides each comprising a lower cladding, a core and an upper cladding and having an optical path conversion mirror formed thereon were formed on the outermost interlaminar insulating layer using the following method at the time of forming the optical waveguides in the step (14) in the manufacturing of the multilayered printed circuit board in Example 14.

Each of the optical waveguides was formed as follows. PMMA for forming a lower cladding was first applied to a predetermined position on the outermost interlaminar insulating layer to form a film and the resultant film was thermally cured, thereby forming a lower cladding. Thereafter, PMMA for forming a core was applied onto the lower cladding to form a film and the resultant film was thermally cured, thereby forming a core layer.

Thereafter, a resist was applied onto the surface of the core layer, a resist pattern was formed by photolithography, and patterning was carried out into core shape by reactive ion etching, thereby forming a core on the lower cladding.

Next, PMMA for forming an upper cladding was applied onto the core and thermally cured, thereby forming an upper cladding on the core and thus obtaining an optical waveguide. Thereafter, a 45°-optical path conversion mirror was formed on one end of this optical waveguide by machining.

It is noted that the PMMA for forming a lower cladding and the PMMA for forming an upper cladding were equal in composition.

EXAMPLE 16

A device for optical communication was manufactured similarly to Example 14 except that openings for forming solder bumps having a diameter of 70 μm at intervals of 127 μm in each of the step (17) in the manufacturing of the substrate for mounting an IC chip and the step (16) in the manufacturing of the multilayered printed circuit board in Example 14.

For each of the devices for IC mounting optical communication in Examples 14 to 16 thus obtained, an optical fiber was attached to the exposed face of the optical waveguide, opposed to the light receiving element, from the multilayered printed circuit board, a detector was attached in place of the light receiving element, optical signal was transmitted through the optical fiber and the optical signal was detected by the detector. As a result, a desired optical signal could be detected, thus demonstrating that each of the devices for IC mounting optical communication manufactured in the examples had sufficiently satisfactory performance as a device for optical communication.

Furthermore, the waveguide loss between the light emitting element mounted on the substrate for mounting an IC chip and the optical waveguide opposed to this light emitting element and formed on the multilayered printed circuit board was measured by the following method. As a result, the waveguide loss was 0.3 dB/cm or less, thus demonstrating that it was possible to sufficiently transmit optical signal.

The measurement of the waveguide loss was conducted by attaching an optical fiber to the end portion of the optical waveguide for light reception, attaching a power meter on the light emitting element-side end portion of the optical path for transmitting optical signal through the optical fiber, transmitting optical signal with a measured wavelength of 850 nm from the optical fiber attached to the optical waveguide, and detecting the optical signal transmitted through the optical waveguide for light reception and the optical path for transmitting optical signal using the power meter.

Moreover, in each of the devices for optical communication obtained in Examples 14 to 16, the positional deviation of the optical elements (light receiving element and light emitting element) and the optical waveguides from desired positions was hardly observed.

EXAMPLE 17

A device for optical communication was manufactured similarly to Example 14 except that optical waveguides manufactured by the following method in the step B-(14) in Example 14.

That is, (1) acrylic resin (refractive index: 1.52, transmissivity: 94%/mm, thermal expansion coefficient: 72 ppm) and acrylic resin (refractive index: 1.51, transmissivity: 93%/mm, thermal expansion coefficient: 70 ppm) were prepared as resin for forming a core and resin for forming a cladding, respectively. Each of the resin for forming a core and resin for forming a cladding was prepared to have a viscosity of 1000 cps (mP·s). Further, the viscosity was adjusted using ethyl lactate.

(2) Next, the resin for forming a cladding was applied at 1000 μm/10 sec using a spin coater, pre-baked at 80° C. for 10 minutes, exposed with 2000 mJ, and post-baked at 150° C. for 1 hour, thereby obtaining a lower cladding.

(3) Next, the resin for forming a core was applied on the lower cladding at 1200 μm/10 sec using the spin coater, pre-baked at 80° C. for 10 minutes, exposed with 1000 mJ, dipped with 1% TMH for 2 minutes, and post-baked at 150° C. for 1 hour, thereby obtaining a core.

(4) Further, the resin for forming a cladding was applied on the lower cladding and the core at 1000 μm/10 sec using the spin coater, pre-baked at 80° C. for 10 minutes, exposed with 2000 mJ, and post-baked at 150° C. for 1 hour, thereby obtaining an upper cladding and producing an optical waveguide. It is noted that the optical waveguide thus formed had a core cross-sectional size of 50×50 μm and film thicknesses of the upper and lower claddings of 50 μm.

(5) Next, dicing was conducted using a 90°-#3000 blade to form a 45°-optical path conversion part. A mirror by metal vapor deposition or the like was not formed. Further, the transmission loss of the formed 45°-optical path conversion part was 1.2 dB.

EXAMPLES 18 TO 25

Each of devices for optical communication was manufactured similarly to Example 17 except that optical waveguides were produced using a resin composition for forming a cladding obtained by adding pulverized silica having a particle size distribution of 0.1 to 0.8 μm to the resin for forming a cladding so that the quantity of the mixed silica became the value shown in Table 3 below.

TABLE 3

|  | Content of pulverized silica (% by weight) | transmissivity (%/mm) | Thermal expansion coefficient (ppm) |
|---|---|---|---|
| Example 18 | 8 | 84 | 67 |
| Example 19 | 10 | 82 | 65 |
| Example 20 | 15 | 84 | 60 |
| Example 21 | 25 | 81 | 53 |
| Example 22 | 50 | 82 | 41 |
| Example 23 | 60 | 79 | 32 |
| Example 24 | 70 | 75 | 28 |
| Example 25 | 80 | 77 | 25 |

For each of the devices for optical communication in Examples 17 to 25 thus obtained, the formability of the cladding at the time of producing the optical waveguide and the presence/absence of the occurrence of cracks on the optical waveguide after a liquid-phase temperature cycle test were evaluated. The evaluation results are shown in Table 4.

The formability of the cladding was evaluated based on whether or not a cladding having a predetermined thickness could be formed.

Further, the liquid-phase temperature cycle test was conducted under the same conditions as those of Example 7 and the presence/absence of cracks on the optical waveguides was evaluated by cutting the multilayered printed circuit board to cross the optical waveguides and observing the cross section.

TABLE 4

|  | Formability of cladding | Liquid-phase temperature cycle | | |
|---|---|---|---|---|
|  |  | 250 cycles | 500 cycles | 1000 cycles |
| Example 17 | ○ | ○ | ○ | Δ |
| Example 18 | ○ | ○ | ○ | Δ |
| Example 19 | ○ | ○ | ○ | Δ |
| Example 20 | ○ | ○ | ○ | ○ |
| Example 21 | ○ | ○ | ○ | ○ |
| Example 22 | ○ | ○ | ○ | ○ |
| Example 23 | ○ | ○ | ○ | ○ |
| Example 24 | Δ | ○ | ○ | ○ |
| Example 25 | Δ | ○ | ○ | ○ |
| Comparative Example | — | ○ | Δ | X |

Table 4 shows the results of Examples 17 to 25 and the evaluation result of optical signal transmission characteristic of the device for optical communication manufactured in the Comparative Example.

Evaluation Standard of Formability of Cladding

○: At the time of forming 10 pieces of optical waveguides, claddings could be formed to have a designed film thickness for all the optical waveguides.

Δ: At the time of forming 10 pieces of optical waveguides, film thicknesses of claddings were partially deviated from the designed film thickness.

X: At the time of forming 10 pieces of optical waveguides, claddings having a designed film thickness could not be formed for any optical waveguides.

Evaluation Standard of Liquid-phase Temperature Cycle Test

○: No crack was observed.

Δ: Some cracks occurred but optical signal was able to be transmitted through optical waveguides.

X: Cracks occurred and optical signal was not able to be transmitted through optical waveguides.

The optical waveguide transmission loss was measured by the following method.

That is, the losses of the optical waveguides having lengths of 60 mm, 50 mm, 40 mm and 20 mm were measured, and transmission losses were measured by a cut-back method of a measuring propagation loss by the least square method.

In addition, for the specific propagation loss of each optical waveguide is as follows. The propagation loss of the optical waveguide (Example 17) in which the core and the claddings did not contain particles was 0.22 dB/cm, that of the optical waveguide (Example 21) in which only the core contained 25% by weight of particles was 0.24 dB/cm and hardly changed even when particles were added to the claddings.

In Examples 18 to 25, pulverized silica particles were added to the claddings constituting the respective optical waveguides. The same experiments were conducted by using titania particles or alumina particles in place of the pulverized silica particles. With the thermal expansion coefficient slightly different, the same results were obtained for formability of the cladding and the liquid-phase temperature cycle test.

The optical waveguides formed in Examples 17 to 25 were optical waveguides for multi-mode. Even when multilayered printed circuit boards were manufactured similarly to Examples 17 to 25 by using optical waveguides for single-mode instead of the optical waveguides for multi-mode, a predetermined optical signal was able to be transmitted.

The optical waveguide for single-mode was formed as follows. Siloxane based resin (refractive index: 1.50, transmissivity: 93%/mm, thermal expansion coefficient: 115 ppm) was prepared as resin for forming a core and siloxane based resin (refractive index: 1.48, transmissivity: 93%/mm, thermal expansion coefficient: 141 ppm) was prepared as resin for forming a cladding. In addition, particles were added by a predetermined mixing quantity to the resin for forming a cladding if necessary. Using these resins, an optical waveguide for single-mode having the cross-sectional size of the core of 10×10 μm and the film thicknesses of the upper cladding and the lower cladding of 10 μm was obtained by the same method as that in Example 17.

Further, among the optical waveguides formed by such a method, the optical waveguide for single-mode having no particles mixed to the claddings had a transmission loss of 0.43 dB/cm for signal light having a wavelength of 1.33 μm and a transmission loss of 0.84 dB/cm for signal light having a wavelength of 1.55 aim, and the optical waveguide for single-mode having 50% by weight of particles mixed to the claddings had a transmission loss of 0.41 dB/cm for signal light having a wavelength of 1.33 μm and a transmission loss of 0.82 dB/cm for signal light having a wavelength of 1.55 μm. The measurement of the transmission losses was made by the cut-back method.

The cladding having no particles mixed therein had a thermal expansion coefficient of 141 ppm, and the cladding having particles mixed therein by 50% by weight had a thermal expansion coefficient of 48 ppm. The optical waveguides were evaluated by conducting the liquid-phase temperature cycle test for the devices for optical communication using the optical waveguides for single-mode. The evaluation results were the same as those for Examples 17 to 25.

EXAMPLE 26

A device for optical communication was manufactured similarly to Example 14 except the sealing resin layer was formed by the following method in the steps of C in Example 14.

That is, after connecting the substrate for mounting an IC chip to the multilayered printed circuit board through the solder bumps, a resin composition containing epoxy resin (transmissivity: 90%/mm, thermal expansion coefficient: 67 ppm) prepared to have a viscosity of 5000 cps (mP·s) was applied around the substrate for mounting an IC chip using a dispenser and left as it was thereafter, thereby causing the resin composition to infiltrate between the substrate for mounting an IC chip and the multilayered printed circuit board. Next, treatments were conducted at 120° C. for 1 hour and 150° C. for 2 hours to cure the resin composition, thereby obtaining a sealing resin layer. It is noted that the clearance between the substrate for mounting an IC chip and the multilayered printed circuit board was 300 μm. The viscosity of the resin composition was measured by BH type No3 at 10 rpm.

EXAMPLES 27 TO 32

Each of devices for optical communication was manufactured similarly to Example 26 except that the sealing resin layer was formed using a resin composition obtained by further adding pulverized silica particles having a particle size distribution of 0.1 to 0.8 μm to the resin composition used in Example 26 to have a mixing quantity shown in the following Table 5.

TABLE 5

|  | Content of pulverized silica (% by weight) | transmissivity (%/mm) | Thermal expansion coefficient (ppm) |
| --- | --- | --- | --- |
| Example 27 | 10 | 82 | 56 |
| Example 28 | 20 | 82 | 46 |
| Example 29 | 50 | 81 | 32 |
| Example 30 | 60 | 80 | 30 |
| Example 31 | 70 | 82 | 27 |
| Example 32 | 80 | 80 | 24 |

For each of the devices for optical communication in Examples 26 to 32 thus obtained, the sealing property by the sealing resin layer and the presence/absence of the occurrence of cracks on the optical waveguides after a liquid-phase temperature cycle test were evaluated. The evaluation results are shown in Table 6.

The sealing property was evaluated by observing the sealing resin layer with X rays and determining whether or not the sealing resin layer was formed entirely.

Further, the liquid-phase temperature cycle test was conducted under the same conditions as those of Example 7 and the presence/absence of cracks on the optical waveguides was evaluated by cutting the sealing resin layer and observing the cross section thereof.

TABLE 6

| | Sealing property by sealing resin layer | Liquid-phase temperature cycle | | |
|---|---|---|---|---|
| | | 250 cycles | 500 cycles | 1000 cycles |
| Example 26 | ○ | ○ | ○ | Δ |
| Example 27 | ○ | ○ | ○ | Δ |
| Example 28 | ○ | ○ | ○ | Δ |
| Example 29 | ○ | ○ | ○ | ○ |
| Example 30 | ○ | ○ | ○ | ○ |
| Example 31 | Δ | ○ | ○ | ○ |
| Example 32 | Δ | ○ | ○ | ○ |
| Comparative Example | — | ○ | Δ | X |

Table 6 shows the results of Examples 26 to 32 and the evaluation result of optical signal transmission characteristic of the device for optical communication manufactured in the above-mentioned Comparative Example.

Evaluation Standard of Sealing Property by Sealing Resin Layer

○: The sealing resin was formed entirely on the clearance between the substrate for mounting an IC chip and the multilayered printed circuit board.

Δ: A large void did not occur in the vicinity of the center of the sealing resin layer and the sealing resin layer was formed almost entirely on the clearance between the substrate for mounting an IC chip and the multilayered printed circuit board. However, a small void occurred in the sealing resin layer.

X: The sealing resin layer was not formed entirely on the clearance between the substrate for mounting an IC chip and the multilayered printed circuit board, and a large void occurred in the vicinity of the center of the sealing resin layer.

Evaluation Standard of Liquid-phase Temperature Cycle Test

○: No crack was observed.

Δ: Some cracks occurred but optical signal was not able to be transmitted through optical waveguides.

X: Cracks occurred and optical signal was not able to be transmitted through optical paths for transmitting optical signals.

In Examples 27 to 32, pulverized silica particles were mixed into the sealing resin layer. The same experiments were conducted by using titania particles or alumina particles in place of the pulverized silica particles. With the thermal expansion coefficient slightly different, the same results were obtained for the sealing property by the sealing resin layer and the liquid-phase temperature cycle test.

Further, at the time of manufacturing devices for optical communication using the same methods as those used in Examples 26 to 32, the viscosity of the resin composition for forming the sealing resin layer was raised and the resin composition for sealing was left as it was for shorter time, thereby forming a sealing resin layer only in the vicinity of the outer periphery of the area put between the substrate for mounting an IC chip and the multilayered printed circuit board. In the device for optical communication thus constituted, a signal was transmitted between the substrate for mounting an IC chip and the multilayered printed circuit board through an air layer. In this case, no disadvantage occurred to the optical signal transmission.

EXAMPLE 33

A. Manufacturing of Substrate for Mounting an IC Chip

A-1. Manufacturing of Package Substrate (a) Manufacturing of Resin Film for Interlaminar Insulating Layer A resin film for an interlaminar insulating layer was manufactured using the same method as that used in the steps of A in Example 1.

(b) Preparation of Resin Filler (Resin Composition)

A resin filler was prepared using the same method in the steps of B in Example 1.

Figure 32:
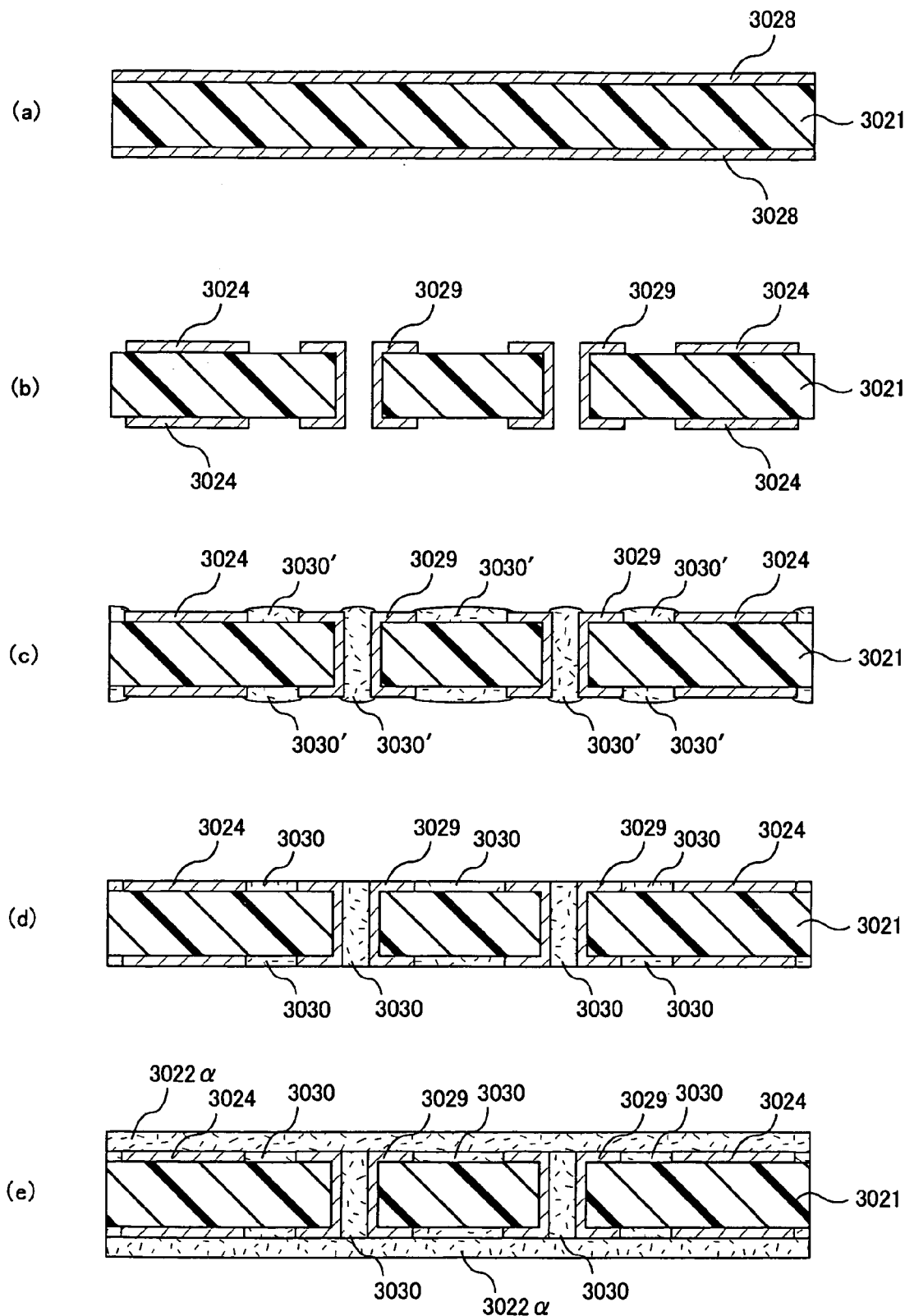
FIG. 32 is a cross-sectional view schematically showing part of steps of manufacturing a substrate for mounting an IC chip that constitutes the device for optical communication according to the first aspect of the third group of the present invention.

(c) Manufacturing of Package Substrate (1) A copper-clad laminated board composed of an insulating substrate 3021 made of a 0.8 mm-thick glass epoxy resin or BT (bismaleimide-triazine) resin, with a 18 μm-thick copper foil 3028 laminated on both faces of the substrate 3021 was used as a starting material (see FIG. 32(a)). First, this copper-clad laminated board was drilled to bore holes and, then an electroless plating treatment was carried out and pattern etching was carried out to form conductor circuits 3024 and plated-through holes 3029 on both faces of the substrate 3021 (see FIG. 32(b)).

(2) The substrate 3021 having the under level conductor circuits 3024 formed thereon was washed with water and dried, then subjected to a blackening treatment using an aqueous solution containing NaOH (10 g/l), NaClO$_2$ (40 g/l), Na$_3$PO$_4$ (6 g/l) as a blackening bath (oxidizing bath) and a reducing treatment using an aqueous solution containing NaOH (10 g/l) and NaBH$_4$ (6 g/l) as a reducing bath to form roughened faces (not shown) on the surfaces of the under level conductor circuits 3024 including the plated-through holes 3029.

(3) After the resin filler described in the (b) was prepared, a layer of resin filler 3030' was formed inside each plated-through hole 3029, non conductor formed areas and the peripheral parts of the conductor circuits 3024 on the substrate 3021 by the following method within 24 hours after the preparation.

That is, first, the resin filler was pushed in the plated-through holes using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minuets, thereby forming the layer of resin filler 3030' (see FIG. 32(c)).

(4) One face of the substrate for which the treatment (3) was just finished was ground by belt sander grinding using #600 belt grinding paper (made by Sankyo Chemical Engineering Co.) so as not to leave the resin filler 3030' on the surfaces of the conductor circuits 3024 and the land surfaces of the plated-through holes 3029 and then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 3030.

In such a manner, the surface layer part of the resin filler 3030 formed in the plated-through holes 3029 and the non conductor formed areas, the surfaces of the conductor circuits 3024 were flattened thus obtaining an insulating substrate wherein: the resin filler 3030 and the side faces of the conductor circuits 3024 were firmly stuck to each other through the roughened faces; and the inner wall faces of the plated-through holes 3029 and the resin filler 3030 were also firmly stuck to each other through the roughened faces (see FIG. 32(d)). By this step, the surface of the resin filler layer 3030 was flush with the surfaces of the conductor circuits 3024.

(5) After the substrate was washed with water and degreased with an acid, soft etching was carried out and etchant was sprayed on both faces of the substrate to etch the surfaces of the conductor circuits 3024 and the land surfaces and inner walls of the plated-through holes 3029, thereby forming roughened faces (not shown) on the entire surfaces of the conductor circuits 3024. As the etchant, etchant (made by Meck Co.; Meck etch bond) containing 10 parts by weight of an imidazole copper(II) complex and 7 parts by weight of glycolic acid, and 5 parts by weight of potassium chloride was used.

(6) Next, the interlaminar insulating layer resin film produced in the (a) was bonded by vacuum pressure-bonding lamination at 0.5 MPa while raising temperature to 50 to 150° C., thereby forming a resin film layer 3022α (see FIG. 32(e)).

Figure 33:
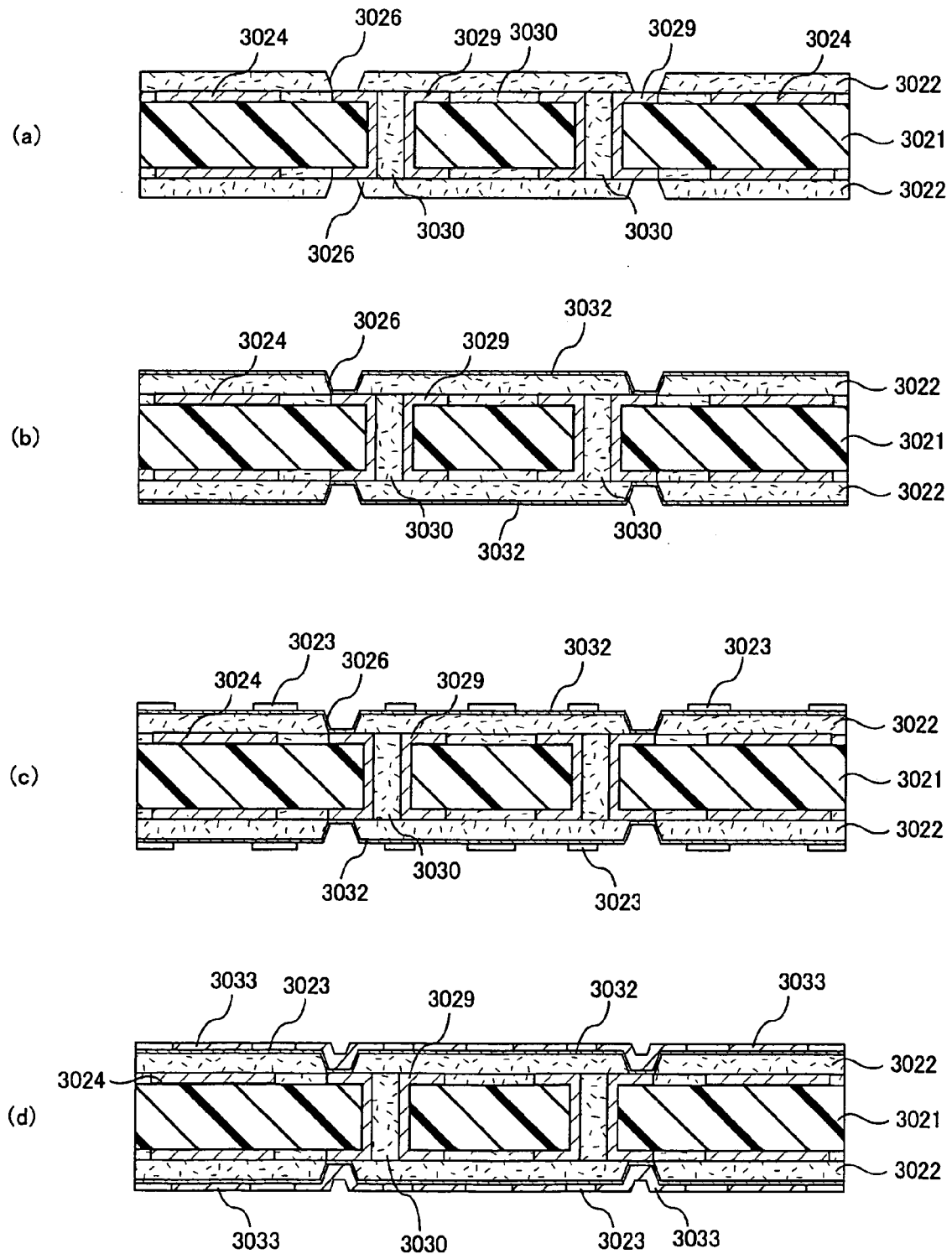
FIG. 33 is a cross-sectional view schematically showing part of the steps of manufacturing the substrate for mounting an IC chip that constitutes the device for optical communication according to the first aspect of the third group of the present invention.

(7) Next, openings for via-holes 3026 with 80 μm diameter were formed in the interlaminar insulating layers 3022α by a $CO_2$ gas laser of 10.4 μm wavelength through a 1.2 mm-thick mask having through holes therein in conditions of a beam diameter of 4.0 mm, a top hat mode, a pulse interval of 8.0 μs, 1.0 mm-diameter of the through holes of the mask and one shot (see FIG. 33(a)).

(8) The substrate in which the openings for via-holes 3026 were formed was immersed in a solution containing 60 g/l of permanganic acid at 80° C. for 10 minutes to dissolve and remove epoxy resin particles existing on the surfaces of the interlaminar resin insulating layers 3022, thus forming the roughened faces (not shown) on the surfaces of the interlaminar insulating layers including the inner wall faces of the openings for via-holes 3026.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth: 3 μm), whereby a catalyst core was attached to the surfaces of the interlaminar insulating layers 3022 (including the inner wall faces of the openings for via-holes 3026) (not shown). That is, the catalyst was attached by immersing the substrate in a catalytic solution containing palladium chloride ($PdCl_2$) and stannous chloride ($SnCl_2$) to precipitate palladium metal.

(10) Next, the substrate was immersed in an electroless copper plating solution having the following composition to form an electroless copper plating film 3032 having a thickness of 0.6 to 3.0 μm on the surface of each interlaminar insulating layer 3022 (including the inner wall faces of the openings for via-holes 3026) (see FIG. 33(b)).

[Electroless Plating Solution]

| | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. liquid temperature and 40 Minutes

(11) Next, a commercially available photosensitive dry film was bonded to both faces of the substrate on which the electroless copper plating film 3032 was formed, a mask was put thereon and exposure with 100 mJ/cm² and development with an aqueous 0.8% sodium carbonate solution were carried out, thereby forming a plating resist 3023 (see FIG. 33(c)).

(12) Next, the substrate was washed with water at 50° C. to be degreased, washed with water at 25° C., and further washed with sulfuric acid. Thereafter, the substrate was subjected to electroplating under the following conditions to thereby form an electroplating copper film 3033 in non plating resist 3023 formed areas (see FIG. 33(d)).

[Electroplating Solution]

| | |
|---|---|
| Sulfuric acid | 2.24 mol/l |
| Copper sulfate | 0.26 mol/l |
| Additive | 19.5 ml/l |
| (Cupracid GL made by Atotech Co.) | |

[Electroplating Conditions]

| | |
|---|---|
| Current density | 1 A/dm² |
| Time | 65 minutes |
| Temperature | 22 ± 2° C. |

Figure 34:
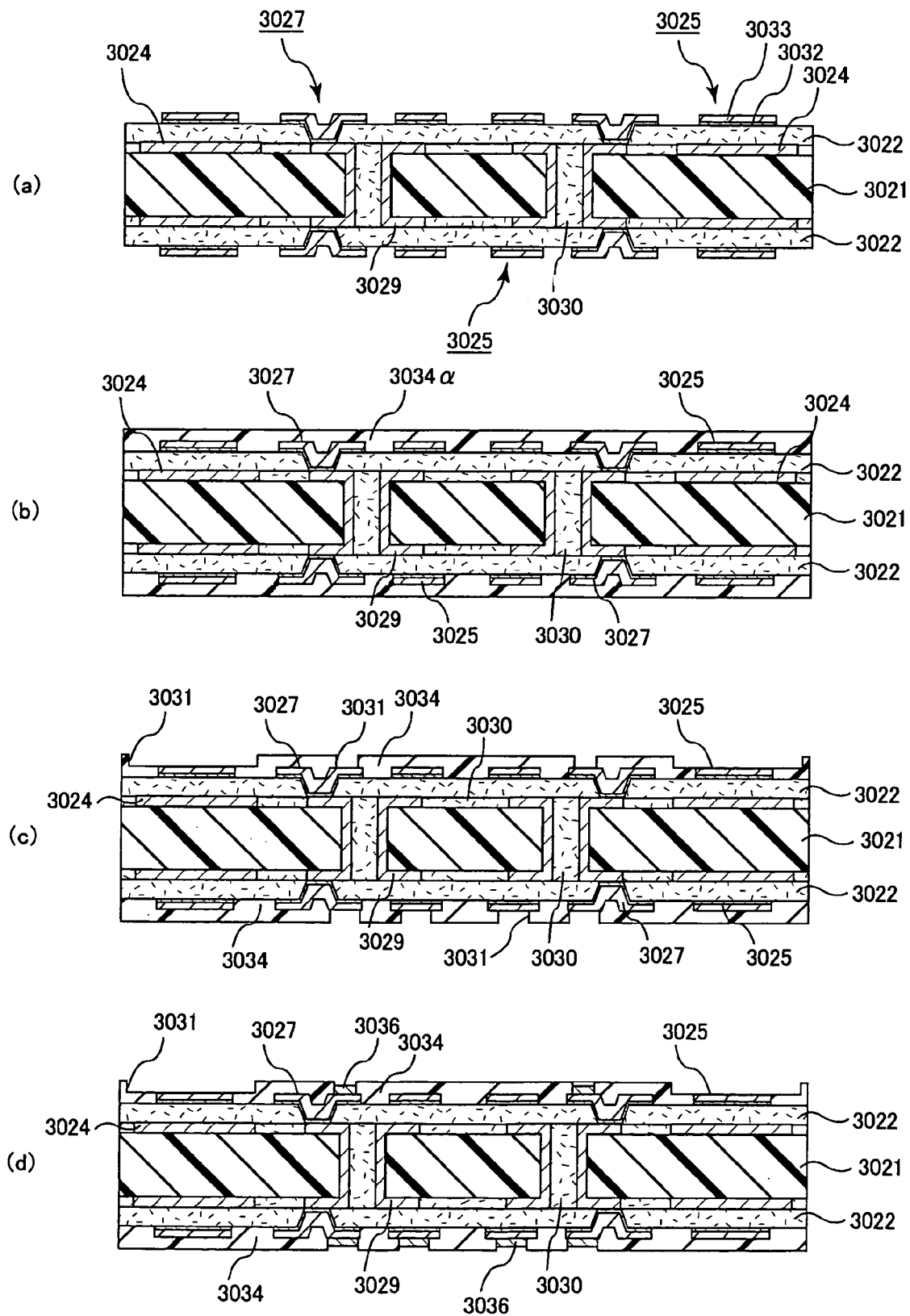
FIG. 34 is a cross-sectional view schematically showing part of the steps of manufacturing the substrate for mounting an IC chip that constitutes the device for optical communication according to the first aspect of the third group of the present invention.

(13) After peeling off the plating resists 3023 with 5% KOH, the electroless plating film under the plating resist 3023 was etched, dissolved and removed with a solution mixture of sulfuric acid and hydrogen peroxide, thus forming conductor circuits 3025 (including via-holes 3027) each composed of the electroless copper plating film 3032 and the electroplating copper film 3033 (FIG. 34(a)).

(14) Further, the substrate having the conductor circuits 3025 and the like formed thereon was immersed in etchant, forming roughened faces (not shown) on the surfaces of the conductor circuits 3025 (including the via-holes 3027). As the etchant, Meck etch bond made by Meck Co. was used.

(15) Next, a solder resin composition was prepared similarly to the step (19) of Example 1.

(16) Next, the solder resist composition was applied both faces of the substrate having the conductor circuits 3025 and the like formed thereon and dried under conditions of 70° C. for 20 minutes and 70° C. for 30 minutes, thereby forming a solder resist composition layer 3034α (see FIG. 34(b)). Next, a 5 mm-thick photomask on which a pattern of opening parts was drawn was closely stuck to the solder resist composition layer 3034α, exposed with UV rays of 1000 mJ/cm² and developed with a DMTG solution, thereby forming openings 3031.

Further, heat treatments were conducted under conditions of 80° C. for 1 hour, 100° C. for 1 hour, 120° C. for 1 hour and 150° C. for 3 hours, respectively, to cure the solder resist composition layer 3034α, thereby forming a solder resist layer 3034 having openings 3031 (see FIG. 34(c)).

(17) Next, the substrate on which the solder resist layers 3034 were formed was immersed in an electroless nickel plating solution having pH 4.5 and containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, thereby forming a nickel plated layer in part of the openings 3031. Further, the resultant substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, to form a 0.03 μm-thick gold plating layer on the nickel plated layer, thus obtaining a package substrate (see FIG. 34(*d*)). In the figures, the two layers of the nickel plated layer and the gold plating layer are denoted as a metal layer 3036.

A-2. Manufacturing of Substrate for Inserting an Optical Element (1) A double-sided copper-clad laminated board composed of an insulating substrate 1 made of a 0.8 mm-thick glass epoxy substrate or BT (bismaleimide-triazine) resin, with a 18 μm-thick copper foil 3008 laminated on both faces of the substrate was used as a starting material (see FIG. 35(*a*)). First, the copper-clad laminated board was drilled to bore holes and then, an electroless plating treatment was carried out to form a conductor layer 3012 on the surface thereof (including the wall faces of through holes) (see FIG. 35(*b*)).

(2) Next, the substrate 3001 having the conductor layer 3012 formed thereon was washed with water and dried, then subjected to a blackening treatment using an aqueous solution containing NaOH (10 g/l), NaClO$_2$ (40 g/l), Na$_3$PO$_4$ (6 g/l) as a blackening bath (oxidizing bath) and a reducing treatment using an aqueous solution containing NaOH (10 g/l) and NaBH$_4$ (6 g/l) as a reducing bath to form roughened faces (not shown) on the surface of the conductor layer 3012.

(3) After the resin filler described in (b) of the A-1 was prepared, a layer of resin filler 3010' was formed inside each through hole having the conductor layer 3012 formed on the wall face thereof by the following method within 24 hours after the preparation.

Figure 35:
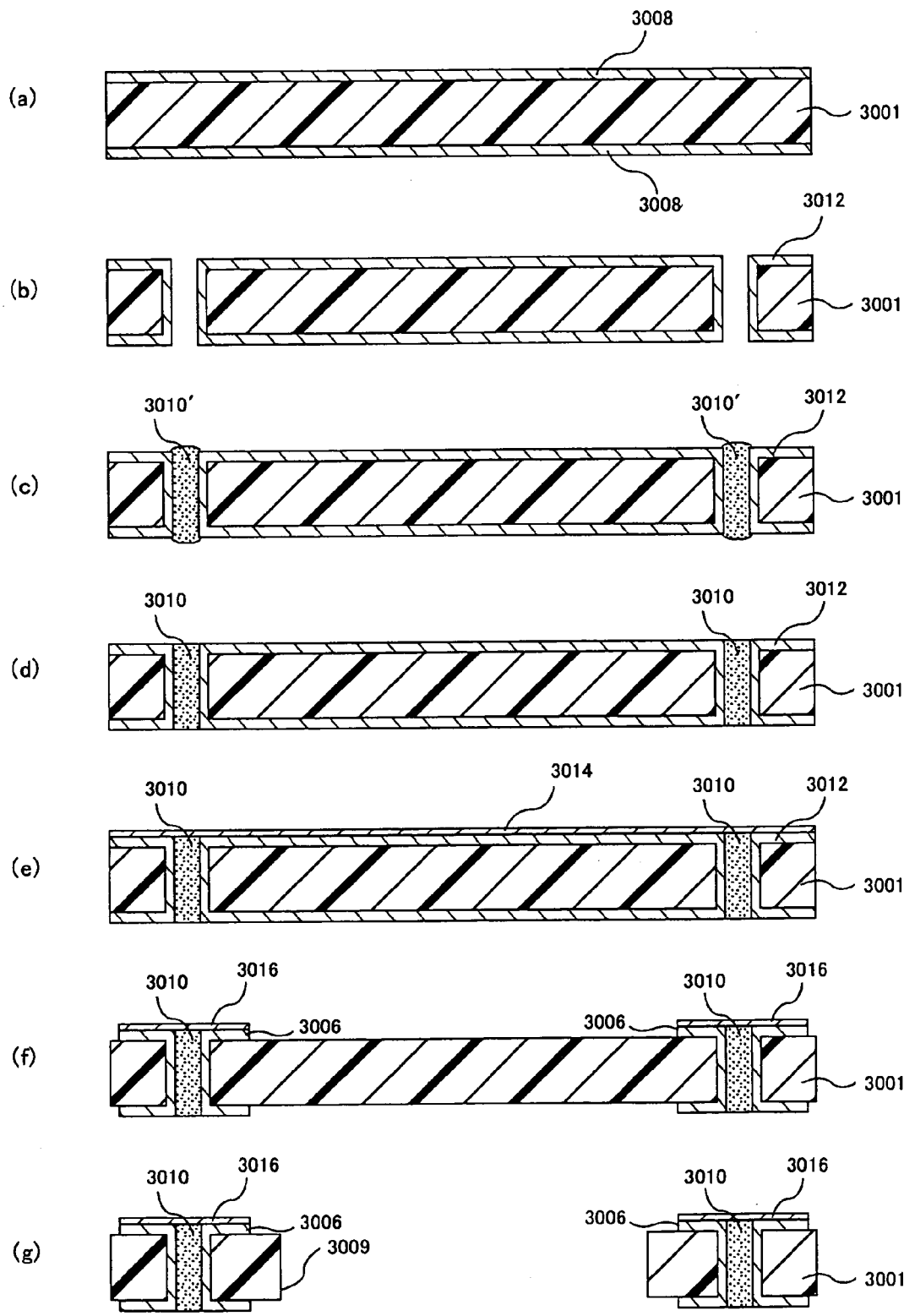
FIG. 35 is a cross-sectional view schematically showing part of the steps of manufacturing the substrate for mounting an IC chip that constitutes the device for optical communication according to the first aspect of the third group of the present invention.

That is, the resin filler was pushed in the through hole using a squeegee and then dried under conditions of 100° C. for 20 minutes (see FIG. 35(*c*)).

(4) One face of the substrate for which the treatment (3) was just finished was ground by belt sander grinding using #600 belt grinding paper (made by Sankyo Chemical Engineering Co.) so as to flatten the exposed face of the layer of resin filler 3010' and the surface of the conductor layer 3012 and buff grinding was then carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 3010 (see FIG. 35(*d*)).

(5) Next, one face of the substrate having the conductor layer 3012 formed there on was subjected to an electroless plating treatment, thereby forming a conductor layer 3014 (see FIG. 35(*e*)).

A palladium catalyst was attached to the face on which the conductor layer 3014 was formed in advance and a plating resist was formed on the face on which the conductor layer 3014 was not formed, thereby forming the conductor layer 3014 on one face of the substrate.

(6) After forming an etching resist (not shown) in portions of the substrate having the conductor layers 3012 and 3014 formed thereon, which portions corresponded to the portions in which conductor circuits (including the land parts of plated-through holes) were to be formed, an etching treatment was conducted to thereby form plated-through holes 3006 having the resin filler layer 3010 formed inside thereof and a cover plating layer 3016 formed on the upper portion thereof and conductor circuits (not shown) (see FIG. 35(*f*)).

The etching resist was formed by bonding a commercially available photosensitive dry film with a mask put thereon and conducting thereto an exposure treatment with 100 mJ/cm$^2$ and a development treatment with an aqueous 0.8% sodium carbonate solution.

Further, the etching treatment was conducted using a solution mixture of sulfuric acid and hydrogen peroxide.

(7) Next, epoxy resin based adhesive was applied to non conductor formed areas on one face of the substrate, thereby forming an adhesive layer (not shown).

(8) Furthermore, a through hole 3009 was formed at the center of the substrate by router processing, thus obtaining a substrate for inserting an optical element (see FIG. 35(*g*)).

A-3. Manufacturing of Substrate for Mounting an IC Chip (1) Lamination pressing based on a mass-laminate method was conducted to obtain a substrate in which the package substrate manufactured in the A-1 and the substrate for inserting an optical element manufactured in the A-2 were bonded together through the adhesive layer formed on the substrate for inserting an optical element (see FIG. 36(*a*)). That is, after aligning the both substrates, temperature was raised to 150° C. and the substrates were further pressed at a pressure of 5 MPa, thereby bonding the package substrate to the substrate for inserting an optical element.

(2) Next, a light receiving element 3038 and a light emitting element 3039 were attached onto the surface of the package substrate exposed from the through hole 3009 formed in the substrate for inserting an optical element using silver paste so that a light receiving part 3038*a* and a light emitting part 3039*a* were exposed to the upward, respectively.

As the light receiving element 3038, an optical element of InGaAs was used. As the light emitting element 3039, an optical element of InGaAsP was used.

Figure 36:
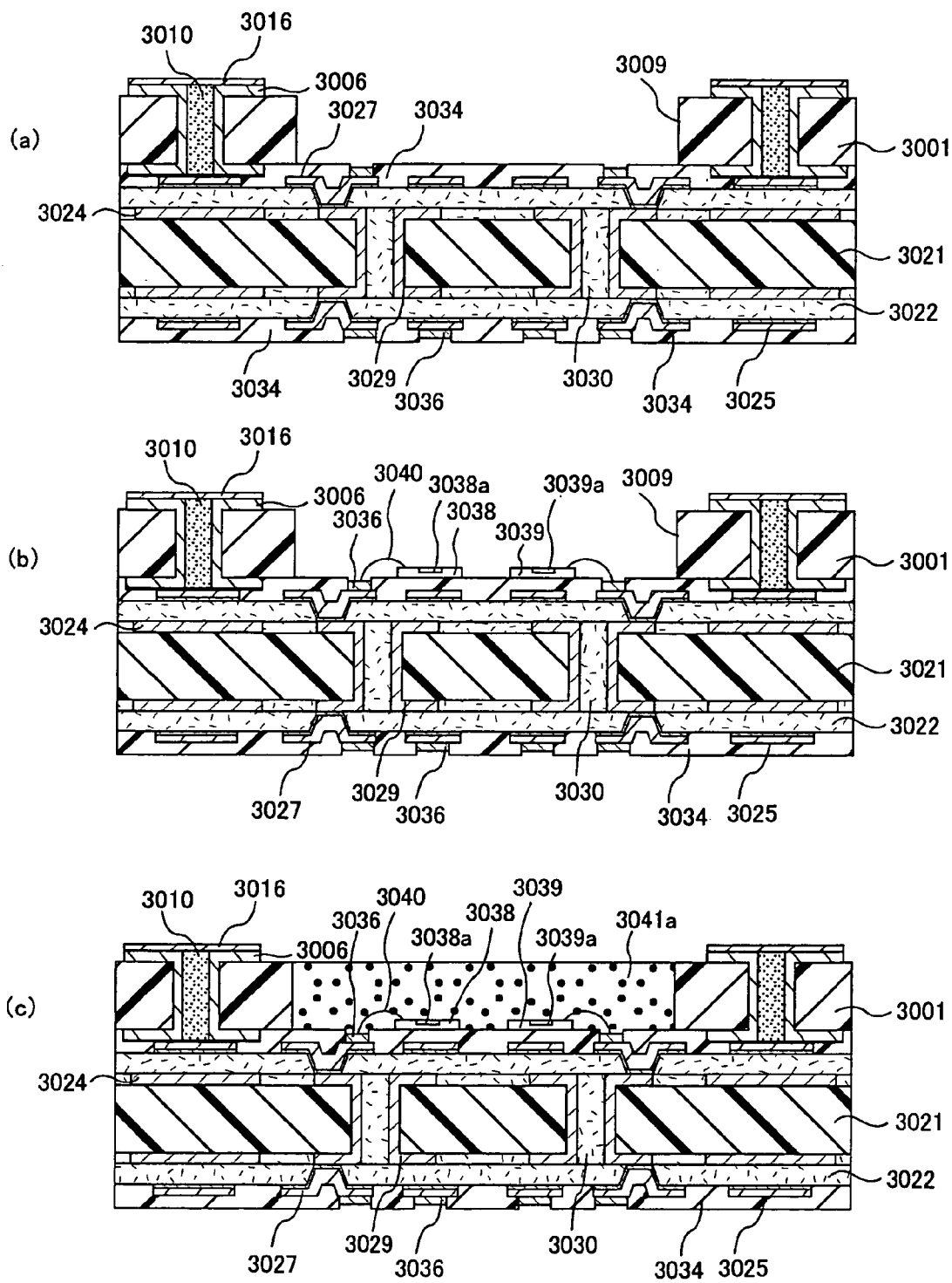
FIG. 36 is a cross-sectional view schematically showing part of the steps of manufacturing the substrate for mounting an IC chip that constitutes the device for optical communication according to the first aspect of the third group of the present invention.

(3) Next, pads for electric connection of the light receiving element 3038 and the light emitting element 3039 were connected to the metal layer 3036 exposed from the through hole 3009 and formed on the surface of the package substrate by wire-bonding (see FIG. 36(*b*)). As wires 3040, Wires made of Au were used.

(4) Next, a resin composition containing epoxy resin was filled into the through hole 3009 formed in the substrate for inserting an optical element by printing and this resin composition was then dried.

Further, buff grinding and mirror grinding were conducted to the exposed face of the resin composition. Thereafter, a heat treatment was conducted thereto, thereby obtaining an resin filled layer for an optical path 3041 (see FIG. 36(*c*)).

It is noted that the resin filled layer for an optical path 3041 had a refractive index of 1.60 and a transmissivity of 85%.

Figure 37:
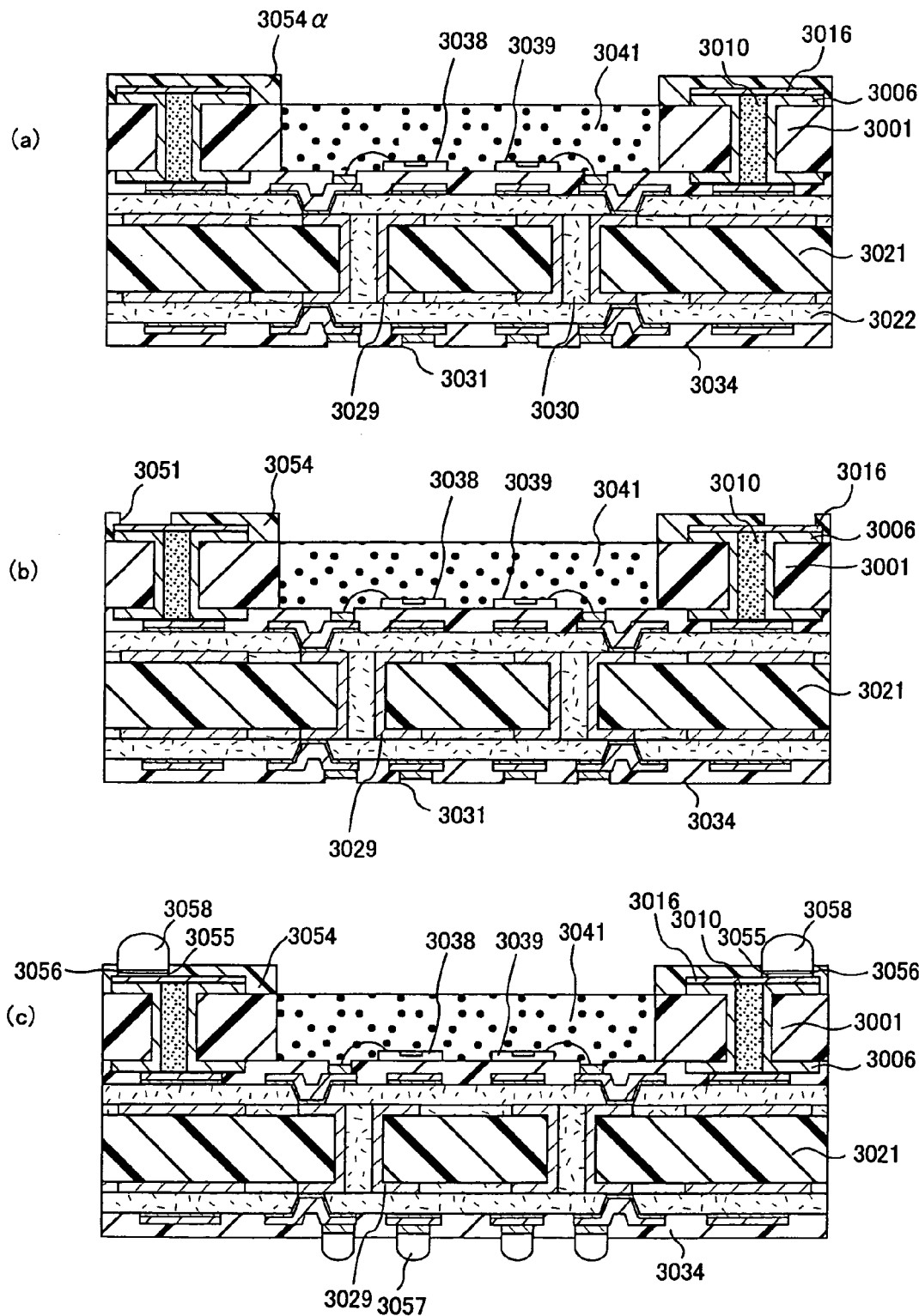
FIG. 37 is a cross-sectional view schematically showing part of the steps of manufacturing the substrate for mounting an IC chip that constitutes the device for optical communication according to the first aspect of the third group of the present invention.

(5) Next, the same resin composition as that prepared in the step (15) in the manufacturing of the package substrate was prepared, applied onto the substrate for inserting an optical element side of the substrate, and dried under conditions of 70° C. for 20 minutes and 70° C. for 30 minutes, thereby forming a solder resist composition layer 3054α (see FIG. 37(*a*)). At this moment, the solder resist composition was not applied onto the surface of the resin filled layer for an optical path 3041.

Next, a 5 mm-thick photomask on which a pattern of opening parts was drawn was closely stuck to the solder resist composition layer 3054α, exposed with UV rays of 1000 mJ/cm$^2$ and developed with a DMTG solution, thereby forming openings 3051.

Further, heat treatments were conducted under conditions of 80° C. for 1 hour, 100° C. for 1 hour, 120° C. for 1 hour and 150° C. for 3 hours, respectively, to cure the solder resist composition layer 3054α, thereby forming a solder resist layer 3054 having openings 3051 (see FIG. 36(*b*)). Accordingly, at the end of this step, the solder resist layer 3054 was formed on the substrate for inserting an optical element side and the solder resist layer 3034 was formed on the package substrate side.

(6) Next, the substrate on which the solder resist layer 3054 was formed was immersed in an electroless nickel plating solution having pH 4.5 and containing nickel chloride ($2.3\times10^{-1}$ mol/l), sodium hypophosphite ($2.8\times10^{-1}$ mol/l) and sodium citrate ($1.6\times10^{-1}$ mol/l) for 20 minutes, thereby forming a nickel plated layer 3055 having a thickness of 5 µm in part of the openings 51. Further, the resultant substrate was immersed in an electroless gold plating solution containing potassium gold cyanide ($7.6\times10^{-3}$ mol/l), ammonium chloride ($1.9\times10^{-1}$ mol/l), sodium citrate ($1.2\times10^{-1}$ mol/l) and sodium hypophosphite ($1.7\times10^{-1}$ mol/l) under conditions of 80° C. for 7.5 minutes, to form a 0.03 µm-thick gold plating layer 3056 on the nickel plated layer 3055.

(7) Next, solder paste (Sn/Ag=96.5/3.5) was printed in each of the openings 3051 formed in the solder resist layer 3054 and each of the openings 3031 of the solder resist layer 3034 and reflow was conducted at 250° C. to thereby form solder bumps for mounting IC chips 3057 and solder bumps for connecting multilayered printed circuit boards 3058, thus obtaining a substrate for mounting an IC chip (see FIG. 37(c)).

B. Manufacturing of Multilayered Printed ircuit Board (a) Manufacturing of Resin Film for Interlaminar Resin Insulating Layer A resin film for an interlaminar insulating layer was prepared using the same method as that used in (a) of the A-1.

(b) Preparation of Resin Filler (Resin Composition)

A resin filler was prepared using the same method as that used in (b) of the A-1.

Figure 38:
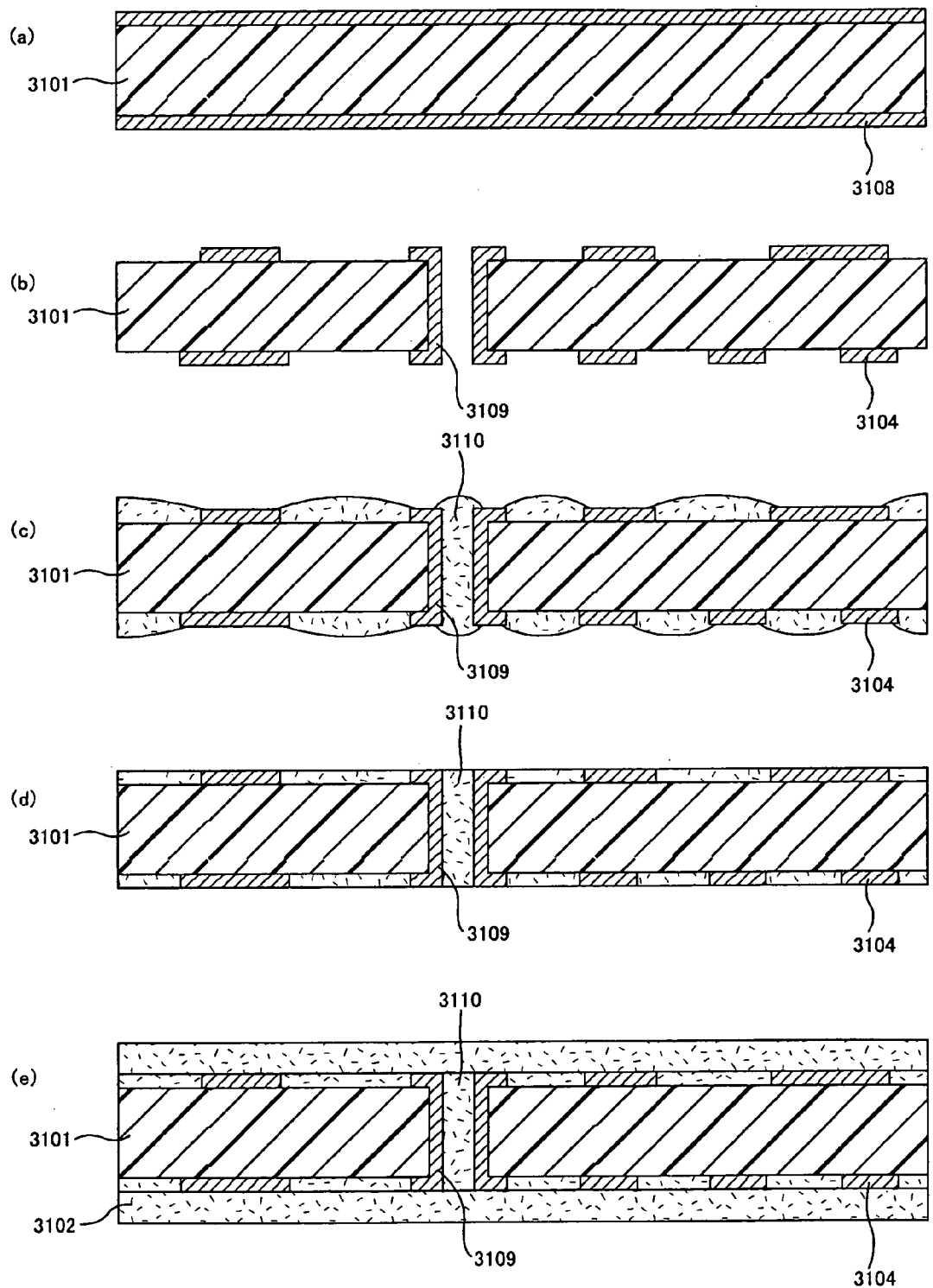
FIG. 38 is a cross-sectional view schematically showing part of steps of manufacturing a multilayered circuit board that constitutes the device for optical communication according to the first aspect of the third group of the present invention.

(c) Manufacturing of Multilayered Printed Circuit Board (1) A copper-clad laminated board composed of an insulating substrate 3101 made of a 0.6 mm-thick glass epoxy resin or BT resin, with a 18 µm-thick copper foil 3008 laminated on both faces of the substrate 3101 was used as a starting material (see FIG. 38(a)). First, the copper-clad laminated board was drilled to bore holes and, then, an electroless plating treatment was carried out and pattern etching was carried out to form conductor circuits 3104 and a plated-through hole 3109 on both faces of the substrate 3101 (see FIG. 38(b)).

(2) The substrate having the plated-through hole 3109 formed therein and the conductor circuits 3104 formed thereon was washed with water and dried, then etchant (made by Meck Co.; Meck etch bond) was sprayed to the substrate, thereby forming roughened faces (not shown) on the surfaces of the conductor circuits 3104 including the through hole 3109.

(3) After the resin filler described in the (b) was prepared, a resin filler layer 3110' was formed inside the plated-through hole 3109, at non conductor formed areas and the peripheral parts of the conductor circuits 3104 on the substrate 3101 by the following method within 24 hours after the preparation.

That is, first, the resin filler was pushed in the plated-through hole using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minuets, thereby forming the layer of the resin filler 3110' (see FIG. 38(c)).

(4) One face of the substrate for which the treatment (3) was just finished was ground by belt sander grinding using #600 belt grinding paper (made by Sankyo Chemical Engineering Co.) so as not to leave the resin filler 3110' on the surfaces of the conductor circuits 3104 and the land surface of the plated-through hole 3109 and then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 3110.

In such a manner, the surface layer part of the resin filler 3110 formed in the plated-through hole 3109 and the non conductor formed areas, the surfaces of the conductor circuits 3104 were flattened, thus obtaining an insulating substrate wherein: the resin filler 3110 and the side faces of the conductor circuits 3104 were firmly stuck to each other through the roughened faces; and the inner wall face of the plated-through hole 3109 and the resin filler 3110 were also firmly stuck to each other through the roughened faces (see FIG. 38(d)). By this step, the surface of the resin filler layer 3110 was flush with the surfaces of the conductor circuits 3104.

(5) After the substrate was washed with water and degreased with an acid, soft etching was carried out and etchant was sprayed on both faces of the substrate to etch the surfaces of the conductor circuits 3104 and the land surface of the plated-through hole 3109, thereby forming roughened faces (not shown) on the entire surfaces of the conductor circuits 3104. As the etchant, Meck etch bond made by Meck Co. was used.

(6) Next, a resin film for an interlaminar resin insulating layer with a slightly larger size than that of the substrate produced in the (a) was put on the substrate, temporarily pressure-bonded under conditions of 0.4 MPa pressure, 80° C. temperature, and 10-second pressure bonding period and cut. Thereafter, the film was bonded by the following method using a vacuum laminator device, thereby forming an interlaminar resin insulating layer 3102 (see FIG. 38(e)).

That is, the resin film for the interlaminar resin insulating layer was actually pressure-bonded on the substrate under conditions of 65 Pa degree of vacuum, 0.4 MPa pressure, 80° C. temperature and 60-second pressure bonding period, and the resin film was further thermally cured at 170° C. for 30 minutes.

(7) Next, openings for via-holes 3106 with 80 µm diameter were formed in the interlaminar insulating layer 3102 by a $CO_2$ gas laser of 10.4 µm wavelength through a 1.2 mm-thick mask having through holes therein in conditions of a beam diameter of 4.0 mm, a top hat mode, a pulse interval of 8.0 µs, 1.0 mm-diameter of the through holes of the mask and one shot.

Figure 39:
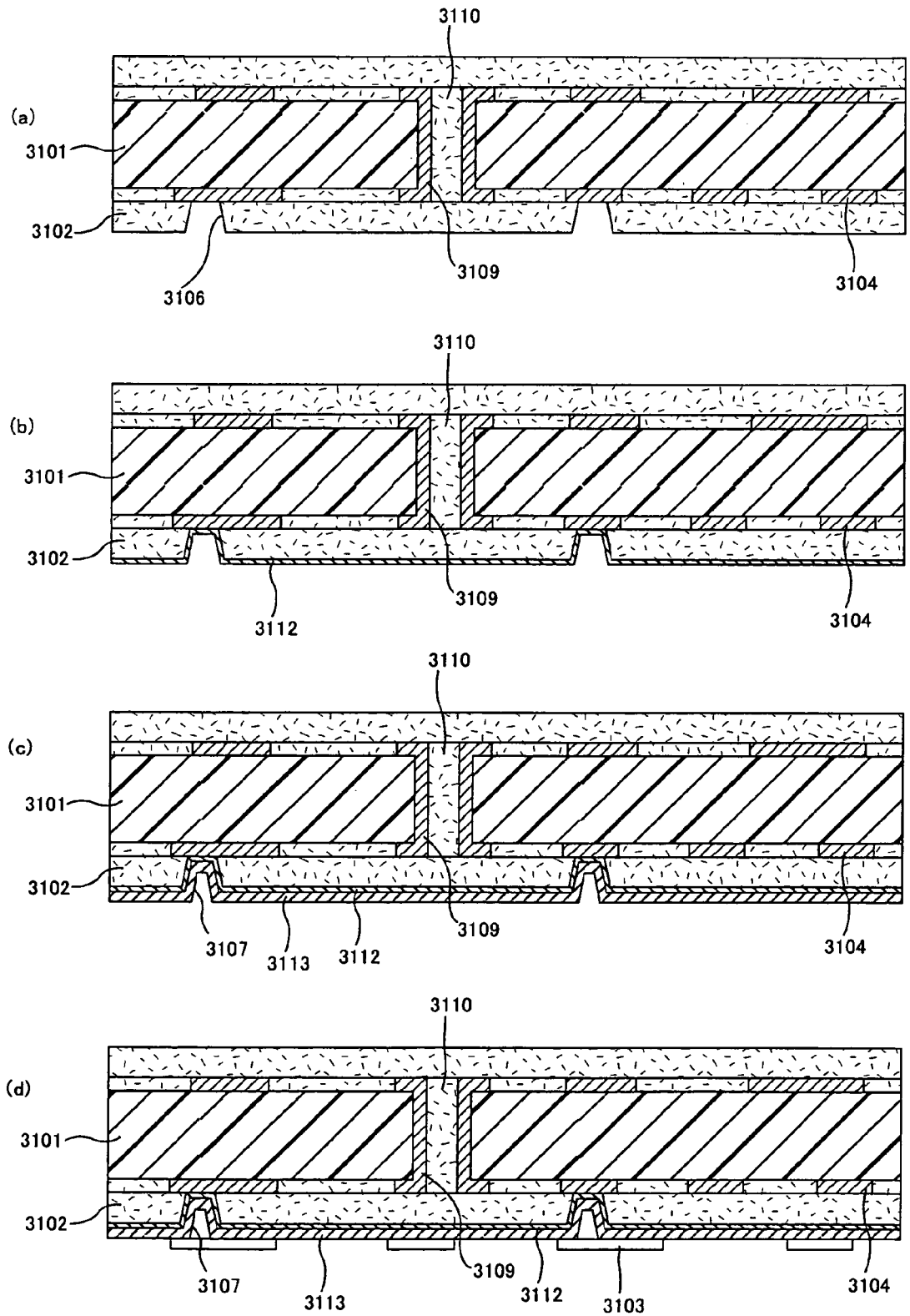
FIG. 39 is a cross-sectional view schematically showing part of the steps of manufacturing the multilayered circuit board that constitutes the device for optical communication according to the first aspect of the third group of the present invention.

(see FIG. 39(a)).

(8) The substrate in which the openings for via-holes 3106 were formed was immersed in a solution containing 60 g/l of permanganic acid at 80° C. for 10 minutes to dissolve and remove epoxy resin particles existing on the surface of the interlaminar resin insulating layer 3102, thus forming the roughened face (not shown) on the surfaces of the interlaminar insulating layer 3102 including the inner wall faces of the openings for via-holes 3106.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth: 3 µm), whereby a catalyst core was attached to the surface of the interlaminar insulating layer 3102 (including the inner wall faces of the openings for via-holes 3106) (not shown). That is, the catalyst was attached by immersing the substrate in a catalytic solution containing palladium chloride ($PdCl_2$) and stannous chloride ($SnCl_2$) to precipitate palladium metal.

(10) Next, the substrate was immersed in an electroless copper plating solution to form a electroless copper plating film 3112 having a thickness of 0.6 to 3.0 μm on the surface of the interlaminar insulating layer 3102 (including the inner wall faces of the openings for via-holes 3106) (see FIG. 39(b)).

It is noted that the used electroless plating solution and the electroless plating conditions were the same as those in the step (10) in the manufacturing of the package substrate.

(11) The substrate on which the electroless plating film 3112 was formed was washed with water and electroplating was then carried out, thereby forming an electroless copper plating film 3113 entirely on the electroless plating film 3112 (see FIG. 39(c)).

It is noted that the used electroplating solution and electroplating conditions were the same as those for the step (12) in the manufacturing of the package substrate.

(12) Next, a commercially available photosensitive dry film was bonded to the substrate on which the electroless copper plating film 3113 was formed, a mask was put thereon and exposure with 100 mJ/cm² and development with an aqueous 0.8% sodium carbonate solution were carried out, thereby forming an etching resist 3103 (see FIG. 39(d)).

Figure 40:
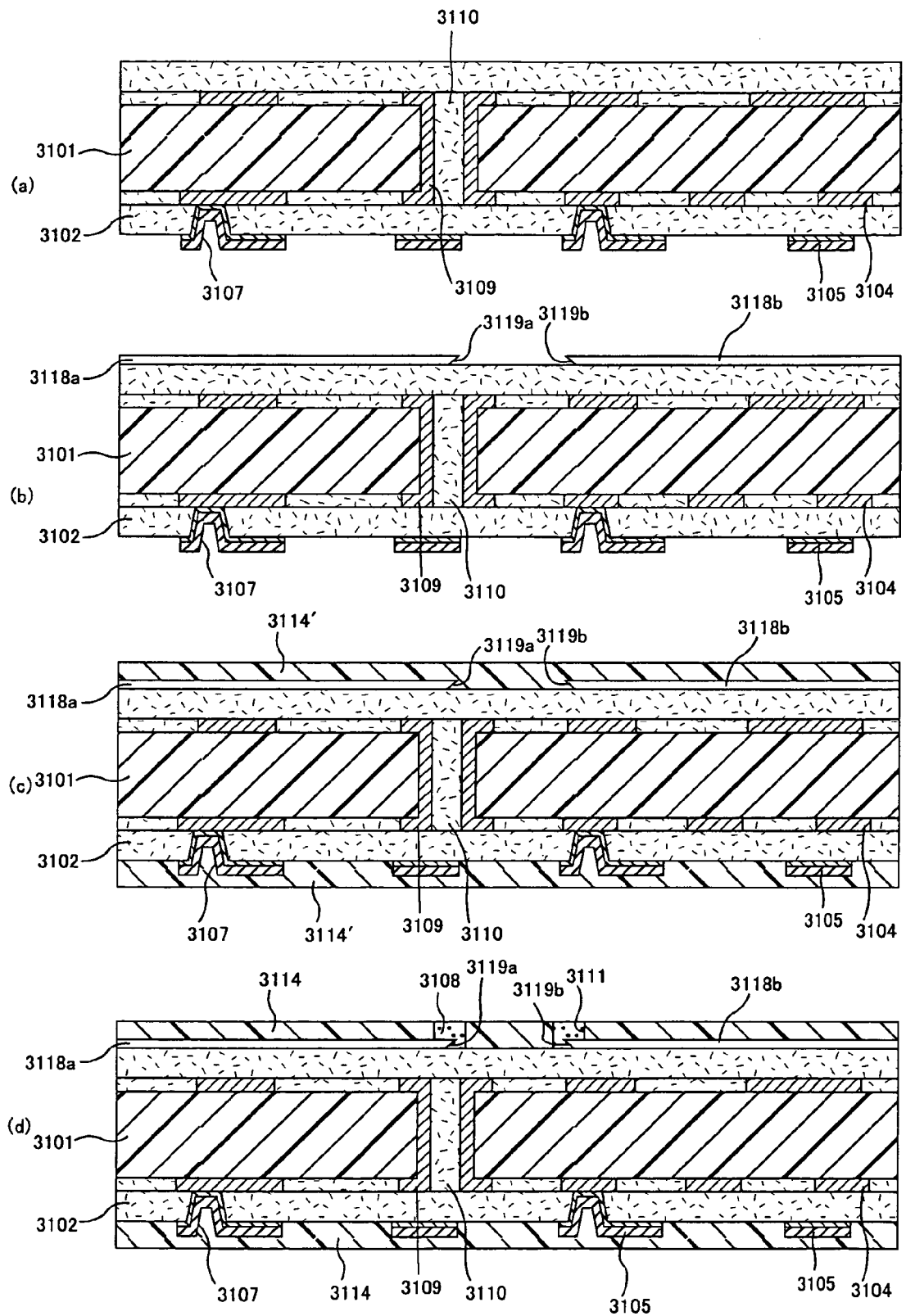
FIG. 40 is a cross-sectional view schematically showing part of the steps of manufacturing the multilayered circuit board that constitutes the device for optical communication according to the first aspect of the third group of the present invention.

(13) Next, the electroplating copper film and the electroless plating film under the non etching resist formed areas were etched with a solution mixture of sulfuric acid and hydrogen peroxide, thereby dissolving and removing these films, and the etching resist was peeled off with 5% NaOH solution, thereby forming conductor circuits 3105 (including via-holes 3105) each composed of the electroless copper plating film 3112 and the electroplating copper film 3113 (see FIG. 40(a)).

Further, using etchant (Meck etch bond), roughened faces (not shown) were formed on the surface of the respective conductor circuits 3105 (including the via-holes 3107).

(14) Next, optical waveguides 3118 (3118a, 3118b) having optical path conversion mirrors 3119 (3119a, 3119b) were formed at predetermined positions on the surface of the interlaminar insulating layer 3102 by the following method, respectively (see FIG. 40(b)).

That is, a film-shaped optical waveguide (width: 25 μm, thickness: 25 μm) which was made of PMMA and on which 45°—the optical conversion mirror 3119 was formed in advance using a diamond saw having a 90°-V-shaped tip end was bonded in such a manner that the side face of the optical waveguide on the other end to the non optical path conversion mirror formed side was aligned to the side face of the interlaminar insulating layer.

The bonding of each optical waveguide was performed by applying adhesive composed of thermosetting resin onto the bonded face of the optical waveguide to the interlaminar insulating layer by a thickness of 10 μm, pressure-bonding the adhesive and curing the adhesive at 60° C. for 1 hour.

In this example, curing was conducted under condition of 60° C./1 hour. In some cases, step curing may be conducted. When the step curing is conducted, no stress occurred due to the optical waveguide at the time of bonding the optical waveguide.

(15) Next, a solder resist composition was prepared similarly to the step (15) in the manufacturing of the package substrate, the solder resist composition was applied onto both faces of the substrate by a thickness of 35 μm and dried under conditions of 70° C. for 20 minutes and 70° C. for 30 minutes, thereby forming a solder resist layer 3114' (see FIG. 40(c)).

(16) Next, a 5 mm-thick photomask on which a pattern of openings for forming solder bumps (openings for connecting the multilayered printed circuit board to the package substrate) and openings for optical paths was drawn was closely stuck to the solder resist layer on one face of the substrate, exposed with UV rays of 1000 mJ/cm² and developed with a DMTG solution, thereby forming openings.

Further, heat treatments were conducted under conditions of 80° C. for 1 hour, 100° C. for 1 hour, 120° C. for 1 hour and 150° C. for 3 hours, respectively, to cure the solder resist layer, thereby forming a solder resist layer 3114 having openings for forming solder bumps (not shown), openings for optical paths 3111 and a thickness of 20 μm.

(17) The same resin composition as the epoxy resin-containing resin composition filled in the step (4) in the manufacturing of the substrate for mounting an IC chip was filled into each opening for an optical path 3111 and a heat treatment was conducted to the resin composition, thereby forming a resin layer for an optical path 3108 in the opening for an optical path 3111. The resin layer for an optical path 3108 had a refractive index of 1.60 and a transmissivity of 85%/mm.

Next, similarly to the step (6) in the manufacturing of the substrate for mounting an IC chip, a nickel plated layer and a gold plating layer were formed, thereby obtaining solder pads (not shown).

(18) Solder paste was printed in each of the openings for forming solder bumps formed in the solder resist layer 3114 and reflow was conducted at 200° C., thereby forming solder bumps (not shown) in the respective openings for forming solder bumps, thus obtaining a multilayered printed circuit board (see FIG. 40(d)).

C. Manufacturing of Device for IC Mounting Optical ommunication

First, an IC chip was mounted on the substrate for mounting an IC chip manufactured through the steps in A and the IC chip was then sealed with resin, thereby obtaining a substrate for mounting an IC chip.

Next, this substrate for mounting an IC chip and the multilayered printed circuit board manufactured through the steps in B were disposed at predetermined positions to be confronting each other, respectively, and reflow was conducted at 200° C., thereby connecting the solder bumps of the substrate for mounting an IC chip and the multilayered printed circuit board to one another to form solder connection parts.

Next, a resin composition for sealing was filled between the multilayered printed circuit board and the substrate for mounting an IC chip which were connected to each other through the solder connection parts and a curing treatment was conducted to the resin composition for sealing, thereby forming a sealing resin layer and thus obtaining a device for optical communication (see FIG. 29).

As the resin composition for sealing, a resin composition containing epoxy resin was used.

In addition, the formed sealing resin layer had a transmissivity of 85%/mm and a refractive index of 1.60.

EXAMPLE 34

A device for optical communication was manufactured similarly to Example 33 except that at the time of forming the sealing resin layer, a resin composition containing olefin resin was used to form a sealing resin layer having a transmissivity of 88%/mm and a refractive index of 1.58, and at the time of forming the resin filled layer for an optical path of the substrate for mounting an IC chip and the resin layer for an optical path of the multilayered printed circuit board, a resin composition containing olefin resin was used to form a resin filled layer for an optical path having a transmissivity of 80%/mm and a refractive index of 1.58.

EXAMPLE 35

A device for optical communication was manufactured similarly to Example 33 except that at the time of forming the sealing resin layer, a resin composition containing acrylic resin was used to form a sealing resin layer having a transmissivity of 85%/mm and a refractive index of 1.50, and at the time of forming the resin filled layer for an optical path of the substrate for mounting an IC chip and the resin layer for an optical path of the multilayered printed circuit board, a resin composition containing epoxy resin was used to form a resin filled layer for an optical path having a transmissivity of 85%/mm and a refractive index of 1.60.

EXAMPLE 36

A device for optical communication was manufactured similarly to Example 33 except that at the time of forming the sealing resin layer, a resin composition containing acrylic resin was used to form a sealing resin layer having a transmissivity of 85%/mm and a refractive index of 1.50, and at the time of forming the resin filled layer for an optical path of the substrate for mounting an IC chip and the resin layer for an optical path of the multilayered printed circuit board, a resin composition containing olefin resin was used to form a resin filled layer for an optical path having a transmissivity of 80%/mm and a refractive index of 1.58.

EXAMPLE 37

A device for optical communication was manufactured similarly to Example 33 except that after executing the step (4) in the manufacturing of the substrate for mounting an IC chip in Example 33, micro lenses were disposed on the face of the resin filled layer for an optical path, said face confronting the sealing resin layer using the following method (see FIG. 30).

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 92%/mm and a refractive index of 1.62.

EXAMPLE 38

A device for optical communication was manufactured similarly to Example 34 except that after forming a resin filled layer for an optical path by executing the same step as the step (4) in the manufacturing of the substrate for mounting an IC chip in Example 33, micro lenses were disposed on the face of the resin filled layer for an optical path, said face confronting the sealing resin layer using the following method in Example 34.

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 92%/mm and a refractive index of 1.62.

EXAMPLE 39

A device for optical communication was manufactured similarly to Example 35 except that after forming a resin filled layer for an optical path by executing the same step as the step (4) in the manufacturing of the substrate for mounting an IC chip in Example 33, micro lenses were disposed on the face of the resin filled layer for an optical path, said face confronting the sealing resin layer using the following method in Example 35.

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 85%/mm and a refractive index of 1.60.

EXAMPLE 40

A device for optical communication was manufactured similarly to Example 36 except that after forming a resin filled layer for an optical path by executing the same step as the step (4) in the manufacturing of the substrate for mounting an IC chip in Example 33, micro lenses were disposed on the face of the resin filled layer for an optical path, said face confronting the sealing resin layer using the following method in Example 36.

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 92%/mm and a refractive index of 1.62.

EXAMPLE 41

A. Manufacturing of Substrate for Mounting an IC Chip
A-1. Manufacturing of Package Substrate
(a) Manufacturing of Resin Film for Interlaminar Insulating Layer and Preparation of Resin Filler (Resin Composition)
A resin film for an interlaminar insulating layer was manufactured and a resin filler was prepared using the same methods as (a) and (b) of the A-1 of Example 33.
(b) Manufacturing of Package Substrate
(1) A double-sided copper-clad laminated board composed of an insulating substrate 3021 made of a 0.8 mm-thick glass epoxy resin or BT (bismaleimide-triazine) resin, with a 18 μm-thick copper foil 3028 laminated on both faces of the substrate 3021 was used as a starting material (see FIG. 41(a)). First, this copper-clad laminated board was drilled to bore holes and, then, an electroless plating treatment was carried out and pattern etching was carried out to form conductor circuits 3024 and plated-through holes 3029 on both faces of the substrate 3021 (see FIG. 41(b)).
(2) The substrate 3021 having the under level conductor circuits 3024 formed thereon was washed with water and dried, then subjected to a blackening treatment using an aqueous solution containing NaOH (10 g/l), NaClO$_2$ (40 g/l), Na$_3$PO$_4$ (6 g/l) as a blackening bath (oxidizing bath) and a reducing treatment using an aqueous solution containing NaOH (10 g/l) and NaBH$_4$ (6 g/l) as a reducing bath to form roughened faces (not shown) on the surfaces of the under level conductor circuits 3024.
(3) After the resin filler described in the (a) was prepared, a layer of resin filler 3030' was formed inside each plated-through hole 3029, non conductor formed areas and the peripheral parts of the conductor circuits 3024 on the substrate 3021 by the following method within 24 hours after the preparation.

That is, first, the resin filler was pushed in the plated-through holes using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minuets, thereby forming the layer of resin filler 3030' (see FIG. 41(c)).

(4) One face of the substrate for which the treatment (3) was just finished was ground by belt sander grinding using #600 belt grinding paper (made by Sankyo Chemical Engineering Co.) so as not to leave the resin filler 3030' on the surfaces of the conductor circuits 3024 and the land surfaces of the plated-through holes 3029 and, then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 3030.

Figure 41:
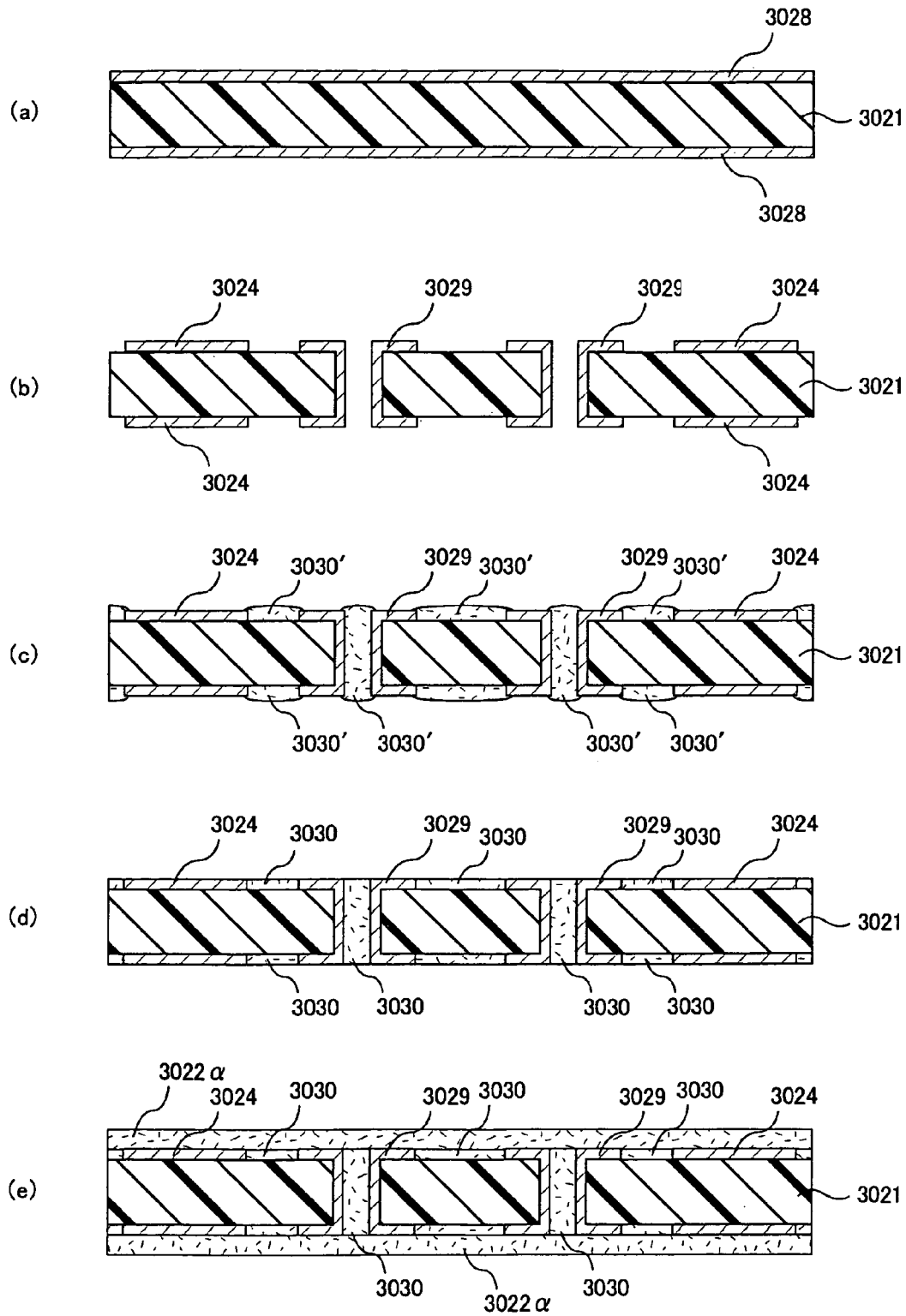
FIG. 41 is a cross-sectional view schematically showing part of the steps of manufacturing the substrate for mounting an IC chip that constitutes the device for optical communication according to the first aspect of the third group of the present invention.

In such a manner, the surface layer part of the resin filler layer 3030 formed in the plated-through holes 3029 and the non conductor formed areas, the surfaces of the conductor circuits 3024 were flattened, thus obtaining an insulating substrate wherein: the resin filler layer 3030 and the side faces of the conductor circuits 3024 were firmly stuck to each other through the roughened faces; and the inner wall faces of the plated-through holes 3029 and the resin filler layer 3030 were also firmly stuck to each other through the roughened faces (see FIG. 41(d)). By this step, the surface of the resin filler layer 3030 was flush with the surfaces of the conductor circuits 3024.

(5) After the substrate was washed with water and degreased with an acid, soft etching was carried out and etchant was sprayed on both faces of the substrate to etch the surfaces of the conductor circuits 3024 and the land surfaces of the plated-through holes 3029, thereby forming roughened faces (not shown) on the entire surfaces of the conductor circuits 3024. As the etchant, Meck etch bond made by Meck Co. was used.

(6) Next, the resin film for an interlaminar insulating layer produced in the (a) was bonded by vacuum pressure-bonding lamination at 0.5 MPa while raising temperature to 50 to 150° C., thereby forming a resin film layer 3022α (see FIG. 41(e)).

Figure 42:
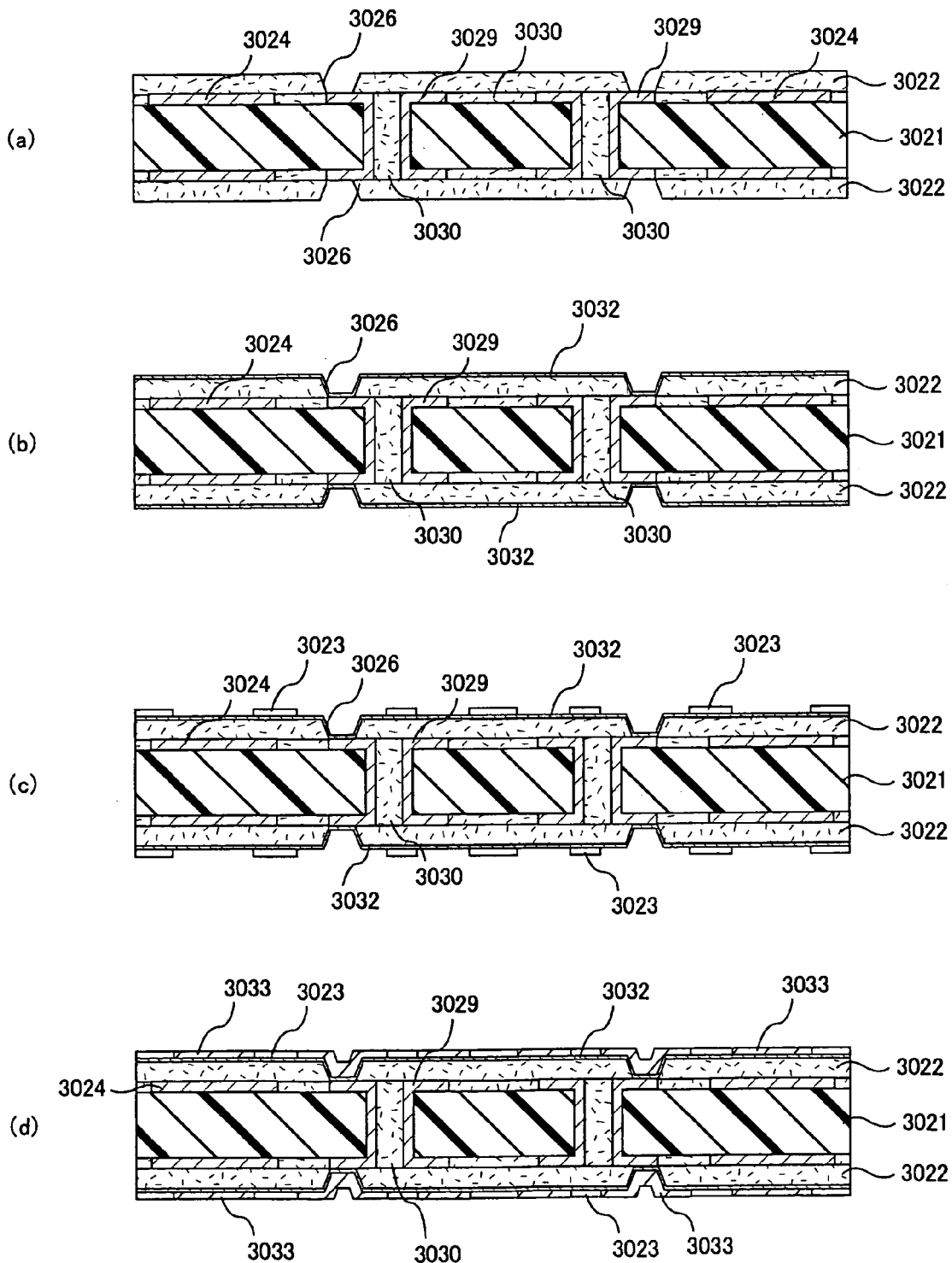
FIG. 42 is a cross-sectional view schematically showing part of the steps of manufacturing the substrate for mounting an IC chip that constitutes the device for optical communication according to the first aspect of the third group of the present invention.

(7) Next, openings for via-holes 3026 with 80 μm diameter were formed in the resin film layer 3022α by a $CO_2$ gas laser of 10.4 μm wavelength through a 1.2 mm-thick mask having through holes therein in conditions of a beam diameter of 4.0 mm, a top hat mode, a pulse interval of 8.0 μs, 1.0 mm-diameter of the through holes of the mask and one shot (see FIG. 42(a)).

(8) The substrate in which the openings for via-holes 3026 were formed was immersed in a solution containing 60 g/l of permanganic acid at 80° C. for 10 minutes to dissolve and remove epoxy resin particles existing on the surfaces of the interlaminar resin insulating layers 3022, thus forming the roughened faces (not shown) on the surfaces of the interlaminar insulating layers 3022 including the inner wall faces of the openings for via-holes 3026.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth: 3 μm), whereby a catalyst core was attached to the surfaces of the interlaminar insulating layers 3022 (including the inner wall faces of the openings for via-holes 3026) (not shown). That is, the catalyst was attached by immersing the substrate in a catalytic solution containing palladium chloride ($PdCl_2$) and stannous chloride ($SnCl_2$) to precipitate palladium metal.

(10) Next, the substrate was immersed in an electroless copper plating solution having the same composition as that of the electroless plating solution used in the step (10) in the manufacturing of the package substrate in Example 33 and the substrate was treated under the same conditions, thereby forming an electroless copper plating film (thin film conductor layer) 3032 having a thickness of 0.6 to 3.0 μm on the surface of each interlaminar insulating layer 3022 (including the inner wall faces of the openings for via-holes 3026) (see FIG. 42(b)).

(11) Next, a commercially available photosensitive dry film was bonded to both faces of the substrate on which the electroless copper plating films 3032 were formed, a mask was put thereon and exposure with 100 mJ/cm² and development with an aqueous 0.8% sodium carbonate solution were carried out, thereby forming a plating resist 3023 (see FIG. 42(c)).

(12) Next, the substrate was formed was washed with water at 50° C. to be degreased, washed with water at 25° C., and further washed with sulfuric acid. Thereafter, the substrate was immersed in an electroplating copper solution having the same composition as the electroplating solution used in the step (12) in the manufacturing of the package substrate in Example 33 and the substrate was treated under the same conditions, thereby forming an electroplating copper film 3033 in non plating resist 3023 formed areas (see FIG. 42(d)).

Figure 43:
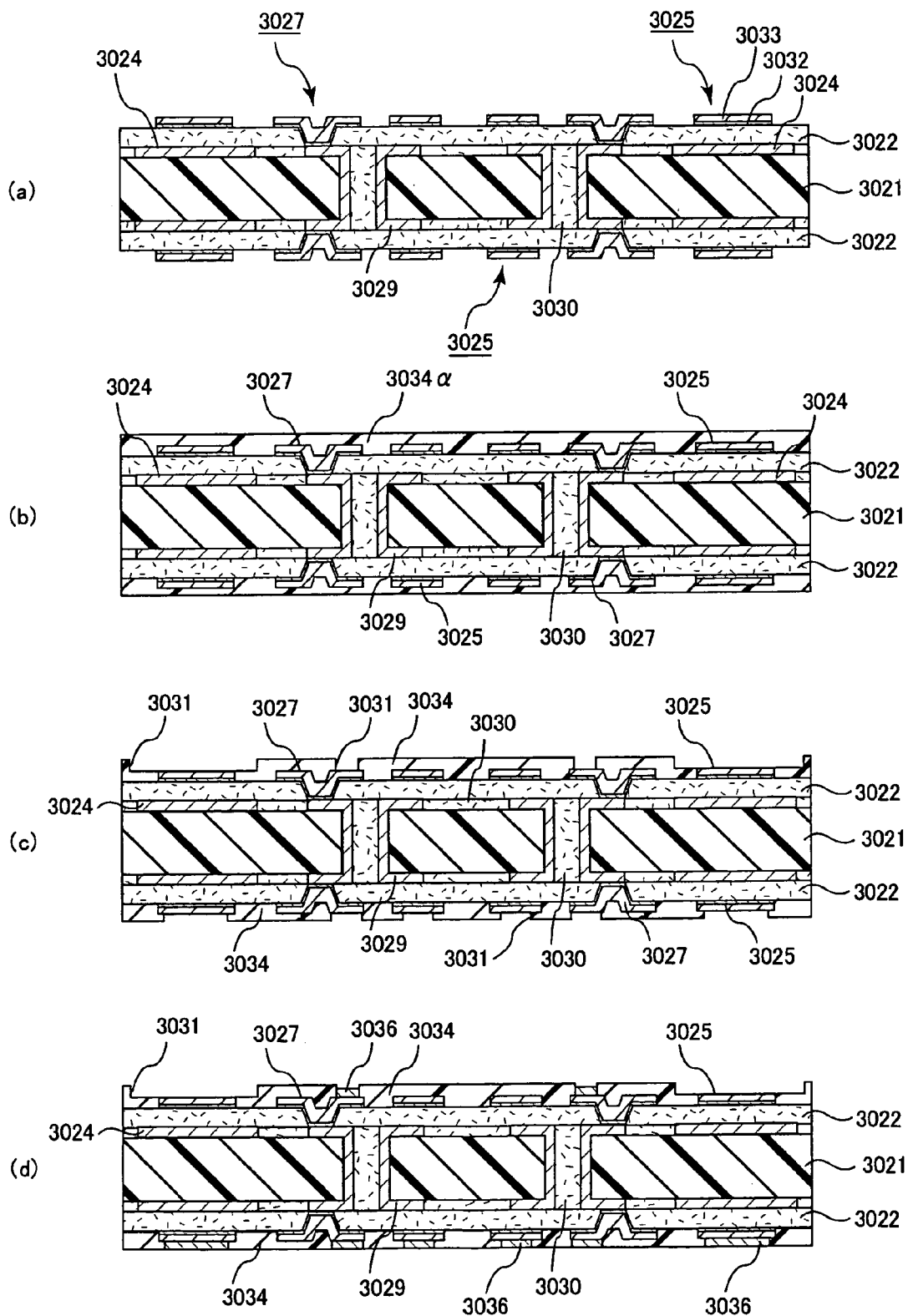
FIG. 43 is a cross-sectional view schematically showing part of the steps of manufacturing the substrate for mounting an IC chip that constitutes the device for optical communication according to the first aspect of the third group of the present invention.

(13) After peeling off the plating resists 3023 with 5% KOH, the electroless plating film under the plating resist 3023 was etched, dissolved and removed with a solution mixture of sulfuric acid and hydrogen peroxide, thus forming conductor circuits 3025 (including via-holes 3027) (FIG. 43(a)).

(14) Next, the substrate having the conductor circuits 3025 and the like formed there on was immersed in etchant, forming roughened faces (not shown) on the surfaces of the conductor circuits 3025 (including the via-holes 3027). As the etchant, Meck etch bond made by Meck Co. was used.

(15) Next, a solder resin composition was prepared similarly to the step (15) of manufacturing the package substrate in Example 33.

(16) Next, the solder resist composition was applied both faces of the substrate having the conductor circuits 3025 and the like formed thereon and dried under conditions of 70° C. for 20 minutes and 70° C. for 30 minutes, thereby forming a solder resist composition layer 3034α (see FIG. 43(b)). Next, a 5 mm-thick photomask on which a pattern of opening parts was drawn was closely stuck to the solder resist composition layer 3034α, exposed with UV rays of 1000 mJ/cm² and developed with a DMTG solution, thereby forming openings 3031.

Further, heat treatments were conducted under conditions of 80° C. for 1 hour, 100° C. for 1 hour, 120° C. for 1 hour and 150° C. for 3 hours, respectively, to cure the solder resist composition layer 3034α, thereby forming a solder resist layer 3034 having openings 3031 (see FIG. 43(c)).

(17) Next, the substrate on which the solder resist layers 3034 were formed was immersed in an electroless nickel plating solution having pH 4.5 and containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, thereby forming a nickel plated layer in part of the openings 3031. Further, the resultant substrate was immersed in an electroless gold plating solution containing potassium gold cyanide ($7.6 \times 10^3$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, to form a gold plating layer on the nickel plated layer, thus obtaining a package substrate (see FIG. 43(d)). In the figures, the two layers of the nickel plated layer and the gold plating layer are denoted as a metal layer 3036.

B. Manufacturing of Substrate for Inserting an Optical Element (1) A single-sided copper-clad laminated board composed of an insulating substrate 3001 made of a 0.8 mm-thick glass epoxy resin or BT (bismaleimide-triazine) resin, with a 18 μm-thick copper foil 3008 laminated on both faces of the substrate 3001 was used as a starting material (see FIG. 44(a)). First, the copper foil 3008 of the single-sided copper-clad laminated board was etched into a pattern, thereby forming conductor circuits 3004 on one face of the substrate (see FIG. 44(b)).

(2) Next, epoxy resin based adhesive was applied to non conductor formed areas on the side of the substrate on which the conductor circuits 3004 was formed, thereby forming an adhesive layer (not shown).

Figure 44:
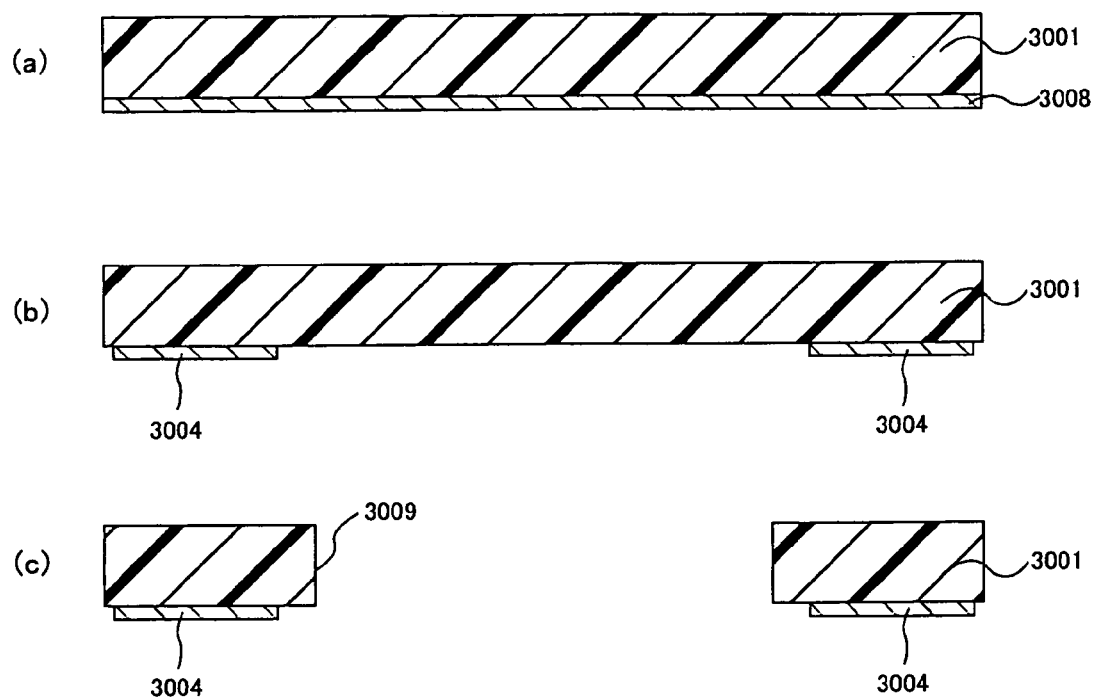
FIG. 44 is a cross-sectional view schematically showing part of the steps of manufacturing the substrate for mounting an IC chip that constitutes the device for optical communication according to the first aspect of the third group of the present invention.

(3) Further, a through hole 3009 was formed at the center of the substrate by router processing, thus obtaining a substrate for inserting an optical element (see FIG. 44(c)).

C. Manufacturing of Substrate for Mounting an IC Chip (1) Lamination pressing based on a mass-laminate method was conducted to obtain a substrate in which the package substrate manufactured in the A and the substrate for inserting an optical element manufactured in the B were bonded together through the adhesive layer formed on the substrate for inserting an optical element (see FIG. 45(a)). That is, after aligning the both substrates, temperature was raised to 150° C. and the substrates were further pressed at a pressure of 5 MPa, thereby bonding the package substrate to the substrate for inserting an optical element.

(2) Next, a light receiving element 3038 and a light emitting element 3039 were attached onto the surface of the package substrate exposed from the through hole 3009 formed in the substrate for inserting an optical element using silver paste so that a light receiving part 3038a and a light emitting part 3039a were exposed to the upward, respectively.

As the light receiving element 3038, an optical element of InGaAs was used. As the light emitting element 3039, an optical element of InGaAsP was used. Further, as the light receiving element 3038 and the light emitting element 3039, optical elements having pads for electric connection provided on the package substrate side relative to the light receiving part 3038a and the light emitting part 3039a, respectively, were used.

Figure 45:
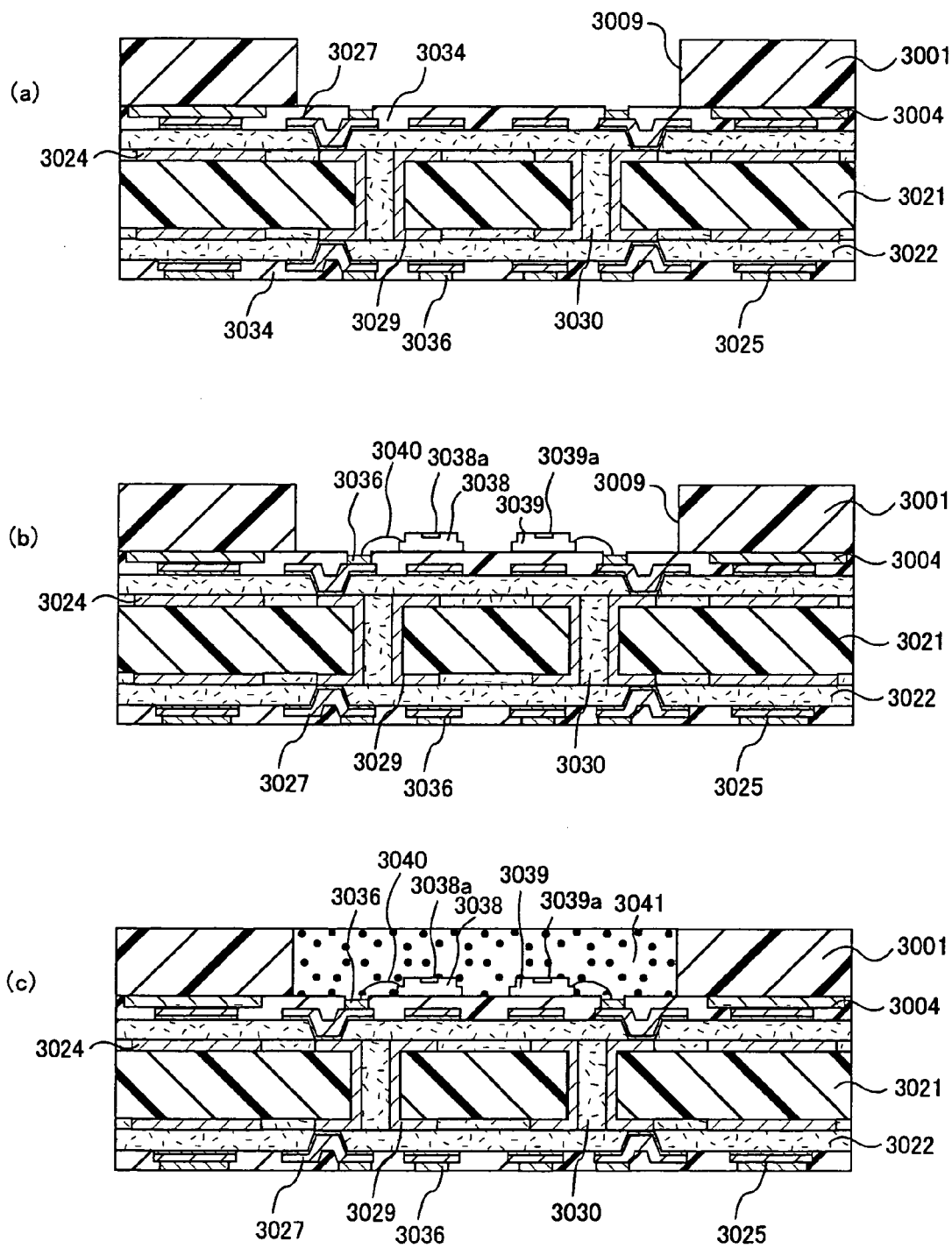
FIG. 45 is a cross-sectional view schematically showing part of the steps of manufacturing the substrate for mounting an IC chip that constitutes the device for optical communication according to the first aspect of the third group of the present invention.

(3) Next, the pads for electric connection of the light receiving element 3038 and the light emitting element 3039 were connected to the metal layer 3036 exposed from the through hole 3009 and formed on the surface of the package substrate by wire-bonding (see FIG. 45(b)). As wires 3040, Wires made of Au were used.

(4) Next, a resin composition containing epoxy resin was filled into the through hole 3009 formed in the substrate for inserting an optical element by printing and this resin composition was then dried.

Further, buff grinding and mirror grinding were conducted to the exposed face of the resin composition. Thereafter, a heat treatment was conducted thereto, thereby obtaining an resin filled layer for an optical path 3041 (see FIG. 45(c)).

It is noted that the resin filled layer for an optical path 3041 had a refractive index of 1.60 and a transmissivity of 85%/mm.

Figure 46:
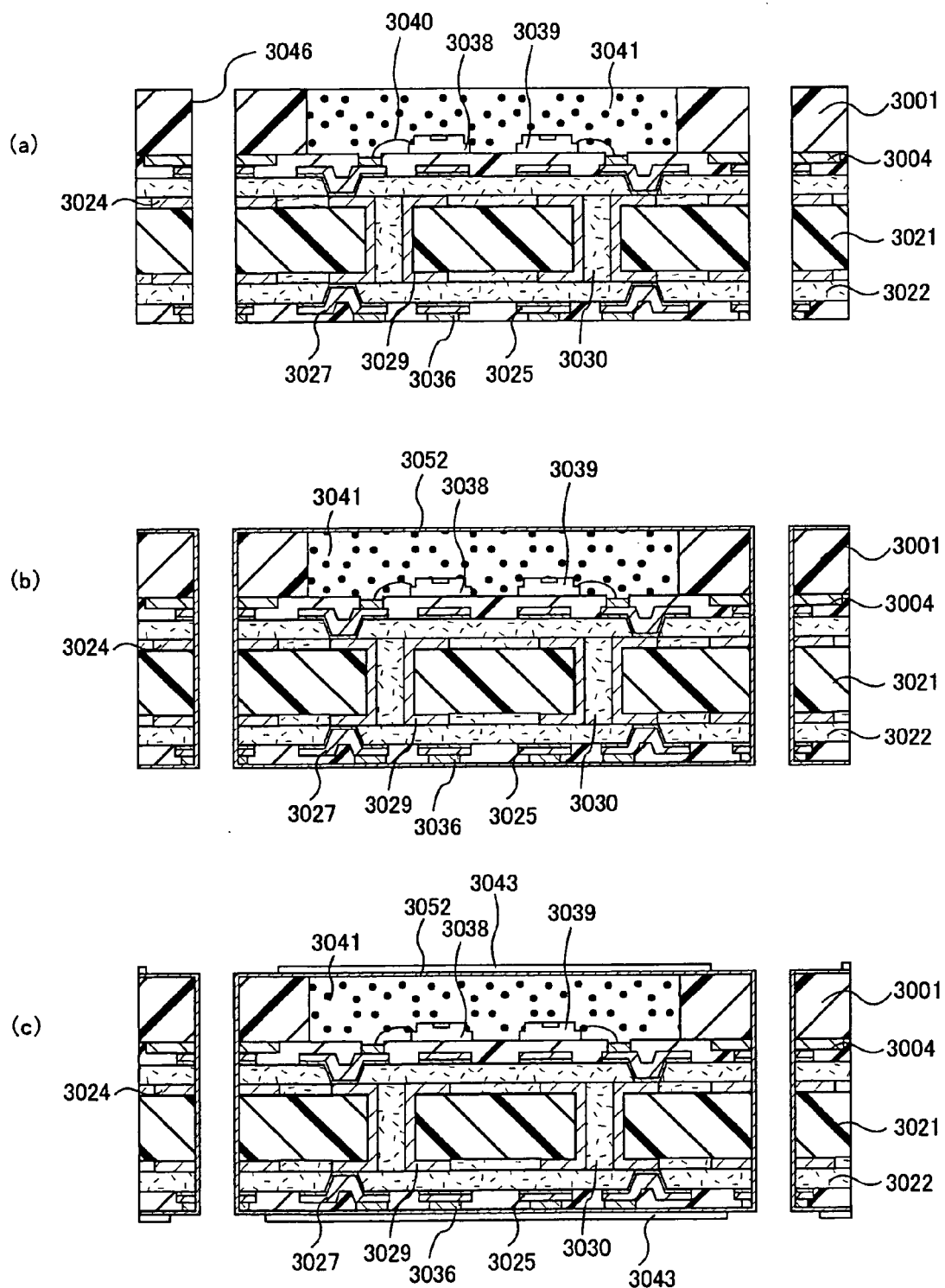
FIG. 46 is a cross-sectional view schematically showing part of the steps of manufacturing the substrate for mounting an IC chip that constitutes the device for optical communication according to the first aspect of the third group of the present invention.

(5) Next, a through hole 3046 penetrating the substrate for inserting an optical element and the package substrate and having a diameter of 400 μm was formed by drilling (see FIG. 46(a)). Further, the substrate was immersed in a solution containing 60 g/l permanganic acid at 80° C. for 10 minutes, thereby conducting a desmear treatment to the wall face of the through hole 3046.

(6) Next, the substrate completed with the treatment was immersed in neutralizer (made by Shiplay Co., Inc.) and washed with water.

Further, a palladium catalyst was attached to the exposed faces of the substrate for inserting an optical element and the package substrate including the wall face of the through hole 3046, there by attaching a catalyst core to wall face of the through hole 3046 and the like (not shown).

(7) Next, the substrate was immersed in an electroless copper plating solution to form an electroless copper plating film (a thin film conductor layer) 3052 having a thickness of 0.6 to 3.0 μm on the exposed faces of the substrate for inserting an optical element and the package substrate including the wall face of the through hole 3046 (see FIG. 46(b)).

It is noted that the same electroless plating solution as that used in the step (10) in the manufacturing of the package substrate was used and the treatment was conducted under the same conditions therefor.

(8) Next, a commercially available photosensitive dry film was bonded to the substrate on which the electroless copper plating film 3052 was formed, a mask was put thereon and exposure with 100 mJ/cm$^2$ and development with an aqueous 0.8% sodium carbonate solution were carried out, thereby forming a plating resist 3043 (see FIG. 46(c)).

Figure 47:
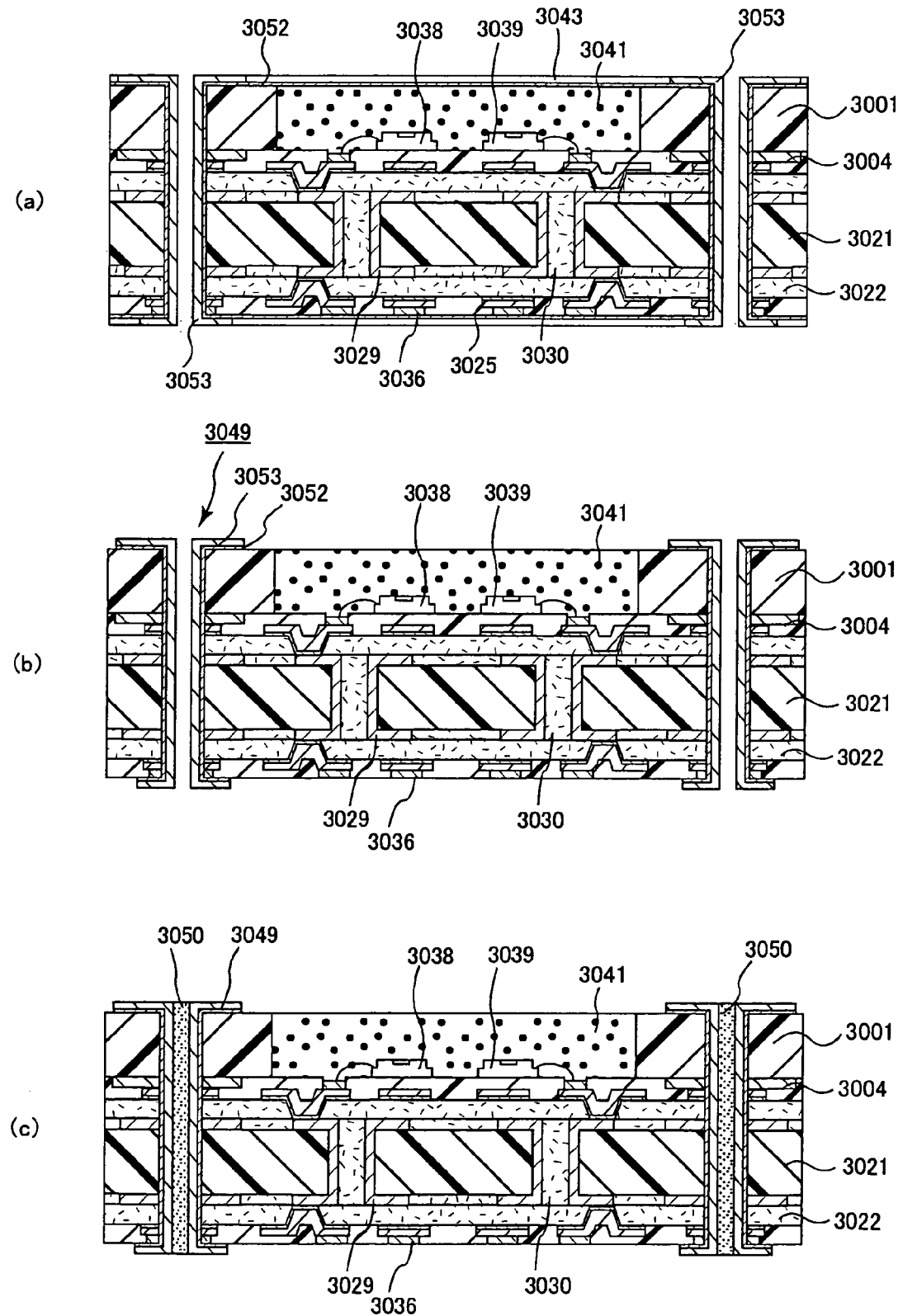
FIG. 47 is a cross-sectional view schematically showing part of the steps of manufacturing the substrate for mounting an IC chip that constitutes the device for optical communication according to the first aspect of the third group of the present invention.

(9) Next, after the substrate was washed with water at 50° C. to be degreased, washed with water at 25° C. and further washed with sulfuric acid, the substrate was subjected to electroplating, thereby forming an electroplating copper film 3053 in non plating resist 3043 formed areas (see FIG. 47(a)).

As the electroplating solution, the same electroplating solution as that used in the step (12) in the manufacturing of the package substrate was used and the substrate was treated under the same conditions.

(10) Further, after peeling off the plating resist 3043 with 5% KOH, the electroless plating film under the plating resist 3043 was etched, dissolved and removed with a solution mixture of sulfuric acid and hydrogen peroxide, thus forming a plated-through hole 3049 penetrating the substrate for inserting an optical element and the package substrate (see FIG. 47(b)).

(11) Next, the substrate in which the plated-through hole 3049 was formed was immersed in etchant (Meck etch bond made by Meck Co.), thereby forming a roughened face (not shown) on the wall faces (including the surfaces of the land parts) of the plated-through hole 3049.

Next, after the same resin composition as that described in the (a) for the manufacturing of the package substrate was prepared, a resin filler layer was formed in the plated-through hole 3049 by the following method within 24 hours after the preparation.

That is, the resin filler was pushed in the plated-through hole 3049 using a squeegee and then dried under conditions of 100° C. for 20 minutes, thereby forming a resin filler layer.

Further, the land surfaces of the plated-through hole 3049 was ground by belt sander grinding using #600 belt grinding paper (made by Sankyo Chemical Engineering Co.) so as not to leave the resin filler on the land surfaces of the plated-through hole 3049. Next, buff grinding was carried out to remove scratches caused by the belt sander grinding. Furthermore, heat treatments were carried out at 100° C. for 1 hour, 120° C. for 3 hours, 150° C. for 1 hour and 180° C. for 7 hours, to form a resin filler layer 3050 having a flat exposed face from the plated-through hole (see FIG. 47(*c*)).

Figure 48:
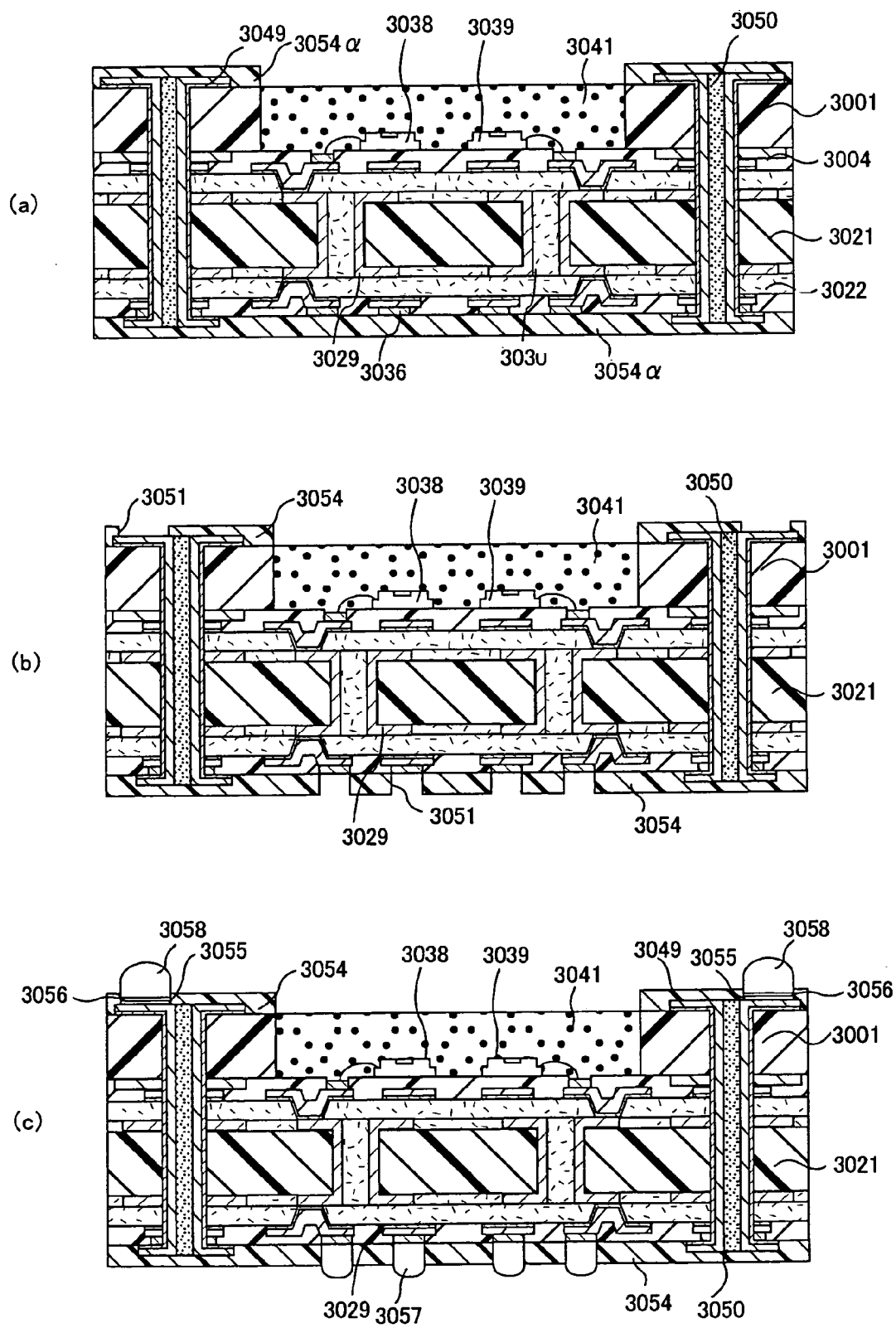
FIG. 48 is a cross-sectional view schematically showing part of the steps of manufacturing the substrate for mounting an IC chip that constitutes the device for optical communication according to the first aspect of the third group of the present invention.

(12) Next, the same resin composition as that prepared in the step (15) in the manufacturing of the package substrate was prepared, applied onto the both faces of the substrate, and dried under conditions of 70° C. for 20 minutes and 70° C. for 30 minutes, thereby forming a solder resist composition layer 3054α (see FIG. 48(*a*)). Herein, the solder resist composition was not applied onto the surface of the resin filled layer 3041.

Next, a 5 mm-thick photomask on which a pattern of opening parts was drawn was closely stuck to the solder resist composition layer 3054α, exposed with UV rays of 1000 mJ/cm$^2$ and developed with a DMTG solution, thereby forming openings 3051.

Further, heat treatments were conducted under conditions of 80° C. for 1 hour, 100° C. for 1 hour, 120° C. for 1 hour and 150° C. for 3 hours, respectively, to cure the solder resist composition layer 3054α, thereby forming a solder resist layer 3054 having openings 3051 (see FIG. 48(*b*)).

(13) Next, the substrate on which the solder resist layer 3054 was formed was immersed in an electroless nickel plating solution having pH 4.5 and containing nickel chloride ($2.3\times10^{-1}$ mol/l), sodium hypophosphite ($2.8\times10^{-1}$ mol/l) and sodium citrate ($1.6\times10^{-1}$ mol/l) for 20 minutes, thereby forming a nickel plated layer 3055 having a thickness of 5 μm in part of the openings 3051. Further, the resultant substrate was immersed in an electroless gold plating solution containing potassium gold cyanide ($7.6\times10^{-3}$ mol/l), ammonium chloride ($1.9\times10^{-1}$ mol/l), sodium citrate ($1.2\times10^{-1}$ mol/l) and sodium hypophosphite ($1.7\times10^{-1}$ mol/l) under conditions of 80° C. for 7.5 minutes, to form a 0.03 μm-thick gold plating layer 56 on the nickel plated layer.

(14) Next, solder paste (Sn/Ag=96.5/3.5) was printed in each of the openings 3051 formed in the solder resist layer 3054 and reflow was conducted at 250° C., thereby forming solder bumps for mounting IC chips 3057 and solder bumps for connecting multilayered printed circuit boards 3058, thus obtaining a substrate for mounting an IC chip (see FIG. 48(*c*)).

B. Manufacturing of Multilayered Printed Circuit Board

A multilayered printed circuit board was manufactured similarly to B of Example 33.

C. Manufacturing of Device for IC Mounting Optical Communication

First, an IC chip was mounted on the substrate for mounting an IC chip manufactured through the steps in A, the IC chip was then sealed with resin, thereby obtaining a substrate for mounting an IC chip.

Thereafter, this substrate for mounting an IC chip and the multilayered printed circuit board manufactured through the steps in B were disposed at predetermined positions to be confronting each other, respectively, and reflow was conducted at 200° C., thereby connecting the solder bumps of the substrate and the board to form solder connection parts.

Next, a resin composition for sealing was filled between the multilayered printed circuit board and the substrate for mounting an IC chip which were connected to each other through the solder connection parts and a curing treatment was conducted to the resin composition for sealing, thereby forming a sealing resin layer and thus obtaining a device for optical communication. As the resin composition for sealing, a resin composition containing epoxy resin was used. In addition, the formed sealing resin layer had a transmissivity of 85%/mm and a refractive index of 1.60.

EXAMPLE 42

A device for optical communication was manufactured similarly to Example 41 except that the resin filled layer for an optical path had two-layer structure composed of an inner resin filled layer for an optical path and an outer resin filled layer for an optical path. Specifically, a device for optical communication was manufactured similarly to Example 41 except that the following method was used in the step (4) in the manufacturing of the substrate for mounting an IC chip (see FIG. 31).

That is, a resin composition containing epoxy resin, silica particles (average particle diameter: 0.5 μm) and curing agent was filled into the through hole formed in the substrate for inserting an optical element by the same height as that of the optical elements (light receiving element and light emitting element) by printing, and this resin composition was thermally cured, thereby forming a inner resin filled layer for an optical path.

Next, a resin composition containing epoxy resin was filled on the inner resin filled layer for an optical path in the through hole by printing and dried, and further, the exposed face of the resin composition was subjected to buff grinding and mirror grinding. Thereafter, a curing treatment was conducted, thereby forming an outer resin filled layer for an optical path.

It is noted that the outer resin filled layer for an optical path had a refractive index of 1.60 and a transmissivity of 85%/mm.

For each of the devices for IC mounting optical communication in Examples 33 to 42 thus obtained, an optical fiber was attached to the exposed face of the optical waveguide, which is at the side confronting the light receiving element, from the side of the multilayered printed circuit board, a detector was attached to the exposed face of the optical waveguide, which is at the side confronting the light emitting element, from the side of the multilayered printed circuit board, optical signal was then transmitted through the optical fiber, the IC chip was allowed to perform arithmetic operation, and the optical signal was detected by the detector. As a result, a desired optical signal was able to be detected, thus demonstrating that each of the devices for IC mounting optical communication manufactured in the examples 33 to 42 had sufficiently satisfactory performance as a device for optical communication.

Furthermore, even when compared with the devices for optical communication manufactured using the same methods as those of Examples 33 to 42 except that the sealing resin layer was not formed and that the resin filled layer for an optical path and the resin layer for an optical path were not formed, the waveguide loss between the light emitting element mounted on the substrate for mounting an IC chip and the optical waveguide confronting this light emitting element and formed on the multilayered printed circuit board was hardly lowered.

Moreover, in each of the devices for optical communication obtained in Examples 33 to 42, the positional deviation of the optical elements (light receiving element and light emitting element) and the optical waveguides from desired positions was hardly observed on the basis of the design.

EXAMPLES 43 TO 49)

Each of devices for optical communication was manufactured similarly to Example 33 except that the light receiving element and the light emitting element were attached onto the surface of the package substrate exposed from the through hole (an area in a planar view of 20×20 mm) formed in the substrate for inserting an optical element in the step (2) of A-3 of Example 33 and that the resin filled layer for an optical path was formed in the step (4) using the following method.

That is, a resin composition obtained by adding pulverized silica having a particle size distribution of 0.1 to 0.8 μm to epoxy resin (transmissivity: 91%/mm, thermal expansion coefficient: 82 ppm) so that the silica content became the value shown in Table 7, was prepared and filled into the through hole by a syringe. Herein, the resin composition was prepared to have a viscosity of 500 cps (mP·s). Next, the resin composition was cured under conditions of 120° C. for 1 hour and 150° C. for 2 hours. The viscosity of the resin composition was measured by BH type No.7 at 10 rpm.

Further, the resin composition overflowing the through hole was removed by grinding using #3000 grinding paper and ground using alumina particles of 0.05 µm to flatten the surface layer of the resin composition, thereby forming the resin filled layer for an optical path.

In Example 43, no silica particles were added.

TABLE 7

|  | Content of pulverized silica (% by weight) | transmissivity (%/mm) | Thermal expansion coefficient (ppm) |
|---|---|---|---|
| Example 43 | 0 | 91 | 72 |
| Example 44 | 5 | 82 | 65 |
| Example 45 | 10 | 80 | 59 |
| Example 46 | 20 | 84 | 51 |
| Example 47 | 40 | 83 | 43 |
| Example 48 | 50 | 81 | 36 |
| Example 49 | 60 | 80 | 32 |

For each of the devices for optical communication in Examples 43 to 49 thus obtained, a wire-bonding state, the presence/absence of cracks on the resin filled layer for an optical path after a liquid-phase temperature cycle test were evaluated. The evaluation results are shown in Table 8.

The wire-bonding state was evaluated by observing the state of wires using a microscope after forming the resin filled layer for an optical path.

Further, the liquid-phase temperature cycle test was conducted under the same conditions as those of Example 7 and the presence/absence of the occurrence of cracks on the resin filled layer for an optical path was evaluated by cutting the substrate for mounting an IC chip to cross the resin filled layer for an optical path using a cutter and observing the cross-section.

TABLE 8

|  | Appearance of wire bonding | Liquid-phase temperature cycle | | |
|---|---|---|---|---|
|  |  | 250 cycles | 500 cycles | 1000 cycles |
| Example 43 | ○ | ○ | ○ | Δ |
| Example 44 | ○ | ○ | ○ | Δ |
| Example 45 | ○ | ○ | ○ | ○ |
| Example 46 | ○ | ○ | ○ | ○ |
| Example 47 | ○ | ○ | ○ | ○ |
| Example 48 | ○ | ○ | ○ | ○ |
| Example 49 | Δ | ○ | ○ | ○ |
| Comparative Example | — | ○ | Δ | X |

Table 8 shows the results of Examples 48 to 49 and the evaluation result of optical signal transmission characteristic of the device for optical communication manufactured in the above-mentioned Comparative Example.

Evaluation Standard of Appearance of Wire-bonding
○: Wires were not deformed.
Δ: Wires were deformed but not broken.
X: Wires were broken.

Evaluation Standard of Liquid-phase Temperature Cycle Test
○: No crack was observed.
Δ: Some cracks occurred but optical signal was able to be transmitted through the resin filled layer for an optical path.
X: Cracks occurred and optical signal was not able to be transmitted through the resin filled layer for an optical path.

In Examples 44 to 49, pulverized silica particles were added to the resin filled layer for an optical path. The same experiments were conducted by using titania particles or alumina particles in place of the pulverized silica particles. With the thermal expansion coefficient slightly different, the same results were obtained for the appearance of wire-bonding and the liquid-phase temperature cycle test.

EXAMPLES 50 TO 58)

Each of devices for optical communication was manufactured similarly to Example 33 except for the use of optical waveguides into which pulverized silica particles (particle size distribution: 0.1 to. 0.8 µm) having a content shown in Table 9 were mixed in the step B-(14) in Example 33.

In each of Examples 50 to 58, the optical waveguides were formed by the same method as that in each of Examples 17 to 25.

TABLE 9

|  | Content of pulverized silica (% by weight) | transmissivity (%/mm) | Thermal expansion coefficient (ppm) |
|---|---|---|---|
| Example 50 | 0 | 93 | 70 |
| Example 51 | 8 | 84 | 67 |
| Example 52 | 10 | 82 | 65 |
| Example 53 | 15 | 84 | 60 |
| Example 54 | 25 | 81 | 53 |
| Example 55 | 50 | 82 | 41 |
| Example 56 | 60 | 79 | 32 |
| Example 57 | 70 | 75 | 28 |
| Example 58 | 80 | 77 | 25 |

For each of the devices for optical communication in Examples 50 to 58 thus obtained, the presence/absence of the occurrence of cracks on the optical waveguides after a liquid-phase temperature cycle test were evaluated. The evaluation results are shown in Table 10.

The evaluation was made by the same evaluation method and evaluation standard as those of Example 17.

TABLE 10

|  | Liquid-phase temperature cycle | | |
|---|---|---|---|
|  | 250 cycles | 500 cycles | 1000 cycles |
| Example 50 | ○ | ○ | Δ |
| Example 51 | ○ | ○ | Δ |
| Example 52 | ○ | ○ | Δ |
| Example 53 | ○ | ○ | ○ |
| Example 54 | ○ | ○ | ○ |
| Example 55 | ○ | ○ | ○ |
| Example 56 | ○ | ○ | ○ |
| Example 57 | ○ | ○ | ○ |
| Example 58 | ○ | ○ | ○ |
| Comparative Example | ○ | Δ | X |

Table 10 shows the results of Examples 50 to 58 and the evaluation result of optical signal transmission characteristic of the device for optical communication manufactured in the above-mentioned Comparative Example.

In Examples 51 to 58, pulverized silica particles were added to the claddings constituting the respective optical waveguides. The same experiments were conducted by using titania particles or alumina particles in place of the pulverized silica particles. With the thermal expansion coefficient slightly different, the same results were obtained for the liquid-phase temperature cycle test.

The optical waveguides formed in Examples 50 to 58 were optical waveguides for multi-mode. Even when devices for optical communication were manufactured similarly to Examples 50 to 58 by using optical waveguides for single-mode instead of the optical waveguides for multi-mode, a predetermined optical signal was able to be transmitted.

The optical waveguide for single-mode was formed as follows. Siloxane based resin (refractive index: 1.50, transmissivity: 93%/mm, thermal expansion coefficient: 115 ppm) was prepared as a resin for forming a core, and siloxane based resin (refractive index: 1.48, transmissivity: 93%/mm, thermal expansion coefficient: 141 ppm) was prepared as a resin for forming a cladding. In addition, particles were added by a predetermined mixing quantity to the resin for forming a cladding, based on necessity. Using these resins, an optical waveguide for single-mode having the cross-sectional size of the core of 10×10 μm and the film thicknesses of the upper cladding and the lower cladding of 10 μm was obtained by the same method as that in Example 17.

Further, among the optical waveguides formed by such a method, the optical waveguide for single-mode having no particles mixed to the claddings had a transmission loss of 0.43 dB/cm for signal light having a wavelength of 1.33 μm and a transmission loss of 0.84 dB/cm for signal light having a wavelength of 1.55 μm, and the optical waveguide for single-mode having 50% by weight of particles mixed to the claddings had a transmission loss of 0.41 dB/cm for signal light having a wavelength of 1.33 μm and a transmission loss of 0.82 dB/cm for signal light having a wavelength of 1.55 μm. The measurement of the transmission losses was made by the cut-back method.

The cladding having no particles mixed therein had a thermal expansion coefficient of 141 ppm, and the cladding having particles mixed therein by 50% by weight had a thermal expansion coefficient of 48 ppm. The optical waveguides were evaluated by conducting the liquid-phase temperature cycle test for the devices for optical communication using the optical waveguides for single-mode. The evaluation results were the same as those for Examples 50 to 58.

EXAMPLES 59 TO 65

Each of devices for optical communication was manufactured similarly to Example 33 except that the sealing resin layer was formed by the following method in the steps of C in Example 33.

That is, after connecting the substrate for mounting an IC chip to the multilayered printed circuit board through the solder bumps, a resin composition which was obtained by adding pulverized silica particles having a particle size distribution of 0.1 to 0.8 μm to epoxy based resin (transmissivity: 90%/mm, thermal expansion coefficient: 67 ppm) so that the mixing quantity of silica became the value shown in the following Table 11 and which was prepared to have a viscosity of 5000 cps (mP·s), was applied around the substrate for mounting an IC chip using a dispenser and left as it was thereafter, thereby causing the resin composition to infiltrate between the substrate for mounting an IC chip and the multilayered printed circuit board. Next, treatments were conducted at 120° C. for 1 hour and 150° C. for 2 hours to cure the resin composition, thereby obtaining a sealing resin layer. It is noted that the clearance between the substrate for mounting an IC chip and the multilayered printed circuit board was 300 μm.

In addition, no pulverized silica particles were added in Example 59.

TABLE 11

|  | Content of pulverized silica (% by weight) | transmissivity (%/mm) | Thermal expansion coefficient (ppm) |
|---|---|---|---|
| Example 59 | 0 | 90 | 67 |
| Example 60 | 10 | 82 | 56 |
| Example 61 | 20 | 82 | 46 |
| Example 62 | 50 | 81 | 32 |
| Example 63 | 60 | 80 | 30 |
| Example 64 | 70 | 82 | 27 |
| Example 65 | 80 | 80 | 24 |

For each of the devices for optical communication in Examples 59 to 65 thus obtained, the sealing property by the sealing resin layer and the presence/absence of the occurrence of cracks on the optical waveguides after a liquid-phase temperature cycle test were evaluated. The evaluation results are shown in Table 12.

The sealing property by the sealing resin layer and the presence/absence of the occurrence of cracks were evaluated by the same evaluation method and evaluation standard as those in Example 26.

TABLE 12

|  | Sealing property by sealing resin layer | Liquid-phase temperature cycle | | |
|---|---|---|---|---|
|  |  | 250 cycles | 500 cycles | 1000 cycles |
| Example 59 | ○ | ○ | ○ | Δ |
| Example 60 | ○ | ○ | ○ | Δ |
| Example 61 | ○ | ○ | ○ | ○ |
| Example 62 | ○ | ○ | ○ | ○ |
| Example 63 | ○ | ○ | ○ | ○ |
| Example 64 | Δ | ○ | ○ | ○ |
| Example 65 | Δ | ○ | ○ | ○ |
| Comparative Example | — | ○ | Δ | X |

Table 12 shows the results of Examples 59 to 65 and the evaluation result of optical signal transmission characteristic of the device for optical communication manufactured in the above-mentioned Comparative Example.

Further, in Examples 60 to 65, pulverized silica particles were mixed into the sealing resin layer. The same experiments were conducted by using titania particles or alumina particles in place of the pulverized silica particles. With the thermal expansion coefficient slightly different, the same results were obtained for the sealing property by the sealing resin layer and the liquid-phase temperature cycle test.

Further, at the time of manufacturing devices for optical communication using the same methods as those used in Examples 59 to 65, the viscosity of the resin composition for forming the sealing resin layer was raised and the resin composition was left as it was for shorter time, thereby forming a sealing resin layer only in the vicinity of the outer periphery of the area put between the substrate for mounting an IC chip and the multilayered printed circuit board. In the device for optical communication having the above-mentioned configuration, a signal was transmitted between the substrate for mounting an IC chip and the multilayered printed circuit board through an air layer. In this case, no disadvantage occurred to the optical signal transmission.

EXAMPLES 66 TO 70

Each of devices for optical communication was manufactured similarly to Example 37 except that micro lenses were formed by the following method at the time of forming the micro lenses in Example 37.

That is, a resin composition obtained by adding pulverized silica particles having a particle size distribution of 0.1 to 0.8 µm to epoxy based resin (transmissivity: 90%/mm, refractive index: 1.53) so that the mixing quantity of the silica became the value shown in the following Table 13 was applied using a dispenser, and a curing treatment was conducted while the resin composition became generally semispherical by the surface tension, thereby forming each micro lens. In Example 66, no pulverized silica particles were added.

TABLE 13

|  | Content of pulverized silica (% by weight) | transmissivity (%/mm) |
|---|---|---|
| Example 66 | 0 | 90 |
| Example 67 | 20 | 84 |
| Example 68 | 40 | 82 |
| Example 69 | 60 | 82 |
| Example 70 | 70 | 81 |

For each of the devices for optical communication in Examples 66 to 70 thus obtained, the application property of the resin composition at the time of forming micro lenses and the presence/absence of the occurrence of cracks on the micro lenses after a liquid-phase temperature cycle test were evaluated. The evaluation results are shown in Table 14.

The application property at the time of forming the micro lenses was evaluated by observing the shapes of the micro lenses by a microscope after forming the micro lenses.

Further, the liquid-phase temperature cycle test was conducted under the same conditions as those of Example 7 and the presence/absence of cracks on the micro lenses was evaluated by cutting the substrate for mounting an IC chip to cross the micro lenses and observing the cross sections of the micro lenses.

TABLE 14

|  | Application property | Liquid-phase temperature cycle | | |
|---|---|---|---|---|
|  |  | 250 cycles | 500 cycles | 1000 cycles |
| Example 66 | ○ | ○ | ○ | ○ |
| Example 67 | ○ | ○ | ○ | ○ |
| Example 68 | ○ | ○ | ○ | ○ |
| Example 69 | ○ | ○ | ○ | ○ |
| Example 70 | Δ | ○ | ○ | ○ |
| Comparative Example | — | ○ | Δ | X |

Table 14 shows the results of Examples 66 to 70 and the evaluation result of optical signal transmission characteristic of the device for optical communication manufactured in the above-mentioned Comparative Example.

Evaluation Standard of Application Property at the Time of Forming Micro Lenses

○: The resin composition was able to be applied to obtain each micro lens of desired shape.

Δ: Although the shape of the applied resin composition was slightly deviated from design, the resin composition was able to function as a micro lens.

X: The shape of the applied resin composition did not become semispherical and the cured resin composition was not able to function as a micro lens.

Evaluation Standard of Liquid-phase Temperature Cycle Test

○: No crack was observed.

Δ: Some cracks occurred but optical signal was able to be transmitted through micro lenses.

X: Cracks occurred and optical signal was not able to be transmitted through micro lenses In Examples 67 to 70, pulverized silica particles were mixed into the micro lenses. The same experiments were conducted by using titania particles or alumina particles in place of the pulverized silica particles. With the thermal expansion coefficient slightly different, the similar results were obtained for the application property at the time of forming micro lenses and the liquid-phase temperature cycle test.

EXAMPLE 71

A. Manufacturing of Substrate for Mounting IC Chip

A-1. Manufacturing of Resin Film for Interlaminar Insulating Layer

A resin film for an interlaminar insulating layer was prepared using the same method as that used in the steps of A in Example 1.

A-2. Preparation of Resin Composition for Filling Through Hole

A resin composition for filling a through hole was prepared using the same method in the steps of B in Example 1.

A-3. Manufacturing of Substrate for Mounting IC Chip (1) A copper-clad laminated board composed of an insulating substrate 4021 made of a 0.8 mm-thick glass epoxy resin or BT (bismaleimide-triazine) resin, with a 18 µm-thick copper foil 4028 laminated on both faces of the substrate 4021 was used as a starting material (see FIG. 51(a)). First, the copper-clad laminated board was drilled to bore holes and, then, an electroless plating treatment was carried out and pattern etching was carried out to form conductor circuits 4024 and a plated-through hole 4029 on both faces of the substrate 4021 (see FIG. 51(b)).

(2) The substrate having the plated-through hole 4029 formed therein and the conductor circuits 4024 formed thereon was washed with water and dried, then subjected to a blackening treatment using an aqueous solution containing NaOH (10 g/l), NaClO₂ (40 g/l), Na₃PO₄ (6 g/l) as a blackening bath (oxidizing bath) and a reducing treatment using an aqueous solution containing NaOH (10 g/l) and NaBH₄ (6 g/l) as a reducing bath to form roughened faces (not shown) on the surfaces of the conductor circuits 4024 including the plated-through hole 4029.

(3) After the resin filler described in A-2 was prepared, a layer of resin filler 4030' was formed inside the plated-through hole 4029, non conductor formed areas and the peripheral parts of the conductor circuits 4024 on the substrate 4021 by the following method within 24 hours after the preparation.

That is, first, the resin filler was pushed in the plated-through hole using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minutes, thereby forming the layer of resin filler 4030' (see FIG. 51(c)).

(4) One face of the substrate for which the treatment (3) was just finished was ground by belt sander grinding using #600 belt grinding paper (made by Sankyo Chemical Engineering Co.) so as not to leave the resin filler 4030' on the surfaces of the conductor circuits 4024 and the land surface of the plated-through hole 4029 and, then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 4030.

Figure 51:
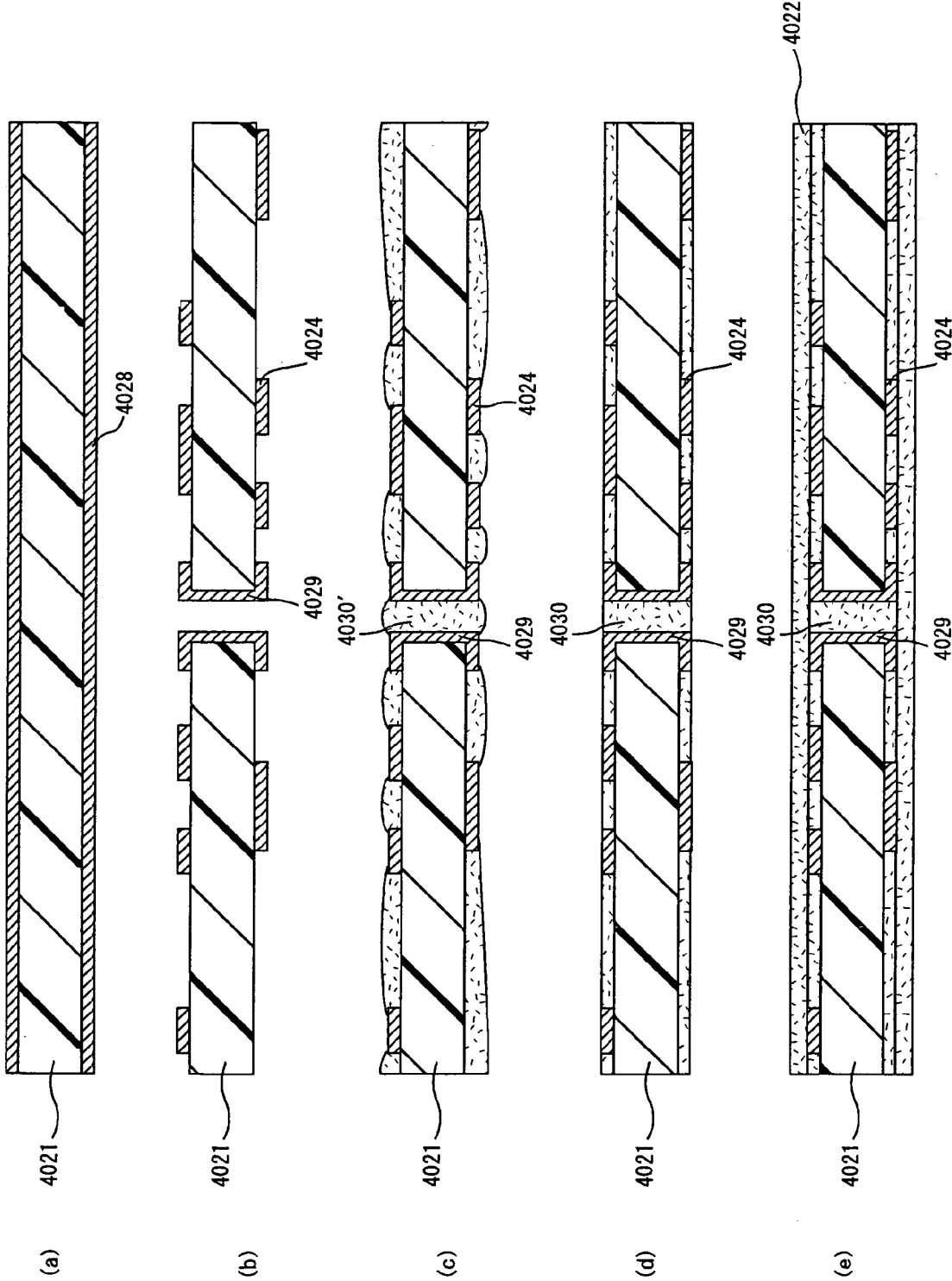
FIG. 51 is a cross-sectional view schematically showing still another embodiment of the device for optical communication according to the first aspect of the fourth group of the present invention.

In such a manner, the surface layer part of the resin filler layer 4030 formed in the plated-through hole 4029 and the non conductor formed areas and the surfaces of the conductor circuits 4024 were flattened, thus obtaining an insulating substrate wherein: the resin filler 4030 and the side faces of the conductor circuits 4024 were firmly stuck to each other through the roughened faces; and the inner wall face of the plated-through hole 4029 and the resin filler 4030 were also firmly stuck to each other through the roughened face, (see FIG. 51(d)). By this step, the surface of the resin filler layer 4030 was flush with the surfaces of the conductor circuits 4024.

(5) After the substrate was washed with water and degreased with an acid, soft etching was carried out and etchant was sprayed on both faces of the substrate to etch the surfaces of the conductor circuits 4024 and the land surface and inner wall of the plated-through hole 4029, thereby forming roughened faces (not shown) on the entire surfaces of the conductor circuits 4024. As the etchant, etchant (made by Meck Co.; Meck etch bond) containing 10 parts by weight of an imidazole copper(II) complex and 7 parts by weight of glycolic acid, and 5 parts by weight of potassium chloride was used.

(6) Next, a resin film for an interlaminar resin insulating layer with a slightly larger size than that of the substrate produced in the A-1 was put on the substrate, temporarily pressure-bonded under conditions of 0.4 MPa pressure, 80° C. temperature, and 10-second pressure bonding period and cut. Thereafter, the film was bonded by the following method using a vacuum laminator device, thereby forming an interlaminar resin insulating layer 4022 (see FIG. 51(e)).

That is, the resin film for an interlaminar resin insulating layer was actually pressure-bonded on the substrate under conditions of 65 Pa degree of vacuum, 0.4 MPa pressure, 80° C. temperature and 60-second pressure bonding period, and the resin film was further thermally cured at 170° C. for 30 minutes.

(7) Next, openings for via-holes 4026 with 80 μm diameter were formed in the interlaminar insulating layers 4022 by a $CO_2$ gas laser of 10.4 μm wavelength through a 1.2 mm-thick mask having through holes therein in conditions of a beam diameter of 4.0 mm, a top hat mode, a pulse interval of 8.0 μs, 1.0 mm-diameter of the through holes of the mask and one shot.

Figure 52:
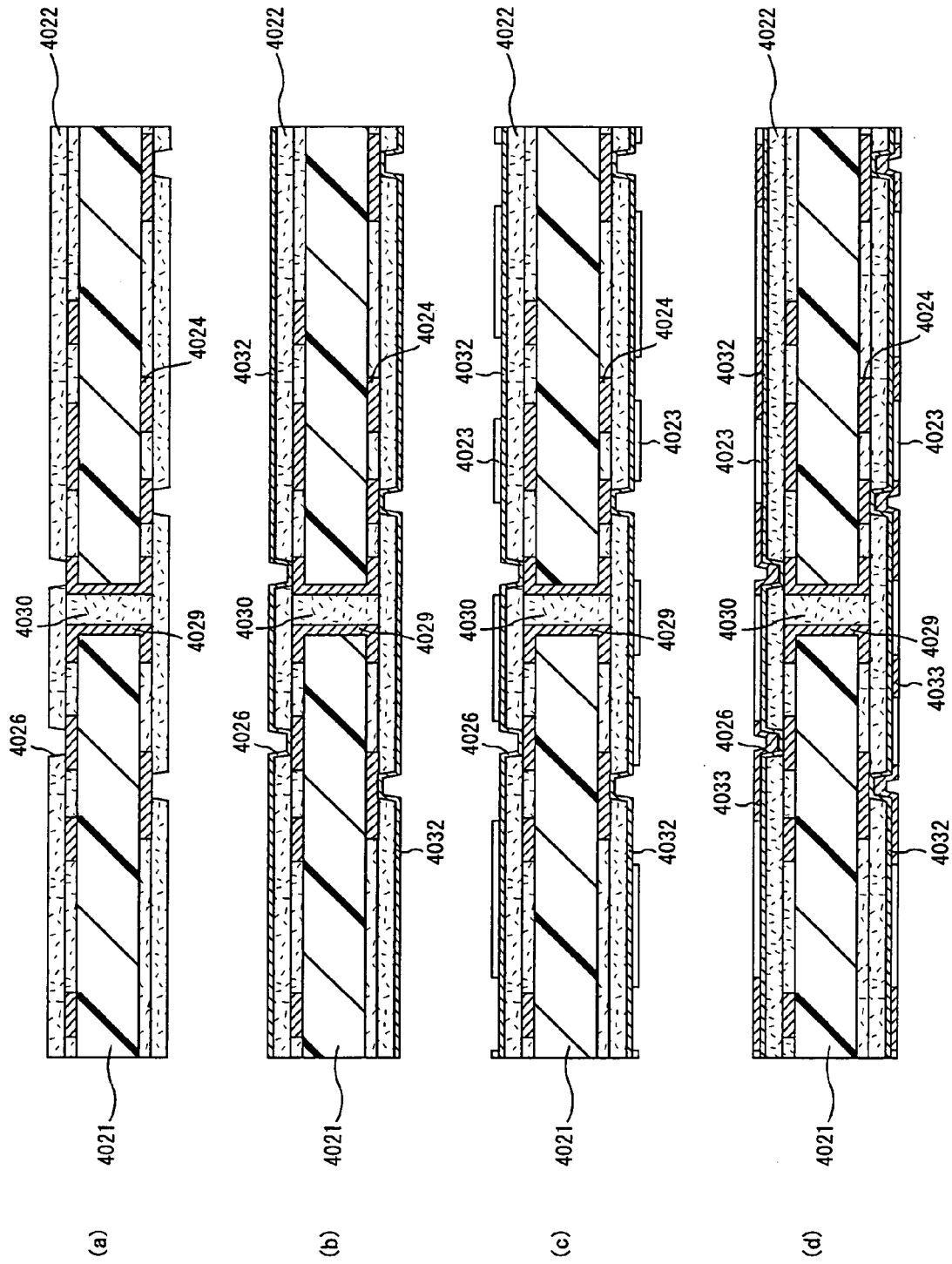
FIG. 52 is a cross-sectional view schematically showing part of steps of manufacturing a substrate for mounting an IC chip that constitutes the device for optical communication according to the first aspect of the fourth group of the present invention.

(see FIG. 52(a)).

(8) The substrate in which the openings for via-holes 4026 were formed was immersed in a solution containing 60 g/l of permanganic acid at 80° C. for 10 minutes to dissolve and remove epoxy resin particles existing on the surfaces of the interlaminar resin insulating layers 4022, thus forming the roughened faces (not shown) on the interlaminar insulating layers 4022 including the inner wall faces of the openings for via-holes 4026.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth: 3 μm), whereby a catalyst core was attached to the surfaces of the interlaminar insulating layers 4022 (including the inner wall faces of the openings for via-holes 4026) (not shown). That is, the catalyst was attached by immersing the substrate in a catalytic solution containing palladium chloride ($PdCl_2$) and stannous chloride ($SnCl_2$) to precipitate palladium metal.

(10) Next, the substrate was immersed in an electroless copper plating solution having the following composition to form an electroless copper plating film 4032 having a thickness of 0.6 to 3.0 μm on the surface of each interlaminar insulating layer 4022 (including the inner wall faces of the openings for via-holes 4026) (see FIG. 52(b)).

[Electroless Plating Solution]

| | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. liquid temperature and 40 minutes

(11) Next, a commercially available photosensitive dry film was bonded to the substrate on which the electroless copper plating films 4032 were formed, a mask was put thereon and exposure with 100 mJ/$cm^2$ and development with an aqueous 0.8% sodium carbonate solution were carried out, thereby forming plating resists 4023 each having a thickness of 20 μm (see FIG. 52(c)).

(12) Next, the substrate was washed with water at 50° C. to be degreased, washed with water at 25° C., and further washed with sulfuric acid. Thereafter, the substrate was subjected to electroplating under the following conditions to thereby form an electroplating copper film 4033 in non plating resist 4023 formed areas (see FIG. 52(d)).

[Electroplating Solution]

| | |
|---|---|
| Sulfuric acid | 2.24 mol/l |
| Copper sulfate | 0.26 mol/l |
| Additive | 19.5 ml/l |
| (Cupracid GL made by Atotech Co.) | |

[Electroplating Conditions]

| | |
|---|---|
| Current density | 1 A/$dm^2$ |
| Time | 65 minutes |
| Temperature | 22 ± 2° C. |

Figure 53:
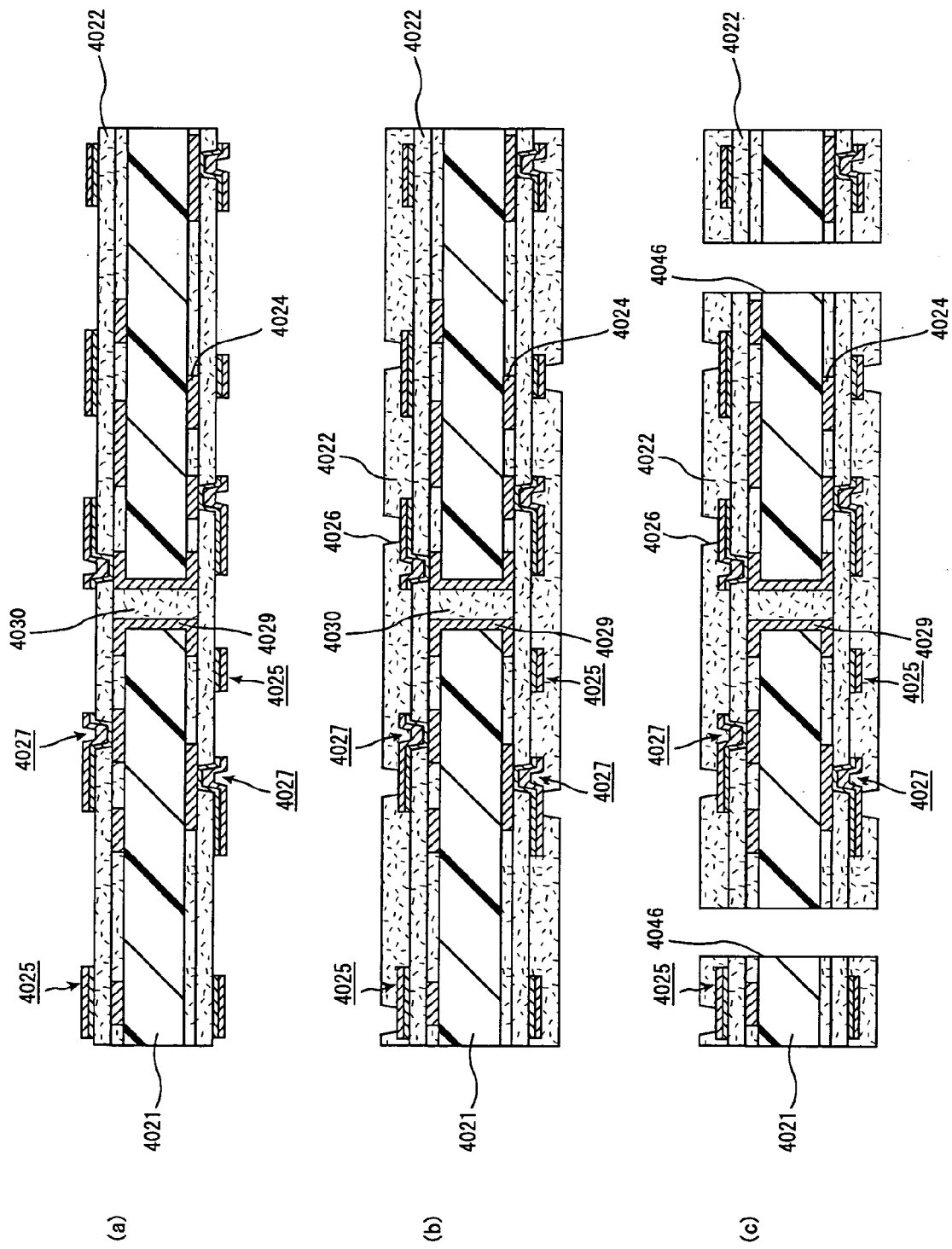
FIG. 53 is a cross-sectional view schematically showing part of the steps of manufacturing the substrate for mounting an IC chip that constitutes the device for optical communication according to the first aspect of the fourth group of the present invention.

(13) After peeling off the plating resists 4023 with 5% NaOH, the electroless plating film under the plating resist 4023 was etched, dissolved and removed with a solution mixture of sulfuric acid and hydrogen peroxide, thus forming conductor circuits 4025 (including via-holes 4027) each composed of the electroless copper plating film 4032 and the electroplating copper film 4033 and having a thickness of 18 μm (see FIG. 53(*a*)).

(14) Further, using the same etchant as that used in the step (5), roughened faces (not shown) were formed on the surfaces of the conductor circuits 4025, and the interlaminar insulating layer 4022 having the openings for via-holes 4026 and having a roughened face (not shown) formed on the surface thereof was then built up in an alternate fashion and in repetition similarly to the steps (6) to (8) (see FIG. 53(*b*)).

Thereafter, using a drill having a diameter of 300 μm, through holes for optical paths 4046 penetrating the substrate 4021 and the interlaminar insulating layers 4022 were formed. Further, a desmear treatment was conducted to the wall faces of the through holes for optical paths 4046 (see FIG. 53(*c*)). In this example, the through holes for optical paths were formed using the drill having a diameter of 300 μm. However, when a through hole for an optical path is formed, it normally suffices to use a drill having a diameter of about 200 to 400 μm.

Figure 54:
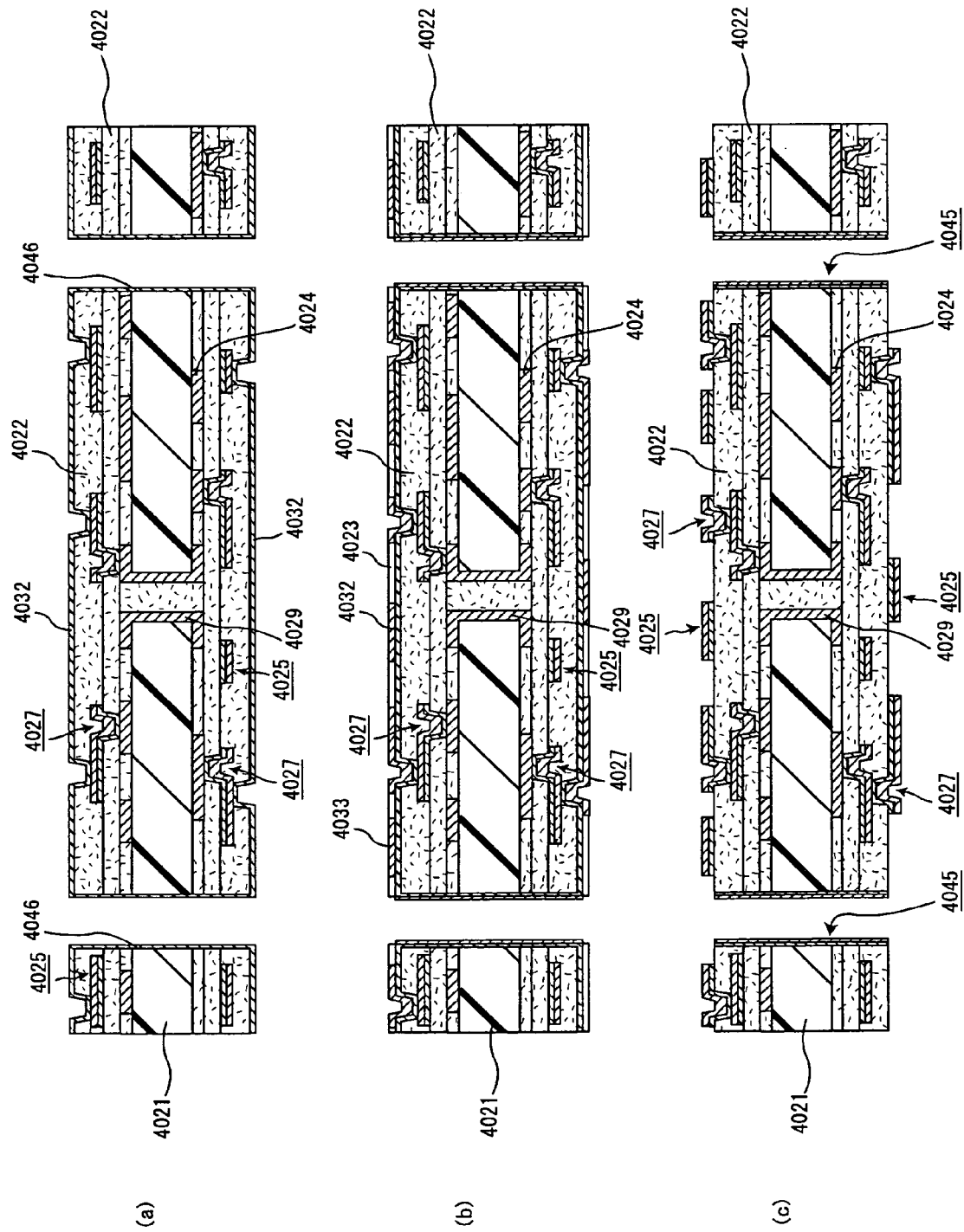
FIG. 54 is a cross-sectional view schematically showing part of the steps of manufacturing the substrate for mounting an IC chip that constitutes the device for optical communication according to the first aspect of the fourth group of the present invention.

(15) Next, a catalyst was attached to the wall faces of the through holes for optical paths 4046 and the surfaces of the interlaminar insulating layers 4022 using the same method as that used in the step (9), and the substrate was immersed in the same electroless copper plating solution as that used in the step (10), thereby forming a thin film conductor layer (electroless copper plating film) 4032 on the surface of the interlaminar insulating layer 4022 (including the inner wall faces of the openings for via-holes 4026) and the wall faces of the through holes for optical paths 4046 (see FIG. 54(*a*)).

(16) Next, a plating resist 4023 was provided by the same method as that used in the step (11) and a copper electroplating film 4033 having a thickness of 20 μm was formed in non plating resist 4023 formed areas by the same method as that used in the step (12) (see FIG. 54(*b*)).

(17) Next, using the same method as that used in the step (13), the plating resist 4023 was peeled off and the thin film conductor layer under the plating resist 4023 was removed, thereby forming conductor circuits 4025 (including via-holes 4027) and a conductor layer 4045.

Furthermore, using the same method as that used in the step (2), an oxidizing-reducing treatment was carried out, thereby forming roughened faces (not shown) on the surfaces of the conductor circuits 4025 and the surface of the conductor layer 4045 (see FIG. 54(*c*)).

(18) Next, the resin composition containing epoxy resin was filled into each through hole for an optical path 4046 in which the conductor layer 4045 was formed using the squeegee, the resin composition was dried and the surface layer of the resin composition was flattened by buff grinding. Further, a curing treatment was conducted to the resin composition, thereby forming a resin layer for an optical path 4042 (see FIG. 55(*a*)).

(19) Next, a solder resist composition was prepared similarly to the step (19) in Example 1.

Figure 55:
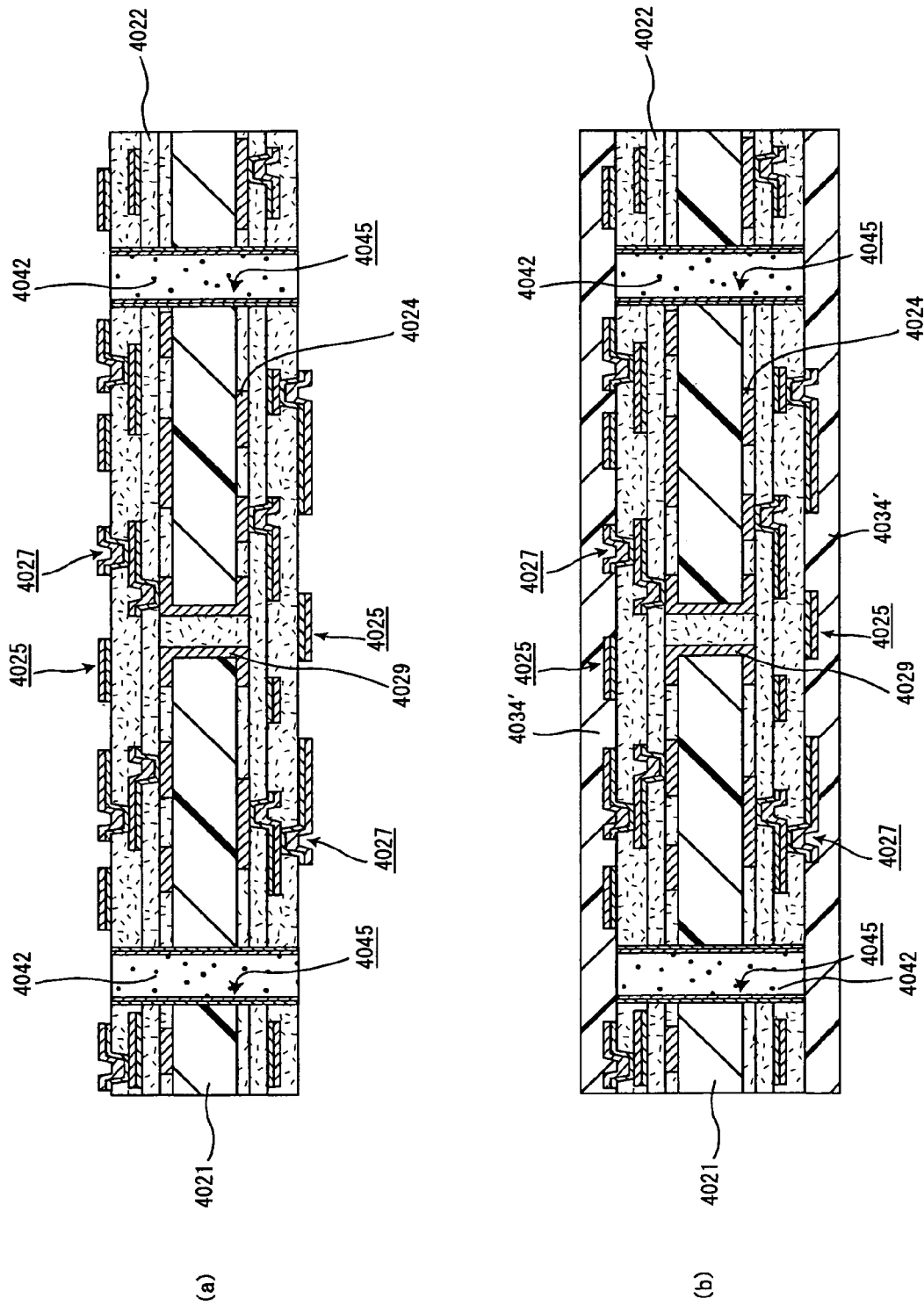
FIG. 55 is a cross-sectional view schematically showing part of the steps of manufacturing the substrate for mounting an IC chip that constitutes the device for optical communication according to the first aspect of the fourth group of the present invention.

(20) Next, the solder resist composition was applied by 30 μm thickness to both faces of the substrate on which the interlaminar insulating layers 4022 and the conductor circuits 4025 (including the via-holes 4027) were formed and dried under conditions of 70° C. for 20 minutes and 70° C. for 30 minutes, thereby forming a solder resist composition layer 4034' (see FIG. 55(*b*)).

(21) A 5 mm-thick photomask on which patterns openings for optical paths and openings for forming solder bumps (openings for mounting IC chips and openings for mounting optical elements) was drawn was closely stuck to the solder resist composition layer 4034' on the IC chip mounting side, exposed with UV rays of 1000 mJ/cm² and developed with a DMTG solution, thereby forming openings.

Further, heat treatments were conducted under conditions of 80° C. for 1 hour, 100° C. for 1 hour, 120° C. for 1 hour and 150° C. for 3 hours, respectively, to cure the solder resist composition layer, thereby forming a solder resist layer 4034 having openings for optical paths 4031, openings for forming solder bumps 4035 and a thickness of 20 μm.

Figure 56:
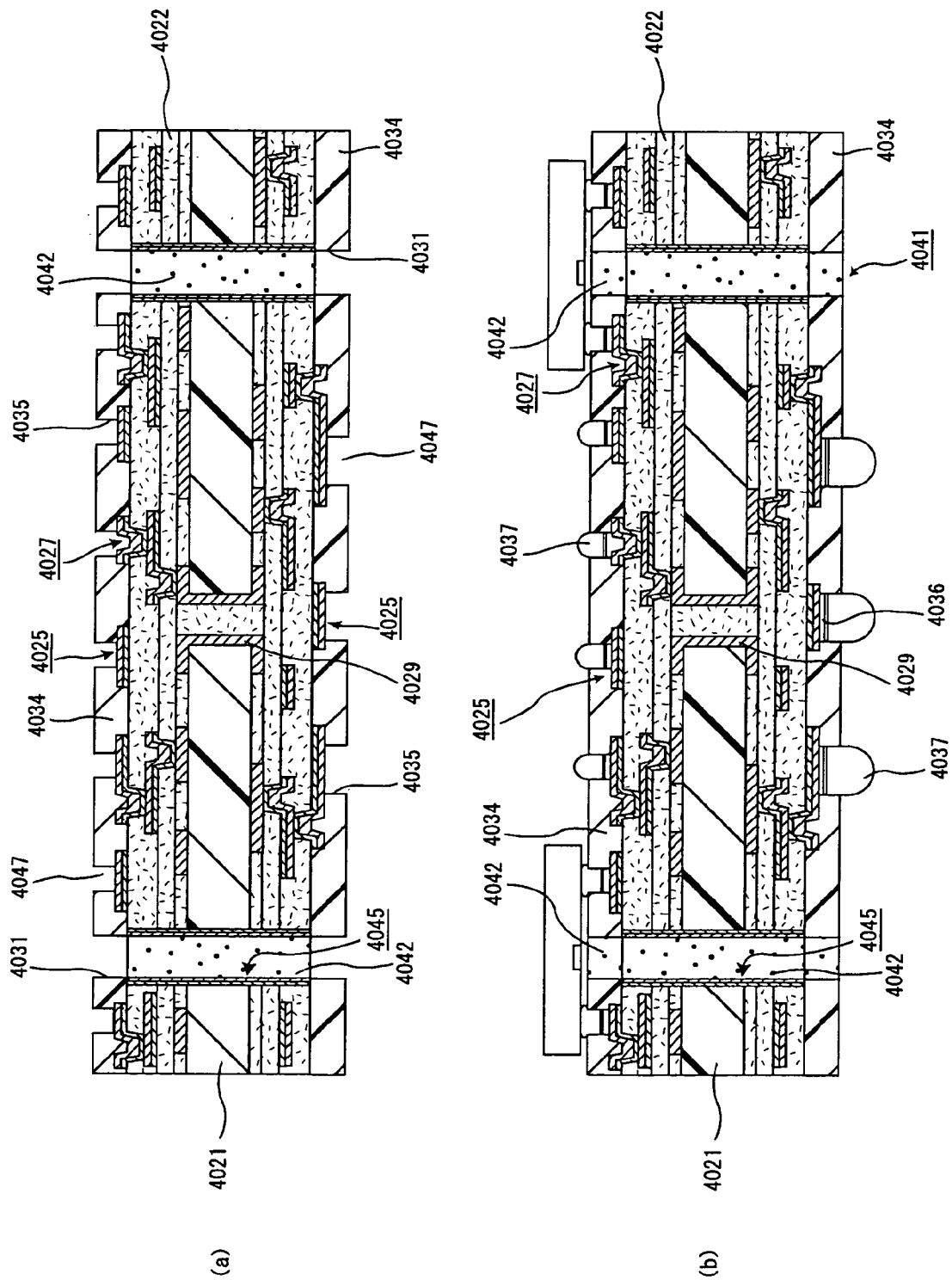
FIG. 56 is a cross-sectional view schematically showing part of the steps of manufacturing the substrate for mounting an IC chip that constitutes the device for optical communication according to the first aspect of the fourth group of the present invention.

Furthermore, a photomask on which a pattern of openings for forming solder bumps (openings for connecting multilayered printed circuit boards) was drawn was closely stuck to the other solder resist composition layer and exposure and development treatments were conducted to the photomask under the same conditions as the exposure and development conditions, thereby forming openings 4035 for forming solder bumps 4035 for connecting the substrate for mounting an IC chip to the multilayered printed circuit board (see FIG. 56(*a*)).

(22) Next, the same resin composition as the epoxy resin-containing resin composition filled in the step (18) was filled into each opening for an optical path formed in the step (21) using the squeegee and dried and, then, the surface layer of the resin composition was flattened by buff grinding. Moreover, a curing treatment was conducted thereto, thereby forming a resin layer for an optical path 4042.

It is noted that the resin layer for an optical path formed in this step and the step (18) had a transmissivity of 85%/mm and a refractive index of 1.60.

(23) Next, the substrate on which the solder resist layers 4034 were formed was immersed in an electroless nickel plating solution having pH 4.5 and containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, thereby forming a 5 μm-thick nickel plated layer in the openings for forming solder bumps 4035 and the optical element openings 4031. Further, the resultant substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, to form a 0.03 μm-thick gold plating layer on the nickel plated layer, thus obtaining solder pads 4036.

(24) Next, solder paste was printed in the openings for forming solder bumps 4035 formed in the solder resist layer 4034, a light receiving element 4038 and a light emitting element 4039 were attached thereinto while aligning the light receiving part 4038*a* of the light receiving element 4038 and the light emitting part 4039*a* of the light emitting element 4039, and reflow was conducted at 200° C., thereby mounting the light receiving element 4038 and the light emitting element 4039, forming solder bumps 4037 in the respective openings for mounting IC chips and openings for mounting multilayered printed circuit boards, thus obtaining a substrate for mounting an IC chip (see FIG. 56(*b*)).

As the light receiving element 4038, an optical element of InGaAs was used. As the light emitting element 4039, an optical element of InGaAsP was used.

B. Manufacturing of Multilayered Printed Circuit Board
B-1. Manufacturing of Resin Film for Interlaminar Resin Insulating Layer A resin film for an interlaminar insulating layer was prepared using the same method as that used in A-1.

B-2. Preparation of Resin Composition for Filling Through Hole

A resin composition for filling a through hole was prepared using the same method as that used in A-2.

B-3. Manufacturing of Multilayered Printed Circuit Board (1) A copper-clad laminated board composed of an insulating substrate 4001 made of a 0.6 mm-thick glass epoxy resin or BT resin, with a 18 μm-thick copper foil 4008 laminated on both faces of the substrate 4001 was used as a starting material (see FIG. 57(a)). First, the copper-clad laminated board was drilled to bore holes and, then, an electroless plating treatment was carried out and pattern etching was carried out to form conductor circuits 4004 and a plated-through hole 4009 on both faces of the substrate 4001 (see FIG. 57(b)).

(2) The substrate having the plated-through hole 4009 formed therein and the conductor circuits 4004 formed thereon was washed with water and dried, then etchant (made by Meck Co.; Meck etch bond) was sprayed to the substrate, thereby forming roughened faces (not shown) on the surfaces of the conductor circuits 4004 including the plated-through hole 4009.

(3) After the resin filler described in B-2 was prepared, a layer of resin filler 4010' was formed inside the plated-through hole 4009, non conductor formed areas and the peripheral parts of the conductor circuits 4004 on the substrate 4001 by the following method within 24 hours after the preparation.

That is, first, the resin filler was pushed in the plated-through hole using a squeegee and then dried under conditions of 100° C. for 20 minutes. Next, a mask having openings corresponding to the non conductor formed areas was put on the substrate, and the resin filler was also filled into the concave non conductor formed areas using the squeegee and dried under conditions of 100° C. for 20 minuets, thereby forming the layer of resin filler 4010' (see FIG. 57(c)).

(4). One face of the substrate for which the treatment (3) was just finished was ground by belt sander grinding using #600 belt grinding paper (made by Sankyo Chemical Engineering Co.) so as not to leave the resin filler 4010' on the surfaces of the conductor circuits 4004 and the land surface of the plated-through hole 4009 and, then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 4010.

Figure 57:
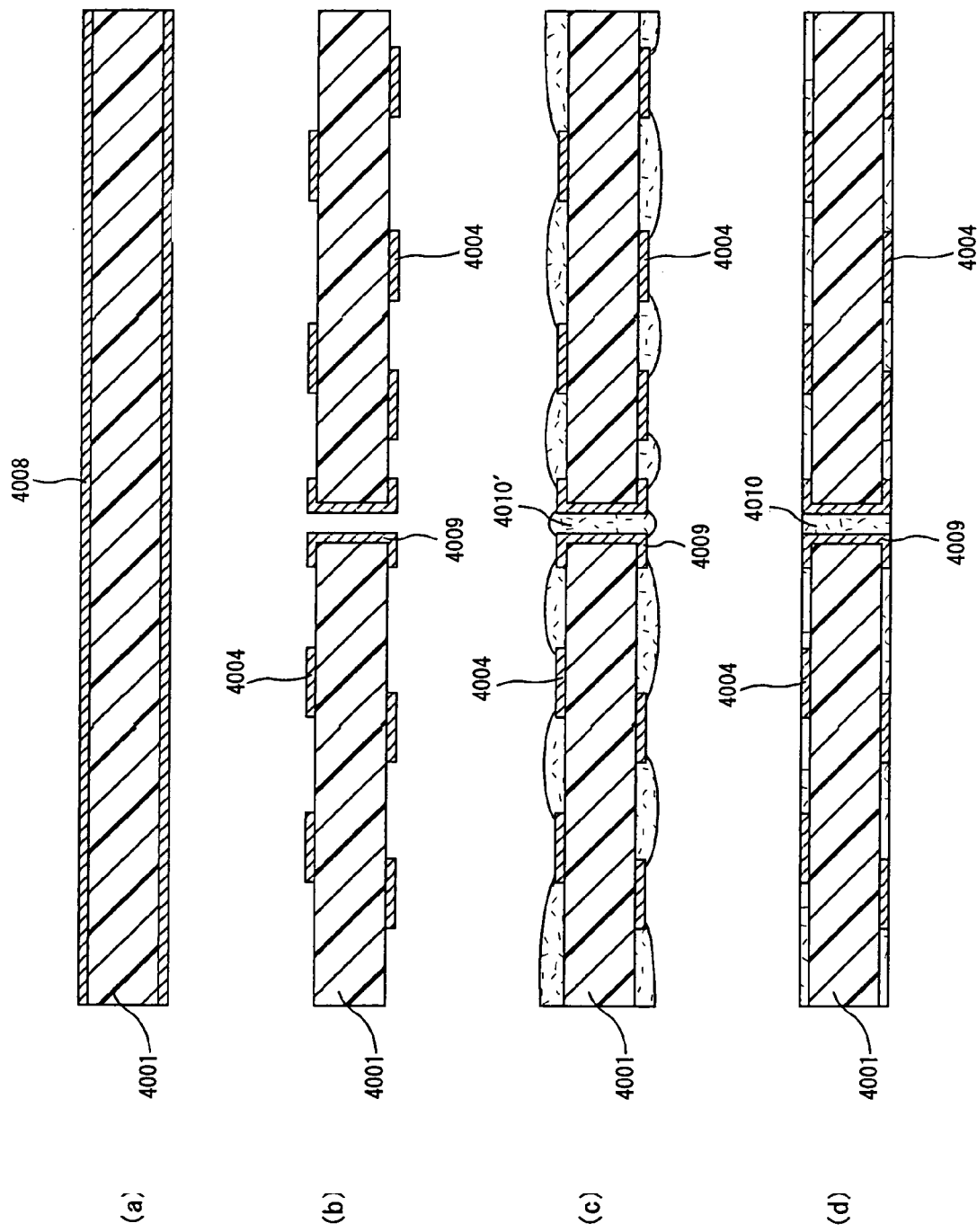
FIG. 57 is a cross-sectional view schematically showing part of steps of manufacturing a multilayered circuit board that constitutes the device for optical communication according to the first aspect of the fourth group of the present invention.

In such a manner, the surface layer part of the resin filler 4010 formed in the plated-through hole 4009 and the non conductor formed areas, the surfaces of the conductor circuits 4004 were flattened, thus obtaining an insulating substrate wherein: the resin filler 4010 and the side faces of the conductor circuits 4004 were firmly stuck to each other through the roughened faces; and the inner wall face of the plated-through hole 4009 and the resin filler 4010 were also firmly stuck to each other through the roughened face (see FIG. 57(d)). By this step, the surface of the resin filler layer 4010 was flush with the surfaces of the conductor circuits 4004.

(5) After the substrate was washed with water and degreased with an acid, soft etching was carried out and etchant was sprayed on both faces of the substrate to etch the surfaces of the conductor circuits 4004 and the land surface and inner wall of the plated-through hole 4009, thereby forming roughened faces (not shown) on the entire surfaces of the conductor circuits 4004. As the etchant, Meck etch bond made by Meck Co. was used.

(6) Next, a resin film for an interlaminar resin insulating layer with a slightly larger size than that of the substrate produced in the B-1 was put on the substrate, temporarily pressure-bonded under conditions of 0.4 MPa pressure, 80° C. temperature, and 10-second pressure bonding period and cut. Thereafter, the film was bonded by the following method using a vacuum laminator device to thereby form an interlaminar resin insulating layer 4002 (see FIG. 58(a)). That is, the resin film for the interlaminar resin insulating layer was actually pressure-bonded on the substrate under conditions of 65 Pa degree of vacuum, 0.4 MPa pressure, 80° C. temperature and 60-second pressure bonding period, and the resin film was further thermally cured at 170° C. for 30 minutes.

(7) Next, openings for via-holes 4006 with 80 μm diameter were formed in the interlaminar insulating layers 4002 by a $CO_2$ gas laser of 10.4 μm wavelength through a 1.2 mm-thick mask having through holes therein in conditions of a beam diameter of 4.0 mm, a top hat mode, a pulse interval of 8.0 μs, 1.0 mm-diameter of the through holes of the mask and one shot. (see FIG. 58(b)).

(8) The substrate in which the openings for via-holes 4006 were formed was immersed in a solution containing 60 g/l of permanganic acid at 80° C. for 10 minutes to dissolve and remove epoxy resin particles existing on the surfaces of the interlaminar resin insulating layers 4022, thus forming the roughened faces (not shown) on the surfaces of the interlaminar insulating layers 4002 including the inner wall faces of the openings for via-holes 4006.

(9) Next, the substrate completed with the treatment was immersed in neutralizer (made by Shiplay Co., Inc.) and washed with water.

Further, a palladium catalyst was attached to the surface of the substrate subjected to the roughening treatment (roughening depth of 3 μm), whereby a catalyst core was attached to the surfaces of the interlaminar insulating layers 4002 (including the inner wall faces of the openings for via-holes 4006) (not shown). That is, the catalyst was attached by immersing the substrate in a catalytic solution containing palladium chloride ($PdCl_2$) and stannous chloride ($SnCl_2$) to precipitate palladium metal.

Figure 58:
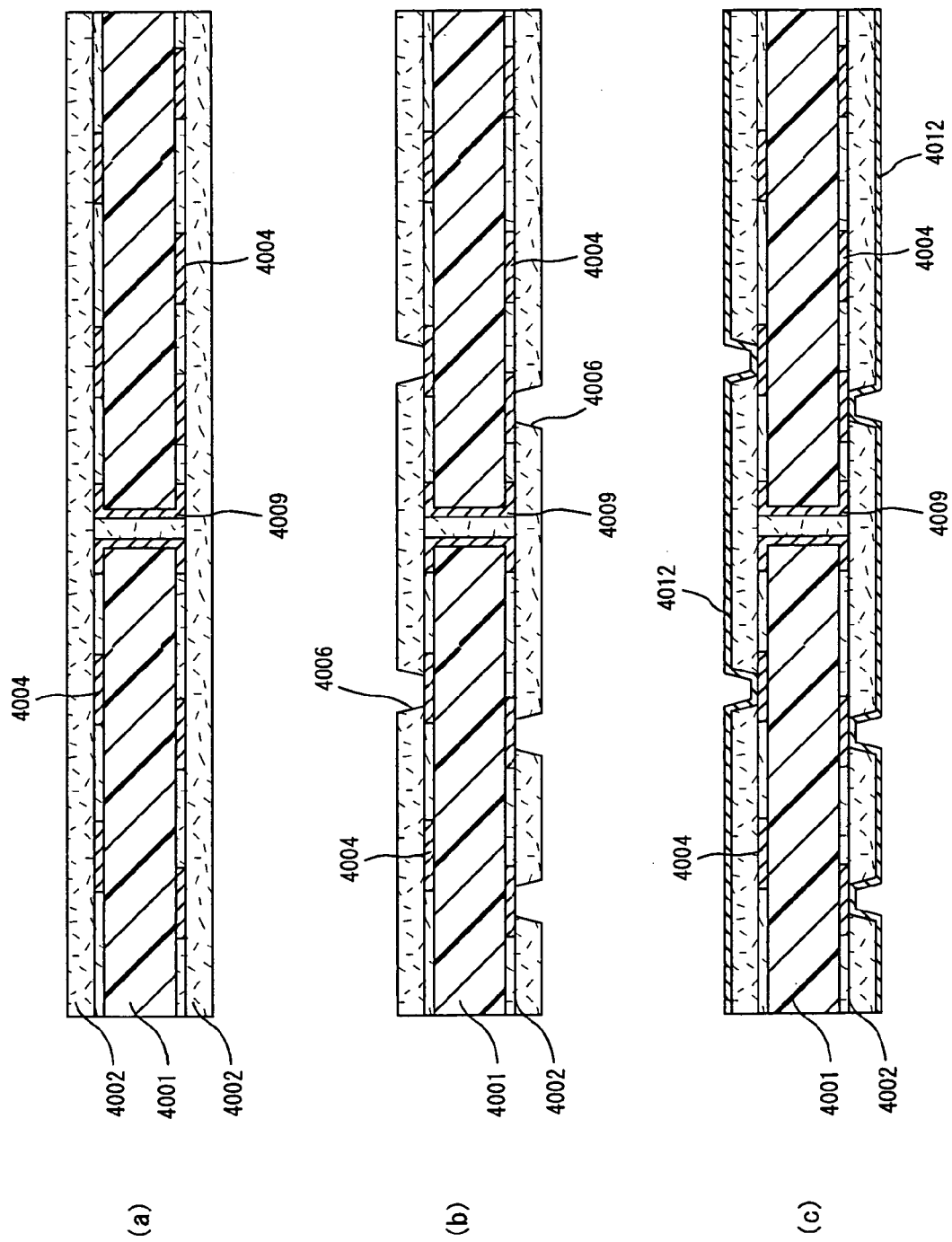
FIG. 58 is a cross-sectional view schematically showing part of the steps of manufacturing the multilayered circuit board that constitutes the device for optical communication according to the first aspect of the fourth group of the present invention.

(10) Next, the substrate was immersed in an electroless copper plating solution to form a electroless copper plating film 4012 having a thickness of 0.6 to 3.0 μm on the surface of each interlaminar insulating layer 4002 (including the inner wall faces of the openings for via-holes 4006) (see FIG. 58(c)).

It is noted that the used electroless plating solution and the electroless plating conditions were the same as those in the step (10) in the manufacturing of the substrate for mounting an IC chip.

(11) The substrate on which the electroless plating films 4012 were formed was washed with water and electroplating was then carried out, thereby forming an electroless copper plating film 4013 having a thickness of 20 μm entirely on each electroless plating film 4012 (see FIG. 59(a)).

It is noted that the used electroplating solution and the electroplating conditions were the same as those in the step (12) in the manufacturing of the substrate for mounting an IC chip.

(12) Next, a commercially available photosensitive dry film was bonded to the substrate on which the electroless copper plating films 4013 were formed, a mask was put there on and exposure with 100 mJ/cm² and development with an aqueous 0.8% sodium carbonate solution were carried out, thereby forming an etching resist 3 (see FIG. 59(b)).

Figure 59:
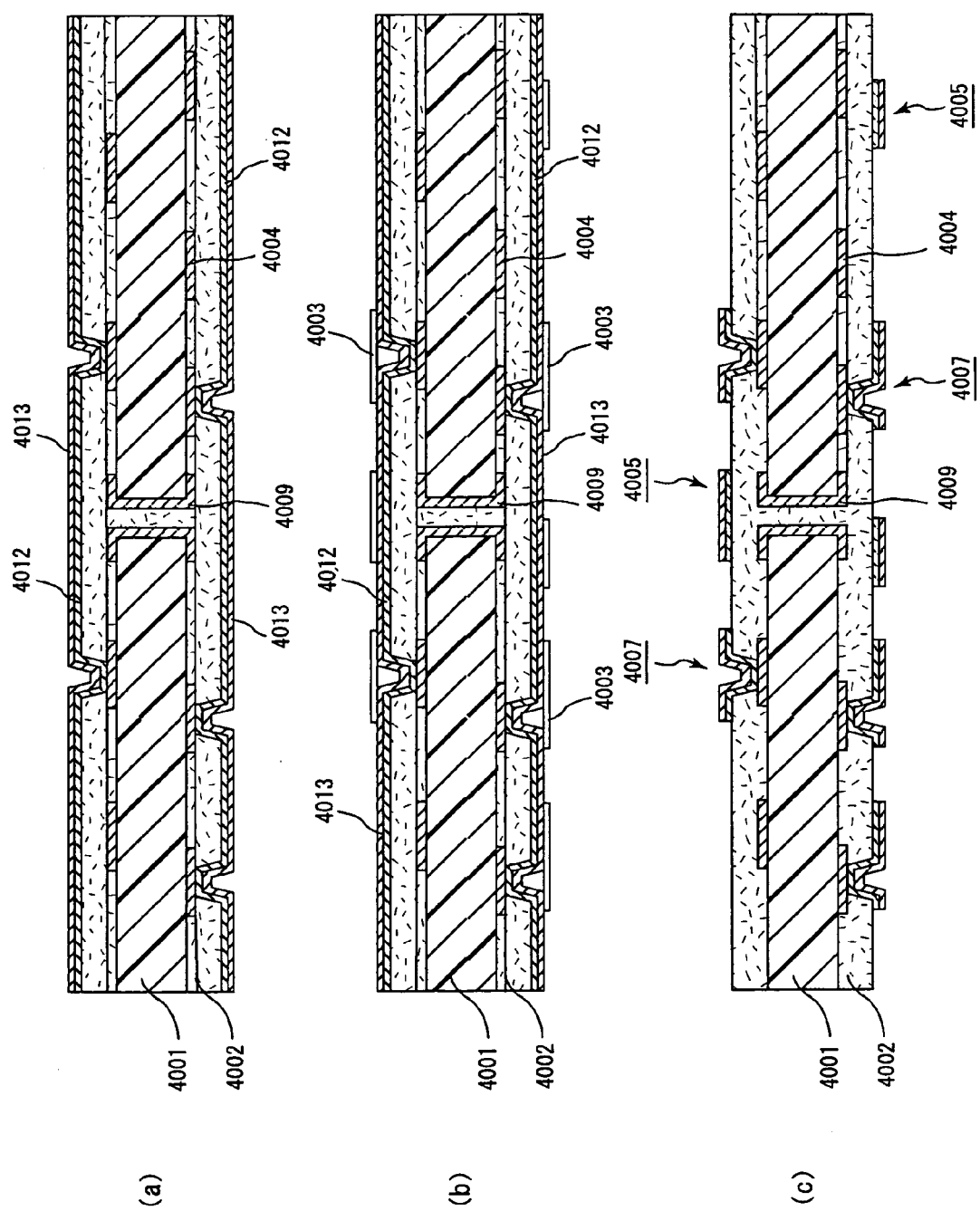
FIG. 59 is a cross-sectional view schematically showing part of the steps of manufacturing the multilayered circuit board that constitutes the device for optical communication according to the first aspect of the fourth group of the present invention.

(13) Next, the electroplating copper film and the electroless plating film under the non etching resist formed areas were etched with a solution mixture of sulfuric acid and hydrogen peroxide to thereby dissolve and remove these films, and the etching resist was peeled off with 5% NaOH solution, thereby forming conductor circuits 4007 (including the via-holes 4005) each composed of the electroless copper plating film 4012 and the electroplating copper film 4013 (see FIG. 59(*c*)).

Further, using etchant (Meck etch bond), roughened faces (not shown) were formed on the surface of the respective conductor circuits 4005 (including the via-holes 7).

Figure 60:
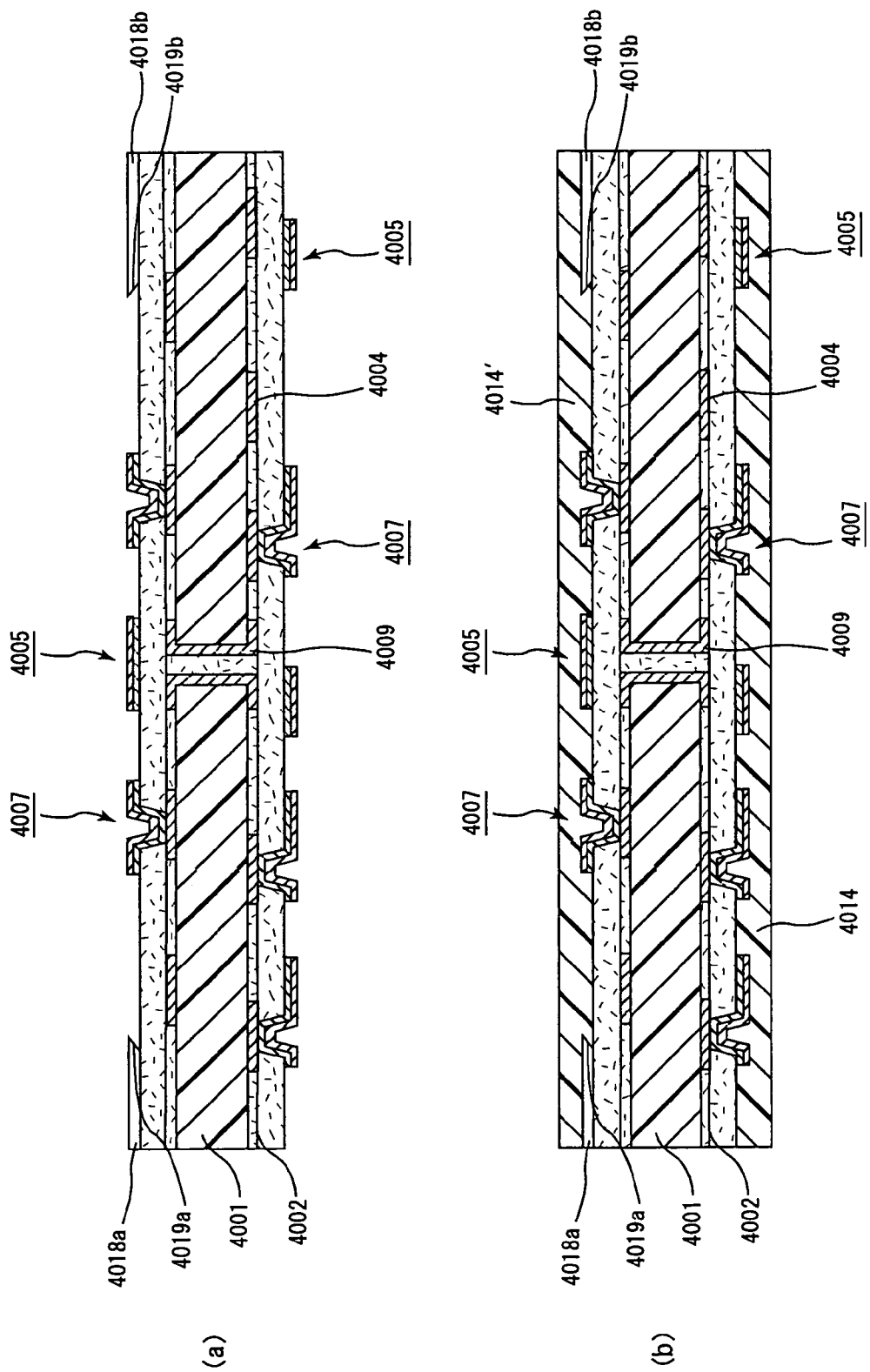
FIG. 60 is a cross-sectional view schematically showing part of the steps of manufacturing the multilayered circuit board that constitutes the device for optical communication according to the first aspect of the fourth group of the present invention.

(14) Next, optical waveguides 4018 (4018*a*, 4018*b*) having optical path conversion mirrors 4019 (4019*a*, 4019*b*) were formed at predetermined positions on the surfaces of the interlaminar insulating layers 4002 by the following method, respectively (see FIG. 60(*a*)).

That is, a film-shaped optical waveguide (width: 25 μm, thickness: 25 μm) which was made of PMMA and on which 45°-optical conversion mirror 4019 was formed in advance using a diamond saw having a 90°-V-shaped tip end was bonded in such a manner that the side face of the optical waveguide on the other end to the non optical path conversion mirror formed side was aligned to the side face of the interlaminar insulating layer.

The bonding of each optical waveguide was performed by applying adhesive composed of thermosetting resin onto the bonded face of the optical waveguide to the interlaminar insulating layer by a thickness of 10 μm, pressure-bonding the adhesive and curing the adhesive at 60° C. for 1 hour.

In this example, curing was conducted under condition of 60° C./1 hour. In some cases, step curing may be conducted. When the step curing is conducted, no stress occurred due to the optical waveguide at the time of bonding the optical waveguide.

(15) Next, a solder resist composition was prepared similarly to the step (19) in the manufacturing of the substrate for mounting an IC chip, the solder resist composition was applied onto both faces of the substrate by a thickness of 35 μm and dried under conditions of 70° C. for 20 minutes and 70° C. for 30 minutes, thereby forming a solder resist layer 4014' (see FIG. 60(*b*)).

(16) Next, a 5 mm-thick photomask on which a pattern of openings for forming solder bumps (openings for connecting the multilayered printed circuit board to the substrate for mounting an IC chip) and openings for optical paths was drawn was closely stuck to the solder resist layer on one face of the substrate, exposed with UV rays of 1000 mJ/cm$^2$ and developed with a DMTG solution, thereby forming openings.

Figure 61:
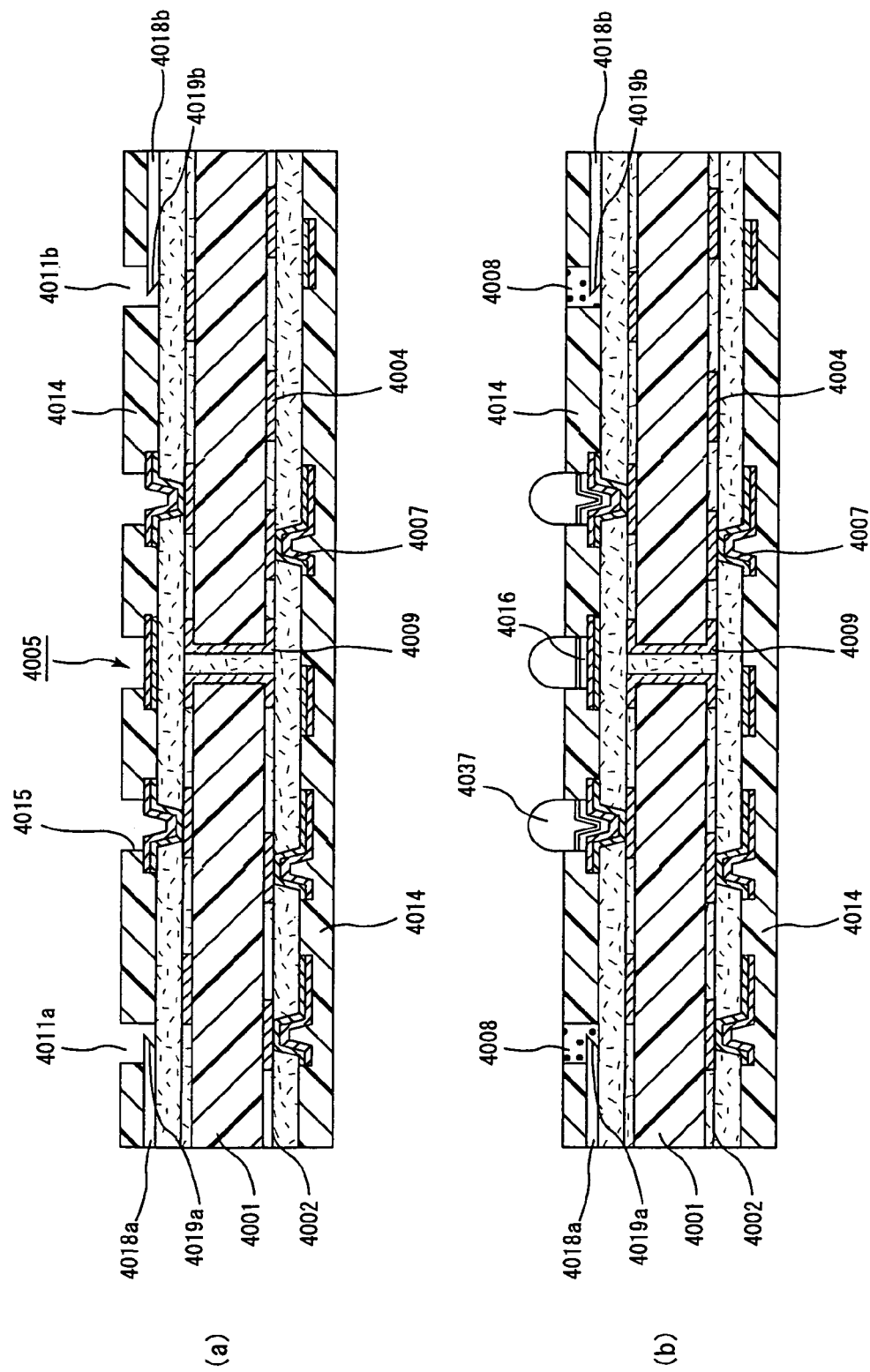
FIG. 61 is a cross-sectional view schematically showing part of the steps of manufacturing the multilayered circuit board that constitutes the device for optical communication according to the first aspect of the fourth group of the present invention.

Further, heat treatments were conducted under conditions of 80° C. for 1 hour, 100° C. for 1 hour, 120° C. for 1 hour and 150° C. for 3 hours, respectively, to cure the solder resist layer, thereby forming a solder resist layer 4014 having openings for forming solder bumps 4015, openings for optical paths 4011 (4011*a*, 4011*b*) and a thickness of 20 μm (see FIG. 61(*a*)).

(17) Next, similarly to the step (22) in the manufacturing of the substrate for mounting an IC chip, the filling, curing and the like of a resin composition containing epoxy resin were carried out, to form a resin layer for an optical path 4008 in each opening for an optical path. Further, similarly to the step (23) in the manufacturing of the substrate for mounting an IC chip, a nickel plated layer and a gold plating layer were formed, thereby obtaining solder pads 4016.

(18) Next, solder paste was printed in each of the openings for forming solder bumps 4015 formed in the solder resist layer 4014, and reflow was conducted at 200° C., thereby forming solder bumps 4017 in the respective openings for forming solder bumps 4015, thus obtaining a multilayered printed circuit board (see FIG. 61(*b*)).

C. Manufacturing of Device for IC Mounting Optical Communication

First, an IC chip was mounted on the substrate for mounting an IC chip manufactured through the steps in A and the IC chip was then sealed with resin, thereby obtaining a substrate for mounting an IC chip.

Next, this substrate for mounting an IC chip and the multilayered printed circuit board manufactured through the steps in B were disposed at predetermined positions to be confronting each other, respectively, and reflow was conducted at 200° C., thereby connecting the solder bumps of the substrate for mounting an IC chip and the multilayered printed circuit board to one another to form solder connection parts.

Next, a resin composition for sealing was filled between the multilayered printed circuit board and the substrate for mounting an IC chip which were connected through the solder connection parts and a curing treatment was conducted to the resin composition for sealing, thereby forming a sealing resin layer and thus obtaining a device for optical communication (see FIG. 49).

As the resin composition for sealing, a resin composition containing epoxy resin was used.

Further, the transmissivity of the formed sealing resin layer was 85%/mm and the refractive index thereof was 1.60.

EXAMPLE 72

A device for optical communication was manufactured similarly to Example 71 except that at the time of forming the resin layer for an optical path in each of the substrate for mounting an IC chip and the multilayered printed circuit board, a resin composition containing olefin resin was used to form a resin layer for an optical path having a transmissivity of 80%/mm and a refractive index of 1.58, and at the time of forming the sealing resin layer, a resin composition containing olefin resin as the resin composition for sealing was used to form a sealing resin layer having a transmissivity of 88%/mm and a refractive index of 1.58.

EXAMPLE 73

A device for optical communication was manufactured similarly to Example 71 except that after executing the step (23) in the manufacturing of the substrate for mounting an IC chip in Example 71, micro lenses were disposed on the end portion of the resin layer for an optical path on the side connected to the multilayered printed circuit board using the following method.

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 92%/mm and a refractive index of 1.62.

EXAMPLE 74

A device for optical communication was manufactured similarly to Example 72 except that after forming an resin layer for an optical path by executing the same step as the step (23) in the manufacturing of the substrate for mounting an IC chip in Example 71, micro lenses were disposed on the end portion of the resin layer for an optical path on the side connected to the multilayered printed circuit board using the following method in Example 72.

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 92%/mm and a refractive index of 1.62.

EXAMPLE 75

A device for optical communication was manufactured similarly to Example 71 except that after executing the same step as the step (23) in the manufacturing of the substrate for mounting an IC chip in Example 71, micro lenses were disposed on the end portion of the resin layer for an optical path on the side connected to the multilayered printed circuit board using the following method and that at the time of forming the sealing resin layer, a resin composition containing acrylic resin was used.

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 85%/mm and a refractive index of 1.60.

It is noted that the sealing resin layer formed herein had a transmissivity of 85%/mm and a refractive index of 1.50.

EXAMPLE 76

A device for optical communication was manufactured similarly to Example 72 except that after forming a resin layer for an optical path by executing the same step as the step (23) in the manufacturing of the substrate for mounting an IC chip in Example 71, micro lenses were disposed on the end portion of the resin layer for an optical path on the side connected to the multilayered printed circuit board using the following method, and that at the time of forming the sealing resin layer, a resin composition containing acrylic resin was used.

That is, a resin composition containing epoxy resin was dropped onto the end portion of the resin layer for an optical path using a dispenser and a curing treatment was then conducted to the resin composition, thereby forming each micro lens. It is noted that the micro lens formed herein had a transmissivity of 92%/mm and a refractive index of 1.62.

It is noted that the sealing resin layer formed herein had a transmissivity of 85%/mm and a refractive index of 1.50.

EXAMPLE 77

A device for optical communication was manufactured similarly to Example 71 except that, at the time of forming the optical waveguides, the optical waveguide that has opening for forming a solder bump and has an optical path conversion mirror formed thereon were formed to cover the outermost interlaminar insulating layer using the following method in the step (14) in the manufacturing of the multilayered printed circuit board in Example 71.

A method of forming optical waveguides covering the entire interlaminar insulating layer will be described. PMMA for forming a lower cladding was first applied to a predetermined position on the outermost interlaminar insulating layer to form a film and the resultant film was thermally cured, thereby forming a lower cladding. Thereafter, PMMA for forming a core was applied onto the lower cladding to form a film and the resultant film was thermally cured, thereby forming a core layer. Thereafter, a resist was applied onto the surface of the core layer, a resist pattern was formed by photolithography and patterning was carried out into core shape by reactive ion etching, thereby forming a core on the lower cladding.

Thereafter, a 45°-optical path conversion mirror was formed on one end of the lower cladding and core by machining.

Next, PMMA for forming an upper cladding was applied entirely onto the interlaminar insulating layer to cover the lower cladding and core and thermally cured, thereby forming an upper cladding entirely on the interlaminar insulating layer.

It is noted that the PMMA for forming a lower cladding and the PMMA for forming an upper cladding were equal in composition.

Through these steps, the optical waveguides were formed entirely on the outermost interlaminar insulating layer.

Thereafter, openings for forming solder bumps were formed on the optical waveguides by a laser treatment.

EXAMPLE 78

A device for optical communication was manufactured similarly to Example 71 except that the positions of the optical waveguides formed on the multilayered printed circuit board were on the outermost interlaminar insulating layer on the opposite side to the side confronting the substrate for mounting an IC chip across the substrate and that optical paths for transmitting optical signal were formed so as to be able to transmit optical signal between the optical waveguides and the optical elements mounted on the substrate for mounting an IC chip.

The multilayered printed circuit board having the above-mentioned configuration was formed through the following steps (1) to (7).

That is, (1) similarly to (1) to (8) in B-3. Manufacturing of multilayered printed circuit board in Example 71, conductor circuits and interlaminar insulating layers having openings for via-holes on both faces of a substrate were formed.

(2) Next, using a drill having a diameter of 300 μm, a through hole for an optical path penetrating the substrate and the interlaminar insulating layers was formed. Further, a desmear treatment was conducted to the wall face of the through hole for an optical path.

(3) Next, a catalyst was attached to the wall face of the through hole for an optical path and the surfaces of the interlaminar insulating layers using the same method as that used in the step (9) in B-3 of Example 71. Further, the substrate was immersed in the same electroless copper plating solution as that used in the step (10) in B-3 of Example 71, thereby forming a thin film conductor layer (electroless copper plating film) on the surface of the interlaminar insulating layer (including the inner wall faces of the openings for via-holes) and the wall face of the through hole for an optical path.

(4) Next, a plating resist was formed at a predetermined position on the thin film conductor layer by the same method as that used in the step (11) A-3. Manufacturing of substrate for mounting IC chip in Example 71. Further, an electroplating copper film was formed in non plating resist formed areas by the same method as that used in the step (12) in A-3.

(5) Next, using the same method as that used in the step (13) in A-3, the plating resist and the thin film conductor layer under the plating resist were removed, thereby forming independent conductor circuits and conductor layer. Furthermore, roughened faces were formed on the surfaces of the conductor circuits by conducting an oxidizing-reducing treatment.

(6) Next, the resin composition containing epoxy resin was filled into the through hole for an optical path in which the conductor layer was formed using the squeegee, the resin composition was dried and the surface layer of the resin composition was flattened by buff grinding. Further, a curing treatment was conducted to the resin composition, thereby forming a resin layer for an optical path.

(7) Next, using the same method as the step (14) in B-3 of Example 71, optical waveguides each having an optical path conversion mirror were formed at predetermined positions on the outermost interlaminar insulating layer on the opposite side to the side confronting the substrate for mounting an IC chip across the substrate.

Thereafter, by executing the same steps as the steps (15) to (18) in B-3, the multilayered printed circuit board was completed. At the time of forming openings for optical paths in the steps, the openings for optical paths were formed to communicate with the through holes for optical paths formed in the step (2).

For each of the devices for IC mounting optical communication in Examples 71 to 78 thus obtained, an optical fiber was attached to the exposed face of the optical waveguide, which is at the side confronting the light receiving element, from the side face of the multilayered printed circuit board, a detector was attached in place of the light receiving element, optical signal was transmitted through the optical fiber and the optical signal was detected by the detector. As a result, a desired optical signal was able to be detected, thus demonstrating that each of the devices for IC mounting optical communication manufactured in the examples had sufficiently satisfactory performance as a device for optical communication.

Furthermore, the waveguide loss between the light emitting element mounted on the substrate for mounting an IC chip and the optical waveguide confronting this light emitting element, which is formed on the multilayered printed circuit board was measured by the following method. As a result, the waveguide loss was 0.3 dB/cm or less, thus demonstrating that it was possible to sufficiently transmit optical signal.

The measurement of the waveguide loss was conducted by attaching an optical fiber to the end portion of the optical waveguide for light reception, attaching a power meter on the light emitting element-side end portion of the optical path for transmitting optical signal through the optical fiber, transmitting optical signal with a measured wavelength of 850 nm from the optical fiber attached to the optical waveguide, and detecting the optical signal transmitted through the optical waveguide for light reception and the optical path for transmitting optical signal using the power meter.

Moreover, in each of the devices for optical communication obtained in Examples 71 to 78, the positional deviation of the optical elements (light receiving element and light emitting element) and the optical waveguides from desired positions was hardly observed.

EXAMPLES 79 TO 85

Each of devices for optical communication was manufactured similarly to Example 71 except that the resin layer for an optical path was formed using the following method in each of the steps (18) and (22) in A-3 of Example 71.

That is, a resin composition obtained by adding pulverized silica having a particle size distribution of 0.1 to 0.8 μm to epoxy resin (refractive index: 1.53, transmissivity: 91%/mm, thermal expansion coefficient: 82 ppm) so that the silica content became the value shown in Table 15, was prepared and filled into the through hole for an optical path by screen printing. Herein, the resin composition was prepared to have a viscosity of 200000 cps (mP·s).

Next, the resin composition was cured under conditions of 120° C. for 1 hour and 150° C. for 2 hours.

Further, the same resin composition as that in the step (22) in the A-3 was filled into the opening for an optical path by screen printing, and a curing treatment was conducted to the resin composition under the same conditions as those mentioned above. Furthermore, the resin composition overflowing the opening for an optical path was removed by grinding using #3000 grinding paper and ground using alumina particles of 0.05 μm to flatten the surface layer of the resin composition, thereby obtaining the resin layer for an optical path.

In Example 79, no silica particles were added.

TABLE 15

|  | Content of pulverized silica (% by weight) | transmissivity (%/mm) | Thermal expansion coefficient (ppm) |
| --- | --- | --- | --- |
| Example 79 | 0 | 91 | 72 |
| Example 80 | 5 | 84 | 67 |
| Example 81 | 10 | 81 | 58 |
| Example 82 | 20 | 84 | 50 |
| Example 83 | 40 | 82 | 42 |
| Example 84 | 50 | 81 | 38 |
| Example 85 | 60 | 78 | 32 |

For each of the devices for optical communication in Examples 79 to 85 thus obtained, the filling property of the resin composition and the presence/absence of cracks on the resin layer for an optical path after a liquid-phase temperature cycle test were evaluated. The evaluation results are shown in Table 16.

The wire-bonding state was evaluated by observing the state of wires using a microscope after forming the resin layer for an optical path.

In addition, the filling property of the resin composition was evaluated by cutting the substrate for mounting an IC chip to cross the optical paths for transmitting optical signal using a cutter after forming the resin layer for an optical path and observing the cross section thereof.

Further, the liquid-phase temperature cycle test and the presence/absence of the occurrence of cracks were evaluated similarly to Example 7.

TABLE 16

|  | Filling property of resin composition | Liquid-phase temperature cycle | | |
| --- | --- | --- | --- | --- |
|  |  | 250 cycles | 500 cycles | 1000 cycles |
| Example 79 | ○ | ○ | ○ | Δ |
| Example 80 | ○ | ○ | ○ | Δ |
| Example 81 | ○ | ○ | ○ | ○ |
| Example 82 | ○ | ○ | ○ | ○ |
| Example 83 | ○ | ○ | ○ | ○ |
| Example 84 | ○ | ○ | ○ | ○ |
| Example 85 | Δ | ○ | ○ | ○ |
| Comparative Example | — | ○ | Δ | X |

Table 16 shows the results of Examples 79 to 85 and the evaluation result of optical signal transmission characteristic of the device for optical communication manufactured in the above-mentioned Comparative Example.

In Examples 80 to 85, pulverized silica particles were added to the resin filled layer for an optical path. The same experiments were conducted by using titania particles or alumina particles in place of the pulverized silica particles. With the thermal expansion coefficient slightly different, the same results were obtained for the liquid-phase temperature cycle test.

EXAMPLES 86 TO 94

Each of devices for optical communication was manufactured similarly to Example 71 except for the use of optical waveguides into which pulverized silica particles having a content shown in Table 17 were mixed in the step (14) in B-3 of Example 71.

In Examples 86 to 94, optical waveguides were formed using the same methods as those in Examples 17 to 25, respectively.

TABLE 17

|  | Content of pulverized silica (% by weight) | transmissivity (%/mm) | Thermal expansion coefficient (ppm) |
|---|---|---|---|
| Example 86 | 0 | 93 | 70 |
| Example 87 | 8 | 84 | 67 |
| Example 88 | 10 | 82 | 65 |
| Example 89 | 15 | 84 | 60 |
| Example 90 | 25 | 81 | 53 |
| Example 91 | 50 | 82 | 41 |
| Example 92 | 60 | 79 | 32 |
| Example 93 | 70 | 75 | 28 |
| Example 94 | 80 | 77 | 25 |

For each of the devices for optical communication in Examples 86 to 94 thus obtained, the presence/absence of the occurrence of cracks on the optical waveguides after a liquid-phase temperature cycle test were evaluated. The evaluation results are shown in Table 18.

The evaluation was made by the same evaluation method and evaluation standard as those of Example 17.

TABLE 18

|  | Liquid-phase temperature cycle | | |
|---|---|---|---|
|  | 250 cycles | 500 cycles | 1000 cycles |
| Example 86 | ○ | ○ | Δ |
| Example 87 | ○ | ○ | Δ |
| Example 88 | ○ | ○ | Δ |
| Example 89 | ○ | ○ | ○ |
| Example 90 | ○ | ○ | ○ |
| Example 91 | ○ | ○ | ○ |
| Example 92 | ○ | ○ | ○ |
| Example 93 | ○ | ○ | ○ |
| Example 94 | ○ | ○ | ○ |
| Comparative Example | ○ | Δ | X |

Table 18 shows the results of Examples 86 to 94 and the evaluation result of optical signal transmission characteristic of the device for optical communication manufactured in the above-mentioned Comparative Example.

In Examples 87 to 94, pulverized silica particles were added to the claddings constituting the respective optical waveguides. The same experiments were conducted by using titania particles or alumina particles in place of the pulverized silica particles. With the thermal expansion coefficient slightly different, the same results were obtained for the liquid-phase temperature cycle test.

Further, the optical waveguides formed in Examples 86 to 94 were optical waveguides for multi-mode. Even when devices for optical communication were manufactured similarly to Examples 86 to 94 by using optical waveguides for single-mode instead of the optical waveguides for multi-mode, a predetermined optical signal was able to be transmitted.

The optical waveguide for single-mode was formed as follows. Siloxane based resin (refractive index: 1.50, transmissivity: 93%/mm, thermal expansion coefficient: 115 ppm) was prepared as resin for forming a core and siloxane based resin (refractive index: 1.48, transmissivity: 93%/mm, thermal expansion coefficient: 141 ppm) was prepared as resin for forming a cladding. In addition, particles were added by a predetermined mixing quantity to the resin for forming a cladding, based on necessity. Using these resins, an optical waveguide for single-mode having the cross-sectional size of the core of 10×10 μm and the film thicknesses of the upper cladding and the lower cladding of 10 μm was obtained by the same method as that in Example 17.

Further, among the optical waveguides formed by such a method, the optical waveguide for single-mode having no particles mixed to the claddings had a transmission loss of 0.43 dB/cm for signal light having a wavelength of 1.33 m and a transmission loss of 0.84 dB/cm for signal light having a wavelength of 1.55 μm, and the optical waveguide for single-mode having 50% by weight of particles mixed to the claddings had a transmission loss of 0.41 dB/cm for signal light having a wavelength of 1.33 μm and a transmission loss of 0.82 dB/cm for signal light having a wavelength of 1.55 μm. The measurement of the transmission losses was made by the cut-back method.

The cladding having no particles mixed therein had a thermal expansion coefficient of 141 ppm, and the cladding having particles mixed therein by 50% by weight had a thermal expansion coefficient of 48 ppm. The optical waveguides were evaluated by conducting the liquid-phase temperature cycle test for the devices for optical communication using the optical waveguides for single-mode. The evaluation results were the same as those for Examples 86 to 94.

EXAMPLES 95 TO 101

Each of devices for optical communication was manufactured similarly to Example 71 except that the sealing resin layer was formed by the following method in the steps of C in Example 71.

That is, after connecting the substrate for mounting an IC chip to the multilayered printed circuit board through the solder bumps, a resin composition which was obtained by adding pulverized silica particles having a particle size distribution of 0.1 to 0.8 μm to epoxy based resin (transmissivity: 90%/mm, thermal expansion coefficient: 67 ppm) so that the mixing quantity of silica became the value shown in the following Table 19 and which was prepared to have a viscosity of 5000 cps (mP·s), was applied around the substrate for mounting an IC chip using a dispenser and left as it was thereafter, thereby causing the resin composition to infiltrate between the substrate for mounting an IC chip and the multilayered printed circuit board. Next, treatments were conducted at 120° C. for 1 hour and 150° C. for 2 hours to cure the resin composition, thereby obtaining a sealing resin layer. It is noted that the clearance between the substrate for mounting an IC chip and the multilayered printed circuit board was 300 μm.

In addition, no pulverized silica particles were added in Example 95.

TABLE 19

|  | Content of pulverized silica (% by weight) | transmissivity (%/mm) | Thermal expansion coefficient (ppm) |
|---|---|---|---|
| Example 95 | 0 | 90 | 67 |
| Example 96 | 10 | 82 | 56 |
| Example 97 | 20 | 82 | 46 |
| Example 98 | 50 | 81 | 32 |
| Example 99 | 60 | 80 | 30 |
| Example 100 | 70 | 82 | 27 |
| Example 101 | 80 | 80 | 24 |

For each of the devices for optical communication in Examples 95 to 101 thus obtained, the sealing property by the sealing resin layer and the presence/absence of the occurrence of cracks on the optical waveguides after a liquid-phase temperature cycle test were evaluated. The evaluation results are shown in Table 20.

The sealing property by the sealing resin layer was evaluated by the same evaluation method and evaluation standard as those in Example 26.

TABLE 20

|  | Sealing property by sealing resin layer | Liquid-phase temperature cycle | | |
|---|---|---|---|---|
|  |  | 250 cycles | 500 cycles | 1000 cycles |
| Example 95 | ○ | ○ | ○ | Δ |
| Example 96 | ○ | ○ | ○ | Δ |
| Example 97 | ○ | ○ | ○ | ○ |
| Example 98 | ○ | ○ | ○ | ○ |
| Example 99 | ○ | ○ | ○ | ○ |
| Example 100 | Δ | ○ | ○ | ○ |
| Example 101 | Δ | ○ | ○ | ○ |
| Comparative Example | — | ○ | Δ | X |

Table 20 shows the results of Examples 95 to 101 and the evaluation result of optical signal transmission characteristic of the device for optical communication manufactured in the above-mentioned Comparative Example.

Further, in Examples 96 to 101, pulverized silica particles were mixed into the sealing resin layer. The same experiments were conducted by using titania particles or alumina particles in place of the pulverized silica particles. With the thermal expansion coefficient slightly different, the same results were obtained for the sealing property by the sealing resin layer and the liquid-phase temperature cycle test.

Further, at the time of manufacturing devices for optical communication using the same methods as those used in Examples 95 to 101, the viscosity of the resin composition for forming the sealing resin layer was raised and the resin composition was left as it was for shorter time, thereby forming a sealing resin layer only in the vicinity of the outer periphery of the area put between the substrate for mounting an IC chip and the multilayered printed circuit board. In the device for optical communication having the above-mentioned configuration, a signal was transmitted between the substrate for mounting an IC chip and the multilayered printed circuit board through an air layer. In this case, no disadvantage occurred to the optical signal transmission.

Further, at the time of manufacturing the device for optical communication using the same methods as those of Examples 95 to 101, respectively, using the same resin composition as that used at the time of forming the sealing resin layer in each of Examples 95 to 101, the clearances between the optical elements: and solder resist layer; or optical paths for transmitting optical signal were sealed with resin. The liquid-phase temperature cycle tests were conducted under the same conditions as those mentioned above to observe the presence/absence of the occurrence of cracks on the resin that sealed the optical elements. As a result, after 250 cycles and 500 cycles, no cracks were observed. After 1000 cycles, when the optical elements were sealed with resin containing 20 to 80% by weight of pulverized silica particles, no cracks were observed. When the optical elements were sealed with resin containing no particles or resin containing 10% by weight of particles, some cracks occurred but optical signal was able to be transmitted through the resin which sealed the optical elements.

The resin sealing was conducted by applying resin around the optical elements using a dispenser, leaving the resin as it was to cause the resin to infiltrate into the clearances between the optical elements and the solder resist layer and the like, and then conducting a curing treatment.

EXAMPLES 102 TO 106

Each of devices for optical communication was manufactured similarly to Example 73 except that micro lenses were formed by the following method in the formation of the micro lenses in Example 73.

That is, a resin composition obtained by adding pulverized silica particles having a particle size distribution of 0.1 to 0.8 μm to epoxy based resin (transmissivity: 90%/mm, refractive index: 1.53) so that the mixing quantity of the silica became the value shown in the following Table 21 was applied using a dispenser, and a curing treatment was conducted while the resin composition became generally semispherical by the surface tension, thereby forming each micro lens. In Example 102, no pulverized silica particles were added.

TABLE 21

|  | Content of pulverized silica (% by weight) | transmissivity (%/mm) |
|---|---|---|
| Example 102 | 0 | 90 |
| Example 103 | 20 | 84 |
| Example 104 | 40 | 82 |
| Example 105 | 60 | 82 |
| Example 106 | 70 | 81 |

For each of the devices for optical communication in Examples 102 to 106 thus obtained, the application property of the resin composition at the time of forming micro lenses and the presence/absence of the occurrence of cracks on the micro lenses after a liquid-phase temperature cycle test were evaluated. The evaluation results are shown in Table 22. The application property at the time of forming the micro lenses, the liquid-phase temperature cycle test and the presence/absence of occurrence of cracks on the micro lenses after the test were evaluated similarly to Example 66.

TABLE 22

|  | Application property | Liquid-phase temperature cycle | | |
|---|---|---|---|---|
|  |  | 250 cycles | 500 cycles | 1000 cycles |
| Example 102 | ○ | ○ | ○ | ○ |
| Example 103 | ○ | ○ | ○ | ○ |
| Example 104 | ○ | ○ | ○ | ○ |
| Example 105 | ○ | ○ | ○ | ○ |

TABLE 22-continued

| | Application property | Liquid-phase temperature cycle | | |
|---|---|---|---|---|
| | | 250 cycles | 500 cycles | 1000 cycles |
| Example 106 | Δ | ◯ | ◯ | ◯ |
| Comparative Example | — | ◯ | Δ | X |

Table 22 shows the results of Examples 102 to 106 and the evaluation result of optical signal transmission characteristic of the device for optical communication manufactured in the above-mentioned Comparative Example.

In Examples 103 to 106, pulverized silica particles were mixed into the resin composition that constitutes micro lenses.

The same experiments were conducted by using titania particles or alumina particles in place of the pulverized silica particles. With the thermal expansion coefficient slightly different, the same results were obtained for the application property and the liquid-phase temperature cycle test.

EXAMPLE 107

A. Manufacturing of Resin Film

A resin film was manufactured using the same method as the steps in A in Example 1.

B. Preparation of Resin Composition for Filling Through Hole

A resin composition for filling a through hole was prepared using the same method as the steps in B in Example 1.

C. Substrate

As a substrate, an insulating substrate made of 0.8 mm-thick glass epoxy resin or BT (bismaleimide-triazine) resin was used.

D. Manufacturing of Optical Waveguide

Next, optical waveguides each having an optical path conversion mirror were manufactured using the following method.

That is, a 45°—the optical conversion mirror was formed on one end of a film-shaped optical waveguide (made by Micro Parts Co.; width: 1 mm, thickness: 20 μm) which was made of PMMA using a diamond saw having a 90°-V-shaped tip end.

E. Manufacturing of Lamination (1) A copper-clad laminated board composed of an base material layer 5031 formed by thermally curing the resin film described in the A at 170° C. for 30 minutes, with a 18 μm-thick copper foil 5028 laminated on both faces of the base material layer 5031 was used as a starting material (see FIG. 65($a$)). First, this copper-clad laminated board was subjected to a laser treatment to bore holes and, then, an electroless plating treatment was carried out and pattern etching was carried out to form conductor circuits 5024 and a plated-through hole 5029 on both faces of the base material layer 5031.

Figure 65:
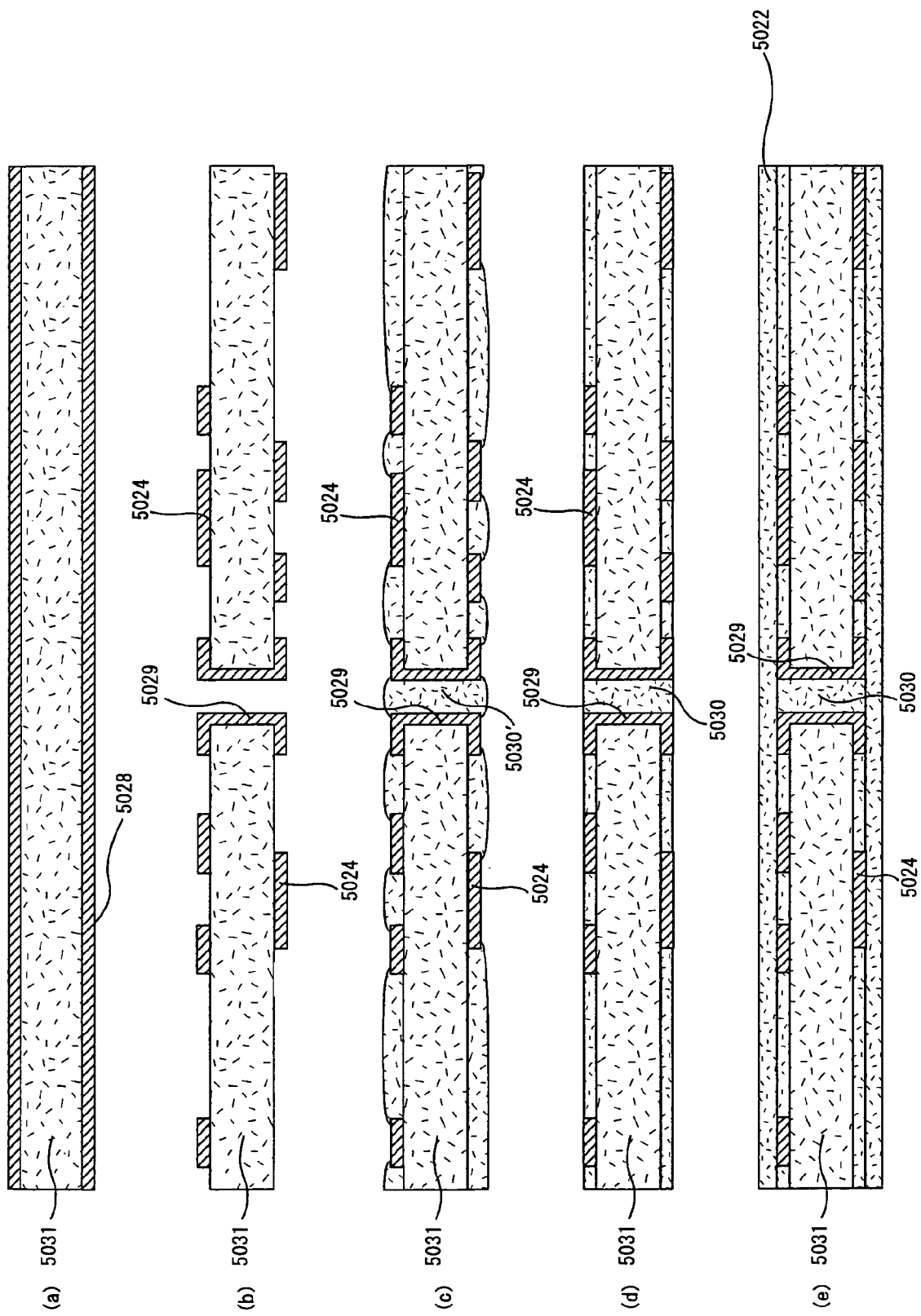
FIG. 65 is a cross-sectional view schematically showing part of a manufacturing method of a substrate for mounting an IC chip according to the second aspect of the fifth group of the present invention.

(2) The base material layer having the plated-through hole 5029 formed therein and the conductor circuits 5024 formed thereon was washed with water and dried, then subjected to a blackening treatment using an aqueous solution containing NaOH (10 g/l), $NaClO_2$ (40 g/l), $Na_3PO_4$ (6 g/l) as a blackening bath (oxidizing bath) and a reducing treatment using an aqueous solution containing NaOH (10 g/l) and $NaBH_4$ (6 g/l) as a reducing bath to form roughened faces (not shown) on the entire surfaces of the conductor circuits 5024 including the plated-through hole 4029 (see FIG. 65($b$)).

(3) After the resin filler described in B was prepared, a layer of resin filler 5030' was formed inside the plated-through hole 5029, non conductor formed areas and the peripheral parts of the conductor circuits 5024 on one face of the base material layer 5031 by the following method within 24 hours after the preparation.

That is, first, the resin filler was pushed in the plated-through hole using a squeegee and then dried under conditions of 100° C. for 20 minutes. Next, a mask having openings corresponding to the non conductor formed areas was put on the base material layer, and the resin filler was also filled into the concave non conductor formed areas using the squeegee and dried under conditions of 100° C. for 20 minuets, thereby forming the layer of resin filler 5030' (see FIG. 65($c$)).

(4) One face of the base material layer for which the treatment (3) was just finished was ground by belt sander grinding using #600 belt grinding paper (made by Sankyo Chemical Engineering Co.) so as not to leave the resin filler 5030' on the surfaces of the conductor circuits 5024 and the land surface of the plated-through holes 5029 and, then, buff grinding was carried out to remove scratches caused by the belt sander grinding. A series of such grinding steps were conducted to the other face of the base material layer in the same manner.

Next, heat treatments at 100° C. for 1 hour, at 120° C. for 3 hours, at 150° C. for 1 hour and 180° C. for 7 hours were carried out, respectively, to form a resin filler layer 5030.

In such a manner, the surface layer part of the resin filler layer 5030 formed in the plated-through hole 5029 and the non conductor formed areas and the surfaces of the conductor circuits 5024 were flattened, the resin filler 5030 and the side faces of the conductor circuits 5024 were firmly stuck to each other through the roughened faces (not shown), and the inner wall face of the plated-through hole 5029 and the resin filler 5030 were also firmly stuck to each other through the roughened face (not shown), thus obtaining base material layer (see FIG. 65($d$)). By this step, the surface of the resin filler layer 5030 was flush with the surfaces of the conductor circuits 5024.

(5) After the base material layer was washed with water and degreased with an acid, soft etching was carried out and etchant was sprayed on both faces of the substrate to etch the surfaces of the conductor circuits 5024 and the land surface and inner wall of the plated-through hole 5029, thereby forming roughened faces (not shown) on the entire surfaces of the conductor circuits 5024. As the etchant, etchant (made by Meck Co.; Meck etch bond) containing 10 parts by weight of an imidazole copper(II) complex and 7 parts by weight of glycolic acid, and 5 parts by weight of potassium chloride was used.

(6) Next, a resin film with a slightly larger size than that of the base material layer produced in the A was put on the base material layer, temporarily pressure-bonded under conditions of 0.4 MPa pressure, 80° C. temperature, and 10-second pressure bonding period and cut. Thereafter, the film was bonded by the following method using a vacuum laminator device, thereby forming an interlaminar resin insulating layer 5022 (see FIG. 65($e$)).

That is, the resin film was actually pressure-bonded on the base material layer under conditions of 65 Pa degree of vacuum, 0.4 MPa pressure, 80° C. temperature and 60-second pressure bonding period, and the resin film was further thermally cured at 170° C. for 30 minutes.

(7) Next, openings for via-holes 5026 with 80 μm diameter were formed in the interlaminar insulating layers 5022 by a $CO_2$ gas laser of 10.4 g/m wavelength through a 1.2 mm-thick mask having through holes formed therein in conditions of a beam diameter of 4.0 mm, a top hat mode, a pulse interval of 8.0 μs, 1.0 mm-diameter of the through holes of the mask and one shot. (see FIG. 66(*a*)).

(8) The base material layer in which the openings for via-holes 5026 were formed was immersed in a solution containing 60 g/l of permanganic acid at 80° C. for 10 minutes to dissolve and remove epoxy resin particles existing on the surfaces of the interlaminar resin insulating layers 5022, thus forming the roughened faces (not shown) on the interlaminar insulating layers 5022 including the inner wall faces of the openings for via-holes 5026.

(9) Next, the base material layer completed with the treatment was immersed in neutralizer (made by Shiplay Co., Inc.) and washed with water.

Further, a palladium catalyst was attached to the surface of the base material layer subjected to the roughening treatment (roughening depth: 3 μm), whereby a catalyst core was attached to the surfaces of the interlaminar insulating layers 5022 (including the inner wall faces of the openings for via-holes 5026) (not shown). That is, the catalyst was attached by immersing the base material layer in a catalytic solution containing palladium chloride ($PdCl_2$) and stannous chloride ($SnCl_2$) to precipitate palladium metal.

Figure 66:
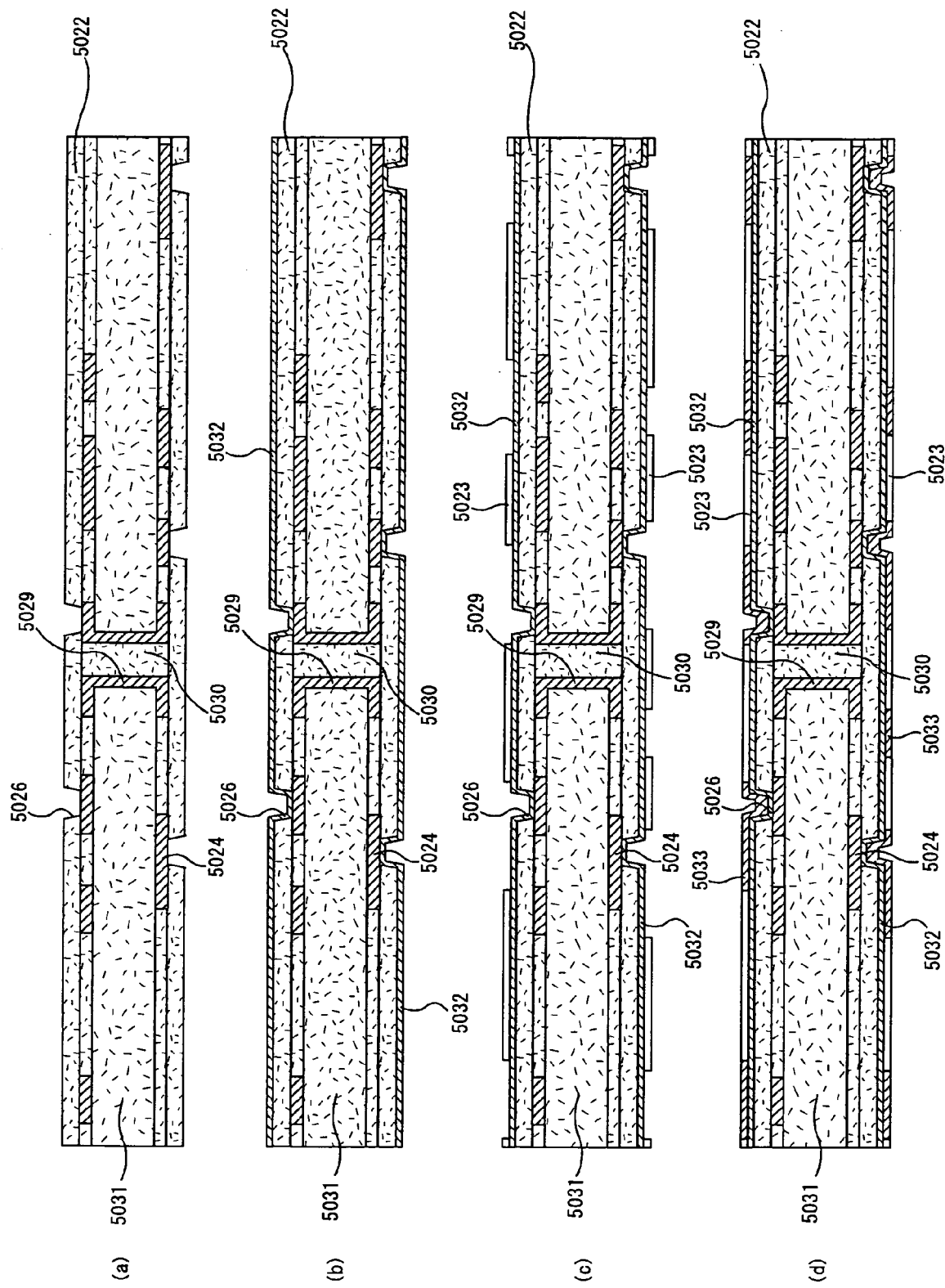
FIG. 66 is a cross-sectional view schematically showing part of the manufacturing method of a substrate for mounting an IC chip according to the second aspect of the fifth group of the present invention.

(10) Next, the base material layer was immersed in an electroless copper plating solution having the following composition to form a thin film conductor layer (electroless copper plating film) 5032 having a thickness of 0.6 to 3.0 μm on the surface of each interlaminar insulating layer 5022 (including the inner wall faces of the openings for via-holes 5026) (see FIG. 66(*b*)).

[Electroless Plating Solution]

| | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. Liquid Temperature and 40 Minutes

(11) Next, a commercially available photosensitive dry film was bonded to the base material layer on which the thin film conductor layers (electroless copper plating films) 5032 were formed, a mask was put thereon and exposure with 100 mJ/cm$^2$ and development with an aqueous 0.8% sodium carbonate solution were carried out, thereby forming a plating resist 5023 having a thickness of 20 μm (see FIG. 66(*c*)).

(12) Next, the base material layer was washed with water at 50° C. to be degreased, washed with water at 25° C., and further washed with sulfuric acid. Thereafter, the base material layer was subjected to electroplating under the following conditions, thereby forming an electroplating copper film 5033 having a thickness of 20 μm in non plating resist 5023 formed areas (see FIG. 66(*d*)).

[Electroplating Solution]

| | |
|---|---|
| Sulfuric acid | 2.24 mol/l |
| Copper sulfate | 0.26 mol/l |
| Additive | 19.5 ml/l |
| (Cupracid HL made by Atotech Co.) | |

[Electroplating Conditions]

| | |
|---|---|
| Current density | 1 A/dm$^2$ |
| Time | 65 minutes |
| Temperature | 22 ± 2° C. |

Figure 67:
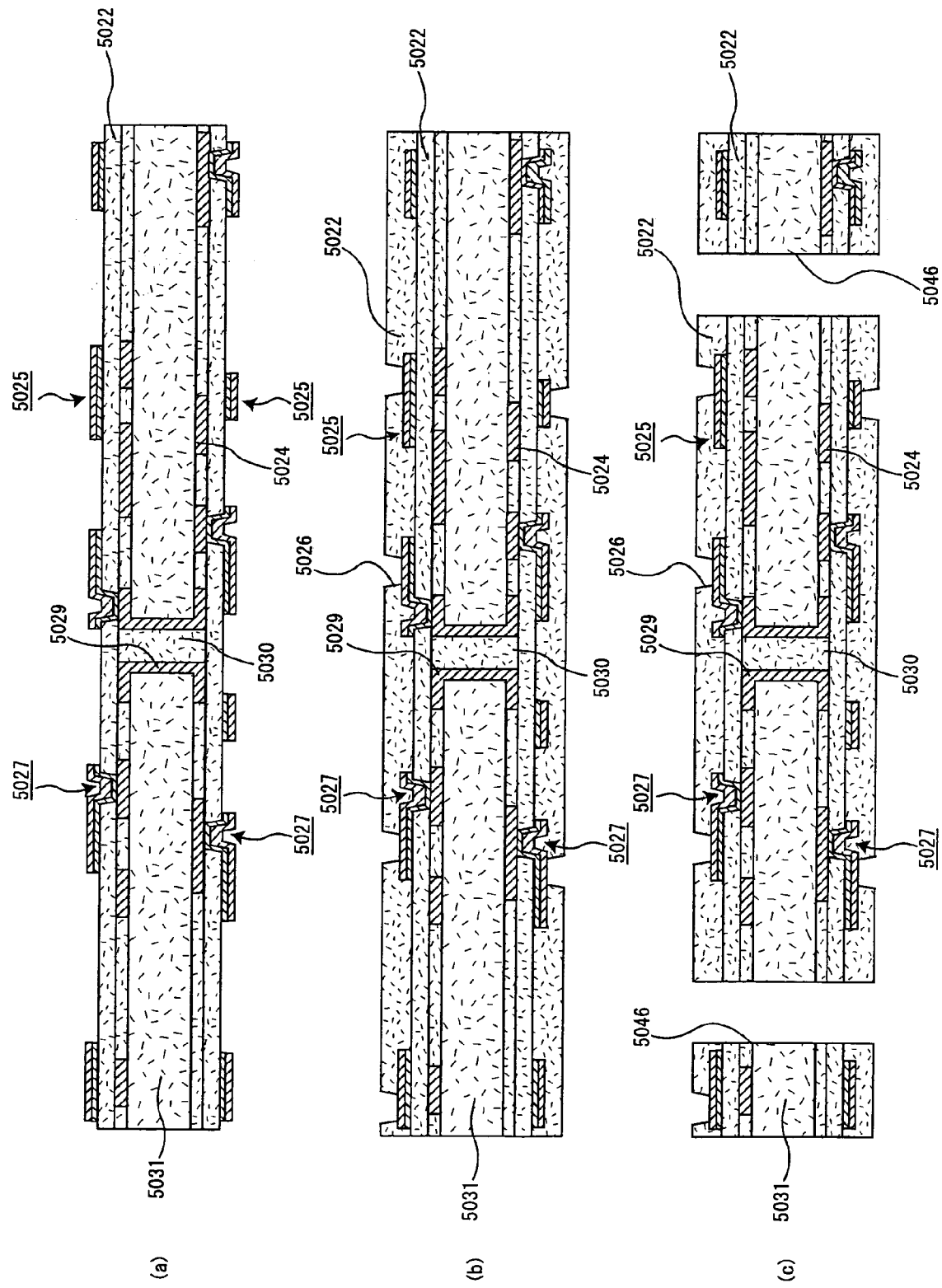
FIG. 67 is a cross-sectional view schematically showing part of the manufacturing method of a substrate for mounting an IC chip according to the second aspect of the fifth group of the present invention.

(13) After peeling off the plating resists 5023 with 5% NaOH, the thin film conductor layer under the plating resist 5023 was etched, dissolved and removed with a solution mixture of sulfuric acid and hydrogen peroxide, thus forming conductor circuits 5025 (including via-holes 5027) each composed of the thin film conductor layer (electroless copper plating film) 5032 and the electroplating copper film 5033 and having a thickness of 18 μm (see FIG. 67(*a*)).

(14) Further, using the same etchant as that used in the step (5), roughened faces (not shown) were formed on the surfaces of the conductor circuits 5025, and the interlaminar insulating layer 5022 having the openings for via-holes 5026 and having a roughened face (not shown) formed on the surface thereof was built up similarly to the steps (6) to (8) (see FIG. 67(*b*)).

Thereafter, using a carbonic acid gas, openings 5046 penetrating the base material layer 5031 and the interlaminar insulating layers 5022 and having a diameter of 250 μm were formed on the interlaminar insulating layer 5022 through a mask having through holes of a thickness of 1.2 mm formed therein. Further, a desmear treatment was conducted to the wall faces of the openings 5046 (see FIG. 67(*c*)).

Figure 68:
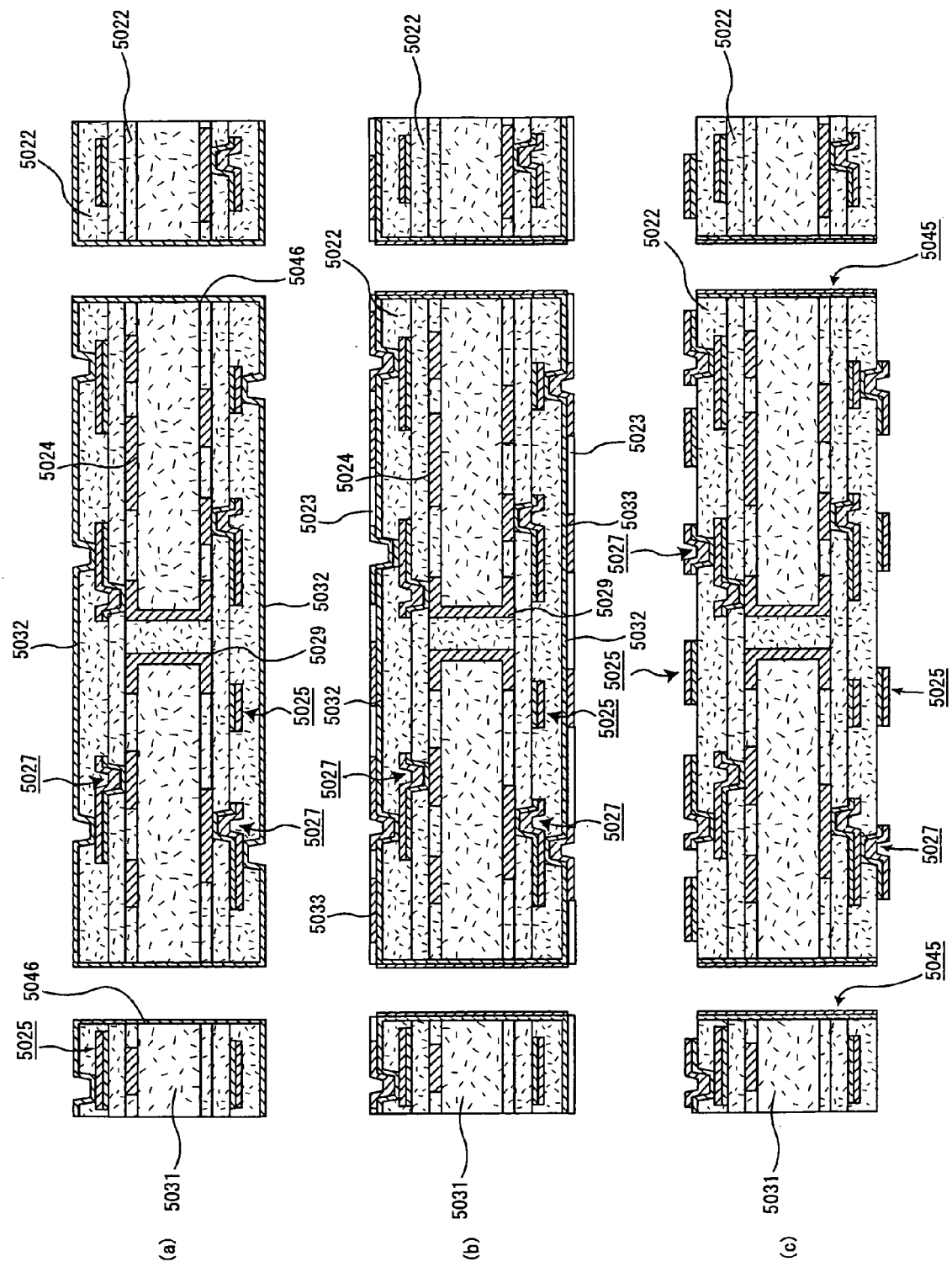
FIG. 68 is a cross-sectional view schematically showing part of the manufacturing method of a substrate for mounting an IC chip according to the second aspect of the fifth group of the present invention.

(15) Next, a catalyst was attached to the wall faces of the openings 5046 and the surfaces of the interlaminar insulating layers 5022 using the same method as that used in the step (9), and the base material layer was immersed in the same electroless copper plating solution as that used in the step (10), thereby forming a thin film conductor layer (electroless copper plating film) 5032 on the surface of the interlaminar insulating layer 5022 (including the inner wall faces of the openings for via-holes 5026) and the wall faces of the openings 5046 (see FIG. 68(*a*))

(16) Next, a plating resist 5023 was provided by the same method as that used in the step (11) and a copper electroplating film 5033 having a thickness of 20 μm was formed in non plating resist 5023 formed areas by the same method as that used in the step (12) (see FIG. 68(*b*)).

(17) Next, using the same method as that used in the step (13), the plating resist 5023 was peeled off and the thin film conductor layer under the plating resist 5023 was removed, thereby forming conductor circuits 5025 (including via-holes 5027) and a conductor layer 5045.

Furthermore, using the same method as that used in the step (2), an oxidizing-reducing treatment was carried out, thereby forming roughened faces (not shown) on the surfaces of the conductor circuits 5025 and the surface of the conductor layer 5045 (see FIG. 68(*c*)).

(18) Next, the resin composition containing epoxy resin was filled into each opening 5046 in which the conductor layer 5045 was formed using the squeegee, the resin composition was dried and the surface layer of the resin composition was flattened. Further, a curing treatment was conducted to the resin composition, thereby forming a resin composition layer 5042*a* (see FIG. 69(*a*)).

(19) Next, a solder resist composition was prepared similarly to the step (19) in Example 1.

Figure 69:
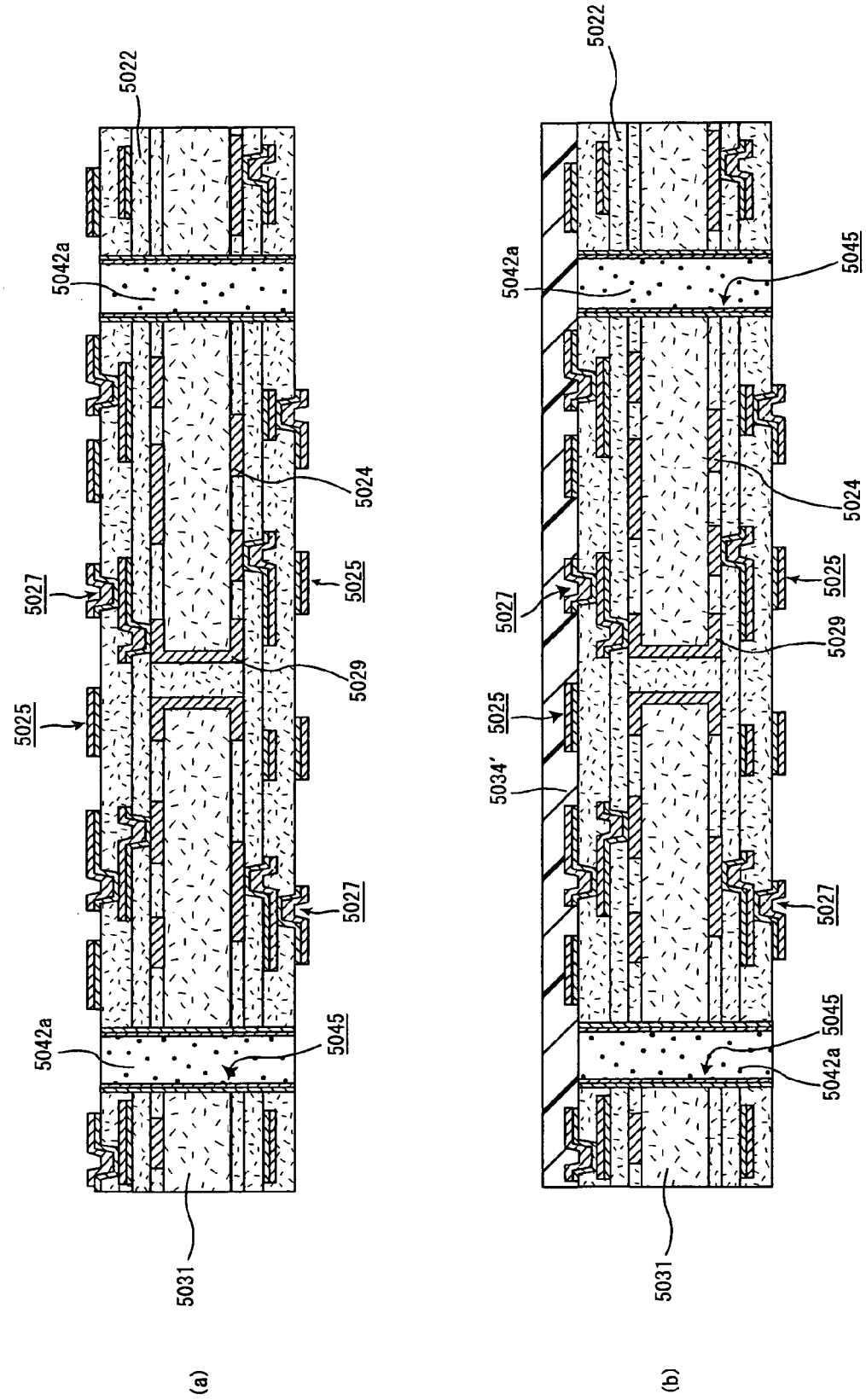
FIG. 69 is a cross-sectional view schematically showing part of the manufacturing method of a substrate for mounting an IC chip according to the second aspect of the fifth group of the present invention.

(20) Next, the solder resist composition was applied by 30 μm thickness to one face of a conductor circuit lamination in which the resin composition 5042*a* was formed and dried under conditions of 70° C. for 20 minutes and 70C for 30 minutes, thereby forming a solder resist composition layer 5034' (see FIG. 69(*b*)).

(21) A 5 mm-thick photomask on which a pattern of openings for forming solder bumps and openings for optical paths was drawn was closely stuck to the solder resist composition layer 5034' on the IC chip mounting side, exposed with UV rays of 1000 mJ/cm$^2$ and developed with a DMTG solution, thereby forming openings having a diameter of 200 µm.

Further, heat treatments were conducted under conditions of 80° C. for 1 hour, 100° C. for 1 hour, 120° C. for 1 hour and 150° C. for 3 hours, respectively, to cure the solder resist composition layer, thereby forming a solder resist layer 5034 having openings for forming solder bumps 5047, openings for optical paths 5042*b* and a thickness of 20 µm. It is noted that a commercially available solder resist composition can be used as the solder resist composition.

Figure 70:
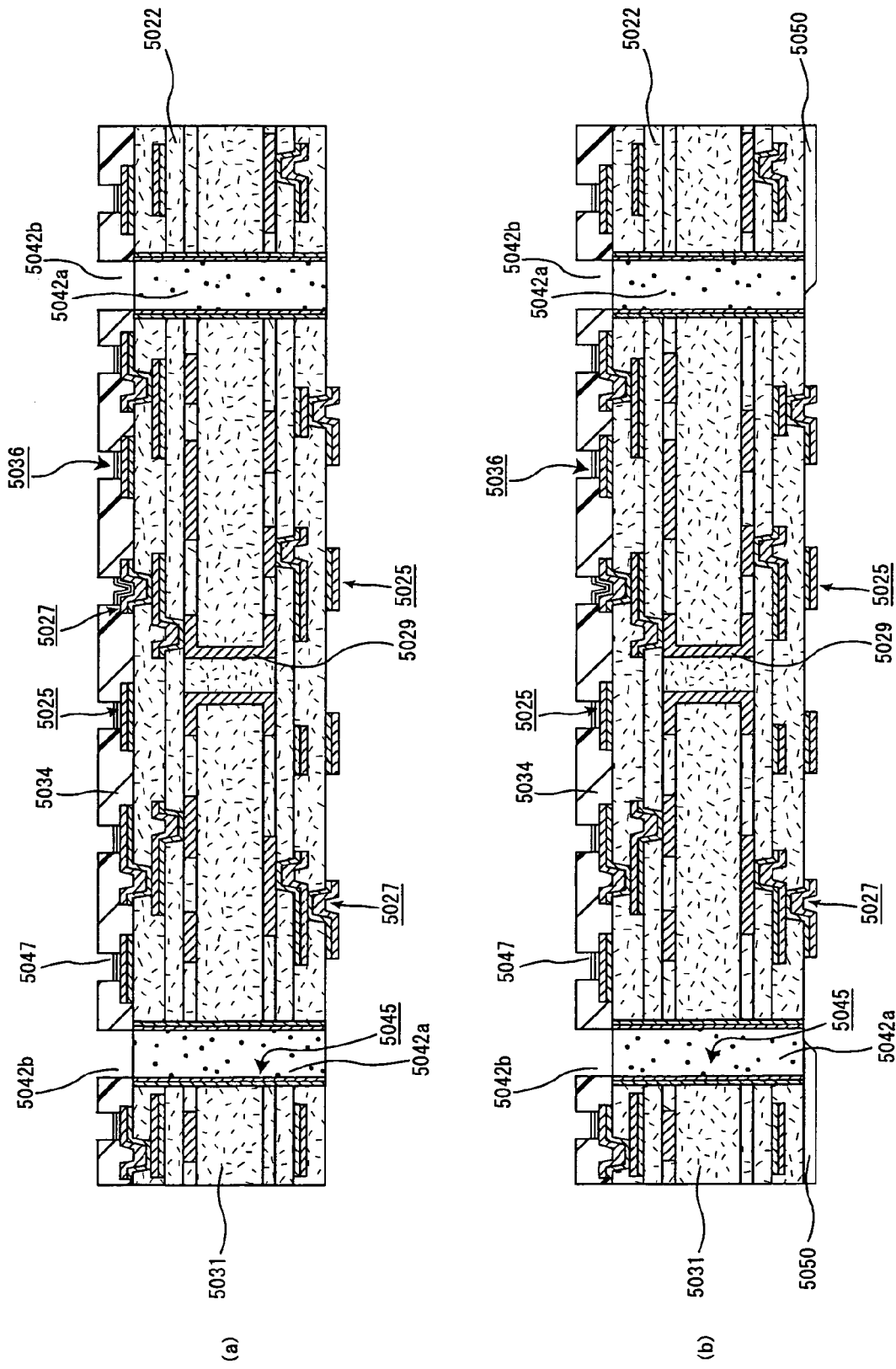
FIG. 70 is a cross-sectional view schematically showing part of the manufacturing method of a substrate for mounting an IC chip according to the second aspect of the fifth group of the present invention.

(22) Next, a conductor circuit lamination on which the solder resist layers 5034 were formed was immersed in an electroless nickel plating solution having pH 4.5 and containing nickel chloride (2.3×10$^{-1}$ mol/l), sodium hypophosphite (2.8×10$^{-1}$ mol/l) and sodium citrate (1.6×10$^1$ µmol/l) for 20 minutes, thereby forming a 5 µm-thick nickel plated layer in the openings for forming solder bumps 5047. Further, the resultant substrate was immersed in an electroless gold plating solution containing potassium gold cyanide (7.6×10$^{-3}$ mol/l), ammonium chloride (1.9×10$^{-1}$ mol/l), sodium citrate (1.2×10$^{-1}$ mol/l) and sodium hypophosphite (1.7×10$^{-1}$ mol/l) under conditions of 80° C. for 7.5 minutes, to form a 0.03 m-thick gold plating layer on the nickel plated layer, whereby solder pads 5036 were obtained and a lamination was thus obtained (see FIG. 70(*a*)).

F. Laminating Step (1) First, optical waveguides 5050 each having an optical path conversion mirror were bonded by the following method at predetermined positions in the non solder resist layer formed face (lower face in the figure) of the lamination manufactured in the steps in the E (see FIG. 70(*b*)).

That is, each of the optical waveguides manufactured in the steps in the D was bonded to the non conductor formed areas in such a manner that the side face thereof on the other end to the non optical conversion mirror formed side is aligned to the side face of the interlaminar insulating layer. The bonding of the optical waveguides was performed by applying adhesive containing thermosetting resin onto the bonded face of the optical waveguide to the interlaminar insulating layer by a thickness of 10 µm, pressure-bonding the adhesive and curing the adhesive at 60° C. for 1 hour.

(2) After the resin filler described in the B was prepared, a resin filler layer was formed inside the via-holes 5027, non conductor formed areas, non optical waveguide formed areas and the peripheral parts of the conductor circuits 5025 (including the via-holes 5027) on one face on which the solder resist layer was not formed by the following method within 24 hours after the preparation.

That is, first, the resin filler was pushed in the via-holes using a squeegee and then dried under conditions of 100° C. for 20 minutes. Next, a mask having openings corresponding to the non conductor circuit formed areas and non optical waveguide formed areas was put on the lamination, and the resin filler was also filled into the concave non conductor formed areas using the squeegee and dried under conditions of 100° C. for 20 minuets, thereby forming a resin filler layer.

(3) One face of the lamination for which the treatment (2) was just finished was ground by belt sander grinding using #60.0 belt grinding paper (made by Sankyo Chemical Engineering Co.) so as not to leave the resin filler on the surfaces of the conductor circuits 5025 and the surfaces of the optical waveguides 5050 and, then, buff grinding was carried out to remove scratches caused by the belt sander grinding.

Next, heat treatments at 100° C. for 1 hour, at 120° C. for 3 hours, at 150° C. for 1 hour and 180° C. for 7 hours were carried out, respectively, to form a resin filler layer 5051.

Figure 71:
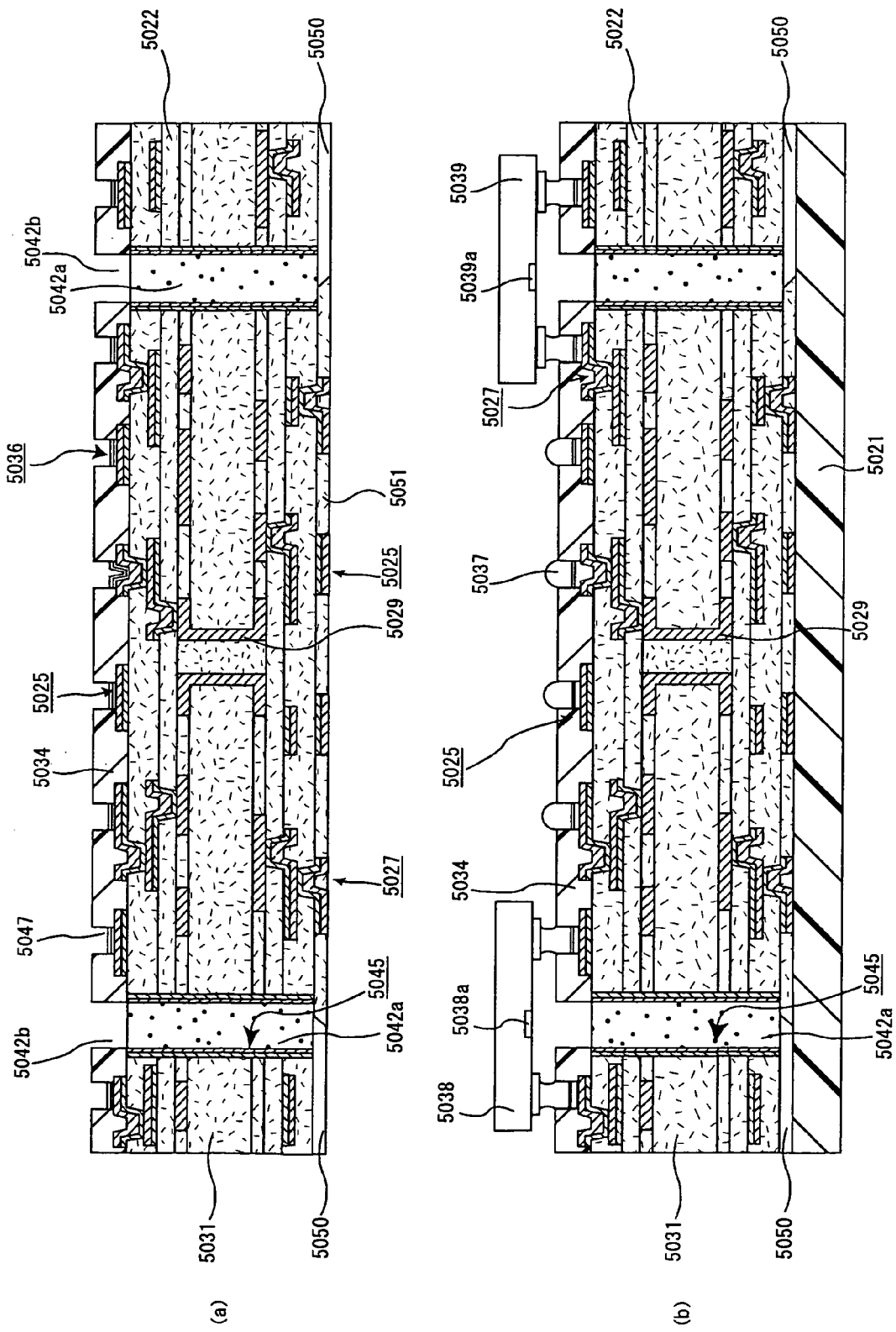
FIG. 71 is a cross-sectional view schematically showing part of the manufacturing method of a substrate for mounting an IC chip according to the second aspect of the fifth group of the present invention.

In such a manner, the lamination wherein the surface layer part of the resin filler 5051 formed in the non conductor circuit formed areas and non optical waveguide formed areas, the surfaces of the conductor circuits 5025 and optical waveguides 5050 were flattened and the resin filler 5051 and the side faces of the conductor circuits 5025 were firmly stuck to each other through the roughened faces (not shown), and the inner wall face of the via-hole 5027 and the resin filler 5051 were also firmly stuck to each other through the roughened face (not shown), was obtained (see FIG. 71(*a*)). By this step, the surface of the resin filler layer 5051 was flush with the surfaces of the conductor circuits 5024 and those of the optical waveguides 5050.

(4) Next, the lamination having the optical waveguides 5050 and resin filler layer 5051 formed thereon through the steps (1) to (3) was put on the substrate 5021 in the C, the lamination was pressure-bonded thereon in conditions of vacuum or reduced pressure, a pressure of 0.5 MPa, a temperature of 100° C. and a period of 120 seconds, thermally cured at 150° C. for 40 minutes, thereby building up the lamination on which the optical waveguides 5050 and the resin filler layer 5051 were formed on the substrate 5021.

(5) Next, solder paste was printed in each of the openings for forming solder bumps 5047 formed in the solder resist layer 5034, a light receiving element 5038 and a light emitting element 5039 while aligning the light receiving part 5038*a* of the light receiving element 5038 and the light emitting part 5039*a* of the light emitting element 5039 and reflow was conducted at 200° C., thereby mounting the light receiving element 5038 and the light emitting element 5039, to form solder bumps 5037 in the respective openings for forming solder bumps 5047, thus obtaining the substrate for mounting an IC chip (see FIG. 71(*b*)).

As the light receiving element 5038, an optical element of InGaAs was used. As the light emitting element 5039, an optical element of InGaAsP was used.

It is noted that in the substrate for mounting an IC chip manufactured in this example, each of the optical paths for transmitting optical signal is constituted by the resin composition, a vacancy and the conductor layer around them.

EXAMPLE 108

A substrate for mounting an IC chip was obtained similarly to Example 107 except that a polyolefin-containing resin composition was used in place of the epoxy resin-containing resin composition in the step (18) in Example 107.

It is noted that in the substrate for mounting an IC chip manufactured in this example, each of the optical paths for transmitting optical signal is constituted by a resin composition, a vacancy and a conductor layer around them.

EXAMPLE 109

A substrate for mounting an IC chip was obtained similarly to Example 107 except that the step (18) in Example 107, i.e., the step of forming the resin composition 5042*a* was not executed.

It is noted that in the substrate for mounting an IC chip manufactured in this example, each of the optical paths for transmitting optical signal is constituted by a vacancy and a conductor layer around the vacancy.

EXAMPLE 110

A substrate for mounting an IC chip was obtained similarly to Example 107 except that the conductor layer was not formed on the wall faces of the openings in the steps (15) and (16) in Example 107.

It is noted that in the substrate for mounting an IC chip manufactured in this example, each of the optical paths for transmitting optical signal is constituted by a resin composition and a vacancy.

EXAMPLE 111

A substrate for mounting an IC chip was obtained similarly to Example 107 except that the conductor layer was not formed on the wall faces of the openings in the steps (15) and (16) in Example 107 and that a polyolefin-containing resin composition was used in place of the epoxy resin-containing resin composition in the step (18).

It is noted that in the substrate for mounting an IC chip manufactured in this example, each of the optical paths for transmitting optical signal is constituted by a resin composition and a vacancy.

EXAMPLE 112

A substrate for mounting an IC chip was obtained similarly to Example 107 except that the conductor layer was not formed on the wall faces of the openings in the steps (15) and (16) in Example 107 and that the step (18), i.e., the step of forming the resin composition layer was not executed.

It is noted that in the substrate for mounting an IC chip manufactured in this example, each of the optical paths for transmitting optical signal is constituted by a vacancy.

EXAMPLE 113

Figure 72:
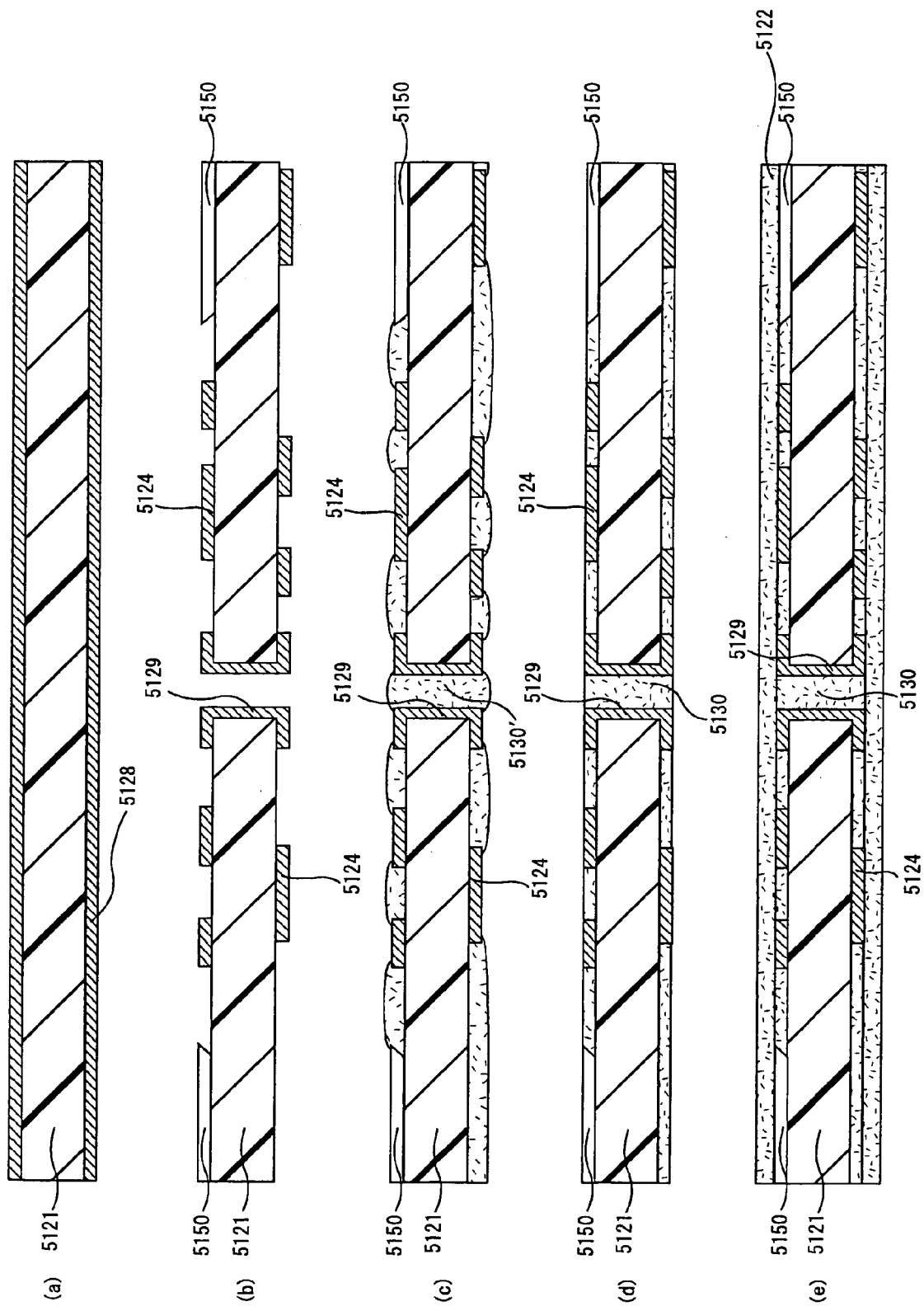
FIG. 72 is a cross-sectional view schematically showing part of a manufacturing method of a substrate for mounting an IC chip according to the third aspect of the fifth group of the present invention.

(1) A copper-clad laminated board composed of an insulating substrate 5121 made of a 0.8 mm-thick glass epoxy resin or BT (bismaleimide-triazine) resin, with a 18 μm-thick copper foil 5128 laminated on both faces of the substrate 5121 was used as a starting material (see FIG. 72(a)). First, the copper-clad laminated board was drilled to bore holes and, then, an electroless plating treatment was carried out and pattern etching was carried out to form conductor circuits 5124 and a plated-through hole 5129 on both faces of the substrate 5121.

(2) The substrate having the plated-through hole 5129 formed therein and the conductor circuits 5124 formed thereon was washed with water and dried, then subjected to a blackening treatment using an aqueous solution containing NaOH (10 g/l), NaClO$_2$ (40 g/l), Na$_3$PO$_4$ (6 g/l) as a blackening bath (oxidizing bath) and a reducing treatment using an aqueous solution containing NaOH (10 g/l) and NaBH$_4$ (6 g/l) as a reducing bath to form roughened faces (not shown) on the entire surfaces of the conductor circuits 5124 including the plated-through hole 5129.

(3) Next, optical waveguides 5150 having optical path conversion mirrors were formed at predetermined positions by the following method, respectively (see FIG. 72(b)).

That is, a film-shaped optical waveguide (made by Micro Parts Co.; width: 1 mm, thickness: 20 μm) which was made of PMMA and on which 45°—the optical conversion mirror was formed in advance using a diamond saw having a 90°-V-shaped tip end was bonded in such a manner that the side face of the optical waveguide on the other end to the non optical conversion mirror formed side was aligned to the side face of the substrate.

The bonding of each optical waveguide 5150 was performed by applying adhesive composed of thermosetting resin onto the bonded face of the optical waveguide to the substrate by a thickness of 10 μm, pressure-bonding the adhesive and curing the adhesive at 60° C. for 1 hour.

In this example, curing was conducted under condition of 60° C./1 hour. In some cases, step curing may be conducted. When the step curing is conducted, no stress occurred due to the optical waveguide at the time of bonding the optical waveguide.

(4) After the resin filler described in B of Example 107 was prepared, a layer of resin filler 5130' was formed inside the plated-through hole 5129, non optical waveguide formed area, non conductor formed areas and the peripheral parts of the conductor circuits 5124 on one face of the substrate 5121 by the following method within 24 hours after the preparation. That is, first, the resin filler was pushed in the plated-through hole using a squeegee and then dried under conditions of 100° C. for 20 minutes. Next, a mask having openings corresponding to the non conductor circuit formed areas was put on the substrate, and the resin filler was also filled into the concave non conductor circuit formed areas using the squeegee and dried under conditions of 100° C. for 20 minuets, thereby forming the layer of resin filler 5130' (see FIG. 72(c)).

(5) One face of the substrate for which the treatment (4) was just finished was ground by belt sander grinding using #600 belt grinding paper (made by Sankyo Chemical Engineering Co.) so as not to leave the resin filler 5130' on the surfaces of the conductor circuits 5124 and the land surface of the plated-through holes 5129 and, then, buff grinding was carried out to remove scratches caused by the belt sander grinding. A series of such grinding steps were conducted to the other face of the substrate in the same manner.

Next, heat treatments at 100° C. for 1 hour, at 120° C. for 3 hours, at 150° C. for 1 hour and 180° C. for 7 hours were carried out, respectively, to form a resin filler layer 5130.

In such a manner, the surface layer part of the resin filler layer 5130 formed in the plated-through hole 5129 and the non conductor circuit formed areas and the surfaces of the conductor circuits 5124 were flattened, the resin filler 5130 and the side faces of the conductor circuits 5124 were firmly stuck to each other through the roughened faces (not shown), and the inner wall face of the plated-through hole 5129 and the resin filler 5130 were also firmly stuck to each other through the roughened face (not shown), thus obtaining an insulating substrate (see FIG. 72(d)). By this step, the surface of the resin filler layer 5130 was flush with the surfaces of the conductor circuits 5124 and the surface of the optical waveguide 5150.

(6) After the substrate was washed with water and degreased with an acid, soft etching was carried out and etchant was sprayed on both faces of the substrate to etch the surfaces of the conductor circuits 5124 and the land surface and inner wall of the plated-through hole 5129, thereby forming roughened faces (not shown) on the entire surfaces of the conductor circuits 5124. As the etchant, etchant (made by Meck Co.; Meck etch bond) containing 10 parts by weight of an imidazole copper(II) complex and 7 parts by weight of glycolic acid, and 5 parts by weight of potassium chloride was used.

(7) Next, a resin film with a slightly larger size than that of the substrate produced in the (1) was put on the substrate, temporarily pressure-bonded under conditions of 0.4 MPa pressure, 80° C. temperature, and 10-second pressure bonding period and cut. Thereafter, the film was bonded by the following method using a vacuum laminator device, thereby forming an interlaminar resin insulating layer 5122 (see FIG. 72(*e*)).

That is, the resin film was actually pressure-bonded on the substrate under conditions of 65 Pa degree of vacuum, 0.4 MPa pressure, 80° C. temperature and 60-second pressure bonding period, and the resin film was further thermally cured at 170° C. for 30 minutes.

It is noted that the resin film was manufactured similarly to A in Example 107.

(8) Next, openings for via-holes 5126 with 80 μm diameter were formed in the interlaminar insulating layers 5122 by a $CO_2$ gas laser of 10.4 μm wavelength through a 1.2 mm-thick mask having through holes formed therein in conditions of a beam diameter of 4.0 mm, a top hat mode, a pulse interval of 8.0 μs, 1.0 mm-diameter of the through holes of the mask and one shot. (see FIG. 73(*a*)).

(9) The substrate in which the openings for via-holes 5126 were formed was immersed in a solution containing 60 g/l of permanganic acid at 80° C. for 10 minutes to dissolve and remove epoxy resin particles existing on the surfaces of the interlaminar resin insulating layers 5122, thus forming the roughened faces (not shown) on the interlaminar insulating layers 5122 including the inner wall faces of the openings for via-holes 5126.

(10) Next, the substrate completed with the treatment was immersed in neutralizer (made by Shiplay Co., Inc.) and washed with water.

Further, a palladium catalyst was attached to the surface of the substrate subjected to the roughening treatment (roughening depth: 3 μm), whereby a catalyst core was attached to the surfaces of the interlaminar insulating layers 5122 (including the inner wall faces of the openings for via-holes 5126) (not shown). That is, the catalyst was attached by immersing the substrate in a catalytic solution containing palladium chloride ($PdCl_2$) and stannous chloride ($SnCl_2$) to precipitate palladium metal.

Figure 73:
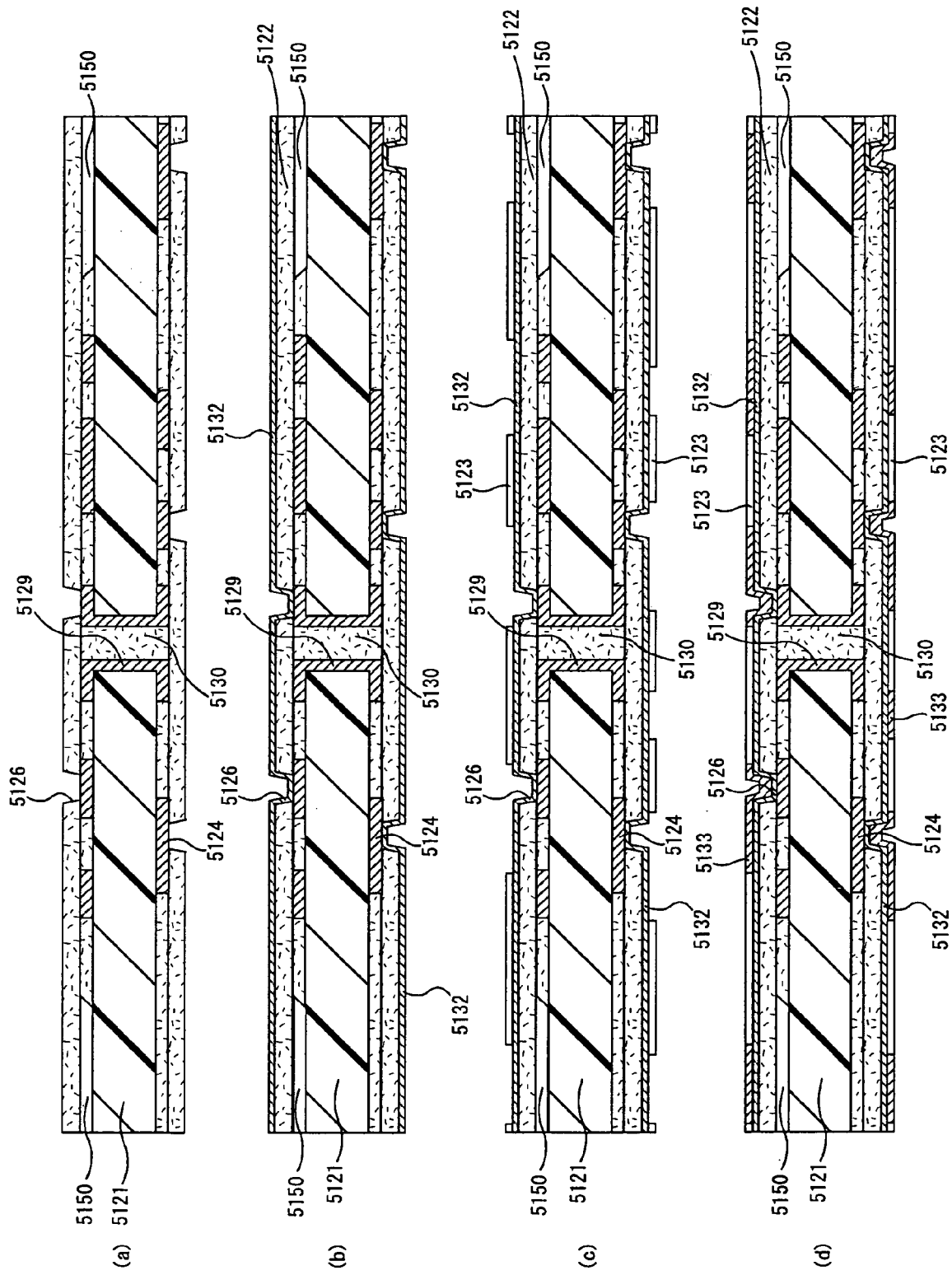
FIG. 73 is a cross-sectional view schematically showing part of the manufacturing method of a substrate for mounting an IC chip according to the third aspect of the fifth group of the present invention.

(11) Next, the substrate was immersed in an electroless copper plating solution having the following composition to form a thin film conductor layer (electroless copper plating film) 5132 having a thickness of 0.6 to 3.0 μm on the surface of each interlaminar insulating layer 5122 (including the inner wall faces of the openings for via-holes 5126) (see FIG. 73(*b*)).

[Electroless Plating Solution]

| | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. Liquid Temperature and 40 Minutes

(12) Next, a commercially available photosensitive dry film was bonded to the substrate on which the thin film conductor layers (electroless copper plating films) 5132 were formed, a mask was put thereon and exposure with 100 mJ/cm² and development with an aqueous 0.8% sodium carbonate solution were carried out, thereby forming a plating resist 5123 having a thickness of 20 μm (see FIG. 73(*c*)).

(13) Next, the substrate was washed with water at 50° C. to be degreased, washed with water at 25° C., and further washed with sulfuric acid. Thereafter, the substrate was subjected to electroplating under the following conditions, thereby forming an electroplating copper film 5133 in non plating resist 5123 formed areas (see FIG. 73(*d*)).

[Electroplating Solution]

| | |
|---|---|
| Sulfuric acid | 2.24 mol/l |
| Copper sulfate | 0.26 mol/l |
| Additive | 19.5 ml/l |
| (Cupracid HL made by Atotech Co.) | |

[Electroplating Conditions]

| | |
|---|---|
| Current density | 1 A/dm² |
| Time | 65 minutes |
| Temperature | 22 ± 2° C. |

Figure 74:
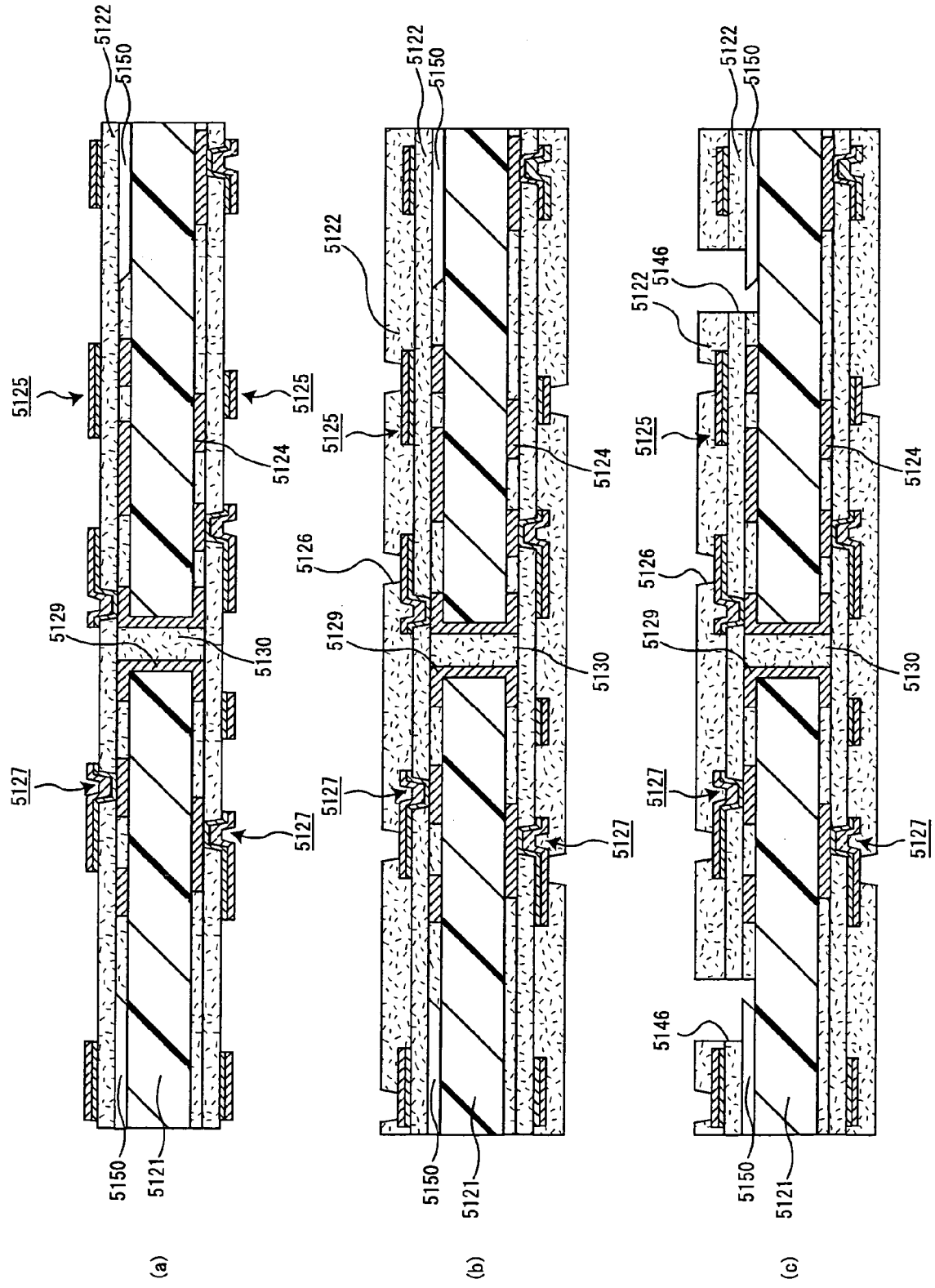
FIG. 74 is a cross-sectional view schematically showing part of the manufacturing method of a substrate for mounting an IC chip according to the third aspect of the fifth group of the present invention.

(14) After peeling off the plating resists 5123 with 5% NaOH, the thin film conductor layer under the plating resist 5123 was etched, dissolved and removed with a solution mixture of sulfuric acid and hydrogen peroxide, thus forming conductor circuits 5125 (including via-holes 5127) each composed of the thin film conductor layer (electroless copper plating film) 5132 and the electroplating copper film 5133 and having a thickness of 18 μm (see FIG. 74(*a*)).

(15) Further, using the same etchant as that used in the step (6), roughened faces (not shown) were formed on the surfaces of the conductor circuits 5125, and the interlaminar insulating layer 5122 having the openings for via-holes 5126 and having a roughened face (not shown) formed on the surface thereof was built up similarly to the steps (6) to (8) (see FIG. 74(*b*)).

Thereafter, openings 5146 having a diameter of 250 μm were formed at positions confronting the optical waveguides 5150 on the interlaminar insulating layer 5122 through a mask having 1.2 mm-thick through holes formed therein using a carbonic acid gas laser. Further, a desmear treatment was conducted to the wall faces of the openings 5146 (see FIG. 74(*c*)).

(16) Next, a catalyst was attached to the surface of each interlaminar insulating layer 5122 by the same method as that used in the step (10). Further, the substrate was immersed in the same electroless copper plating solution as the electroless plating solution used in the step (11), thereby forming a thin film conductor layer (electroless copper plating film) 5132 on the surface of each interlaminar insulating layer 5122 (including the inner wall faces of the openings for via-holes 5126) (see FIG. 75(*a*)). It is noted that a mask was formed on the wall faces of the openings formed in this step and no catalyst was applied to the openings.

Figure 75:
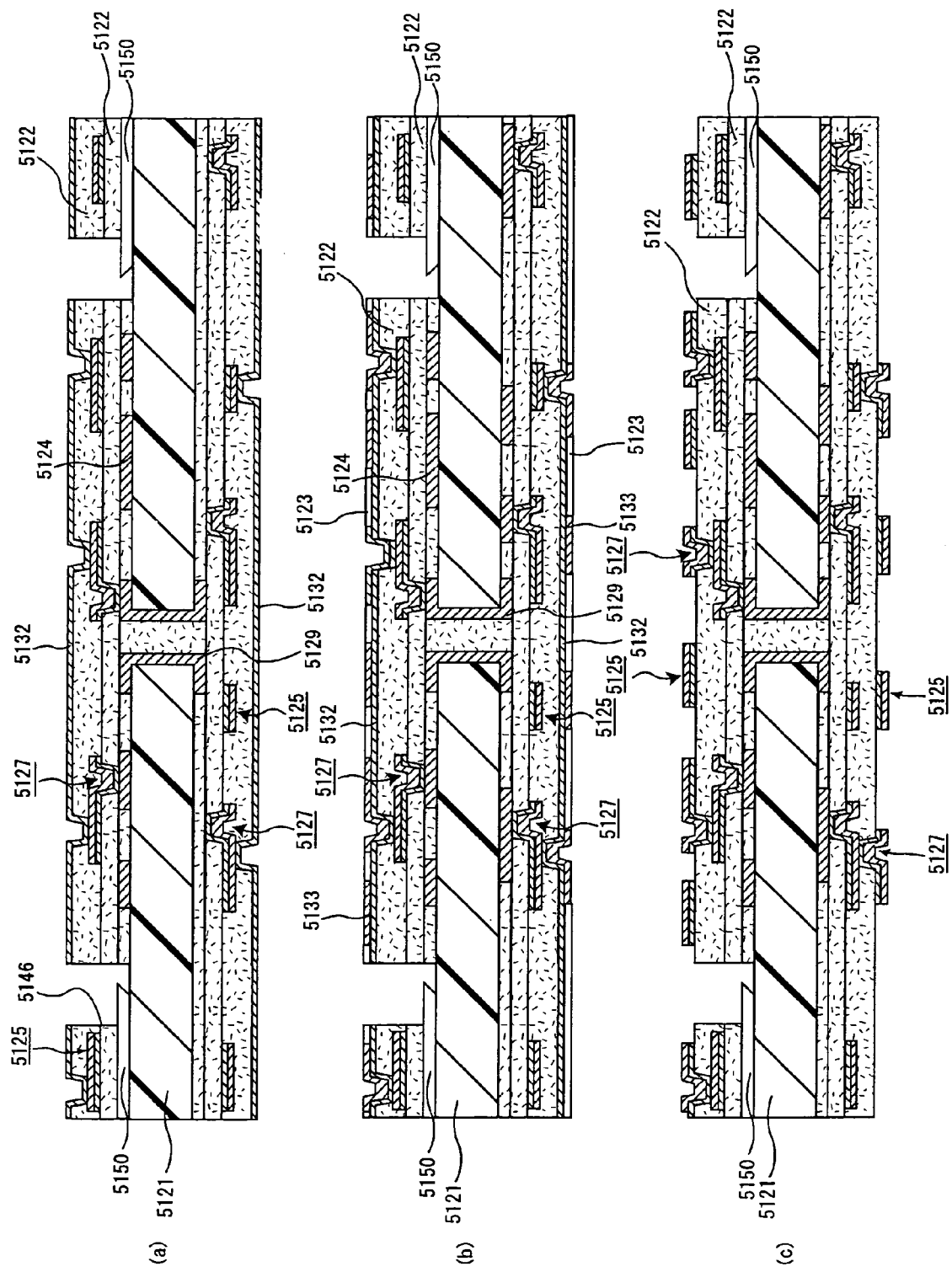
FIG. 75 is a cross-sectional view schematically showing part of the manufacturing method of a substrate for mounting an IC chip according to the third aspect of the fifth group of the present invention.

(17) Next, a plating resist 5123 was provided by the same method as that used in the step (12) and an electroplating copper film 5133 having a thickness of 20 μm was formed in non plating resist 5123 formed areas by the same method as that used in the step (13) (see FIG. 75(*b*)).

(18) Next, using the same method as that used in the step (14), the plating resist 5123 was peeled off and the thin film conductor layer under the plating resist 5123 was removed, thereby forming conductor circuits 5125 (including via-holes 5127).

Furthermore, using the same method as that used in the step (2), an oxidizing-reducing treatment was carried out, thereby forming roughened faces (not shown) on the surfaces of the conductor circuits 5125 (see FIG. 75(*c*)).

(19) Next, the resin composition containing epoxy resin was filled into each opening 5146 using the squeegee, the resin composition was dried and the surface layer of the resin composition was flattened by buff grinding. Further, a curing treatment was conducted to the resin composition, thereby forming a resin composition layer 5142*a* (see FIG. 76(*a*)).

(20) Next, a solder resist composition was prepared similarly to the step (19) of Example 1.

Figure 76:
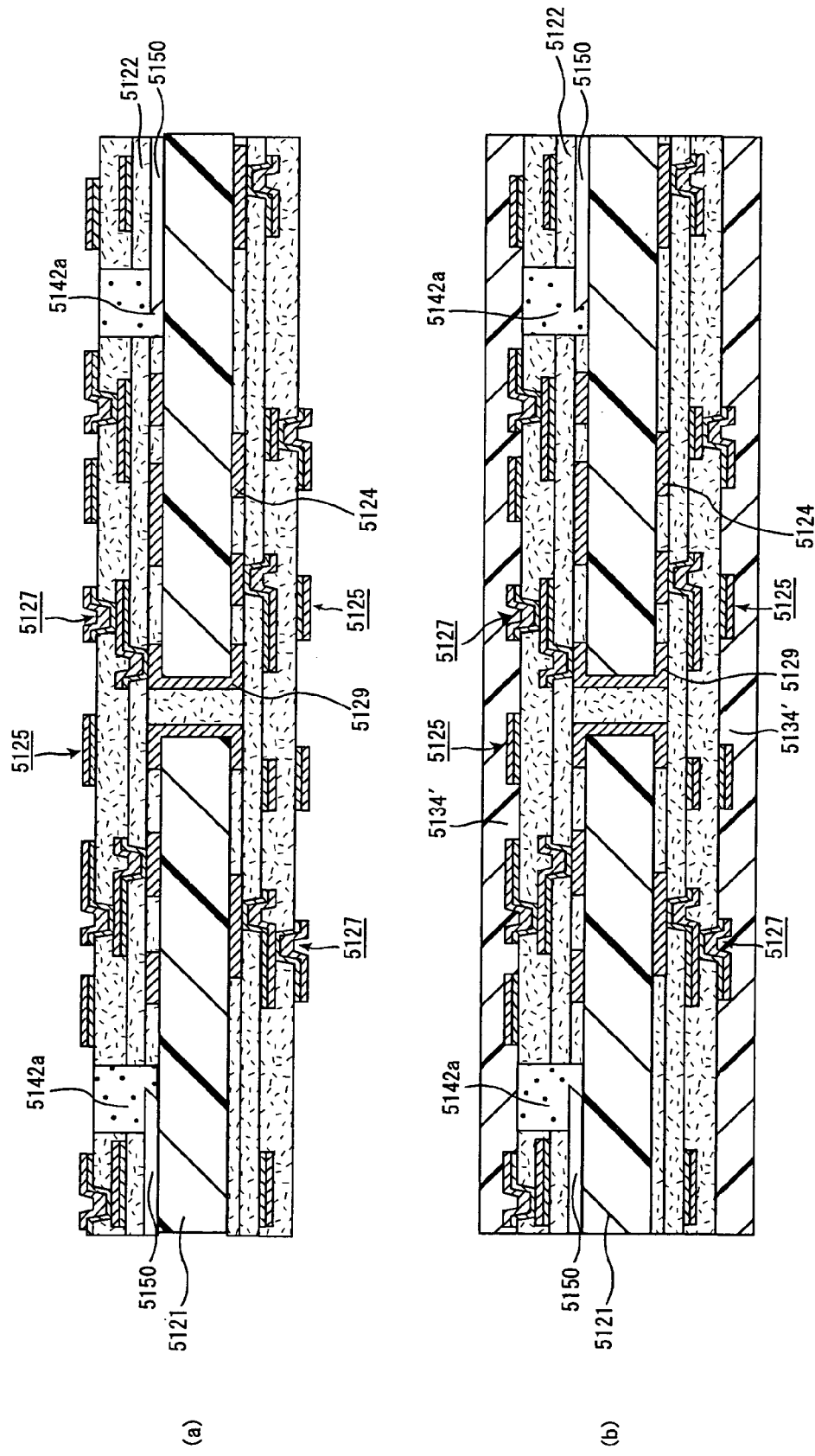
FIG. 76 is a cross-sectional view schematically showing part of the manufacturing method of a substrate for mounting an IC chip according to the third aspect of the fifth group of the present invention.

(21) Next, the solder resist composition was applied by 30 μm thickness to both faces of the substrate in which the resin composition layer 5142*a* was formed and dried under conditions of 70° C. for 20 minutes and 70° C. for 30 minutes, thereby forming a solder resist composition layer 5134' (see FIG. 76(*b*)).

(22) A 5 mm-thick photomask on which a pattern of openings for forming solder bumps and openings for optical paths was drawn was closely stuck to the solder resist composition layer 5134' on the IC chip mounting side, exposed with UV rays of 1000 mJ/cm$^2$ and developed with a DMTG solution, thereby forming openings having a diameter of 200 μm.

Figure 77:
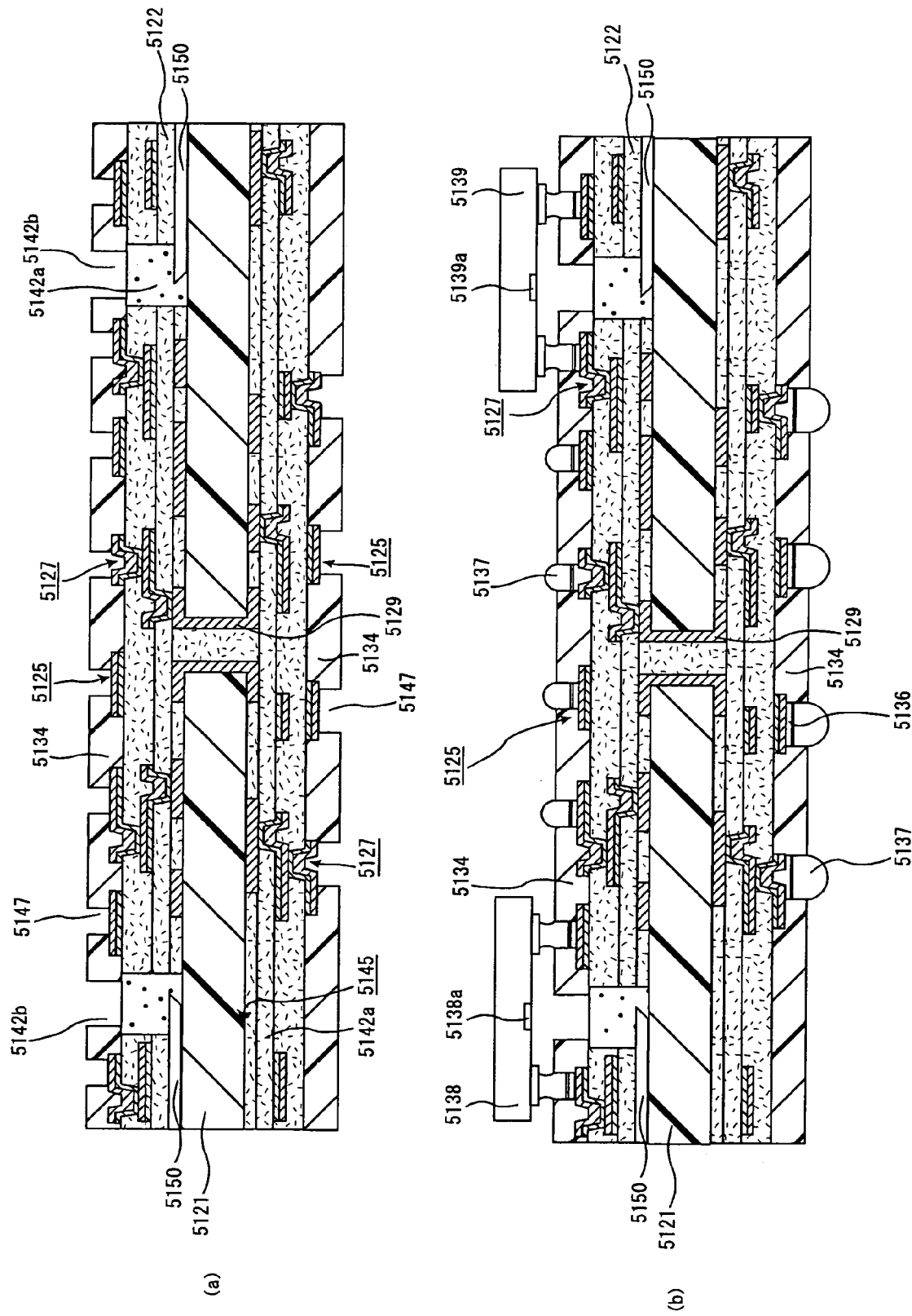
FIG. 77 is a cross-sectional view schematically showing part of the manufacturing method of a substrate for mounting an IC chip according to the third aspect of the fifth group of the present invention.

Further, heat treatments were conducted under conditions of 80° C. for 1 hour, 100° C. for 1 hour, 120° C. for 1 hour and 150° C. for 3 hours, respectively, to cure the solder resist composition layer, thereby forming a solder resist layer 5134 having openings for forming solder bumps 5147, openings for optical paths 5142*b* and a thickness of 20 μm (see FIG. 77(*a*)).

(23) Next, the substrate on which the solder resist layers 5134 were formed was immersed in an electroless nickel plating solution having pH 4.5 and containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, thereby forming a 5 μm-thick nickel plated layer in the openings for forming solder bumps 5147. Further, the resultant substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, to form a 0.03 μm-thick gold plating layer on the nickel plated layer, thus obtaining solder pads 5136.

(24) Next, solder paste was printed in the openings for forming solder bumps 5147 formed in each solder resist layer 5134, a light receiving element 5138 and a light emitting element 5139 were attached thereinto while aligning the light receiving part 5138*a* of the light receiving element 5138 and the light emitting part 5139*a* of the light emitting element 5139, and reflow was conducted at 200° C., thereby mounting the light receiving element 5138 and the light emitting element 5139, forming solder bumps 5137 in the respective openings for forming solder bumps 5147, thus obtaining a substrate for mounting an IC chip (see FIG. 77(*b*)).

As the light receiving element 5138, an optical element of InGaAs was used. As the light emitting element 5139, an optical element of InGaAsP was used.

It is noted that in the substrate for mounting an IC chip manufactured in this example, each of the optical paths for transmitting optical signal is constituted by the resin composition, a vacancy and the conductor layer around them.

EXAMPLE 114

A substrate for mounting an IC chip was obtained similarly to Example 113 except that each optical waveguide was directly formed on the substrate using the following method in place of the method of forming the optical waveguide by bonding a film-shaped optical waveguide in the step (3) of Example 113.

That is, a resin composition containing PMMA resin was applied to a predetermined position on the substrate, the resin composition was dried, and the surface layer thereof was flattened by buff grinding. Further, after a curing treatment was conducted to the resin composition, a 45°-optical path conversion mirror was formed using a diamond saw having a 90°-V-shaped tip end, thereby forming each optical waveguide.

REFERENCE EXAMPLE 1

(1) First, the same steps as (1) to (19) in Example 113 were executed to manufacture a multilayered circuit board having the optical waveguides and the optical paths for transmitting optical signal formed therein.

Next, a light receiving element and a light emitting element were attached to the end portions of the respective optical paths for transmitting optical signal filled with the resin composition, respectively while being aligned. As the light receiving element, an optical element of InGaAs was used. As the light emitting element, an optical element of InGaAsP was used. In addition, the connection of the connection terminals of the light receiving element and the light emitting element to the conductor circuits of the multilayered circuit board was established by conductive adhesive.

(2) Next, on the multilayered circuit board to which the light receiving element and the light emitting element were attached, interlaminar insulating layers and conductor circuits were formed by the same methods as those used in the steps (7) to (14) in Example 113.

Herein, as the resin film, a resin film in which openings were provided in portions corresponding to the light receiving element and the light emitting element, respectively, in advance was used.

Furthermore, the same methods as those used in the steps (16) to (24) in Example 113 were conducted, thereby forming conductor circuits and solder resist layers. Herein, the step (19) was not executed and the conductor circuits were formed to be connected to the optical elements.

Using such a method, a substrate for mounting an IC chip having the optical elements (light receiving element and light emitting element) mounted inside was manufactured.

100 substrates for mounting IC chips were manufactured by each of the methods shown in Examples 107 to 114 and Reference Example 1. These substrates for mounting IC chips were cut by a cutter so as to cross the optical waveguides and the optical paths for transmitting optical signal and the cross sections thereof were observed, respectively.

As a result, the optical waveguides and the optical paths for transmitting optical signal connecting the optical waveguides to the optical elements were secured in any of the substrates for mounting IC chips.

Further, 100 substrates for mounting IC chips were manufactured by each of the methods shown in Examples 107, 113 and Reference Example 1. For each of these substrates for mounting IC chips, after an IC chip was mounted, a detector was attached to the end portion of the optical signal output-side optical waveguide, optical signal was transmitted through the optical signal input-side optical waveguide, the IC chip was allowed to perform arithmetic operation, the optical signal was detected by the detector and the connection loss between the light receiving element and light emitting element and the optical paths for transmitting optical signal were measured.

As a result, in five out of 100 substrates for mounting IC chips manufactured by the method shown in Example 107 and in seven out of 100 substrates for mounting IC chips manufactured by the method shown in Example 113, a desired optical signal could not be detected and large connection loss was discovered.

In addition, in 40 out of 100 substrates for mounting IC chips manufactured by the method shown in Reference Example 1, a desired optical signal could not be detected and large connection loss was discovered.

The reason that there were a number of poor-connection products among the substrates for mounting IC chips manufactured in the method shown in Reference Example 1 was estimated as follows In the method shown in Reference Example 1, after mounting the optical elements, it was necessary to conduct a heat treatment and the like in the steps of forming the conductor circuits, the interlaminar insulating layers and the like. During this heat treatment, the positional deviation of the optical elements occurred, resulting in poor connection.

As for the substrates for mounting IC chips manufactured by the methods shown in Examples 107 and 113, there were products having poor connection due to the positional deviation of the optical elements similarly to Reference Example 1. However, because the optical composition were surface-mounted, such poor connection was able to be solved by replacing only the optical elements.

Moreover, in the substrates for mounting IC chips manufactured by the methods shown in Examples 107 and 113, micro lenses were formed on the end portions of the respective optical paths for transmitting optical signal through an adhesive layer, and in the substrates for mounting IC chips manufactured by the methods shown in Examples 107 and 113, micro lenses were formed inside the respective optical paths for transmitting optical signal and on the resin composition layer by dropping acrylic resin using a dispenser (see FIGS. 64 and 78).

Further, the optical signal connection loss of each of the substrates for mounting IC chips having these micro lenses formed therein was similarly measured. As a result, the number of substrates for mounting IC chips which could not detect a desired optical signal and which had large connection loss was decreased compared with the substrates for mounting IC chips manufactured by the methods shown in Examples 107 and 113.

EXAMPLES 115 TO 121

Each of substrates for mounting IC chips was manufactured similarly to Example 107 except that the resin composition layer was formed using the following method in the step (18) in E of Example 107.

That is, a resin composition formed by adding pulverized silica having a particle size distribution of 0.1 to 0.8 μm to epoxy resin (refractive index: 1.53, transmissivity: 91%/mm, thermal expansion coefficient: 82 ppm) so that the silica content became the value shown in Table 23, was prepared and filled into the through hole by screen printing. Herein, the resin composition was prepared to have a viscosity of 200000 cps (mP·s).

Next, the resin composition was cured under conditions of 120° C. for 1 hour and 150° C. for 2 hours, thereby obtaining a resin composition layer.

In Example 115, no silica particles were added.

TABLE 23

| | Content of pulverized silica (% by weight) | transmissivity (%/mm) | Thermal expansion coefficient (ppm) |
|---|---|---|---|
| Example 115 | 0 | 91 | 72 |
| Example 116 | 5 | 84 | 67 |
| Example 117 | 10 | 81 | 58 |
| Example 118 | 20 | 84 | 50 |
| Example 119 | 40 | 82 | 42 |
| Example 120 | 50 | 81 | 38 |
| Example 121 | 60 | 78 | 32 |

For each of the substrates for mounting IC chips in Examples 115 to 121 thus obtained, the filling property of the resin composition and the presence/absence of cracks on the resin composition layer after a liquid-phase temperature cycle test were evaluated. The evaluation results are shown in Table 24.

The filling property of the resin composition was evaluated by cutting the substrate for mounting an IC chip to cross the optical paths for transmitting optical signal using a cutter after forming the resin composition layer and observing the cross section thereof.

Further, the liquid-phase temperature cycle test and the presence/absence of the occurrence of cracks were evaluated similarly to Example 7.

TABLE 24

| | Sealing property by sealing resin layer | Liquid-phase temperature cycle | | |
|---|---|---|---|---|
| | | 250 cycles | 500 cycles | 1000 cycles |
| Example 115 | ◯ | ◯ | ◯ | Δ |
| Example 116 | ◯ | ◯ | ◯ | Δ |
| Example 117 | ◯ | ◯ | ◯ | ◯ |
| Example 118 | ◯ | ◯ | ◯ | ◯ |
| Example 119 | ◯ | ◯ | ◯ | ◯ |
| Example 120 | ◯ | ◯ | ◯ | ◯ |
| Example 121 | Δ | ◯ | ◯ | ◯ |
| Comparative Example | — | ◯ | Δ | X |

Table 24 shows the results of Examples 115 to 121 and the evaluation result of optical signal transmission characteristic of the device for optical communication manufactured in the above-mentioned Comparative Example.

In Examples 116 to 121, pulverized silica particles were added to the resin composition layer. The same experiments were conducted by using titania particles or alumina particles in place of the pulverized silica particles. With the thermal expansion coefficient slightly different, the same results were obtained for the liquid-phase temperature cycle test.

EXAMPLES 122 TO 130

Each of substrates for mounting IC chips was manufactured similarly to Example 107 except for the use of optical waveguides into which pulverized silica particles (particle size distribution: 0.1 to 0.8 μm) having a content shown in Table 25 were mixed in the steps in D of Example 107.

In Examples 122 to 130, optical waveguides were formed using the same methods as those in Examples 17 to 25, respectively.

TABLE 25

| | Content of pulverized silica (% by weight) | transmissivity (%/mm) | Thermal expansion coefficient (ppm) |
|---|---|---|---|
| Example 122 | 0 | 93 | 70 |
| Example 123 | 8 | 84 | 67 |
| Example 124 | 10 | 82 | 65 |
| Example 125 | 15 | 84 | 60 |
| Example 126 | 25 | 81 | 53 |
| Example 127 | 50 | 82 | 41 |
| Example 128 | 60 | 79 | 32 |
| Example 129 | 70 | 75 | 28 |
| Example 130 | 80 | 77 | 25 |

For each of the substrates for mounting IC chips in Examples 122 to 130 thus obtained, the presence/absence of the occurrence of cracks on the optical waveguides after a liquid-phase temperature cycle test were evaluated. The evaluation results are shown in Table 26.

The evaluation was made by the same evaluation method and evaluation standard as those of Example 17.

TABLE 26

| | Liquid-phase temperature cycle | | |
|---|---|---|---|
| | 250 cycles | 500 cycles | 1000 cycles |
| Example 122 | ◯ | ◯ | Δ |
| Example 123 | ◯ | ◯ | Δ |
| Example 124 | ◯ | ◯ | Δ |
| Example 125 | ◯ | ◯ | ◯ |
| Example 126 | ◯ | ◯ | ◯ |
| Example 127 | ◯ | ◯ | ◯ |
| Example 128 | ◯ | ◯ | ◯ |
| Example 129 | ◯ | ◯ | ◯ |
| Example 130 | ◯ | ◯ | ◯ |
| Comparative Example | ◯ | Δ | X |

Table 26 shows the results of Examples 122 to 130 and the evaluation result of optical signal transmission characteristic of the device for optical communication manufactured in the above-mentioned Comparative Example.

In Examples 123 to 130, pulverized silica particles were added to the claddings constituting the respective optical waveguides. The same experiments were conducted by using titania particles or alumina particles in place of the pulverized silica particles. With the thermal expansion coefficient slightly different, the same results were obtained for the liquid-phase temperature cycle test.

Further, the optical waveguides formed in Examples 122 to 130 were optical waveguides for multi-mode. Even when substrates for mounting IC chips were manufactured similarly to Examples 122 to 130 by using optical waveguides for single-mode instead of the optical waveguides for multi-mode, a predetermined optical signal was able to be transmitted.

The optical waveguide for single-mode was formed as follows. Siloxane based resin (refractive index: 1.50, transmissivity: 93%/mm, thermal expansion coefficient: 115 ppm) was prepared as resin for forming a core and siloxane based resin (refractive index: 1.48, transmissivity: 93%/mm, thermal expansion coefficient: 141 ppm) was prepared as resin for forming a cladding. In addition, particles were added by a predetermined mixing quantity to the resin for forming a cladding, based on necessity. Using these resins, an optical waveguide for single-mode having the cross-sectional size of the core of 10×10 μm and the film thicknesses of the upper cladding and the lower cladding of 10 μm was obtained by the same method as that in Example 17.

Further, among the optical waveguides formed by such a method, the optical waveguide for single-mode having particles mixed to the claddings had a transmission loss of 0.43 dB/cm for signal light having a wavelength of 1.33 μm and a transmission loss of 0.84 dB/cm for signal light having a wavelength of 1.55 μm, and the optical waveguide for single-mode having 50% by weight of particles mixed to the claddings had a transmission loss of 0.41 dB/cm for signal light having a wavelength of 1.33 μm and a transmission loss of 0.82 dB/cm for signal light having a wavelength of 1.55 μm. The measurement of the transmission losses was made by the cut-back method.

The cladding having no particles mixed therein had a thermal expansion coefficient of 141 ppm, and the cladding having particles mixed therein by 50% by weight had a thermal expansion coefficient of 48 ppm. The optical waveguides were evaluated by conducting the liquid-phase temperature cycle test for the substrates for mounting IC chips using the optical waveguides for single-mode. The evaluation results were the same as those for Examples 122 to 130.

EXAMPLES 131 TO 135

Each of substrates for mounting IC chips was manufactured similarly to Example 107 except that each micro lens was formed inside the optical path for transmitting optical signal and on the resin composition layer before mounting the optical elements by the following method in Example 107.

That is, a resin composition obtained by adding pulverized silica particles having a particle size distribution of 0.1 to 0.8 μm to epoxy based resin (transmissivity: 90%/mm, refractive index: 1.53) so that the mixing quantity of the silica became the value shown in the following Table 27 was applied using a dispenser, and a curing treatment was conducted while the resin composition became generally semispherical by the surface tension, thereby forming each micro lens. In Example 131, no particles were added to the resin composition.

TABLE 27

| | Content of pulverized silica (% by weight) | transmissivity (%/mm) |
|---|---|---|
| Example 131 | 0 | 90 |
| Example 132 | 20 | 84 |
| Example 133 | 40 | 82 |
| Example 134 | 60 | 82 |
| Example 135 | 70 | 81 |

For each of the substrates for mounting IC chips in Examples 131 to 135 thus obtained, the application property of the resin composition at the time of forming micro lenses and the presence/absence of the occurrence of cracks on the micro lenses after a liquid-phase temperature cycle test were evaluated. The evaluation results are shown in Table 28. The application property at the time of forming the micro lenses, the liquid-phase temperature cycle test and the observation of the presence/absence of cracks on the micro lenses after the test were evaluated similarly to Example 66.

TABLE 28

| | Application property | Liquid-phase temperature cycle | | |
| --- | --- | --- | --- | --- |
| | | 250 cycles | 500 cycles | 1000 cycles |
| Example 131 | ○ | ○ | ○ | ○ |
| Example 132 | ○ | ○ | ○ | ○ |
| Example 133 | ○ | ○ | ○ | ○ |
| Example 134 | ○ | ○ | ○ | ○ |
| Example 135 | Δ | ○ | ○ | ○ |
| Comparative Example | — | ○ | Δ | X |

Table 28 shows the results of Examples 131 to 135 and the evaluation result of optical signal transmission characteristic of the device for optical communication manufactured in the above-mentioned Comparative Example.

Further, in Examples 132 to 135, pulverized silica particles were mixed into the resin composition that constitutes the micro lenses. The same experiments were conducted by using titania particles or alumina particles in place of the pulverized silica particles. With the thermal expansion coefficient slightly different, the same results were obtained for the filling property of the resin composition and the liquid-phase temperature cycle test.

INDUSTRIAL APPLICABILITY

In the substrate for mounting an IC chip according to the first aspect of the first group of the present invention, optical elements are mounted and optical paths for transmitting optical signal penetrating the substrate for mounting an IC chip are provided as mentioned above. Therefore, input and output signals for the optical elements can be transmitted through the optical paths for transmitting optical signal. In addition, when an IC chip is mounted on the substrate, the distance between the IC chip and each of the optical elements is short and the reliability of the transmission of an electric signal is excellent.

Further, in the substrate for mounting an IC chip, on which an IC chip is mounted, according to the first aspect of the first group of the present invention, electronic components and optical elements necessary for optical communication can be provided integrally. Therefore, it is possible to contribute to making a terminal device for optical communication small in size.

Moreover, in the substrate for mounting an IC chip according to the first aspect of the first group of the present invention, when the optical elements are mounted on the surface thereof, positional deviation derived from a heat treatment during manufacturing does not occur. Besides, when a defect occurs to one of the optical elements, it suffices to replace only the defective optical element, thus advantageously ensuring good economical efficiency.

In the manufacturing method of a substrate for mounting an IC chip according to the second aspect of the first group of the present invention, optical paths for transmitting optical signal penetrating a substrate for mounting an IC chip are formed as mentioned above. Therefore, it is possible to suitably manufacture the substrate for mounting an IC chip capable of transmitting input and output signals for optical elements through the optical paths for transmitting optical signal according to the first aspect of the first group of the present invention.

In each of the devices for optical communication according to the third to fifth aspects of the first group of the present invention, optical paths for transmitting optical signal in the above-mentioned manner are formed in at least one of the substrate for mounting an IC chip and the multilayered printed circuit board. Therefore, it is possible to suitably transmit optical signal through the optical paths for transmitting optical signal. In addition, it is possible to ensure excellent optical signal transmission characteristic and realize high-density wiring.

Furthermore, when the substrate for mounting an IC chip according to the first aspect of the first group of the present invention is employed as the substrate for mounting an IC chip that constitutes each of the devices for optical communication, the devices for optical communication according to the third to fifth aspects of the first group of the present invention can attain the same effects as those of the substrate for mounting an IC chip according to the first aspect of the first group of the present invention.

As mentioned above, the device for optical communication according to the first aspect of the second group of the present invention comprises a substrate for mounting an IC chip on which a light receiving element and a light emitting element are mounted at respective predetermined positions and a multilayered printed circuit board on which optical waveguides are formed at respective predetermined positions. Therefore, the connection loss between the mounted optical components is low and connection reliability as the device for optical communication is excellent.

Further, as mentioned above, in the device for optical communication according to the first aspect of the second group of the present invention, a sealing resin layer is formed and dust, external matters and the like floating in the air are prevented from entering between each optical element and each optical waveguide and the optical signal transmission is not hampered by the dust, external matters and the like. Therefore, reliability as the device for optical communication is excellent.

Moreover, by forming the sealing resin layer, the sealing resin layer can serve to moderate the stress generated between the substrate for mounting an IC chip and the multilayered printed circuit board and make it more difficult to cause the positional deviation of the optical elements and the optical waveguides. Therefore, the device for optical communication according to the first aspect of the second group of the present invention is excellent in reliability.

In the manufacturing method of a device for optical communication according to the second aspect of the second group of the present invention, after disposing and fixing a substrate for mounting an IC chip and a multilayered printed circuit board at and to respective predetermined positions, a sealing resin layer is formed between them. Therefore, it is possible to suitably manufacture a device for optical communication capable of preventing dust, foreign matters and the like floating in the air from entering between the optical elements and the optical waveguides and capable of preventing optical signal transmission from being hampered.

Further, by forming the sealing resin layer between the substrate for mounting an IC chip and the multilayered printed circuit board, the sealing resin layer can serve to moderate the stress generated between the substrate for mounting an IC chip and the multilayered printed circuit board due to the difference in thermal expansion coefficient therebetween and make it more difficult to cause the positional deviation of the optical element and the optical waveguide.

Accordingly, the manufacturing method of a device for optical communication according to the second aspect of the second group of the present invention can suitably manufacture a device for optical communication excellent in reliability.

As mentioned above, the device for optical communication according to the first aspect of the third group of the present invention comprises a substrate for mounting an IC chip on which a light receiving element and a light emitting element are mounted at respective predetermined positions and a multilayered printed circuit board on which optical waveguides are formed at respective predetermined positions. Therefore, the connection loss between the mounted optical components is low and connection reliability as the device for optical communication is excellent.

Further, in the device for optical communication according to the first aspect of the third group of the present invention, when a sealing resin layer is formed between the substrate for mounting an IC chip and the multilayered printed circuit board, dust, external matters and the like floating in the air do not enter between the optical elements and the optical waveguides and the optical signal transmission is not hampered by the dust, external matters and the like, thus ensuring more excellent reliability as the device for optical communication.

Moreover, when the sealing resin layer is formed, the sealing resin layer can serve to moderate the stress generated between the substrate for mounting an IC chip and the multilayered printed circuit board and make it more difficult to cause the positional deviation of the optical elements and the optical waveguides, thus ensuring more excellent reliability as the device for optical communication.

In the manufacturing method of a device for optical communication according to the second aspect of the third group of the present invention, after disposing and fixing a substrate for mounting an IC chip and a multilayered printed circuit board at and to respective predetermined positions, a sealing resin layer is formed between them. Therefore, it is possible to suitably manufacture a device for optical communication capable of preventing dust, foreign matters and the like floating in the air from entering between the optical element and the optical waveguide and capable of preventing optical signal transmission from being hampered.

Further, in case of forming the sealing resin layer between the substrate for mounting an IC chip and the multilayered printed circuit board, the sealing resin layer can serve to moderate the stress generated between the substrate for mounting an IC chip and the multilayered printed circuit board due to the difference in thermal expansion coefficient therebetween and make it more difficult to cause the positional deviation of the optical element and the optical waveguide.

Accordingly, the manufacturing method of a device for optical communication according to the second aspect of the third group of the present invention can suitably manufacture a device for optical communication excellent in reliability.

As mentioned above, the device for optical communication according to the first aspect of the fourth group of the present invention comprises a substrate for mounting an IC chip on which a light receiving element and alight emitting element are mounted at respective predetermined positions and a multi layered printed circuit board on which optical waveguides are formed at respective predetermined positions. Therefore, the connection loss between the mounted optical components is low and connection reliability as the device for optical communication is excellent.

Further, in the device for optical communication according to the first aspect of the fourth group of the present invention, when a sealing resin layer is formed between the substrate for mounting an IC chip and the multilayered printed circuit board, dust, external matters and the like floating in the air do not enter between the optical elements and the optical waveguides and the optical signal transmission is not hampered by the dust, external matters and the like, thus ensuring more excellent reliability as the device for optical communication.

Moreover, when the sealing resin layer is formed, the sealing resin layer can serve to moderate the stress generated between the substrate for mounting an IC chip and the multilayered printed circuit board and make it more difficult to cause the positional deviation of the optical elements and the optical waveguides, thus ensuring more excellent reliability as the device for optical communication.

In the manufacturing method of a device for optical communication according to the second aspect of the fourth group of the present invention, after disposing and fixing a substrate for mounting an IC chip and a multilayered printed circuit board at and to respective predetermined positions, a sealing resin layer is formed between them. Therefore, it is possible to suitably manufacture a device for optical communication capable of preventing dust, foreign matters and the like floating in the air from entering between the optical element and the optical waveguide and capable of preventing optical signal transmission from being hampered.

Further, by forming the sealing resin layer between the substrate for mounting an IC chip and the multilayered printed circuit board, the sealing resin layer can serve to moderate the stress generated between the substrate for mounting an IC chip and the multilayered printed circuit board due to the difference in thermal expansion coefficient therebetween and make it more difficult to cause the positional deviation of the optical elements and the optical waveguides.

Accordingly, the manufacturing method of a device for optical communication according to the second aspect of the fourth group of the present invention can suitably manufacture a device for optical communication excellent in reliability.

In the substrate for mounting an IC chip according to the first aspect of the fifth group of the present invention, optical waveguides are formed inside the substrate for mounting an IC chip and optical paths for transmitting optical signal connecting optical elements to the optical waveguides are provided as mentioned above. Therefore, input and output signals for the optical elements can be transmitted through the optical waveguides and optical paths for transmitting optical signal. In addition, when an IC chip is mounted on the substrate, the distance between the IC chip and each of the optical elements is short and electric signal transmission reliability is excellent.

Further, in the substrate for mounting an IC chip, on which an IC chip is mounted, according to the present invention, electronic components and optical elements necessary for optical communication can be integrally provided. Therefore, it is possible to contribute to making a terminal device for optical communication small in size.

Moreover, in the substrate for mounting an IC chip according to the first aspect of the fifth group of the present invention, when the optical elements are mounted on the surface of the substrate, positional deviation derived from a heat treatment during manufacturing does not occur. Besides, when a defect occurs to one of the optical elements, it suffices to replace only the defective optical element, thus advantageously ensuring good economical efficiency.

In the manufacturing methods of a substrate for mounting an IC chip according to the second and third aspects of the fifth group of the present invention, optical waveguides are formed inside the substrate for mounting an IC chip and openings communicating with a conductor circuit lamination and solder resist layers are formed. The communicating openings can serve as optical paths for transmitting optical signal. Therefore, when optical elements are mounted on a substrate for mounting an IC chip manufactured by the manufacturing method of a substrate for mounting an IC chip according to the second or third aspect of the fifth group of the present invention, the substrate for mounting an IC chip can suitably transmit optical signal between the optical elements and the optical waveguides through the optical paths for transmitting optical signal.

The invention claimed is:

1. A substrate for mounting an IC chip comprising:
an insulating substrate having a first surface and a second surface on an opposite side of the first surface;
a first built-up structure formed on the first surface of the insulating substrate and comprising a conductor circuit and an interlaminar insulating layer;
a second built-up structure formed on the second surface of the insulating substrate and comprising a conductor circuit and an interlaminar insulating layer;
a solder resist layer formed as an outermost layer over the first built-up structure;
an optical element mounted over the solder resist layer;
a resin layer formed between the solder resist layer and the optical element; and
an optical path for transmitting optical signal to or from the optical element and penetrating though the insulating substrate, first built-up structure, second built-up structure and solder resist layer.

2. The substrate for mounting an IC chip according to claim 1, wherein the optical element is mounted on the solder resist layer.

3. The substrate for mounting an IC chip according to claim 2, wherein said optical element is at least one of a light receiving element and a light emitting element.

4. The substrate for mounting an IC chip according to claim 1, further comprising an electronic component mounted on a surface of one of the solder resist layer.

5. The substrate for mounting an IC chip according to claim 1, further comprising a micro lens disposed on an end portion of the optical path for transmitting optical signal.

6. The substrate for mounting an IC chip according to claim 1, wherein the optical path for transmitting optical signal has a cross-sectional diameter which is 100 to 500 μm.

7. The substrate for mounting an IC chip according to claim 1, further comprising a plated-through hole connecting the conductor circuit of the first built-up structure and the conductor circuit of the second built-up structure through the insulating substrate and a via-hole connecting the conductor circuit in the first built-up structure and another conductor circuit in the first-built-up structure through the interlaminar insulating layer in the first built-up structure.

* * * * *